United States Patent
Germeroth et al.

(10) Patent No.: US 12,522,660 B2
(45) Date of Patent: Jan. 13, 2026

(54) METHODS FOR SELECTION AND STIMULATION OF CELLS AND APPARATUS FOR SAME

(71) Applicant: C3S2 GMBH, Munich (DE)

(72) Inventors: Lothar Germeroth, Munich (DE); Christian Stemberger, Munich (DE); Mateusz Pawel Poltorak, Munich (DE); Thomas Schmidt, Munich (DE)

(73) Assignee: C3S2 GMBH, Munich (DE)

( * ) Notice: Subject to any disclaimer, the term of this patent is extended or adjusted under 35 U.S.C. 154(b) by 1205 days.

(21) Appl. No.: 17/289,690

(22) PCT Filed: Oct. 30, 2019

(86) PCT No.: PCT/EP2019/079746
§ 371 (c)(1),
(2) Date: Apr. 28, 2021

(87) PCT Pub. No.: WO2020/089343
PCT Pub. Date: May 7, 2020

(65) Prior Publication Data
US 2022/0002669 A1    Jan. 6, 2022

Related U.S. Application Data

(60) Provisional application No. 62/861,314, filed on Jun. 13, 2019, provisional application No. 62/842,511, filed on May 2, 2019, provisional application No. 62/753,911, filed on Oct. 31, 2018.

(51) Int. Cl.
| | |
|---|---|
| *G01N 33/50* | (2006.01) |
| *A61K 40/11* | (2025.01) |
| *A61K 40/31* | (2025.01) |
| *A61K 40/42* | (2025.01) |
| *C07K 16/28* | (2006.01) |
| *C12N 5/0783* | (2010.01) |

(52) U.S. Cl.
CPC .......... *C07K 16/2818* (2013.01); *A61K 40/11* (2025.01); *A61K 40/31* (2025.01); *A61K 40/4211* (2025.01); *A61K 40/4215* (2025.01); *C07K 16/2809* (2013.01); *C12N 5/0636* (2013.01); *A61K 2239/38* (2023.05); *A61K 2239/48* (2023.05); *C07K 2319/03* (2013.01); *C12N 2501/2302* (2013.01); *C12N 2501/2307* (2013.01); *C12N 2501/2315* (2013.01); *C12N 2501/505* (2013.01); *C12N 2501/51* (2013.01); *C12N 2501/515* (2013.01); *C12N 2501/52* (2013.01)

(58) Field of Classification Search
None
See application file for complete search history.

(56) References Cited

U.S. PATENT DOCUMENTS

| | | |
|---|---|---|
| 1,631,788 A | 6/1927 | Bennett et al. |
| 2,467,434 A | 4/1949 | Kuplec |
| 4,235,871 A | 11/1980 | Papahadjopoulos et al. |
| 4,361,549 A | 11/1982 | Kung |
| 4,501,728 A | 2/1985 | Geho et al. |
| 4,690,915 A | 9/1987 | Rosenberg |
| 4,816,567 A | 3/1989 | Cabilly et al. |
| 4,837,028 A | 6/1989 | Allen |
| 4,851,341 A | 7/1989 | Hopp |
| 4,966,695 A | 10/1990 | Joshua |
| 5,019,369 A | 5/1991 | Presant et al. |
| 5,087,616 A | 2/1992 | Myers et al. |
| 5,168,049 A | 12/1992 | Meade et al. |
| 5,219,740 A | 6/1993 | Miller et al. |
| 5,506,121 A | 4/1996 | Skerra |
| 5,629,205 A | 5/1997 | Lagosky |
| 5,665,866 A | 9/1997 | Weir et al. |
| 5,773,224 A | 6/1998 | Grandics et al. |
| 5,849,576 A | 12/1998 | Skerra et al. |
| 5,869,270 A | 2/1999 | Rhode et al. |
| 5,985,658 A | 11/1999 | Colinas |
| 6,022,951 A | 2/2000 | Sano |
| 6,040,177 A | 3/2000 | Riddell et al. |
| 6,060,273 A | 5/2000 | Dirks et al. |
| 6,103,493 A | 8/2000 | Skerra et al. |
| 6,123,655 A | 9/2000 | Fell |

(Continued)

FOREIGN PATENT DOCUMENTS

| | | |
|---|---|---|
| CN | 101 226 118 | 7/2008 |
| CN | 101 446 576 | 6/2009 |

(Continued)

OTHER PUBLICATIONS

Ghassemi et al. (Cancer Immunol Res; 6(9); 1100-9, supplemental pp. 1-10. 2018). (Year: 2018).*
U.S. Appl. No. 18/983,137, filed Dec. 16, 2024, by Ramsborg et al. (Copy not provided). (Copy not submitted herewith pursuant to the waiver of 37 C.F.R. § 1.98(a)(2)(iii) issued by the Office on Sep. 21, 2004).
U.S. Appl. No. 19/029,968, filed Jan. 17, 2025, by Ramsborg et al. (Copy not provided). (Copy not submitted herewith pursuant to the waiver of 37 C.F.R. § 1.98(a)(2)(iii) issued by the Office on Sep. 21, 2004).
U.S. Appl. No. 19/030,019, filed Jan. 17, 2025, by Ramsborg et al. (Copy not provided). (Copy not submitted herewith pursuant to the waiver of 37 C.F.R. § 1.98(a)(2)(iii) issued by the Office on Sep. 21, 2004).

(Continued)

*Primary Examiner* — Zachary S Skelding
(74) *Attorney, Agent, or Firm* — Michael A. Whittaker

(57) ABSTRACT

Provided herein are methods for selecting and stimulating a plurality of cells in a sample of cells using column chromatography, and collecting the cells without using additional steps or reagents to facilitate detachment of the cells from the column. In some aspects, the methods provided herein reduce the time needed to generate a population of selected and stimulated cells useful for genetic engineering, and ultimately, cell therapy, compared to existing methods. Also provided are articles of manufacture and apparatus thereof.

39 Claims, 20 Drawing Sheets

Specification includes a Sequence Listing.

(56) References Cited

U.S. PATENT DOCUMENTS

| | | |
|---|---|---|
| 6,156,493 A | 12/2000 | Stayton |
| 6,165,750 A | 12/2000 | Stayton |
| 6,207,453 B1 | 3/2001 | Maass et al. |
| 6,232,445 B1 | 5/2001 | Rhode |
| 6,270,772 B1 | 8/2001 | Burrows et al. |
| 6,303,121 B1 | 10/2001 | Kwon |
| 6,303,309 B1 | 10/2001 | Jurinke et al. |
| 6,309,645 B1 | 10/2001 | Rhode et al. |
| 6,312,916 B1 | 11/2001 | Kopetzki et al. |
| 6,331,415 B1 | 12/2001 | Cabilly et al. |
| 6,352,694 B1 | 3/2002 | June |
| 6,368,813 B1 | 4/2002 | Reznuj et al. |
| 6,391,571 B1 | 5/2002 | Kopetzki et al. |
| 6,410,270 B1 | 6/2002 | Strittmater et al. |
| 6,410,319 B1 | 6/2002 | Raubitschek et al. |
| 6,417,331 B1 | 7/2002 | Kopetzki et al. |
| 6,451,995 B1 | 9/2002 | Cheung et al. |
| 6,534,055 B1 | 3/2003 | June et al. |
| 6,569,997 B1 | 5/2003 | Kwon |
| 6,638,728 B1 | 10/2003 | Desai et al. |
| 6,716,602 B2 | 4/2004 | Andersen et al. |
| 6,733,433 B1 | 5/2004 | Fell |
| 6,815,171 B2 | 11/2004 | Burrows et al. |
| 6,849,185 B1 | 2/2005 | Wu et al. |
| 6,979,556 B2 | 12/2005 | Simmons et al. |
| 7,033,834 B2 | 4/2006 | Valerio et al. |
| 7,070,995 B2 | 7/2006 | Jensen |
| 7,074,904 B2 | 7/2006 | Wong et al. |
| 7,074,905 B2 | 7/2006 | Rhode et al. |
| 7,094,579 B2 | 8/2006 | Gray et al. |
| 7,112,439 B2 | 9/2006 | Johnson et al. |
| 7,141,656 B2 | 11/2006 | Rhode et al. |
| 7,189,322 B2 | 3/2007 | Wu et al. |
| 7,202,349 B2 | 4/2007 | Davis et al. |
| 7,265,209 B2 | 9/2007 | Jensen |
| 7,265,218 B2 | 9/2007 | Burrows et al. |
| 7,294,483 B2 | 11/2007 | Leung et al. |
| 7,354,762 B2 | 4/2008 | Jensen |
| 7,362,449 B2 | 4/2008 | Dubois et al. |
| 7,446,179 B2 | 11/2008 | Jensen et al. |
| 7,446,190 B2 | 11/2008 | Sadelain et al. |
| 7,446,191 B2 | 11/2008 | Jensen |
| 7,482,000 B2 | 1/2009 | DeVaux |
| 7,494,656 B2 | 2/2009 | Bachmann |
| 7,547,438 B2 | 6/2009 | Thomas et al. |
| 7,585,620 B2 | 9/2009 | Schutz et al. |
| 7,618,799 B2 | 11/2009 | Coleman et al. |
| 7,704,708 B2 | 4/2010 | Wu et al. |
| 7,718,399 B2 | 5/2010 | Jung et al. |
| 7,754,447 B2 | 7/2010 | Glover et al. |
| 7,776,562 B2 | 8/2010 | Busch |
| 7,837,871 B2 | 11/2010 | Gjerde et al. |
| 7,906,327 B2 | 3/2011 | Sydnor et al. |
| 7,923,221 B1 | 4/2011 | Cabilly et al. |
| 7,981,632 B2 | 7/2011 | Schmidt |
| 7,985,564 B2 | 7/2011 | Retallack et al. |
| 8,148,494 B2 | 4/2012 | Leonhartsberger |
| 8,216,573 B2 | 7/2012 | Wich et al. |
| 8,268,964 B2 | 9/2012 | Scholler et al. |
| 8,283,125 B2 | 10/2012 | Ramirez et al. |
| 8,298,782 B2 | 10/2012 | Busch |
| 8,324,353 B2 | 12/2012 | Jensen |
| 8,339,645 B2 | 12/2012 | Nakawaki |
| 8,361,744 B2 | 1/2013 | Marrichi et al. |
| 8,389,282 B2 | 3/2013 | Sadelain et al. |
| 8,398,282 B2 | 3/2013 | Kuhlman et al. |
| 8,426,168 B2 | 4/2013 | Stempfer et al. |
| 8,441,187 B2 | 5/2013 | Hunze et al. |
| 8,449,874 B2 | 5/2013 | Bachmann |
| 8,450,086 B2 | 5/2013 | Huang et al. |
| 8,479,118 B2 | 7/2013 | Lyndersay et al. |
| RE44,512 E | 10/2013 | Glover et al. |
| 8,735,098 B2 | 5/2014 | Marrichi et al. |
| 8,735,330 B2 | 5/2014 | Geir |
| 8,735,540 B2 | 5/2014 | Schmidt |
| 8,802,374 B2 | 8/2014 | Jensen |
| 8,822,647 B2 | 9/2014 | Jensen |
| 8,828,379 B2 | 9/2014 | Loset et al. |
| 8,911,993 B2 | 12/2014 | June et al. |
| 9,023,604 B2 | 5/2015 | Schmidt et al. |
| 9,233,125 B2 | 1/2016 | Davila et al. |
| 9,242,244 B2 | 1/2016 | Gjerde et al. |
| 9,370,732 B2 | 6/2016 | Gjerde |
| 9,637,719 B2 | 5/2017 | Gjerde |
| 9,684,281 B2 | 6/2017 | Mathuis et al. |
| 9,891,148 B2 | 2/2018 | Gjerde et al. |
| 9,904,248 B2 | 2/2018 | Mathuis et al. |
| 9,920,294 B2 | 3/2018 | Gjerde |
| 10,107,729 B2 | 10/2018 | Gjerde |
| 10,220,332 B2 | 3/2019 | Gjerde |
| 10,228,312 B2 | 3/2019 | Stadler |
| 10,307,693 B2 | 6/2019 | Gjerde |
| 10,428,351 B2 | 10/2019 | Crisman et al. |
| 10,752,668 B2 | 8/2020 | Agaugue et al. |
| 10,830,676 B2 | 11/2020 | Gjerde |
| 11,077,389 B2 | 8/2021 | Gjerde |
| 11,097,207 B2 | 8/2021 | Gjerde |
| 11,137,327 B2 | 10/2021 | Gjerde |
| 11,248,238 B2 | 2/2022 | Bashour et al. |
| 11,274,278 B2 | 3/2022 | Germeroth et al. |
| 11,400,115 B2 | 8/2022 | Ramsborg et al. |
| 11,466,253 B2 | 10/2022 | Germeroth et al. |
| 11,851,678 B2 | 12/2023 | Mujacic et al. |
| 11,866,465 B2 | 1/2024 | Schmidt et al. |
| 11,913,024 B2 | 2/2024 | Germeroth et al. |
| 12,066,365 B2 | 8/2024 | Stadler |
| 12,129,477 B2 | 10/2024 | Bashour et al. |
| 12,135,265 B2 | 11/2024 | Stadler |
| 12,208,137 B2 | 1/2025 | Ramsborg et al. |
| 2001/0026932 A1 | 10/2001 | Thomas et al. |
| 2002/0034513 A1 | 3/2002 | Rode et al. |
| 2002/0091079 A1 | 7/2002 | Rhode et al. |
| 2002/0131960 A1 | 9/2002 | Sadelain et al. |
| 2002/0150914 A1 | 10/2002 | Andersen et al. |
| 2002/0176864 A1 | 11/2002 | Burrows et al. |
| 2003/0077739 A1 | 4/2003 | Simmons et al. |
| 2003/0162249 A1 | 8/2003 | Gray et al. |
| 2003/0170238 A1 | 9/2003 | Gruenberg et al. |
| 2003/0175850 A1 | 9/2003 | Ross et al. |
| 2003/0208783 A1 | 11/2003 | Hillen et al. |
| 2003/0223994 A1 | 12/2003 | Hoogenboom et al. |
| 2003/0228660 A1 | 12/2003 | Gray et al. |
| 2003/0235908 A1 | 12/2003 | Berenson et al. |
| 2004/0082012 A1 | 4/2004 | Busch et al. |
| 2004/0191260 A1 | 9/2004 | Reiter et al. |
| 2004/0209295 A1 | 10/2004 | Schwabe et al. |
| 2005/0003431 A1 | 1/2005 | Wucherpfennig et al. |
| 2005/0074848 A1 | 4/2005 | Schwebe |
| 2005/0074853 A1 | 4/2005 | Burrows et al. |
| 2006/0019319 A1 | 1/2006 | Billadeau et al. |
| 2006/0034850 A1 | 2/2006 | Weidanz et al. |
| 2006/0058226 A1 | 3/2006 | Ishikawa et al. |
| 2006/0106199 A1 | 5/2006 | Erdmann et al. |
| 2006/0246542 A1 | 11/2006 | Simmons et al. |
| 2006/0269990 A1 | 11/2006 | Stempfer et al. |
| 2007/0015244 A1 | 1/2007 | Simmons et al. |
| 2007/0092530 A1 | 4/2007 | Weidanz et al. |
| 2007/0116690 A1 | 5/2007 | Yang et al. |
| 2007/0224664 A1 | 9/2007 | Simmons et al. |
| 2007/0238169 A1 | 10/2007 | Abilez et al. |
| 2007/0241061 A1 | 10/2007 | Engstrom et al. |
| 2008/0038282 A1 | 2/2008 | Napper et al. |
| 2008/0064859 A1 | 3/2008 | Vandenbark et al. |
| 2008/0076158 A1 | 3/2008 | Dassler et al. |
| 2008/0085532 A1 | 4/2008 | Gorlach et al. |
| 2008/0171951 A1 | 7/2008 | Fell |
| 2008/0206818 A1 | 8/2008 | Wich et al. |
| 2008/0254511 A1 | 10/2008 | Dassler et al. |
| 2008/0255004 A1 | 10/2008 | Neurauter et al. |
| 2008/0279851 A1 | 11/2008 | Coyle et al. |
| 2009/0104660 A1 | 4/2009 | Jung et al. |
| 2009/0137472 A1 | 5/2009 | Schwabe et al. |
| 2009/0226474 A1 | 9/2009 | Weidanz et al. |
| 2009/0304679 A1 | 12/2009 | Weidanz et al. |

(56) References Cited

U.S. PATENT DOCUMENTS

| | | |
|---|---|---|
| 2010/0005867 A1 | 1/2010 | Doerr |
| 2010/0068738 A1 | 3/2010 | Kawamura et al. |
| 2010/0168390 A1 | 7/2010 | Brix et al. |
| 2010/0248257 A1 | 9/2010 | Jacobsen et al. |
| 2010/0267057 A1 | 10/2010 | Rakestraw et al. |
| 2011/0070581 A1 | 3/2011 | Gupta |
| 2011/0236411 A1 | 9/2011 | Scholler et al. |
| 2011/0244517 A1 | 10/2011 | Simmons et al. |
| 2011/0318380 A1 | 12/2011 | Brix et al. |
| 2012/0214187 A1 | 8/2012 | Lees et al. |
| 2012/0225453 A1 | 9/2012 | Withers et al. |
| 2012/0264161 A1 | 10/2012 | Scholler et al. |
| 2012/0321665 A1 | 12/2012 | Bollyky et al. |
| 2013/0115588 A1 | 5/2013 | Davis et al. |
| 2013/0149337 A1 | 6/2013 | Cooper et al. |
| 2013/0184439 A1 | 7/2013 | Spitali et al. |
| 2013/0196375 A1 | 8/2013 | Strobbe |
| 2013/0287748 A1 | 10/2013 | June et al. |
| 2013/0289253 A1 | 10/2013 | Leuscher et al. |
| 2014/0120580 A1 | 5/2014 | Simmons et al. |
| 2014/0271635 A1 | 9/2014 | Brogdon et al. |
| 2014/0294841 A1 | 10/2014 | Scheinberg et al. |
| 2014/0295458 A1 | 10/2014 | Schmidt |
| 2014/0349315 A1 | 11/2014 | Loset et al. |
| 2015/0024411 A1 | 1/2015 | Stadler |
| 2015/0031566 A1 | 1/2015 | Napper et al. |
| 2015/0157959 A1 | 6/2015 | Bouvier et al. |
| 2015/0301046 A1 | 10/2015 | Schmidt |
| 2016/0272688 A1 | 9/2016 | Schmidt |
| 2017/0037368 A1 | 2/2017 | Germeroth et al. |
| 2017/0037369 A1 | 2/2017 | Ramsborg et al. |
| 2017/0037370 A1 | 2/2017 | Kaiser et al. |
| 2017/0051035 A1 | 2/2017 | Payne et al. |
| 2017/0052176 A1 | 2/2017 | Carl et al. |
| 2017/0240920 A1 | 8/2017 | Pule et al. |
| 2017/0282096 A1 | 10/2017 | Bouvier et al. |
| 2018/0178142 A1 | 6/2018 | Gjerde |
| 2018/0296602 A1 | 10/2018 | Riddell et al. |
| 2019/0041306 A1 | 2/2019 | Gjerde |
| 2019/0049351 A1 | 2/2019 | Gjerde |
| 2019/0112576 A1 | 4/2019 | Germeroth et al. |
| 2019/0136186 A1 | 5/2019 | Germeroth et al. |
| 2019/0226951 A1 | 7/2019 | Stadler |
| 2019/0232196 A1 | 8/2019 | Gjerde |
| 2019/0234844 A1 | 8/2019 | Stadler |
| 2019/0247846 A1 | 8/2019 | Suh et al. |
| 2019/0358562 A1 | 11/2019 | Gjerde |
| 2020/0017880 A1 | 1/2020 | Bashour et al. |
| 2020/0239910 A1 | 7/2020 | Bonyhadi |
| 2021/0017249 A1 | 1/2021 | Sather et al. |
| 2021/0032297 A1 | 2/2021 | Schmidt et al. |
| 2021/0163893 A1 | 6/2021 | Westoby et al. |
| 2022/0195388 A1 | 6/2022 | Germeroth et al. |
| 2022/0243223 A1 | 8/2022 | Bashour et al. |
| 2023/0090117 A1 | 3/2023 | Haig et al. |
| 2023/0090176 A1 | 3/2023 | Ramsborg et al. |
| 2023/0190814 A1 | 6/2023 | Ramsborg et al. |
| 2023/0295567 A1 | 9/2023 | Germeroth et al. |
| 2024/0076617 A1 | 3/2024 | Mujacic et al. |
| 2024/0101613 A1 | 3/2024 | Schmidt et al. |
| 2024/0191188 A1 | 6/2024 | Germeroth et al. |
| 2025/0019723 A1 | 1/2025 | Bashour et al. |
| 2025/0020556 A1 | 1/2025 | Stadler |

FOREIGN PATENT DOCUMENTS

| | | |
|---|---|---|
| CN | 103 305 464 | 9/2013 |
| DE | 19641876 | 4/1998 |
| EP | 1054063 | 11/2000 |
| EP | 0 700 430 | 4/2005 |
| EP | 1669129 | 6/2006 |
| EP | 1908769 | 4/2008 |
| EP | 2 537 416 | 12/2012 |
| JP | 2006-516197 | 6/2006 |
| JP | 2011-182702 | 9/2011 |
| RU | 2249039 | 3/2005 |
| RU | 2469044 | 12/2012 |
| WO | WO-1986/002077 | 4/1986 |
| WO | WO-1992/008796 | 5/1992 |
| WO | WO-1994/028143 | 12/1994 |
| WO | WO-1996/004314 | 2/1996 |
| WO | WO-1996/013593 | 5/1996 |
| WO | WO-1996/018105 | 6/1996 |
| WO | WO-1996/020014 | 7/1996 |
| WO | WO-1996/023879 | 8/1996 |
| WO | WO-1996/024606 | 8/1996 |
| WO | WO-1996/036721 | 11/1996 |
| WO | WO-1997/028191 | 8/1997 |
| WO | WO-1998/006749 | 2/1998 |
| WO | WO-1998/040396 | 9/1998 |
| WO | WO-1999/014236 | 3/1999 |
| WO | WO-1999/018129 | 4/1999 |
| WO | WO-1999/021572 | 5/1999 |
| WO | WO-1999/042597 | 8/1999 |
| WO | WO-1999/060120 | 11/1999 |
| WO | WO-1999/061065 | 12/1999 |
| WO | WO-2000/014257 | 3/2000 |
| WO | WO-2000/069549 | 5/2000 |
| WO | WO-2000/038762 | 7/2000 |
| WO | WO 2000/043551 | 7/2000 |
| WO | WO-2001/004144 | 1/2001 |
| WO | WO-2001/056603 | 9/2001 |
| WO | WO-2002/040697 | 5/2002 |
| WO | WO-2002/054065 | 7/2002 |
| WO | WO 2002/055992 | 7/2002 |
| WO | WO-2002/061428 | 8/2002 |
| WO | WO-2002/077018 | 10/2002 |
| WO | WO-2003/018771 | 3/2003 |
| WO | WO-2003/020763 | 3/2003 |
| WO | WO-2003/029462 | 4/2003 |
| WO | WO-2003/068201 | 8/2003 |
| WO | WO-2003/068956 | 8/2003 |
| WO | WO-2003/090781 | 11/2003 |
| WO | WO-2004/001418 | 12/2003 |
| WO | WO-2004/018520 | 3/2004 |
| WO | WO-2004/029221 | 4/2004 |
| WO | WO-2004/033685 | 4/2004 |
| WO | WO-2004/096975 | 11/2004 |
| WO | WO-2004/104185 | 12/2004 |
| WO | WO-2005/017174 | 2/2005 |
| WO | WO-2005/019466 | 3/2005 |
| WO | WO-2005/024000 | 3/2005 |
| WO | WO-2005/035567 | 4/2005 |
| WO | WO-2005/038031 | 4/2005 |
| WO | WO-2005/050209 | 6/2005 |
| WO | WO 2005/087802 | 9/2005 |
| WO | WO-2006/000830 | 1/2006 |
| WO | WO 2006/041487 | 4/2006 |
| WO | WO-2006/044650 | 4/2006 |
| WO | WO-2006/054961 | 5/2006 |
| WO | WO-2006/058226 | 6/2006 |
| WO | WO-2007/001459 | 1/2007 |
| WO | WO-2007/112012 | 10/2007 |
| WO | WO-2007/117602 | 10/2007 |
| WO | WO-2008/011486 | 1/2008 |
| WO | WO-2008/051424 | 5/2008 |
| WO | WO 2008/100122 | 8/2008 |
| WO | WO-2008/116468 | 10/2008 |
| WO | WO-2008/140573 | 11/2008 |
| WO | WO-2009/003492 | 1/2009 |
| WO | WO-2009/003493 | 1/2009 |
| WO | WO-2009/039854 | 4/2009 |
| WO | WO-2009/072003 | 6/2009 |
| WO | WO-2009/072006 | 6/2009 |
| WO | WO-2009/092068 | 7/2009 |
| WO | WO-2009/095447 | 8/2009 |
| WO | WO-2009/106073 | 9/2009 |
| WO | WO-2010/037395 | 4/2010 |
| WO | WO-2010/080032 | 7/2010 |
| WO | WO-2010/104949 | 9/2010 |
| WO | WO-2011/044186 | 4/2011 |
| WO | WO-2011/101681 | 8/2011 |
| WO | WO-2011/107489 | 9/2011 |
| WO | WO-2012/013682 | 2/2012 |

(56) References Cited

FOREIGN PATENT DOCUMENTS

| | | |
|---|---|---|
| WO | WO-2012/017081 | 2/2012 |
| WO | WO-2012/044999 | 4/2012 |
| WO | WO-2012/058627 | 5/2012 |
| WO | WO-2012/129514 | 9/2012 |
| WO | WO-2012/137538 | 10/2012 |
| WO | WO-2013/011011 | 1/2013 |
| WO | WO-2013/038191 | 3/2013 |
| WO | WO-2013/038272 | 3/2013 |
| WO | WO-2013/062365 | 5/2013 |
| WO | WO-2013/071154 | 5/2013 |
| WO | WO-2013/123061 | 8/2013 |
| WO | WO-2013/124474 | 8/2013 |
| WO | WO-2013/126726 | 8/2013 |
| WO | WO-2013/166321 | 11/2013 |
| WO | WO-2014/008058 | 1/2014 |
| WO | WO-2014/011489 | 1/2014 |
| WO | WO-2014/011996 | 1/2014 |
| WO | WO-2014/031687 | 2/2014 |
| WO | WO-2014/048920 | 4/2014 |
| WO | WO-2014/055668 | 4/2014 |
| WO | WO-2014/076277 | 5/2014 |
| WO | WO-2014/118220 | 8/2014 |
| WO | WO-2015/095895 | 7/2015 |
| WO | WO-2015/158868 | 10/2015 |
| WO | WO-2015/162211 | 10/2015 |
| WO | WO-2015/164675 | 10/2015 |
| WO | WO-2016/030414 | 3/2016 |
| WO | WO-2016/073602 | 5/2016 |
| WO | WO-2016/090312 | 6/2016 |
| WO | WO-2016/090320 | 6/2016 |
| WO | WO-2016/090327 | 6/2016 |
| WO | WO-2016/090329 | 6/2016 |
| WO | WO-2016/166568 | 10/2016 |
| WO | WO-2017/068419 | 4/2017 |
| WO | WO-2017/068421 | 4/2017 |
| WO | WO-2017/068425 | 4/2017 |
| WO | WO-2017/096329 | 6/2017 |
| WO | WO-2017/173256 | 10/2017 |
| WO | WO-2017/177137 | 10/2017 |
| WO | WO 2017/180969 | 10/2017 |
| WO | WO-2018/106595 | 6/2018 |
| WO | WO-2018/134691 | 7/2018 |
| WO | WO-2018/170188 | 9/2018 |
| WO | WO-2018/197949 | 11/2018 |
| WO | WO-2019/018603 | 1/2019 |
| WO | WO-2019/090004 | 5/2019 |
| WO | WO-2019/113556 | 6/2019 |
| WO | WO-2020/033927 | 2/2020 |
| WO | WO-2021/084050 | 5/2021 |
| WO | WO-2022/234009 | 11/2022 |

OTHER PUBLICATIONS

U.S. Appl. No. 19/030,056, filed Jan. 17, 2025, by Ramsborg et al. (Copy not provided). (Copy not submitted herewith pursuant to the waiver of 37 C.F.R. § 1.98(a)(2)(iii) issued by the Office on Sep. 21, 2004).
Anastasov et al., "Optimized Lentiviral Transduction Protocols by Use of a Poloxamer Enhancer, Spinoculation, and scFv-Antibody Fusions to VSV-G," Methods Mol Biol (2016) 1448:49-61.
Boyman et al., "The role of interleukin-2 in memory CD8 cell differentiation," Adv Exp Med Biol (2010) 684:28-41.
Krug et al., "A GMP-compliant protocol to expand and transfect cancer patient T cells with mRNA encoding a tumor-specific chimeric antigen receptor," Cancer Immunol Immunother (Oct. 2014, e-pub. Jun. 18, 2014) 63(10):999-1008.
Marcus et al., "Allogeneic chimeric antigen receptor-modified cells for adoptive cell therapy of cancer," Expert Opin Biol Ther (Jul. 2014, e-pub. Mar. 24, 2014) 14(7):947-954.
Teschner et al., "In Vitro Stimulation and Expansion of Human Tumour-Reactive CD8+ Cytotoxic T Lymphocytes by Anti-CD3/CD28/CD137 Magnetic Beads," Scandinavian Journal of Immunology (Apr. 2011) 74(2):155-164.
Turtle et al., "CD19 CAR-T cells of defined CD4+:CD8+ composition in adult B cell ALL patients," The Journal of Clinical Investigation (Jun. 1, 2016, e-pub. Apr. 25, 2016) 126(6):2123-2138.
U.S. Appl. No. 17/850,875, filed Jun. 27, 2022, by Ramsborg et al. (Copy not provided). (Copy not submitted herewith pursuant to the waiver of 37 C.F.R. § 1.98(a)(2)(iii) issued by the Office on Sep. 21, 2004).
U.S. Appl. No. 18/045,137, filed Oct. 7, 2022, by Germeroth et al. (Copy not provided). (Copy not submitted herewith pursuant to the waiver of 37 C.F.R. § 1.98(a)(2)(iii) issued by the Office on Sep. 21, 2004).
U.S. Appl. No. 17/772,981, filed Oct. 29, 2020, by Poltorak et al. (Copy not provided). (Copy not submitted herewith pursuant to the waiver of 37 C.F.R. § 1.98(a)(2)(iii) issued by the Office on Sep. 21, 2004).
Aleksandrova et al. "Functionality and Cell Senescence of CD4/CD8-Selected CD20 CAR T Cells Manufactured Using the Automated CliniMACS Prodigy® Platform." Transfus Med Hemother. (Feb. 2019) 46(1):47-54.
Braun et al., "Rapid separation of T cell subpopulations with monoclonal antibodies and affinity chromatography," J Immunol Methods. (1982) 54(2):251-8.
Casati et al., "Clinical-scale selection and viral transduction of human naïve and central memory CD8+ T cells for adoptive cell therapy of cancer patients, "Cancer Immunology (2013) 62(10): 1563-1573.
Corada et al., "Monoclonal antibodies directed to different regions of vascular endothelial cadherin extracellular domain affect adhesion and clustering of the protein and modulate endothelial permeability," Blood. (2001) 97(6):1679-84.
Davis et al., "Assessment of a positive selection technique using an avidin column to isolate human peripheral blood T cell subsets," J Immunol Methods. (1994) 175(2):247-57.
Fernandes et al., "Kinetics of class II MHC expression on cytotoxic T cells generated by skin allograft," Tissue Antigens. (1990) 36(3):93-9.
Gunzer et al.,, "Two-step negative enrichment of CD4+ and CD8+ T cells from murine spleen via nylon wool adherence and an optimized antibody cocktail," J Immunol Methods. (2001) 258(1-2): 55-63.
Kaikkonen et al., "(Strept)avidin-displaying lentiviruses as versatile tools for targeting and dual imaging of gene delivery," Gene Ther (2009) 16:894-904.
Medvec et al., "Improved Expansion and In Vivo Function of Patient T Cells by a Serum-free Medium," Mol Ther Methods Clin Dev. (2017) 8:65-74.
Moeller et al., "Adoptive transfer of gene-engineered CD4+ helper T cells induces potent primary and secondary tumor rejection," Blood (2005) 106(9):2995-3003.
Nascimbeni et al., "Peripheral CD4+CD8+ T cells are differentiated effector memory cells with antiviral functions," Blood (2004) 104(2):478-86.
Padlan,"X-Ray Crystallography of Antibodies," Adv Prot Chem (1996) 49:57-133.
Poirier et al. "CD28-specific immunomodulating antibodies: what can be learned from experimental models?" American Journal of Transplantation. Jul. 2012; 12(7):1682-90.
Purification Technical Handbook (2010, retrieved from https://at.vwr.com/assetsvc/asset/de AT/id/20551553/contents).
Radisch et al., "Next generation automated traceless cell chromatography platform for GMP-compliant cell isolation and activation," Sci Rep. (2022) 12(1):6572.
Roddie et al. "Manufacturing chimeric antigen receptor T cells: issues and challenges." Cytotherapy. (Mar. 2019) 21(3):327-340.
Skea et al., "The selective expansion of functional T cell subsets," J Hematother Stem Cell Res. (1999) 8(5): 525-38.
Smith et al., "Redirected infection of directly biotinylated recombinant adenovirus vectors through cell surface receptors and antigens," Proc Natl Acad Sci USA (1999) 8855-8860.
Tarantula, Explanatory Biotechnological Dictionary (English translation only).

(56) References Cited

OTHER PUBLICATIONS

Woolridge et al. "Anti-CD8 antibodies can inhibit or enhance peptide-MHC class I (pMHCI) multimer binding: this is paralleled by their effects on CTL activation and occurs in the absence of an interaction between pMHCI and CD8 on the cell surface." The Journal of Immunology (2003)171.12: 6650-6660.
Aksoy et al., "Human primary T cells: A practical guide," Published on Jun. 19, 2018. Retrieved on Jan. 7, 2020. Retrieved from https://peerj.com/preprints/26993/.
Al-Aghbar et al., "High-Affinity Ligands Can Trigger T Cell Receptor Signaling Without CD45 Segregation." Front Immunol. (2018); 9: 713.
Al-Lazikani et al., "Standard conformations for the canonical structures of immunoglobulins," J Mol Biol (1997) 273(4):927-948.
Alonso-Camino, V. et al. (May 2013, e-pub. May 21, 2013). "CARbodies: Human Antibodies Against Cell Surface Tumor Antigens Selected From Repertoires Displayed on T Cell Chimeric Antigen Receptors", 2(5):e93, 11 pages.
Anonymous, "Cross-linking reagents introduction to cross-linking single-step vs. multi-step reactions," Published on Jan. 1, 2005. Retrieved from http://www.korambiotech.com/upload/bbs/2/Cross-Linking TechHB.pdf. Retrieved on Nov. 30, 2018.
Anonymous, "Optimization of Human T Cell Expansion Protocol: Effects of Early Cell Dilution," Published Oct. 2018. Retrieved on Jan. 7, 2020. Retrieved on https://cdn.stemcell.com/media/files/techbulletin/TB27143-Optimization_of_Human_T_Cell_Expansion_Protocol.pdf?_ga=2.128430788.931468903.1578439383852611746.1578439383.
Anonymous, "SMCC and Sulfo-SMCC," Published Jan. 1, 2018. Retrieved on https://assets.thermofisher.com/TFS-Assets/LSG/manuals/MAN0011295_SMCC_SulfoSMCC_UG.pdf. Retrieved on Dec. 3, 2018.
Anonymous, "Traut's reagent," Published on Jan. 1, 2012. Retrieved from https://assets.thermofisher.com/TFS-Assets/LSG/manuals/MAN0011238_Trauts_Reag_UG.pdf. Retrieved on Dec. 3, 2018.
Arakawa et al. (Sep. 1996). "Cloning and sequencing of the VH and V kappa genes of an anti-CD3 monoclonal antibody, and construction of a mouse/human chimeric antibody," *J Biochem.* 120(3):657-662.
Araki et al., "mTOR regulates memory CD8 T-cell differentiation," Nature (2009) 460(7251):108-112.
Argarana et al. (Feb. 25, 1986). "Molecular cloning and nucleotide sequence of the streptavidin gene," *Nucleic Acids Res.* 14(4):1871-1882.
Arndt et al., "Analysis of TCR activation kinetics in primary human T cells upon focal or soluble stimulation," J Immunol Methods. Jan. 31, 2013;387(1-2):276-83.
Ashouri et al., "Endogenous Nur77 Is a Specific Indicator of Antigen Receptor Signaling in Human T and B Cells." J. Immunol. (2017) 198(2); 657-668.
Bambauer et al., "LDL-apheresis: technical and clinical aspects," The Scientific World Journal (2012).
Barret, D.M et al. (2014, e-pub. Nov. 20, 2013). "Chimeric Antigen Receptor Therapy for Cancer," Annu Rev Med. (2014); 65:333-347.
Barrett et al., "The length and mode of termination of individual muscle fibers in the human Sartorius and posterior femoral muscles," Cell Tissues Organs (1962) 48(3):242-257.
Bashour et al., "Functional Characterization of a T Cell Stimulation Reagent for the Production of Therapeutic Chimeric Antigen Receptor T Cells," Abstract of Poster, presented at American Society of Hematology Annual Meeting, Orlando, FL (Dec. 5, 2015) 1 page.
Bashour et al., "Functional Characterization of a T Cell Stimulation Reagent for the Production of Therapeutic Chimeric Antigen Receptor T Cells," Presentation of Poster, presented at American Society of Hematology Annual Meeting, Orlando, FL (Dec. 5, 2015).
Baum, C. et al. (Jun. 2006, e-pub. Apr. 24, 2006). "Retrovirus Vectors: Toward the Plentivirus?" Molecular Therapy 13(6)1050-1063.
Berg et al., "Sustained TCRsignaling is required for mitogen-activated protein kinase activation anddegranulation by cytotoxic T lymphocytes." 1998. J. Immunol. 161(6), 2919-2924.
Berger et al., "Adoptive transfer of effector CD8 T cells derived from central memory cells establishes persistent T cell memory in primates." (2008) J Clin Invest 118(1):294-305.
Bes, C. et al. (2003). "Mapping the Paratope of Anti-CD4 Recombinant Fab 13B8.2 by Combining Parallel Peptide Synthesis and Site-directed Mutagenesis", The Journal of Biological Chemistry 278(16):14265-14273.
Beste et al., "Small antibody-like proteins with prescribed ligand specificities derived from the lipocalin fold," Proc Natl Acad Sci U S A. Mar. 2, 1999;96(5):1898-1903.
Birnbaum et al., "Molecular architecture of the αβ T cell receptor-CD3 complex." Proc Natl Acad Sci USA. Dec. 9, 2014;111(49):17576-81. doi: 10.1073/pnas.1420936111.
Blair, P.J. et al. (Feb. 21, 2000). "Cd40 Ligand (Cd154) Triggers a Short-Term Cd4+ T Cell Activation Response That Results in Secretion of Immunomodulatory Cytokines and Apoptosis", J Exp Med. 191(4):651-660.
Boerman et al., "Pretargeted radioimmunotherapy of cancer: progress step by step." Journal of Nuclear Medicine, (2003) 44(3); 400-411.
Boris-Lawrie, K.A. et al. (Feb. 1993). "Recent advances in retrovirus vector technology", *Curr Opin Genet Dev.* 3(1):102-109.
Brash, E.D. (May 1987). "Strontium Phosphate Transfection of Human Cells in Primary Culture: Stable Expression of the Simian Virus 40 Large-T-Antigen Gene in Primary Human Bronchial Epithelial Cells", *Mol. Cell. Biol.* 7(5):2031-2034.
Brentjens, R. et al. (Mar. 20, 2013). "CD19-targeted T cells rapidly induce molecular remissions in adults with chemotherapy-refractory acute lymphoblastic leukemia", Sci. Transl. Med. 5(177):177ra38, 19 pages.
Brosseron et al. "Isolating peripheral lymphocytes by density gradient centrifugation and magnetic cell sorting" Methods Mol Biol (2015) 1295:33-42.
Buckle et al., "Integrating Experiment and Theory to Understand TCR-pMHC Dynamics." Front Immunol. Dec. 7, 2018;9:2898.
Burns, J.C. et al. (Sep. 1993). "Vesicular stomatitis virus G glycoprotein pseudotyped retroviral vectors: concentration to very high titer and efficient gene transfer into mammalian and nonmammalian cells", Proc. Natl. Acad. Sci. U.S.A. 90(17):8033-8037.
Busch et al., "Differing roles of inflammation and antigen in T cell proliferation and memory generation." J Immunol. (2000) 164(8); 4063-4070.
Carrillo et al., "The Multiple Sequence Alignment Problem in Biology," SIAM J Applied Math (1988) 48:1073.
Carlens, S. (Oct. 2000). "Ex vivo T lymphocyte expansion for retroviral transduction: influence of serum-free media on variations in cell expansion rates and lymphocyte subset distribution", *Exp Hematol* 28(10):1137-1146.
Carpenter et al., "B-cell Maturation Antigen Is a Promising Target for Adoptive T-cell Therapy of Multiple Myeloma," Clin Cancer Rest (2013) 19(8):2048-2060.
Carpentier et al., 2009. "T-cell artificial focal triggering tools: linking surface interactions with cell response." PLoS One (2009) 4(3), e4784.
Casalegno-Garduño et al., Multimer technologies for detection and adoptive transfer of antigen-specific T cells. Cancer Immunol Immunother. Feb. 2010;59(2):195-202 Check Spec.
Casati et al., "Enrichment, stimulation, and viral transduction of naive and central memory CD8+ T cells under GMP conditions for translational research towards the development of adoptive cell therapy of cancer patients," MACS&more (2013) 15:20-24.
Cavalieri, S. et al. (Jul. 15, 2003). "Human T lymphocytes transduced by lentiviral vectors in the absence of TCR activation maintain an intact immune competence", 102(2):497-505.
Challita et al., "Multiple modifications in cis elements of the long terminal repeat of retroviral vectors lead to increased expression and decreased DNA methylation in embryonic carcinoma cells," J Virol (1995) 69(2):748-755.

(56) References Cited

OTHER PUBLICATIONS

Chang et al., "Identification and selective expansion of functionally superior T cells expressing chimeric antigen receptors," J Transl Med (2015) 13(1):161.
Cheadle et al., "Chimeric antigen receptors for T-cell based therapy," Methods Mol Biol. (2012);907:645-66.
Chen et al., "Biotin IgM Antibodies in Human Blood: A Previously Unknown Factor Eliciting False Results in Biotinylation-Based Immunoassays," Plos One (2012); 7(8); e42376, pp. 1-8.
Chervin et al., "Engineering higher affinity T cell receptors using a T cell display system, " J Immunol Methods (2008) 339:175-184.
Chicaybam, L. et al. (Mar. 26, 2013). "An Efficient Low Cost Method for Gene Transfer to T Lymphocytes", PLOS One 8(3):e60298, 11 pages.
Chothia et al., "The outline structure of the T-cell alpha beta receptor," EMBO J (1988) 7:3745.
Choudhuri et al., "Signaling microdomains in T cells." FEBS Lett. (2010) 584(24); 4823-4831.
Church et al., "Tumor-specific CD4+ T cells maintain effector and memory tumor-specific CD8+ T cells," Eur J Immunol (2013) 44(1):69-79.
Clackson et al., "Making antibody fragments using phage display libraries," Nature (1991) 352:624-628.
Clement et al., "Analysis of the monocyte Fc receptors and antibody-mediated cellular interactions required for the induction of T cell proliferation by anti-T3 antibodies." J Immunol. (1985) 135(1): 165-71.
Cohen et al., "Recombinant antibodies with MHC-restricted, peptide-specific, T-cell receptor-like specificity: new tools to study antigen presentation and TCR-peptide-MHC interactions," J Mol Recogn (2003) 16:324-332.
Cooper, L.J.N. (Feb. 15, 2003). "T-cell clones can be rendered specific for CD19: toward the selective augmentation of the graft-versus-B-lineage leukemia effect", Blood 101(4):1637-1644.
Crompton et al., "Akt inhibition enhances expansion of potent tumor-specific lymphocytes with memory cell characteristics," Cancer Res. (2015) 75(2):296-305.
Dainiak et al., Methods in Cell Separations. Adv Biochem Eng Biotechnol. 2007;106:1-18.
Daniels et al., "Thymic Selection Threshold Defined by Compartmentalization of Ras/MAPK Signalling," Nature. Dec. 7, 2006; 444(7120): 724-729.
Davila, M. L. et al. (Apr. 9, 2013). "CD19 CAR-Targeted T Cells Induce Long-Term Remission and B Cell Aplasia in an Immunocompetent Mouse Model of B Cell Acute Lymphoblastic Leukemia", PLOS One 8(4):e61338, 14pgs.
Davis et al., "The kinetic-segregation model: TCR triggering and beyond." Nat. Immunol. 7, 803-809 (2006).
De Felipe et al., "Skipping the co-expression problem: the new 2A "CHYSEL"technology," Genetic Vaccines and Ther (2004) 2:13.
De Felipe et al., "Targeting of proteins derived from self-processing polyproteins containing multiple signal sequences," Traffic (2004) 5:616-626.
Deng, Z.B. et al. (Jun. 2004). "An agonist human ICOS monoclonal antibody that induces T cell activation and inhibits proliferation of a myeloma cell line", Hybrid Hybridomics. 23(3):176-182.
Depil et al., "Off-the-shelf allogeneic CAR T cells: development and challenges." Nat Rev Drug Discov (2020) 3: 185-199.
Dubel et al., "Bifunctional and multimeric complexes of streptavidin fused to single chain antibodies (scFv)," J Immunol Methods (1995) 178(2):201-209.
Effenberger et al., "FLEXamers: A Double Tag for Universal Generation of Versatile Peptide-MHC Multimers." J Immunol. Apr. 1, 2019;202(7):2164-2171.
Fairhead, M. et al. (Jan. 9, 2014). "Plug-and-Play Pairing via Defined Divalent Streptavidins", J Mol Biol. 426(1):199-214.
Faraghat et al. "High-throughput, low-loss, low-cost, and label-free cell separation using electrophysiology-activated cell enrichment." Proc Natl Acad Sci U S A. (May 2, 2017) 114(18): 4591-4596.
Fedorov, V.D. et al. (Dec. 11, 2013). "PD-1- and CTLA-4-Based Inhibitory Chimeric Antigen Receptors (iCARs) Divert Off-Target Immunotherapy Responses", Sci. Transl. Med. 5(215):215ra172, 25 pgs.
Frecha, C. et al. (Oct. 2010, e-pub. Aug. 24, 2010). "Advances in the Field of Lentivector-based Transduction of T and B Lymphocytes for Gene Therapy", Molecular Therapy 18(10):1748-1757.
Garlie et al., "T cells coactivated with immobilized anti-CD3 and anti-CD28 as potential immunotherapy for cancer." J. Immunother. (1999) 22(4); 336-345.
Gattinoni and Restifo, "Moving T memory stem cells to the clinic," Blood (2013) 121(4):567-8.
Gattinoni, L. et al. (2012, e-pub. Sep. 21, 2012)."Paths to stemness: building the ultimate antitumour T cell", Nature Reviews Cancer 12(671):1-14.
Gearing et al., "The international standard for human interleukin-2. Calibration by international collaborative study," J Immunol Methods (1988) 114(1-2):3-9.
Germeroth "IBA T-catch cell isolation in pipette tips" Apr. 23, 2014 Retrieved from the internet: URL:http://x.ymcdn.com/sites/www.celltherapysociety.org/resource/resmgr/2014_AnnualMtgPresentations/T2_L.Germeroth.pdf [Retrieved on Jan. 23, 2017].
Ghassemi et al., "Reducing Ex Vivo Culture Improves the Antileukemic Activity of Chimeric Antigen Receptor (CAR) T Cells," Cancer Immunology Research (2018) 6(9):1100-1109. DOI: 10.1158/2326-6066.CIR-17-0405.
Ghassemi S., "Ultra-Short Manufacturing of Quiescent Chimeric Antigen Receptor T Cells for Adoptive Immunotherapy," Molecular Therapy vol. 27 No 4S1 Apr. 2019, p. 86.
Gill et al., "Biopharmaceutical drug discovery using novel protein scaffolds," Curr Opin Biotechnol. Dec. 2006;17(6):653-658.
Godawat et al., "Period counter-current chromatography—design and operational considerations for integrated and continuous purification of proteins," Biotechnology journal (2012) 7(12):1496-1508.
Goyette et al., "How does T cell receptor clustering impact on signal transduction?" J Cell Sci. Feb. 11, 2019;132(4). pii: jcs226423. doi: 10.1242/jcs.226423.
Grutzkau et al. "Small but mighty: how the MACS-technology based on nanosized superparamagnetic particles has helped to analyze the immune system within the last 20 years." Cytometry A. (Jul. 2010) 77(7): 643-647.
Guedan et al. "Emerging Cellular Therapies for Cancer." Annu Rev Immunol. (Apr. 26, 2019) 37:145-171.
Hackett, P.B. et al. (Apr. 2010, e-pub. Jan. 26, 2010). "A Transposon and Transposase System for Human Application", Mol. Ther. 18(4):674-683.
Han et a., "Chimeric antigen receptor T-cell therapy for cancer: a basic research-oriented perspective," Mar. 2018;10(3):221-234.
Hermans, I.F. et al. (2004). "The Vital Assay: A Versatile Fluorometric Technique for Assessing CTL- and NKT-mediated Cytotoxicity Against Multiple Targets in Vitro and in Vivo", J. Immunological Methods 285(1):25-40.
Hobson et al., "In situ transfuction of target cells on solid surfaces by immobilized viral vectors," BMC Biotechnol (2003) 3(4):1-10.
Holler et al., "TCRs with high affinity for foreign pMHC show self-reactivity," Nat Immunol (2003) 4(1):55-62.
Holler et al., "In vitro evolution of a T cell receptor with high affinity for peptide/MHC," Proc Natl Acad Sci USA (2000) 97:5387-5392.
Holliger, P. et al., "Diabodies": small bivalent and bispecific antibody fragments, Proc Natl Acad Sci U S A. Jul. 15, 1993;90(14):6444-6448.
Holt et al., Domain antibodies: proteins for therapy. Trends Biotechnol. Nov. 2003;21(11):484-490.
Honegger A and Plückthun A, "Yet another numbering scheme for immunoglobulin variable domains: an automatic modeling and analysis tool," J Mol Biol, Jun. 8, 2001;309(3):657-70.
Hoo et al., "Characterization of a single-chain T-cell receptor expressed in *Escherichia coli*." PNAS (1992) 89(10):4759-4763.
Howarth, M. et al. (Apr. 2006). "A monovalent streptavidin with a single femtomolar biotin binding site," Nat Methods 3(4):267-273.

(56) References Cited

OTHER PUBLICATIONS

Hu et al., "T-cell Homing Therapy for Reducing Regulatory T Cells and Preserving Effector T-cell Function in Large Solid Tumors," Clin Cancer Res. (2018) 24(12):2920-2934.
Huang, X. et al. (2009). "DNA Transposons for Modification of Human Primary T Lymphocytes1", Methods in Mol Biol 506:115-126.
Hudecek et al., "Receptor affinity and extracellular domain modifications affect tumor recognition by ROR1-specific chimeric antigen receptor T cells," Clin Cancer Res. Jun. 15, 2013;19(12):3153-3164.
Hudson et al., "Engineered Antibodies," Nature Medicine (2003) 9(1):129-133.
Hunziker et al., "Exhaustion of cytotoxic T cells during adoptive immunotherapy of virus carrier mice can be prevented by B cells or CD4+ T cells," Eur J Immunol (2002) 32(2):374-382.
Huppa et al., "T-cell-antigen recognition and the immunological synapse," Nat. Rev. Immunol. (2003) 3(12); 973-983.
Hutten et al., New magnetic nanoparticles for biotechnology. J Biotechnol. Aug. 26, 2004;112(1-2):47-63.
Iliades et al., "Triabodies: single chain Fv fragments without a linker form trivalent trimers," FEBS Lett. Jun. 16, 1997;409(3):437-441.
Ill et al., "Design and construction of a hybrid immunoglobulin domain with properties of both heavy and light chain variable regions," Protein Eng. Aug. 10, 1997(8):949-957.
Imadome, "The clinical condition and diagnosis of EBV-T/NK-LPD (CAEBV, EBV-HLH etc.)," [Rinsho Ketsueki] Japanese J Clin Hematol (2013) 54(10):1992-98. (Reference in Japanese).
Invitrogen, "Healthy cells in—good data out," Cell isolation and Activation (2010) p. 1-12.
Isozaki et al. "Intelligent image-activated cell sorting 2.0." Lab Chip. (Jun. 30, 2020) 20(13): 2263-2273.
Janeway et al., Immunobiology: The Immune System in Health and Disease, 3rd ED., Current Biology Publications (1997), p. 4:33.
Johnston, S.A. (1990). "Biolistic transformation: microbes to mice", Nature 346(6286):776-777.
Jores et al., "Resolution of hypervariable regions in T-cell receptor beta chains by a modified Wu-Kabat index of amino acid diversity." Proc Natl Acad Sci USA (1990) 87:9138.
Kacherovsky et al. "Traceless aptamer-mediated isolation of CD8+ T cells for chimeric antigen receptor T-cell therapy." Nat Biomed Eng. (Oct. 2019) 3(10):783-795.
Kato et al., "Development of Rous sarcoma Virus-like Particles Displaying hVV49 scFv for specific targeted drug delievery to human colon carcinoma cells," Pharm Res (2015) 32:3699-3707.
Kim et al., "The ABCs of Artificial Antigen Presentation," Nat Biotechnol Apr. 22, 2004(4): 403-10.
Klebanoff, C.A. et al. (Nov. 2012). "Sorting through subsets: Which T cell populations mediate highly effective adoptive immunotherapy?", J Immunother 35(9):651-660.
Kleymann et al. "Engineered Fv Fragments as a Tool for the One-Step Purification of Integral Multisubunit Membrane Protein Complexes." Nat Biotechnol (1995) 13: 155-160.
Knabel et al., "Reversible MHC multimer staining for functional isolation of T-cell populations and effective adoptive transfer," Nat Med. Jun. 2002; 8(6):631-637.
Kochenderfer, J. N. et al. (May 2013, e-pub. Apr. 2, 2013). "Treating B-cell cancer with T cells expressing anti-CD19 chimeric antigen receptors", Nat Rev. Clin Oncol. 10(5):267-276.
Kochenderfer, J.N. et al. (Sep. 2009). "Construction and Pre-clinical Evaluation of an Anti-CD19 Chimeric Antigen Receptor", J Immunother. 32(7):689-702.
Kohanski, R.A., Lane, M.D. "Monovalent avidin affinity columns" Methods Enzymol. 1990;184:194-200.
Kong et al., "Isolation of breast cancer stem cell and screening of specific polypeptide bonding to it," Chinese Journal of Cancer Prevention and Control (2013) 20(24):1892-1895.

Korndorfer et al., "Improved affinity of engineered streptavidin for the Strep-tag 11 peptide is due to a fixed open conformation of the lid-like loop at the binding site," Protein Sci (2002) 11:883-893.
Koste, L. et al. (May 2014, e-pub. Apr. 3, 2014). "T-cell receptor transfer into human T cells with ecotropic retroviral vectors", Gene Ther 21(5):533-538.
Kotb, "Bacterial pyrogenic exotoxins as superantigens," Clin Microbiol Rev (1995) 8(3):411-426.
Kubben et al. "Identification of differential protein interactors of lamin A and progerin," Nucleus (2010) 1(6): 513-525.
Kumar et al., "Cell separation using cryogel-based affinity chromatography", Nature Protocols, Nature Publishing Group, GB, vol. 5, No. 11, Nov. 1, 2010, pp. 1737-17 47.
Kumar et al., Affinity binding of cells to cryogel adsorbents with immobilized specific ligands: effect of ligand coupling and matrix architecture. J Mol Recognit. Jan.-Feb. 2005;18(1):84-93.
Kumar et al., "Integrated bioprocess for the production and isolation of urokinase from animal cell culture using supermacroporous cryogel matrices," Biotechnology and Bioengineering (2006) 93(4):636-646.
Kurucz et al., "A bacterially expressed single-chain Fv construct from the 2B4 T-cell receptor," PNAS USA (1993) 90:3830.
Kwon et al., "Quantitative evaluation of the relative cell permeability of peptoids and peptides," J Am Chem Soc. Feb. 14, 2007;129(6):1508-1509.
Lada et al., "Quantitation of Integrated HIV Provirus by Pulsed-Field Gel Electrophoresis and Droplet Digital PCR," J Clin Microbiol (2018) 56(12): e01158-18.
Larvor et al., Measurement of the dissociation rate constant of antigen/antibody complexes in solution by enzyme-linked immunosorbent assay. J Immunol Methods. Apr. 15, 1994;170(2):167-175.
Lefranc et al., "IMGT unique numbering for immunoglobulin and T cell receptor variable domains and Ig superfamily V-like domains," Dev Comp Immunol (2003) 27(1):55-77.
Lenschow et al., "CD28/B7 system of T cell costimulation." Annu Rev Immunol. 1996;14:233-58.
Levin et al., "Optimizing the affinity and specificity of proteins with molecular display," Mol BioSyst (2006) 2:49-57.
Levine et al., 1997. "Effects of CD28 costimulation on long-term proliferation of CD4+ T cells in the absence of exogenous feeder cells." J. Immunol. (1997) 159(12), 5921-5930.
Li et al., "Comparison of inlet geometry in microfluidic cell affinity chromatography," Analytical chemistry (2011) 83(3):774-781.
Li et al., "Directed evolution of human T-cell receptors with picomolar affinities by phage display," Nature Biotechnology (2005) 23:349-354.
Li et al., "Negative enrichment of target cells by microfluidic affinity chromatography," Analytical Chemistry (2011) 83(20):7863-7869.
Li et al., "Multiparameter cell affinity chromatography: Separation and analysis in a single microfluidic channel," Anal Chem (2012) 84(19):8140-8148.
Li et al.. "T cell receptor signalling in the control of regulatory T cell differentiation and function." Nat Rev Immunol. (2016) 16(4): 220-233. doi: 10.1038/nri.2016.26.
Li, Y. et al., "Comparison of anti-CD3 and anti-CD28-coated Beads With Soluble anti-CD3 for Expanding Human T Cells: Differing Impact on CD8 T Cell Phenotype and Responsiveness to Restimulation," J Transl Med (2010) 8: 104.
Lim et al. "Engineered Streptavidin Monomer and Dimer with Improved Stability and Function," Biochemistry (2010), 50:8682-91.
Ling et al., "B-cell and plasma cell antigens: new and previously defined clusters," Leucocyte typing III (1987) 302.
Liu et al., "Inclusion of Strep-tag II in design of antigen receptors for T-cell immunotherapy," Nature Biotech (2016) 34(4):430-434.
Liu J, Zhou G, Zhang L, Zhao Q. "Building Potent Chimeric Antigen Receptor T Cells with CRISPR Genome Editing," Front Immunol. Mar. 19, 2019;10:456. doi: 10.3389/fimmu.2019.00456.
Lu et al., "A rapid cell expansion process for production of engineered autologous CAR-T cell therapies," Human Gene Therapy Methods (2016) 27(6):209-218.

(56) References Cited

OTHER PUBLICATIONS

Lupton, S. D. et al. (Jun. 1991). "Dominant Positive and Negative Selection Using a Hygromycin Phosphotransferase-Thymidine Kinase Fusion Gene", *Mol. and Cell Biol*.11(6):3374-3378.
MacCallum et al., J. Mol. Biol. 262:732-745 (1996), "Antibody-antigen interactions: Contact analysis and binding site topography," J. Mol. Biol. 262, 732-745.
Manuri, P.V.R. et al. (Apr. 2010). "piggyBac Transposon=Transposase System to Generate CD19-Specific T Cells for the Treatment of B-Lineage Malignancies", Human Gene Therapy 21:427-437.
Martin et al., "The affinity-selection of a minibody polypeptide inhibitor of human interleukin-6," EMBO J. Nov. 15, 1994;13(22):5303-5309.
Martin et al., "Modeling antibody hypervariable loops: a combined algorithm," PNAS, 1989, 86(23):9268-9272.
Matic et al., "ine Tuning and Efficient T Cell Activation with Stimulatory aCD3 Nanoarrays," Nano Letters (2013) 13:5090-5097.
Mehlhop-Williams et al., "Memory CD8+ T cells exhibit increased antigen threshold requirements for recall proliferation." J Exp Med. (2014) 211(2): 345-56. doi: 10.1084/jem.20131271.
Melero et al., "Agonist antibodies to TNFR molecules that costimulate T and NK cells," Clin Cancer Res (2013) 19(5):1044-1053.
Meyer et al., "Biodegradable nanoellipsoidal artificial antigen presenting cells for antigen specific T-cell activation." Small. (2015) 11(13):1519-1525. doi: 10.1002/smll.201402369.
Miller, A.D. (Spring 1990). "Retrovirus Packaging Cells", *Hum Gene Ther*. 1(1):5-14.
Miller, A.D. et al. (Oct. 1989). "Improved Retroviral Vectors for Gene Transfer and Expression", Biotechniques. 7(9):980-990.
Milone et al., "Chimeric Receptors Containing CD137 Signal Transduction Domains Mediate Enhanced Survival of T Cells and Increased Antileukemic Efficacy In Vivo," Mol Ther (2009) 17(8):1453-64.
Miltenyi et al., High Gradient Magnetic Cell Separation With MACS. Cytometry. 1990;11(2):231-238.
Mittal et al. "Biotin-4-fluorescein based fluorescence quenching assay for determination of biotin binding capacity of streptavidin conjugated quantum dots." Bioconjug Chem. (2011) 22(3):362-368.
Mittler, R.S. et al. (2004). "Anti-CD137 antibodies in the treatment of autoimmune disease and cancer", Immunol. Res. 29(1-3):197-208.
Mohr et al., "Efficient immunoaffinity chromatography of lymphocytes directly from whole blood." Sci Rep. 2018 8(1):16731. doi: 10.1038/s41598-018-34589-z.
Mohr et al., "Minimally manipulated murine regulatory T cells purified by reversible Fab Multimers are potent suppressors for adoptive T-cell therapy." Eur. J. Immunol. (2017) 47: 2153-2162.
Morizono et al., "A versatile targeting system with lentiviral vectors bearing the biotin-adaptor peptide," J Gene Med. Aug. 2009;11(8):655-63.
Mosavi et al., "The ankyrin repeat as molecular architecture for protein recognition," Protein Sci. Jun. 2004;13(6):1435-1448.
Murray et al. "Continuous and Quantitative Purification of T-Cell Subsets for Cell Therapy Manufacturing Using Magnetic Ratcheting Cytometry." SLAS Technol. (Aug. 2018) 23(4):326-337.
Naldini "Lentiviruses as gene transfer agents for delviery to non-dividing cells." Curr Opin Biotechnol. Oct. 1998; 9(5):457-63.
Nauerth et al., "Flow cytometry-based TCR-ligand Koff-rate assay for fast avidity screening of even very small antigen-specific T cell populations ex vivo." Cytometry A. (2016) 89(9):816-825. doi: 10.1002/cyto.a.22933.
Neeson et al., "Ex Vivo Culture of Chimeric Antigen Receptor T Cells Generates Functional CD8+ T Cells With Effector and Central Memory-Like Phenotype," Gene Ther (2010) 17(9): 1105-16.
Neuenhahn et al., "Transfer of minimally manipulated CMV-specific T cells from stem cell or third-party donors to treat CMV infection after alloHSCT." Leukemia (2017) 31(10): 2161-2171.
Noguchi et al., "Preparation and properties of the immunoconjugate composed of anti-human colon cancer monoclonal antibody and mitomycin C-dextran conjugate," Bioconjug Chem. Mar.-Apr. 1992;3(2):132-7.
Okamoto et al., "A Promising Vector for TCR Gene Therapy: Differential Effect of siRNA, 2A Peptide, and Disulfide Bond on the Introduced TCR Expression," Mol Ther Nucleic Acids. (2012) 1(12): e63. 11 pages.
Padmanabhan et al., Purification of Transiently Transfected Cells by Magnetic Affinity Cell Sorting. J Immunogenet. Apr. 1989; 16(2):91-102.
Park, J-J. et al. (Feb. 2012, e-pub. Aug. 30, 2011). "Expression of anti-HVEM single-chain antibody on tumor cells induces tumor-specific immunity with long-term memory", Cancer Immunol Immunother 61(2):203-214.
Park, T. S. et al. (Nov. 2011). "Treating Cancer with Genetically Engineered T Cells", Trends Biotechnol. 29(11):550-557.
Paulsen, M. et al. (Apr. 2011, e-pub. Nov. 5, 2010). "Modulation of CD4+ T-cell activation by CD95 co-stimulation", Cell Death Differ. 18(4):619-631.
Pearce EL. "Metabolism in T cell activation and differentiation," Curr. Opin. Immunol. (2010) 22(3), 314-320.
Perkins et al., "Manufacturing an Enhanced CAR T Cell Product By Inhibition of the PI3K/Akt Pathway During T Cell Expansion Results in Improved In Vivo Efficacy of Anti-BCMA CAR T Cells," Blood (2015) 126(23):1893.
Plieva et al., "Characterization of supermacroporous monolithic polyacrylamide based matrices designed for chromatography of bioparticles," Journal of Chromatography (2004) 807(1):129-137.
Poltorak et al., "Expamers: a new technology to control T cell activation." Sci. Rep. (2020) 10: 17832.
Poltorak et al., "TCR activation kinetics and feedback regulation in primary human T cells." Cell Commun Signal. Jan. 14, 2013;11:4. doi: 10.1186/1478-811X-11-4.
Portolano et al., "Lack of promiscuity in autoantigen-specific H and L chain combinations as revealed by human H and L chain "roulette"." J Immunol (1993) 150:880-887.
Pozarowski et al., "Analysis of Cell Cycle by Flow Cytometry," Methods Mol Biol. (2004) 281: 301-311.
Pritchard et al. "Cell sorting actuated by a microfluidic inertial vortex." Lab Chip. (Jul. 9, 2019) 19(14): 2456-2465.
Pullagurla et al., "Parallel affinity-based isolation of leukocyte subsets using microfluidics: application for stroke diagnosis," Analytical chemistry (2014) 86(8):4058-4065.
Qiagen: "Strep-tagged Protein Purification Handbook For expressing, purifying, and detecting proteins carrying a Strep-tag II or a 6xHis tag and a Strep-tag II Two-step protein purification system His.Strep pQE-TriSystem Vector Set pQE-TriSystem Strep Vector Strep-Tactin Superflow and Superflow Cartridge", Apr. 1, 2007 (Apr. 1, 2007).
Qin et al. "Chimeric Antigen Receptor beyond CAR-T Cells." Cancers (Basel). (Jan. 22, 2021) 13(3):404.
Qureshi et al., "Development and characterization of a series of soluble tetrameric and monomeric streptavidin muteins with differential biotin binding affinities," The Journal of Biological Chemistry (2001) 276(49):46422-46428.
Rapoport et al., "Restoration of immunity in lymphopenic individuals with cancer by vaccination and adoptive T-cell transfer." Nat Med. (2005) 11(11):1230-1237.
Riddell et al., "The use of anti-CD3 and anti-CD28 monoclonal antibodies to clone and expand human antigen-specific T cells." J Immunol Methods. (1990) 128(2): 189-201.
Riddell, S.R. et al. (Jun. 1992). "Phase I study of cellular adoptive immunotherapy using genetically modified CD8+ HIV-specific T cells for HIV seropositive patients undergoing allogeneic bone marrow transplant. The Fred Hutchinson Cancer Research Center and the University of Washington School of Medicine, Department of Medicine, Division of Oncology", 3(3):319-338.
Rosenberg, S.A. (Aug. 2011). "Cell transfer immunotherapy for metastatic solid cancer—what clinicians need to know", 8(10):577-585.

(56) References Cited

OTHER PUBLICATIONS

Rossy et al., "How Does the Kinase Lck Phosphorylate the T Cell Receptor? Spatial Organization as a Regulatory Mechanism," Front Immunol. (2012) 3:167.
Rudd et al., "CD28 and CTLA-4 coreceptor expression and signal transduction." Immunol Rev. (2009) 229(1); 12-26.
Rybak, J.N., et al. "Purification of biotinylated proteins on streptavidin resin: a protocol for quantitative elution," Proteomics. 2004 4(8): 2296-2299.
Sabatino et al., "Generation of clinical-grade CD19-specific CAR-modified CD8+ memory stem cells for the treatment of human B-cell malignancies," Blood. Jul. 28, 2016;128(4):519-28.
Sadelain, M. et al. (Apr. 2013, e-pub. Apr. 2, 2013). "The basic principles of chimeric antigen receptor (CAR) design", Cancer Disc. 3(4):388-398.
Sanchez-Paulete et al., "Deciphering CD137 (4-1BB) signaling in T-cell costimulation for translation into successful cancer immunotherapy." Eur. J. Immunol. (2016) 46(3); 513-522. doi:10.1002/eji.201445388.
Sano et al., "A streptavidin-protein a chimera that allows one-step production of a variety of specific antibody conjugates," Nature (1991) 9:1378-1381.
Sawai et al., "A novel method of cell-specific mRNA transfection," Molecular Genetics of Metabolim (1998) 64:44-51.
Scarpa, M. et al. (Feb. 1991). "Characterization of recombinant helper retroviruses from Moloney-based vectors in ecotropic and amphotropic packaging cell lines", Virology 180(2):849-852.
Schlueter et al., :"Specificity and binding properties of a single-chain T cell receptor," J Mol Biol (1996) 256(5):859-869.
Schmidt and Skerra, The Strep-tag system for one-step purification and high-affinity detection or capturing of proteins. Nat Protoc. 2007;2(6):1528-1535.
Schmidt et al., "Development of the Twin-Strep-tag and its application for purification of recombinant proteins from cell culture supernatants." Protein Expression and Purification (2013) 92(1); 54-61.
Schmidt et al., "Molecular Interaction Between the Strep-tag Affinity Peptide and its Cognate Target, Streptavidin." Mol. Biol. (1996) 255(5); 753-766.
Schmidt et al., "The random peptide library-assisted engineering of a C-terminal affinity peptide, useful for the detection and purification of a functional Ig Fv fragment." Protein Eng. (1993) 6(1); 109-122.
Schmitt et al., "Adoptive transfer and selective reconstitution of streptamer-selected cytomegalovirus-specific CD8+ T cells leads to virus clearance in patients after allogeneic peripheral blood stem cell transplantation," Transfusion. Mar. 2011;51(3):591-9.
Schober et al., "Orthotopic replacement of T-cell receptor α- and β-chains with preservation of near-physiological T-cell function." Nat Biomed Eng. (2019) 3(12): 974-984. doi: 10.1038/s41551-019-0409-0.
Schuler et al. SYFPEITHI, Database for Searching and T-Cell Epitope Prediction. in Immunoinformatics Methods in Molecular Biology, vol. 409(1): 75-93 2007.
Schroeder, Nach Zellen Angeln. Faszination Forschung Jun. 30, 2010:28-37 Retrieved from the Internet: URL:http://portal.mytum.de/pressestelle/faszination-forschung/2010nr6/index (Including English translation).
Sharma, N. et al. (Feb. 2013, e-pub. Feb. 26, 2013). "Efficient Sleeping Beauty DNA Transposition From DNA Minicircles", Mol Ther Nucleic Acids. 2(2):e74, 10 pages.
Silverman et al., "Multivalent avimer proteins evolved by exon shuffling of a family of human receptor domains," Nat Biotechnol. Dec. 2005;23(12):1556-61.
Singh et al., "ProPred: prediction of HLA-DR binding sites," Bioinformatics (2001) 17(12):1236-1237.
Singh et al. "CAR T cells: continuation in a revolution of immunotherapy." The Lancet Oncology (Mar. 2020) 21(3): e168-e178.
Skerra et al., "Applications of a peptide ligand for streptavidin: the Strep-tag," Biomolecular Engineer (1999) 16(1-4):79-86.
Skerra, "Engineered protein scaffolds for molecular recognition," J Mol Recognit. Jul.-Aug. 2000;13(4):167-87.
Smith et al., "Ex vivo expansion of human T cells for adoptive immunotherapy using the novel Xeno-free CTS Immune Cell Serum Replacement," Clinical & Translational Immunology (2015) 4:e31.
Soman et al., "MTS dye based colorimetric CTLL-2 cell proliferation assay for product release and stability monitoring of interleukin-15: assay qualification, standardization and statistical analysis," J Immunol Methods (2009) 348(1-2):83-94.
Stemberger et al., Novel Serial Positive Enrichment Technology Enables Clinical Multiparameter Cell Sorting. PLoS One. 2012;7(4):e35798 (11 pp).
Stone et al., "The assembly of single domain antibodies into bispecific decavalent molecules," J Immunol Methods. Jan. 10, 2007;318(1-2):88-94.
Sun et al., "Plug-and-go" strategy to maniupulate streptavidin valencies, Bioconjugate Chem (2014) 25:1375-1380.
Szoka, F. Jr. et al. (1980). "Comparative Properties and Methods of Preparation of Lipid Vesicles (Liposomes)", Ann. Rev. Biophys. Bioeng. 9:467-508.
Tamada et al., "Redirecting Gene-Modified T Cells toward Various Cancer Types Using Tagged Antibodies," Eur J Immunol (2002) 32(12):3617-3627.
Taraban et al. (Dec. 2002, e-pub. ). "Expression and costimulatory effects of the TNF receptor superfamily members CD134 (OX40) and CD137 (4-1BB), and their role in the generation of anti-tumor immune responses", Eur J Immunol. 32(12):3617-3627.
Terakura, S. et al. (Jan. 5, 2012, e-pub. Oct. 26, 2011). "Generation of CD19-chimeric antigen receptor modified CD8+ T cells derived from virus-specific central memory T cells", Blood 119(1):72-82.
Themeli, M. et al. (Oct. 2013, e-pub. Aug. 11, 2013). "Generation of tumor-targeted human T lymphocytes from induced pluripotent stem cells for cancer therapy", Nat Biotechnol. 31(10):928-933.
ThermoFisher Scientific, Avidin-Biotein Interaction, retrieved from https://www.thermofisher.com/us/en/home/life-science/protein-biology/protein-biology-learning-center/protein-biology-resource-library/pierce-protein-methods/avidin-biotin-interaction.html on Apr. 9, 2019, pp. 1-7.
Traunecker et al., "Bispecific single chain molecules (Janusins) target cytotoxic lymphocytes on HIV infected cells," EMBO J. Dec. 1991;10(12):3655-9.
Traunecker et al., "Janusin: new molecular design for bispecific reagents," Int J Cancer Suppl. (1992);7:51-2.
Trickett et al., "T cell stimulation and expansion using anti-CD3/CD28 beads" J. Immunol Methods (2003) 275(102):251-255.
Tsiotis et al. "Isolation and structural characterization of trimeric cyanobacterial photosystem I complex with the help of recombinant antibody fragments." Eur J Biochem. (Aug. 1, 1995) 231(3):823-30.
Tsukahara, T et al. (Aug. 16, 2013, Jul. 17, 2013). "CD19 target-engineered T-cells accumulate at tumor lesions in human B-cell lymphoma xenograft mouse models", 438(1):84-89.
Tumaini et al., "Simplified process for the production of anti-CD19-CAR-engineered T cells," Cytotherapy. Nov. 2013;15(11):1406-15.
Turka et al., "CD28 is an Inducible T Cell Surface Antigen That Transduces a Proliferative Signal in CD3+ Mature Thymocytes," J Immunol (1990) 144:1646-1653.
Turtle et al., "Genetically retargeting CD8+ lymphocyte subsets for cancer immunotherapy." Curr Opin Immunol. (2011) 23(2); 299-305.
Turtle, C.J. et al. (Oct. 2012, e-pub. Jul. 18, 2012). "Engineered T cells For Anti-Cancer Therapy", Curr. Opin. Immunol. 24(5):633-639.
Urbanska et al., "A universal strategy for adoptive immunotherapy of cancer through use of a novel T-cell antigen receptor," Cancer Res (2012) 72:1844-1852.
Vadakekolathu et al. "T-Cell Manipulation Strategies to Prevent Graft-Versus-Host Disease in Haploidentical Stem Cell Transplantation." Biomedicines. (Jun. 21, 2017) 5(2): 33.

(56) References Cited

OTHER PUBLICATIONS

Valle et al., "Heterogeneous CD3 Expression Levels in Differing T Cell Subsets Correlate with the In Vivo Anti-CD3-Mediated T Cell Modulation." J Immunol. (2015) 5: 2117-2127.
Van Panhuys et al., "T-cell-receptor-dependent signal intensity dominantly controls CD4(+) T cell polarization In Vivo." Immunity. (2014) 41(1): 63-74. doi: 10.1016/j.immuni.2014.06.003.
Van Stipdonk et al., "Naïve CTLs require a single brief period of antigenic stimulation for clonal expansion and differentiation." Nat Immunol. (2001) 2(5): 423-429.
Van Tendeloo, VFI et al. (2000). "High-level transgene expression in primary human T lymphocytes and adult bone marrow CD341 cells via electroporation-mediated gene delivery", Gene Therapy 7(16):1431-1437.
Vanhove et al., "Selective blockade of CD28 and not CTLA-4 with a single-chain Fv-alpha1-antitrypsin fusion antibody," Blood. Jul. 15, 2003;102(2):564-570.
Verhoeyen, E. et al. (2009). "Lentiviral vector gene transfer into human T cells", Methods Mol Biol. 506(1):97-114.
Vormittag et al., "A Guide to Manufacturing CAR T Cell Therapies," Curr Opin Biotechnol (2018) 53: 164-181.
Voss, S. et al. (1997). "Mutagenesis of a flexible loop in Streptavidin Leads to Higher Affinity for the Strep-tag II Peptide and Improved Performance in Recombinant Protein Purification", Protein Engineering 10(8):975-982.
Wadhwa et al., "Receptor Mediated Glycotargeting," J. Drug Targeting (1995) 3:111.
Walter et al., "Cutting edge: Predetermined Avidity of Human CD8 T cells expanded on calibrated MHC/Anti-CD28-Coated Microspheres," J Immunol (2003) 171:4973-4978.
Wang et al., "A transgene-encoded cell surface polypeptide for selection, in vivo tracking, and ablation of engineered cells." Blood. (2011) 118(5):1255-1263.
Wang et al., "Clinical manufacturing of CAR T cells: foundation of a promising therapy," Mol Ther Oncolytics (2016) 3:16015.
Wang et al., "Dynamics of proximal signaling events after TCR/CD8-mediated induction of proliferation or apoptosis in mature CD8+ T cells." J. Immunol. (2008) 180(10); 6703-6712.
Wang et al., "Phenotypic and functional attributes of lentivirus-modified CD19-specific human CD8+ central memory T cells manufactured at clinical scale," J Immunother. (2012) 35(9):689-701.
Wang et al., "Open-tubular capillary cell affinity chromatography: single and tandem blood cell separation," Anal Chem (2008) 80(6):2118-2124.
Wang et al., Database Biosis. Database accession No. PREV200900325303.Abstract Only Mar. 2009: 1 page.
Wang et al., Generation of leukaemia antigen-specific donor lymphocyte infusions powered by streptamer-based selection. Bone Marrow Transplantation Mar. 2009;43(Suppl1):S73.
Wang et al., Open-Tubular Capillary Cell Affinity Chromatography: Single and Tandem Blood Cell Separation. Anal Chem. Mar. 15, 2008;80(6):2118-2124.
Wang et al.: "Streptamer-based selection of WT1-specific CD8+ T cells for specific donor lymphocyte infusions", Experimental Hematology, vol. 38, No. 11, Nov. 1, 2010 (Nov. 1, 2010), pp. 1066-1073.
Wigler, M. et al. (May 1977). "Transfer of Purified Herpes Virus Thymidine Kinase Gene to Cultured Mouse Cells", Cell 2(11):223-232.
Williams et al., "Affinity recovery of moloney murine leukaemia virus," J Chromatography B (2005) 820(1):111-119.
Wilson et al., "The use of mRNA display to select high-affinity protein-binding peptides," Proc Natl Acad Sci U S A. Mar. 27, 2001;98(7):3750-5.
Wu, R. et al. (Mar. 2012). "Adoptive T-cell Therapy Using Autologous Tumor-infiltrating Lymphocytes for Metastatic Melanoma: Current Status and Future Outlook", Cancer J. 18(2):160-175.
Wu, S.C. et al. (Jun. 17, 2005). "Engineering soluble monomeric streptavidin with reversible biotin binding capability", *J. Biol. Chem.*280(24):23225-23231.

Wulfing et al., "Correctly folded T-cell receptor fragments in the periplasm of *Escherichia coli*. Influence of folding catalysts," J Mol Biol (1994) 242:655.
Xia et al., "Enrichment of haploid spermatids in mice by flow sorting," Natl Journal of Andrology (2014) 20(2):106-110.
Xu et al., "Closely Related T-memory Stem Cells Correlate With in Vivo Expansion of CAR.CD19-T Cells and Are Preserved by IL-7 and IL-15," Blood (2014) 123 (24): 3750-3759.
Xu et al., "Multiparameter Comparative Analysis Reveals Differential Impacts of Various Cytokines on CART Cell Phenotype and Function Ex Vivo and in Vivo," Oncotarget (2016) 7(50): 82354-82368.
Xu et al., Aptamer-Based Microfluidic Device for Enrichment, Sorting, and Detection of Multiple Cancer Cells. Anal Chem. Sep. 1, 2009;81(17):7436-7442.
Yang et al., "In vitro generated anti-tumor T lymphocytes exhibit distinct subsets mimicking in vivo antigen-experienced cells." Cancer Immunol Immunother (2011) 60(5): 739-749.
Yang et al., "Targeting lentiviral vectors to specific cell types in vivo," PNAS USA (2006) 103(31):11479-11484.
Yarilin, "Immunology principles," M. Medicine (1999) 184-195, 339-347 (English Translation included).
Zeiser et al., "Acute Graft-versus-Host Disease—Biologic Process, Prevention, and Therapy," N Engl J Med (2017) 377: 2167-2179.
Zhang et al., "CD137 promotes proliferation and survival of human B cells," J Immunol. Jan. 15, 2010;184(2):787-95.
Zhang et al., "LAT: the ZAP-70 tyrosine kinase substrate that links T cell receptor to cellular activation," Cell (1998) 92(1):83-92.
Zhang, M. et al. (Aug. 7, 2015). "A novel approach to make homogeneous protease-stable monovalent streptavidin", Biochem Biophys Res Commun. 463(4):1059-1063.
Zhao et al., "Development of the First World Health Organization Lentiviral Vector Standard: Toward the Production Control and Standardization of Lentivirus-Based Gene Therapy Products," Hum Gene Ther Methods (2017) 28 (4): 205-214.
Zhou X et al., "Lentivirus-mediated gene transfer and expression in established human tumor antigen-specific cytotoxic T cells and primayr unstimulated T cels," Human Gene Therapy, vol. 14 No. 11, Jul. 20, 2003 pp. 1089-1105.
Zhu et al. "Closed-system manufacturing of CD19 and dual-targeted CD20/19 chimeric antigen receptor T cells using the CliniMACS Prodigy device at an academic medical center." Cytotherapy. (Mar. 2018) 20(3):394-406.
Zufferey et al. "Self-Inactivating Lentivirus Vector for Safe and Efficient In Vivo Gene Delivery," J. Virol (1998) 72(12):9873-9880.
Zufferey et al. "Woodchuck Hepatitis Virus Posttranscriptional Regulatory Element Enhances Expression of Transgenes Delivered by Retroviral Vectors" 1999. J. Virol. Vol. 73, No. 4, pp. 2886-2892.
U.S. Appl. No. 18/289,557, filed May 5, 2022, by Poltorak et al. (Copy not provided). (Copy not submitted herewith pursuant to the waiver of 37 C.F. R. § 1.98(a)(2)(iii) issued by the Office on Sep. 21, 2004).
Bostrom et al., "High affinity antigen recognition of the dual specific variants of herceptin is entropy-driven in spite of structural plasticity," PLoS One. (2011) 6(4):e17887, 12 pages.
Chai et al., "Single-molecule protein arrays enabled by scanning probe block copolymer lithography," Proc Natl Acad Sci USA. (2011) 108(49): 19521-5.
Hinrichs et al., "Human effector CD8+ T cells derived from naive rather than memory subsets possess superior traits for adoptive immunotherapy," Blood. (2011) 117(3):808-14.
Iyer et al., "Industrializing Autologous Adoptive Immunotherapies: Manufacturing Advances and Challenges," Front Med (Lausanne). (2018) 5:150, 9 pages.
Jarmoskaite et al., "How to measure and evaluate binding affinities," Elife (2020) 9:e57264, 34 pages.
Jethwa et al., "Use of gene-modified regulatory T-cells to control autoimmune and alloimmune pathology: Is now the right time?" Clin Immunology (2014) 150:51-63.
Kaartinen et al., "Low interleukin-2 concentration favors generation of early memory T cells over effector phenotypes during chimeric antigen receptor T-cell expansion," Cytotherapy (2017) 19(6):689-702.

(56) References Cited

OTHER PUBLICATIONS

Katz et al., "Therapeutic targeting of CD19 in hematological malignancies: past, present, future and beyond," Leukemia & Lymphoma (2014) 55:999-1006.
Li, Experiment of Biochemistry and Molecular Biology, edited by Weifang Li, Hefei: China University of Science and Technology Press, Jan. 2012, pp. 95-109. (English machine translation provided).
Lv, Clinical Immunological Test (2nd Edition), edited by Lv Shijing, Beijing: China Medical Science and Technology Press, Jan. 2010, p. 110, (II) avidin and streptavidin. (English machine translation provided).
Mackensen et al., "Anti-CD19 Car T cell therapy for refractory systemic lupus erythematosus," Nat Med (2022) 28(10):2124-2132 and Supplementary Materials.
Mei et al., "Rationale of anti-CD 19 immunotherapy: an option to target autoreactive plasma cells in autoimmunity," Arthritis Research & Therapy (2012) 14(Suppl 5):S1. p. 1-16.
Mougiakakos et al., "CD19-Targeted Car T Cells in Refractory Systemic Lupus Erythematosus," N Engl J Med (2021) 385(6):567-569 and Supplementary Appendix.
Nesbeth et al., "Metabolic Biotinylation of Lentiviral Pseudotypes for Scalable Paramagnetic Microparticle-Dependent Manipulation," Mol Ther (2006) 13(4):814-822.
Parrott et al., "Metabolically biotinylated adenovirus for cell targeting, ligand screening, and vector purification," Mol Ther (2003) 8(4):688-700.
Ponnazhagan et al., "Conjugate-based targeting of recombinant adeno-associated virus type 2 vectors by using avidin-linked ligands," J Virol. (2002) 76(24):12900-7.
Prospec, Streptavidin Protein, catalogue No. PRO-283, retrieved from: https://www.prospecbio.com/streptavidin [Dec. 28, 2022] (Year: 2016), 3 pages.
Salmon, "Arming T cells against B cells in systemic lupus erythematosus," Nat Med (2022) 28(10):2009-2010.
Takahashi et al., "Non-destructive on-chip cell sorting system with real-time microscopic image processing," Journal of Nanobiotechnology (2004) 2(5), 8 pages.
Van Loenen et al., "A Good Manufacturing Practice procedure to engineer donor virus-specific T cells into potent anti-leukemic effector cells," Haematologica. (2014) 99(4):759-68.
Weigmann, "Cell Isolation of Spleen Mononuclear Cells," Bio-Protocol (2013) 3(9):4 pages.
Dang et al., Enhanced activation and expansion of T cells using mechanically soft elastomer fibers. Adv Biosyst. Feb. 2018;2(2):1700167.
Kim et al., Single Step Isolation and Activation of Primary CD3+ T Lymphocytes Using Alcohol-Dispersed Electrospun Magnetic Nanofibers. Nano Lett. Aug. 8, 2012; 12(8): 4018-4024 (incl supporting information, 23 pages total).
Office Action issued in related Australian Patent Application No. 2019370705 dated Sep. 24, 2025 (5 pages).

\* cited by examiner

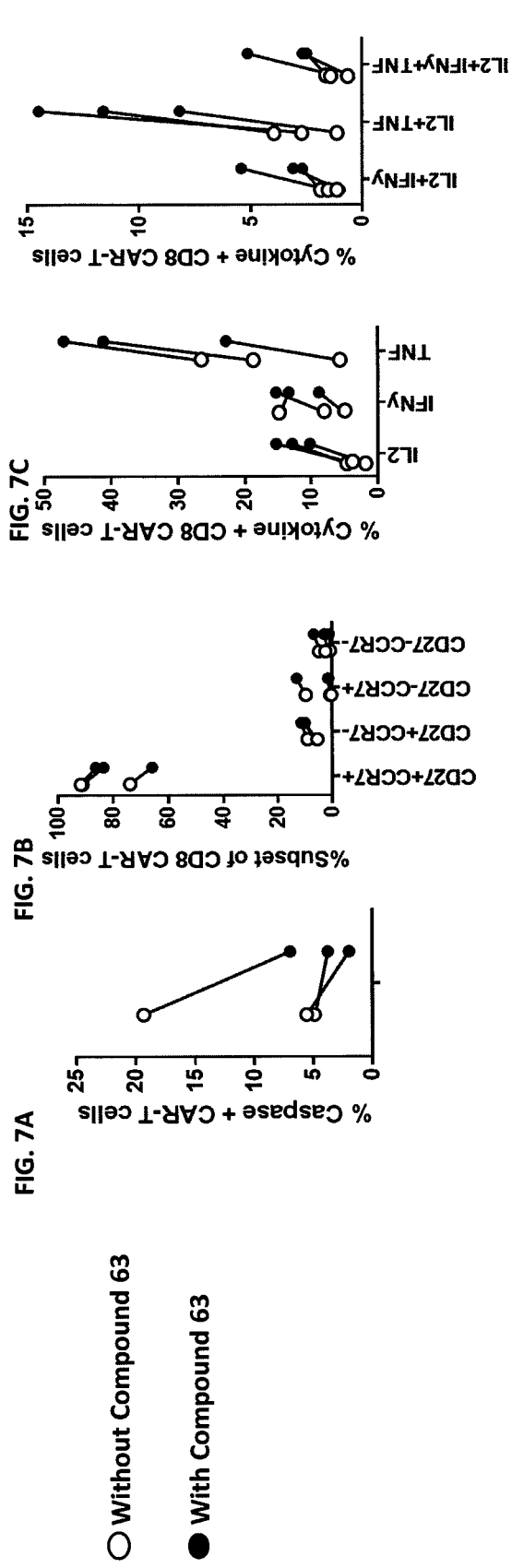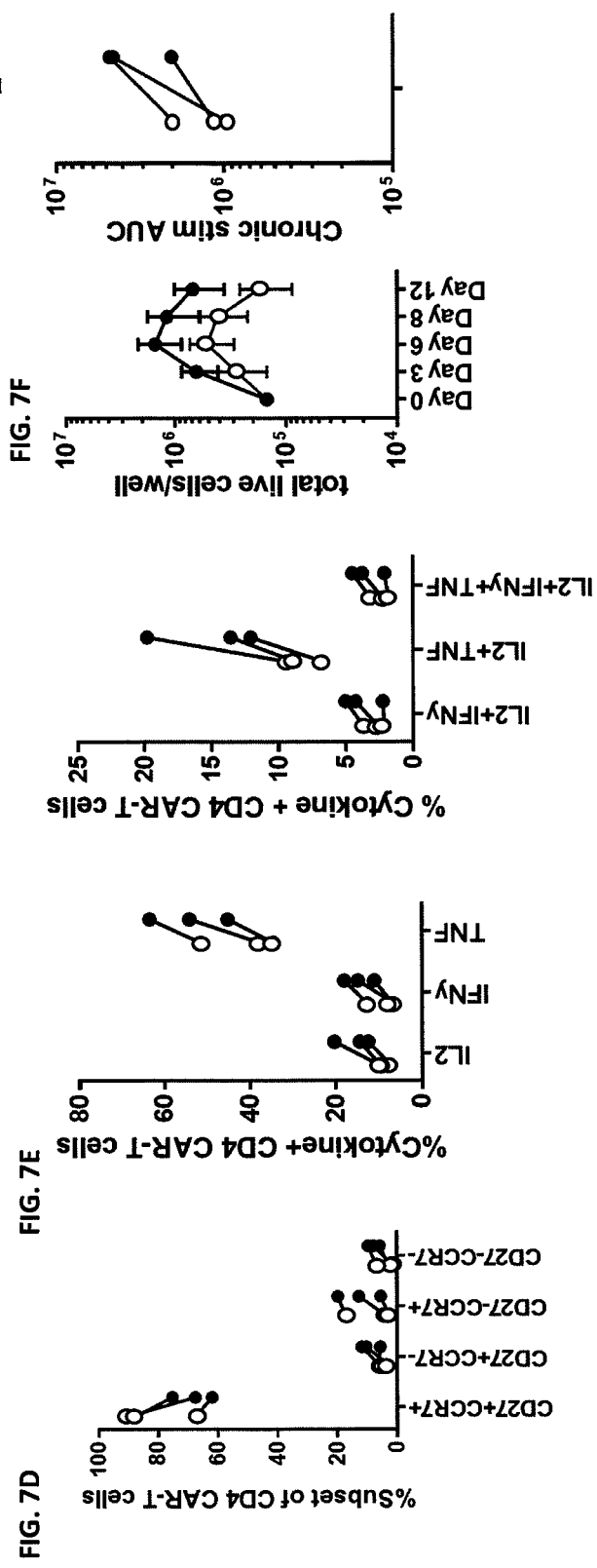

SEQUENCE LISTING

<160> NUMBER OF SEQ ID NOS: 131

<210> SEQ ID NO 1
<211> LENGTH: 159
<212> TYPE: PRT
<213> ORGANISM: Streptomyces avidinii
<220> FEATURE:
<223> OTHER INFORMATION: UniProt No. P22629

<400> SEQUENCE: 1

Asp Pro Ser Lys Asp Ser Lys Ala Gln Val Ser Ala Ala Glu Ala Gly
1               5                   10                  15

Ile Thr Gly Thr Trp Tyr Asn Gln Leu Gly Ser Thr Phe Ile Val Thr
            20                  25                  30

Ala Gly Ala Asp Gly Ala Leu Thr Gly Thr Tyr Glu Ser Ala Val Gly
        35                  40                  45

Asn Ala Glu Ser Arg Tyr Val Leu Thr Gly Arg Tyr Asp Ser Ala Pro

```
                    50                  55                  60
Ala Thr Asp Gly Ser Gly Thr Ala Leu Gly Trp Thr Val Ala Trp Lys
 65                  70                  75                  80

Asn Asn Tyr Arg Asn Ala His Ser Ala Thr Thr Trp Ser Gly Gln Tyr
                 85                  90                  95

Val Gly Gly Ala Glu Ala Arg Ile Asn Thr Gln Trp Leu Leu Thr Ser
                100                 105                 110

Gly Thr Thr Glu Ala Asn Ala Trp Lys Ser Thr Leu Val Gly His Asp
            115                 120                 125

Thr Phe Thr Lys Val Lys Pro Ser Ala Ser Ile Asp Ala Ala Lys
        130                 135                 140

Lys Ala Gly Val Asn Asn Gly Asn Pro Leu Asp Ala Val Gln Gln
145                 150                 155

<210> SEQ ID NO 2
<211> LENGTH: 127
<212> TYPE: PRT
<213> ORGANISM: Streptomyces avidinii
<220> FEATURE:
<223> OTHER INFORMATION: Minimal streptavidin

<400> SEQUENCE: 2

Met Glu Ala Gly Ile Thr Gly Thr Trp Tyr Asn Gln Leu Gly Ser Thr
  1               5                  10                  15

Phe Ile Val Thr Ala Gly Ala Asp Gly Ala Leu Thr Gly Thr Tyr Glu
                 20                  25                  30

Ser Ala Val Gly Asn Ala Glu Ser Arg Tyr Val Leu Thr Gly Arg Tyr
             35                  40                  45

Asp Ser Ala Pro Ala Thr Asp Gly Ser Gly Thr Ala Leu Gly Trp Thr
         50                  55                  60

Val Ala Trp Lys Asn Asn Tyr Arg Asn Ala His Ser Ala Thr Thr Trp
 65                  70                  75                  80

Ser Gly Gln Tyr Val Gly Gly Ala Glu Ala Arg Ile Asn Thr Gln Trp
                 85                  90                  95

Leu Leu Thr Ser Gly Thr Thr Glu Ala Asn Ala Trp Lys Ser Thr Leu
                100                 105                 110

Val Gly His Asp Thr Phe Thr Lys Val Lys Pro Ser Ala Ala Ser
            115                 120                 125

<210> SEQ ID NO 3
<211> LENGTH: 159
<212> TYPE: PRT
<213> ORGANISM: Streptomyces avidinii
<220> FEATURE:
<223> OTHER INFORMATION: Mutein Streptavidin Val44-Thr45-Ala46-Arg47

<400> SEQUENCE: 3

Asp Pro Ser Lys Asp Ser Lys Ala Gln Val Ser Ala Ala Glu Ala Gly
  1               5                  10                  15

Ile Thr Gly Thr Trp Tyr Asn Gln Leu Gly Ser Thr Phe Ile Val Thr
                 20                  25                  30

Ala Gly Ala Asp Gly Ala Leu Thr Gly Thr Tyr Val Thr Ala Arg Gly
             35                  40                  45

Asn Ala Glu Ser Arg Tyr Val Leu Thr Gly Arg Tyr Asp Ser Ala Pro
         50                  55                  60

Ala Thr Asp Gly Ser Gly Thr Ala Leu Gly Trp Thr Val Ala Trp Lys
 65                  70                  75                  80
```

```
Asn Asn Tyr Arg Asn Ala His Ser Ala Thr Thr Trp Ser Gly Gln Tyr
            85                  90                  95

Val Gly Gly Ala Glu Ala Arg Ile Asn Thr Gln Trp Leu Leu Thr Ser
        100                 105                 110

Gly Thr Thr Glu Ala Asn Ala Trp Lys Ser Thr Leu Val Gly His Asp
        115                 120                 125

Thr Phe Thr Lys Val Lys Pro Ser Ala Ala Ser Ile Asp Ala Ala Lys
        130                 135                 140

Lys Ala Gly Val Asn Asn Gly Asn Pro Leu Asp Ala Val Gln Gln
145                 150                 155

<210> SEQ ID NO 4
<211> LENGTH: 127
<212> TYPE: PRT
<213> ORGANISM: Streptomyces avidinii
<220> FEATURE:
<223> OTHER INFORMATION: Mutein Streptavidin Val44-Thr45-Ala46-Arg47

<400> SEQUENCE: 4

Met Glu Ala Gly Ile Thr Gly Thr Trp Tyr Asn Gln Leu Gly Ser Thr
1               5                   10                  15

Phe Ile Val Thr Ala Gly Ala Asp Gly Ala Leu Thr Gly Thr Tyr Val
            20                  25                  30

Thr Ala Arg Gly Asn Ala Glu Ser Arg Tyr Val Leu Thr Gly Arg Tyr
        35                  40                  45

Asp Ser Ala Pro Ala Thr Asp Gly Ser Gly Thr Ala Leu Gly Trp Thr
    50                  55                  60

Val Ala Trp Lys Asn Asn Tyr Arg Asn Ala His Ser Ala Thr Thr Trp
65                  70                  75                  80

Ser Gly Gln Tyr Val Gly Gly Ala Glu Ala Arg Ile Asn Thr Gln Trp
                85                  90                  95

Leu Leu Thr Ser Gly Thr Thr Glu Ala Asn Ala Trp Lys Ser Thr Leu
            100                 105                 110

Val Gly His Asp Thr Phe Thr Lys Val Lys Pro Ser Ala Ala Ser
        115                 120                 125

<210> SEQ ID NO 5
<211> LENGTH: 159
<212> TYPE: PRT
<213> ORGANISM: Streptomyces avidinii
<220> FEATURE:
<223> OTHER INFORMATION: Mutein Streptavidin Ile44-Gly45-Ala-46-Arg47

<400> SEQUENCE: 5

Asp Pro Ser Lys Asp Ser Lys Ala Gln Val Ser Ala Ala Glu Ala Gly
1               5                   10                  15

Ile Thr Gly Thr Trp Tyr Asn Gln Leu Gly Ser Thr Phe Ile Val Thr
            20                  25                  30

Ala Gly Ala Asp Gly Ala Leu Thr Gly Thr Tyr Ile Gly Ala Arg Gly
        35                  40                  45

Asn Ala Glu Ser Arg Tyr Val Leu Thr Gly Arg Tyr Asp Ser Ala Pro
    50                  55                  60

Ala Thr Asp Gly Ser Gly Thr Ala Leu Gly Trp Thr Val Ala Trp Lys
65                  70                  75                  80

Asn Asn Tyr Arg Asn Ala His Ser Ala Thr Thr Trp Ser Gly Gln Tyr
                85                  90                  95

Val Gly Gly Ala Glu Ala Arg Ile Asn Thr Gln Trp Leu Leu Thr Ser
            100                 105                 110
```

```
Gly Thr Thr Glu Ala Asn Ala Trp Lys Ser Thr Leu Val Gly His Asp
        115                 120                 125

Thr Phe Thr Lys Val Lys Pro Ser Ala Ala Ser Ile Asp Ala Ala Lys
    130                 135                 140

Lys Ala Gly Val Asn Asn Gly Asn Pro Leu Asp Ala Val Gln Gln
145                 150                 155

<210> SEQ ID NO 6
<211> LENGTH: 127
<212> TYPE: PRT
<213> ORGANISM: Streptomyces avidinii
<220> FEATURE:
<223> OTHER INFORMATION: Mutein Streptavidin Ile44-Gly45-Ala-46-Arg47

<400> SEQUENCE: 6

Met Glu Ala Gly Ile Thr Gly Thr Trp Tyr Asn Gln Leu Gly Ser Thr
1               5                   10                  15

Phe Ile Val Thr Ala Gly Ala Asp Gly Ala Leu Thr Gly Thr Tyr Ile
            20                  25                  30

Gly Ala Arg Gly Asn Ala Glu Ser Arg Tyr Val Leu Thr Gly Arg Tyr
        35                  40                  45

Asp Ser Ala Pro Ala Thr Asp Gly Ser Gly Thr Ala Leu Gly Trp Thr
    50                  55                  60

Val Ala Trp Lys Asn Asn Tyr Arg Asn Ala His Ser Ala Thr Thr Trp
65                  70                  75                  80

Ser Gly Gln Tyr Val Gly Gly Ala Glu Ala Arg Ile Asn Thr Gln Trp
                85                  90                  95

Leu Leu Thr Ser Gly Thr Thr Glu Ala Asn Ala Trp Lys Ser Thr Leu
            100                 105                 110

Val Gly His Asp Thr Phe Thr Lys Val Lys Pro Ser Ala Ala Ser
        115                 120                 125

<210> SEQ ID NO 7
<211> LENGTH: 8
<212> TYPE: PRT
<213> ORGANISM: Artificial Sequence
<220> FEATURE:
<223> OTHER INFORMATION: Streptavidin binding peptide, Strep-tag (R)

<400> SEQUENCE: 7

Trp Arg His Pro Gln Phe Gly Gly
1               5

<210> SEQ ID NO 8
<211> LENGTH: 8
<212> TYPE: PRT
<213> ORGANISM: Artificial Sequence
<220> FEATURE:
<223> OTHER INFORMATION: Strep-tag(R) II

<400> SEQUENCE: 8

Trp Ser His Pro Gln Phe Glu Lys
1               5

<210> SEQ ID NO 9
<211> LENGTH: 3
<212> TYPE: PRT
<213> ORGANISM: Artificial Sequence
<220> FEATURE:
<223> OTHER INFORMATION: Streptavidin Binding peptide
<220> FEATURE:
<221> NAME/KEY: VARIANT
```

```
<222> LOCATION: 3
<223> OTHER INFORMATION: Xaa is selected from Gln, Asp, and Met

<400> SEQUENCE: 9

His Pro Xaa
1

<210> SEQ ID NO 10
<211> LENGTH: 4
<212> TYPE: PRT
<213> ORGANISM: Artificial Sequence
<220> FEATURE:
<223> OTHER INFORMATION: Streptavidin-binding peptide

<400> SEQUENCE: 10

His Pro Gln Phe
1

<210> SEQ ID NO 11
<211> LENGTH: 8
<212> TYPE: PRT
<213> ORGANISM: Artificial Sequence
<220> FEATURE:
<223> OTHER INFORMATION: Streptavidin-binding peptide
<220> FEATURE:
<221> NAME/KEY: VARIANT
<222> LOCATION: 1
<223> OTHER INFORMATION: Xaa is Trp, Lys, or Arg
<220> FEATURE:
<221> NAME/KEY: VARIANT
<222> LOCATION: 2
<223> OTHER INFORMATION: Xaa is any amino acid
<220> FEATURE:
<221> NAME/KEY: VARIANT
<222> LOCATION: 7
<223> OTHER INFORMATION: Xaa is Gly or Glu
<220> FEATURE:
<221> NAME/KEY: VARIANT
<222> LOCATION: 8
<223> OTHER INFORMATION: Xaa is Gly, Lys, or Arg

<400> SEQUENCE: 11

Xaa Xaa His Pro Gln Phe Xaa Xaa
1               5

<210> SEQ ID NO 12
<211> LENGTH: 8
<212> TYPE: PRT
<213> ORGANISM: Artificial Sequence
<220> FEATURE:
<223> OTHER INFORMATION: Streptavidin-binding peptide
<220> FEATURE:
<221> NAME/KEY: VARIANT
<222> LOCATION: 2
<223> OTHER INFORMATION: Xaa is any amino acid
<220> FEATURE:
<221> NAME/KEY: VARIANT
<222> LOCATION: 7
<223> OTHER INFORMATION: Xaa is Gly or Glu
<220> FEATURE:
<221> NAME/KEY: VARIANT
<222> LOCATION: 8
<223> OTHER INFORMATION: Xaa Gly, Lys, or Arg

<400> SEQUENCE: 12

Trp Xaa His Pro Gln Phe Xaa Xaa
1               5

<210> SEQ ID NO 13
<211> LENGTH: 28
<212> TYPE: PRT
```

```
<213> ORGANISM: Artificial Sequence
<220> FEATURE:
<223> OTHER INFORMATION: Sequential modules of streptavidin-binding
      peptide
<220> FEATURE:
<221> NAME/KEY: VARIANT
<222> LOCATION: 9
<223> OTHER INFORMATION: Xaa is any amino acid
<220> FEATURE:
<221> NAME/KEY: VARIANT
<222> LOCATION: 10
<223> OTHER INFORMATION: Xaa is any amino acid
<220> FEATURE:
<221> NAME/KEY: VARIANT
<222> LOCATION: 11
<223> OTHER INFORMATION: Xaa is any amino acid
<220> FEATURE:
<221> NAME/KEY: VARIANT
<222> LOCATION: 12
<223> OTHER INFORMATION: Xaa is any amino acid
<220> FEATURE:
<221> NAME/KEY: VARIANT
<222> LOCATION: 13
<223> OTHER INFORMATION: Xaa is any amino acid
<220> FEATURE:
<221> NAME/KEY: VARIANT
<222> LOCATION: (14)...(14)
<223> OTHER INFORMATION: Xaa is any amino acid
<220> FEATURE:
<221> NAME/KEY: VARIANT
<222> LOCATION: (15)...(15)
<223> OTHER INFORMATION: Xaa is any amino acid
<220> FEATURE:
<221> NAME/KEY: VARIANT
<222> LOCATION: (16)...(16)
<223> OTHER INFORMATION: Xaa is any amino acid
<220> FEATURE:
<221> NAME/KEY: VARIANT
<222> LOCATION: (17)...(17)
<223> OTHER INFORMATION: Xaa is any amino acid or null
<220> FEATURE:
<221> NAME/KEY: VARIANT
<222> LOCATION: (18)...(18)
<223> OTHER INFORMATION: Xaa is any amino acid if Xaa at position 17 is
      any amino acid, otherwise Xaa is null
<220> FEATURE:
<221> NAME/KEY: VARIANT
<222> LOCATION: (19)...(19)
<223> OTHER INFORMATION: Xaa is any amino acid if Xaa at position 17 is
      any amino acid, otherwise Xaa is null
<220> FEATURE:
<221> NAME/KEY: VARIANT
<222> LOCATION: (20)...(20)
<223> OTHER INFORMATION: Xaa is any amino acid if Xaa at position 17 is
      any amino acid, otherwise Xaa is null

<400> SEQUENCE: 13

Trp Ser His Pro Gln Phe Glu Lys Xaa Xaa Xaa Xaa Xaa Xaa Xaa Xaa
1               5                   10                  15

Xaa Xaa Xaa Xaa Trp Ser His Pro Gln Phe Glu Lys
            20                  25

<210> SEQ ID NO 14
<211> LENGTH: 28
<212> TYPE: PRT
<213> ORGANISM: Artificial Sequence
<220> FEATURE:
<223> OTHER INFORMATION: Sequential modules of streptavidin-binding
      peptide
<220> FEATURE:
<221> NAME/KEY: VARIANT
<222> LOCATION: 17
<223> OTHER INFORMATION: Xaa is Gly or null
<220> FEATURE:
<221> NAME/KEY: VARIANT
<222> LOCATION: 18
```

```
<223> OTHER INFORMATION: Xaa is Gly if Xaa at position 17 is Gly,
      otherwise Xaa is null
<220> FEATURE:
<221> NAME/KEY: VARIANT
<222> LOCATION: 19
<223> OTHER INFORMATION: Xaa is Gly if Xaa at position 17 is Gly,
      otherwise Xaa is null
<220> FEATURE:
<221> NAME/KEY: VARIANT
<222> LOCATION: 20
<223> OTHER INFORMATION: Xaa is Ser if Xaa at position 17 is Gly,
      otherwise Xaa is null

<400> SEQUENCE: 14

Trp Ser His Pro Gln Phe Glu Lys Gly Gly Gly Ser Gly Gly Gly Ser
1               5                   10                  15

Xaa Xaa Xaa Xaa Trp Ser His Pro Gln Phe Glu Lys
            20                  25

<210> SEQ ID NO 15
<211> LENGTH: 30
<212> TYPE: PRT
<213> ORGANISM: Artificial Sequence
<220> FEATURE:
<223> OTHER INFORMATION: Twin-Strep-tag

<400> SEQUENCE: 15

Ser Ala Trp Ser His Pro Gln Phe Glu Lys Gly Gly Gly Ser Gly Gly
1               5                   10                  15

Gly Ser Gly Gly Gly Ser Trp Ser His Pro Gln Phe Glu Lys
            20                  25                  30

<210> SEQ ID NO 16
<211> LENGTH: 30
<212> TYPE: PRT
<213> ORGANISM: Artificial Sequence
<220> FEATURE:
<223> OTHER INFORMATION: Twin-Strep-tag

<400> SEQUENCE: 16

Ser Ala Trp Ser His Pro Gln Phe Glu Lys Gly Gly Gly Ser Gly Gly
1               5                   10                  15

Gly Ser Gly Gly Ser Ala Trp Ser His Pro Gln Phe Glu Lys
            20                  25                  30

<210> SEQ ID NO 17
<211> LENGTH: 28
<212> TYPE: PRT
<213> ORGANISM: Artificial Sequence
<220> FEATURE:
<223> OTHER INFORMATION: Twin-Strep-tag

<400> SEQUENCE: 17

Trp Ser His Pro Gln Phe Glu Lys Gly Gly Gly Ser Gly Gly Gly Ser
1               5                   10                  15

Gly Gly Gly Ser Trp Ser His Pro Gln Phe Glu Lys
            20                  25

<210> SEQ ID NO 18
<211> LENGTH: 24
<212> TYPE: PRT
<213> ORGANISM: Artificial Sequence
<220> FEATURE:
<223> OTHER INFORMATION: Twin-Strep-tag

<400> SEQUENCE: 18
```

```
Trp Ser His Pro Gln Phe Glu Lys Gly Gly Gly Ser Gly Gly Gly Ser
1               5                   10                  15

Trp Ser His Pro Gln Phe Glu Lys
                20
```

<210> SEQ ID NO 19
<211> LENGTH: 28
<212> TYPE: PRT
<213> ORGANISM: Artificial Sequence
<220> FEATURE:
<223> OTHER INFORMATION: Twin-Strep-tag

<400> SEQUENCE: 19

```
Trp Ser His Pro Gln Phe Glu Lys Gly Gly Gly Ser Gly Gly Gly Ser
1               5                   10                  15

Gly Gly Ser Ala Trp Ser His Pro Gln Phe Glu Lys
                20                  25
```

<210> SEQ ID NO 20
<211> LENGTH: 9
<212> TYPE: PRT
<213> ORGANISM: Artificial Sequence
<220> FEATURE:
<223> OTHER INFORMATION: HA-tag

<400> SEQUENCE: 20

```
Tyr Pro Tyr Asp Val Pro Asp Tyr Ala
1               5
```

<210> SEQ ID NO 21
<211> LENGTH: 11
<212> TYPE: PRT
<213> ORGANISM: Artificial Sequence
<220> FEATURE:
<223> OTHER INFORMATION: VSV-G-tag

<400> SEQUENCE: 21

```
Tyr Thr Asp Ile Glu Met Asn Arg Leu Gly Lys
1               5                   10
```

<210> SEQ ID NO 22
<211> LENGTH: 11
<212> TYPE: PRT
<213> ORGANISM: Artificial Sequence
<220> FEATURE:
<223> OTHER INFORMATION: HSV-tag

<400> SEQUENCE: 22

```
Gln Pro Glu Leu Ala Pro Glu Asp Pro Glu Asp
1               5                   10
```

<210> SEQ ID NO 23
<211> LENGTH: 10
<212> TYPE: PRT
<213> ORGANISM: Artificial Sequence
<220> FEATURE:
<223> OTHER INFORMATION: T7 epitope

<400> SEQUENCE: 23

```
Ala Ser Met Thr Gly Gly Gln Gln Met Gly
1               5                   10
```

<210> SEQ ID NO 24
<211> LENGTH: 11
<212> TYPE: PRT
<213> ORGANISM: Artificial Sequence

```
<220> FEATURE:
<223> OTHER INFORMATION: HSV epitope

<400> SEQUENCE: 24

Gln Pro Glu Leu Ala Pro Glu Asp Pro Glu Asp
1               5                   10

<210> SEQ ID NO 25
<211> LENGTH: 10
<212> TYPE: PRT
<213> ORGANISM: Artificial Sequence
<220> FEATURE:
<223> OTHER INFORMATION: Myc epitope

<400> SEQUENCE: 25

Glu Gln Lys Leu Ile Ser Glu Glu Asp Leu
1               5                   10

<210> SEQ ID NO 26
<211> LENGTH: 14
<212> TYPE: PRT
<213> ORGANISM: Artificial Sequence
<220> FEATURE:
<223> OTHER INFORMATION: V5-tag

<400> SEQUENCE: 26

Gly Lys Pro Ile Pro Asn Pro Leu Leu Gly Leu Asp Ser Thr
1               5                   10

<210> SEQ ID NO 27
<211> LENGTH: 126
<212> TYPE: PRT
<213> ORGANISM: Streptomyces avidinii
<220> FEATURE:
<223> OTHER INFORMATION: Mutein Streptavidin Val44-Thr45-Ala46-Arg47 and
      Glu117, Gly120, Tyr121 (mutein m1-9)

<400> SEQUENCE: 27

Glu Ala Gly Ile Thr Gly Thr Trp Tyr Asn Gln Leu Gly Ser Thr Phe
1               5                   10                  15

Ile Val Thr Ala Gly Ala Asp Gly Ala Leu Thr Gly Thr Tyr Val Thr
            20                  25                  30

Ala Arg Gly Asn Ala Glu Ser Arg Tyr Val Leu Thr Gly Arg Tyr Asp
        35                  40                  45

Ser Ala Pro Ala Thr Asp Gly Ser Gly Thr Ala Leu Gly Trp Thr Val
    50                  55                  60

Ala Trp Lys Asn Asn Tyr Arg Asn Ala His Ser Ala Thr Thr Trp Ser
65                  70                  75                  80

Gly Gln Tyr Val Gly Gly Ala Glu Ala Arg Ile Asn Thr Gln Trp Leu
                85                  90                  95

Leu Thr Ser Gly Thr Thr Glu Glu Asn Ala Gly Tyr Ser Thr Leu Val
            100                 105                 110

Gly His Asp Thr Phe Thr Lys Val Lys Pro Ser Ala Ala Ser
        115                 120                 125

<210> SEQ ID NO 28
<211> LENGTH: 139
<212> TYPE: PRT
<213> ORGANISM: Streptomyces avidinii
<220> FEATURE:
<223> OTHER INFORMATION: Mutein Streptavidin Val44-Thr45-Ala46-Arg47 and
      Glu117, Gly120, Tyr121 (mutein m1-9)

<400> SEQUENCE: 28
```

```
Asp Pro Ser Lys Asp Ser Lys Ala Gln Val Ser Ala Ala Glu Ala Gly
1               5                   10                  15

Ile Thr Gly Thr Trp Tyr Asn Gln Leu Gly Ser Thr Phe Ile Val Thr
                20                  25                  30

Ala Gly Ala Asp Gly Ala Leu Thr Gly Thr Tyr Val Thr Ala Arg Gly
            35                  40                  45

Asn Ala Glu Ser Arg Tyr Val Leu Thr Gly Arg Tyr Asp Ser Ala Pro
        50                  55                  60

Ala Thr Asp Gly Ser Gly Thr Ala Leu Gly Trp Thr Val Ala Trp Lys
65                  70                  75                  80

Asn Asn Tyr Arg Asn Ala His Ser Ala Thr Thr Trp Ser Gly Gln Tyr
                85                  90                  95

Val Gly Gly Ala Glu Ala Arg Ile Asn Thr Gln Trp Leu Leu Thr Ser
            100                 105                 110

Gly Thr Thr Glu Glu Asn Ala Gly Tyr Ser Thr Leu Val Gly His Asp
        115                 120                 125

Thr Phe Thr Lys Val Lys Pro Ser Ala Ala Ser
        130                 135
```

<210> SEQ ID NO 29
<211> LENGTH: 253
<212> TYPE: PRT
<213> ORGANISM: Artificial Sequence
<220> FEATURE:
<223> OTHER INFORMATION: Variable Heavy chain of Fab fragment m13B8.2

<400> SEQUENCE: 29

```
Ala Met Gln Val Gln Leu Lys Gln Ser Gly Pro Gly Leu Val Gln Pro
1               5                   10                  15

Ser Gln Ser Leu Ser Ile Thr Cys Thr Val Ser Gly Phe Ser Leu Thr
                20                  25                  30

Thr Phe Gly Val His Trp Val Arg Gln Ser Pro Gly Lys Gly Leu Glu
            35                  40                  45

Trp Leu Gly Val Ile Trp Ala Ser Gly Ile Thr Asp Tyr Asn Val Pro
        50                  55                  60

Phe Met Ser Arg Leu Ser Ile Thr Lys Asp Asn Ser Lys Ser Gln Val
65                  70                  75                  80

Phe Phe Lys Leu Asn Ser Leu Gln Pro Asp Asp Thr Ala Ile Tyr Tyr
                85                  90                  95

Cys Ala Lys Asn Asp Pro Gly Thr Gly Phe Ala Tyr Trp Gly Gln Gly
            100                 105                 110

Thr Leu Val Thr Val Ser Ala Gly Ser Thr Lys Gly Pro Ser Val Phe
        115                 120                 125

Pro Leu Ala Pro Ser Ser Lys Ser Thr Ser Gly Gly Thr Ala Ala Leu
        130                 135                 140

Gly Cys Leu Val Lys Asp Tyr Phe Pro Glu Pro Val Thr Val Ser Trp
145                 150                 155                 160

Asn Ser Gly Ala Leu Thr Ser Gly Val His Thr Phe Pro Ala Val Leu
                165                 170                 175

Gln Ser Ser Gly Leu Tyr Ser Leu Ser Ser Val Val Thr Val Pro Ser
            180                 185                 190

Ser Ser Leu Gly Thr Gln Thr Tyr Ile Cys Asn Val Asn His Lys Pro
        195                 200                 205

Ser Asn Thr Lys Val Asp Lys Lys Val Glu Pro Lys Ser Cys Gly Ser
        210                 215                 220
```

```
Ala Trp Ser His Pro Gln Phe Glu Lys Gly Gly Ser Gly Gly Gly
225                 230                 235                 240

Ser Gly Gly Ser Ala Trp Ser His Pro Gln Phe Glu Lys
            245                 250
```

<210> SEQ ID NO 30
<211> LENGTH: 218
<212> TYPE: PRT
<213> ORGANISM: Artificial Sequence
<220> FEATURE:
<223> OTHER INFORMATION: Variable Light chain of Fab Fragment m13B8.2

<400> SEQUENCE: 30

```
Ala Met Asp Ile Gln Met Thr Gln Ser Pro Ala Ser Leu Ser Ala Ser
1               5                   10                  15

Val Gly Glu Thr Val Thr Phe Thr Cys Arg Ala Ser Glu Met Ile Tyr
            20                  25                  30

Ser Tyr Leu Ala Trp Tyr Gln Gln Lys Gln Gly Lys Ser Pro Gln Leu
        35                  40                  45

Leu Val His Asp Ala Lys Thr Leu Ala Glu Gly Val Pro Ser Arg Phe
    50                  55                  60

Ser Gly Gly Gly Ser Gly Thr Gln Phe Ser Leu Lys Ile Asn Thr Leu
65                  70                  75                  80

Gln Pro Glu Asp Phe Gly Thr Tyr Tyr Cys Gln Ala His Tyr Gly Asn
                85                  90                  95

Pro Pro Thr Phe Gly Gly Gly Thr Lys Leu Glu Ile Lys Arg Gly Ile
            100                 105                 110

Ala Ala Pro Ser Val Phe Ile Phe Pro Pro Ser Asp Glu Gln Leu Lys
        115                 120                 125

Ser Gly Thr Ala Ser Val Val Cys Leu Leu Asn Asn Phe Tyr Pro Arg
    130                 135                 140

Glu Ala Lys Val Gln Trp Lys Val Asp Asn Ala Leu Gln Ser Gly Asn
145                 150                 155                 160

Ser Gln Glu Ser Val Thr Glu Gln Asp Ser Lys Asp Ser Thr Tyr Ser
                165                 170                 175

Leu Ser Ser Thr Leu Thr Leu Ser Lys Ala Asp Tyr Glu Lys His Lys
            180                 185                 190

Val Tyr Ala Cys Glu Val Thr His Gln Gly Leu Ser Ser Pro Val Thr
        195                 200                 205

Lys Ser Phe Asn Arg Gly Glu Cys Gly Ser
    210                 215
```

<210> SEQ ID NO 31
<211> LENGTH: 119
<212> TYPE: PRT
<213> ORGANISM: Artificial Sequence
<220> FEATURE:
<223> OTHER INFORMATION: Variable Heavy chain of anti-CD3 antibody OKT3

<400> SEQUENCE: 31

```
Gln Val Gln Leu Gln Gln Ser Gly Ala Glu Leu Ala Arg Pro Gly Ala
1               5                   10                  15

Ser Val Lys Met Ser Cys Lys Ala Ser Gly Tyr Thr Phe Thr Arg Tyr
            20                  25                  30

Thr Met His Trp Val Lys Gln Arg Pro Gly Gln Gly Leu Glu Trp Ile
        35                  40                  45

Gly Tyr Ile Asn Pro Ser Arg Gly Tyr Thr Asn Tyr Asn Gln Lys Phe
```

```
                        50                  55                  60
Lys Asp Lys Ala Thr Leu Thr Thr Asp Lys Ser Ser Ser Thr Ala Tyr
 65                  70                  75                  80

Met Gln Leu Ser Ser Leu Thr Ser Glu Asp Ser Ala Val Tyr Tyr Cys
                     85                  90                  95

Ala Arg Tyr Tyr Asp Asp His Tyr Cys Leu Asp Tyr Trp Gly Gln Gly
                100                 105                 110

Thr Thr Leu Thr Val Ser Ser
            115

<210> SEQ ID NO 32
<211> LENGTH: 106
<212> TYPE: PRT
<213> ORGANISM: Artificial Sequence
<220> FEATURE:
<223> OTHER INFORMATION: Variable Light chain of anti-CD3 antibody OKT3

<400> SEQUENCE: 32

Gln Ile Val Leu Thr Gln Ser Pro Ala Ile Met Ser Ala Ser Pro Gly
  1               5                  10                  15

Glu Lys Val Thr Met Thr Cys Ser Ala Ser Ser Val Ser Tyr Met
                 20                  25                  30

Asn Trp Tyr Gln Gln Lys Ser Gly Thr Ser Pro Lys Arg Trp Ile Tyr
             35                  40                  45

Asp Thr Ser Lys Leu Ala Ser Gly Val Pro Ala His Phe Arg Gly Ser
 50                  55                  60

Gly Ser Gly Thr Ser Tyr Ser Leu Thr Ile Ser Gly Met Glu Ala Glu
 65                  70                  75                  80

Asp Ala Ala Thr Tyr Tyr Cys Gln Gln Trp Ser Ser Asn Pro Phe Thr
                 85                  90                  95

Phe Gly Ser Gly Thr Lys Leu Glu Ile Asn
                100                 105

<210> SEQ ID NO 33
<211> LENGTH: 116
<212> TYPE: PRT
<213> ORGANISM: Artificial Sequence
<220> FEATURE:
<223> OTHER INFORMATION: Variable Heavy chain of anti-CD28 antibody
      CD28.3

<400> SEQUENCE: 33

Leu Gln Gln Ser Gly Ala Glu Leu Val Lys Pro Gly Ala Ser Val Arg
  1               5                  10                  15

Leu Ser Cys Lys Ala Ser Gly Tyr Thr Phe Thr Glu Tyr Ile Ile His
                 20                  25                  30

Trp Ile Lys Leu Arg Ser Gly Gln Gly Leu Glu Trp Ile Gly Trp Phe
             35                  40                  45

Tyr Pro Gly Ser Asn Asp Ile Gln Tyr Asn Ala Lys Phe Lys Gly Lys
 50                  55                  60

Ala Thr Leu Thr Ala Asp Lys Ser Ser Ser Thr Val Tyr Met Glu Leu
 65                  70                  75                  80

Thr Gly Leu Thr Ser Glu Asp Ser Ala Val Tyr Phe Cys Ala Arg Arg
                 85                  90                  95

Asp Asp Phe Ser Gly Tyr Asp Ala Leu Pro Tyr Trp Gly Gln Gly Thr
                100                 105                 110

Met Val Thr Val
            115
```

```
<210> SEQ ID NO 34
<211> LENGTH: 108
<212> TYPE: PRT
<213> ORGANISM: Artificial Sequence
<220> FEATURE:
<223> OTHER INFORMATION: Variable Light chain of anti-CD28 antibody
      CD28.3

<400> SEQUENCE: 34

Asp Ile Gln Met Thr Gln Ser Pro Ala Ser Leu Ser Val Ser Val Gly
1               5                   10                  15

Glu Thr Val Thr Ile Thr Cys Arg Thr Asn Glu Asn Ile Tyr Ser Asn
            20                  25                  30

Leu Ala Trp Tyr Gln Gln Lys Gln Gly Lys Ser Pro Gln Leu Leu Ile
        35                  40                  45

Tyr Ala Ala Thr His Leu Val Glu Gly Val Pro Ser Arg Phe Ser Gly
    50                  55                  60

Ser Gly Ser Gly Thr Gln Tyr Ser Leu Lys Ile Thr Ser Leu Gln Ser
65                  70                  75                  80

Glu Asp Phe Gly Asn Tyr Tyr Cys Gln His Phe Trp Gly Thr Pro Cys
                85                  90                  95

Thr Phe Gly Gly Gly Thr Lys Leu Glu Ile Lys Arg
            100                 105

<210> SEQ ID NO 35
<211> LENGTH: 11
<212> TYPE: PRT
<213> ORGANISM: Artificial Sequence
<220> FEATURE:
<223> OTHER INFORMATION: MAT tag

<400> SEQUENCE: 35

His Asn His Arg His Lys His Gly Gly Gly Cys
1               5                   10

<210> SEQ ID NO 36
<211> LENGTH: 118
<212> TYPE: PRT
<213> ORGANISM: Artificial Sequence
<220> FEATURE:
<223> OTHER INFORMATION: Variable Heavy chain of huOKT8

<400> SEQUENCE: 36

Gln Val Gln Leu Val Gln Ser Gly Ala Glu Val Lys Lys Pro Gly Ala
1               5                   10                  15

Thr Val Lys Ile Ser Cys Lys Val Ser Gly Phe Asn Ile Lys Asp Thr
            20                  25                  30

Tyr Ile His Trp Val Gln Gln Ala Pro Gly Lys Gly Leu Glu Trp Met
        35                  40                  45

Gly Arg Ile Asp Pro Ala Asn Asp Asn Thr Leu Tyr Ala Ser Lys Phe
    50                  55                  60

Gln Gly Arg Val Thr Ile Thr Ala Asp Thr Ser Thr Asp Thr Ala Tyr
65                  70                  75                  80

Met Glu Leu Ser Ser Leu Arg Ser Glu Asp Thr Ala Val Tyr Tyr Cys
                85                  90                  95

Ala Arg Gly Tyr Gly Tyr Tyr Val Phe Asp His Trp Gly Gln Gly Thr
            100                 105                 110

Leu Val Thr Val Ser Ser
            115
```

<210> SEQ ID NO 37
<211> LENGTH: 107
<212> TYPE: PRT
<213> ORGANISM: Artificial Sequence
<220> FEATURE:
<223> OTHER INFORMATION: Variable Light chain of huOKT8

<400> SEQUENCE: 37

Asp Val Gln Ile Thr Gln Ser Pro Ser Ser Leu Ser Ala Ser Val Gly
1               5                   10                  15

Asp Arg Val Thr Ile Thr Cys Arg Thr Ser Arg Ser Ile Ser Gln Tyr
            20                  25                  30

Leu Ala Trp Tyr Gln Gln Lys Pro Gly Lys Val Pro Lys Leu Leu Ile
        35                  40                  45

Tyr Ser Gly Ser Thr Leu Gln Ser Gly Val Pro Ser Arg Phe Ser Gly
50                  55                  60

Ser Gly Ser Gly Thr Asp Phe Thr Leu Thr Ile Ser Ser Leu Gln Pro
65                  70                  75                  80

Glu Asp Val Ala Thr Tyr Tyr Cys Gln Gln His Asn Glu Asn Pro Leu
                85                  90                  95

Thr Phe Gly Gly Gly Thr Lys Val Glu Ile Lys
            100                 105

<210> SEQ ID NO 38
<211> LENGTH: 30
<212> TYPE: PRT
<213> ORGANISM: Artificial Sequence
<220> FEATURE:
<223> OTHER INFORMATION: Linker

<400> SEQUENCE: 38

Pro Gly Gly Gly Ser Gly Gly Gly Ser Gly Gly Gly Ser Gly
1               5                   10                  15

Gly Gly Gly Ser Gly Gly Gly Gly Ser Gly Gly Gly Gly Pro
            20                  25                  30

<210> SEQ ID NO 39
<211> LENGTH: 17
<212> TYPE: PRT
<213> ORGANISM: Artificial Sequence
<220> FEATURE:
<223> OTHER INFORMATION: Linker

<400> SEQUENCE: 39

Gly Ser Ala Asp Asp Ala Lys Lys Asp Ala Ala Lys Lys Asp Gly Lys
1               5                   10                  15

Ser

<210> SEQ ID NO 40
<211> LENGTH: 22
<212> TYPE: PRT
<213> ORGANISM: Artificial Sequence
<220> FEATURE:
<223> OTHER INFORMATION: GMCSFR alpha chain

<400> SEQUENCE: 40

Met Leu Leu Leu Val Thr Ser Leu Leu Leu Cys Glu Leu Pro His Pro
1               5                   10                  15

Ala Phe Leu Leu Ile Pro
            20

```
<210> SEQ ID NO 41
<211> LENGTH: 66
<212> TYPE: DNA
<213> ORGANISM: Artificial Sequence
<220> FEATURE:
<223> OTHER INFORMATION: GMCSFR alpha chain

<400> SEQUENCE: 41
atgcttctcc tggtgacaag ccttctgctc tgtgagttac cacacccagc attcctcctg      60
atccca                                                                66

<210> SEQ ID NO 42
<211> LENGTH: 18
<212> TYPE: PRT
<213> ORGANISM: Artificial Sequence
<220> FEATURE:
<223> OTHER INFORMATION: CD8 alpha signal peptide

<400> SEQUENCE: 42

Met Ala Leu Pro Val Thr Ala Leu Leu Leu Pro Leu Ala Leu Leu Leu
1               5                   10                  15

His Ala

<210> SEQ ID NO 43
<211> LENGTH: 357
<212> TYPE: PRT
<213> ORGANISM: Artificial Sequence
<220> FEATURE:
<223> OTHER INFORMATION: truncated epidermal growth factor receptor
      (tEGFR)

<400> SEQUENCE: 43

Met Leu Leu Leu Val Thr Ser Leu Leu Leu Cys Glu Leu Pro His Pro
1               5                   10                  15

Ala Phe Leu Leu Ile Pro Arg Lys Val Cys Asn Gly Ile Gly Ile Gly
                20                  25                  30

Glu Phe Lys Asp Ser Leu Ser Ile Asn Ala Thr Asn Ile Lys His Phe
            35                  40                  45

Lys Asn Cys Thr Ser Ile Ser Gly Asp Leu His Ile Leu Pro Val Ala
    50                  55                  60

Phe Arg Gly Asp Ser Phe Thr His Thr Pro Pro Leu Asp Pro Gln Glu
65                  70                  75                  80

Leu Asp Ile Leu Lys Thr Val Lys Glu Ile Thr Gly Phe Leu Leu Ile
                85                  90                  95

Gln Ala Trp Pro Glu Asn Arg Thr Asp Leu His Ala Phe Glu Asn Leu
            100                 105                 110

Glu Ile Ile Arg Gly Arg Thr Lys Gln His Gly Gln Phe Ser Leu Ala
        115                 120                 125

Val Val Ser Leu Asn Ile Thr Ser Leu Gly Leu Arg Ser Leu Lys Glu
    130                 135                 140

Ile Ser Asp Gly Asp Val Ile Ile Ser Gly Asn Lys Asn Leu Cys Tyr
145                 150                 155                 160

Ala Asn Thr Ile Asn Trp Lys Lys Leu Phe Gly Thr Ser Gly Gln Lys
                165                 170                 175

Thr Lys Ile Ile Ser Asn Arg Gly Glu Asn Ser Cys Lys Ala Thr Gly
            180                 185                 190

Gln Val Cys His Ala Leu Cys Ser Pro Glu Gly Cys Trp Gly Pro Glu
        195                 200                 205
```

```
Pro Arg Asp Cys Val Ser Cys Arg Asn Val Ser Arg Gly Arg Glu Cys
    210                 215                 220

Val Asp Lys Cys Asn Leu Leu Glu Gly Glu Pro Arg Glu Phe Val Glu
225                 230                 235                 240

Asn Ser Glu Cys Ile Gln Cys His Pro Glu Cys Leu Pro Gln Ala Met
                245                 250                 255

Asn Ile Thr Cys Thr Gly Arg Gly Pro Asp Asn Cys Ile Gln Cys Ala
                260                 265                 270

His Tyr Ile Asp Gly Pro His Cys Val Lys Thr Cys Pro Ala Gly Val
            275                 280                 285

Met Gly Glu Asn Asn Thr Leu Val Trp Lys Tyr Ala Asp Ala Gly His
290                 295                 300

Val Cys His Leu Cys His Pro Asn Cys Thr Tyr Gly Cys Thr Gly Pro
305                 310                 315                 320

Gly Leu Glu Gly Cys Pro Thr Asn Gly Pro Lys Ile Pro Ser Ile Ala
                325                 330                 335

Thr Gly Met Val Gly Ala Leu Leu Leu Leu Val Val Ala Leu Gly
                340                 345                 350

Ile Gly Leu Phe Met
            355

<210> SEQ ID NO 44
<211> LENGTH: 335
<212> TYPE: PRT
<213> ORGANISM: Artificial Sequence
<220> FEATURE:
<223> OTHER INFORMATION: truncated epidermal growth factor receptor
      (tEGFR)

<400> SEQUENCE: 44

Arg Lys Val Cys Asn Gly Ile Gly Ile Gly Glu Phe Lys Asp Ser Leu
1               5                   10                  15

Ser Ile Asn Ala Thr Asn Ile Lys His Phe Lys Asn Cys Thr Ser Ile
                20                  25                  30

Ser Gly Asp Leu His Ile Leu Pro Val Ala Phe Arg Gly Asp Ser Phe
            35                  40                  45

Thr His Thr Pro Pro Leu Asp Pro Gln Glu Leu Asp Ile Leu Lys Thr
    50                  55                  60

Val Lys Glu Ile Thr Gly Phe Leu Leu Ile Gln Ala Trp Pro Glu Asn
65                  70                  75                  80

Arg Thr Asp Leu His Ala Phe Glu Asn Leu Glu Ile Ile Arg Gly Arg
                85                  90                  95

Thr Lys Gln His Gly Gln Phe Ser Leu Ala Val Val Ser Leu Asn Ile
                100                 105                 110

Thr Ser Leu Gly Leu Arg Ser Leu Lys Glu Ile Ser Asp Gly Asp Val
            115                 120                 125

Ile Ile Ser Gly Asn Lys Asn Leu Cys Tyr Ala Asn Thr Ile Asn Trp
        130                 135                 140

Lys Lys Leu Phe Gly Thr Ser Gly Gln Lys Thr Lys Ile Ile Ser Asn
145                 150                 155                 160

Arg Gly Glu Asn Ser Cys Lys Ala Thr Gly Gln Val Cys His Ala Leu
                165                 170                 175

Cys Ser Pro Glu Gly Cys Trp Gly Pro Glu Pro Arg Asp Cys Val Ser
            180                 185                 190

Cys Arg Asn Val Ser Arg Gly Arg Glu Cys Val Asp Lys Cys Asn Leu
        195                 200                 205
```

Leu Glu Gly Glu Pro Arg Glu Phe Val Glu Asn Ser Glu Cys Ile Gln
            210                 215                 220

Cys His Pro Glu Cys Leu Pro Gln Ala Met Asn Ile Thr Cys Thr Gly
225                 230                 235                 240

Arg Gly Pro Asp Asn Cys Ile Gln Cys Ala His Tyr Ile Asp Gly Pro
                245                 250                 255

His Cys Val Lys Thr Cys Pro Ala Gly Val Met Gly Glu Asn Asn Thr
            260                 265                 270

Leu Val Trp Lys Tyr Ala Asp Ala Gly His Val Cys His Leu Cys His
            275                 280                 285

Pro Asn Cys Thr Tyr Gly Cys Thr Gly Pro Gly Leu Glu Gly Cys Pro
            290                 295                 300

Thr Asn Gly Pro Lys Ile Pro Ser Ile Ala Thr Gly Met Val Gly Ala
305                 310                 315                 320

Leu Leu Leu Leu Leu Val Val Ala Leu Gly Ile Gly Leu Phe Met
                325                 330                 335

<210> SEQ ID NO 45
<211> LENGTH: 22
<212> TYPE: PRT
<213> ORGANISM: Artificial Sequence
<220> FEATURE:
<223> OTHER INFORMATION: F2A

<400> SEQUENCE: 45

Val Lys Gln Thr Leu Asn Phe Asp Leu Leu Lys Leu Ala Gly Asp Val
1               5                   10                  15

Glu Ser Asn Pro Gly Pro
            20

<210> SEQ ID NO 46
<211> LENGTH: 20
<212> TYPE: PRT
<213> ORGANISM: Artificial Sequence
<220> FEATURE:
<223> OTHER INFORMATION: E2A

<400> SEQUENCE: 46

Gln Cys Thr Asn Tyr Ala Leu Leu Lys Leu Ala Gly Asp Val Glu Ser
1               5                   10                  15

Asn Pro Gly Pro
            20

<210> SEQ ID NO 47
<211> LENGTH: 24
<212> TYPE: PRT
<213> ORGANISM: Artificial Sequence
<220> FEATURE:
<223> OTHER INFORMATION: T2A

<400> SEQUENCE: 47

Leu Glu Gly Gly Gly Glu Gly Arg Gly Ser Leu Leu Thr Cys Gly Asp
1               5                   10                  15

Val Glu Glu Asn Pro Gly Pro Arg
            20

<210> SEQ ID NO 48
<211> LENGTH: 18
<212> TYPE: PRT
<213> ORGANISM: Artificial Sequence
<220> FEATURE:

```
<223> OTHER INFORMATION: T2A

<400> SEQUENCE: 48

Glu Gly Arg Gly Ser Leu Leu Thr Cys Gly Asp Val Glu Glu Asn Pro
1               5                   10                  15

Gly Pro

<210> SEQ ID NO 49
<211> LENGTH: 22
<212> TYPE: PRT
<213> ORGANISM: Artificial Sequence
<220> FEATURE:
<223> OTHER INFORMATION: P2A

<400> SEQUENCE: 49

Gly Ser Gly Ala Thr Asn Phe Ser Leu Leu Lys Gln Ala Gly Asp Val
1               5                   10                  15

Glu Glu Asn Pro Gly Pro
            20

<210> SEQ ID NO 50
<211> LENGTH: 19
<212> TYPE: PRT
<213> ORGANISM: Artificial Sequence
<220> FEATURE:
<223> OTHER INFORMATION: P2A

<400> SEQUENCE: 50

Ala Thr Asn Phe Ser Leu Leu Lys Gln Ala Gly Asp Val Glu Glu Asn
1               5                   10                  15

Pro Gly Pro

<210> SEQ ID NO 51
<211> LENGTH: 5
<212> TYPE: PRT
<213> ORGANISM: Artificial Sequence
<220> FEATURE:
<223> OTHER INFORMATION: CDR H1

<400> SEQUENCE: 51

Asp Tyr Gly Val Ser
1               5

<210> SEQ ID NO 52
<211> LENGTH: 16
<212> TYPE: PRT
<213> ORGANISM: Artificial Sequence
<220> FEATURE:
<223> OTHER INFORMATION: CDR H2

<400> SEQUENCE: 52

Val Ile Trp Gly Ser Glu Thr Thr Tyr Tyr Asn Ser Ala Leu Lys Ser
1               5                   10                  15

<210> SEQ ID NO 53
<211> LENGTH: 7
<212> TYPE: PRT
<213> ORGANISM: Artificial Sequence
<220> FEATURE:
<223> OTHER INFORMATION: CDR H3

<400> SEQUENCE: 53

Tyr Ala Met Asp Tyr Trp Gly
1               5
```

```
<210> SEQ ID NO 54
<211> LENGTH: 12
<212> TYPE: PRT
<213> ORGANISM: Artificial Sequence
<220> FEATURE:
<223> OTHER INFORMATION: CDR H3

<400> SEQUENCE: 54

His Tyr Tyr Tyr Gly Gly Ser Tyr Ala Met Asp Tyr
1               5                   10

<210> SEQ ID NO 55
<211> LENGTH: 11
<212> TYPE: PRT
<213> ORGANISM: Artificial Sequence
<220> FEATURE:
<223> OTHER INFORMATION: CDR L1

<400> SEQUENCE: 55

Arg Ala Ser Gln Asp Ile Ser Lys Tyr Leu Asn
1               5                   10

<210> SEQ ID NO 56
<211> LENGTH: 7
<212> TYPE: PRT
<213> ORGANISM: Artificial Sequence
<220> FEATURE:
<223> OTHER INFORMATION: CDR L2

<400> SEQUENCE: 56

Ser Arg Leu His Ser Gly Val
1               5

<210> SEQ ID NO 57
<211> LENGTH: 7
<212> TYPE: PRT
<213> ORGANISM: Artificial Sequence
<220> FEATURE:
<223> OTHER INFORMATION: CDR L2

<400> SEQUENCE: 57

His Thr Ser Arg Leu His Ser
1               5

<210> SEQ ID NO 58
<211> LENGTH: 9
<212> TYPE: PRT
<213> ORGANISM: Artificial Sequence
<220> FEATURE:
<223> OTHER INFORMATION: CDR L3

<400> SEQUENCE: 58

Gly Asn Thr Leu Pro Tyr Thr Phe Gly
1               5

<210> SEQ ID NO 59
<211> LENGTH: 9
<212> TYPE: PRT
<213> ORGANISM: Artificial Sequence
<220> FEATURE:
<223> OTHER INFORMATION: CDR L3

<400> SEQUENCE: 59

Gln Gln Gly Asn Thr Leu Pro Tyr Thr
1               5
```

```
<210> SEQ ID NO 60
<211> LENGTH: 120
<212> TYPE: PRT
<213> ORGANISM: Artificial Sequence
<220> FEATURE:
<223> OTHER INFORMATION: VH

<400> SEQUENCE: 60
```

Glu Val Lys Leu Gln Glu Ser Gly Pro Gly Leu Val Ala Pro Ser Gln
1               5                   10                  15

Ser Leu Ser Val Thr Cys Thr Val Ser Gly Val Ser Leu Pro Asp Tyr
            20                  25                  30

Gly Val Ser Trp Ile Arg Gln Pro Pro Arg Lys Gly Leu Glu Trp Leu
        35                  40                  45

Gly Val Ile Trp Gly Ser Glu Thr Thr Tyr Tyr Asn Ser Ala Leu Lys
    50                  55                  60

Ser Arg Leu Thr Ile Ile Lys Asp Asn Ser Lys Ser Gln Val Phe Leu
65                  70                  75                  80

Lys Met Asn Ser Leu Gln Thr Asp Asp Thr Ala Ile Tyr Tyr Cys Ala
                85                  90                  95

Lys His Tyr Tyr Tyr Gly Gly Ser Tyr Ala Met Asp Tyr Trp Gly Gln
            100                 105                 110

Gly Thr Ser Val Thr Val Ser Ser
        115                 120

```
<210> SEQ ID NO 61
<211> LENGTH: 107
<212> TYPE: PRT
<213> ORGANISM: Artificial Sequence
<220> FEATURE:
<223> OTHER INFORMATION: VL

<400> SEQUENCE: 61
```

Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr
            100                 105

```
<210> SEQ ID NO 62
<211> LENGTH: 18
<212> TYPE: PRT
<213> ORGANISM: Artificial Sequence
<220> FEATURE:
<223> OTHER INFORMATION: Linker

<400> SEQUENCE: 62
```

Gly Ser Thr Ser Gly Ser Gly Lys Pro Gly Ser Gly Glu Gly Ser Thr
1               5                   10                  15

Lys Gly

<210> SEQ ID NO 63
<211> LENGTH: 735
<212> TYPE: DNA
<213> ORGANISM: Artificial Sequence
<220> FEATURE:
<223> OTHER INFORMATION: Sequence encoding scFv

<400> SEQUENCE: 63

```
gacatccaga tgacccagac cacctccagc ctgagcgcca gcctgggcga ccgggtgacc      60
atcagctgcc gggccagcca ggacatcagc aagtacctga actggtatca gcagaagccc     120
gacggcaccg tcaagctgct gatctaccac accagccggc tgcacagcgg cgtgcccagc     180
cggtttagcg gcagcggctc cggcaccgac tacagcctga ccatctccaa cctggaacag     240
gaagatatcg ccacctactt ttgccagcag ggcaacacac tgccctacac ctttggcggc     300
ggaacaaagc tggaaatcac cggcagcacc tccggcagcg gcaagcctgg cagcggcgag     360
ggcagcacca agggcgaggt gaagctgcag gaaagcggcc ctggcctggt ggcccccagc     420
cagagcctga gcgtgacctg caccgtgagc ggcgtgagcc tgcccgacta cggcgtgagc     480
tggatccggc agccccccag gaagggcctg gaatggctgg gcgtgatctg gggcagcgag     540
accacctact acaacagcgc cctgaagagc cggctgacca tcatcaagga caacagcaag     600
agccaggtgt tcctgaagat gaacagcctg cagaccgacg acaccgccat ctactactgc     660
gccaagcact actactacgg cggcagctac gccatggact actggggcca gggcaccagc     720
gtgaccgtga gcagc                                                      735
```

<210> SEQ ID NO 64
<211> LENGTH: 245
<212> TYPE: PRT
<213> ORGANISM: Artificial Sequence
<220> FEATURE:
<223> OTHER INFORMATION: scFv

<400> SEQUENCE: 64

```
Asp Ile Gln Met Thr Gln Thr Thr Ser Ser Leu Ser Ala Ser Leu Gly
1               5                   10                  15

Asp Arg Val Thr Ile Ser Cys Arg Ala Ser Gln Asp Ile Ser Lys Tyr
            20                  25                  30

Leu Asn Trp Tyr Gln Gln Lys Pro Asp Gly Thr Val Lys Leu Leu Ile
        35                  40                  45

Tyr His Thr Ser Arg Leu His Ser Gly Val Pro Ser Arg Phe Ser Gly
    50                  55                  60

Ser Gly Ser Gly Thr Asp Tyr Ser Leu Thr Ile Ser Asn Leu Glu Gln
65                  70                  75                  80

Glu Asp Ile Ala Thr Tyr Phe Cys Gln Gln Gly Asn Thr Leu Pro Tyr
                85                  90                  95

Thr Phe Gly Gly Gly Thr Lys Leu Glu Ile Thr Gly Ser Thr Ser Gly
            100                 105                 110

Ser Gly Lys Pro Gly Ser Gly Glu Gly Ser Thr Lys Gly Glu Val Lys
        115                 120                 125

Leu Gln Glu Ser Gly Pro Gly Leu Val Ala Pro Ser Gln Ser Leu Ser
    130                 135                 140

Val Thr Cys Thr Val Ser Gly Val Ser Leu Pro Asp Tyr Gly Val Ser
145                 150                 155                 160

Trp Ile Arg Gln Pro Pro Arg Lys Gly Leu Glu Trp Leu Gly Val Ile
                165                 170                 175
```

```
Trp Gly Ser Glu Thr Thr Tyr Tyr Asn Ser Ala Leu Lys Ser Arg Leu
            180                 185                 190

Thr Ile Ile Lys Asp Asn Ser Lys Ser Gln Val Phe Leu Lys Met Asn
        195                 200                 205

Ser Leu Gln Thr Asp Asp Thr Ala Ile Tyr Tyr Cys Ala Lys His Tyr
    210                 215                 220

Tyr Tyr Gly Gly Ser Tyr Ala Met Asp Tyr Trp Gly Gln Gly Thr Ser
225                 230                 235                 240

Val Thr Val Ser Ser
                245

<210> SEQ ID NO 65
<211> LENGTH: 5
<212> TYPE: PRT
<213> ORGANISM: Artificial Sequence
<220> FEATURE:
<223> OTHER INFORMATION: CDR H1

<400> SEQUENCE: 65

Ser Tyr Trp Met Asn
1               5

<210> SEQ ID NO 66
<211> LENGTH: 17
<212> TYPE: PRT
<213> ORGANISM: Artificial Sequence
<220> FEATURE:
<223> OTHER INFORMATION: CDR H2

<400> SEQUENCE: 66

Gln Ile Tyr Pro Gly Asp Gly Asp Thr Asn Tyr Asn Gly Lys Phe Lys
1               5                   10                  15

Gly

<210> SEQ ID NO 67
<211> LENGTH: 13
<212> TYPE: PRT
<213> ORGANISM: Artificial Sequence
<220> FEATURE:
<223> OTHER INFORMATION: CDR H3

<400> SEQUENCE: 67

Lys Thr Ile Ser Ser Val Val Asp Phe Tyr Phe Asp Tyr
1               5                   10

<210> SEQ ID NO 68
<211> LENGTH: 9
<212> TYPE: PRT
<213> ORGANISM: Artificial Sequence
<220> FEATURE:
<223> OTHER INFORMATION: CDR L3

<400> SEQUENCE: 68

Gln Gln Tyr Asn Arg Tyr Pro Tyr Thr
1               5

<210> SEQ ID NO 69
<211> LENGTH: 5
<212> TYPE: PRT
<213> ORGANISM: Artificial Sequence
<220> FEATURE:
<223> OTHER INFORMATION: CDR H1

<400> SEQUENCE: 69
```

```
Ser Tyr Trp Met Asn
1               5
```

```
<210> SEQ ID NO 70
<211> LENGTH: 17
<212> TYPE: PRT
<213> ORGANISM: Artificial Sequence
<220> FEATURE:
<223> OTHER INFORMATION: CDR H2

<400> SEQUENCE: 70

Gln Ile Tyr Pro Gly Asp Gly Asp Thr Asn Tyr Asn Gly Lys Phe Lys
1               5                   10                  15

Gly
```

```
<210> SEQ ID NO 71
<211> LENGTH: 122
<212> TYPE: PRT
<213> ORGANISM: Artificial Sequence
<220> FEATURE:
<223> OTHER INFORMATION: VH

<400> SEQUENCE: 71

Glu Val Lys Leu Gln Gln Ser Gly Ala Glu Leu Val Arg Pro Gly Ser
1               5                   10                  15

Ser Val Lys Ile Ser Cys Lys Ala Ser Gly Tyr Ala Phe Ser Ser Tyr
                20                  25                  30

Trp Met Asn Trp Val Lys Gln Arg Pro Gly Gln Gly Leu Glu Trp Ile
            35                  40                  45

Gly Gln Ile Tyr Pro Gly Asp Gly Asp Thr Asn Tyr Asn Gly Lys Phe
        50                  55                  60

Lys Gly Gln Ala Thr Leu Thr Ala Asp Lys Ser Ser Ser Thr Ala Tyr
65                  70                  75                  80

Met Gln Leu Ser Gly Leu Thr Ser Glu Asp Ser Ala Val Tyr Phe Cys
                85                  90                  95

Ala Arg Lys Thr Ile Ser Ser Val Val Asp Phe Tyr Phe Asp Tyr Trp
                100                 105                 110

Gly Gln Gly Thr Thr Val Thr Val Ser Ser
            115                 120
```

```
<210> SEQ ID NO 72
<211> LENGTH: 108
<212> TYPE: PRT
<213> ORGANISM: Artificial Sequence
<220> FEATURE:
<223> OTHER INFORMATION: VL

<400> SEQUENCE: 72

Asp Ile Glu Leu Thr Gln Ser Pro Lys Phe Met Ser Thr Ser Val Gly
1               5                   10                  15

Asp Arg Val Ser Val Thr Cys Lys Ala Ser Gln Asn Val Gly Thr Asn
                20                  25                  30

Val Ala Trp Tyr Gln Gln Lys Pro Gly Gln Ser Pro Lys Pro Leu Ile
            35                  40                  45

Tyr Ser Ala Thr Tyr Arg Asn Ser Gly Val Pro Asp Arg Phe Thr Gly
        50                  55                  60

Ser Gly Ser Gly Thr Asp Phe Thr Leu Thr Ile Thr Asn Val Gln Ser
65                  70                  75                  80

Lys Asp Leu Ala Asp Tyr Phe Cys Gln Gln Tyr Asn Arg Tyr Pro Tyr
                85                  90                  95
```

```
Thr Ser Gly Gly Gly Thr Lys Leu Glu Ile Lys Arg
            100                 105

<210> SEQ ID NO 73
<211> LENGTH: 11
<212> TYPE: PRT
<213> ORGANISM: Artificial Sequence
<220> FEATURE:
<223> OTHER INFORMATION: CDR L1

<400> SEQUENCE: 73

Lys Ala Ser Gln Asn Val Gly Thr Asn Val Ala
1               5                   10

<210> SEQ ID NO 74
<211> LENGTH: 7
<212> TYPE: PRT
<213> ORGANISM: Artificial Sequence
<220> FEATURE:
<223> OTHER INFORMATION: CDR L2

<400> SEQUENCE: 74

Ser Ala Thr Tyr Arg Asn Ser
1               5

<210> SEQ ID NO 75
<211> LENGTH: 9
<212> TYPE: PRT
<213> ORGANISM: Artificial Sequence
<220> FEATURE:
<223> OTHER INFORMATION: CDR L3

<400> SEQUENCE: 75

Gln Gln Tyr Asn Arg Tyr Pro Tyr Thr
1               5

<210> SEQ ID NO 76
<211> LENGTH: 5
<212> TYPE: PRT
<213> ORGANISM: Artificial Sequence
<220> FEATURE:
<223> OTHER INFORMATION: CDR H1

<400> SEQUENCE: 76

Ser Tyr Trp Met Asn
1               5

<210> SEQ ID NO 77
<211> LENGTH: 17
<212> TYPE: PRT
<213> ORGANISM: Artificial Sequence
<220> FEATURE:
<223> OTHER INFORMATION: CDR H2

<400> SEQUENCE: 77

Gln Ile Tyr Pro Gly Asp Gly Asp Thr Asn Tyr Asn Gly Lys Phe Lys
1               5                   10                  15

Gly

<210> SEQ ID NO 78
<211> LENGTH: 13
<212> TYPE: PRT
<213> ORGANISM: Artificial Sequence
<220> FEATURE:
<223> OTHER INFORMATION: CDR H3
```

<400> SEQUENCE: 78

Lys Thr Ile Ser Ser Val Val Asp Phe Tyr Phe Asp Tyr
1               5                   10

<210> SEQ ID NO 79
<211> LENGTH: 15
<212> TYPE: PRT
<213> ORGANISM: Artificial Sequence
<220> FEATURE:
<223> OTHER INFORMATION: Linker

<400> SEQUENCE: 79

Gly Gly Gly Gly Ser Gly Gly Gly Gly Ser Gly Gly Gly Gly Ser
1               5                   10                  15

<210> SEQ ID NO 80
<211> LENGTH: 245
<212> TYPE: PRT
<213> ORGANISM: Artificial Sequence
<220> FEATURE:
<223> OTHER INFORMATION: scFv

<400> SEQUENCE: 80

Glu Val Lys Leu Gln Gln Ser Gly Ala Glu Leu Val Arg Pro Gly Ser
1               5                   10                  15

Ser Val Lys Ile Ser Cys Lys Ala Ser Gly Tyr Ala Phe Ser Ser Tyr
                20                  25                  30

Trp Met Asn Trp Val Lys Gln Arg Pro Gly Gln Gly Leu Glu Trp Ile
            35                  40                  45

Gly Gln Ile Tyr Pro Gly Asp Gly Asp Thr Asn Tyr Asn Gly Lys Phe
        50                  55                  60

Lys Gly Gln Ala Thr Leu Thr Ala Asp Lys Ser Ser Ser Thr Ala Tyr
65                  70                  75                  80

Met Gln Leu Ser Gly Leu Thr Ser Glu Asp Ser Ala Val Tyr Phe Cys
                85                  90                  95

Ala Arg Lys Thr Ile Ser Ser Val Val Asp Phe Tyr Phe Asp Tyr Trp
                100                 105                 110

Gly Gln Gly Thr Thr Val Thr Val Ser Ser Gly Gly Gly Gly Ser Gly
            115                 120                 125

Gly Gly Ser Gly Gly Gly Gly Ser Asp Ile Glu Leu Thr Gln Ser
        130                 135                 140

Pro Lys Phe Met Ser Thr Ser Val Gly Asp Arg Val Ser Val Thr Cys
145                 150                 155                 160

Lys Ala Ser Gln Asn Val Gly Thr Asn Val Ala Trp Tyr Gln Gln Lys
                165                 170                 175

Pro Gly Gln Ser Pro Lys Pro Leu Ile Tyr Ser Ala Thr Tyr Arg Asn
            180                 185                 190

Ser Gly Val Pro Asp Arg Phe Thr Gly Ser Gly Ser Gly Thr Asp Phe
        195                 200                 205

Thr Leu Thr Ile Thr Asn Val Gln Ser Lys Asp Leu Ala Asp Tyr Phe
210                 215                 220

Cys Gln Gln Tyr Asn Arg Tyr Pro Tyr Thr Ser Gly Gly Gly Thr Lys
225                 230                 235                 240

Leu Glu Ile Lys Arg
                245

<210> SEQ ID NO 81
<211> LENGTH: 12

```
<212> TYPE: PRT
<213> ORGANISM: Homo sapiens
<220> FEATURE:
<223> OTHER INFORMATION: spacer (IgG4hinge)

<400> SEQUENCE: 81

Glu Ser Lys Tyr Gly Pro Pro Cys Pro Pro Cys Pro
1               5                   10

<210> SEQ ID NO 82
<211> LENGTH: 36
<212> TYPE: DNA
<213> ORGANISM: Homo sapiens
<220> FEATURE:
<223> OTHER INFORMATION: spacer (IgG4hinge)

<400> SEQUENCE: 82
gaatctaagt acggaccgcc ctgcccccct tgccct                              36

<210> SEQ ID NO 83
<211> LENGTH: 119
<212> TYPE: PRT
<213> ORGANISM: Homo sapiens
<220> FEATURE:
<223> OTHER INFORMATION: Hinge-CH3 spacer

<400> SEQUENCE: 83

Glu Ser Lys Tyr Gly Pro Pro Cys Pro Pro Cys Pro Gly Gln Pro Arg
1               5                   10                  15

Glu Pro Gln Val Tyr Thr Leu Pro Pro Ser Gln Glu Glu Met Thr Lys
                20                  25                  30

Asn Gln Val Ser Leu Thr Cys Leu Val Lys Gly Phe Tyr Pro Ser Asp
            35                  40                  45

Ile Ala Val Glu Trp Glu Ser Asn Gly Gln Pro Glu Asn Asn Tyr Lys
        50                  55                  60

Thr Thr Pro Pro Val Leu Asp Ser Asp Gly Ser Phe Phe Leu Tyr Ser
65                  70                  75                  80

Arg Leu Thr Val Asp Lys Ser Arg Trp Gln Glu Gly Asn Val Phe Ser
                85                  90                  95

Cys Ser Val Met His Glu Ala Leu His Asn His Tyr Thr Gln Lys Ser
                100                 105                 110

Leu Ser Leu Ser Leu Gly Lys
        115

<210> SEQ ID NO 84
<211> LENGTH: 229
<212> TYPE: PRT
<213> ORGANISM: Homo sapiens
<220> FEATURE:
<223> OTHER INFORMATION: Hinge-CH2-CH3 spacer

<400> SEQUENCE: 84

Glu Ser Lys Tyr Gly Pro Pro Cys Pro Pro Cys Pro Ala Pro Glu Phe
1               5                   10                  15

Leu Gly Gly Pro Ser Val Phe Leu Phe Pro Pro Lys Pro Lys Asp Thr
                20                  25                  30

Leu Met Ile Ser Arg Thr Pro Glu Val Thr Cys Val Val Val Asp Val
            35                  40                  45

Ser Gln Glu Asp Pro Glu Val Gln Phe Asn Trp Tyr Val Asp Gly Val
        50                  55                  60

Glu Val His Asn Ala Lys Thr Lys Pro Arg Glu Glu Gln Phe Asn Ser
```

```
                65                  70                  75                  80
            Thr Tyr Arg Val Val Ser Val Leu Thr Val Leu His Gln Asp Trp Leu
                            85                  90                  95
            Asn Gly Lys Glu Tyr Lys Cys Lys Val Ser Asn Lys Gly Leu Pro Ser
                           100                 105                 110
            Ser Ile Glu Lys Thr Ile Ser Lys Ala Lys Gly Gln Pro Arg Glu Pro
                           115                 120                 125
            Gln Val Tyr Thr Leu Pro Pro Ser Gln Glu Met Thr Lys Asn Gln
                130                 135                 140
            Val Ser Leu Thr Cys Leu Val Lys Gly Phe Tyr Pro Ser Asp Ile Ala
            145                 150                 155                 160
            Val Glu Trp Glu Ser Asn Gly Gln Pro Glu Asn Asn Tyr Lys Thr Thr
                           165                 170                 175
            Pro Pro Val Leu Asp Ser Asp Gly Ser Phe Phe Leu Tyr Ser Arg Leu
                           180                 185                 190
            Thr Val Asp Lys Ser Arg Trp Gln Glu Gly Asn Val Phe Ser Cys Ser
                           195                 200                 205
            Val Met His Glu Ala Leu His Asn His Tyr Thr Gln Lys Ser Leu Ser
                210                 215                 220
            Leu Ser Leu Gly Lys
            225

<210> SEQ ID NO 85
<211> LENGTH: 282
<212> TYPE: PRT
<213> ORGANISM: Homo sapiens
<220> FEATURE:
<223> OTHER INFORMATION: IgD-hinge-Fc

<400> SEQUENCE: 85

Arg Trp Pro Glu Ser Pro Lys Ala Gln Ala Ser Ser Val Pro Thr Ala
            1               5                   10                  15
            Gln Pro Gln Ala Glu Gly Ser Leu Ala Lys Ala Thr Thr Ala Pro Ala
                           20                  25                  30
            Thr Thr Arg Asn Thr Gly Arg Gly Gly Glu Glu Lys Lys Lys Glu Lys
                           35                  40                  45
            Glu Lys Glu Glu Gln Glu Glu Arg Glu Thr Lys Thr Pro Glu Cys Pro
                50                  55                  60
            Ser His Thr Gln Pro Leu Gly Val Tyr Leu Leu Thr Pro Ala Val Gln
            65                  70                  75                  80
            Asp Leu Trp Leu Arg Asp Lys Ala Thr Phe Thr Cys Phe Val Val Gly
                           85                  90                  95
            Ser Asp Leu Lys Asp Ala His Leu Thr Trp Glu Val Ala Gly Lys Val
                           100                 105                 110
            Pro Thr Gly Gly Val Glu Glu Gly Leu Leu Glu Arg His Ser Asn Gly
                           115                 120                 125
            Ser Gln Ser Gln His Ser Arg Leu Thr Leu Pro Arg Ser Leu Trp Asn
                130                 135                 140
            Ala Gly Thr Ser Val Thr Cys Thr Leu Asn His Pro Ser Leu Pro Pro
            145                 150                 155                 160
            Gln Arg Leu Met Ala Leu Arg Glu Pro Ala Ala Gln Ala Pro Val Lys
                           165                 170                 175
            Leu Ser Leu Asn Leu Leu Ala Ser Ser Asp Pro Pro Glu Ala Ala Ser
                           180                 185                 190
            Trp Leu Leu Cys Glu Val Ser Gly Phe Ser Pro Pro Asn Ile Leu Leu
```

```
                195                 200                 205
Met Trp Leu Glu Asp Gln Arg Glu Val Asn Thr Ser Gly Phe Ala Pro
        210                 215                 220

Ala Arg Pro Pro Gln Pro Gly Ser Thr Thr Phe Trp Ala Trp Ser
225                 230                 235                 240

Val Leu Arg Val Pro Ala Pro Ser Pro Gln Pro Ala Thr Tyr Thr
                245                 250                 255

Cys Val Val Ser His Glu Asp Ser Arg Thr Leu Leu Asn Ala Ser Arg
            260                 265                 270

Ser Leu Glu Val Ser Tyr Val Thr Asp His
        275                 280

<210> SEQ ID NO 86
<211> LENGTH: 14
<212> TYPE: PRT
<213> ORGANISM: Artificial Sequence
<220> FEATURE:
<223> OTHER INFORMATION: Exemplary IgG Hinge

<400> SEQUENCE: 86

Glu Val Val Val Lys Tyr Gly Pro Pro Cys Pro Pro Cys Pro
1               5                   10

<210> SEQ ID NO 87
<211> LENGTH: 5
<212> TYPE: PRT
<213> ORGANISM: Artificial Sequence
<220> FEATURE:
<223> OTHER INFORMATION: Exemplary IgG Hinge
<220> FEATURE:
<221> NAME/KEY: VARIANT
<222> LOCATION: 1
<223> OTHER INFORMATION: Xaa is Gly, Cys, or Arg
<220> FEATURE:
<221> NAME/KEY: VARIANT
<222> LOCATION: 4
<223> OTHER INFORMATION: Xaa is Cys or Thr

<400> SEQUENCE: 87

Xaa Pro Pro Xaa Pro
1               5

<210> SEQ ID NO 88
<211> LENGTH: 15
<212> TYPE: PRT
<213> ORGANISM: Artificial Sequence
<220> FEATURE:
<223> OTHER INFORMATION: Exemplary IgG Hinge

<400> SEQUENCE: 88

Glu Pro Lys Ser Cys Asp Lys Thr His Thr Cys Pro Pro Cys Pro
1               5                   10                  15

<210> SEQ ID NO 89
<211> LENGTH: 12
<212> TYPE: PRT
<213> ORGANISM: Artificial Sequence
<220> FEATURE:
<223> OTHER INFORMATION: Exemplary IgG Hinge

<400> SEQUENCE: 89

Glu Arg Lys Cys Cys Val Glu Cys Pro Pro Cys Pro
1               5                   10

<210> SEQ ID NO 90
```

<211> LENGTH: 61
<212> TYPE: PRT
<213> ORGANISM: Artificial Sequence
<220> FEATURE:
<223> OTHER INFORMATION: Exemplary IgG Hinge

<400> SEQUENCE: 90

Glu Leu Lys Thr Pro Leu Gly Asp Thr His Thr Cys Pro Arg Cys Pro
1               5                   10                  15

Glu Pro Lys Ser Cys Asp Thr Pro Pro Cys Pro Arg Cys Pro Glu
            20                  25                  30

Pro Lys Ser Cys Asp Thr Pro Pro Cys Pro Arg Cys Pro Glu Pro
        35                  40                  45

Lys Ser Cys Asp Thr Pro Pro Cys Pro Arg Cys Pro
    50                  55                  60

<210> SEQ ID NO 91
<211> LENGTH: 12
<212> TYPE: PRT
<213> ORGANISM: Artificial Sequence
<220> FEATURE:
<223> OTHER INFORMATION: Exemplary IgG Hinge

<400> SEQUENCE: 91

Glu Ser Lys Tyr Gly Pro Pro Cys Pro Ser Cys Pro
1               5                   10

<210> SEQ ID NO 92
<211> LENGTH: 12
<212> TYPE: PRT
<213> ORGANISM: Artificial Sequence
<220> FEATURE:
<223> OTHER INFORMATION: Exemplary IgG Hinge

<400> SEQUENCE: 92

Glu Ser Lys Tyr Gly Pro Pro Cys Pro Pro Cys Pro
1               5                   10

<210> SEQ ID NO 93
<211> LENGTH: 9
<212> TYPE: PRT
<213> ORGANISM: Artificial Sequence
<220> FEATURE:
<223> OTHER INFORMATION: Exemplary IgG Hinge

<400> SEQUENCE: 93

Tyr Gly Pro Pro Cys Pro Pro Cys Pro
1               5

<210> SEQ ID NO 94
<211> LENGTH: 10
<212> TYPE: PRT
<213> ORGANISM: Artificial Sequence
<220> FEATURE:
<223> OTHER INFORMATION: Exemplary IgG Hinge

<400> SEQUENCE: 94

Lys Tyr Gly Pro Pro Cys Pro Pro Cys Pro
1               5                   10

<210> SEQ ID NO 95
<211> LENGTH: 27
<212> TYPE: PRT
<213> ORGANISM: Homo sapiens
<220> FEATURE:
<223> OTHER INFORMATION: CD28 (amino acids 153-179 of Accession No.

P10747)

<400> SEQUENCE: 95

Phe Trp Val Leu Val Val Gly Gly Val Leu Ala Cys Tyr Ser Leu
1               5                  10                  15

Leu Val Thr Val Ala Phe Ile Ile Phe Trp Val
            20                  25

<210> SEQ ID NO 96
<211> LENGTH: 66
<212> TYPE: PRT
<213> ORGANISM: Homo sapiens
<220> FEATURE:
<223> OTHER INFORMATION: CD28 (amino acids 114-179 of Accession No.
      P10747)

<400> SEQUENCE: 96

Ile Glu Val Met Tyr Pro Pro Pro Tyr Leu Asp Asn Glu Lys Ser Asn
1               5                  10                  15

Gly Thr Ile Ile His Val Lys Gly Lys His Leu Cys Pro Ser Pro Leu
            20                  25                  30

Phe Pro Gly Pro Ser Lys Pro Phe Trp Val Leu Val Val Val Gly Gly
        35                  40                  45

Val Leu Ala Cys Tyr Ser Leu Leu Val Thr Val Ala Phe Ile Ile Phe
    50                  55                  60

Trp Val
65

<210> SEQ ID NO 97
<211> LENGTH: 41
<212> TYPE: PRT
<213> ORGANISM: Homo sapiens
<220> FEATURE:
<223> OTHER INFORMATION: CD28 (amino acids 180-220 Accession No. P10747)

<400> SEQUENCE: 97

Arg Ser Lys Arg Ser Arg Leu Leu His Ser Asp Tyr Met Asn Met Thr
1               5                  10                  15

Pro Arg Arg Pro Gly Pro Thr Arg Lys His Tyr Gln Pro Tyr Ala Pro
            20                  25                  30

Pro Arg Asp Phe Ala Ala Tyr Arg Ser
        35                  40

<210> SEQ ID NO 98
<211> LENGTH: 41
<212> TYPE: PRT
<213> ORGANISM: Homo sapiens
<220> FEATURE:
<223> OTHER INFORMATION: CD28 (LL to GG)

<400> SEQUENCE: 98

Arg Ser Lys Arg Ser Arg Gly Gly His Ser Asp Tyr Met Asn Met Thr
1               5                  10                  15

Pro Arg Arg Pro Gly Pro Thr Arg Lys His Tyr Gln Pro Tyr Ala Pro
            20                  25                  30

Pro Arg Asp Phe Ala Ala Tyr Arg Ser
        35                  40

<210> SEQ ID NO 99
<211> LENGTH: 42
<212> TYPE: PRT
<213> ORGANISM: Homo sapien

<220> FEATURE:
<223> OTHER INFORMATION: 4-1BB (amino acids 214-255 of Q07011.1)

<400> SEQUENCE: 99

Lys Arg Gly Arg Lys Lys Leu Leu Tyr Ile Phe Lys Gln Pro Phe Met
1               5                   10                  15

Arg Pro Val Gln Thr Thr Gln Glu Glu Asp Gly Cys Ser Cys Arg Phe
            20                  25                  30

Pro Glu Glu Glu Glu Gly Gly Cys Glu Leu
        35                  40

<210> SEQ ID NO 100
<211> LENGTH: 112
<212> TYPE: PRT
<213> ORGANISM: Homo sapiens
<220> FEATURE:
<223> OTHER INFORMATION: CD3 zeta

<400> SEQUENCE: 100

Arg Val Lys Phe Ser Arg Ser Ala Asp Ala Pro Ala Tyr Gln Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
    50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110

<210> SEQ ID NO 101
<211> LENGTH: 112
<212> TYPE: PRT
<213> ORGANISM: Homo sapiens
<220> FEATURE:
<223> OTHER INFORMATION: CD3 zeta

<400> SEQUENCE: 101

Arg Val Lys Phe Ser Arg Ser Ala Glu Pro Pro Ala Tyr Gln Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
    50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110

<210> SEQ ID NO 102
<211> LENGTH: 112

<212> TYPE: PRT
<213> ORGANISM: Homo sapiens
<220> FEATURE:
<223> OTHER INFORMATION: CD3 zeta

<400> SEQUENCE: 102

```
Arg Val Lys Phe Ser Arg Ser Ala Asp Ala Pro Ala Tyr Lys Gln Gly
1               5                   10                  15

Gln Asn Gln Leu Tyr Asn Glu Leu Asn Leu Gly Arg Arg Glu Glu Tyr
            20                  25                  30

Asp Val Leu Asp Lys Arg Arg Gly Arg Asp Pro Glu Met Gly Gly Lys
        35                  40                  45

Pro Arg Arg Lys Asn Pro Gln Glu Gly Leu Tyr Asn Glu Leu Gln Lys
50                  55                  60

Asp Lys Met Ala Glu Ala Tyr Ser Glu Ile Gly Met Lys Gly Glu Arg
65                  70                  75                  80

Arg Arg Gly Lys Gly His Asp Gly Leu Tyr Gln Gly Leu Ser Thr Ala
                85                  90                  95

Thr Lys Asp Thr Tyr Asp Ala Leu His Met Gln Ala Leu Pro Pro Arg
            100                 105                 110
```

<210> SEQ ID NO 103
<211> LENGTH: 126
<212> TYPE: PRT
<213> ORGANISM: Streptomyces avidinii
<220> FEATURE:
<223> OTHER INFORMATION: Minimal streptavidin

<400> SEQUENCE: 103

```
Glu Ala Gly Ile Thr Gly Thr Trp Tyr Asn Gln Leu Gly Ser Thr Phe
1               5                   10                  15

Ile Val Thr Ala Gly Ala Asp Gly Ala Leu Thr Gly Thr Tyr Glu Ser
            20                  25                  30

Ala Val Gly Asn Ala Glu Ser Arg Tyr Val Leu Thr Gly Arg Tyr Asp
        35                  40                  45

Ser Ala Pro Ala Thr Asp Gly Ser Gly Thr Ala Leu Gly Trp Thr Val
50                  55                  60

Ala Trp Lys Asn Asn Tyr Arg Asn Ala His Ser Ala Thr Thr Trp Ser
65                  70                  75                  80

Gly Gln Tyr Val Gly Gly Ala Glu Ala Arg Ile Asn Thr Gln Trp Leu
                85                  90                  95

Leu Thr Ser Gly Thr Thr Glu Ala Asn Ala Trp Lys Ser Thr Leu Val
            100                 105                 110

Gly His Asp Thr Phe Thr Lys Val Lys Pro Ser Ala Ala Ser
        115                 120                 125
```

<210> SEQ ID NO 104
<211> LENGTH: 126
<212> TYPE: PRT
<213> ORGANISM: Streptomyces avidinii
<220> FEATURE:
<223> OTHER INFORMATION: Mutein Streptavidin Val44-Thr45-Ala46-Arg47

<400> SEQUENCE: 104

```
Glu Ala Gly Ile Thr Gly Thr Trp Tyr Asn Gln Leu Gly Ser Thr Phe
1               5                   10                  15

Ile Val Thr Ala Gly Ala Asp Gly Ala Leu Thr Gly Thr Tyr Val Thr
            20                  25                  30

Ala Arg Gly Asn Ala Glu Ser Arg Tyr Val Leu Thr Gly Arg Tyr Asp
```

```
                35                  40                  45
Ser Ala Pro Ala Thr Asp Gly Ser Gly Thr Ala Leu Gly Trp Thr Val
 50                  55                  60

Ala Trp Lys Asn Asn Tyr Arg Asn Ala His Ser Ala Thr Thr Trp Ser
 65                  70                  75                  80

Gly Gln Tyr Val Gly Gly Ala Glu Ala Arg Ile Asn Thr Gln Trp Leu
                 85                  90                  95

Leu Thr Ser Gly Thr Thr Glu Ala Asn Ala Trp Lys Ser Thr Leu Val
                100                 105                 110

Gly His Asp Thr Phe Thr Lys Val Lys Pro Ser Ala Ala Ser
                115                 120                 125

<210> SEQ ID NO 105
<211> LENGTH: 126
<212> TYPE: PRT
<213> ORGANISM: Streptomyces avidinii
<220> FEATURE:
<223> OTHER INFORMATION: Mutein Streptavidin Ile44-Gly45-Ala-46-Arg47

<400> SEQUENCE: 105

Glu Ala Gly Ile Thr Gly Thr Trp Tyr Asn Gln Leu Gly Ser Thr Phe
 1               5                  10                  15

Ile Val Thr Ala Gly Ala Asp Gly Ala Leu Thr Gly Thr Tyr Ile Gly
                 20                  25                  30

Ala Arg Gly Asn Ala Glu Ser Arg Tyr Val Leu Thr Gly Arg Tyr Asp
                 35                  40                  45

Ser Ala Pro Ala Thr Asp Gly Ser Gly Thr Ala Leu Gly Trp Thr Val
 50                  55                  60

Ala Trp Lys Asn Asn Tyr Arg Asn Ala His Ser Ala Thr Thr Trp Ser
 65                  70                  75                  80

Gly Gln Tyr Val Gly Gly Ala Glu Ala Arg Ile Asn Thr Gln Trp Leu
                 85                  90                  95

Leu Thr Ser Gly Thr Thr Glu Ala Asn Ala Trp Lys Ser Thr Leu Val
                100                 105                 110

Gly His Asp Thr Phe Thr Lys Val Lys Pro Ser Ala Ala Ser
                115                 120                 125

<210> SEQ ID NO 106
<211> LENGTH: 326
<212> TYPE: PRT
<213> ORGANISM: Homo sapiens
<220> FEATURE:
<223> OTHER INFORMATION: Human IgG2 Fc (Uniprot No P01861)

<400> SEQUENCE: 106

Ala Ser Thr Lys Gly Pro Ser Val Phe Pro Leu Ala Pro Cys Ser Arg
 1               5                  10                  15

Ser Thr Ser Glu Ser Thr Ala Ala Leu Gly Cys Leu Val Lys Asp Tyr
                 20                  25                  30

Phe Pro Glu Pro Val Thr Val Ser Trp Asn Ser Gly Ala Leu Thr Ser
                 35                  40                  45

Gly Val His Thr Phe Pro Ala Val Leu Gln Ser Ser Gly Leu Tyr Ser
 50                  55                  60

Leu Ser Ser Val Val Thr Val Pro Ser Ser Asn Phe Gly Thr Gln Thr
 65                  70                  75                  80

Tyr Thr Cys Asn Val Asp His Lys Pro Ser Asn Thr Lys Val Asp Lys
                 85                  90                  95
```

```
Thr Val Glu Arg Lys Cys Cys Val Glu Cys Pro Pro Cys Pro Ala Pro
            100                 105                 110

Pro Val Ala Gly Pro Ser Val Phe Leu Phe Pro Pro Lys Pro Lys Asp
        115                 120                 125

Thr Leu Met Ile Ser Arg Thr Pro Glu Val Thr Cys Val Val Val Asp
130                 135                 140

Val Ser His Glu Asp Pro Glu Val Gln Phe Asn Trp Tyr Val Asp Gly
145                 150                 155                 160

Val Glu Val His Asn Ala Lys Thr Lys Pro Arg Glu Glu Gln Phe Asn
                165                 170                 175

Ser Thr Phe Arg Val Val Ser Val Leu Thr Val Val His Gln Asp Trp
            180                 185                 190

Leu Asn Gly Lys Glu Tyr Lys Cys Lys Val Ser Asn Lys Gly Leu Pro
        195                 200                 205

Ala Pro Ile Glu Lys Thr Ile Ser Lys Thr Lys Gly Gln Pro Arg Glu
    210                 215                 220

Pro Gln Val Tyr Thr Leu Pro Pro Ser Arg Glu Glu Met Thr Lys Asn
225                 230                 235                 240

Gln Val Ser Leu Thr Cys Leu Val Lys Gly Phe Tyr Pro Ser Asp Ile
                245                 250                 255

Ser Val Glu Trp Glu Ser Asn Gly Gln Pro Glu Asn Asn Tyr Lys Thr
            260                 265                 270

Thr Pro Pro Met Leu Asp Ser Asp Gly Ser Phe Phe Leu Tyr Ser Lys
        275                 280                 285

Leu Thr Val Asp Lys Ser Arg Trp Gln Gln Gly Asn Val Phe Ser Cys
    290                 295                 300

Ser Val Met His Glu Ala Leu His Asn His Tyr Thr Gln Lys Ser Leu
305                 310                 315                 320

Ser Leu Ser Pro Gly Lys
                325

<210> SEQ ID NO 107
<211> LENGTH: 327
<212> TYPE: PRT
<213> ORGANISM: Homo sapiens
<220> FEATURE:
<223> OTHER INFORMATION: Human IgG4 Fc (Uniprot P01861)

<400> SEQUENCE: 107

Ala Ser Thr Lys Gly Pro Ser Val Phe Pro Leu Ala Pro Cys Ser Arg
1               5                   10                  15

Ser Thr Ser Glu Ser Thr Ala Ala Leu Gly Cys Leu Val Lys Asp Tyr
            20                  25                  30

Phe Pro Glu Pro Val Thr Val Ser Trp Asn Ser Gly Ala Leu Thr Ser
        35                  40                  45

Gly Val His Thr Phe Pro Ala Val Leu Gln Ser Ser Gly Leu Tyr Ser
    50                  55                  60

Leu Ser Ser Val Val Thr Val Pro Ser Ser Ser Leu Gly Thr Lys Thr
65                  70                  75                  80

Tyr Thr Cys Asn Val Asp His Lys Pro Ser Asn Thr Lys Val Asp Lys
                85                  90                  95

Arg Val Glu Ser Lys Tyr Gly Pro Pro Cys Pro Ser Cys Pro Ala Pro
            100                 105                 110

Glu Phe Leu Gly Gly Pro Ser Val Phe Leu Phe Pro Pro Lys Pro Lys
        115                 120                 125
```

```
Asp Thr Leu Met Ile Ser Arg Thr Pro Glu Val Thr Cys Val Val Val
    130                 135                 140

Asp Val Ser Gln Glu Asp Pro Glu Val Gln Phe Asn Trp Tyr Val Asp
145                 150                 155                 160

Gly Val Glu Val His Asn Ala Lys Thr Lys Pro Arg Glu Glu Gln Phe
                165                 170                 175

Asn Ser Thr Tyr Arg Val Val Ser Val Leu Thr Val Leu His Gln Asp
            180                 185                 190

Trp Leu Asn Gly Lys Glu Tyr Lys Cys Lys Val Ser Asn Lys Gly Leu
        195                 200                 205

Pro Ser Ser Ile Glu Lys Thr Ile Ser Lys Ala Lys Gly Gln Pro Arg
    210                 215                 220

Glu Pro Gln Val Tyr Thr Leu Pro Pro Ser Gln Glu Glu Met Thr Lys
225                 230                 235                 240

Asn Gln Val Ser Leu Thr Cys Leu Val Lys Gly Phe Tyr Pro Ser Asp
                245                 250                 255

Ile Ala Val Glu Trp Glu Ser Asn Gly Gln Pro Glu Asn Asn Tyr Lys
            260                 265                 270

Thr Thr Pro Pro Val Leu Asp Ser Asp Gly Ser Phe Phe Leu Tyr Ser
        275                 280                 285

Arg Leu Thr Val Asp Lys Ser Arg Trp Gln Glu Gly Asn Val Phe Ser
    290                 295                 300

Cys Ser Val Met His Glu Ala Leu His Asn His Tyr Thr Gln Lys Ser
305                 310                 315                 320

Leu Ser Leu Ser Leu Gly Lys
                325

<210> SEQ ID NO 108
<211> LENGTH: 107
<212> TYPE: PRT
<213> ORGANISM: Artificial Sequence
<220> FEATURE:
<223> OTHER INFORMATION: FKBP

<400> SEQUENCE: 108

Gly Val Gln Val Glu Thr Ile Ser Pro Gly Asp Gly Arg Thr Phe Pro
1               5                   10                  15

Lys Arg Gly Gln Thr Cys Val Val His Tyr Thr Gly Met Leu Glu Asp
            20                  25                  30

Gly Lys Lys Met Asp Ser Ser Arg Asp Arg Asn Lys Pro Phe Lys Phe
        35                  40                  45

Met Leu Gly Lys Gln Glu Val Ile Arg Gly Trp Glu Glu Gly Val Ala
    50                  55                  60

Gln Met Ser Val Gly Gln Arg Ala Lys Leu Thr Ile Ser Pro Asp Tyr
65                  70                  75                  80

Ala Tyr Gly Ala Thr Gly His Pro Gly Ile Ile Pro Pro His Ala Thr
                85                  90                  95

Leu Val Phe Asp Val Glu Leu Leu Lys Leu Glu
            100                 105

<210> SEQ ID NO 109
<211> LENGTH: 107
<212> TYPE: PRT
<213> ORGANISM: Artificial Sequence
<220> FEATURE:
<223> OTHER INFORMATION: FKBP12v36

<400> SEQUENCE: 109
```

```
Gly Val Gln Val Glu Thr Ile Ser Pro Gly Asp Gly Arg Thr Phe Pro
1               5                   10                  15

Lys Arg Gly Gln Thr Cys Val Val His Tyr Thr Gly Met Leu Glu Asp
            20                  25                  30

Gly Lys Lys Val Asp Ser Ser Arg Asp Arg Asn Lys Pro Phe Lys Phe
            35              40              45

Met Leu Gly Lys Gln Glu Val Ile Arg Gly Trp Glu Glu Gly Val Ala
        50                  55                  60

Gln Met Ser Val Gly Gln Arg Ala Lys Leu Thr Ile Ser Pro Asp Tyr
65                  70                  75                  80

Ala Tyr Gly Ala Thr Gly His Pro Gly Ile Ile Pro Pro His Ala Thr
                85                  90                  95

Leu Val Phe Asp Val Glu Leu Leu Lys Leu Glu
            100                 105
```

<210> SEQ ID NO 110
<211> LENGTH: 16
<212> TYPE: PRT
<213> ORGANISM: Artificial Sequence
<220> FEATURE:
<223> OTHER INFORMATION: Modified acylation motif

<400> SEQUENCE: 110

```
Met Gly Ser Asn Lys Ser Lys Pro Lys Asp Ala Ser Gln Arg Arg Arg
1               5                   10                  15
```

<210> SEQ ID NO 111
<211> LENGTH: 5
<212> TYPE: PRT
<213> ORGANISM: Artificial Sequence
<220> FEATURE:
<223> OTHER INFORMATION: dual acylation motif
<220> FEATURE:
<221> NAME/KEY: VARIANT
<222> LOCATION: 4
<223> OTHER INFORMATION: Xaa is any amino acid

<400> SEQUENCE: 111

```
Met Gly Cys Xaa Cys
1               5
```

<210> SEQ ID NO 112
<211> LENGTH: 4
<212> TYPE: PRT
<213> ORGANISM: Artificial Sequence
<220> FEATURE:
<223> OTHER INFORMATION: acylation region
<220> FEATURE:
<221> NAME/KEY: VARIANT
<222> LOCATION: 4
<223> OTHER INFORMATION: Xaa is any amino acid

<400> SEQUENCE: 112

```
Cys Ala Ala Xaa
1
```

<210> SEQ ID NO 113
<211> LENGTH: 118
<212> TYPE: PRT
<213> ORGANISM: Artificial Sequence
<220> FEATURE:
<223> OTHER INFORMATION: Variable heavy (VH) Anti-BCMA

<400> SEQUENCE: 113

```
Glu Val Gln Leu Val Gln Ser Gly Ala Glu Met Lys Lys Pro Gly Ala
1               5                   10                  15

Ser Leu Lys Leu Ser Cys Lys Ala Ser Gly Tyr Thr Phe Ile Asp Tyr
            20                  25                  30

Tyr Val Tyr Trp Met Arg Gln Ala Pro Gly Gln Gly Leu Glu Ser Met
        35                  40                  45

Gly Trp Ile Asn Pro Asn Ser Gly Gly Thr Asn Tyr Ala Gln Lys Phe
50                  55                  60

Gln Gly Arg Val Thr Met Thr Arg Asp Thr Ser Ile Ser Thr Ala Tyr
65                  70                  75                  80

Met Glu Leu Ser Arg Leu Arg Ser Asp Asp Thr Ala Met Tyr Tyr Cys
                85                  90                  95

Ala Arg Ser Gln Arg Asp Gly Tyr Met Asp Tyr Trp Gly Gln Gly Thr
            100                 105                 110

Leu Val Thr Val Ser Ser
            115
```

<210> SEQ ID NO 114
<211> LENGTH: 105
<212> TYPE: PRT
<213> ORGANISM: Artificial Sequence
<220> FEATURE:
<223> OTHER INFORMATION: Variable light (VL) Anti-BCMA

<400> SEQUENCE: 114

```
Gln Ser Ala Leu Thr Gln Pro Ala Ser Val Ser Ala Ser Pro Gly Gln
1               5                   10                  15

Ser Ile Ala Ile Ser Cys Thr Gly Thr Ser Ser Asp Val Gly Trp Tyr
            20                  25                  30

Gln Gln His Pro Gly Lys Ala Pro Lys Leu Met Ile Tyr Glu Asp Ser
        35                  40                  45

Lys Arg Pro Ser Gly Val Ser Asn Arg Phe Ser Gly Ser Lys Ser Gly
50                  55                  60

Asn Thr Ala Ser Leu Thr Ile Ser Gly Leu Gln Ala Glu Asp Glu Ala
65                  70                  75                  80

Asp Tyr Tyr Cys Ser Ser Asn Thr Arg Ser Ser Thr Leu Val Phe Gly
                85                  90                  95

Gly Gly Thr Lys Leu Thr Val Leu Gly
            100                 105
```

<210> SEQ ID NO 115
<211> LENGTH: 228
<212> TYPE: PRT
<213> ORGANISM: Homo sapiens
<220> FEATURE:
<223> OTHER INFORMATION: Hinge-CH2-CH3 spacer

<400> SEQUENCE: 115

```
Glu Ser Lys Tyr Gly Pro Pro Cys Pro Pro Cys Pro Ala Pro Pro Val
1               5                   10                  15

Ala Gly Pro Ser Val Phe Leu Phe Pro Pro Lys Pro Lys Asp Thr Leu
            20                  25                  30

Met Ile Ser Arg Thr Pro Glu Val Thr Cys Val Val Val Asp Val Ser
        35                  40                  45

Gln Glu Asp Pro Glu Val Gln Phe Asn Trp Tyr Val Asp Gly Val Glu
50                  55                  60

Val His Asn Ala Lys Thr Lys Pro Arg Glu Glu Gln Phe Gln Ser Thr
65                  70                  75                  80
```

```
Tyr Arg Val Val Ser Val Leu Thr Val Leu His Gln Asp Trp Leu Asn
                85                  90                  95

Gly Lys Glu Tyr Lys Cys Lys Val Ser Asn Lys Gly Leu Pro Ser Ser
            100                 105                 110

Ile Glu Lys Thr Ile Ser Lys Ala Lys Gly Gln Pro Arg Glu Pro Gln
            115                 120                 125

Val Tyr Thr Leu Pro Pro Ser Gln Glu Glu Met Thr Lys Asn Gln Val
130                 135                 140

Ser Leu Thr Cys Leu Val Lys Gly Phe Tyr Pro Ser Asp Ile Ala Val
145                 150                 155                 160

Glu Trp Glu Ser Asn Gly Gln Pro Glu Asn Asn Tyr Lys Thr Thr Pro
                165                 170                 175

Pro Val Leu Asp Ser Asp Gly Ser Phe Phe Leu Tyr Ser Arg Leu Thr
            180                 185                 190

Val Asp Lys Ser Arg Trp Gln Glu Gly Asn Val Phe Ser Cys Ser Val
            195                 200                 205

Met His Glu Ala Leu His Asn His Tyr Thr Gln Lys Ser Leu Ser Leu
    210                 215                 220

Ser Leu Gly Lys
225

<210> SEQ ID NO 116
<211> LENGTH: 117
<212> TYPE: PRT
<213> ORGANISM: Artificial Sequence
<220> FEATURE:
<223> OTHER INFORMATION: VVariable heavy (VH) Anti-BCMA

<400> SEQUENCE: 116

Gln Ile Gln Leu Val Gln Ser Gly Pro Glu Leu Lys Lys Pro Gly Glu
1               5                   10                  15

Thr Val Lys Ile Ser Cys Lys Ala Ser Gly Tyr Thr Phe Thr Asp Tyr
            20                  25                  30

Ser Ile Asn Trp Val Lys Arg Ala Pro Gly Lys Gly Leu Lys Trp Met
        35                  40                  45

Gly Trp Ile Asn Thr Glu Thr Arg Glu Pro Ala Tyr Ala Tyr Asp Phe
50                  55                  60

Arg Gly Arg Phe Ala Phe Ser Leu Glu Thr Ser Ala Ser Thr Ala Tyr
65                  70                  75                  80

Leu Gln Ile Asn Asn Leu Lys Tyr Glu Asp Thr Ala Thr Tyr Phe Cys
                85                  90                  95

Ala Leu Asp Tyr Ser Tyr Ala Met Asp Tyr Trp Gly Gln Gly Thr Ser
            100                 105                 110

Val Thr Val Ser Ser
        115

<210> SEQ ID NO 117
<211> LENGTH: 111
<212> TYPE: PRT
<213> ORGANISM: Artificial Sequence
<220> FEATURE:
<223> OTHER INFORMATION: Variable light (VL) Anti-BCMA

<400> SEQUENCE: 117

Asp Ile Val Leu Thr Gln Ser Pro Pro Ser Leu Ala Met Ser Leu Gly
1               5                   10                  15

Lys Arg Ala Thr Ile Ser Cys Arg Ala Ser Glu Ser Val Thr Ile Leu
```

```
                    20                  25                  30

Gly Ser His Leu Ile His Trp Tyr Gln Gln Lys Pro Gly Gln Pro Pro
        35                  40                  45

Thr Leu Leu Ile Gln Leu Ala Ser Asn Val Gln Thr Gly Val Pro Ala
    50                  55                  60

Arg Phe Ser Gly Ser Gly Ser Arg Thr Asp Phe Thr Leu Thr Ile Asp
65                  70                  75                  80

Pro Val Glu Glu Asp Val Ala Val Tyr Tyr Cys Leu Gln Ser Arg
                85                  90                  95

Thr Ile Pro Arg Thr Phe Gly Gly Gly Thr Lys Leu Glu Ile Lys
            100                 105                 110

<210> SEQ ID NO 118
<211> LENGTH: 122
<212> TYPE: PRT
<213> ORGANISM: Artificial Sequence
<220> FEATURE:
<223> OTHER INFORMATION: Variable heavy (VH) Anti-BCMA

<400> SEQUENCE: 118

Gln Ile Gln Leu Val Gln Ser Gly Pro Asp Leu Lys Lys Pro Gly Glu
1               5                   10                  15

Thr Val Lys Leu Ser Cys Lys Ala Ser Gly Tyr Thr Phe Thr Asn Phe
            20                  25                  30

Gly Met Asn Trp Val Lys Gln Ala Pro Gly Lys Gly Phe Lys Trp Met
        35                  40                  45

Ala Trp Ile Asn Thr Tyr Thr Gly Glu Ser Tyr Phe Ala Asp Asp Phe
    50                  55                  60

Lys Gly Arg Phe Ala Phe Ser Val Glu Thr Ser Ala Thr Thr Ala Tyr
65                  70                  75                  80

Leu Gln Ile Asn Asn Leu Lys Thr Glu Asp Thr Ala Thr Tyr Phe Cys
                85                  90                  95

Ala Arg Gly Glu Ile Tyr Tyr Gly Tyr Asp Gly Gly Phe Ala Tyr Trp
            100                 105                 110

Gly Gln Gly Thr Leu Val Thr Val Ser Ala
        115                 120

<210> SEQ ID NO 119
<211> LENGTH: 107
<212> TYPE: PRT
<213> ORGANISM: Artificial Sequence
<220> FEATURE:
<223> OTHER INFORMATION: Variable light (VL) Anti-BCMA

<400> SEQUENCE: 119

Asp Val Val Met Thr Gln Ser His Arg Phe Met Ser Thr Ser Val Gly
1               5                   10                  15

Asp Arg Val Ser Ile Thr Cys Arg Ala Ser Gln Asp Val Asn Thr Ala
            20                  25                  30

Val Ser Trp Tyr Gln Gln Lys Pro Gly Gln Ser Pro Lys Leu Leu Ile
        35                  40                  45

Phe Ser Ala Ser Tyr Arg Tyr Thr Gly Val Pro Asp Arg Phe Thr Gly
    50                  55                  60

Ser Gly Ser Gly Ala Asp Phe Thr Leu Thr Ile Ser Ser Val Gln Ala
65                  70                  75                  80

Glu Asp Leu Ala Val Tyr Tyr Cys Gln Gln His Tyr Ser Thr Pro Trp
                85                  90                  95
```

Thr Phe Gly Gly Gly Thr Lys Leu Asp Ile Lys
            100                 105

<210> SEQ ID NO 120
<211> LENGTH: 116
<212> TYPE: PRT
<213> ORGANISM: Artificial Sequence
<220> FEATURE:
<223> OTHER INFORMATION: Variable heavy (VH) Anti-BCMA

<400> SEQUENCE: 120

Glu Val Gln Leu Val Gln Ser Gly Ala Glu Val Lys Lys Pro Gly Glu
1               5                   10                  15

Ser Leu Lys Ile Ser Cys Lys Gly Ser Gly Tyr Ser Phe Thr Ser Tyr
            20                  25                  30

Trp Ile Gly Trp Val Arg Gln Met Pro Gly Lys Gly Leu Glu Trp Met
        35                  40                  45

Gly Ile Ile Tyr Pro Gly Asp Ser Asp Thr Arg Tyr Ser Pro Ser Phe
    50                  55                  60

Gln Gly His Val Thr Ile Ser Ala Asp Lys Ser Ile Ser Thr Ala Tyr
65                  70                  75                  80

Leu Gln Trp Ser Ser Leu Lys Ala Ser Asp Thr Ala Met Tyr Tyr Cys
                85                  90                  95

Ala Arg Tyr Ser Gly Ser Phe Asp Asn Trp Gly Gln Gly Thr Leu Val
            100                 105                 110

Thr Val Ser Ser
        115

<210> SEQ ID NO 121
<211> LENGTH: 111
<212> TYPE: PRT
<213> ORGANISM: Artificial Sequence
<220> FEATURE:
<223> OTHER INFORMATION: Variable light (VL) Anti-BCMA

<400> SEQUENCE: 121

Ser Tyr Glu Leu Thr Gln Pro Pro Ser Ala Ser Gly Thr Pro Gly Gln
1               5                   10                  15

Arg Val Thr Met Ser Cys Ser Gly Thr Ser Ser Asn Ile Gly Ser His
            20                  25                  30

Ser Val Asn Trp Tyr Gln Gln Leu Pro Gly Thr Ala Pro Lys Leu Leu
        35                  40                  45

Ile Tyr Thr Asn Asn Gln Arg Pro Ser Gly Val Pro Asp Arg Phe Ser
    50                  55                  60

Gly Ser Lys Ser Gly Thr Ser Ala Ser Leu Ala Ile Ser Gly Leu Gln
65                  70                  75                  80

Ser Glu Asp Glu Ala Asp Tyr Tyr Cys Ala Ala Trp Asp Gly Ser Leu
                85                  90                  95

Asn Gly Leu Val Phe Gly Gly Gly Thr Lys Leu Thr Val Leu Gly
            100                 105                 110

<210> SEQ ID NO 122
<211> LENGTH: 5
<212> TYPE: PRT
<213> ORGANISM: Artificial Sequence
<220> FEATURE:
<223> OTHER INFORMATION: Linker

<400> SEQUENCE: 122

Gly Gly Gly Gly Ser

```
<210> SEQ ID NO 123
<211> LENGTH: 4
<212> TYPE: PRT
<213> ORGANISM: Artificial Sequence
<220> FEATURE:
<223> OTHER INFORMATION: Linker

<400> SEQUENCE: 123

Gly Gly Gly Ser
1

<210> SEQ ID NO 124
<211> LENGTH: 21
<212> TYPE: PRT
<213> ORGANISM: Artificial Sequence
<220> FEATURE:
<223> OTHER INFORMATION: Linker

<400> SEQUENCE: 124

Ser Arg Gly Gly Gly Gly Ser Gly Gly Gly Gly Ser Gly Gly Gly Gly
1               5                   10                  15

Ser Leu Glu Met Ala
            20

<210> SEQ ID NO 125
<211> LENGTH: 122
<212> TYPE: PRT
<213> ORGANISM: Artificial Sequence
<220> FEATURE:
<223> OTHER INFORMATION: Variable heavy (VH) Anti-BCMA

<400> SEQUENCE: 125

Glu Val Gln Leu Val Gln Ser Gly Ala Glu Val Lys Lys Pro Gly Ser
1               5                   10                  15

Ser Val Lys Val Ser Cys Lys Ala Ser Gly Gly Thr Phe Ser Ser Tyr
            20                  25                  30

Ala Ile Ser Trp Val Arg Gln Ala Pro Gly Gln Gly Leu Glu Trp Met
        35                  40                  45

Gly Arg Ile Ile Pro Ile Leu Gly Ile Ala Asn Tyr Ala Gln Lys Phe
    50                  55                  60

Gln Gly Arg Val Thr Met Thr Glu Asp Thr Ser Thr Asp Thr Ala Tyr
65                  70                  75                  80

Met Glu Leu Ser Ser Leu Arg Ser Glu Asp Thr Ala Val Tyr Tyr Cys
                85                  90                  95

Ala Arg Ser Gly Tyr Ser Lys Ser Ile Val Ser Tyr Met Asp Tyr Trp
            100                 105                 110

Gly Gln Gly Thr Leu Val Thr Val Ser Ser
        115                 120

<210> SEQ ID NO 126
<211> LENGTH: 111
<212> TYPE: PRT
<213> ORGANISM: Artificial Sequence
<220> FEATURE:
<223> OTHER INFORMATION: Variable light (VL) Anti-BCMA

<400> SEQUENCE: 126

Leu Pro Val Leu Thr Gln Pro Pro Ser Thr Gly Thr Pro Gly Gln
1               5                   10                  15

Arg Val Thr Val Ser Cys Ser Gly Ser Ser Ser Asn Ile Gly Ser Asn
```

```
                    20                  25                  30

Val Val Phe Trp Tyr Gln Gln Leu Pro Gly Thr Ala Pro Lys Leu Val
                35                  40                  45

Ile Tyr Arg Asn Asn Gln Arg Pro Ser Gly Val Pro Asp Arg Phe Ser
        50                  55                  60

Val Ser Lys Ser Gly Thr Ser Ala Ser Leu Ala Ile Ser Gly Leu Arg
65                  70                  75                  80

Ser Glu Asp Glu Ala Asp Tyr Tyr Cys Ala Ala Trp Asp Asp Ser Leu
                85                  90                  95

Ser Gly Tyr Val Phe Gly Thr Gly Thr Lys Val Thr Val Leu Gly
                100                 105                 110

<210> SEQ ID NO 127
<211> LENGTH: 120
<212> TYPE: PRT
<213> ORGANISM: Artificial Sequence
<220> FEATURE:
<223> OTHER INFORMATION: Variable heavy (VH) Anti-BCMA

<400> SEQUENCE: 127

Gln Val Gln Leu Val Gln Ser Gly Ala Glu Val Lys Lys Pro Gly Ser
1               5                   10                  15

Ser Val Lys Val Ser Cys Lys Ala Ser Gly Gly Thr Phe Ser Ser Tyr
                20                  25                  30

Ala Ile Ser Trp Val Arg Gln Ala Pro Gly Gln Gly Leu Glu Trp Met
                35                  40                  45

Gly Arg Ile Ile Pro Ile Leu Gly Thr Ala Asn Tyr Ala Gln Lys Phe
        50                  55                  60

Gln Gly Arg Val Thr Ile Thr Ala Asp Glu Ser Thr Ser Thr Ala Tyr
65                  70                  75                  80

Met Glu Leu Ser Ser Leu Arg Ser Glu Asp Thr Ala Val Tyr Tyr Cys
                85                  90                  95

Ala Arg Ser Gly Tyr Gly Ser Tyr Arg Trp Gly Asp Ser Trp Gly Gln
                100                 105                 110

Gly Thr Leu Val Thr Val Ser Ser
        115                 120

<210> SEQ ID NO 128
<211> LENGTH: 112
<212> TYPE: PRT
<213> ORGANISM: Artificial Sequence
<220> FEATURE:
<223> OTHER INFORMATION: Variable light (VL) Anti-BCMA

<400> SEQUENCE: 128

Gln Ala Val Leu Thr Gln Pro Pro Ser Ala Ser Gly Thr Pro Gly Gln
1               5                   10                  15

Arg Val Thr Ile Ser Cys Ser Gly Ser Ser Asn Ile Gly Ser Asn
                20                  25                  30

Tyr Val Phe Trp Tyr Gln Gln Leu Pro Gly Thr Ala Pro Lys Leu Leu
                35                  40                  45

Ile Tyr Ser Asn Asn Gln Arg Pro Ser Gly Val Pro Asp Arg Phe Ser
        50                  55                  60

Gly Ser Lys Ser Gly Thr Ser Ala Ser Leu Ala Ile Ser Gly Leu Arg
65                  70                  75                  80

Ser Glu Asp Glu Ala Asp Tyr Tyr Cys Ala Ala Trp Asp Asp Ser Leu
                85                  90                  95
```

Ser Ala Ser Tyr Val Phe Gly Thr Gly Thr Lys Val Thr Val Leu Gly
            100                 105                 110

<210> SEQ ID NO 129
<211> LENGTH: 118
<212> TYPE: PRT
<213> ORGANISM: Artificial Sequence
<220> FEATURE:
<223> OTHER INFORMATION: Variable heavy (VH) Anti-BCMA

<400> SEQUENCE: 129

Gln Val Gln Leu Val Gln Ser Gly Ala Glu Val Lys Lys Pro Gly Ala
1               5                   10                  15

Ser Val Lys Val Ser Cys Lys Ala Ser Gly Tyr Thr Phe Thr Asp Tyr
            20                  25                  30

Tyr Met His Trp Val Arg Gln Ala Pro Gly Gln Arg Leu Glu Trp Met
        35                  40                  45

Gly Trp Ile Asn Pro Asn Ser Gly Gly Thr Asn Tyr Ala Gln Lys Phe
    50                  55                  60

Gln Asp Arg Ile Thr Val Thr Arg Asp Thr Ser Asn Thr Gly Tyr
65                  70                  75                  80

Met Glu Leu Thr Arg Leu Arg Ser Asp Asp Thr Ala Val Tyr Tyr Cys
                85                  90                  95

Ala Arg Ser Pro Tyr Ser Gly Val Leu Asp Lys Trp Gly Gln Gly Thr
            100                 105                 110

Leu Val Thr Val Ser Ser
        115

<210> SEQ ID NO 130
<211> LENGTH: 112
<212> TYPE: PRT
<213> ORGANISM: Artificial Sequence
<220> FEATURE:
<223> OTHER INFORMATION: Variable light (VL) Anti-BCMA

<400> SEQUENCE: 130

Gln Ser Val Leu Thr Gln Pro Pro Ser Val Ser Gly Ala Pro Gly Gln
1               5                   10                  15

Arg Val Thr Ile Ser Cys Thr Gly Ser Ser Ser Asn Ile Gly Ala Gly
            20                  25                  30

Phe Asp Val His Trp Tyr Gln Gln Leu Pro Gly Thr Ala Pro Lys Leu
        35                  40                  45

Leu Ile Tyr Gly Asn Ser Asn Arg Pro Ser Gly Val Pro Asp Arg Phe
    50                  55                  60

Ser Gly Ser Lys Ser Gly Thr Ser Ala Ser Leu Ala Ile Thr Gly Leu
65                  70                  75                  80

Gln Ala Glu Asp Glu Ala Asp Tyr Tyr Cys Gln Ser Tyr Asp Ser Ser
                85                  90                  95

Leu Ser Gly Tyr Val Phe Gly Thr Gly Thr Lys Val Thr Val Leu Gly
            100                 105                 110

<210> SEQ ID NO 131
<211> LENGTH: 10
<212> TYPE: PRT
<213> ORGANISM: Artificial Sequence
<220> FEATURE:
<223> OTHER INFORMATION: Hinge

```
<400> SEQUENCE: 131

Lys Tyr Gly Pro Pro Cys Pro Pro Cys Pro
1               5                   10
```

# METHODS FOR SELECTION AND STIMULATION OF CELLS AND APPARATUS FOR SAME

CROSS-REFERENCE TO RELATED APPLICATIONS

This application is a National Stage application under 35 U.S.C. § 371 of International Application No. PCT/EP2019/079746, filed on Oct. 30, 2019, which claims priority to U.S. provisional application 62/753,911, filed Oct. 31, 2018, entitled "METHODS FOR SELECTION AND STIMULATION OF CELLS AND KITS AND APPARATUS FOR SAME," U.S. provisional application No. 62/842,511, filed May 2, 2019, entitled "METHODS FOR SELECTION AND STIMULATION OF CELLS AND KITS AND APPARATUS FOR SAME," and U.S. provisional application No. 62/861,314, filed Jun. 13, 2019, entitled "METHODS FOR SELECTION AND STIMULATION OF CELLS AND KITS AND APPARATUS FOR SAME," the contents of which are incorporated by reference in their entirety for all purposes.

INCORPORATION BY REFERENCE OF SEQUENCE LISTING

The present application is being filed along with a Sequence Listing in electronic format. The Sequence Listing is provided as a file entitled 735042019200SeqList.txt, created Apr. 28, 2021, which is 94,040 bytes in size. The information in the electronic format of the Sequence Listing is incorporated by reference in its entirety.

FIELD

The present disclosure provides methods for selecting and stimulating a plurality of cells in a sample of cells using column chromatography, and collecting and/or eluting the cells without using additional steps or reagents to facilitate detachment of the cells from the column. In some aspects, the methods provided herein reduce the time needed to generate a population of selected and stimulated cells useful for genetic engineering, and ultimately, cell therapy, compared to existing methods. Also provided are articles of manufacture and apparatus thereof.

BACKGROUND

Various cell therapy methods are available for treating diseases and conditions. Among cell therapy methods are methods involving immune cells, such as T cells (e.g., CD4+ and CD8+ T cells), which may be genetically engineered with a recombinant receptor, such as chimeric antigen receptors. Methods for generating suitable cell populations, e.g., selected (enriched) and stimulated cell populations for use in such cell therapies often require separate selection and stimulation steps, which can prolong the manufacturing process. Furthermore, selection techniques may involve steps that contaminate selected cells with selection-related particles, such as, for example, selection agents such as Fab fragments and competition reagents and/or free binding agents used to facilitate detachment of the cells from the stationary phase, thus requiring additional wash steps and/or media exchange to purify the output composition. The additional processing steps may result in cell stress, potentially affecting downstream cell processing or even cell biology, in addition to requiring considerable time to complete. Improved methods for generating cell populations suitable for use, for example in cell therapy, which minimize cell handling and processing time, are thus needed. Provided are methods, articles of manufacture, and apparatus that meet such needs.

SUMMARY

Provided are methods of on-column stimulation of T cells, the method including: adding an oligomeric stimulatory reagent capable of delivering a stimulatory signal in T cells to a stationary phase containing a plurality of immobilized T cells, thereby initiating incubation of the stimulatory reagent with one or more T cells, wherein: the stationary phase includes a selection agent that specifically binds to a selection marker on the surface of one or more T cells or subset thereof; the oligomeric stimulatory reagent includes one or more stimulatory agent including (i) a first stimulatory agent that is an anti-CD3 antibody, and (ii) a second stimulatory agent that is an anti-CD28 antibody; and within 24 hours of initiating incubation, collecting one or more of the plurality of T cells from the stationary phase by gravity flow, thereby generating a composition containing stimulated T cells. In the provided method, the selection agent that specifically binds to a selection marker on the surface of one or more T cells or subsets thereof immobilizes the plurality of T cells on the stationary phase.

Provided are methods of on-column stimulation of T cells, the method including: incubating an oligomeric stimulatory reagent capable of delivering a stimulatory signal in T cells with a plurality of T cells immobilized on a stationary phase, thereby initiating incubation of the stimulatory reagent with one or more T cells, wherein: the stationary phase includes a selection agent that specifically binds to a selection marker on the surface of one or more T cells or subset thereof; the oligomeric stimulatory reagent includes one or more stimulatory agent including (i) a first stimulatory agent that is an anti-CD3 antibody, and (ii) a second stimulatory agent that is an anti-CD28 antibody; and within 24 hours of initiating incubation, collecting one or more of the plurality of T cells from the stationary phase by gravity flow, thereby generating a composition containing stimulated T cells. In the provided method, the selection agent that specifically binds to a selection marker on the surface of one or more T cells or subsets thereof immobilizes the plurality of T cells on the stationary phase.

Provided are methods of on-column stimulation of T cells, the method including: combining an oligomeric stimulatory reagent capable of delivering a stimulatory signal in T cells with a plurality of T cells immobilized on a stationary phase, thereby initiating incubation of the stimulatory reagent with one or more T cells, wherein: the stationary phase includes a selection agent that specifically binds to a selection marker on the surface of one or more T cells or subset thereof; the oligomeric stimulatory reagent includes one or more stimulatory agent including (i) a first stimulatory agent that is an anti-CD3 antibody, and (ii) a second stimulatory agent that is an anti-CD28 antibody; and within 24 hours of initiating incubation, collecting one or more of the plurality of T cells from the stationary phase by gravity flow, thereby generating a composition containing stimulated T cells. In the provided method, the selection agent that specifically binds to a selection marker on the surface of one or more T cells or subsets thereof immobilizes the plurality of T cells on the stationary phase.

Provided are methods for on-column stimulation of T cells, the method including incubating a plurality of T cells immobilized on a stationary phase with one or more stimulatory agent to deliver a stimulatory signal in one or more T cells of the plurality of T cells, said stationary phase including a selection agent that specifically binds to a selection marker on the surface of the one or more T cells, where specific binding of the selection agent to the selection marker expressed by the one or more T cells effects the immobilization of the one or more T cells on the stationary phase; and within 24 hours of the initiation of the incubation, collecting the one or more T cells from the stationary phase by gravity flow without the addition of a competition agent or free binding agent to elute the plurality of T cells from the stationary phase, thereby generating a composition containing stimulated T cells. Provided are methods for on-column stimulation of T cells, the method including incubating a plurality of T cells immobilized on a stationary phase with one or more stimulatory agent to deliver a stimulatory signal in one or more T cells of the plurality of T cells, said stationary phase including a selection agent that specifically binds to a selection marker on the surface of the one or more T cells, where specific binding of the selection agent to the selection marker expressed by the one or more T cells immobilizes the one or more T cells on the stationary phase; and within 24 hours of the initiation of the incubation, collecting the one or more T cells from the stationary phase by gravity flow, thereby generating a composition containing stimulated T cells. In some embodiments, the stationary phase contains at least one of the one or more stimulatory agents capable of delivering a stimulatory signal in the one or more T cells. In some embodiments, the at least one stimulatory agent is a first stimulatory agent, and the stationary phase further includes one or more of a second stimulatory agent capable of enhancing, dampening, or modifying the stimulatory signal of the first stimulatory agent. In some embodiments, the stimulatory agent is a first stimulatory agent, and wherein prior to the incubating, adding to the stationary phase a stimulatory reagent containing one or more of a second stimulatory agent capable of enhancing, dampening, or modifying the stimulatory signal of the first stimulatory agent. In some embodiments, the stimulatory agent is a first stimulatory agent, and wherein prior to the incubating, adding to the stationary phase a stimulatory reagent containing one or more of a second stimulatory agent capable of enhancing, dampening, or modifying the stimulatory signal of the first stimulatory agent. In some embodiments, the one or more stimulatory agents is a first stimulatory agent and a second stimulatory agent, and wherein prior to the incubating, adding to the stationary phase a stimulatory reagent including the second stimulatory agent that is capable of enhancing, dampening, or modifying the stimulatory signal of the first stimulatory agent. In some embodiments, prior to the incubating, adding a stimulatory reagent to the stationary phase, said stimulatory reagent containing at least one of the one or more stimulatory agent.

In some embodiments, the at least one stimulatory agent is a first stimulatory agent and the one or more stimulatory agent further contains one or more of a second stimulatory agent capable of enhancing, dampening, or modifying the stimulatory signal of the first stimulatory agent. In some embodiments, the at least one of the one or more stimulatory agent, optionally the first stimulatory agent, is capable of delivering a stimulatory signal, wherein the stimulatory signal is through a TCR/CD3 complex in a T cell, a CD3-containing complex in a T cell, and/or an ITAM-containing molecule in a T cell. In some embodiments, the at least one of the one or more first stimulatory agent is capable of delivering a stimulatory signal, wherein the stimulatory signal is through a TCR/CD3 complex in a T cell, a CD3-containing complex in a T cell, and/or an ITAM-containing molecule in a T cell. In some embodiments, the second stimulatory agent is capable of specifically binding to a costimulatory molecule on the one or more T cells. In some embodiments, the first stimulatory agent delivers a stimulatory signal through a TCR/CD3 complex in a T cell, a CD3-containing complex in a T cell, and/or an ITAM-containing molecule in a T cell and the second stimulatory agent binds to a costimulatory molecule on the T cell.

Provided are methods of on-column stimulation of T cells, the method including adding a sample containing a plurality of T cells to a stationary phase, said stationary phase containing a selection agent that binds to a selection marker on the surface of one or more of the plurality of T cells, thereby immobilizing the one or more of the plurality of T cells on the stationary phase; adding, to the stationary phase, a stimulatory reagent containing one or more stimulatory agent capable of delivering a stimulatory signal in one or more of said plurality of T cells, thereby initiating incubation of the stimulatory reagent with the one or more T cells; and within 24 hours of the initiating incubation, collecting one or more of said plurality of T cells from the stationary phase by gravity flow without the addition of a competition agent or free binding agent to elute the plurality of T cells from the stationary phase, thereby generating a composition containing stimulated T cells.

Provided are methods of on-column stimulation of T cells, the method including adding a sample containing a plurality of T cells to a stationary phase, said stationary phase containing a selection agent that binds to a selection marker on the surface of one or more of the plurality of T cells, thereby immobilizing the one or more of the plurality of T cells on the stationary phase; adding, to the stationary phase, a stimulatory reagent containing one or more stimulatory agent capable of delivering a stimulatory signal in one or more of said plurality of T cells, thereby initiating incubation of the stimulatory reagent with the one or more T cells; and within 24 hours of the initiating incubation, collecting one or more of said plurality of T cells from the stationary phase by gravity flow, thereby generating a composition containing stimulated T cells.

Provided are methods of on-column stimulation of T cells, the method including incubating a sample containing a plurality of T cells on a stationary phase, said stationary phase containing a selection agent that binds to a selection marker on the surface of one or more of the plurality of T cells, thereby immobilizing the one or more of the plurality of T cells on the stationary phase, with a stimulatory reagent containing one or more stimulatory agent capable of delivering a stimulatory signal in one or more of said plurality of T cells, thereby initiating incubation of the stimulatory reagent with the one or more T cells; and within 24 hours of the initiating incubation, collecting one or more of said plurality of T cells from the stationary phase by gravity flow without the addition of a competition agent or free binding agent to elute the plurality of T cells from the stationary phase, thereby generating a composition containing stimulated T cells.

Provided are methods of on-column stimulation of T cells, the method including (1) combining (a) a sample containing a plurality of T cells and (b) a stationary phase containing a selection agent capable of specifically binding to a selection marker expressed on the surface of one or more of the plurality of T cells, wherein specific binding of the selection agent to a selection marker effects the immobilization of said plurality of T cells on the stationary phase; (2) adding, to the stationary phase, a stimulatory reagent containing one or more stimulatory agent capable of delivering a stimulatory signal in T cells, thereby initiating incubation of the stimulatory reagent with the one or more T cells; and (3) within 24 hours of the initiating incubation, collecting one or more of said plurality of T cells from the stationary phase by gravity flow without the addition of a competition agent or free binding agent to elute the plurality of T cells from the stationary phase, thereby generating a composition containing stimulated T cells.

Provided are methods of on-column stimulation of T cells, the method including (1) combining (a) a sample containing a plurality of T cells and (b) a stationary phase containing a selection agent capable of specifically binding to a selection marker expressed on the surface of one or more of the plurality of T cells, wherein specific binding of the selection agent to a selection marker immobilizes said one or more of the plurality of T cells on the stationary phase; (2) adding, to the stationary phase, a stimulatory reagent containing one or more stimulatory agent capable of delivering a stimulatory signal in T cells, thereby initiating incubation of the stimulatory reagent with the one or more T cells; and (3) within 24 hours of the initiating incubation, collecting one or more of said plurality of T cells from the stationary phase by gravity flow, thereby generating a composition containing stimulated T cells.

Provided are methods of on-column stimulation of T cells, the method including adding an oligomeric stimulatory reagent to a stationary phase containing a plurality of immobilized T cells, thereby initiating incubation of the stimulatory reagent with one or more T cells of the plurality of immobilized T cells, wherein: the stationary phase comprises a selection agent that specifically binds to a selection marker on the surface of one or more T cells, wherein specific binding of the selection agent to the selection marker expressed by the one or more T cells effects the immobilization of said one or more T cells on the stationary phase; and the oligomeric stimulatory reagent contains (i) a plurality of streptavidin or streptavidin mutein molecules and (ii) one or more stimulatory agent capable of delivering a stimulatory signal in one or more T cells, wherein the size of the oligomeric stimulatory reagent contains i) a radius of greater than 50 nm, ii) a molecular weight of at least $5 \times 10^6$ g/mol; and/or (iii) at least 100 streptavidin or streptavidin mutein tetramers per oligomeric stimulatory reagent. In some embodiments, the method further includes within 24 hours of the initiating incubation, collecting one or more of the plurality of T cells from the stationary phase by gravity flow, thereby generating a composition containing stimulated T cells. In some embodiments, the method further includes within 24 hours of the initiating incubation, collecting one or more of the plurality of T cells from the stationary phase by gravity flow without the addition of a competition agent or free binding agent to elute the plurality of T cells from the stationary phase, thereby generating a composition containing stimulated T cells.

In some embodiments, the collecting of the one or more of the plurality of T cells from the stationary phase occurs within about 23, 22, 21, 20, 19, 18, 17, 16, 15, 14, 13, 12, 11, 10, 9, 8, 7, 6, 5, 4, 3, or 2 hours of initiating the incubation. In some embodiments, the collecting one or more of the plurality of T cells from the stationary phase occurs within about 2 to 24, 3 to 24, 4 to 24, 5, to 24, 6 to 24, 7 to 24, 8 to 24, 9 to 24, 10 to 24, 11 to 24, 12 to 24, 13 to 24, 14 to 24, 15 to 24, 16 to 24, 17 to 24, 18 to 24, 19 to 24, 20 to 24, 21 to 24, 22 to 24, 23 to 24, 2 to 23, 2 to 22, 2 to 21, 2 to 20, 2 to 19, 2 to 18, 2 to 17, 2 to 16, 2 to 15, 2 to 14, 2 to 13, 2 to 12, 2 to 11, 2 to 10, 2 to 9, 2 to 8, 2 to 7, 2 to 6, 2 to 5, 2 to 4, or 2 to 3 hours of initiating the incubation. In some embodiments, the collecting one or more of the plurality of T cells from the stationary phase occurs within about 12, 10, 8, 6, 4, or 2 hours of initiating the incubation. In some embodiments, the collecting one or more of the plurality of T cells from the stationary phase occurs within 6 hours of initiating the incubation. In some embodiments, the collecting one or more of the plurality of T cells from the stationary phase occurs within 5 hours of initiating the incubation. In some embodiments, the collecting one or more of the plurality of T cells from the stationary phase occurs within at or about 4.5 hours of initiating the incubation. In some embodiments, the collecting one or more of the plurality of T cells from the stationary phase occurs within 4 hours of initiating the incubation. In some embodiments, the collecting one or more of the plurality of T cells from the stationary phase occurs within 3 hours of initiating the incubation.

In some embodiments, the initiating incubation with the stimulatory reagent is carried out within or within about 10 minutes, within or within about 20 minutes, within or within about 30 minutes, within or within about 45 minutes, within or within about 60 minutes, within or within about 90 minutes or within or within about 120 minutes after adding or combining the sample containing the plurality of T cells to or with the stationary phase. In some embodiments, the initiating incubation with the stimulatory reagent is carried out within or within about 20 to 100 minutes after adding or combining the sample containing the plurality of T cells to or with the stationary phase. In some embodiments, the initiating incubation with the stimulatory reagent is carried out within or within about 30 to 90 minutes after adding or combining the sample containing the plurality of T cells to or with the stationary phase. In some embodiments, the initiating incubation with the stimulatory reagent is carried out within or within about 30 to 80 minutes after adding or combining the sample containing the plurality of T cells to or with the stationary phase. In some embodiments, the initiating incubation with the stimulatory reagent is carried out within or within about 30 to 70 minutes after adding or combining the sample containing the plurality of T cells to or with the stationary phase. In some embodiments, the initiating incubation with the stimulatory reagent is carried out within or within about 30 to 60 minutes after adding or combining the sample containing the plurality of T cells to or with the stationary phase. In some embodiments, the initiating incubation with the stimulatory reagent is carried out within or within about 30 to 50 minutes after adding or combining the sample containing the plurality of T cells to or with the stationary phase. In some embodiments, the initiating incubation with the stimulatory reagent is carried out within or within about 30 to 40 minutes after adding or combining the sample containing the plurality of T cells to or with the stationary phase. In some embodiments, the initiating incubation with the stimulatory reagent is carried out within or within about 30 minutes after adding or combining the sample containing the plurality of T cells to or with the stationary phase. In some embodiments, the initiating incubation with the stimulatory reagent is carried out within or within about 40 minutes after adding or combining the sample containing the plurality of T cells to or with the stationary phase. In some embodiments, the initiating incubation with the stimulatory reagent is carried out within or within about 50 minutes after adding or combining the sample containing the plurality of T cells to or with the stationary phase. In some embodiments, the initiating incubation with the stimulatory reagent is carried out within or within about 60 minutes after adding or combining the sample containing the plurality of T cells to or with the stationary phase. In some embodiments, the initiating incubation with the stimulatory reagent is carried out within or within about 70 minutes after adding or combining the sample containing the plurality of T cells to or with the stationary phase. In some embodiments, the initiating incubation with the stimulatory reagent is carried out within or within about 80 minutes after adding or combining the sample containing the plurality of T cells to or with the stationary phase. In some embodiments, the initiating incubation with the stimulatory reagent is carried out within or within about 90 minutes after adding or combining the sample containing the plurality of T cells to or with the stationary phase.

In some embodiments, at least one of the one or more stimulatory agent is capable of delivering a stimulatory signal, wherein the stimulatory signal is through a TCR/CD3 complex in a T cell, a CD3-containing complex in a T cell, and/or an ITAM-containing molecule in a T cell. In some embodiments, the at least one stimulatory agent is a first stimulatory agent and the stimulatory reagent further contains one or more of a second stimulatory agent capable of enhancing, dampening, or modifying the stimulatory signal of the first stimulatory agent. In some embodiments, the second stimulatory agent is capable of specifically binding to a costimulatory molecule on the one or more T cells. In some embodiments, the costimulatory molecule is selected from among CD28, CD90 (Thy-1), CD95 (Apo–/Fas), CD137 (4-1BB), CD154 (CD40L), ICOS, LAT, CD27, OX40 or HVEM. In some embodiments, the second stimulatory agent is capable of specifically binding to CD28. In some embodiments, the first stimulatory agent specifically binds CD3 and the second stimulatory agent specifically binds CD28.

In some embodiments, the stimulatory agent is or contains an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or the stimulatory agent contains an antibody fragment; the stimulatory agent is or contains a Fab fragment; the stimulatory agent is selected from the group of divalent antibody fragments consisting of (Fab)2'-fragments and divalent single-chain Fv (scFv) fragments; the stimulatory agent is a monovalent antibody fragment selected from the group consisting of Fab fragments, Fv fragments, and scFvs; and/or the stimulatory agent is a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

In some embodiments, the first and second stimulatory agents, independently, are or contain an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or the first and second stimulatory agents, independently, contain an antibody fragment; the first and second stimulatory agents, independently, are or contain a Fab fragment; the first and second stimulatory agents, independently, are selected from the group of divalent antibody fragments consisting of (Fab)2'-fragments and divalent single-chain Fv (scFv) fragments; the first and second stimulatory agents, independently, are a monovalent antibody fragment selected from the group consisting of Fab fragments, Fv fragments, and scFvs; and/or the first and second stimulatory agents, independently, are a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

In some embodiments, the one or more stimulatory agent includes a monovalent antibody fragment. In some embodiments, the first and second stimulatory agents, independently, comprise a monovalent antibody fragment. In some embodiments, the first stimulatory agent comprises a monovalent antibody fragment that binds to CD3 and the second stimulatory agent comprises a monovalent antibody fragment that binds to CD28. In some embodiments, the monovalent antibody fragment is selected from the group consisting of a Fab fragment, an Fv fragment, and a single-chain Fv fragment (scFv). In some embodiments, the first stimulatory reagent is an anti-CD3 Fab and the second stimulatory agent is an anti-CD28 Fab.

Provided are methods of on-column stimulation of T cells, the method including adding an oligomeric stimulatory reagent capable of delivering a stimulatory signal in T cells to a stationary phase containing a plurality of immobilized T cells, thereby initiating incubation of the stimulatory reagent with one or more T cells, wherein: the stationary phase contains a selection agent capable of specifically binding to a selection marker on the surface of one or more T cells or subset thereof, wherein specific binding of the selection agent to a selection marker expressed by the one or more T cells or a subset thereof effects the immobilization of said at least a plurality of T cells on the stationary phase, and wherein the selection agent is a Fab fragment capable of specifically binding to a selection marker selected from the group consisting of CD3, CD4, and CD8; the oligomeric stimulatory reagent contains (i) a plurality of streptavidin mutein molecules, (ii) a first stimulatory agent capable of delivering a stimulatory signal in one or more T cells, wherein the first stimulatory agent is a Fab fragment capable of specifically binding to CD3, and (iii) a second stimulatory agent capable of enhancing, dampening, or modifying the stimulatory signal, wherein the second stimulatory agent is a Fab fragment capable of specifically binding to CD28, and wherein the size of the oligomeric stimulatory reagent contains i) a radius of greater than 50 nm, ii) a molecular weight of at least $5\times10^6$ g/mol; and/or (iii) at least 100 streptavidin or streptavidin mutein tetramers per oligomeric stimulatory reagent; and within 24 hours of initiating incubation, collecting one or more of the plurality of T cells from the stationary phase by gravity flow without the addition of a competition agent or free binding agent to elute the plurality of T cells from the stationary phase, thereby generating a composition containing stimulated T cells.

In some embodiments, the T cells are from a sample that is or includes a whole blood sample, a buffy coat sample, a peripheral blood mononuclear cells (PBMC) sample, an unfractionated T cell sample, a lymphocyte sample, a white blood cell sample, an apheresis product, or a leukapheresis product. In some embodiments, the sample is an apheresis or leukapheresis product. In some embodiments, the apheresis or leukapheresis product has been previously cryofrozen.

In some embodiments, the incubating with the one or more stimulatory agents releases one or more of the plurality of immobilized T cells from the stationary phase. In some embodiments, the incubating with the first and second stimulatory agents releases one or more of the plurality of immobilized T cells from the stationary phase.

In some embodiments, the stimulatory agent further contains biotin, a biotin analog that reversibly binds to a streptavidin or avidin, a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGGSAWSHPQFEK (SEQ ID NO: 16), Trp-Ser-His-Pro-Gln-Phe-Glu-Lys-(GlyGlyGly-Ser)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag. In some embodiments, the one or more stimulatory agent further comprises a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGGSAWSHPQFEK (SEQ ID NO: 16), Trp-Ser-His-Pro-Gln-Phe-Glu-Lys-(GlyGlyGly-Ser)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)2Gly-Gly-Ser-Ala-Trp-Ser-His-Pro-Gln-Phe-Glu-Lys (SEQ ID NO: 19). In some embodiments, the one or more stimulatory agent further comprises a streptavidin-binding peptide having the sequence SAWSHPQFEKGGGSGGGSGG-SAWSHPQFEK (SEQ ID NO: 16).

In some embodiments, the first stimulatory agent and the second stimulatory agent, independently, further contain biotin, a biotin analog that reversibly binds to a streptavidin or avidin, a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGGSAWSHPQFEK (SEQ ID NO: 16), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Trp-Ser-His-Pro-Gln-Phe-Glu-Lys-(GlyGlySer)$_2$Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag. In some embodiments, each of the first and second stimulatory agent further comprises a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGly-Ser)3-Trp-Ser-His-Pro-Gln-Phe-Glu-Lys (SEQ ID NO:15), Trp-Ser-His-Pro-Gln-Phe-Glu-Lys-(GlyGlyGlySer)3-Trp-Ser-His-Pro-Gln-Phe-Glu-Lys (SEQ ID NO: 17), SAWSHPQFEKGGGSGGGSGGSAWSHPQFEK (SEQ ID NO: 16), Trp-Ser-His-Pro-Gln-Phe-Glu-Lys-(GlyGlyGly-Ser)2-Trp-Ser-His-Pro-Gln-Phe-Glu-Lys (SEQ ID NO: 18) and Trp-Ser-His-Pro-Gln-Phe-Glu-Lys-(GlyGlyGlySer) 2Gly-Gly-Ser-Ala-Trp-Ser-His-Pro-Gln-Phe-Glu-Lys (SEQ ID NO: 19). In some embodiments, each of the first and second stimulatory agent further comprises a streptavidin-binding peptide having the sequence SAWSHPQFEKGGGSGGGSGGSAWSHPQFEK (SEQ ID NO: 16).

In some embodiments, the selection agent is or contains an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or the selection agent contains an antibody fragment; the selection agent is or contains a Fab fragment; the selection agent is selected from the group of divalent antibody fragments consisting of (Fab)2'-fragments and divalent single-chain Fv (scFv) fragments; the selection agent is a monovalent antibody fragment selected from the group consisting of Fab fragments, Fv fragments, and scFvs; and/or the selection agent is a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

In some embodiments, the selection agent further contains biotin, a biotin analog that reversibly binds to a streptavidin or avidin, a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)3-Trp-Ser-His-Pro-Gln-Phe-Glu-Lys (SEQ ID NO: 17), SAWSHPQFEKGGGSGGGSGGSAWSHPQFEK (SEQ ID NO:16), Trp-Ser-His-Pro-Gln-Phe-Glu-Lys-(GlyGlyGlySer)2-Trp-Ser-His-Pro-Gln-Phe-Glu-Lys (SEQ ID NO: 18) and Trp-Ser-His-Pro-Gln-Phe-Glu-Lys-(GlyGlySer)2Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag. In some embodiments, the selection agent further comprises biotin, a biotin analog that reversibly binds to a streptavidin or avidin, a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGGSAWSHPQFEK (SEQ ID NO:16), Trp-Ser-His-Pro-Gln-Phe-Glu-Lys-(GlyGlyGly-Ser)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer) 2Gly-Gly-Ser-Ala-Trp-Ser-His-Pro-Gln-Phe-Glu-Lys (SEQ ID NO: 19). In some embodiments, the selection agent further comprises a streptavidin-binding peptide having the sequence SAWSHPQFEKGGGSGGGSGGSAWSHPQFEK (SEQ ID NO:16).

In some embodiments, the selection marker is a T cell coreceptor; the selection marker is or contains a member of a T cell antigen receptor complex; the selection marker is or contains a CD3 chain; the selection marker is or contains a CD3 zeta chain; the selection marker is or contains a CD8; the selection marker is or contains a CD4; the selection marker is or contains CD45RA; the selection marker is or contains CD27; the selection marker is or contains CD28; and/or the selection marker is or contains CCR7. In some embodiments, the selection marker is selected from the group consisting of CD3, CD4, and CD8. In some embodiments, the selection marker is CD3.

In some embodiments, the specific binding between the selection agent and the selection marker does not induce a signal, or does not induce a stimulatory or activating or proliferative signal, to the T cells. In some embodiments, the selection agent includes a monovalent antibody fragment that binds to CD3, CD8 or CD4. In some embodiments, the selection agent is an anti-CD3 Fab, an anti-CD8 Fab or an anti-CD4 Fab. In some embodiments, the selection agent is an anti-CD3 Fab. In some embodiments, the anti-CD3 Fab comprises an OKT3 antibody Fab fragment. In some embodiments, the anti-CD3 Fab comprises a variable heavy chain having the sequence set forth by SEQ ID NO:31 and a variable light chain having the sequence set forth by SEQ ID NO:32.

In some embodiments, stimulatory reagent is soluble. In some embodiments, the stimulatory reagent is not, and is not bound to or associated with, a solid support, stationary phase, a bead, a microparticle, a magnetic particle, and/or a matrix; and/or the reagent is flexible, does not contain a metal or magnetic core, is comprised entirely or primarily of organic multimer, is not spherical, is not substantially spherical or uniform in shape and/or is not rigid. In some embodiments, the stimulatory reagent is or contains streptavidin, avidin, a mutein of streptavidin that reversibly binds biotin, a biotin analog or a biologically active fragment thereof; a mutein of avidin or streptavidin that reversibly binds a streptavidin-binding peptide; a reagent that contains at least two chelating groups K, wherein the at least two chelating groups are capable of binding to a transition metal ion; an agent capable of binding to an oligohistidine affinity tag; an agent capable of binding to a glutathione-S-transferase; calmodulin or an analog thereof; an agent capable of binding to calmodulin binding peptide (CBP); an agent capable of binding to a FLAG-peptide; an agent capable of binding to an HA-tag; an agent capable of binding to maltose binding protein (MBP); an agent capable of binding to an HSV epitope; an agent capable of binding to a myc epitope; or an agent capable of binding to a biotinylated carrier protein.

In some embodiments, the stimulatory reagent is or contains a streptavidin mutein or an avidin mutein that reversibly binds to biotin or a biologically active fragment; the stimulatory reagent is or contains a streptavidin mutein or an avidin mutein that reversibly binds to a biotin analog or a biologically active fragment; and/or the stimulatory reagent is or contains a streptavidin mutein or an avidin mutein that reversibly binds to a streptavidin-binding peptide.

In some embodiments, the stimulatory reagent is an oligomeric stimulatory reagent containing a plurality of streptavidin or streptavidin mutein molecules, wherein the size of the oligomeric stimulatory particle reagent contains i) a radius of greater than 50 nm, ii) a molecular weight of at least $5 \times 10^6$ g/mol; and/or (iii) at least 100 streptavidin or streptavidin mutein tetramers per oligomeric particle reagent. In some embodiments, the oligomeric stimulatory reagent is soluble. In some embodiments, the oligomeric stimulatory reagent is not, and is not bound to or associated with, a solid support, stationary phase, a bead, a microparticle, a magnetic particle, and/or a matrix; and/or the reagent is flexible, does not contain a metal or magnetic core, is comprised entirely or primarily of organic multimer, and/or is not rigid.

In some embodiments, the streptavidin or streptavidin mutein molecules reversibly bind to or are capable of reversibly binding to biotin, a biotin analog or a streptavidin-binding peptide. In some embodiments, the streptavidin mutein contains the amino acid sequence Val44-Thr45-Ala46-Arg47 or Ile44-Gly45-Ala46-Arg47 at sequence positions corresponding to positions 44 to 47 with reference to positions in streptavidin in the sequence of amino acids set forth in SEQ ID NO:1; or the streptavidin mutein contains the amino acid sequence Val44-Thr45-Ala46-Arg47 at sequence positions corresponding to positions 44 to 47 with reference to positions in streptavidin in the sequence of amino acids set forth in SEQ ID NO: 1. In some embodiments, the streptavidin-binding peptide is selected from the group consisting of Trp-Ser-His-Pro-Gln-Phe-Glu-Lys (SEQ ID NO: 8), Trp-Ser-His-Pro-Gln-Phe-Glu-Lys-(GlyGlyGlySer)3-Trp-Ser-His-Pro-Gln-Phe-Glu-Lys ((SEQ ID NO: 17), SAWSHPQFEKGGGSGGGSGG-SAWSHPQFEK (SEQ ID NO:16), SAWSHPQFEKGGGSGGGSGGGSWSHPQFEK (SEQ ID NO:15), Trp-Ser-His-Pro-Gln-Phe-Glu-Lys-(GlyGlyGly-Ser)2-Trp-Ser-His-Pro-Gln-Phe-Glu-Lys (SEQ ID NO: 18) and Trp-Ser-His-Pro-Gln-Phe-Glu-Lys-(GlyGlyGlySer)2Gly-Gly-Ser-Ala-Trp-Ser-His-Pro-Gln-Phe-Glu-Lys (SEQ ID NO: 19).

In some embodiments, the oligomeric particle reagent contains a radius of greater than 60 nm, greater than 70 nm, greater than 80 nm, or greater than 90 nm. In some embodiments, the oligomeric particle reagent contains a radius of between 50 nm and 150 nm, between 75 nm and 125 nm, between 80 nm and 115 nm, or between 90 nm and 110 nm, inclusive; or a radius of 90 nm±15 nm, or 95 nm±20-25 nm. In some embodiments, the radius is a hydrodynamic radius.

In Some Embodiments, the Oligomeric Particle Reagent Contains a Molecular Weight of
at least $5 \times 10^7$ g/mol, or at least $1 \times 10^8$ g/mol; and/or between $5 \times 10^7$ g/mol and $5 \times 10^8$ g/mol, between $1 \times 10^8$ g/mol and $5 \times 10^8$ g/mol, or between $1 \times 10^8$ g/mol and $2 \times 10^8$ g/mol. In some embodiments, the oligomeric particle reagent contains at least 500 streptavidin or streptavidin mutein tetramers, at least 1,000 streptavidin or streptavidin mutein tetramers, at least 1,500 streptavidin or streptavidin mutein tetramers, or at least 2,000 streptavidin or streptavidin mutein tetramers; and/or; between 1,000 and 20,000 streptavidin or streptavidin mutein tetramers, between 1,000 and 10,000 streptavidin or streptavidin mutein tetramers, or between 2,000 and 5,000 streptavidin or streptavidin mutein tetramers. In some embodiments, the oligomeric stimulatory reagent is added to the stationary phase at a concentration of between about 1 to about 2 µg/l million cells.

In some embodiments, the selection agent is directly or indirectly bound to the stationary phase. In some embodiments, the selection agent is bound indirectly to the stationary phase through a selection reagent to which the selection agent reversibly binds. In some embodiments, the selection reagent is or contains streptavidin, avidin, a mutein of streptavidin that reversibly binds biotin, a biotin analog or a biologically active fragment thereof; a mutein of avidin or streptavidin that reversibly binds a streptavidin-binding peptide; a reagent that contains at least two chelating groups K, wherein the at least two chelating groups are capable of binding to a transition metal ion; an agent capable of binding to an oligohistidine affinity tag; an agent capable of binding to a glutathione-S-transferase; calmodulin or an analog thereof; an agent capable of binding to calmodulin binding peptide (CBP); an agent capable of binding to a FLAG-peptide; an agent capable of binding to an HA-tag; an agent capable of binding to maltose binding protein (MBP); an agent capable of binding to an HSV epitope; an agent capable of binding to a myc epitope; or an agent capable of binding to a biotinylated carrier protein. In some embodiments, the selection reagent is or contains a streptavidin mutein or an avidin mutein that reversibly binds to biotin or a biologically active fragment; the stimulatory reagent is or contains a streptavidin mutein or an avidin mutein that reversibly binds to a biotin analog or a biologically active fragment; and/or the stimulatory reagent is or contains a streptavidin mutein or an avidin mutein that reversibly binds to a streptavidin-binding peptide. In some embodiments, the streptavidin or streptavidin mutein molecules reversibly bind to or are capable of reversibly binding to biotin, a biotin analog or a streptavidin-binding peptide.

In some embodiments, the streptavidin mutein contains the amino acid sequence Val44-Thr45-Ala46-Arg47 or Ile44-Gly45-Ala46-Arg47 at sequence positions corresponding to positions 44 to 47 with reference to positions in streptavidin in the sequence of amino acids set forth in SEQ ID NO:1; or the streptavidin mutein contains the amino acid sequence Val44-Thr45-Ala46-Arg47 at sequence positions corresponding to positions 44 to 47 with reference to positions in streptavidin in the sequence of amino acids set forth in SEQ ID NO: 1. In some embodiments, the streptavidin-binding peptide is selected from the group consisting of Trp-Ser-His-Pro-Gln-Phe-Glu-Lys (SEQ ID NO: 8), SAWSHPQFEKGGGSGGGSGGSAWSHPQFEK (SEQ ID NO:16), Trp-Ser-His-Pro-Gln-Phe-Glu-Lys-(GlyGlyGly-Ser)$_3$-Trp-Ser-His-Pro-Gln-Phe-Glu-Lys (SEQ ID NO: 17), SAWSHPQFEKGGGSGGGSGGGSWSHPQFEK (SEQ ID NO:15), Trp-Ser-His-Pro-Gln-Phe-Glu-Lys-(GlyGlyGly-Ser)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$ Gly-Gly-Ser-Ala-Trp-Ser-His-Pro-Gln-Phe-Glu-Lys (SEQ ID NO: 19). In some embodiments, the streptavidin-binding peptide has the sequence SAWSHPQFEKGGGSGGGSGG-SAWSHPQFEK (SEQ ID NO:16).

In some embodiments, the methods provided herein are carried out at or at about 37° C. In some embodiments, said collecting includes washing the stationary phase with media, the media not containing a competition agent or free binding agent to elute the T cells from the stationary phase. In some embodiments, the collecting by gravity flow adding media to the stationary phase, the media not comprising a competition agent or free binding agent to elute the T cells from the stationary phase. In some embodiments, said composition containing stimulated T cells does not contain a competition agent or free binding agent. In some embodiments, said competition agent or free binding agent is or contains biotin or a biotin analog, optionally wherein the biotin analog is D-biotin. In some embodiments, the competition agent or free binding agent is D-biotin. In some embodiments, the method includes after said collecting, further incubating the composition containing the stimulated T cells. In some embodiments, the further incubation is carried out at or about 37° C.±2° C.; and/or the further incubation is carried out in the presence of a further agent that is capable of delivering a signal to T cells. In some embodiments, the further agent is contained in the media used for washing the stationary phase. In some embodiments, the further agent is capable of enhancing or inducing proliferation of T cells, CD4+ T cells and/or CD8+ T cells. In some embodiments, the further agent is a cytokine selected from among IL-2, IL-15 and IL-7. In some embodiments, the further incubation is carried out for a time that is 72 hours, no more than 48 hours, no more than 24 hours, or no more than 12 hours.

In some embodiments, the method further includes introducing a recombinant nucleic acid molecule into the stimulated T cells of the composition, wherein the nucleic acid molecule encodes a recombinant protein, thereby producing a composition comprising transduced T cells. In some embodiments, the recombinant protein is an antigen receptor. In some embodiments, the recombinant protein is a chimeric antigen receptor.

In some embodiments, the chimeric antigen receptor (CAR) contains an extracellular antigen-recognition domain that specifically binds to a target antigen and an intracellular signaling domain comprising an ITAM. In some embodiments, the intracellular signaling domain comprises an intracellular domain of a CD3-zeta (CD3c) chain. In some embodiments, further included is a transmembrane domain linking the extracellular domain and the intracellular signaling domain. In some embodiments, the transmembrane domain comprises a transmembrane portion of CD28. In some embodiments, the intracellular signaling domain further contains an intracellular signaling domain of a T cell costimulatory molecule. In some embodiments, the T cell costimulatory molecule is selected from the group consisting of CD28 and 41BB. In some embodiments, the nucleic acid further contains a promoter operably linked to the nucleic acid encoding the recombinant antigen receptor.

In some embodiments, the introduction of the recombinant nucleic acid is achieved by transduction with a viral particle. In some embodiments, the viral particle is a retroviral vector particle. In some embodiments, the viral particle is a lentiviral vector particle.

In some embodiments, the method further includes incubating the composition comprising transduced cells under conditions for viral integration, optionally at a temperature of at or about 37°±2° C. In some embodiments, the incubating the composition comprising transduced cells is carried out for up to 96 hours subsequent to the introducing. In some embodiments, the incubating the composition comprising transduced cells is carried out for up to 72 hours subsequent to the introducing. In some embodiments, the incubating the composition comprising transduced cells is carried out for up to 48 hours subsequent to the introducing. In some embodiments, the incubating the composition comprising transduced cells is carried out for up to 24 hours subsequent to the introducing. In some embodiments, the incubating on the composition comprising transduced cells is carried out for at least 18 hours subsequent to the introducing.

In some embodiments, the method further includes cultivating the composition containing transduced cells under conditions for viral integration, thereby producing a composition containing cultivated T cells. In some embodiments, the method further includes cultivating the composition containing transduced cells under conditions to expand the T cells. In some embodiments, the cultivating is carried out for a time that is no more than 14 days, no more than 12 days, no more than 10 days, no more than 8 days or no more than 6 days. In some embodiments, no more than 5 days.

In some embodiments, the method further includes harvesting the engineered T cells, thereby producing an output population of engineered T cells. In some embodiments, the method further includes harvesting the engineered T cells at a time between 48 and 120 hours, inclusive, after the exposing to the stimulatory reagent is initiated. In some embodiments, the harvesting is carried out within 120 hours after the exposing to the stimulatory agent is initiated. In some embodiments, the harvesting is carried out within 96 hours after the exposing to the stimulatory agent is initiated. In some embodiments, the harvesting is carried out within 72 hours after the exposing to the stimulatory agent is initiated. In some embodiments, the harvesting is carried out within 48 hours after the exposing to the stimulatory agent is initiated.

In some embodiments, at the time of harvesting the percentage of naïve-like cells is greater than or greater than about 60% among total T cells in the population, total CD4+ T cells in the population or total CD8+ T cells, or of recombinant protein-expressing cells thereof, in the population. In some embodiments, the naïve-like T cells comprise CD27+CCR7+ cells.

In some embodiments, the introducing is carried out in serum free media. In some embodiments, the incubating is carried out in serum free media. In some embodiments, wherein the cultivating is carried out in serum free media. In some embodiments, the serum free media contains 0.5 mM to 5 mM of a dipeptide form of L-glutamine in a basal media; 0.5 mM to 5 mM L-glutamine; and optionally at least one protein, wherein the media is free of serum. In some embodiments, the serum free media contains a recombinant cytokine selected from among IL-2, IL-15 and IL-7, optionally recombinant human IL-2, recombinant human IL-15 and/or recombinant human IL-7. In some embodiments, the serum free media does not contain a recombinant cytokine selected from among IL-2, IL-15 and IL-7, optionally recombinant human IL-2, recombinant human IL-15 and/or recombinant human IL-7.

In some embodiments, the method further includes incubating the composition containing transduced cells. In some embodiments, the incubation is performed for or for about 24 hours±6 hours, 48 hours±6 hours, or 72 hours±6 hours.

In some embodiments, the method further includes adding a competition agent or free binding agent to the composition containing the stimulated T cells, thereby disrupting the reversible bond(s). In some embodiments, the method further includes adding a competition agent or free binding agent to the composition containing the transduced T cells, thereby disrupting the reversible bond(s). In some embodiments, the method further includes adding a competition agent or free binding agent to the composition containing the cultivated T cells, thereby disrupting the reversible bond(s). In some embodiments, the method further includes adding a competition agent or free binding agent to the composition containing the engineered cells, optionally transduced T cells, optionally wherein the agent is added under conditions to dissociate the one or more stimulatory agent from the oligomeric stimulatory reagent in the composition. In some embodiments, the method further includes adding a competition agent or free binding agent to the composition containing the incubated T cells, optionally under conditions to dissociate the one or more stimulatory agent from the oligomeric stimulatory reagent in the composition. In some embodiments, the method further includes adding a competition agent or free binding agent to the composition containing the cultivated T cells, optionally under conditions to dissociate the one or more stimulatory agent from the oligomeric stimulatory reagent in the composition. In some embodiments, adding the competition agent or free binding agent is carried out prior to the harvesting.

In some embodiments, the competition agent or free binding agent is not detrimental to the T cells and/or wherein the addition of said substance does not reduce the percentage of surviving T cells to less than 90%, 80%, 70%, 60%, or 50%, as compared to incubation of the T cells, under comparable or the same conditions, without the competition agent or free binding agent. In some embodiments, said disruption terminates or lessens the stimulatory signal in the T cells. In some embodiments, the competition reagent and free binding agent independently contain a molecule from the group consisting of: streptavidin-binding molecules; biotin; D-biotin; biotin analogs; biotin analogs that specifically bind to streptavidin or a streptavidin analog having an amino acid sequence Val44-Thr45-Ala46-Arg47 or Ile44-Gly45-Ala46-Arg47 at sequence positions corresponding to positions 44 to 47 of a wild type streptavidin; or the competition reagent and free binding agent independently comprise a metal chelator, which is optionally EDTA or EGTA. In some embodiments, the competition agent or free binding agent is D-biotin, optionally 1 mM of D-biotin. In some embodiments, the method further includes washing the cells, optionally wherein the washing reduces or removes the stimulatory reagent and/or the one or more stimulatory agents in the composition. In some embodiments, the washing is carried out before the harvesting.

In some embodiments, the T cells contain antigen-specific T cells or a population thereof, a T helper cell or population thereof, a cytotoxic T cell or population thereof, a memory T cell or population thereof, or a regulatory T cell or population thereof. In some embodiments, the T cells comprise CD3+ T cells or comprise CD4+ and/or CD8+ T cells.

In some embodiments, the method includes selecting a T cell subset from the stimulated T cells of the composition prior to the introducing, wherein the recombinant nucleic acid molecule is introduced into the selected T cell subset. In some embodiments, the method includes selecting a subset of T cells from the composition containing transduced cells prior to the incubation, wherein the selected subset of T cells are incubated under the conditions for viral integration. In some embodiments, method includes selecting a subset of T cells from the composition containing engineered cells prior to the cultivating, wherein the selected subset of T cells is cultivated under the conditions to expand the T cells. In some embodiments, the method includes selecting a subset of T cells from the composition containing engineered cells prior to the harvesting, wherein the selected subset of T cells is harvested to produce the output population of engineered T cells. In some embodiments, the subset of T cells are naïve-like T cells or are T cells that are surface positive for a marker expressed on naïve-like T cells are CCR7+CD45RA+, CD27+CCR7+ or CD62L-CCR7+. In some embodiments, the naïve-like T cells comprise CD27+CCR7+ T cells. In some embodiments, the naïve-like T cells comprise CCR7+CD45RA+ T cells. In some embodiments, wherein the subset of T cells expresses the recombinant protein, optionally the chimeric antigen receptor. In some embodiments, the selecting the subset of T cells is carried out by affinity column chromatography.

In some embodiments, the method further includes formulating the harvested cells for cryopreservation and/or administration to a subject, optionally in the presence of a pharmaceutically acceptable excipient. In some embodiments, the harvested cells are formulated in the presence of a cryoprotectant. In some embodiments, In some embodiments, the stationary phase is or comprises a chromatography matrix. In some embodiments, the stationary phase has a binding capacity, optionally a static binding capacity or a dynamic binding capacity, of between about 75 million and about 125 million T cells per mL of stationary phase. In some embodiments, (a) the stationary phase is about 20 mL; and/or (b) the stationary phase has a binding capacity of 2 billion±0.5 billion cells. In some embodiments, the method includes two stationary phases. In some embodiments, the two stationary phases are arranged in parallel. In some embodiments, wherein the two stationary phases are arranged sequentially.

Provided are articles of manufacture for on-column stimulation of T cells, the article of manufacture containing a first stimulatory agent and a second stimulatory agent capable of specifically binding to a first molecule and a second molecule, respectively, on the surface of a T cell, thereby stimulating the T cell; and a stationary phase comprising a selection agent capable of specifically binding to a selection marker on a T cell, thereby immobilizing the T cell onto the stationary phase. In some embodiments, the stationary phase further contains the first stimulatory agent and the second stimulatory agent. In some embodiments, the first stimulatory agent, the second stimulatory agent, and the selection agent are bound indirectly to the stationary phase through a selection reagent. In some embodiments, the article further includes a stimulatory reagent, wherein the first and second stimulatory agents are or are capable of being reversibly bound. In some embodiments, the stimulatory reagent is an oligomeric stimulatory reagent. In some embodiments, the selection agent is bound indirectly to the stationary phase through a selection reagent.

In some embodiments, the stationary phase is or includes a chromatography matrix, and wherein the article of manufacture further contains a container in which all or part of the chromatography matrix is contained. In some embodiments, article of manufacture includes two stationary phases. In some embodiments, the two stationary phases are arranged in parallel. In some embodiments, the wherein the two stationary phases are arranged in sequentially.

Provided are apparatus including the articles of manufacture and embodiments thereof. In some embodiments, the apparatus further includes a fluid inlet, being fluidly connected to one or more component of the apparatus, and/or a fluid outlet, being fluidly connected to one or more component of the apparatus. In some embodiments, the apparatus is in a closed or sterile system. In some embodiments, the system is a closed and sterile system.

Provided are apparatus and/or articles of manufacture for use in any of the methods provided herein, including embodiments thereof, wherein the method is optionally carried out in an automated fashion.

BRIEF DESCRIPTION OF THE DRAWINGS

FIG. 2A summarizes WST metabolic activity for all tested batches (pooled) compared to reference batches containing anti-CD3/anti-CD28 multimerized on an oligomeric backbone with an average hydrodynamic radius of 36 nm or 101 nm. The average WST metabolic activity among T cells from the different donors for individual tested batches and reference reagents is shown in FIG. 2B.

FIG. 5A shows T cell size and CD3, CD69, and CD25 expression at 24 hours and 5 days following on-column stimulation. FIG. 5B shows the proliferative capacity of the spontaneously detached cultured T cells. Cells were isolated from an apheresis sample applied to the stationary phase and collected using a wash step.

FIG. 6A shows pS6 expression in live CD8+ T cells by memory subset. FIG. 6B shows the mean florescence intensity (mfi) of total CD8 T cells by treatment as indicated. FIGS. 6C-6D show viability and total T cell numbers, respectively, over time (as indicated by days; d1, etc.) in culture after initiation of stimulation ("input").

FIGS. 7A-7F show exemplary functional and phenotypic properties of cryopreserved CAR-T cells generated using methods employing incubation with an anti-CD3/anti-CD28 oligomeric stimulatory reagent in the presence or absence of Compound 63. FIG. 7A shows intracellular expression of Caspase at the time of thaw. FIGS. 7B and 7D show CD8 CAR-T cell and CD4 CAR-T cell phenotypic profiles, respectively, by subset expression of CD27 and/or CCR7. FIGS. 7C and 7E show intracellular IL2, IFNg, or TNF (left panels) or combinations of IL2 and/or IFNg or TNF (right panels) among CD8 CAR-T cells and CD4 CAR-T cells, respectively, stimulated with antigen-bearing targets. FIG. 7F shows expansion and survival over 12 days (left panel) and total expansion metric calculated by area under the curve (right panel) for CAR-T cells stimulated with anti-CAR beads.

FIG. 9A), the percentage of live cells expressing the exemplary CAR (FIG. 9B), the percentage of live cells expressing CD4 at selection and on day 8 of the process (FIG. 9C), and T cell phenotype distributions (percentage) for each donor (FIG. 9D) on day 5 in culture (day 8 from the beginning of the process) for the on-column stimulation or the alternative processes described in Example 5.

FIG. 12B), and the percentage of viable cells (FIG. 12C) generated using the on-column stimulation or the alternative processes described in Example 5. Three manufacturing runs are shown for each process.

DETAILED DESCRIPTION

Figure 1:
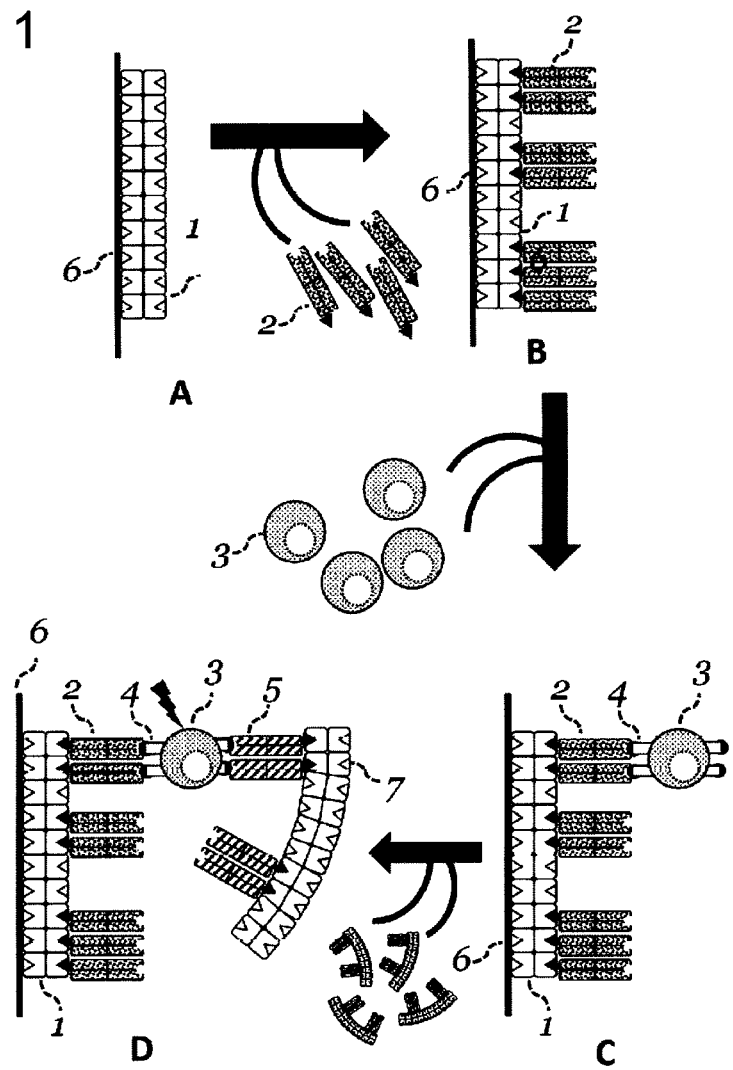
FIG. 1 provides a schematic representation of an exemplary embodiment for stimulating and selecting for target cells, in which the stimulation is carried out by an incubation of the cells, which occurs, at least in part, in the presence of a support, 6, drawn here as a stationary phase, having immobilized thereon component(s) of a selection reagent 1 for cell selection (Panel A), which has a binding site for a selection agent 2, which is capable of binding to a molecule (selection marker) 4 present on some or all of the target cells. The selection agent 2 is added to the support with immobilized selection reagent 1, under conditions whereby the reagent and agent reversibly bind, e.g., via binding sites, generating an oligomeric complex with the agent multimerized thereon (Panel B). The selection agent can include more than one agent. Alternatively, the reversibly bound complex of the agent and reagent may be added to the stationary phase as a complex for immobilization. As shown, cells 3, including target cells, are combined with the stationary phase and multimerized selection agent complex, whereby target cells become reversibly immobilized to the support 6, via the selection agent 2 and reagent (selection reagent) 1 (Panel C). Optionally, cells not bound are removed, either prior to addition of stimulatory agents or subsequent thereto. A complex containing multimerized stimulatory agents 5 reversibly bound to an oligomeric stimulatory reagent 7 is added, under conditions whereby the stimulatory agent 5 specifically binds to a molecule on the target cells, thereby inducing or modulating a signal in the immobilized target cells expressing the marker (Panel D).

Provided herein are methods for selecting cells from a sample comprising target cells (e.g., T cells, CD3+, CD4+, CD8+ T cells) and immobilizing said target cells on the stationary phase of a chromatography column, stimulating immobilized cells on the stationary phase (also referred to herein as on-column stimulation), and collecting and/or eluting the selected and stimulated cells that spontaneously detach from the stationary phase without the use of competition agents or free binding agents to facilitate detachment. Among the provided methods are methods involving selecting cells from a sample comprising target cells (e.g., T cells, CD3+, CD4+, CD8+ T cells) and immobilizing said target cells on the stationary phase of a chromatography column, stimulating immobilized cells on the stationary phase, and collecting and/or eluting the selected and stimulated cells by gravity flow. In provided embodiments, stimulating target cells (e.g., CD3+, CD4+, or CD8+ T cells) on a stationary phase of a chromatography column, facilitates downregulation of the molecule used for cell selection (i.e., selection marker), resulting in spontaneous detachment or release of the cell from the stationary phase. The release or detachment of the cells can occur without any additional steps or reagents. In some aspects, the cells can be collected by gravity flow, such as by adding a media or other solution to the chromatography column. In particular embodiments, the media or other solution that is added does not contain a competition agents or free binding agents to facilitate detachment of the cells from the stationary phase.

In some embodiments, the selected and stimulated cells are a composition containing stimulated T cells in which the T cells have been selected from a biological sample (e.g. apheresis or whole blood sample) containing a plurality of T cells. In some embodiments, the collecting and/or eluting of the selected and stimulated cells that spontaneously detach from the stationary phase is accomplished via gravity flow, for example during a wash step. The methods provided herein combine cell selection, stimulation, and collection and/or elution steps, and do not require separate steps to facilitate detachment of the selected and stimulated cells from the stationary phase and purification steps to remove agents (e.g., competition agents and/or free binding agents) used to facilitate detachment. As such, the methods reduce the number of processing steps needed to generate a selected and stimulated cell composition suitable for downstream processing (e.g., genetic engineering, expansion, subsequent incubation, stimulation and/or selection (e.g., initial selection and/or polishing)), thereby reducing manufacturing time, minimizing potential cell stress, and decreasing the potential for contamination.

In particular embodiments, the methods generate an output composition of selected and stimulated cells suitable for downstream processing within a set amount of time, such as within 24 hours. In particular embodiments, the methods generate an output composition of selected and stimulated cells suitable for downstream processing within a set amount of time, such as within or within about 12, 11, 10, 9, 8, 7, 6, 5, 4, 3, or 2 hours. In particular embodiments, the methods generate an output composition of selected and stimulated cells suitable for downstream processing within a set amount of time, such as within or within about 6, 5, 4, 3, or 2 hours. In some embodiments, the methods generate an output composition of selected and stimulated cells suitable for downstream processing within a set amount of time, such as within or within less than about 6 hours. In some embodiments, the methods generate an output composition of selected and stimulated cells suitable for downstream processing within a set amount of time, such as within or within less than about 5.5 hours. In some embodiments, the methods generate an output composition of selected and stimulated cells suitable for downstream processing within a set amount of time, such as within or within less than about 5 hours. In some embodiments, the methods generate an output composition of selected and stimulated cells suitable for downstream processing within a set amount of time, such as within or within less than about 4.5 hours. In some embodiments, the methods generate an output composition of selected and stimulated cells suitable for downstream processing within a set amount of time, such as within or within less than about 4 hours. In some embodiments, the methods generate an output composition of selected and stimulated cells suitable for downstream processing within a set amount of time, such as within or within less than about 3 hours. In some embodiments, the methods generate an output composition of selected and stimulated cells suitable for downstream processing within a set amount of time, such as within or within less than about 3 to 6 hours. In some embodiments, the methods generate an output composition of selected and stimulated cells suitable for downstream processing within a set amount of time, such as within or within less than about 4 to 6 hours. In some embodiments, the methods generate an output composition of selected and stimulated cells suitable for downstream processing within a set amount of time, such as within or within less than about 5 to 6 hours. In some embodiments, the methods generate an output composition of selected and stimulated cells suitable for downstream processing within a set amount of time, such as within or within less than about 4 to 5 hours. In some embodiments, the methods provided herein generate a composition of engineered T cells (e.g., a therapeutic cell composition) within 5 days. In some embodiments, the methods provided herein generate a composition of engineered T cells (e.g., a therapeutic cell composition) in or in about 4 to 5 days. In some embodiments, the steps provided herein result in a manufacturing process that is or is about 4 or 5 days in length. In some embodiments, the steps provided herein result in a manufacturing process that is about 4 to 5 days in length. In some embodiments, the steps provided herein result in a manufacturing process that is or is about 4 days in length or 96±6 hours in length.

The provided methods include methods for selecting cells, e.g., CD3+, CD4+, and CD8+ T cells, from other components, such as from other cells in a sample, and immobilizing the cells on a stationary phase of a chromatography column; stimulating the selected cells immobilized on the stationary phase; and collecting selected and stimulated cells in the absence of processing steps to detach the cells from the stationary phase and remove agents (e.g., competition agents or free binding agents) used to facilitate said detachment from the output composition of selected and stimulated cells. In particular embodiments, the provided methods include methods for selecting cells, e.g., CD3+, CD4+, and CD8+ T cells, from other components, such as from other cells in a sample, and immobilizing the cells on a stationary phase of a chromatography column; stimulating the selected cells immobilized on the stationary phase; and eluting and/or collecting selected and stimulated cells by gravity flow.

In particular aspects, the provided methods are improved compared to many existing methods for generating engineered cells (e.g. T cells), such as for cell therapy, that include one or more additional steps after cell selection (e.g. immunoaffinity-based selection) prior to stimulating cells. In some embodiments, the one or more additional steps present in existing methods can include an elution step or steps with a competition reagent or free bind agent to recover or collect the selected cells and/or steps to remove reagents used in the selection (e.g. magnetic bead reagents or antibodies). In some embodiments, such additional steps can prolong a process for engineering cells for a cell therapy and/or can result in manipulations of cells during the process that may impact their differentiation state, viability or cell number. In particular aspects, the provided methods generate populations of selected and stimulated cells in a shortened amount of time compared to methods that include separate selecting and stimulating steps and require additional steps to detach cells from the stationary phase and remove agents used to facilitate detachment.

In certain aspects, the methods generate a selected and stimulated cell output population (also referred to as an output composition) suitable for downstream processing (e.g., genetic engineering, expansion, and/or subsequent rounds of incubation, stimulation, and/or selection (e.g., polishing)), within 24 hours of initiating stimulation on the column, also referred to herein as on-column stimulation. In some embodiments, the methods generate a selected and stimulated cell output population (e.g., output composition) suitable for downstream processing (e.g., genetic engineering, expansion, and/or subsequent rounds of incubation, stimulation, and/or selection (e.g., polishing)), within or within about 12, 11, 10, 9, 8, 7, 6, 5, 4, 3, or 2 hours of initiating stimulation on the column. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 6, 5, 4, 3, or 2 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 3 to 6 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 4 to 6 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 5 to 6 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 4 to 5 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 6 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 5.5 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 5 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 4.5 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 4 hours. In some embodiments, the methods generate a selected and stimulated cell output population suitable for downstream processing (e.g., genetic engineering, expansion, and/or subsequent rounds of incubation, stimulation, and/or selection (e.g., polishing)), within or within about 3 hours.

In some embodiments, the methods involve the use of stimulatory agents capable of binding to molecules on the surface of the cells, thereby delivering a stimulatory signal to the cell. In some embodiments, the stimulatory agents are comprised in an oligomeric stimulatory reagent (e.g. a streptavidin mutein oligomer conjugated to anti-CD3 and anti-CD28 Fabs) that can be added to the stationary phase. In some embodiments, the stimulation results in the spontaneous detachment of the selected cells from the stationary phase, thus allowing collection and/or elution of the selected and stimulated cells in the absence of additional processing steps to detach the cells from the stationary phase and remove agents used to facilitate said detachment from the output stimulated cell composition. In some embodiments, the stimulation results in the spontaneous detachment or release of the selected cells from the stationary phase, thus allowing collection and/or elution of the selected and stimulated cells by gravity flow. In some embodiments, gravity flow is relied upon to collect or elute the spontaneously detached cells from the column (e.g., stationary phase). In some embodiments, a wash step, for example in combination with gravity flow, may be used to elute the spontaneously detached cells from the column (e.g., stationary phase). In some embodiments, the wash step can simply include adding cell media (e.g. serum free media) to the column, such as the same media present in the cell input composition prior to adding or immobilizing the cells on the stationary phase. In particular aspects, the methods successfully generate an uncontaminated (e.g., free of agents used for detachment (e.g., competition agents, free binding agents) and/or selection agents) composition of selected and stimulated cells suitable for further processing, e.g., genetic engineering, expansion, incubation, or subsequent rounds of stimulation and/or selection (e.g., polishing), within 24 hours of initiating on-column stimulation. Also provided are articles of manufacture and apparatus thereof Different methods are available for generating cell populations suitable for use in cell therapy (e.g., selected (enriched) and stimulated cell populations, engineered to express recombinant proteins (e.g., chimeric antigen receptors)). However, in some aspects, these methods may require a long or a relatively long amount of time to generate the cells, at least in part due to the need to perform multiple processing steps. Multiple processing steps may also result in cellular stress, thus affecting the usefulness of the cells in downstream processing. Additional methods for generating cell compositions are needed.

In particular aspects, the provided methods are based on observations that selecting and stimulating target cells (e.g., CD3+, CD4+, or CD8+ T cells) on a stationary phase of a chromatography column, where stimulation facilitates downregulation of the molecule used for cell selection (i.e., selection marker), results in spontaneous detachment of the cell from the stationary phase. In some embodiments, the stationary phase of the chromatography column is functionalized with an agent (e.g., selection agent) capable of specifically binding to a molecule (e.g., selection marker) on a target cell surface. In this way, when combining a sample comprising target cells containing the selection marker (e.g., CD3, CD4, CD8) with the stationary phase (e.g., adding the sample to the stationary phase), target cells (e.g., CD3+, CD4+, CD8+ T cells) are indirectly immobilized to the stationary phase. In particular aspects, the target cells (e.g., T cells) are stimulated while immobilized on the stationary phase (e.g., on-column stimulation), for example, by addition of stimulatory agents, stimulatory reagents comprising stimulatory agents, and/or via stimulatory agents coupled directly or indirectly to the stationary phase. In particular embodiments, the stimulatory agents include agents that activate or stimulate T cells, such as anti-CD3/anti-CD28 antibody (e.g. Fab) agents. Thus, in some aspects, the provided methods and other embodiments are advantageous in that they condense multiple processing steps (e.g., selection and stimulation) and/or eliminate processing steps (e.g., steps for removing selection reagents and/or agents used to facilitate detachment) and allow the condensed process to occur within the same container and/or closed system, which can provide increased efficiency and sterility.

In certain aspects, the methods involve the use of oligomeric stimulatory reagents comprising stimulatory agents capable of delivering a stimulatory signal to a target cell (e.g., T cell). Exemplary oligomeric reagents include streptavidin mutein oligomers that are reversibly bound or conjugated to one or more antibody or fragment thereof capable of delivering a stimulatory signal to a target cell, e.g. a T cell. In some embodiments, the oligomeric stimulatory reagent is a streptavidin mutein oligomer conjugated to anti-CD3 and anti-CD28 Fabs. Existing reagents for use in stimulating T cells in vitro, such as in the absence of exogenous growth factors or low amounts of exogenous growth factors, are known (see e.g. U.S. Pat. No. 6,352,694 B1 and European Patent EP 0 700 430 B1). In general, such reagents may employ beads, e.g., magnetic beads, of greater than 1 µm in diameter to which various binding agents (e.g. anti-CD3 antibody and/or anti-CD28 antibody) are immobilized. However, in some cases, such magnetic beads are, for example, difficult to integrate into methods for stimulating cells under conditions required for clinical trials or therapeutic purposes since it has to be made sure that these magnetic beads are substantially or completely removed before administering the engineered T cells to a subject. In some aspects, such removal, such as by exposing the cells to a magnetic field, may decrease the yield of viable cells available for the cell therapy. In certain cases, such reagents, e.g., stimulatory reagents containing magnetic beads, must be incubated with the cells for a minimal amount of time to allow a sufficient amount of detachment of the T cells from the stimulatory reagent. Furthermore, reagents such as beads are not readily compatible with column chromatography due to physical constraints.

The provided methods utilizing oligomeric stimulatory reagents (e.g. streptavidin mutein oligomer conjugated to anti-CD3 and anti-CD28 antibodies, such as Fabs) overcome such potential limitations. For example, in some embodiments, the provided methods include addition of a soluble oligomeric reagent not bound to a solid support (e.g., bead) to the stationary phase to initiate stimulation. In some embodiments, the provided methods can include steps to reduce or minimize the amount of residual oligomeric stimulatory reagent that may be present at the end of an overall process of engineering cells for a cell therapy. In some embodiments, the risk of residual reagent in output cells, e.g. engineered cells, generated or produced by the methods is reduced or avoided by use of the oligomeric reagent since addition of a competition reagent or free binding agent can be used to dissociate (e.g., disrupt binding) the oligomeric stimulatory reagents from the stimulatory agents in a composition containing the cells. In some embodiments, it also may be sufficient to reduce or remove the oligomeric stimulatory reagent from cells in a composition by one or more washing steps, such as without the need to add a competition reagent or free binding agent, since the oligomeric stimulatory reagent is soluble. In some embodiments, this also means that a process that is compliant with GMP standards can be more easily established compared to other methods, such as those where additional measures have to be taken to ensure that the final population for administration is free of beads. Thus, in some aspects, removal or separation of oligomeric stimulatory reagent from cells, such as by the addition of a competition agent or free binding agent or by one or more washing steps, results in little or no cell loss as compared to removal or separation of bead based stimulatory reagents. In some aspects, the timing of the stimulatory reagent or oligomeric stimulatory reagent reduction, removal or separation is not limited or is less limited than the removal or separation of bead based stimulatory reagents. Thus, in some aspects, the stimulatory reagent or oligomeric stimulatory reagent may be reduced, removed or separated from the cells at any time or step during the provided methods.

In particular aspects, the durations of the provided methods can be measured from when cells, e.g., T cells of an input cell population or sample, are first contacted or exposed to stimulating conditions (e.g., as described herein such as in Section I-C), referred to herein alternatively as the initiation of incubation with a stimulatory agent or under stimulating conditions, e.g., as in when the exposing to the stimulatory reagent is initiated. In some embodiments, the duration of time for collecting an output population (also referred to herein as an output composition) containing stimulated target cells (e.g., CD3+, CD4+, CD8+ T cells) is measured from initiation of incubation of target cells with a stimulatory reagent (e.g., adding a stimulatory reagent or exposing to a stimulatory reagent), i.e. when the stimulatory reagent is added to the column. In some embodiments, the collecting is carried out by gravity flow of cells from the column at a time after initiating the incubation, which, in some cases, can include one or more washes of the column to ensure recovery of spontaneously released cells from the column. In particular embodiments, the duration of the incubation until collection of cells from the column, is, is about, or is less than 24 hours, 23 hours, 22 hours, 21 hours, 20 hours, 19 hours, 18 hours, 17 hours, 16 hours, 15 hours, 14 hours, 13 hours, 12 hours, 11 hours, 10 hours, 9 hours, 8 hours, 7 hours, 6 hours, 5 hours, 4 hours, 3 hours, or 2 hours. In some embodiments, the duration of the incubation until elution and/or collection of cells from the column, is, is about, or is less than 12 hours, 11 hours, 10 hours, 9 hours, 8 hours, 7 hours, 6 hours, 5 hours, 4 hours, 3 hours, or 2 hours. In some embodiments, the duration of the incubation until elution and/or collection of cells from the column, is, is about, or is less than 6 hours, 5 hours, 4 hours, 3 hours, or 2 hours. In some embodiments, the duration of the incubation until elution and/or collection of cells from the column, is, is about, or is less than 6 hours. In some embodiments, the duration of the incubation until elution and/or collection of cells from the column, is, is about, or is less than 5 hours. In some embodiments, the duration of the incubation until elution and/or collection of cells from the column, is, is about, or is less than 4.5 hours. In some embodiments, the duration of the incubation until elution and/or collection of cells from the column, is, is about, or is less than 4 hours. In some embodiments, the duration of the incubation until elution and/or collection of cells from the column, is, is about, or is less than 3 hours. In some embodiments, the duration of the incubation until elution and/or collection of cells from the column is between or is between about 3 to 6 hours. In some embodiments, the duration of the incubation until elution and/or collection of cells from the column is between or is between about 4 to 6 hours. In some embodiments, the duration of the incubation until elution and/or collection of cells from the column is between or is between about 4 to 5 hours. In some embodiments, the duration of the provided incubation with a stimulatory reagent before collection from the column, such as to produce an output composition of selected and stimulated cells for use in connection with genetically engineering the cells with a recombinant receptor, e.g. by transduction, is, is about, or is less than 75%, 60%, 50%, 40%, 30%, 25%, 15%, or 10% of alternative or existing processes, such as alternative processes in which selection and stimulation are carried out separately and/or in which stimulation is not carried out on a column.

It is contemplated herein that the output compositions of selected and stimulated cells may be further processed. For example, the output cells may be genetically engineered to express a recombinant protein, such as a chimeric antigen receptor, and/or the output cells may undergo further incubation, stimulation, expansion, selection (e.g., polishing), and/or formulation. In some embodiments, the output composition of selected and stimulated cells can be further processed (e.g., engineered, polished) to generate an output composition of engineered cells, for example a therapeutic cell composition useful for the treatment of disease in a patient.

In certain embodiments, the provided methods are performed on samples, such as, for example, apheresis, buffy coat, or whole blood. In some embodiments, the samples are biological samples. In some embodiments, the biological samples are collected from human subjects. In some embodiments, the biological samples are collect from patients suffering from a disease or condition. In some embodiments, the methods are performed on populations of cells, e.g., CD3+ T cells, that were previously isolated, enriched, or selected from a sample. In some embodiments, the methods are performed on populations of cells, e.g., CD4+ and CD8+ T cells, that were previously isolated, enriched, or selected from a sample. In some embodiments, the sample or cells isolated from the sample may have been cryopreserved.

Also provided are cells and populations prepared by the methods, including pharmaceutical populations and formulations, and kits, systems, and devices for carrying out the methods. Further provided are methods for use of the cells and populations prepared by the methods, including therapeutic methods, such as methods for adoptive cell therapy, and pharmaceutical populations for administration to subjects.

All publications, including patent documents, scientific articles and databases, referred to in this application are incorporated by reference in their entirety for all purposes to the same extent as if each individual publication were individually incorporated by reference. If a definition set forth herein is contrary to or otherwise inconsistent with a definition set forth in the patents, applications, published applications and other publications that are herein incorporated by reference, the definition set forth herein prevails over the definition that is incorporated herein by reference.

The section headings used herein are for organizational purposes only and are not to be construed as limiting the subject matter described.

I. METHODS FOR SELECTING, STIMULATING, AND ENGINEERING CELLS

Provided herein are methods for generating an output population of cells (also referred to as an output composition), such as selected and stimulated T cells, e.g. CD3+ T, CD4+ T, and CD8+ T cells, including steps for the selection, stimulation, and collection of the cells. In some embodiments, the output population of stimulated and selected cells is suitable for generating a therapeutic cell composition. In certain aspects, the method combines the selection and stimulating steps which allows collection and/or elution of selected and stimulated cells that spontaneously detach from the stationary phase without the use of competition agents or free binding agents to facilitate detachment. Thus, the methods provided herein combine cell selection, stimulation, and collection/elution steps, and do not require separate steps to facilitate detachment of the selected and stimulated cells from the stationary phase and purification steps to remove agents (e.g., competition agents and/or free binding agents) used to facilitate detachment. As such, the methods reduce the number of processing steps needed to generate a selected and stimulated cell output composition suitable for downstream processing (e.g., genetic engineering, expansion, subsequent incubation, stimulation and/or selection (e.g., polishing)), thereby reducing manufacturing time, minimizing potential cell stress, and decreasing the potential for contamination. In particular embodiments, the methods generate a composition of selected and stimulated cells suitable for downstream processing within a set amount of time, such as within 24 hours. In some embodiments, the output population of selected and stimulated cells is used as an input population, or is a source for use as an input population, for subsequent steps, for example genetic engineering as described in Section I-E.

In certain embodiments, the methods provided herein are used in connection with manufacturing, generating, or producing a cell therapy. In some embodiments, the methods of generating or producing the output composition, e.g., selected and stimulated T cells, include one or more steps for isolating cells from a subject, incubating the cells under stimulatory conditions. In some aspects, the output composition is used as a source of input cells for further downstream processes for producing a cell therapy, such as for genetically engineering the cells. In some embodiments, the method includes processing steps carried out in an order in which cells, e.g. primary CD3+, CD4+ and CD8+ T cells, are isolated, such as selected or separated, from a biological sample and incubated under stimulating conditions and collected or eluted in a single step, and subsequently genetically engineered to introduce a recombinant polynucleotide encoding a recombinant receptor into the cells, such as by transduction or transfection; and then collected, harvested, or filled into a container, e.g., a bag or vial, as an output population of engineered cells. In some embodiments, the cells of the output population of engineered cells (e.g., a therapeutic cell composition) are re-introduced into the same subject, optionally after cryopreserving and storing the cells. In some embodiments, the output populations of engineered cells are suitable for use in a therapy, e.g., an autologous cell therapy.

In particular embodiments, the provided methods are used in connection with generating an output population of engineered cells expressing a recombinant receptor from an initial or input population of cells. In certain embodiments, the input population is produced, generated, and/or made by providing, combining, mixing, and/or pooling cells collected as an output composition of selected and stimulated cells by the provided methods. In some embodiments, the input population of cells contains enriched T cells, enriched CD3+ T cells, enriched CD4+ T cells, and/or enriched CD8+ T cells (hereinafter also referred to as populations of enriched T cells, populations of enriched CD3+ T cells, populations of enriched CD4+ T cells, and populations of enriched CD8+ T cells, respectively). In some embodiments, the input population of cells is a population of CD4+ or CD8+ T cells or is a combined, mixed, and/or pooled population of CD4+, and CD8+ T cells. In some embodiments the input population of cells is a population of CD3+ cells. In certain embodiments, the provided methods are used in connection with genetically engineering the selected and stimulated cells, e.g., to introduce a polynucleotide encoding a recombinant protein by transduction or transfection. In certain embodiments, the methods may be used to isolate or select cells and stimulate cells from a biological sample (e.g., whole blood, apheresis), such as from a biological sample taken, collected, and/or obtained from a subject, to generate an input population of enriched T cells that have been stimulated. In some embodiments, the provided methods may further include harvesting, collecting, and/or formulating populations of enriched T cells after the cells have been engineered, transduced, and/or cultured.

In certain embodiments, the methods provided herein are performed in connection with introducing a heterologous or recombinant polynucleotide into the cells, e.g., transducing or transfecting the cells, such as by a method described herein, e.g., in Section I-E. In particular embodiments of provided methods, the cells are incubated either during or after genetically engineering the cells, for example, for an amount of time sufficient to allow for integration of a heterologous or recombinant polynucleotide encoding a recombinant protein or to allow for the expression of the recombinant protein. In certain embodiments, the cells are incubated for a set or fixed amount of time, such as an amount of time greater than 18 hours or less than 4 days. In some embodiments, the engineering step is started or initiated within a set amount of time from when the stimulating is started or initiated, such as within 24 hours from when the cells are exposed to a stimulatory agent. In some embodiments, the engineering step is started or initiated within or within about 2, 3, 4, 5, 6, 7, 8, 9, 10, 11, 12 hours from when the cells are exposed to a stimulatory agent. In some embodiments, the engineering step is started or initiated within or within about 2, 3, 4, 5, or 6 hours from when the cells are exposed to a stimulatory agent. In some embodiments, the engineering step is started or initiated within or within about 3 or 6 hours from when the cells are exposed to a stimulatory agent. In some embodiments, the engineering step is started or initiated within or within about 4 or 6 hours from when the cells are exposed to a stimulatory agent. In some embodiments, the engineering step is started or initiated within or within about 4 or 5 hours from when the cells are exposed to a stimulatory agent. In some embodiments, the engineering step is started or initiated within or within about 6 hours from when the cells are exposed to a stimulatory agent. In some embodiments, the engineering step is started or initiated within or within about 5 hours from when the cells are exposed to a stimulatory agent. In some embodiments, the engineering step is started or initiated within or within about 4.5 hours from when the cells are exposed to a stimulatory agent. In some embodiments, the engineering step is started or initiated within or within about 4 hours from when the cells are exposed to a stimulatory agent. In some embodiments, the engineering step is started or initiated within or within about 3 hours from when the cells are exposed to a stimulatory agent. In some embodiments, incubation in the presence of a heterologous or recombinant polynucleotide, optionally where the heterologous or recombinant polynucleotide is contained in a virus (e.g., viral vector), lasts for a duration of, of about, or of at least 1 hour. In some embodiments, the one or more process steps are carried out, at least in part, in serum free media. In some embodiments, the serum free media is a defined or well-defined cell culture media. In certain embodiments, the serum free media is a controlled culture media that has been processed, e.g., filtered to remove inhibitors and/or growth factors. In some embodiments, the serum free media contains proteins. In certain embodiments, the serum-free media may contain serum albumin, hydrolysates, growth factors, hormones, carrier proteins, and/or attachment factors. In some embodiments, the serum free media includes cytokines. In some embodiments, the serum free media includes cytokines or recombinant cytokines. In some embodiments, the serum free media includes recombinant IL-2, IL-15, and/or IL-7. In some embodiments, the serum free media includes glutamine. In some embodiments, the serum free media includes glutamine and recombinant IL-2, IL-15, and IL-7.

In some embodiments, the provided methods are carried out such that one, more, or all steps in the preparation of cells for clinical use, e.g., in adoptive cell therapy, are carried out without exposing the cells to non-sterile conditions. In some embodiments, the cells are selected, stimulated, transduced, washed, and formulated, all within a closed, sterile system or device. In some embodiments, the one or more of the steps are carried out apart from the closed system or device. In some such embodiments, the cells are transferred apart from the closed system or device under sterile conditions, such as by sterile transfer to a separate closed system.

In particular embodiments, the sample and/or isolated portions of the sample, such as a sample containing cells in connection with one or more steps of the method, (e.g., buffy coat, populations of enriched T cells) may be collected, formulated for cryoprotection, frozen (e.g., cryoprotected), and/or stored below 0° C., below −20° C., or at or below −70C or −80° C. prior to, during, or after any stage or step of the methods as provided herein. In some embodiments, the cells may be stored for an amount of time under 1, 2, 3, 4, 5, 6, 7, 8, 9, or 10 days, or an amount of time under 1, 2, 3, 4, 5, 6, 7, 8 weeks, or for an amount of time at least 1, 2, 3, 4, 5, 6, 7, or 8 weeks, or for more than 8 weeks. After storage, the sample of cells or isolated portion of the sample may be thawed and processing according to the method may be resumed from the same point in the process. In particular embodiments, cultivated and/or formulated populations of enriched T cells (e.g., engineered T cells) are cryoprotected and stored prior to being administered to a subject, e.g., as an autologous cell therapy.

In particular embodiments, at any stage or step in the process, a portion of the cells may be sampled or collected, e.g., cells may be taken from the population of cells (such as a population of T cells) while the population remains in the closed system. In certain embodiments, such cells may be analyzed for makers, features, or characteristics including but not limited to viability, apoptosis, activation, stimulation, growth, and/or exhaustion. In some embodiments, the cells are sampled or collected by an automated process (see, for example, Section I-E-3a). In some embodiments, the analysis of sampled or collected cells is automated. In particular embodiments, the analysis is performed in a closed system under sterile conditions.

In some embodiments, cells or populations of cells that are produced and/or processed by the provided methods may be compared to cells or populations of cells processed or produced by an exemplary and/or alternative process. In certain embodiments, the alternative and/or exemplary process may differ in one or more specific aspects, but otherwise contains similar or the same features, aspects, steps, stages, reagents, or conditions of the embodiment or aspect of the provided methods that be compared to an exemplary or alternative process. For example, selected and stimulated cells generated by the provided methods, e.g., an output composition of selected and stimulated cells, may be compared to cells that were generated with a process that involved separate selection and stimulating steps which required use of a competition agent or free binding agent to detach the selected cells from a stationary phase. In some embodiments, unless otherwise specified, the provided methods and the exemplary or alternative process would have been otherwise similar and/or identical, such as with similar or identical steps for selecting, enriching, stimulating, engineering, transfecting, transducing, cultivating, and/or formulating. In some embodiments, unless otherwise specified, the provided methods and the alternative process select and/or enrich cells from the same or similar types of biological samples, and/or process cells and/or input cells of the same cell type.

The methods provided herein reduce the amount of time needed to generate an output composition of engineered cells (e.g., a therapeutic cell composition). In some embodiments, the amount of time needed to generate an output composition of engineered cells (e.g., a therapeutic cell composition) is at least 40%, 50%, 60%, 70%, 80%, or 90% less than the time required for an alternative process. In some embodiments, the methods provided herein produce an output composition of engineered cells (e.g., a therapeutic cell composition) in less than 5 days. In some embodiments, the methods provided herein produce an output cell composition of engineered cells (e.g., a therapeutic cell composition) in or in about 4 days or in or in about 96 hours. In some embodiments, the methods provided herein produce an output cell composition of engineered cells (e.g., a therapeutic cell composition) in or in about 4 to 5 days or in or in about 96 to 120 hours, inclusive.

A. Samples and Cell Preparation

In particular embodiments, the provided methods include selecting and/or enriching cells from a biological sample. In some embodiments, the provided methods include selecting cells or populations thereof from biological samples, such as those obtained from or derived from a subject, such as one having a particular disease or condition or in need of a cell therapy or to which cell therapy will be administered. In some aspects, the subject is a human, such as a subject who is a patient in need of a particular therapeutic intervention, such as the adoptive cell therapy for which cells are being isolated, processed, and/or engineered. Accordingly, the cells in some embodiments are primary cells, e.g., primary human cells. The samples include tissue, fluid, and other samples taken directly from the subject. The biological sample can be a sample obtained directly from a biological source or a sample that is processed. Biological samples include, but are not limited to, body fluids, such as blood, plasma, serum, cerebrospinal fluid, synovial fluid, urine and sweat, tissue and organ samples, including processed samples derived therefrom.

In some aspects, the sample is blood or a blood-derived sample, or is or is derived from an apheresis or leukapheresis product. Exemplary samples include whole blood, peripheral blood mononuclear cells (PBMCs), leukocytes, bone marrow, thymus, tissue biopsy, tumor, leukemia, lymphoma, lymph node, gut associated lymphoid tissue, mucosa associated lymphoid tissue, spleen, other lymphoid tissues, liver, lung, stomach, intestine, colon, kidney, pancreas, breast, bone, prostate, cervix, testes, ovaries, tonsil, or other organ, and/or cells derived therefrom. Samples include, in the context of cell therapy, e.g., adoptive cell therapy, samples from autologous and allogeneic sources.

In some examples, cells from the circulating blood of a subject are obtained, e.g., by apheresis or leukapheresis. The samples, in some aspects, contain lymphocytes, including T cells, monocytes, granulocytes, B cells, other nucleated white blood cells, red blood cells, and/or platelets, and in some aspects contains cells other than red blood cells and platelets.

In some embodiments, the blood cells collected from the subject are washed, e.g., to remove the plasma fraction and to place the cells in an appropriate buffer or media for subsequent processing steps. In some embodiments, the cells are washed with phosphate buffered saline (PBS). In some embodiments, the wash solution lacks calcium and/or magnesium and/or many or all divalent cations. In some aspects, a washing step is accomplished a semi-automated "flow-through" centrifuge (for example, the Cobe 2991 cell processor, Baxter) according to the manufacturer's instructions. In some aspects, a washing step is accomplished by tangential flow filtration (TFF) according to the manufacturer's instructions. In some embodiments, the cells are resuspended in a variety of biocompatible buffers after washing, such as, for example, $Ca^{++}/Mg^{++}$ free PBS. In certain embodiments, components of a blood cell sample are removed and the cells directly resuspended in culture media.

In some embodiments, the sample containing cells (e.g., an apheresis product or a leukapheresis product) is washed in order to remove one or more anti-coagulants, such as heparin, added during apheresis or leukapheresis.

In some embodiments, the sample containing cells (e.g., a whole blood sample, a buffy coat sample, a peripheral blood mononuclear cells (PBMC) sample, an unfractionated T cell sample, a lymphocyte sample, a white blood cell sample, an apheresis product, or a leukapheresis product) is cryopreserved and/or cryoprotected (e.g., frozen) and then thawed prior to any steps for isolating, selecting, activating, stimulating, engineering, transducing, transfecting, incubating, culturing, harvesting, formulating a population of the cells, and/or administering the formulated cell population to a subject.

In some embodiments, a sample containing autologous Peripheral Blood Mononuclear Cells (PBMCs) from a subject is collected in a method suitable to ensure appropriate quality for manufacturing. In one aspect, the sample containing PBMCs is derived from fractionated whole blood. In some embodiments, whole blood from a subject is fractionated by leukapheresis using a centrifugal force and making use of the density differences between cellular phenotypes, when autologous mononuclear cells (MNCs) are preferentially enriched while other cellular phenotypes, such as red blood cells, are reduced in the collected cell composition. In some embodiments, autologous plasma is concurrently collected during the MNC collection, which in some aspects can allow for extended leukapheresis product stability. In one aspect, the autologous plasma is added to the leukapheresis product to improve the buffering capacity of the leukapheresis product matrix. In some aspects, a total volume of whole blood processed in order to generate the leukapheresis product is or is about 2 L, 4 L, 6 L, 8 L, 10 L, 12 L, 14 L, 16 L, 18 L, or 20 L, or is any value between any of the foregoing. In some embodiments, the volume of autologous plasma collected is or is about 10 mL, 50 mL, 100 mL, 150 mL, 200 mL, 250 mL, or 300 mL, or more, or is a volume between any of the foregoing. In some embodiments, the leukapheresis product is subjected to a procedure, e.g., washing and formulation for in-process cryopreservation, within about 48 hours of the leukapheresis collection completion. In some embodiments, the leukapheresis product is subjected to one or more wash steps, e.g., within about 2 hours, 6 hours, 12 hours, 18 hours, 24 hours, 36 hours, or 48 hours of the leukapheresis collection completion. In some aspects, the one or more wash step removes the anticoagulant during leukapheresis collection, cellular waste that may have accumulated in the leukapheresis product, residual platelets and/or cellular debris. In some embodiments, one or more buffer exchange is performed during the one or more wash step.

In particular embodiments, an apheresis product or a leukapheresis product is cryopreserved and/or cryoprotected (e.g., frozen) and then thawed before being subject to a cell selection or isolation step (e.g., a T cell selection or isolation step) as described infra. In some embodiments, after a cryopreserved and/or cryoprotected apheresis product or leukapheresis product is subject to a T cell selection or isolation step, no additional cryopreservation and/or cryoprotection step is performed during or between any of the subsequent steps, such as the steps of activating, stimulating, engineering, transducing, transfecting, incubating, culturing, harvesting, formulating a population of the cells, and/or administering the formulated cell population to a subject. For example, T cells selected from a thawed cryopreserved and/or cryoprotected apheresis product or leukapheresis product are not again cryopreserved and/or cryoprotected before being thawed for a downstream process, such as transduction.

In particular embodiments, the cryopreserved and/or cryoprotected apheresis product or leukapheresis product is banked (e.g., without cell selection before freezing the sample), which, in some aspects, can allow more flexibility for subsequent manufacturing steps. In some aspects, the cryopreserved and/or cryoprotected apheresis product or leukapheresis product is aliquoted into multiple cryopreservation container such as bags, which can each individually or in combination be used in processing of the product. In one aspect, banking cells before selection increases cell yields for a downstream process, and banking cells earlier may mean they are healthier and may be easier to meet manufacturing success criteria. In another aspect, once thawed, the cryopreserved and/or cryoprotected apheresis product or leukapheresis product can be subject to one or more different selection methods. Advantages of this approach are, among other things, to enhance the availability, efficacy, and/or other aspects of cells of a cell therapy for treatment of a disease or condition of a subject, such as in the donor of the sample and/or another recipient.

In some embodiments, the sample (e.g. apheresis or leukapheresis sample) is collected and cryopreserved and/or cryoprotected prior to or without prior cell selection (e.g., without prior T cell selection, such as selection by chromatography), at a time after the donor is diagnosed with a disease or condition. In some aspects, the time of cryopreservation also is before the donor has received one or more of the following: any initial treatment for the disease or condition, any targeted treatment or any treatment labeled for treatment for the disease or condition, or any treatment other than radiation and/or chemotherapy. In some embodiments, the sample is collected after a first relapse of a disease following initial treatment for the disease, and before the donor or subject receives subsequent treatment for the disease. The initial and/or subsequent treatments may be a therapy other than a cell therapy. In some embodiments, the collected cells may be used in a cell therapy following initial and/or subsequent treatments. In one aspect, the cryopreserved and/or cryoprotected sample without prior cell selection may help reduce up-front costs, such as those associated with non-treatment patients in a randomized clinic trial who may crossover and require treatment later.

In some embodiments, the sample (e.g. apheresis or leukapheresis sample) is collected and cryopreserved and/or cryoprotected prior to or without prior cell selection (e.g., without prior T cell selection, such as selection by chromatography), at a time after a second relapse of a disease following a second line of treatment for the disease, and before the donor or subject receives subsequent treatment for the disease. In some embodiments, patients are identified as being likely to relapse after a second line of treatment, for example, by assessing certain risk factors. In some embodiments, the risk factors are based on disease type and/or genetics, such as double-hit lymphoma, primary refractory cancer, or activated B-cell lymphoma. In some embodiments, the risk factors are based on clinical presentation, such as early relapse after first-line treatment, or other poor prognostic indicators after treatment (e.g., IPI (International Prognostic Index)>2).

In some embodiments, the sample (e.g. apheresis or leukapheresis sample) is collected and cryopreserved and/or cryoprotected prior to or without prior cell selection (e.g., without prior T cell selection, such as selection by chromatography), at a time before the donor or subject is diagnosed with a disease. In some aspects, the donor or subject may be determined to be at risk for developing a disease. In some aspects, the donor or subject may be a healthy subject. In certain cases, the donor or subject may elect to bank or store cells without being deemed at risk for developing a disease or being diagnosed with a disease in the event that cell therapy is required at a later stage in life. In some embodiments, a donor or subject may be deemed at risk for developing a disease based on factors such as genetic mutations, genetic abnormalities, genetic disruptions, family history, protein abnormalities (such as deficiencies with protein production and/or processing), and lifestyle choices that may increase the risk of developing a disease. In some embodiments, the cells are collected as a prophylactic.

In some embodiments, the cryopreserved and/or cryoprotected sample of cells (e.g. apheresis or leukapheresis sample), such as a sample of cells that has not been subjected to a prior cell selection (e.g., without prior T cell selection, such as selection by chromatography) is stored, or banked, for a period of time greater than or equal to 12 hours, 24 hours, 36 hours, or 48 hours. In some embodiments, the sample is stored or banked for a period of time greater than or equal to 1 week, 2 weeks, 3 weeks, or 4 weeks. In some embodiments, the sample is placed into long-term storage or long-term banking. In some aspects, the sample is stored for a period of time greater than or equal to 1 month, 2 months, 3 months, 4 months, 5 months, 6 months, 7 months, 8 months, 9 months, 10 months, 11 months, 1 year, 2 years, 3 years, 4 years, 5 years, 6 years, 7 years, 8 years, 9 years, 10 years, 11 years, 12 years, 13 years, 14 years, 15 years, 16 years, 17 years, 18 years, 19 years, 20 years, 25 years, 30 years, 35 years, 40 years, or more.

In some embodiments, an apheresis or leukapheresis sample taken from a donor is shipped in a cooled environment to a storage or processing facility, and/or cryogenically stored at the storage facility or processed at the processing facility. In some embodiments, before shipping, the sample is processed, for example, by selecting T cells, such as CD4+ and/or CD8+ T cells. In some embodiments, such processing is performed after shipping and before cryogenically storing the sample. In some embodiments, the processing is performed after thawing the sample following cryogenical storage.

By allowing donors to store their cells at a stage when the donors, and thus their cells, have not undergone extensive treatment for a disease and/or prior to contracting of a disease or condition or diagnosis thereof, such cells may have certain advantages for use in cell therapy compared to cells harvested after one or after multiple rounds of treatment. For example, cells harvested before one or more rounds of treatment may be healthier, may exhibit higher levels of certain cellular activities, may grow more rapidly, and/or may be more receptive to genetic manipulation than cells that have undergone several rounds of treatment. Another example of an advantage according to embodiments described herein may include convenience. For example, by collecting, optionally processing, and storing a donor's cells before they are needed for cell therapy, the cells would be readily available if and when a recipient later needs them. This could increase apheresis lab capacity, providing technicians with greater flexibility for scheduling the apheresis collection process.

Exemplary methods and systems for cryogenic storage and processing of cells from a sample, such as an apheresis sample, can include those described in International published application no. WO2018170188. In some embodiments, the method and systems involve collecting apheresis before the patient needs cell therapy, and then subjecting the apheresis sample to cryopreservation for later use in a process for engineering the cells, e.g. T cells, with a recombinant receptor (e.g. CAR). In some cases, such processes can include those described herein. In some embodiments, an apheresis sample is collected from a subject and cryopreserved prior to subsequent T cell selection, activation, stimulation, engineering, transduction, transfection, incubation, culturing, harvest, formulation of a population of the cells, and/or administration of the formulated cell population to a subject. In such examples, the cryopreserved apheresis sample is thawed prior to subjecting the sample to one or more selection steps, such as any as described herein.

In some embodiments, the cryopreserved and/or cryoprotected sample of cells (e.g. apheresis or leukapheresis sample), such as a sample of cells that has not been subject to a prior cell selection (e.g., without prior T cell selection, such as selection by chromatography) is thawed prior to its use for downstream processes for manufacture of a cell population for cell therapy, for example, a T cell population containing CAR+ T cells. In some embodiments, such a cryopreserved and/or cryoprotected sample of cells (e.g. apheresis or leukapheresis sample) is used in connection with the process provided herein for engineered a T cell therapy, such as a CAR+ T cell therapy. In particular examples, no further step of cryopreservation is carried out prior to or during the harvest/formulation steps.

B. Cell Selection by Chromatography

In aspects of the methods provided herein, cells of a sample, e.g., T cells, are selected by chromatographic isolation, such as by column chromatography including affinity chromatography or gel permeation chromatography. In some embodiments, the method employs a selection agent that binds to a selection marker that is located on the surface of a target cell, e.g., the cell to be isolated, selected, or enriched. Such methods may be described as (traceless) cell affinity chromatography technology (CATCH) and may include any of the methods or techniques described in PCT Application Nos. WO2013124474 and WO2015164675, which are hereby incorporated by reference in their entirety.

In some embodiments, a cryopreserved and/or cryoprotected apheresis product or leukapheresis product is thawed. In some embodiments, the thawed cell composition is subjected to dilution (e.g., with a serum-free medium) and/or wash (e.g., with a serum-free medium), which in some cases can remove or reduce unwanted or undesired components. In some cases, the dilution and/or wash removes or reduces the presence of a cryoprotectant, e.g. DMSO, contained in the thawed sample, which otherwise may negatively impact cellular viability, yield, recovery upon extended room temperature exposure. In some embodiments, the dilution and/or wash allows media exchange of a thawed cryopreserved product into a serum-free medium, such as one described herein in Section III or in PCT/US2018/064627, which is incorporated herein by reference.

In some embodiments, the serum-free medium comprises a basal medium (e.g. OpTmizer™ T-Cell Expansion Basal Medium (ThermoFisher), supplemented with one or more supplement. In some embodiments, the one or more supplement is serum-free. In some embodiments, the serum-free medium comprises a basal medium supplemented with one or more additional components for the maintenance, expansion, and/or activation of a cell (e.g., a T cell), such as provided by an additional supplement (e.g. OpTmizer™ T-Cell Expansion Supplement (ThermoFisher)). In some embodiments, the serum-free medium further comprises a serum replacement supplement, for example, an immune cell serum replacement, e.g., ThermoFisher, #A2596101, the CTS™ Immune Cell Serum Replacement, or the immune cell serum replacement described in Smith et al. *Clin Transl Immunology.* 2015 January; 4(1): e31. In some embodiments, the serum-free medium further comprises a free form of an amino acid such as L-glutamine. In some embodiments, the serum-free medium further comprises a dipeptide form of L-glutamine (e.g., L-alanyl-L-glutamine), such as the dipeptide in Glutamax™ (ThermoFisher). In some embodiments, the serum-free medium further comprises one or more recombinant cytokines, such as recombinant human IL-2, recombinant human IL-7, and/or recombinant human IL-15.

In some embodiments, the cells, e.g., the target cells, have or express a selection marker as described herein on the cell surface, such that the cells to be isolated, selected, or enriched are defined by the presence of at least one common specific receptor molecule. In some embodiments, the sample containing the target cell may also contain additional cells that are devoid of the selection marker. For example, in some embodiments, T cells are selected, isolated, or enriched from a sample containing multiple cells types, e.g., red blood cells or B cells.

In some embodiments, the selection agent is comprised in a chromatography column, e.g., bound directly or indirectly to the chromatography matrix (e.g., stationary phase). In some embodiments, the selection agent is present on the chromatography matrix (e.g., stationary phase) at the time the sample is added to the column. In some embodiments, the selection agent is capable of being bound indirectly to the chromatography matrix (e.g., stationary phase) through a reagent, e.g., a selection reagent as described herein, for example in Section II-A. In some embodiments, the selection reagent is bound covalently or non-covalently to the stationary phase of the column. In some embodiments, the selection reagent is reversibly immobilized on the chromatography matrix (e.g., stationary phase). In some cases, the selection reagent is immobilized on the chromatography matrix (e.g., stationary phase) via covalent bonds. In some aspects, the selection reagent is reversibly immobilized on the chromatography matrix (e.g., stationary phase) non-covalently.

In some embodiments, the selection agent may be present, for example bound directly to (e.g., covalently or non-covalently) or indirectly via a selection reagent, on the chromatography matrix (e.g., stationary phase) at the time the sample is added to the chromatography column (e.g., stationary phase). Thus, upon addition of the sample, target cells can be bound by the selection agent and immobilized on the chromatography matrix (e.g., stationary phase) of the column. Alternatively, in some embodiments, the selection agent can be added to the sample. In this way, the selection agent binds to the target cells (e.g., T cells) in the sample, and the sample can then be added to a chromatography matrix (e.g., stationary phase) comprising the selection reagent, where the selection agent, already bound to the target cells, binds to the selection reagent, thereby immobilizing the target cells on the chromatography matrix (e.g., stationary phase). In some embodiments, the selection agent binds to the selection reagent as described herein, for example in as described in Section II-A and Section II-B, via binding partner C, as described herein, comprised in the selection agent.

In some aspects, a selection agent is added to the sample. In certain embodiments, the selection agent has a binding site B, which specifically binds to a receptor molecule (e.g., selection marker) on the surface of the cell, e.g., the target cell. For example, see Section II-B and below. In some aspects, the selection agent also includes a binding partner C, which can specifically and reversibly bind to a binding site Z of a selection reagent.

In certain aspects, the selection reagent may also contain two or more binding sites Z that can be bound by the binding partner C, thereby providing a multimerization of the receptor binding reagent. This selection reagent used herein can thus also be a multimerization reagent. The selection reagent may, for example, be streptavidin, a streptavidin mutein, avidin, an avidin mutein or a mixture thereof. In some aspects, different chromatography matrices are coupled to different selection reagents, and may be layered into a column forming a multicomponent system for separation.

In some embodiments, two or more selection agents associate with, such as are reversibly or irreversibly bound to, the selection reagent, such as via the one or plurality of binding sites Z present on the selection reagent. In some cases, this results in the selection agents being closely arranged to each other such that an avidity effect can take place if a target cell having (at least two copies of) a cell surface molecule (e.g., selection marker) is brought into contact with the selection agent that is able to bind the particular molecule (e.g., selection marker).

In some embodiments, two or more different selection agents that are the same, i.e. have the same selection marker binding specificity, can be reversibly bound to the selection reagent. In some embodiments, it is possible to use at least two different selection agents, and in some cases, three or four different selection agents that bind to different selection markers. In some aspects, each of the at least two selection agents can bind to a different molecule (e.g., selection marker), such as a first molecule, second molecule and so on. In some cases, the different molecules (e.g., selection markers), such as cell surface molecules, can be present on the same target cell. In other cases, the different molecules (e.g., selection markers), such as cell surface molecules, can be present on different target cells that are present in the same population of cells. In some case, a third, fourth and so on selection agent can be associated with the same reagent, each containing a further different binding site.

In some embodiments, the two or more different selection agents contain the same binding partner C. In some embodiments, the two or more different selection agents contain different binding partners. In some aspects, a first selection agent can have a binding partner C1 that can specifically bind to a binding site Z1 present on the selection reagent and a second selection agent can have a binding partner C2 that can specifically bind to the binding site Z1 or to a binding site Z2 present on the selection reagent. Thus, in some instances, the plurality of binding sites Z comprised by the selection reagent includes binding sites Z1 and Z2, which are capable of reversibly binding to binding partners C1 and C2, respectively, comprised by the selection agent. In some embodiments, C1 and C2 are the same, and/or Z1 and Z2 are the same. In other aspects, one or more of the plurality of binding sites Z can be different. In other instances, one or more of the plurality of binding partners C may be different. It is within a level of a skilled artisan to choose any combination of different binding partners C that are compatible with a selection reagent containing the binding sites Z, as long as each of the binding partners C are able to interact, such as specifically bind, with one of the binding sites Z.

In certain embodiments, the sample, e.g., the sample containing the cells and the selection agent, is added to or contacted with a chromatography matrix containing an attached or immobilized selection reagent. In particular aspects, the selection reagent has a plurality of binding sites Z that specifically bind to the binding partner C of the selection agent. In certain aspects, the selection agent binds to the selection reagent by the interaction between the binding partner C and the binding site Z. Thus, in some embodiments, the cell, e.g., the target cell, is immobilized via the complex that is formed by the one or more binding sites Z of the selection reagent and the binding site Z of selection agent on the chromatography matrix. In further aspects, the cells, e.g., the target cells, may be depleted from the sample, such as by rinsing, releasing, or washing the remaining sample from the chromatography matrix. In particular aspects, the selection agent may either be included in the sample that contains the cells or it may be applied or contacted to the chromatography matrix for binding to the attached selection or multimerization reagent, such as before the sample is added to the chromatography matrix.

In some embodiments, a reversible bond formed between binding partner C and binding site Z can be disrupted by a competition agent and/or free binding agent. In some embodiments, a competition agent and/or free binding agent can be a biotin, a biotin derivative or analog or a streptavidin-binding peptide capable of competing for binding with the binding partner C for the one or more binding sites Z. In some embodiments, the binding partner C and the competition agent and/or free binding agent are different, and the competition agent and/or free binding agent exhibit a higher binding affinity for the one or more binding sites Z compared to the affinity of the binding partner. In particular aspects of any of the methods provided herein, addition of a competition agent and/or free binding agent to the stationary phase of the chromatography column to disrupt the binding of the selection agent to the selection reagent is not required to detach the target cells (e.g., T cells) from the chromatography matrix (e.g., stationary phase).

In some embodiments, the cells, e.g., the target cells of the sample, may be depleted from the sample, such as by rinsing, releasing, or washing the remaining sample from the chromatography matrix (e.g., stationary phase). In some embodiments, one or more (e.g., 2, 3, 4, 5, 6) wash steps are used to remove unbound cells and debris from the chromatography matrix (e.g., stationary phase). In some embodiments, at least two wash steps are performed. In some embodiments, the sample is allowed to penetrate the matrix for at least or about 5, 10, 15, 16, 20, 25, 30, 35, 40, 45, 50, 55, 60, 70, 80, 90, 100, or 120 minutes before one or more wash steps are performed. In some embodiments, a wash step is performed at, about, or at least 5, 10, 15, 20, 25, 30, 35, 40, 45, 50, 55, 60, 70, 80, 90, 100, or 120 minutes after the sample is added to the chromatography column (e.g., stationary phase). In some embodiments, a wash step is performed at, about, or at least 5, 10, 15, 20, 25, 30, 35, 40, 45, 50, 55, or 60 minutes after the sample is added to the chromatography column (e.g., stationary phase). In some embodiments, one or more wash steps are performed within or within about 120, 100, 90, 80, 70, 60, 55, 50, 45, 40, 35, 30, 25, 20, 15, 10, or 5 minutes following addition of the sample to the chromatography column (e.g., stationary phase). In some embodiments, one or more wash steps are performed within or within about 60, 55, 50, 45, 40, 35, 30, 25, 20, 15, 10, or 5 minutes following addition of the sample to the chromatography column (e.g., stationary phase). In some embodiments, one or more wash steps are performed within or within about 5 to 60 minutes following addition of the sample to the chromatography column (e.g., stationary phase). In some embodiments, one or more wash steps are performed within or within about 5 to 50 minutes following addition of the sample to the chromatography column (e.g., stationary phase). In some embodiments, one or more wash steps are performed within or within about 5 to 40 minutes following addition of the sample to the chromatography column (e.g., stationary phase). In some embodiments, one or more wash steps are performed within or within about 5 to 30 minutes following addition of the sample to the chromatography column (e.g., stationary phase). In some embodiments, one or more wash steps are performed within or within about 5 to 20 minutes following addition of the sample to the chromatography column (e.g., stationary phase). In some embodiments, one or more wash steps are performed within or within about 5 to 10 minutes following addition of the sample to the chromatography column (e.g., stationary phase). In some embodiments, one or more wash steps are performed within or within about 10 to 60 minutes following addition of the sample to the chromatography column (e.g., stationary phase). In some embodiments, one or more wash steps are performed within or within about 20 to 60 minutes following addition of the sample to the chromatography column (e.g., stationary phase). In some embodiments, one or more wash steps are performed within or within about 30 to 60 minutes following addition of the sample to the chromatography column (e.g., stationary phase). In some embodiments, one or more wash steps are performed within or within about 40 to 60 minutes following addition of the sample to the chromatography column (e.g., stationary phase). In some embodiments, one or more wash steps are performed within or within about 50 to 60 minutes following addition of the sample to the chromatography column (e.g., stationary phase).

In some embodiments, multiple rounds of cell selection steps are carried out, where the positively or negatively selected fraction from one step is subjected to another selection step, such as a subsequent positive or negative selection. In certain embodiments, methods, techniques, and reagents for selection, isolation, and enrichment are described, for example, in PCT Application No. WO2015164675, which is hereby incorporated by reference in its entirety.

In some embodiments, a single selection step can be used to isolate target cells (e.g., CD3+ T cells) from a sample. In some embodiments, the single selection step can be performed on a single chromatography column. In some examples, a single selection step can deplete cells expressing multiple markers simultaneously. Likewise, multiple cell types can simultaneously be positively selected. In certain embodiments, selection steps are repeated and or performed more than once, where the positively or negatively selected fraction from one step is subjected to the same selection step, such as a repeated positive or negative selection. In some examples, a single selection step is repeated and/or performed more than once, for example to increase the purity of the selected cells and/or to further remove and/or deplete the negatively selected cells from the negatively selected fraction. In certain embodiments, one or more selection steps are performed two times, three times, four times, five times, six times, seven times, eight times, nine times, ten times, or more than ten times. In certain embodiments, the one or more selection steps are performed and/or repeated between one and ten times, between one and five times, or between three and five times. In some embodiments, two selection steps are performed.

Cell selection may be performed using one or more chromatography columns. In some embodiments, the one or more chromatography columns are included in a closed system. In some embodiments, the closed system is an automated closed system, for example requiring minimal or no user (e.g., human) input. In some embodiments, cell selection is performed sequentially (e.g., a sequential selection technique). In some embodiments, the one or more chromatography columns are arranged sequentially. For example, a first column may be oriented such that the output of the column (e.g., eluent) can be fed, e.g., via connected tubing, to a second chromatography column. In some embodiments, a plurality of chromatography columns may be arranged sequentially. In some embodiments, cell selection may be achieved by carrying out sequential positive and negative selection steps, the subsequent step subjecting the negative and/or positive fraction from the previous step to further selection, where the entire process is carried out in the same tube or tubing set. In some embodiments, a sample containing target cells is subjected to a sequential selection in which a first selection is effected to enrich for one of the CD4+ or CD8+ populations, and the non-selected cells from the first selection are used as the source of cells for a second selection to enrich for the other of the CD4+ or CD8+ populations. In some embodiments, a further selection or selections can be effected to enrich for sub-populations of one or both of the CD4+ or CD8+ population, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a sequential selection in which a first selection is effected to enrich for a CD3+ population, and the selected cells are used as the source of cells for a second selection to enrich for CD3+ populations. In some embodiments, a sample containing target cells is subjected to a sequential selection in which a first selection is effected to enrich for a CD3+ population on a first stationary phase (e.g., in a first chromatograph column), and the flow through containing unbound cells is used as the source of cells for a second selection to enrich for a CD3+ population on a second stationary phase (e.g., in a second chromatograph column), wherein the first and second stationary phases are arranged sequentially. In some embodiments, a further selection or selections can be effected to enrich for sub-populations of the CD3+ population, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a sequential selection in which a first selection is effected to enrich for a CD3+ population, and the selected cells are used as the source of cells for a second selection to enrich for CD4+ populations. In some embodiments, a further selection or selections can be effected to enrich for sub-populations of the CD3+CD4+ population, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a sequential selection in which a first selection is effected to enrich for a CD3+ population, and the selected cells are used as the source of cells for a second selection to enrich for CD8+ populations. In some embodiments, a further selection or selections can be effected to enrich for sub-populations of the CD3+CD8+ population, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. It is contemplated that in some aspects, specific subpopulations of T cells (e.g., CD3+ cells), such as cells positive or expressing high levels of one or more surface markers, e.g., CD28+, CD62L+, CCR7+, CD27+, CD127+, CD4+, CD8+, CD45RA+, and/or CD45RO+ T cells, are selected by positive or negative sequential selection techniques.

In some embodiments, cell selection is performed in parallel (e.g., parallel selection technique). In some embodiments, the one or more chromatography columns are arranged in parallel. For example, two or more columns may be arranged such that a sample is loaded onto two or more columns at the same time via tubing that allows for the sample to be added to each column, for example, without the need for the sample to traverse through a first column. For example, using a parallel selection technique, cell selection may be achieved by carrying out positive and/or negative selection steps simultaneously, for example in a closed system where the entire process is carried out in the same tube or tubing set. In some embodiments, a sample containing target cells is subjected to a parallel selection in which the sample is load onto two or more chromatography columns, where each column effects selection of a cell population. In some embodiments, the two or more chromatography columns effect selection of CD3+, CD4+, or CD8+ populations individually. In some embodiments, the two or more chromatography columns, including affinity chromatography or gel permeation chromatography, independently effect selection of the same cell population. For example, the two or more chromatography columns may effect selection of CD3+ cells. In some embodiments, the two or more chromatography columns, including affinity chromatography or gel permeation chromatography, independently effect selection of different cell populations. For example, the two or more chromatography columns independently may effect selection of CD3+ cells, CD4+ cells, and CD8+ cells. In some embodiments, a further selection or selections, for example using sequential selection techniques, can be effected to enrich for sub-populations of one or all cell populations selected via parallel selection. For example, selected cells may be further selected for central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a parallel selection in which parallel selection is effected to enrich for a CD3+ population on the two or more columns. In some embodiments, a further selection or selections can be effected to enrich for sub-populations of the CD3+ population, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a parallel selection in which a selection is effected to enrich for a CD3+ population and a CD4+ population on the two or more columns, independently. In some embodiments, a further selection or selections can be effected to enrich for sub-populations of the CD3+ and CD4+ populations, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a parallel selection in which parallel selection is effected to enrich for a CD3+ population and a CD8+ population. In some embodiments, a further selection or selections can be effected to enrich for sub-populations of the CD3+ and CD8+ populations, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. In some embodiments, a sample containing target cells is subjected to a parallel selection in which parallel selection is effected to enrich for a CD4+ population and a CD8+ population. In some embodiments, a further selection or selections can be effected to enrich for sub-populations of the CD4+ and CD8+ populations, for example, central memory T ($T_{CM}$) cells, naïve T cells, and/or cells positive for or expressing high levels of one or more surface markers, e.g., CD28+, CD62L+, CCR7+, CD27+, CD127+, CD4+, CD8+, CD45RA+, and/or CD45RO+. It is contemplated that in some aspects, specific subpopulations of T cells (e.g., CD3+, CD4+, CD8+ T cells), such as cells positive or expressing high levels of one or more surface markers, e.g., CD28+, CD62L+, CCR7+, CD27+, CD127+, CD4+, CD8+, CD45RA+, and/or CD45RO+ T cells, are selected by positive or negative parallel selection techniques. In some embodiments, sequential and parallel selection techniques can be used in combination.

In some embodiments, two columns are used for parallel selection. In some embodiments, the two columns select for the same cell type (e.g., same selection marker). In some embodiments, the two columns each select for CD3+ T cells.

In general, binding capacity of a stationary phase (e.g., selection resin) affects how much stationary phase is needed in order to select a certain number of target moieties, e.g., target cells such as T cells. The binding capacity, e.g., the number of target cells that can be immobilized per mL of the stationary phase (e.g., selection resin), can be used to determine or control the number of captured target cells on one or more columns. One or more chromatography column can be used for the on-column cell selection and stimulation disclosed herein. When multiple columns are used, they can be arranged sequentially, in parallel, or in a suitable combination thereof. Thus, the binding capacity of a stationary phase (e.g., selection resin) can be used to standardize the reagent amount in a single-column approach or the reagent amount for each column in a multiple-column approach.

In some embodiments, the binding capacity of the stationary phase used herein is the maximum number of target cells bound to the stationary phase at given solvent and cell concentration conditions, when an excess of target cells are loaded onto the stationary phase. In some embodiments, the binding capacity is or is about 100 million±25 million target cells (e.g., T cells) per mL of stationary phase. In some embodiments, the static binding capacity of the stationary phase (e.g., selection resin) disclosed herein ranges between about 75 million and about 125 million target cells per mL of stationary phase. In one aspect, the binding capacity of the stationary phase used herein for on-column cell selection and stimulation is a static binding capacity. In some embodiments, the static binding capacity is the maximum amount of cells capable of being immobilized on the stationary phase, e.g., at certain solvent and cell concentration conditions. In some embodiments, the static binding capacity of the stationary phase (e.g., selection resin) disclosed herein ranges between about 50 million and about 100 million target cells per mL of stationary phase. In some embodiments, the static binding capacity is or is about 100 million±25 million target cells (e.g., T cells) per mL of stationary phase. In some embodiments, the static binding capacity of the stationary phase (e.g., selection resin) disclosed herein ranges between about 75 million and about 125 million target cells per mL of stationary phase. In some embodiments, the static binding capacity of the stationary phase (e.g., selection resin) is between about 10 million and about 20 million, between about 20 million and about 30 million, between about 30 million and about 40 million, between about 40 million and about 50 million, between about 50 million and about 60 million, between about 60 million and about 70 million, between about 70 million and about 80 million, between about 80 million and about 90 million, between about 90 million and about 100 million, between about 110 million and about 120 million, between about 120 million and about 130 million, between about 130 million and about 140 million, between about 140 million and about 150 million, between about 150 million and about 160 million, between about 160 million and about 170 million, between about 170 million and about 180 million, between about 180 million and about 190 million, or between about 190 million and about 200 million target cells per mL of stationary phase.

In some embodiments, the binding capacity of the stationary phase used herein is the number of target cells that bind to the stationary phase under given flow conditions before a significant breakthrough of unbound target cells occurs. In one aspect, the binding capacity of the stationary phase used herein for on-column cell selection and stimulation is a dynamic binding capacity, i.e., the binding capacity under operating conditions in a packed chromatography column during sample application. In some embodiments, the dynamic binding capacity is determined by loading a sample containing a known concentration of the target cells and monitoring the flow-through, and the target cells will bind the stationary phase to a certain break point before unbound target cells will flow through the column. In some embodiments, the dynamic binding capacity is or is about 100 million±25 million target cells (e.g., T cells) per mL of stationary phase. In some embodiments, the dynamic binding capacity of the stationary phase (e.g., selection resin) disclosed herein is between or is between about 75 million and about 125 million target cells per mL of stationary phase. In some embodiments, the dynamic binding capacity of the stationary phase (e.g., selection resin) disclosed herein ranges between about 50 million and about 100 million target cells per mL of stationary phase. In some embodiments, the dynamic binding capacity of the stationary phase (e.g., selection resin) is between about 10 million and about 20 million, between about 20 million and about 30 million, between about 30 million and about 40 million, between about 40 million and about 50 million, between about 50 million and about 60 million, between about 60 million and about 70 million, between about 70 million and about 80 million, between about 80 million and about 90 million, between about 90 million and about 100 million, between about 110 million and about 120 million, between about 120 million and about 130 million, between about 130 million and about 140 million, between about 140 million and about 150 million, between about 150 million and about 160 million, between about 160 million and about 170 million, between about 170 million and about 180 million, between about 180 million and about 190 million, or between about 190 million and about 200 million target cells per mL of stationary phase.

In some embodiments, the stationary phase is 20 mL. In some embodiments, the stationary phase has a binding capacity of 2 billion±0.5 billion cells.

Any material may be employed as a chromatography matrix (e.g., stationary phase). In general, a suitable chromatography material is essentially innocuous, i.e. not detrimental to cell viability, such as when used in a packed chromatography column under desired conditions. In some embodiments, the stationary phase remains in a predefined location, such as a predefined position, whereas the location of the sample is being altered. Thus, in some embodiments the stationary phase is the part of a chromatographic system through which the mobile phase flows (either by flow through or in a batch mode) and where distribution of the components contained in the liquid phase (either dissolved or dispersed) between the phases occurs.

In some embodiments, the chromatography matrix has the form of a solid or semisolid phase, whereas the sample that contains the target cell to be isolated/separated is a fluid phase. The chromatography matrix can be a particulate material (of any suitable size and shape) or a monolithic chromatography material, including a paper substrate or membrane. Thus, in some aspects, the chromatography can be both column chromatography as well as planar chromatography. In some embodiments, in addition to standard chromatography columns, columns allowing a bidirectional flow such as PhyTip® columns available from PhyNexus, Inc. San Jose, CA, U.S.A. or pipette tips can be used for column based/flow through mode based methods. Thus, in some cases, pipette tips or columns allowing a bidirectional flow are also comprised by chromatography columns useful in the present methods. In some cases, such as where a particulate matrix material is used, the particulate matrix material may, for example, have a mean particle size of about 5 µm to about 200 µm, or from about 5 µm to about 400 µm, or from about 5 µm to about 600 µm. In some aspects, the chromatography matrix may, for example, be or include a polymeric resin or a metal oxide or a metalloid oxide. In some aspects, such as where planar chromatography is used, the matrix material may be any material suitable for planar chromatography, such as conventional cellulose-based or organic polymer based membranes (for example, a paper membrane, a nitrocellulose membrane or a polyvinylidene difluoride (PVDF) membrane) or silica coated glass plates. In one embodiment, the chromatography matrix/stationary phase is a non-magnetic material or non-magnetizable material.

In some embodiments, non-magnetic or non-magnetizable chromatography stationary phases that are suitable in the present methods include derivatized silica or a crosslinked gel. In some aspects, a crosslinked gel may be based on a natural polymer, such as on a polymer class that occurs in nature. For example, a natural polymer on which a chromatography stationary phase may be based is a polysaccharide. In some cases, a respective polysaccharide is generally crosslinked. An example of a polysaccharide matrix includes, but is not limited to, an agarose gel (for example, Superflow™ agarose or a Sepharose® material such as Superflow™ Sepharose® that are commercially available in different bead and pore sizes) or a gel of crosslinked dextran(s). A further illustrative example is a particulate cross-linked agarose matrix, to which dextran is covalently bonded, that is commercially available (in various bead sizes and with various pore sizes) as Sephadex® or Superdex®, both available from GE Healthcare. Another illustrative example of such a chromatography material is Sephacryl® which is also available in different bead and pore sizes from GE Healthcare.

In some embodiments, a crosslinked gel may also be based on a synthetic polymer, such as on a polymer class that does not occur in nature. In some aspects, such a synthetic polymer on which a chromatography stationary phase is based is a polymer that has polar monomer units, and which is therefore in itself polar. Thus, in some cases, such a polar polymer is hydrophilic. Hydrophilic molecules, also termed lipophobic, in some aspects contain moieties that can form dipole-dipole interactions with water molecules. In general, hydrophobic molecules, also termed lipophilic, have a tendency to separate from water.

Generally, a chromatographic method is a fluid chromatography, typically a liquid chromatography. In some aspects, the chromatography can be carried out in a flow through mode in which a fluid sample containing the cells, e.g., the target cells, is applied, for example, by gravity flow or by a pump on one end of a column containing the chromatography matrix and in which the fluid sample exists the column at the other end of the column. In addition the chromatography can be carried out in an "up and down" mode in which a fluid sample containing the cells to be isolated is applied, for example, by a pipette on one end of a column containing the chromatography matrix packed within a pipette tip and in which the fluid sample enters and exists the chromatography matrix/pipette tip at the other end of the column. Alternatively, the chromatography can also be carried out in a batch mode in which the chromatography material (stationary phase) is incubated with the sample that contains the cells, for example, under shaking, rotating or repeated contacting and removal of the fluid sample, for example, by means of a pipette.

In some aspects, any material may be employed as chromatography matrix in the context of the invention, as long as the material is suitable for the chromatographic isolation, e.g., selection of cells. In particular aspects, a suitable chromatography material is at least innocuous or essentially innocuous, e.g., not detrimental to cell viability, when used in a packed chromatography column under desired conditions for cell isolation and/or cell separation. In some aspects, the chromatography matrix remains in a predefined location, typically in a predefined position, whereas the location of the sample to be separated and of components included therein, is being altered. Thus, in some aspects, the chromatography matrix is a "stationary phase."

Typically, the respective chromatography matrix has the form of a solid or semi-solid phase, whereas the sample that contains the target cell to be isolated/separated is a fluid phase. The mobile phase used to achieve chromatographic separation is likewise a fluid phase. The chromatography matrix can be a particulate material (of any suitable size and shape) or a monolithic chromatography material, including a paper substrate or membrane. Thus, the chromatography can be both column chromatography as well as planar chromatography. In addition to standard chromatography columns, columns allowing a bidirectional flow or pipette tips can be used for column based/flow through mode based chromatographic separation of cells as described here. In some aspects, a particulate matrix material is used, and the particulate matrix material may, for example, have a mean particle size of about 5 µm to about 200 µm, or from about 5 µm to about 400 µm, or from about 5 µm to about 600 µm. In some aspects, planar chromatography is used, and the matrix material may be any material suitable for planar chromatography, such as conventional cellulose-based or organic polymer based membranes (for example, a paper membrane, a nitrocellulose membrane or a polyvinylidene difluoride (PVDF) membrane) or silica coated glass plates.

In some aspects, the chromatography matrix/stationary phase is a non-magnetic material or non-magnetisable material. Such material may include derivatized silica or a crosslinked gel. A crosslinked gel (which is typically manufactured in a bead form) may be based on a natural polymer, such as a crosslinked polysaccharide. Suitable examples include but are not limited to agarose gels or a gel of crosslinked dextran(s). A crosslinked gel may also be based on a synthetic polymer, i.e. on a polymer class that does not occur in nature. Usually such a synthetic polymer on which a chromatography stationary phase for cell separation is based is a polymer that has polar monomer units, and which is therefore in itself polar.

Illustrative examples of suitable synthetic polymers are polyacrylamide(s), a styrene-divinylbenzene gel and a copolymer of an acrylate and a diol or of an acrylamide and a diol. An illustrative example is a polymethacrylate gel, commercially available as a Fractogel®. A further example is a copolymer of ethylene glycol and methacrylate, commercially available as a Toyopearl®. In some embodiments a chromatography stationary phase may also include natural and synthetic polymer components, such as a composite matrix or a composite or a co-polymer of a polysaccharide and agarose, e.g. a polyacrylamide/agarose composite, or of a polysaccharide and N,N'-methylenebisacrylamide. An illustrative example of a copolymer of a dextran and N,N'-methylenebisacryhamide is the above-mentioned Sephacryl® series of material. A derivatized silica may include silica particles that are coupled to a synthetic or to a natural polymer. Examples of such embodiments include, but are not limited to, polysaccharide grafted silica, polyvinyl-pyrrolidone grafted silica, polyethylene oxide grafted silica, poly(2-hydroxyethylaspartamide) silica and poly(N-isopropylacrylamide) grafted silica.

A chromatography matrix employed in the present invention is in some embodiments a gel filtration (also known as size exclusion) matrix. A gel filtration can be characterized by the property that it is designed to undergo, at least essentially, no interaction with the cells to be separated. Hence, a gel filtration matrix allows the separation of cells or other biological entities as defined herein largely on the basis of their size. A respective chromatography matrix is typically a particulate porous material as mentioned above. The chromatography matrix may have a certain exclusion limit, which is typically defined in terms of a molecular weight above which molecules are entirely excluded from entering the pores. The respective molecular weight defining the size exclusion limit may be selected to be below the weight corresponding to the weight of a target cell (or biological entity) to be isolated. In such an embodiment the target cell is prevented from entering the pores of the size exclusion chromatography matrix. Likewise, a stationary phase that is an affinity chromatography matrix may have pores that are of a size that is smaller than the size of a chosen target cell. In illustrative embodiments the affinity chromatography matrix and/or the gel filtration matrix has a mean pore size of 0 to about 500 nm.

Other components present in a sample such as stimulatory agents and/or stimulatory reagents (e.g., oligomeric stimulatory reagents) may have a size that is below the exclusion limit of the pores and this can enter the pores of the size exclusion chromatography matrix. Of such components that are able to partially or fully enter the pore volume, larger molecules, with less access to the pore volume will usually elute first, whereas the smallest molecules elute last. In some embodiments the exclusion limit of the size exclusion chromatography matrix is selected to be below the maximal width of the target cell. Hence, components that have access to the pore volume will usually remain longer in/on the size exclusion chromatography matrix than target cell. Thus, target cells can be collected in the eluate of a chromatography column separately from other matter/components of a sample. Therefore components such as a stimulatory reagent elute at a later point of time from a gel filtration matrix than the target cell. This separation effect will be further increased, if the gel permeation matrix comprises a selection reagent (usually covalently bound thereon) that comprises binding sites, for example binding sites Z that are able to bind reagents such as a selection reagent and/or a competition reagent present in a sample. The selection agent and/or the competition reagent will be bound by the binding sites Z of the affinity reagent and thereby immobilized on the gel permeation matrix. This method is usually carried out in a removal cartridge and in some embodiments a method, a combination and a kit according to the invention include and/or employ such a gel filtration matrix. In a respective method cells are accordingly separated on the basis of size.

A chromatography matrix employed in the present invention may also include magnetically attractable matter such as one or more magnetically attractable particles or a ferrofluid. A respective magnetically attractable particle may comprise a selection reagent with a binding site (e.g., selection agent) that is capable of binding to and immobilizing the target cell on the chromatography matrix. Magnetically attractable particles may contain diamagnetic, ferromagnetic, paramagnetic or superparamagnetic material. Superparamagnetic material responds to a magnetic field with an induced magnetic field without a resulting permanent magnetization. Magnetic particles based on iron oxide are for example commercially available as Dynabeads® from Dynal Biotech, as magnetic MicroBeads from Miltenyi Biotec, as magnetic porous glass beads from CPG Inc., as well as from various other sources, such as Roche Applied Science, BIOCLON, BioSource International Inc., micromod, AMBION, Merck, Bangs Laboratories, Polysciences, or Novagen Inc., to name only a few. Magnetic nanoparticles based on superparamagnetic Co and FeCo, as well as ferromagnetic Co nanocrystals have been described, for example by Hütten, A. et al. (J. Biotech. (2004), 112, 47-63). However, in some embodiments a chromatography matrix employed in the present invention is void of any magnetically attractable matter.

Selection Agent

As described above, in certain aspects, the methods provided herein employ a selection agent. In some embodiments, the agent, as described in Section II-B, is a selection agent. In some embodiments, the selection agent binds to a molecule on the surface of a cell, such as a cell surface molecule. In some instances, the cell surface molecule is a selection marker. In some embodiments, the selection agent is capable of specifically binding to a selection marker expressed by one or more of the cells in a sample. In some embodiments, reference to specific binding to a molecule, such as a cell surface molecule or cell surface receptor, throughout the disclosure does not necessarily mean that the agent binds only to such molecule. For example, an agent that specifically binds to a molecule may bind to other molecules, generally with much lower affinity as determined by, e.g., immunoassays, BIAcore®, KinExA 3000 instrument (Sapidyne Instruments, Boise, ID), or other assays. In some cases, the ability of an agent, under specific binding conditions, to bind to a target molecule such that its affinity or avidity is at least 5 times as great, such as at least 10, 20, 30, 40, 50, 100, 250 or 500 times as great, or even at least 1000 times as great as the average affinity or avidity of the same agent to a collection of random peptides or polypeptides of sufficient statistical size.

In some embodiments, the cells, e.g., target cells (e.g., T cells), have or express a molecule on the cell surface, e.g., a selection marker, such that the cells to be selected are defined by the presence of at least one common specific molecule (e.g., selection marker). In some embodiments, the sample containing the target cell may also contain additional cells that are devoid of the molecule (e.g., selection marker). For example, in some embodiments, T cells may be selected from a sample containing multiple cells types, e.g., red blood cells or B cells. Selection marker and receptor molecule may be used interchangeably herein to refer to a cell surface molecule.

In some embodiments, the selection marker (e.g., a receptor molecule) that is located on the cell surface, e.g., the target cell surface, may be any molecule as long as it remains covalently or non-covalently bonded to the cell surface during a chromatographic separation process in a method according to the invention. The selection marker (e.g., receptor molecule) is a molecule against which a selection agent may be directed. In some embodiments the selection marker is a peptide or a protein, such as a membrane receptor protein. In some embodiments the selection marker is a lipid, a polysaccharide or a nucleic acid. A selection marker (e.g., receptor molecule) that is a protein may be a peripheral membrane protein or an integral membrane protein. It may in some embodiments have one or more domains that span the membrane. In certain embodiments, the selection marker is a surface protein of an immune cell, e.g., CD3, CD4, or CD8. In some embodiments the selection marker may be an antigen defining a desired cell population or subpopulation, for instance a population or subpopulation of blood cells, e. g. lymphocytes (e.g. T cells, CD4+ T cells, or CD8+ T cells).

In some aspects, the cell surface molecule, e.g., selection marker, may be an antigen defining a desired cell population or subpopulation, for instance a population or subpopulation of blood cells, e. g. lymphocytes (e.g. T cells, T-helper cells, for example, CD3+ T cells, CD8 Tcells, CD4+ T-helper cells, B cells or natural killer cells), monocytes, or stem cells, e.g. CD34-positive peripheral stem cells or Nanog or Oct-4 expressing stem cells. In some embodiments, the selection marker can be a marker expressed on the surface of T cells or a subset of T cells, such as CD25, CD28, CD62L, CCR7, CD27, CD127, CD3, CD4, CD8, CD45RA, and/or CD45RO. Examples of T-cells include cells such as CMV-specific CD8+ T-lymphocytes, cytotoxic T-cells, memory T-cells and regulatory T-cells (Treg). An illustrative example of Treg includes CD4 CD25 CD45RA Treg cells and an illustrative example of memory T-cells includes CD62L CD8+ specific central memory T-cells.

As mentioned above, in some embodiments, the selection agent has or contains a binding site B. In certain embodiments, the binding site B is monovalent. In some aspects, a monovalent binding site B is or contains a monovalent antibody fragment or a proteinaceous binding molecule with immunoglobulin-like functions, an aptamer or an MHC molecule. Examples of monovalent antibody fragments include, but are not limited to a Fab fragment, a Fv fragment, and a single-chain Fv fragment (scFv), including a divalent single-chain Fv fragment. Examples of (recombinant) antibody fragments are Fab fragments, Fv fragments, single-chain Fv fragments (scFv), a divalent antibody fragment such as an (Fab)2'-fragment, diabodies, triabodies (Iliades, P., et al., *FEBS Lett* (1997) 409, 437-441), decabodies (Stone, E., et al., *Journal of Immunological Methods* (2007) 318, 88-94) and other domain antibodies (Holt, L. J., et al., *Trends Biotechnol*. (2003), 21, 11, 484-490). In some embodiments, one or more binding sites of the selection agent may be a bivalent proteinaceous artificial binding molecule such as a dimeric lipocalin mutein that is also known as "duocalin". In some embodiments the receptor binding reagent may have a single second binding site, i.e., it may be monovalent. Examples of monovalent receptor binding reagents include, but are not limited to, a monovalent antibody fragment, a proteinaceous binding molecule with antibody-like binding properties or an MHC molecule.

Yet further examples of suitable proteinaceous binding molecules are an EGF-like domain, a Kringle-domain, a fibronectin type I domain, a fibronectin type II domain, a fibronectin type III domain, a PAN domain, a G1a domain, a SRCR domain, a Kunitz/Bovine pancreatic trypsin Inhibitor domain, tendamistat, a Kazal-type serine protease inhibitor domain, a Trefoil (P-type) domain, a von Willebrand factor type C domain, an Anaphylatoxin-like domain, a CUB domain, a thyroglobulin type I repeat, LDL-receptor class A domain, a Sushi domain, a Link domain, a Thrombospondin type I domain, an immunoglobulin domain or a an immunoglobulin-like domain (for example, domain antibodies or camel heavy chain antibodies), a C-type lectin domain, a MAM domain, a von Willebrand factor type A domain, a Somatomedin B domain, a WAP-type four disulfide core domain, a F5/8 type C domain, a Hemopexin domain, an SH2 domain, an SH3 domain, a Laminin-type EGF-like domain, a C2 domain, "Kappabodies" (cf. Ill. et al., Protein Eng (1997) 10, 949-57, a so called "minibody" (Martin et al., EMBO J (1994) 13, 5303-5309), a diabody (cf. Holliger et al., PNAS USA (1993)90, 6444-6448), a so called "Janusis" (cf. Traunecker et al., EMBO J (1991) 10, 3655-3659, or Traunecker et al., Int J Cancer (1992) Suppl 7, 51-52), a nanobody, a microbody, an affilin, an affibody, a knottin, ubiquitin, a zinc-finger protein, an autofluorescent protein or a leucine-rich repeat protein. An example of a nucleic acid molecule with antibody-like functions is an aptamer. An aptamer folds into a defined three-dimensional motif and shows high affinity for a given target structure.

In particular aspects, the selection agent contains a binding partner C. In some aspects, the binding partner C included in the selection agent may for instance be hydrocarbon-based (including polymeric) and include nitrogen-, phosphorus-, sulphur-, carbon-, halogen- or pseudohalogen groups. It may be an alcohol, an organic acid, an inorganic acid, an amine, a phosphine, a thiol, a disulfide, an alkane, an amino acid, a peptide, an oligopeptide, a polypeptide, a protein, a nucleic acid, a lipid, a saccharide, an oligosaccharide, or a polysaccharide. As further examples, it may also be a cation, an anion, a polycation, a polyanion, a polycation, an electrolyte, a polyelectrolyte, a carbon nanotube or carbon nanofoam. Generally, such a binding partner has a higher affinity to the binding site of the selection or multimerization reagent than to other matter. Examples of a respective binding partner include, but are not limited to, a crown ether, an immunoglobulin, a fragment thereof and a proteinaceous binding molecule with antibody-like functions.

In some embodiments the binding partner C that is included in the selection agent includes biotin and the selection reagent includes a streptavidin analog or an avidin analog that reversibly binds to biotin. In some embodiments the binding partner C that is included in the selection agent includes a biotin analog that reversibly binds to streptavidin or avidin, and the selection reagent includes streptavidin, avidin, a streptavidin analog or an avidin analog that reversibly binds to the respective biotin analog. In some embodiments the binding partner C that is included in the selection agent includes a streptavidin or avidin binding peptide and the selection reagent includes streptavidin, avidin, a streptavidin analog or an avidin analog that reversibly binds to the respective streptavidin or avidin binding peptide.

In some embodiments the binding partner that is included in the selection agent may include a streptavidin-binding peptide. In some embodiments, the peptide sequence contains a sequence with the general formula His-Pro-Xaa, where Xaa is glutamine, asparagine, or methionine, such as contains the sequence set forth in SEQ ID NO: 9. In some embodiments, the peptide sequence has the general formula set forth in SEQ ID NO: 11, such as set forth in SEQ ID NO: 12. In one example, the peptide sequence is Trp-Arg-His-Pro-Gln-Phe-Gly-Gly (also called Strep-Tag®, set forth in SEQ ID NO: 7). In one example, the peptide sequence is Trp-Ser-His-Pro-Gln-Phe-Glu-Lys (also called Strep-Tag® II, set forth in SEQ ID NO: 8), which is described in U.S. Pat. No. 6,103,493, for example, and is commercially available under the trademark Strep-Tactin®. The streptavidin binding peptides might, for example, be single peptides such as the "Strep-Tag®" described in U.S. Pat. No. 5,506,121, for example, or streptavidin binding peptides having a sequential arrangement of two or more individual binding modules as described in International Patent Publication WO 02/077018 or U.S. Pat. No. 7,981,632.

In some embodiment the binding partner C of the selection agent includes a moiety known to the skilled artisan as an affinity tag. In such an embodiment the selection reagent includes a corresponding binding partner, for example, an antibody or an antibody fragment, known to bind to the affinity tag. As a few illustrative examples of known affinity tags, the binding partner that is included in the selection agent may include dinitrophenol or digoxigenin, oligohistidine, polyhistidine, an immunoglobulin domain, maltose-binding protein, glutathione-S-transferase (GST), chitin binding protein (CBP) or thioredoxin, calmodulin binding peptide (CBP), FLAG'-peptide, the HA-tag, the VSV-G-tag, the HSV-tag, the T7 epitope, maltose binding protein (MBP), the HSV epitope of the sequence of herpes simplex virus glycoprotein D, the "myc" epitope of the transcription factor c-myc of the sequence, the V5-tag, or glutathione-S-transferase (GST). In such an embodiment the complex formed between the one or more binding sites of the selection reagent, in this case an antibody or antibody fragment, and the antigen can be disrupted competitively by adding the free antigen, i.e. the free peptide (epitope tag) or the free protein (such as MBP or CBP). The affinity tag might also be an oligonucleotide tag. Such an oligonucleotide tag may, for instance, be used to hybridize to an oligonucleotide with a complementary sequence, linked to or included in the selection reagent.

In line with the co-pending International Patent Application PCT/EP2012/063969, published as WO 2013/011011, (the entire content of which is incorporated herein by reference for all purposes) the strength of the binding between the selection agent and a selection marker on a target cell may not be essential for the reversibility of the binding of the target cell to the selection reagent via the selection agent. Rather, irrespective of the strength of the binding, meaning whether the dissociation constant ($K_D$) for the binding between the selection agent via the binding site B and the selection marker is of low affinity, for example, in the range of a $K_D$ of about $10^{-3}$ to about $10^{-7}$ M, or of high affinity, for example, in the range of a $K_D$ of about $10^{--7}$ to about $1\times10^{-10}$ M, a target cell can be reversibly stained as long as the dissociation of the binding of the selection agent via the binding site B and the receptor molecule occurs sufficiently fast. In this regard the dissociation rate constant ($k_{off}$) for the binding between the selection agent via the binding site B and the selection agent may have a value of about $3\times10^{-5}$ sec$^{-1}$ or greater (this dissociation rate constant is the constant characterizing the dissociation reaction of the complex formed between the binding site B of the selection agent and the selection marker on the surface of the target cell). The association rate constant ($k_{on}$) for the association reaction between the binding site B of the selection agent and the selection marker on the surface of the target cell may have any value. In order to ensure a sufficiently reversible binding between the selection marker and selection agent it is advantageous to select the $k_{off}$ value of the binding equilibrium to have a value of about $3\times10^{-5}$ sec$^{-1}$ or greater, of about $5\times10^{-5}$ sec$^{-1}$ or greater, such as or as about $1\times10^{-4}$ sec$^{-1}$ or greater, $5\times10^{-4}$ sec$^{-1}$ or greater, $1\times10^{-3}$ sec$^{-1}$ or greater, $5\times10^{-3}$ sec$^{-1}$ or greater, a $1\times10^{-2}$ sec$^{-1}$ or greater, $1\times10^{-1}$ sec$^{-1}$ or greater or $5\times10^{-1}$ sec$^{-1}$ or greater. It is noted here that the values of the kinetic and thermodynamic constants as used herein, refer to conditions of atmospheric pressure, i.e. 1.013 bar, and room temperature, i.e. 25° C.

In some embodiments the selection agent has a single (monovalent) binding site B capable of specifically binding to the selection marker. In some embodiments the selection agent has at least two (i.e., a plurality of binding sites B including three, four or also five identical binding sites B), capable of binding to the selection marker. In any of these embodiments, the binding of the selection marker via (each of) the binding site(s) B may have a $k_{off}$ value of about $3\times10^{-5}$ sec$^{-1}$ or greater. Thus, the selection agent can be monovalent (for example a monovalent antibody fragment or a monovalent artificial binding molecule (proteinaceous or other) such as a mutein based on a polypeptide of the lipocalin family (also known as "Anticalin®"), or a bivalent molecule such as an antibody or a fragment in which both binding sites are retained such as an F(ab')2 fragment. In some embodiments the selection marker may be a multivalent molecule such as a pentameric IgE molecule, provided the $k_{off}$ rate is $3\times10^{-5}$ sec$^{-1}$ or greater.

In some embodiments of the invention, it is on a molecular level not the $k_{off}$ rate (of $3\times10^{-5}$ sec$^{-1}$ or greater) of the binding of the selection agent via the at least binding site B and the selection marker on the target cell that provides for the (traceless) isolation of biological material via reversible cell affinity chromatography technology described here. Rather, and as described, for example, in U.S. Pat. No. 7,776,562 or International Patent application WO02/054065, a low affinity binding between the selection marker and the binding site B of the selection agent together with an avidity effect mediated via the immobilized selection reagent allows for a reversible and traceless isolation of a target cell. In these embodiments a complex between the two or more binding sites Z of the selection reagent and the binding partner C of at least two selection agents can form, allowing a reversible immobilization of the target cells on the affinity chromatography matrix. As mentioned above, such a low binding affinity may be characterized by a dissociation constant ($K_D$) in the range from about $1.0\times10^{-3}$ M to about $1.0\times10^{-7}$ M for the binding of the selection agent via the binding site B and the selection marker on the target cell surface.

In some embodiments, the selection marker may be CD4 and the selection agent specifically binds CD4. In some aspects, the selection agent that specifically binds CD4 may be selected from the group consisting of an anti-CD4-antibody, a divalent antibody fragment of an anti-CD4 antibody, a monovalent antibody fragment of an anti-CD4-antibody, and a proteinaceous CD4 binding molecule with antibody-like binding properties. In some embodiments, an anti-CD4-antibody, such as a divalent antibody fragment or a monovalent antibody fragment (e.g. CD4 Fab fragment) can be derived from antibody 13B8.2 or a functionally active mutant of 13B8.2 that retains specific binding for CD4. For example, exemplary mutants of antibody 13B8.2 or m13B8.2 are described in U.S. Pat. No. 7,482,000, U.S. Patent Appl. No. US2014/0295458 or International Patent Application No. WO2013/124474; and Bes, C, et al. J Biol Chem 278, 14265-14273 (2003). The mutant Fab fragment termed "m13B8.2" carries the variable domain of the CD4 binding murine antibody 13B8.2 and a constant domain containing constant human CH1 domain of type gamma for the heavy chain and the constant human light chain domain of type kappa, as described in U.S. Pat. No. 7,482,000. In some embodiments, the anti-CD4 antibody, e.g. a mutant of antibody 13B8.2, contains the amino acid replacement H91A in the variable light chain, the amino acid replacement Y92A in the variable light chain, the amino acid replacement H35A in the variable heavy chain and/or the amino acid replacement R53A in the variable heavy chain, each by Kabat numbering. In some aspects, compared to variable domains of the 13B8.2 Fab fragment in m13B8.2 the His residue at position 91 of the light chain (position 93 in SEQ ID NO: 30) is mutated to Ala and the Arg residue at position 53 of the heavy chain (position 55 in SEQ ID NO: 29) is mutated to Ala. In some embodiments, the reagent that is reversibly bound to anti-CD4 or a fragment thereof is commercially available or derived from a reagent that is commercially available (e.g. catalog No. 6-8000-206 or 6-8000-205 or 6-8002-100; IBA GmbH, Gottingen, Germany). In some embodiments, the selection agent comprises an anti-CD4 Fab fragment. In some embodiments, the anti-CD4 Fab fragment comprises a variable heavy chain having the sequence set forth by SEQ ID NO:29 and a variable light chain having the sequence set forth by SEQ ID NO:30. In some embodiments, the anti-CD4 Fab fragment comprises the CDRs of the variable heavy chain having the sequence set forth by SEQ ID NO:29 and the CDRs of the variable light chain having the sequence set forth by SEQ ID NO:30.

In some embodiments, the selection marker may be CD8 and the selection agent specifically binds CD8. In some aspects, the selection agent that specifically binds CD8 may be selected from the group consisting of an anti-CD8-antibody, a divalent antibody fragment of an anti-CD8 antibody, a monovalent antibody fragment of an anti-CD8-antibody, and a proteinaceous CD8 binding molecule with antibody-like binding properties. In some embodiments, an anti-CD8-antibody, such as a divalent antibody fragment or a monovalent antibody fragment (e.g. CD8 Fab fragment) can be derived from antibody OKT8 (e.g. ATCC CRL-8014) or a functionally active mutant thereof that retains specific binding for CD8. In some embodiments, the reagent that is reversibly bound to anti-CD8 or a fragment thereof is commercially available or derived from a reagent that is commercially available (e.g. catalog No. 6-8003 or 6-8000-201; IBA GmbH, Gottingen, Germany). In some embodiments, the selection agent comprises an anti-CD8 Fab fragment. In some embodiments, the anti-CD8 Fab fragment comprises a variable heavy chain having the sequence set forth by SEQ ID NO:36 and a variable light chain having the sequence set forth by SEQ ID NO:37. In some embodiments, the anti-CD8 Fab fragment comprises the CDRs of the variable heavy chain having the sequence set forth by SEQ ID NO:36 and the CDRs of the variable light chain having the sequence set forth by SEQ ID NO:37.

In some embodiments, the selection marker may be CD3 and the selection agent specifically binds CD3. In some aspects, the selection agent that specifically binds CD3 may be selected from the group consisting of an anti-CD3-antibody, a divalent antibody fragment of an anti-CD3 antibody, a monovalent antibody fragment of an anti-CD3-antibody, and a proteinaceous CD3 binding molecule with antibody-like binding properties. In some embodiments, an anti-CD3-antibody, such as a divalent antibody fragment or a monovalent antibody fragment (e.g. CD3 Fab fragment) can be derived from antibody OKT3 (e.g. ATCC CRL-8001; see e.g., Stemberger et al. PLoS One. 2012; 7(4): e35798) or a functionally active mutant thereof that retains specific binding for CD3. In some embodiments, the reagent that is reversibly bound to anti-CD3 or a fragment thereof is commercially available or derived from a reagent that is commercially available (e.g. catalog No. 6-8000-201, 6-8001-100; IBA GmbH, Gottingen, Germany). In some embodiments, the selection agent comprises an anti-CD3 Fab fragment. In some embodiments, the anti-CD3 Fab fragment comprises a variable heavy chain having the sequence set forth by SEQ ID NO:31 and a variable light chain having the sequence set forth by SEQ ID NO:32. In some embodiments, the anti-CD3 Fab fragment comprises the CDRs of the variable heavy chain having the sequence set forth by SEQ ID NO:31 and the CDRs of the variable light chain having the sequence set forth by SEQ ID NO:32.

In any of the above examples, the divalent antibody fragment may be an (Fab)2'-fragment, or a divalent single-chain Fv fragment while the monovalent antibody fragment may be selected from the group consisting of a Fab fragment, an Fv fragment, and a single-chain Fv fragment (scFv). In any of the above examples, the proteinaceous binding molecule with antibody-like binding properties may be an aptamer, a mutein based on a polypeptide of the lipocalin family, a glubody, a protein based on the ankyrin scaffold, a protein based on the crystalline scaffold, an adnectin, and an avimer.

C. On-Column Stimulation

The methods provided herein include combining the cell selection by column chromatography step with stimulation. Thus, in certain aspects, stimulation is performed during at least a portion of the selection step when cells are immobilized on the column (e.g., by the selection agent). In some embodiments, where two or more columns are used for selection, stimulation is performed on each column. In some embodiments, where two or more columns are used for selection, stimulation is performed on fewer than the total number of columns. In some embodiments, where two or more columns are used for selection, stimulation is performed on at least one column. In some embodiments, where parallel selection is used, stimulation is performed on each column. In some embodiments, where parallel selection is used, stimulation is performed on at least one column. In some embodiments, where sequential selection is used, stimulation is performed on each column. In some embodiments, where sequential selection is used, stimulation is performed on at least one column. In some embodiments, the stimulating conditions include conditions that stimulate or activate, and/or are capable of delivering a stimulatory signal in a cell, e.g., a CD3+, CD4+, or CD8+ T cell, such as a signal generated from a TCR and/or a costimulatory molecule. In some embodiments, the stimulating conditions are or include incubating target cells (e.g., T cells) immobilized on the chromatography matrix (e.g., stationary phase) with a stimulatory agent, e.g., an agent that delivers a stimulatory signal, or is capable of delivering a stimulatory signal, thereby stimulating the selected cell or with a stimulatory reagent including stimulatory agents, such as an oligomeric stimulatory reagent. In some embodiments, the stimulatory agent binds to and stimulates and/or activates a TCR and/or a costimulatory molecule. In particular embodiments, the stimulatory reagent is an oligomeric stimulatory reagent provided herein, e.g., as described in Section I-C-1a. In certain embodiments, stimulating a population of cells under stimulating conditions generates or produces a population of selected and stimulated cells (also referred to herein as a stimulated population of cells). The population of selected and stimulated cells may be referred to herein as an output population of stimulated and selected cells. In some cases, the population of selected and stimulated cells may serve as an input population for downstream processing, for example genetic engineering as described in Section I-E.

In certain embodiments, the cells of a sample are selected and stimulated prior to introducing a heterologous or recombinant polynucleotide into the cells, such as by a method, step, or technique described herein, e.g., in Section I-E. In some embodiments, the output population of selected and stimulated cells is engineered to express heterologous or recombinant proteins (e.g., chimeric antigen receptors).

In some embodiments, the stimulation is considered to be initiated when the cells of the population are first stimulated or exposed to conditions that activate or stimulate, and/or are capable of activing or stimulating a signal in the cell, such as a signal generated from a TCR and/or a coreceptor or costimulatory molecule. In some embodiments, the stimulation is initiated when the cells are first contacted or exposed to a stimulatory agent or stimulatory reagent, such as a stimulatory reagent, for example as described in Section II-A and/or Section I-C-1b, containing stimulatory agents described herein, e.g., in section I-C-1a and/or Section II-A. In particular aspects, the initiation of the stimulation (also referred to herein as initiation of incubation) occurs when the target cells (e.g., T cells) of the sample immobilized on the chromatography matrix (e.g., stationary phase) are first contacted or exposed to a stimulatory agent or stimulatory reagent containing stimulating agents (e.g., an oligomeric stimulatory reagent, for example as described in Section I-C-1b below). In some embodiments, the cells are allowed to penetrate the column for about 5, 10, 15, 20, 25, 30, 35, 40, 45, 50, 55, 60, 70, 80, 90, 100 or 120 minutes prior to addition of the stimulatory reagent (e.g., oligomeric stimulatory reagent) or stimulatory agents. In some embodiments, the column is washed at least one (1, 2, 3, 4, 5) time prior to addition of the stimulatory reagent (e.g., oligomeric stimulatory reagent) or stimulatory agents. In some embodiments, the column is washed at least twice prior to addition of the stimulatory agents or stimulatory reagent including stimulatory agents (e.g., an oligomeric stimulatory reagent).

In some embodiments, the stimulatory agents or stimulatory reagent including stimulatory agents (e.g., oligomeric stimulatory reagent) is added at, at about, or at least 15, 20, 25, 30, 35, 40, 45, 50, 55, 60, 70, 80, 90, 100, or 120 minutes after the sample is added to the chromatography column (e.g., stationary phase). In some embodiments, the stimulatory agents or stimulatory reagent including stimulatory agents (e.g., oligomeric stimulatory reagent) is added at, at about, or at least 30, 35, 40, 45, 50, 55, 60, 70, 80, 90, 100, or 120 minutes after the sample is added to the chromatography column (e.g., stationary phase). In some embodiments, the stimulatory agents or stimulatory reagent including stimulatory agents (e.g., oligomeric stimulatory reagent) is added at, at about, or at least, 30, 35, 40, 45, 50, 55, or 60 minutes after the sample is added to the chromatography column (e.g., stationary phase). In some embodiments, the stimulatory agents or stimulatory reagent including stimulatory agents (e.g., oligomeric stimulatory reagent) is added from between about 15 to about 120 minutes, inclusive, after the sample is added to the column. In some embodiments, the stimulatory agents or stimulatory reagent including stimulatory agents (e.g., oligomeric stimulatory reagent) is added from between about 15 to about 100 minutes, inclusive, after the sample is added to the column. In some embodiments, the stimulatory agents or stimulatory reagent including stimulatory agents (e.g., oligomeric stimulatory reagent) is added from between about 15 to about 90 minutes, inclusive, after the sample is added to the column. In some embodiments, the stimulatory agents or stimulatory reagent including stimulatory agents (e.g., oligomeric stimulatory reagent) is added from between about 15 to about 80 minutes, inclusive, after the sample is added to the column. In some embodiments, the stimulatory agents or stimulatory reagent including stimulatory agents (e.g., oligomeric stimulatory reagent) is added from between about 15 to about 70 minutes, inclusive, after the sample is added to the column. In some embodiments, the stimulatory agents or stimulatory reagent including stimulatory agents (e.g., oligomeric stimulatory reagent) is added from between about 15 to about 60 minutes, inclusive, after the sample is added to the column. In some embodiments, the stimulatory agents or stimulatory reagent including stimulatory agents (e.g., oligomeric stimulatory reagent) is added from between about 15 to about 50 minutes, inclusive, after the sample is added to the column. In some embodiments, the stimulatory agents or stimulatory reagent including stimulatory agents (e.g., oligomeric stimulatory reagent) is added from between about 15 to about 40 minutes, inclusive, after the sample is added to the column. In some embodiments, the stimulatory agents or stimulatory reagent including stimulatory agents (e.g., oligomeric stimulatory reagent) is added from between about 15 to about 30 minutes, inclusive, after the sample is added to the column. In some embodiments, the stimulatory agents or stimulatory reagent including stimulatory agents (e.g., oligomeric stimulatory reagent) is added from between about 30 to about 120 minutes, inclusive, after the sample is added to the column. In some embodiments, the stimulatory agents or stimulatory reagent including stimulatory agents (e.g., oligomeric stimulatory reagent) is added from between about 30 to about 100 minutes, inclusive, after the sample is added to the column. In some embodiments, the stimulatory agents or stimulatory reagent including stimulatory agents (e.g., oligomeric stimulatory reagent) is added from between about 30 to about 90 minutes, inclusive, after the sample is added to the column. In some embodiments, the stimulatory agents or stimulatory reagent including stimulatory agents (e.g., oligomeric stimulatory reagent) is added from between about 30 to about 80 minutes, inclusive, after the sample is added to the column. In some embodiments, the stimulatory agents or stimulatory reagent including stimulatory agents (e.g., oligomeric stimulatory reagent) is added from between about 30 to about 70 minutes, inclusive, after the sample is added to the column. In some embodiments, the stimulatory agents or stimulatory reagent including stimulatory agents (e.g., oligomeric stimulatory reagent) is added from between about 30 to about 60 minutes, inclusive, after the sample is added to the column. In some embodiments, the stimulatory agents or stimulatory reagent including stimulatory agents (e.g., oligomeric stimulatory reagent) is added from between about 30 to about 50 minutes, inclusive, after the sample is added to the column. In some embodiments, the stimulatory agents or stimulatory reagent including stimulatory agents (e.g., oligomeric stimulatory reagent) is added from between about 30 to about 40 minutes, inclusive, after the sample is added to the column. In some embodiments, at least one wash step is performed prior to adding the stimulatory agents or reagent including stimulatory agents (e.g., oligomeric stimulatory reagent) to the column.

In some embodiments, the stimulation, e.g. incubating the immobilized cells under stimulating conditions, is performed for, for about, or for less than one day. In some embodiments, the stimulation, e.g. incubating the immobilized cells under stimulating conditions, is performed for, for about, or for less than, 24, 23, 22, 21, 20, 19, 18, 17, 16, 15, 14, 13, 12, 11, 10, 9, 8, 7, 6, 5, 4, 3, or 2 hours. In some embodiments, the stimulation, e.g. incubating the selected cells under stimulating conditions, is performed for between or between about 2 to 24, 3 to 24, 4 to 24, 5, to 24, 6 to 24, 7 to 24, 8 to 24, 9 to 24, 10 to 24, 11 to 24, 12 to 24, 13 to 24, 14 to 24, 15 to 24, 16 to 24, 17 to 24, 18 to 24, 19 to 24, 20 to 24, 21 to 24, 22 to 24, 23 to 24, 2 to 23, 2 to 22, 2 to 21, 2 to 20, 2 to 19, 2 to 18, 2 to 17, 2 to 16, 2 to 15, 2 to 14, 2 to 13, 2 to 12, 2 to 11, 2 to 10, 2 to 9, 2 to 8, 2 to 7, 2 to 6, 2 to 5, 2 to 4, or 2 to 3 hours. In some embodiments, the stimulation, e.g. incubating the immobilized cells under stimulating conditions, is performed for, for about, or for less than, 24 hours. In some embodiments, the stimulation, e.g. incubating the immobilized cells under stimulating conditions, is performed for, for about, or for less than, 12 hours. In some embodiments, the stimulation, e.g. incubating the immobilized cells under stimulating conditions, is performed for, for about, or for less than, 5 hours. In some embodiments, the stimulation, e.g. incubating the immobilized cells under stimulating conditions, is performed for, for about, or for less than, 4.5 hours. In some embodiments, the stimulation, e.g. incubating the immobilized cells under stimulating conditions, is performed for, for about, or for less than, 4 hours. In some embodiments, the stimulation, e.g. incubating the immobilized cells under stimulating conditions, is performed for, for about, or for less than, 2 hours.

In particular embodiments, an amount of, of about, or of at least $50 \times 10^6$, $100 \times 10^6$, $150 \times 10^6$, $200 \times 10^6$, $250 \times 10^6$, $300 \times 10^6$, $350 \times 10^6$, $400 \times 10^6$, $450 \times 10^6$, $500 \times 10^6$, $550 \times 10^6$, $600 \times 10^6$, $700 \times 10^6$, $800 \times 10^6$, $900 \times 10^6$, $1,000 \times 10^6$, $1250 \times 10^6$, $1500 \times 10^6$, $1750 \times 10^6$, $2000 \times 10^6$, $2250 \times 10^6$, $2500 \times 10^6$, $2750 \times 10^6$, $3000 \times 10^6$ $3250 \times 10^6$, $3500 \ 10^6$, $3750 \times 10^6$, $4000 \times 10^6$, $4250 \times 10^6$, $4500 \times 10^6$, $4750 \times 10^6$, or $5000 \times 10^6$ cells selected from the sample, or any number between any of the foregoing, are stimulated, e.g., incubated under stimulating conditions. In some embodiments, the selected cells are immobilized on a single column (e.g., containing a chromatography matrix). For example, the total amount of selected cells from the sample are immobilized on a single column and the immobilized cells on the single column are incubated under stimulating conditions. In some embodiments, the selected cells are immobilized on two columns (e.g., each containing a chromatography matrix). For example, the total amount of selected cells from the sample are immobilized on two columns (e.g., each column (e.g., chromatography matrix) contains half or about half of the total amount of cells immobilized thereon) and the immobilized cells on the two columns are incubated under stimulating conditions. In certain embodiments, the cells, e.g., selected cells (e.g., T cells) immobilized on the chromatography matrix (e.g., stationary phase), are stimulated e.g., incubated under stimulating conditions such as in the presence of a stimulatory agent, at a density of, of about, or at least $0.01 \times 10^6$ cells/mL, $0.1 \times 10^6$ cells/mL, $0.5 \times 10^6$ cells/mL, $1.0 \times 10^6$ cells/mL, $1.5 \times 10^6$ cells/mL, $2.0 \times 10^6$ cells/mL, $2.5 \times 10^6$ cells/mL, $3.0 \times 10^6$ cells/mL, $4.0 \times 10^6$ cells/mL, $5.0 \times 10^6$ cells/mL, $10 \times 10^6$ cells/mL, $50 \times 10^6$ cells/mL, $75 \times 10^6$ cells/mL, $100 \times 10^6$ cells/mL, $125 \times 10^6$ cells/mL, $150 \times 10^6$ cells/mL, or $200 \times 10^6$ cells/mL. In certain embodiments, the cells, e.g., selected cells (e.g., T cells) immobilized on the stationary phase, are stimulated or subjected to stimulation, e.g., incubated under stimulating conditions such as in the presence of a stimulatory agent, at a density of or of about $100 \pm 25$ million cells/mL. In certain embodiments, the cells, e.g., selected cells (e.g., T cells) immobilized on the stationary phase, are stimulated or subjected to stimulation, e.g., incubated under stimulating conditions such as in the presence of a stimulatory agent, at a density of, of about, or at least $3.0 \times 10^6$ cells/mL. In certain embodiments, the selected cells are viable cells.

In some embodiments, the stimulatory agent or stimulatory reagent including stimulatory agents is added to the column at a concentration of, of about, or at least 0.25, 0.5, 0.75, 1, 1.25, 1.5, 1.75, 2, 2.25, 2.5, 2.75, 3 µg per $1 \times 10^6$ cells. In some embodiments, the stimulatory agent or stimulatory reagent including stimulatory agents is added to the column containing immobilized cells at a concentration of, of about, or at least 0.75, 1, 1.25, 1.5, 1.75, 2, 2.25 µg per $1 \times 10^6$ cells. In some embodiments, the stimulatory agent or stimulatory reagent including stimulatory agents is added to the column at a concentration of or of about 1 to 2 µg per $1 \times 10^6$ cells. In some embodiments, the stimulatory reagent is an oligomeric stimulatory reagent. In some embodiments the oligomeric stimulatory reagent is added to the column containing immobilized cells at a concentration of between or between about 1 to 2 µg per $1 \times 10^6$ cells. In some embodiments, $5 \times 10^8$ oligomeric stimulatory reagents are added to the column containing immobilized cells. In cases where two or more columns contain immobilized cells for stimulation, the concentration or amount of stimulatory agent or stimulatory reagent including stimulatory agents (e.g., oligomeric stimulatory reagent) described herein is added or applied to each column.

In some embodiments, the conditions for stimulation can include one or more of particular media, temperature, oxygen content, carbon dioxide content, time, agents, e.g., nutrients, amino acids, antibiotics, ions, and/or stimulatory factors, such as cytokines, chemokines, antigens, binding partners, fusion proteins, recombinant soluble receptors, and any other agents designed to activate the cells. In some embodiments, temperature is or is about 37° C. In some embodiments, the oxygen and carbon dioxide content is controlled using gas exchange.

In particular embodiments, the stimulating conditions include incubating the cells, e.g., selected cells of a sample, with and/or in the presence of one or more cytokines. In particular embodiments, the one or more cytokines are recombinant cytokines. In some embodiments, the one or more cytokines are human recombinant cytokines. In certain embodiments, the one or more cytokines bind to and/or are capable of binding to receptors that are expressed by and/or are endogenous to the selected cells (e.g., T cells). In particular embodiments, the one or more cytokines are or include a member of the 4-alpha-helix bundle family of cytokines. In some embodiments, members of the 4-alpha-helix bundle family of cytokines include, but are not limited to, interleukin-2 (IL-2), interleukin-4 (IL-4), interleukin-7 (IL-7), interleukin-9 (IL-9), interleukin 12 (IL-12), interleukin 15 (IL-15), granulocyte colony-stimulating factor (G-CSF), and granulocyte-macrophage colony-stimulating factor (GM-CSF). In some embodiments, the one or more cytokines is or includes IL-15. In particular embodiments, the one or more cytokines is or includes IL-7. In particular embodiments, the one or more cytokines is or includes IL-2.

In certain embodiments, the amount or concentration of the one or more cytokines are measured and/or quantified with International Units (IU). International units may be used to quantify vitamins, hormones, cytokines, vaccines, blood products, and similar biologically active substances. In some embodiments, IU are or include units of measure of the potency of biological preparations by comparison to an international reference standard of a specific weight and strength e.g., WHO 1st International Standard for Human IL-2, 86/504. International Units are the only recognized and standardized method to report biological activity units that are published and are derived from an international collaborative research effort. In particular embodiments, the IU for population, sample, or source of a cytokine may be obtained through product comparison testing with an analogous WHO standard product. For example, in some embodiments, the IU/mg of a population, sample, or source of human recombinant IL-2, IL-7, or IL-15 is compared to the WHO standard IL-2 product (NIBSC code: 86/500), the WHO standard IL-17 product (NIBSC code: 90/530) and the WHO standard IL-15 product (NIBSC code: 95/554), respectively.

In some embodiments, the biological activity in IU/mg is equivalent to (ED50 in ng/ml)-$1 \times 10^6$. In particular embodiments, the ED50 of recombinant human IL-2 or IL-15 is equivalent to the concentration required for the half-maximal stimulation of cell proliferation (XTT cleavage) with CTLL-2 cells. In certain embodiments, the ED50 of recombinant human IL-7 is equivalent to the concentration required for the half-maximal stimulation for proliferation of PHA-activated human peripheral blood lymphocytes. Details relating to assays and calculations of IU for IL-2 are discussed in Wadhwa et al., Journal of Immunological Methods (2013), 379 (1-2): 1-7; and Gearing and Thorpe, Journal of Immunological Methods (1988), 114 (1-2): 3-9; details relating to assays and calculations of IU for IL-15 are discussed in Soman et al. Journal of Immunological Methods (2009) 348 (1-2): 83-94.

In some embodiments, the cells, e.g., selected cells of a sample, are stimulated or subjected to stimulation in the presence of a cytokine, e.g., a recombinant human cytokine, at a concentration of between 1 IU/mL and 1,000 IU/mL, between 10 IU/mL and 50 IU/mL, between 50 IU/mL and 100 IU/mL, between 100 IU/mL and 200 IU/mL, between 100 IU/mL and 500 IU/mL, between 250 IU/mL and 500 IU/mL, or between 500 IU/mL and 1,000 IU/mL.

In some embodiments, the cells, e.g., selected cells of a sample, are stimulated or subjected to stimulation in the presence of recombinant IL-2, e.g., human recombinant IL-2, at a concentration between 1 IU/mL and 500 IU/mL, between 10 IU/mL and 250 IU/mL, between 50 IU/mL and 200 IU/mL, between 50 IU/mL and 150 IU/mL, between 75 IU/mL and 125 IU/mL, between 100 IU/mL and 200 IU/mL, or between 10 IU/mL and 100 IU/mL. In particular embodiments, cells, e.g., selected cells of a sample, are stimulated or subjected to stimulation in the presence of recombinant IL-2 at a concentration at or at about 50 IU/mL, 60 IU/mL, 70 IU/mL, 80 IU/mL, 90 IU/mL, 100 IU/mL, 110 IU/mL, 120 IU/mL, 130 IU/mL, 140 IU/mL, 150 IU/mL, 160 IU/mL, 170 IU/mL, 180 IU/mL, 190 IU/mL, or 100 IU/mL. In some embodiments, the cells, e.g., selected cells of a sample, are stimulated or subjected to stimulation in the presence of or of about 100 IU/mL of recombinant IL-2, e.g., human recombinant IL-2.

In some embodiments, the cells, e.g., selected cells of a sample, are stimulated or subjected to stimulation in the presence of recombinant IL-7, e.g., human recombinant IL-7, at a concentration between 100 IU/mL and 2,000 IU/mL, between 500 IU/mL and 1,000 IU/mL, between 100 IU/mL and 500 IU/mL, between 500 IU/mL and 750 IU/mL, between 750 IU/mL and 1,000 IU/mL, or between 550 IU/mL and 650 IU/mL. In particular embodiments, the cells, e.g., the input cells, are stimulated or subjected to stimulation in the presence of IL-7 at a concentration at or at about 50 IU/mL, 100 IU/mL, 150 IU/mL, 200 IU/mL, 250 IU/mL, 300 IU/mL, 350 IU/mL, 400 IU/mL, 450 IU/mL, 500 IU/mL, 550 IU/mL, 600 IU/mL, 650 IU/mL, 700 IU/mL, 750 IU/mL, 800 IU/mL, 750 IU/mL, 750 IU/mL, 750 IU/mL, or 1,000 IU/mL. In particular embodiments, the cells, e.g., selected cells of a sample, are stimulated or subjected to stimulation in the presence of or of about 600 IU/mL of recombinant IL-7, e.g., human recombinant IL-7.

In some embodiments, the cells, e.g., selected cells of a sample, are stimulated or subjected to stimulation in the presence of recombinant IL-15, e.g., human recombinant IL-15, at a concentration between 1 IU/mL and 500 IU/mL, between 10 IU/mL and 250 IU/mL, between 50 IU/mL and 200 IU/mL, between 50 IU/mL and 150 IU/mL, between 75 IU/mL and 125 IU/mL, between 100 IU/mL and 200 IU/mL, or between 10 IU/mL and 100 IU/mL. In particular embodiments, cells, e.g., a cell of the input population, are stimulated or subjected to stimulation in the presence of recombinant IL-15 at a concentration at or at about 50 IU/mL, 60 IU/mL, 70 IU/mL, 80 IU/mL, 90 IU/mL, 100 IU/mL, 110 IU/mL, 120 IU/mL, 130 IU/mL, 140 IU/mL, 150 IU/mL, 160 IU/mL, 170 IU/mL, 180 IU/mL, 190 IU/mL, or 200 IU/mL. In some embodiments, the cells, e.g., selected cells of a sample, are stimulated or subjected to stimulation in the presence of or of about 100 IU/mL of recombinant IL-15, e.g., human recombinant IL-15.

In particular embodiments, the cells, e.g., selected cells of a sample, are stimulated or subjected to stimulation under stimulating conditions in the presence of IL-2, IL-7, and/or IL-15. In some embodiments, the IL-2, IL-7, and/or IL-15 are recombinant. In certain embodiments, the IL-2, IL-7, and/or IL-15 are human. In particular embodiments, the one or more cytokines are or include human recombinant IL-2, IL-7, and/or IL-15. In certain embodiments, the cells, e.g., selected cells of a sample, are stimulated or subjected to stimulation under stimulating conditions in the presence of recombinant IL-2, IL-7, and IL-15. In certain embodiments, the cells are stimulated or subjected to stimulation under stimulating conditions in the presence of recombinant IL-2 of or of about 100 IU/mL, recombinant IL-7 of or of about 600 IU/mL, and recombinant IL-15 of or of about 100 IU/mL. In some embodiments, the stimulating conditions further comprise glutamine.

The conditions can include one or more of particular media, temperature, oxygen content, carbon dioxide content, time, agents, e.g., nutrients, amino acids, antibiotics, ions, and/or stimulatory factors, such as cytokines, chemokines, antigens, binding partners, fusion proteins, recombinant soluble receptors, and any other agents designed to activate the cells.

In some aspects, stimulation is carried out in accordance with techniques such as those described in U.S. Pat. No. 6,040,177 to Riddell et al., Klebanoff et al. (2012) J Immunother. 35(9): 651-660, Terakura et al. (2012) Blood. 1:72-82, and/or Wang et al. (2012) J Immunother. 35(9):689-701.

In some embodiments, the stimulation is performed in serum free media. In some embodiments, the serum free media is a defined and/or well-defined cell culture media. In certain embodiments, the serum free media is a controlled culture media that has been processed, e.g., filtered to remove inhibitors and/or growth factors. In some embodiments, the serum free media contains proteins. In certain embodiments, the serum-free media may contain serum albumin, hydrolysates, growth factors, hormones, carrier proteins, and/or attachment factors.

In some embodiments, the stimulation is performed in serum free media described herein in Section III or in PCT/US2018/064627. In some embodiments, the serum-free medium comprises a basal medium (e.g. OpTmizer™ T-Cell Expansion Basal Medium (ThermoFisher), supplemented with one or more supplement. In some embodiments, the one or more supplement is serum-free. In some embodiments, the serum-free medium comprises a basal medium supplemented with one or more additional components for the maintenance, expansion, and/or activation of a cell (e.g., a T cell), such as provided by an additional supplement (e.g. OpTmizer™ T-Cell Expansion Supplement (ThermoFisher)). In some embodiments, the serum-free medium further comprises a serum replacement supplement, for example, an immune cell serum replacement, e.g., ThermoFisher, #A2596101, the CTS™ Immune Cell Serum Replacement, or the immune cell serum replacement described in Smith et al. Clin Trans' Immunology. 2015 January; 4(1): e31. In some embodiments, the serum-free medium further comprises a free form of an amino acid such as L-glutamine. In some embodiments, the serum-free medium further comprises a dipeptide form of L-glutamine (e.g., L-alanyl-L-glutamine), such as the dipeptide in Glutamax™ (ThermoFisher). In some embodiments, the serum-free medium further comprises one or more recombinant cytokines, such as recombinant human IL-2, recombinant human IL-7, and/or recombinant human IL-15.

In some embodiments, stimulation, e.g., incubation under stimulatory conditions, is carried out at room temperature (e.g., at or about 23° C.). In some embodiments, stimulation, e.g., incubation under stimulatory conditions, is carried out at or about 37° C.

The methods provided herein allow for collecting or eluting the selected cells from a chromatography column without the addition of a competition agent or free binding agent to elute the cells from the stationary phase. In some embodiments, on-column stimulation effects detachment of selected cells from the column. In some embodiments, for example when the stimulating agents or stimulating reagent including stimulatory agents is not bound, e.g., directly or indirectly, to the stationary phase of the chromatography column, the detached cells may remain bound to the stimulatory agents or stimulatory reagent containing stimulatory agents. Thus, in some embodiments, the detached cell may remain under stimulating conditions after detaching from the column and/or when collected and/or eluted. In some embodiments, the stimulating conditions are maintained for a period of time following removal (e.g., collection or elution) from the column. In some embodiments, at least a portion of the stimulation in the presence of stimulatory agents or a stimulatory reagent including stimulatory agents is carried out in the internal cavity of a centrifugal chamber, for example, under centrifugal rotation, such as described in International Publication Number WO2016/073602.

In some embodiments, the stimulation carried out following collection or elution of the cells from the column is generally carried out under mixing conditions, such as in the presence of spinning, generally at relatively low force or speed, such as speed lower than that used to pellet the cells, such as from or from about 600 rpm to 1700 rpm (e.g. at or about or at least 600 rpm, 1000 rpm, or 1500 rpm or 1700 rpm), such as at an RCF at the sample or wall of the chamber or other container of from or from about 80 g to 100 g (e.g. at or about or at least 80 g, 85 g, 90 g, 95 g, or 100 g). In some embodiments, the spin is carried out using repeated intervals of a spin at such low speed followed by a rest period, such as a spin and/or rest for 1, 2, 3, 4, 5, 6, 7, 8, 9, or 10 seconds, such as a spin at approximately 1 or 2 seconds followed by a rest for approximately 5, 6, 7, or 8 seconds. In some embodiments, the stimulation carried out following collection or elution of the cells from the column is carried out under mixing conditions, such as rocking. In certain embodiments, the stimulation is performed under static conditions, such as conditions that do not involve centrifugation, shaking, rotating, rocking, or perfusion, e.g., continuous or semi-continuous perfusion of the media.

In some embodiments, the eluted and/or collected cells, for example cells still bound to the stimulatory agent or stimulatory reagent including stimulatory agents are transferred (e.g., transferred under sterile conditions) to a container such as a bag or vial, and placed in an incubator. In particular embodiments, incubator is set at, at about, or at least 16° C., 24° C., or 35° C. In some embodiments, the incubator is set at 37° C., at about at 37° C., or at 37° C.±2° C., ±1° C., ±0.5° C., or ±0.1° C. In particular embodiments, the stimulation under static condition is performed in a cell culture bag placed in an incubator. In some embodiments, the stimulation under rocking conditions is performed in a cell culture bag placed in an incubator. In some embodiments, the culture bag is composed of a single-web polyolefin gas permeable film which enables monocytes, if present, to adhere to the bag surface.

1. Use of Stimulatory Agents and Reagents for On-Column Stimulation

In particular aspects, the stimulating conditions include incubating the target cells (e.g., T cells) immobilized on a chromatography matrix (e.g., stationary phase) with one or more stimulatory agents. In some embodiments, the stimulatory agents are comprised in a stimulatory reagent. In some embodiments, the stimulatory agents are bound directly or indirectly to the chromatography matrix (e.g., stationary phase) of the chromatography column. In some embodiments, the stimulatory agents are bound indirectly to the chromatography matrix (e.g., stationary phase) of the chromatography column, for example through a selection reagent as described herein, for example in Section II-A and/or Section I-B or a stimulatory reagent as described herein, for example in Section II-A and/or Section I-C-1b. In some embodiments, the stimulatory agents are comprised in a stimulatory reagent. In some embodiments, the stimulatory reagent is bound to the chromatography matrix (e.g., stationary phase) of the chromatography column. In some embodiments, the stimulatory reagent is covalently bound to the chromatography matrix (e.g., stationary phase). In some embodiments, the stimulatory agent is non-covalently bound to the chromatography matrix (e.g., stationary phase).

In some embodiments, the stimulatory reagent is not bound to or associated with a solid support, stationary phase, a bead, a microparticle, a magnetic particle, and/or a matrix (e.g., chromatography matrix). In some embodiments, the stimulatory reagent is flexible, does not contain a metal or magnetic core, is comprised entirely or primarily of organic multimer, and/or is not rigid. In some embodiments, the stimulatory reagent is soluble. In some embodiments, the stimulatory reagent is an oligomeric stimulatory reagent (see, e.g., Section I-C-1b). In some embodiments, the oligomeric stimulatory reagent is soluble.

In certain embodiments, the initiation of the stimulation occurs when the cells are incubated or contacted with the stimulatory agent. Thus, in some embodiments, where the stimulatory agent is bound directly or indirectly, e.g., through a selection reagent or stimulatory reagent, to the chromatography matrix (e.g., stationary phase) of the column, initiation of the stimulation occurs when the sample comprising the target cells is added to the chromatography matrix (e.g., stationary phase) of the column. In some embodiments, when the stimulatory agents are comprised in a stimulatory reagent not associated (e.g., bound) with a chromatography matrix (e.g., stationary phase), the initiation of the stimulation occurs when the stimulatory reagent (e.g., oligomeric stimulatory reagent) is added to the stationary phase upon which the target cells of the sample are immobilized. In some embodiments, when the stimulatory agent is not bound directly or indirectly to the chromatography matrix (e.g., stationary phase) and is not comprised in a stimulatory reagent (e.g., oligomeric stimulatory reagent), initiation of the stimulation occurs when the stimulatory agent is added to the chromatography matrix (e.g., stationary phase).

In some embodiments, the stimulating conditions or stimulatory reagents (e.g., oligomeric stimulatory reagents) include one or more stimulatory agent, which is capable of activating an intracellular signaling domain of a TCR complex. In some embodiments, the one or more stimulatory agent is capable of activating an intracellular signaling domain of a TCR complex. In some embodiments, a stimulatory agent as contemplated herein can include, but is not limited to, RNA, DNA, proteins (e.g., enzymes), antigens, polyclonal antibodies, monoclonal antibodies, antibody fragments, carbohydrates, lipids lectins, or any other biomolecule with an affinity for a desired target. In some embodiments, the desired target is a T cell receptor and/or a component of a T cell receptor. In certain embodiments, the desired target is CD3. In certain embodiments, the desired target is a T cell costimulatory molecule, e.g., CD28, CD137 (4-1-BB), OX40, or ICOS. In some embodiments, the stimulatory agent is an antibody or antigen binding fragment thereof, such as a Fab.

In some embodiments, the stimulatory reagent (e.g., oligomeric stimulatory reagent) contains one or more stimulatory agents that bind to one or more of the following macromolecules on a cell (e.g., a T cell): CD2, CD3, CD4, CD5, CD8, CD25, CD27, CD28, CD29, CD31, CD44, CD45RA, CD45RO, CD54 (ICAM-1), CD127, MHCI, MHCII, CTLA-4, ICOS, PD-1, OX40, CD27L (CD70), 4-1BB (CD137), 4-1BBL, CD30L, LIGHT, IL-2R, IL-12R, IL-1R, IL-15R; IFN-gammaR, TNF-alphaR, IL-4R, IL-10R, CD18/CD11a (LFA-1), CD62L (L-selectin), CD29/CD49d (VLA-4), Notch ligand (e.g. Delta-like 1/4, Jagged 1/2, etc.), CCR1, CCR2, CCR3, CCR4, CCR5, CCR7, and CXCR3 or fragment thereof including the corresponding ligands to these macromolecules or fragments thereof. In some embodiments, a stimulatory agent specifically binds to one or more of the following macromolecules on a cell (e.g. a T cell): CD28, CD62L, CCR7, CD27, CD127, CD3, CD4, CD8, CD45RA, and/or CD45RO.

In some embodiments, the stimulatory agent is an antibody that binds to and/or recognizes one or more components of a T cell receptor. In particular embodiments, the stimulatory agent is an anti-CD3 antibody. In certain embodiments, the stimulatory agent is an antibody that binds to and/or recognizes a costimulatory molecule. In certain embodiments, the stimulatory agent is an anti-CD28 antibody. In some embodiments, the stimulatory reagent comprises an anti-CD28 antibody and an anti-CD3 antibody (e.g., stimulatory agents). In some embodiments, the stimulatory reagent comprises one or more stimulatory agents. In some embodiments, the stimulatory reagent comprises a first and a second stimulatory agent. In some embodiments, the first stimulatory agent is an anti-CD3 antibody or antigen-binding fragment thereof, for example as described herein, and the second stimulatory agent is an anti-CD28 antibody or antigen-binding fragment thereof, for example as described herein. In some embodiments, the first stimulatory agent is an anti-CD3 Fab, for example as described herein, and the second stimulatory agent is an anti-CD28 Fab, for example as described herein.

In some embodiments, for example when the stimulatory agent is not bound to a stimulatory reagent (e.g., oligomeric stimulatory reagent) or a selection reagent, the stimulatory agent is an antibody, a divalent antibody fragment, a F(ab)$_2$, or a divalent single-chain Fv fragment. In some embodiments, PMA/ionomycin may be used to stimulate the cells.

In some embodiments, the cells, e.g., selected cells of a sample, are stimulated or subjected to stimulation in the presence of a ratio of stimulatory agent to cells at or at about 3:1, 2.5:1, 2:1, 1.5:1, 1.25:1, 1.2:1, 1.1:1, 1:1, 0.9:1, 0.8:1, 0.75:1, 0.67:1, 0.5:1, 0.3:1, or 0.2:1. In particular embodiments, the ratio of stimulatory agent to cells is between 2.5:1 and 0.2:1, between 2:1 and 0.5:1, between 1.5:1 and 0.75:1, between 1.25:1 and 0.8:1, between 1.1:1 and 0.9:1. In particular embodiments, the ratio of stimulatory agent to cells is about 1:1 or is 1:1. In particular embodiments, the ratio of stimulatory reagent to cells is about 0.3:1 or is 0.3:1. In particular embodiments, the ratio of stimulatory reagent to cells is about 0.2:1 or is 0.2:1.

In some embodiments, the cells are stimulated or subjected to stimulation in the presence of, of about, or of at least 0.01 µg, 0.02 µg, 0.03 µg, 0.04 µg, 0.05 µg, 0.1 µg, 0.2 µg, 0.3 µg, 0.4 µg, 0.5 µg, 0.75 µg, 1 µg, 1.2 µg, 1.4 µg, 1.6 µg, 1.8 µg, 2 µg, 3 µg, 4 µg, 5 µg, 6 µg, 7 µg, 8 µg, 9 µg, or 10 µg of the stimulatory reagent per $10^6$ cells. In some embodiments, the cells are stimulated or subjected to stimulation in the presence of or of about 4 µg per $10^6$ cells. In particular embodiments, the cells are stimulated or subjected to stimulation in the presence of or of about 3 µg per $10^6$ cells. In particular embodiments, the cells are stimulated or subjected to stimulation in the presence of or of about 2.5 µg per $10^6$ cells. In particular embodiments, the cells are stimulated or subjected to stimulation in the presence of or of about 2 µg per $10^6$ cells. In particular embodiments, the cells are stimulated or subjected to stimulation in the presence of or of about 1.8 µg per $10^6$ cells. In particular embodiments, the cells are stimulated or subjected to stimulation in the presence of or of about 1.6 µg per $10^6$ cells. In particular embodiments, the cells are stimulated or subjected to stimulation in the presence of or of about 1.4 µg per $10^6$ cells. In particular embodiments, the cells are stimulated or subjected to stimulation in the presence of or of about 1.2 µg per $10^6$ cells. In particular embodiments, the cells are stimulated or subjected to stimulation in the presence of or of about 1 µg per $10^6$ cells. In particular embodiments, the cells are stimulated or subjected to stimulation in the presence of or of about 0.8 µg per $10^6$ cells. In various embodiments, the cells are stimulated or subjected to stimulation in the presence of or of about 0.8 µg per $10^6$ cells.

a. Stimulatory Agents

As described above, in certain aspects, the methods provided herein employ a stimulatory agent. In some embodiments, the agent, as described in Section II-B, is a stimulatory agent. In some embodiments, the stimulatory agent binds to a molecule on the surface of a cell, which binding between the stimulatory agent and the molecule is capable of inducing, delivering, or modulating a stimulatory signal in the cells. In some instances, the cell surface molecule (e.g. receptor) is a signaling molecule. In some such cases, the stimulatory agent is capable of specifically binding to a signaling molecule expressed by one or more target cells (e.g., T cells). In some instances, the stimulatory agent is any agent that is capable of inducing or delivering a stimulatory signal in a cell (e.g., a T cell) upon binding to a cell surface molecule, such as a receptor. In some embodiments, the stimulatory signal can be immunostimulatory, in which case the stimulatory agent is capable of inducing, delivering, or modulating a signal that is involved in or that does stimulate an immune response by the cell (e.g. T cell), e.g., increase immune cell proliferation or expansion, immune cell activation, immune cell differentiation, cytokine secretion, cytotoxic activity or one or more other functional activities of an immune cell. In some embodiments, the stimulatory signal can be inhibitory, in which case the stimulatory agent is capable of inducing, delivering, or modulating a stimulatory signal in the cell (e.g. T cell) that is involved in or that does inhibit an immune response, e.g. inhibits or decreases immune cell proliferation or expansion, immune cell activation, immune cell differentiation, cytokine secretion, cytotoxic activity or one or more other functional activities of an immune cell.

In some embodiments, the stimulatory agent is a first stimulatory agent. In some embodiments, the first stimulatory agent binds to a receptor molecule on the surface of the selected cells of the sample. Thus, in some cases, the first stimulatory agent delivers, induces, or modulates a stimulatory signal. In some aspects, the delivering, inducing, or modulating of a stimulatory signal by the first stimulatory agent effects the stimulation of the cells. Thus, in some cases, the first stimulatory agent delivers a stimulatory signal or provides a primary activation signal to the cells, thereby stimulating and/or activating the cells. In some embodiments, the first stimulatory agent further induces downregulation of a selection marker. As used herein, downregulation may encompass a reduction in expression, e.g., cell surface expression, of a selection marker compared to an earlier time point.

In some embodiments, the target cells (e.g., T cells) comprise TCR/CD3 complexes and costimulatory molecules, such as CD28. In this case, the first stimulatory agent binds to a TCR/CD3 complex, thereby delivering a stimulatory signal (e.g., a primary signal, e.g., primary activation signal) in the T cells, and the second stimulatory agent binds to a costimulatory CD28 molecule. In particular aspects, the first stimulatory agent and/or the second stimulatory agent further induce downregulation of a selection marker (e.g., a selection marker used to immobilize the target cells (e.g., T cells)).

In some embodiments, the first stimulatory agent delivers a TCR/CD3 complex-associated stimulatory signal (e.g., primary signal) in the cells, e.g., T cells. In some embodiments, the first stimulatory agent specifically binds to a molecule containing an immunoreceptor tyrosine-based activation motif or ITAM. In some aspects, the first stimulatory agent specifically binds CD3. In some cases, a first stimulatory agent that specifically binds CD3 may be selected from the group consisting of an anti-CD3-antibody, a divalent antibody fragment of an anti-CD3 antibody, a monovalent antibody fragment of an anti-CD3-antibody, and a proteinaceous CD3 binding molecule with antibody-like binding properties. The divalent antibody fragment may be a F(ab')2-fragment, or a divalent single-chain Fv fragment while the monovalent antibody fragment may be selected from the group consisting of a Fab fragment, an Fv fragment, and a single-chain Fv fragment (scFv). In some cases, a proteinaceous CD3 binding molecule with antibody-like binding properties may be an aptamer, a mutein based on a polypeptide of the lipocalin family, a glubody, a protein based on the ankyrin scaffold, a protein based on the crystalline scaffold, an adnectin, or an avimer.

In some embodiments, an anti-CD3 Fab fragment can be derived from the CD3 binding monoclonal antibody produced by the hybridoma cell line OKT3 (ATCC® CRL-8001™; see also U.S. Pat. No. 4,361,549). The variable domain of the heavy chain and the variable domain of the light chain of the anti-CD3 antibody OKT3 are described in Arakawa et al J. Biochem. 120, 657-662 (1996) and comprise the amino acid sequences set forth in SEQ ID NOs: 31 and 32, respectively. In some embodiments, the anti-CD3 Fab comprises the CDRs of the variable heavy and light chains set forth in SEQ ID NOs: 31 and 32, respectively.

In some embodiments, the stimulatory agent is a second stimulatory agent. In some embodiments, the second stimulatory agent binds to a molecule on the surface of the cells, such as a cell surface molecule, e.g., receptor molecule. In some embodiments, the second stimulatory agent is capable of enhancing, dampening, or modifying a stimulatory signal delivered through the molecule bound by the first stimulatory agent. In some embodiments, the second stimulatory agent delivers, induces, or modulates a stimulatory signal, e.g., a second or an additional stimulatory signal. In some aspects, the second stimulatory agent enhances or potentiates a stimulatory signal induced by the first stimulatory agent. In some embodiments, the second stimulatory agent binds to an accessory molecule and/or can stimulate or induce an accessory or secondary stimulatory signal in the cell. In some aspects, the second stimulatory agent binds to a costimulatory molecule and/or provides a costimulatory signal.

In some embodiments, the stimulatory agent, which can be the second stimulatory agent, binds, e.g. specifically binds, to a second molecule that can be a costimulatory molecule, an accessory molecule, a cytokine receptor, a chemokine receptor, an immune checkpoint molecule, or a member of the TNF family or the TNF receptor family.

In some embodiments, the molecule on the cell, e.g., T cell, may be CD28 and the stimulatory agent (e.g. which can be the second stimulatory agent) specifically binds CD28. In some aspects, the stimulatory agent (e.g. which can be the second stimulatory agent) that specifically binds CD28 may be selected from the group consisting of an anti-CD28-antibody, a divalent antibody fragment of an anti-CD28 antibody, a monovalent antibody fragment of an anti-CD28-antibody, and a proteinaceous CD28 binding molecule with antibody-like binding properties. The divalent antibody fragment may be an F(ab')2-fragment, or a divalent single-chain Fv fragment while the monovalent antibody fragment may be selected from the group consisting of a Fab fragment, an Fv fragment, and a single-chain Fv fragment (scFv). A proteinaceous CD28 binding molecule with antibody-like binding properties may be an aptamer, a mutein based on a polypeptide of the lipocalin family, a glubody, a protein based on the ankyrin scaffold, a protein based on the crystalline scaffold, an adnectin, and an avimer.

In some embodiments, an anti-CD28 Fab fragment can be derived from antibody CD28.3 (deposited as a synthetic single chain Fv construct under GenBank Accession No. AF451974.1; see also Vanhove et al, BLOOD, 15 Jul. 2003, Vol. 102, No. 2, pages 564-570) the variable heavy and light chains of which comprise SEQ ID NO: 33 and 34, respectively. In some embodiments, the anti-CD28 Fab comprises the CDRs of the variable heavy and light chains set forth in SEQ ID NOs: 33 and 34, respectively.

In some embodiments, the molecule on the cell, e.g., T cell, is CD90 and the stimulatory agent (e.g. which can be the second stimulatory agent) specifically binds CD90. In some aspects, the stimulatory agent (e.g. which can be the second stimulatory agent) that specifically binds CD90 may be selected from the group consisting of an anti-CD90-antibody, a divalent antibody fragment of an anti-CD90 antibody, a monovalent antibody fragment of an anti-CD90- antibody, and a proteinaceous CD90 binding molecule with antibody-like binding properties. The antibody or antigen-binding fragment can be derived from any known in the art. See e.g. anti-CD90 antibody G7 (Biolegend, cat. no. 105201).

In some embodiments, the molecule on the cell, e.g., T cell, is CD95 and the stimulatory agent (e.g. which can be the second stimulatory agent) specifically binds CD95. In some aspects, the stimulatory agent (e.g. which can be the second stimulatory agent) that specifically binds CD95 may be selected from the group consisting of an anti-CD95-antibody, a divalent antibody fragment of an anti-CD95 antibody, a monovalent antibody fragment of an anti-CD95-antibody, and a proteinaceous CD95 binding molecule with antibody-like binding properties. The antibody or antigen-binding fragment can be derived from any known in the art. For example, in some aspects, the anti-CD90 antibody can be monoclonal mouse anti-human CD95 CH11 (Upstate Biotechnology, Lake Placid, NY) or can be anti-CD95 mAb 7C11 or anti-APO-1, such as described in Paulsen et al. Cell Death & Differentiation 18.4 (2011): 619-631.

In some embodiments, the molecule on the cell, e.g., T cell or B cell, may be CD137 and the stimulatory agent (e.g. which can be the second stimulatory agent) specifically binds CD137. In some aspects, the stimulatory agent (e.g. which can be the second stimulatory agent) that specifically binds CD137 may be selected from the group consisting of an anti-CD137-antibody, a divalent antibody fragment of an anti-CD137 antibody, a monovalent antibody fragment of an anti-CD137-antibody, and a proteinaceous CD137 binding molecule with antibody-like binding properties. The antibody or antigen-binding fragment can be derived from any known in the art. For example, the anti-CD137 antibody can be LOB12, IgG2a or LOB12.3, IgG1 as described in Taraban et al. Eur J Immunol. 2002 December; 32(12):3617-27. See also e.g. U.S. Pat. Nos. 6,569,997, 6,303,121, Mittler et al. Immunol Res. 2004; 29(1-3):197-208.

In some embodiments, the molecule on the cell, e.g. B cell, may be CD40 and the stimulatory agent, e.g., stimulatory agent, (e.g. which can be the second stimulatory agent, e.g., second stimulatory agent) specifically binds CD40. In some aspects, the stimulatory agent (which can be the second stimulatory agent, e.g., second stimulatory agent) that specifically binds CD40 may be selected from the group consisting of an anti-CD40-antibody, a divalent antibody fragment of an anti-CD40 antibody, a monovalent antibody fragment of an anti-CD40-antibody, and a proteinaceous CD40 binding molecule with antibody-like binding properties.

In some embodiments, the molecule on the cell, e.g., T cell, may be CD40L (CD154) and the stimulatory agent (e.g. which can be the second stimulatory agent) specifically binds CD40L. In some aspects, the stimulatory agent (e.g. which can be the second stimulatory agent) that specifically binds CD40L may be selected from the group consisting of an anti-CD40L-antibody, a divalent antibody fragment of an anti-CD40L antibody, a monovalent antibody fragment of an anti-CD40L-antibody, and a proteinaceous CD40L binding molecule with antibody-like binding properties. The antibody or antigen-binding fragment can be derived from any known in the art. For example, the anti-CD40L antibody can in some aspects be Hu5C8, as described in Blair et al. JEM vol. 191 no. 4 651-660. See also e.g. WO1999061065, US20010026932, U.S. Pat. No. 7,547,438, WO2001056603.

In some embodiments, the molecule on the cell, e.g., T cell, may be inducible T cell Costimulator (ICOS) and the stimulatory agent, (e.g. which can be the second stimulatory agent) specifically binds ICOS. In some aspects, the stimulatory agent (e.g. which can be the second stimulatory agent) that specifically binds ICOS may be selected from the group consisting of an anti-ICOS-antibody, a divalent antibody fragment of an anti-ICOS antibody, a monovalent antibody fragment of an anti-ICOS-antibody, and a proteinaceous ICOS binding molecule with antibody-like binding properties. The antibody or antigen-binding fragment can be derived from any known in the art. See e.g. US20080279851 and Deng et al. Hybrid Hybridomics. 2004 June; 23(3):176-82.

In some embodiments, the molecule on the cell, e.g., T cell, may be Linker for Activation of T cells (LAT) and the stimulatory agent (e.g. which can be the second stimulatory agent) specifically binds LAT. In some aspects, the stimulatory agent (e.g. which can be the second stimulatory agent) that specifically binds LAT may be selected from the group consisting of an anti-LAT-antibody, a divalent antibody fragment of an anti-LAT antibody, a monovalent antibody fragment of an anti-LAT-antibody, and a proteinaceous LAT binding molecule with antibody-like binding properties. The antibody or antigen-binding fragment can be derived from any known in the art.

In some embodiments, the molecule on the cell, e.g., T cell, may be CD27 and the stimulatory agent (e.g. which can be the second stimulatory agent) specifically binds CD27. In some aspects, the stimulatory agent (e.g. which can be the second stimulatory agent) that specifically binds CD27 may be selected from the group consisting of an anti-CD27-antibody, a divalent antibody fragment of an anti-CD27 antibody, a monovalent antibody fragment of an anti-CD27-antibody, and a proteinaceous CD27 binding molecule with antibody-like binding properties. The antibody or antigen-binding fragment can be derived from any known in the art. See e.g. WO2008051424.

In some embodiments, the molecule on the cell, e.g., T cell, may be OX40 and the stimulatory agent (e.g. which can be the second stimulatory agent) specifically binds OX40. In some aspects, the stimulatory agent (e.g. which can be the second stimulatory agent) that specifically binds OX40 may be selected from the group consisting of an anti-OX40-antibody, a divalent antibody fragment of an anti-OX40 antibody, a monovalent antibody fragment of an anti-OX40-antibody, and a proteinaceous OX40 binding molecule with antibody-like binding properties. The antibody or antigen-binding fragment can be derived from any known in the art. See e.g. WO2013038191, Melero et al. Clin Cancer Res. 2013 Mar. 1; 19(5):1044-53.

In some embodiments, the molecule on the cell, e.g., T cell, may be HVEM and the stimulatory agent (e.g. which can be the second stimulatory agent) specifically binds HVEM. In some aspects, the stimulatory agent (e.g. which can be the second stimulatory agent) that specifically binds HVEM may be selected from the group consisting of an anti-HVEM-antibody, a divalent antibody fragment of an anti-HVEM antibody, a monovalent antibody fragment of an anti-HVEM-antibody, and a proteinaceous HVEM binding molecule with antibody-like binding properties. The antibody or antigen-binding fragment can be derived from any known in the art. See e.g. WO2006054961, WO2007001459, Park et al. Cancer Immunol Immunother. 2012 February; 61(2):203-14.

In any of the above examples, the divalent antibody fragment may be a (Fab)2'-fragment, or a divalent single-chain Fv fragment while the monovalent antibody fragment may be selected from the group consisting of a Fab fragment, an Fv fragment, and a single-chain Fv fragment (scFv). In any of the above examples, the proteinaceous binding molecule with antibody-like binding properties may be an aptamer, a mutein based on a polypeptide of the lipocalin family, a glubody, a protein based on the ankyrin scaffold, a protein based on the crystalline scaffold, an adnectin, and an avimer.

In some aspects, the stimulatory agent specifically targets a molecule expressed on the surface of the target cells in which the molecule is a TCR, a chimeric antigen receptor, or a molecule comprising an immunoreceptor tyrosine-based activation motif or ITAM. For example, the molecule expressed on the surface of the target cell is selected from a T cell or B cell antigen receptor complex, a CD3 chain, a CD3 zeta, an antigen-binding portion of a T cell receptor or a B cell receptor, or a chimeric antigen receptor. In some cases, the stimulatory agent targets peptide:MHC class I complexes.

In some embodiments, the stimulatory agent binds to a His-tagged extracellular domain of a molecule expressed on the surface of the target cells. In some cases, the stimulatory agent contains the peptide sequence Trp-Ser-His-Pro-Gln-Phe-Glu-Lys (also called Strep-Tag® II, set forth in SEQ ID NO: 8) conjugated with a nickel charged trisNTA (also called His-STREPPER or His/Strep-Tag®II Adapter). In some embodiments, the molecule expressed on the surface of the target cells that is His-tagged is CD19.

In some embodiments, the stimulatory agent specifically binds to the antibody portion of the recombinant receptor, e.g., CAR. In some cases, the antibody portion of the recombinant receptor includes at least a portion of an immunoglobulin constant region, such as a hinge region, e.g., an IgG4 hinge region, and/or a CH1/CL and/or Fc region. In some embodiments, the constant region or portion is of a human IgG, such as IgG4 or IgG1. In some cases, the reagent is loaded with αIgG that recognizes the IgG4 spacer.

In some embodiments, the desired target is a T cell receptor and/or a component of a T cell receptor. In certain embodiments, the desired target is CD3. In certain embodiment, the desired target is a T cell costimulatory molecule, e.g., CD28, CD137 (4-1-BB), OX40, or ICOS.

In some embodiments, for example when the stimulatory agent is not bound to a stimulatory reagent (e.g., oligomeric stimulatory reagent) or a selection reagent, the stimulatory agent is an antibody, a divalent antibody fragment, a F(ab)$_2$, or a divalent single-chain Fv fragment. In some embodiments, when the stimulatory agent is not bound to the reagent, the stimulatory agent does not include a binding partner C.

b. Oligomeric Stimulatory Reagents

As suggested above, in particular embodiments, the stimulatory reagent contains an oligomeric stimulatory reagent, e.g., a streptavidin mutein reagent, that is conjugated, linked, or attached to one or more stimulatory agents. As described above, in some embodiments, the one or more stimulatory agents have an attached binding domain or binding partner (e.g., a binding partner C) that is capable of binding to the oligomeric stimulatory reagent at particular binding sites (e.g., binding site Z). In some embodiments, a plurality of the stimulatory agent is reversibly bound to the oligomeric stimulatory reagent. In various embodiments, the oligomeric stimulatory reagent has a plurality of the particular binding sites, Z, which, in certain embodiments, are reversibly bound to a plurality of stimulatory agents at the binding domain (e.g., binding partner C). In some embodiments, the amount of bound agents are reduced or decreased in the presence of a competition agent, e.g., an agent that is also capable of binding to the particular binding sites (e.g., binding site Z).

In some embodiments, the oligomeric stimulatory reagent is or includes a reversible system in which at least one stimulatory agent (e.g., a stimulatory agent that is capable of producing a signal in a cell such as a T cell) is associated, e.g., reversibly associated, with the oligomeric stimulatory reagent. Non-limiting examples of oligomeric stimulatory reagents may be found, for example, in International published PCT Appl. No. WO 2018/197949, the contents of which are incorporated herein by reference in their entirety. In some embodiments, the reagent contains a plurality of binding sites capable of binding, e.g., reversibly binding, to the stimulatory agent. In some cases, the reagent is an oligomeric stimulatory reagent having at least one attached agent capable of producing a signal (e.g., stimulatory signal) in a cell such as a T cell. In some embodiments, the stimulatory agent contains at least one binding site, e.g., a binding site B, that can specifically bind an epitope or region of a molecule (e.g., cell surface molecule or receptor) and also contains a binding partner, also referred to herein as a binding partner C, that specifically binds to at least one binding site of the oligomeric stimulatory reagent, e.g., binding site Z of the reagent. In some embodiments, the binding interaction between the binding partner C and the at least one binding site Z is a non-covalent interaction. In some cases, the binding interaction between the binding partner C and the at least one binding site Z is a covalent interaction. In some embodiments, the binding interaction, such as non-covalent interaction, between the binding partner C and the at least one binding site Z is reversible.

Substances that may be used as oligomeric stimulatory reagents in such reversible systems are known, see e.g., U.S. Pat. Nos. 5,168,049; 5,506,121; 6,103,493; 7,776,562; 7,981,632; 8,298,782; 8,735,540; 9,023,604; and International published PCT Appl. Nos. WO2013/124474 and WO2014/076277. Non-limiting examples of reagents and binding partners capable of forming a reversible interaction, as well as substances (e.g. competition agents) capable of reversing such binding, are described below.

In some embodiments, the oligomeric stimulatory reagent is an oligomer of streptavidin, streptavidin mutein or analog, avidin, an avidin mutein or analog (such as neutravidin) or a mixture thereof, in which such oligomeric stimulatory reagent contains one or more binding sites for reversible association with the binding domain of the stimulatory agent (e.g., a binding partner C). In some embodiments, the binding domain of the stimulatory agent can be a biotin, a biotin derivative or analog, or a streptavidin-binding peptide or other molecule that is able to specifically bind to streptavidin, a streptavidin mutein or analog, avidin or an avidin mutein or analog.

In certain embodiments, one or more stimulatory agents (e.g., agents that are capable of producing a signal in a cell such as a T cell, for example as described in Section I-C-1a above) associate with, such as are reversibly bound to, the oligomeric stimulatory reagent, such as via the plurality of the particular binding sites (e.g., binding sites Z) present on the oligomeric stimulatory reagent. In some cases, this results in the stimulatory agents being closely arranged to each other such that an avidity effect can take place if a target cell having (at least two copies of) a cell surface molecule that is bound by or recognized by the stimulatory agent is brought into contact with the agent.

In some embodiments, the oligomeric stimulatory reagent is a streptavidin oligomer, a streptavidin mutein oligomer, a streptavidin analog oligomer, an avidin oligomer, an oligomer composed of avidin mutein or avidin analog (such as neutravidin) or a mixture thereof. In particular embodiments, the oligomeric stimulatory reagents contain particular binding sites that are capable of binding to a binding domain (e.g., the binding partner C) of a stimulatory agent. In some embodiments, the binding domain can be a biotin, a biotin derivative or analog, or a streptavidin-binding peptide or other molecule that is able to specifically bind to streptavidin, a streptavidin mutein or analog, avidin or an avidin mutein or analog. Examples of streptavidin, a streptavidin mutein, a streptavidin analog, an avidin, an avidin mutein or avidin analog (such as neutravidin) and binding domain molecules, e.g., biotin, a biotin derivative or analog, or a streptavidin-binding peptide or other molecule that is able to specifically bind to streptavidin, a streptavidin mutein or analog, avidin or an avidin mutein or analog, contemplated as comprising the oligomeric stimulatory reagent system are described in Section II-A below. The methods provided herein further contemplate that the oligomeric stimulatory reagent may comprise a molecule capable of binding to an oligohistidine affinity tag, a glutathione-S-transferase, calmodulin or an analog thereof, calmodulin binding peptide (CBP), a FLAG-peptide, an HA-tag, maltose binding protein (MBP), an HSV epitope, a myc epitope, and/or a biotinylated carrier protein (see Section II-A).

In particular embodiments provided herein, is an oligomeric stimulatory reagent that is composed of and/or contains a plurality of streptavidin or streptavidin mutein tetramers. In certain embodiments, the oligomeric stimulatory reagent provided herein contains a plurality of binding sites that reversibly bind or are capable of reversibly binding to one or more stimulatory agents. In some embodiments, the oligomeric stimulatory reagent has a radius, e.g., an average radius, of between 70 nm and 125 nm, inclusive; a molecular weight of between $1 \times 10^7$ g/mol and $1 \times 10^9$ g/mol, inclusive; and/or between 1,000 and 5,000 streptavidin or streptavidin mutein tetramers, inclusive. In some embodiments, the oligomeric stimulatory reagent is bound, e.g., reversibly bound, to one or more stimulatory agents such as an agent that binds to a molecule, e.g. receptor, on the surface of a cell. In certain embodiments, the one or more stimulatory agents are agents described herein, e.g., in Section I-C-1a. In some embodiments, the one or more stimulatory agent contains a monovalent binding site (e.g., binding site B). In some embodiments, the monovalent binding site binds to CD3. In some embodiments, the monovalent binding site binds to costimulatory molecule, for example as described herein. In some embodiments, the monovalent binding site binds to CD28. In some embodiments, the one or more stimulatory agents contain a monovalent binding site capable of binding to CD3 and/or CD28. In some embodiments, the stimulatory agent is an anti-CD3 and/or an anti-CD28 antibody or antigen binding fragment thereof, such as an antibody or antigen-binding fragment thereof that contains a binding partner, C, e.g., a streptavidin binding peptide, e.g. Strep-Tag® II. In particular embodiments, the one or more stimulatory agents is an anti-CD3 and/or an anti-CD28 Fab containing a binding partner, e.g., a streptavidin binding peptide, e.g. Strep-Tag® II. In particular embodiments, the one or more agents comprise a streptavidin-based oligomer, such as a streptavidin mutein oligomer conjugated to Strep-tagged anti-CD3 and Strep-tagged anti-CD28 Fabs. In some embodiments, the oligomeric stimulatory reagent is any as described in WO2015/158868 or WO2018/197949.

In some embodiments, provided herein is an oligomeric stimulatory reagent that is composed of and/or contains a plurality of streptavidin or streptavidin mutein tetramers. In certain embodiments, the oligomeric stimulatory reagent provided herein contains a plurality of binding sites that reversibly bind or are capable of reversibly binding to one or more stimulatory agents. In some embodiments, the oligomeric particle has a radius, e.g., an average radius, of between 80 nm and 120 nm, inclusive; a molecular weight, e.g., an average molecular weight of between $7.5 \times 10^6$ g/mol and $2 \times 10^8$ g/mol, inclusive; and/or an amount, e.g., an average amount, of between 500 and 10,000 streptavidin or streptavidin mutein tetramers, inclusive. In some embodiments, the oligomeric stimulatory reagent is bound, e.g., reversibly bound, to one or more stimulatory agents, such as an agent that binds to a molecule, e.g. receptor, on the surface of a cell. In certain embodiments, the one or more stimulatory agents are agents described herein, e.g., in Section I-B-2-a. In some embodiments, the stimulatory agent is an anti-CD3 and/or an anti-CD28 antibody or antigen binding fragment thereof, such as an antibody or antigen fragment thereof that contains a binding partner, C, e.g., a streptavidin binding peptide, e.g. Strep-Tag® II. In particular embodiments, the one or more agents is an anti-CD3 and/or an anti CD28 Fab containing a binding partner, e.g., a streptavidin binding peptide, e.g. Twin-Strep-tag (e.g., SEQ ID NO:16).

In some embodiments, the cells are stimulated or subjected to stimulation in the presence of, of about, or of at least 0.01 µg, 0.02 µg, 0.03 µg, 0.04 µg, 0.05 µg, 0.1 µg, 0.2 µg, 0.3 µg, 0.4 µg, 0.5 µg, 0.75 µg, 1 µg, 1.2 µg, 1.4 µg, 1.6 µg, 1.8 µg, 2 µg, 2.2 µg, 2.4 µg, 2.6 µg, 2.8 µg, 3 µg, 4 µg, 5 µg, 6 µg, 7 µg, 8 µg, 9 µg, or 10 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 4 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 3 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 2.75 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 2.5 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 2.25 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about 2 µg of the oligomeric stimulatory reagent (e.g., the streptavidin-based oligomer, such as a such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 1.8 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 1.6 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 1.4 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 1.2 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 1 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In particular embodiments, the cells are stimulated or subjected to stimulation in the presence of or of about 0.8 µg of the oligomeric stimulatory reagent (e.g., the streptavidin-based oligomer, such as a streptavidin mutein oligomer, conjugated to Strep-tagged anti-CD3 and Strep-tagged anti-CD28 Fabs) per $10^6$ cells. In some embodiments, the cells are stimulated or subjected to stimulation in the presence of or of about $10 \times 10^8$, $9 \times 10^8$, $8 \times 10^8$, $7 \times 10^8$, $6 \times 10^8$, $5 \times 10^8$, $4 \times 10^8$, $3 \times 10^8$, $2 \times 10^8$, $1 \times 10^8$ oligomeric stimulatory reagents. In some embodiments, the cells are stimulated or subjected to stimulation in the presence of or of about $7 \times 10^8$, $6 \times 10^8$, $5 \times 10^8$, $4 \times 10^8$, $3 \times 10^8$ oligomeric stimulatory reagents. In some embodiments, the cells are stimulated or subjected to stimulation in the presence of or of about $7 \times 10^8$ to $3 \times 10^8$ oligomeric stimulatory reagents. In some embodiments, the cells are stimulated or subjected to stimulation in the presence of or of about $6 \times 10^8$ to $4 \times 10^8$ oligomeric stimulatory reagents. In some embodiments, the cells are stimulated or subjected to stimulation in the presence of or of about $6 \times 10^8$ to $5 \times 10^8$ oligomeric stimulatory reagents. In some embodiments, the cells are stimulated or subjected to stimulation in the presence of or of about $5 \times 10^8$ oligomeric stimulatory reagents.

In some embodiments, the cells, e.g., selected cells of a sample, are stimulated or subjected to stimulation in the presence of a ratio of oligomeric stimulatory reagent to cells at or at about 3:1, 2.5:1, 2:1, 1.5:1, 1.25:1, 1.2:1, 1.1:1, 1:1, 0.9:1, 0.8:1, 0.75:1, 0.67:1, 0.5:1, 0.3:1, or 0.2:1. In particular embodiments, the ratio of oligomeric stimulatory reagent to cells is between 2.5:1 and 0.2:1, between 2:1 and 0.5:1, between 1.5:1 and 0.75:1, between 1.25:1 and 0.8:1, between 1.1:1 and 0.9:1. In particular embodiments, the ratio of oligomeric stimulatory reagent to cells is about 1:1 or is 1:1. In particular embodiments, the ratio of oligomeric stimulatory reagent to cells is about 0.3:1 or is 0.3:1. In particular embodiments, the ratio of oligomeric stimulatory reagent to cells is about 0.2:1 or is 0.2:1.

In certain aspects, within the oligomeric stimulatory reagent, the mass ratio between the oligomeric particles and the attached agents is about 3:1. In certain aspects, within the oligomeric stimulatory reagent, the mass ratio among the oligomeric particles, the attached anti-CD3 Fabs, and the attached anti-CD28 Fabs is about 3:0.5:0.5. In certain aspects, 4 µg of the oligomeric stimulatory reagent is or includes 3 µg of oligomeric particles and 1 µg of attached agents, e.g., 0.5 µg of anti-CD3 Fabs and 0.5 µg of anti-CD28 Fabs. In other examples, 1.2 µg of the oligomeric stimulatory reagent per $10^6$ cells is or includes 0.9 µg of oligomeric particles and 0.3 µg of attached agents, e.g., 0.15 µg of anti-CD3 Fabs and 0.15 µg of anti-CD28 Fabs, per $10^6$ cells. In some embodiments, the oligomeric stimulatory reagent is added to a serum-free medium and the stimulation is performed in the serum free medium, e.g., as described herein in Section III or in PCT/US2018/064627.

In some embodiments, the serum-free medium comprises a basal medium (e.g. OpTmizer™ T-Cell Expansion Basal Medium (ThermoFisher), supplemented with one or more supplement. In some embodiments, the one or more supplement is serum-free. In some embodiments, the serum-free medium comprises a basal medium supplemented with one or more additional components for the maintenance, expansion, and/or activation of a cell (e.g., a T cell), such as provided by an additional supplement (e.g. OpTmizer™ T-Cell Expansion Supplement (ThermoFisher)). In some embodiments, the serum-free medium further comprises a serum replacement supplement, for example, an immune cell serum replacement, e.g., ThermoFisher, #A2596101, the CTS™ Immune Cell Serum Replacement, or the immune cell serum replacement described in Smith et al. *Clin Transl Immunology.* 2015 January; 4(1): e31. In some embodiments, the serum-free medium further comprises a free form of an amino acid such as L-glutamine. In some embodiments, the serum-free medium further comprises a dipeptide form of L-glutamine (e.g., L-alanyl-L-glutamine), such as the dipeptide in Glutamax™ (ThermoFisher). In some embodiments, the serum-free medium further comprises one or more recombinant cytokines, such as recombinant human IL-2, recombinant human IL-7, and/or recombinant human IL-15.

D. Elution

In aspects of the methods provided herein, elution of cells, e.g., target cells (e.g., T cells) following incubation with a stimulatory agent from the chromatography column is accomplished without the use of a competition agent or free binding agent as described herein. In some embodiments, during incubation with the stimulatory agent, cells immobilized via the selection agent on the chromatography matrix (e.g., stationary phase) spontaneously detach from the selection agent. In some embodiments, spontaneous detachment occurs within one day from the start of the incubation with a stimulatory agent. In some embodiments, spontaneous detachment occurs within 24, 23, 22, 21, 20, 19, 18, 17, 16, 15, 14, 13, 12, 11, 10, 9, 8, 7, 6, 5, 4, 3, or 2 hours from the start of the incubation with a stimulatory agent. In some embodiments, spontaneous detachment occurs within about 2 to 24, 3 to 24, 4 to 24, 5, to 24, 6 to 24, 7 to 24, 8 to 24, 9 to 24, 10 to 24, 11 to 24, 12 to 24, 13 to 24, 14 to 24, 15 to 24, 16 to 24, 17 to 24, 18 to 24, 19 to 24, 20 to 24, 21 to 24, 22 to 24, 23 to 24, 2 to 23, 2 to 22, 2 to 21, 2 to 20, 2 to 19, 2 to 18, 2 to 17, 2 to 16, 2 to 15, 2 to 14, 2 to 13, 2 to 12, 2 to 11, 2 to 10, 2 to 9, 2 to 8, 2 to 7, 2 to 6, 2 to 5, 2 to 4, or 2 to 3 hours following the start of incubation with the stimulatory agent. In some embodiments, detachment from the column occurs within or within about 4 to 5 hours, e.g., 4.5 hours following the start of incubation with the stimulatory agent. In some embodiments, the majority of the plurality of target cells (e.g., T cells) immobilized via the selection agent on the chromatography matrix (e.g., stationary phase) detach in less than one day from the start of the incubation with a stimulatory agent. In some embodiments, the majority of the plurality of target cells (e.g., T cells) immobilized via the selection agent on the chromatography matrix (e.g., stationary phase) detach in less than 24 hours from the start of the incubation with a stimulatory agent. In some embodiments, the majority of the plurality of target cells (e.g., T cells) immobilized via the selection agent on the chromatography matrix (e.g., stationary phase) detach in less than 12 hours from the start of the incubation with a stimulatory agent. In some embodiments, the majority of the plurality of target cells (e.g., T cells) immobilized via the selection agent on the chromatography matrix (e.g., stationary phase) detach in less than 5 hours from the start of the incubation with a stimulatory agent. In some embodiments, the majority of the plurality of target cells (e.g., T cells) immobilized via the selection agent on the chromatography matrix (e.g., stationary phase) detach in less than 4 hours from the start of the incubation with a stimulatory agent. In some embodiments, the majority of the plurality of target cells (e.g., T cells) immobilized via the selection agent on the chromatography matrix (e.g., stationary phase) detach in less than 2 hours from the start of the incubation with a stimulatory agent.

In some embodiments, the spontaneously detached cells are eluted and/or collected via gravity flow from the chromatography column. In some embodiments, the spontaneously detached cells are eluted from the chromatography column using a wash step. In some embodiments, at least one wash step is performed at, at about, or at least 2, 3, 4, 5, 6, 7, 8, 9, 10, 11, 12, 13, 14, 15, 16, 17, 18, 19, 20, 21, 22, 23, or 24 hours after initiation of the incubation with the stimulatory agent or stimulatory reagent containing stimulatory agents. In some embodiments, one or more wash steps are performed at, at about, or at least 2, 3, 4, 5, 6, 7, 8, 9, 10, 11, 12, 13, 14, 15, 16, 17, 18, 19, 20, 21, 22, 23, or 24 hours after initiation of the incubation with the stimulatory agent or stimulatory reagent containing stimulatory agents. In some embodiments, one or more wash steps are performed within about 2 to 24, 3 to 24, 4 to 24, 5, to 24, 6 to 24, 7 to 24, 8 to 24, 9 to 24, 10 to 24, 11 to 24, 12 to 24, 13 to 24, 14 to 24, 15 to 24, 16 to 24, 17 to 24, 18 to 24, 19 to 24, 20 to 24, 21 to 24, 22 to 24, 23 to 24, 2 to 23, 2 to 22, 2 to 21, 2 to 20, 2 to 19, 2 to 18, 2 to 17, 2 to 16, 2 to 15, 2 to 14, 2 to 13, 2 to 12, 2 to 11, 2 to 10, 2 to 9, 2 to 8, 2 to 7, 2 to 6, 2 to 5, 2 to 4, or 2 to 3 hours following the start of incubation with the stimulatory agents or stimulatory reagent including stimulatory agents.

In some embodiments, the eluting and/or collecting step following the selection and on-column stimulation steps is performed within or within about 2 days after the sample is added to the chromatography column (e.g., stationary phase), for example as described in Section I-A. In some embodiments, the eluting and/or collecting step following the selection and on-column stimulation steps is performed within or within about 1 to 2 days after the sample is added to the chromatography column (e.g., stationary phase), for example as described in Section I-A. In some embodiments, the eluting and/or collecting step following the selection and on-column stimulation steps is performed within or within about 1 day after the sample is added to the chromatography column (e.g., stationary phase), for example as described in Section I-A. In some embodiments, the eluting and/or collecting step following the selection and on-column stimulation steps is performed less than 1 day after the sample is added to the chromatography column (e.g., stationary phase), for example as described in Section I-A. In some embodiments, the eluting and/or collecting step following the selection and on-column stimulation steps is performed within or within about 48, 36, 24, 12, 6, 4, or 2 hours, inclusive, after the sample is added to the chromatography column (e.g., stationary phase), for example as described in Section I-A. In some embodiments, the collecting or eluting step following the selection and on-column stimulation steps is performed within or within about 2 to 48, 2 to 36, 2 to 24, 2 to 12, 2 to 6, 2 to 4, 4 to 48, 4 to 36, 4 to 24, 4 to 12, 4 to 6, 6 to 48, 6 to 36, 6 to 24, 6 to 12, 12 to 48, 12 to 36, 12 to 24, 24 to 48, 24 to 36, or 36 to 48 hours after the sample is added to the chromatography column (e.g., stationary phase). In some embodiments, the process duration, including steps from selection and on-column stimulation to elution or collecting, is less than 48, 36, 24, 12, 6, 4, or 2 hours. In some embodiments, the process duration, including steps from selection and on-column stimulation to elution or collecting, is less than 36 hours. In some embodiments, the process duration, including steps from selection and on-column stimulation to elution or collecting, is less than 24 hours. In some embodiments, the process duration, including steps from selection and on-column stimulation to elution or collecting, is less than 12 hours. In some embodiments, the process duration, including steps from selection and on-column stimulation to elution or collecting, is, is about, or is less than 7 hours. In some embodiments, the process duration, including steps from selection and on-column stimulation to elution or collecting, is, is about, or is less than 6.5 hours. In some embodiments, the process duration, including steps from selection and on-column stimulation to elution or collecting, is, is about, or is less than 6 hours. In some embodiments, the process duration, including steps from selection and on-column stimulation to elution or collecting, is, is about, or is less than 5.5 hours. In some embodiments, the process duration, including steps from selection and on-column stimulation to elution or collecting, is, is about, or is less than 5 hours. In some embodiments, the process duration, including steps from selection and on-column stimulation to elution or collecting, is, is about, or is less than 4.5 hours. In some embodiments, the process duration, including steps from selection and on-column stimulation to elution or collecting, is, is about, or is less than 4 hours.

In some embodiments, the wash media is a culture media. Thus, in some embodiments, the eluted cells can proceed directly to downstream processing (e.g., subsequent selections steps, stimulating steps, incubating steps, genetic engineering). In some embodiments, the wash media comprises serum free basal media containing glutamine and recombinant IL-2, IL-15, and IL-7. In some embodiments, the wash media comprises serum free basal media containing glutamine and lacking one or more of recombinant IL-2, IL-15, and IL-7. In some embodiments, the wash media comprises serum free basal media lacking glutamine and one or more of recombinant IL-2, IL-15, and IL-7.

In some embodiments, the eluate comprises stimulatory reagent (e.g., oligomeric stimulatory reagent). In some embodiments, the collected cells are still bound to the stimulatory agents (e.g., stimulatory agents bound to the oligomeric stimulatory reagent). In some embodiments, the stimulatory agents contained in the eluate are bound to the eluted cell and the stimulatory reagent (e.g., oligomeric stimulatory reagent). As such, the collected and/or eluted cells may still be considered under stimulating conditions. In some embodiments, the detached and eluted cells are under stimulating conditions (e.g., still being stimulated). In some embodiments, the eluted cells may continue under stimulating conditions, for example as described in Section I-C.

In some embodiments, the column and collection containers are connected in a closed system. In some embodiments, the closed system is sterile. In some embodiments, the selection, stimulation, and elution steps are performed by an automated system with minimal or no manual, such as human, operation or interference.

E. Genetic Engineering

In some embodiments, the provided methods include genetically engineering the cells (e.g., an output composition of selected and stimulated cells), e.g., introducing a heterologous or recombinant polynucleotide encoding a recombinant protein. Such recombinant proteins may include recombinant receptors, such as any described in Section IV. Introduction of the polynucleotides, e.g., heterologous or recombinant polynucleotides, encoding the recombinant protein into the cell may be carried out using any of a number of known vectors. Such vectors include viral, including lentiviral and gammaretroviral, systems. Exemplary methods include those for transfer of heterologous polynucleotides encoding the receptors, including via viral, e.g., retroviral or lentiviral, transduction. In some embodiments, a population of stimulated cells (e.g., output composition of selected and stimulated cells) is genetically engineered, such as to introduce a heterologous or recombinant polynucleotide encoding a recombinant receptor, thereby generating a population of transformed cells (also referred to herein as a transformed population of cells).

In particular embodiments, the cells (e.g., T cells, CD3+, CD4+, CD8+ T cells) are genetically engineered, transformed, or transduced after the cells have undergone on-column stimulation, such as by any of the methods provided herein, e.g., in Section I-C. In particular embodiments, the one or more stimulated populations have been previously cryoprotected and stored, and are thawed prior to genetically engineering, transforming, transfecting, or transducing the cells.

In particular embodiments, the cells (e.g., T cells, CD3+, CD4+, CD8+ T cells) are genetically engineered, transformed, or transduced after the cells are stimulated or subjected to stimulation or cultured under stimulatory conditions (e.g., on-column stimulation). In particular embodiments, the cells are genetically engineered, transformed, or transduced at, at about, or within 72 hours, 60 hours, 48 hours, 36 hours, 24 hours, 12 hours, 5 hours, 4 hours, or 2 hours, inclusive, from the initiation of the stimulation. In some embodiments, the cells are genetically engineered at or at about 2, 3, 4, 5, or 6 hours from the initiation of on-column stimulation. In some embodiments, the cells are genetically engineered at or at about 4 to 5 hours from the initiation of on-column stimulation. In some embodiments, the cells are still under stimulating conditions during genetic engineering. In certain embodiments, the cells are genetically engineered, transformed, or transduced between or between about 2 hours and 6 hours or 6 hours and 12 hours, after the initiation of the stimulation. In certain embodiments, the cells are genetically engineered, transformed, or transduced between or between about 12 hours and 48 hours, 16 hours and 36 hours, or 18 hours and 30 hours after the initiation of the stimulation. In particular embodiments, the cells are genetically engineered, transformed, or transduced between or between about 18 hours and 30 hours after the initiation of the stimulation. In particular embodiments, the cells are genetically engineered, transformed, or transduced at or at about 22 hours or 24 hours after the initiation of the stimulation. In particular embodiments, the cells are genetically engineered, transformed, or transduced at or at about 6 hours or 12 hours after the initiation of the stimulation. In particular embodiments, the cells are genetically engineered, transformed, or transduced at or at about 4 hours or 5 hours after the initiation of the stimulation. In particular embodiments, the cells are genetically engineered, transformed, or transduced at or at about 2 hours or 3 hours after the initiation of the stimulation.

In certain embodiments, methods for genetic engineering are carried out by contacting or introducing one or more cells of a population (e.g., output composition of selected and stimulated cells) with a nucleic acid molecule or polynucleotide encoding the recombinant protein, e.g. a recombinant receptor. In certain embodiments, the nucleic acid molecule or polynucleotide is heterologous to the cells. In particular embodiments, heterologous nucleic acid molecule or heterologous polynucleotide is not native to the cells. In certain embodiments, the heterologous nucleic acid molecule or heterologous polynucleotide encodes a protein, e.g., a recombinant protein, that is not natively expressed by the cell. In particular embodiments, the heterologous nucleic acid molecule or polynucleotide is or contains a nucleic acid sequence that is not found in the cell prior to the contact or introduction.

In some embodiments, the cells, e.g., output composition, are engineered, e.g., transduced or in the presence of a transduction adjuvant. Exemplary transduction adjuvants include, but are not limited to, polycations, fibronectin or fibronectin-derived fragments or variants, and RetroNectin. In certain embodiments, the cells are engineered in the presence of polycations, fibronectin or fibronectin-derived fragments or variants, and/or RetroNectin. In particular embodiments, the cells are engineered in the presence of a polycation that is polybrene, DEAE-dextran, protamine sulfate, poly-L-lysine, or a cationic liposome. In particular embodiments, the cells are engineered in the presence of protamine sulfate.

In some embodiments, the genetic engineering, e.g., transduction, is carried out in serum free media, e.g., as described herein in Section III or in PCT/US2018/064627. In some embodiments, the serum free media is a defined or well-defined cell culture media. In certain embodiments, the serum free media is a controlled culture media that has been processed, e.g., filtered to remove inhibitors and/or growth factors. In some embodiments, the serum free media contains proteins. In certain embodiments, the serum-free media may contain serum albumin, hydrolysates, growth factors, hormones, carrier proteins, and/or attachment factors. In some embodiments, the media comprises glutamine.

In particular embodiments, the cells are engineered in the presence of one or more cytokines. In certain embodiments, the one or more cytokines are recombinant cytokines. In particular embodiments, the one or more cytokines are human recombinant cytokines. In certain embodiments, the one or more cytokines bind to and/or are capable of binding to receptors that are expressed by and/or are endogenous to T cells. In particular embodiments, the one or more cytokines is or includes a member of the 4-alpha-helix bundle family of cytokines. In some embodiments, members of the 4-alpha-helix bundle family of cytokines include, but are not limited to, interleukin-2 (IL-2), interleukin-4 (IL-4), interleukin-7 (IL-7), interleukin-9 (IL-9), interleukin 12 (IL-12), interleukin 15 (IL-15), granulocyte colony-stimulating factor (G-CSF), and granulocyte-macrophage colony-stimulating factor (GM-CSF). In some embodiments, the one or more cytokines is or includes IL-15. In particular embodiments, the one or more cytokines is or includes IL-7. In particular embodiments, the one or more cytokines is or includes recombinant IL-2.

In particular embodiments, cells, e.g., stimulated cells are engineered under stimulating conditions in the presence of IL-2, IL-7, and/or IL-15. In certain embodiments, the IL-2, IL-7, and/or IL-15 are recombinant. In certain embodiments, the IL-2, IL-7, and/or IL-15 are human. In particular embodiments, the one or more cytokines are or include human recombinant IL-2, IL-7, and/or IL-15. In certain embodiments, the cells are engineered, e.g., transduced or under stimulating conditions in the presence of recombinant IL-2, IL-7, and IL-15.

In some embodiments, the cells are genetically engineered, transformed, or transduced in the presence of the same or similar media as was present during the stimulation. In some embodiments, the cells are genetically engineered, transformed, or transduced in media having the same cytokines as the media present during stimulation. In certain embodiments, the cells are genetically engineered, transformed, or transduced, in media having the same cytokines at the same concentrations as the media present during stimulation.

1. Transduction

In some embodiments, genetically engineering the cells (e.g., output composition) is or includes introducing the polynucleotide, e.g., the heterologous or recombinant polynucleotide, into the cells by transduction. In some embodiments, the cells are transduced or subjected to transduction with a viral vector. In particular embodiments, the cells are transduced or subjected to transduction with a viral vector. In some embodiments, the virus is a retroviral vector, such as a gammaretroviral vector or a lentiviral vector. Methods of lentiviral transduction are known. Exemplary methods are described in, e.g., Wang et al. (2012) J. Immunother. 35(9): 689-701; Cooper et al. (2003) Blood. 101:1637-1644; Verhoeyen et al. (2009) Methods Mol Biol. 506: 97-114; and Cavalieri et al. (2003) Blood. 102(2): 497-505.

In some embodiments, the transduction is carried out by contacting one or more cells of a population (e.g., output composition) with a nucleic acid molecule encoding the recombinant protein, e.g. recombinant receptor. In some embodiments, the contacting can be effected with centrifugation, such as spinoculation (e.g. centrifugal inoculation). Such methods include any of those as described in International Publication Number WO2016/073602. Exemplary centrifugal chambers include those produced and sold by Biosafe SA, including those for use with the Sepax® and Sepax® 2 system, including an A-200/F and A-200 centrifugal chambers and various kits for use with such systems. Exemplary chambers, systems, and processing instrumentation and cabinets are described, for example, in U.S. Pat. Nos. 6,123,655, 6,733,433 and Published U.S. Patent Application, Publication No.: US 2008/0171951, and published international patent application, publication no. WO 00/38762, the contents of each of which are incorporated herein by reference in their entirety. Exemplary kits for use with such systems include, but are not limited to, single-use kits sold by BioSafe SA under product names CS-430.1, CS-490.1, CS-600.1 or CS-900.2.

In some embodiments, the provided methods are used in connection with transducing a viral vector containing a polynucleotide encoding a recombinant receptor into, into about, or into less than $300 \times 10^6$ cells, e.g., viable T cells of a stimulated cell population. In certain embodiments, at or about $100 \times 10^6$ cells, e.g., viable T cells of a stimulated cell population are transduced or subjected to transduction. In some embodiments, $1 \times 10^6$ cells per mL e.g., viable T cells of a stimulated cell population are transduced or subjected to transduction. In some embodiments, the viral vector dose is or is about 10, 9, 8, 7, 6, 5, 4, 3, 2, or 1 µL per $1 \times 10^6$ cells. In some embodiments, the viral vector dose is between or is between about 6 to 4 µL per $1 \times 10^6$ cells. In some embodiments, the viral vector dose is or is about 5 µL per $1 \times 10^6$ cells.

In some embodiments, the transduction is performed in serum free media. In some embodiments, the transduction is performed in the presence of IL-2, IL-7, and IL-15. In some embodiments, the viral vector for transduction is frozen and thawed prior to use, and the thawed viral vector is diluted with serum free media. In some embodiments, the serum free media for diluting the viral vector and for transduction are as described herein in Section III or in PCT/US2018/064627.

In some embodiments, the serum-free medium comprises a basal medium (e.g. OpTmizer™ T-Cell Expansion Basal Medium (ThermoFisher), supplemented with one or more supplement. In some embodiments, the one or more supplement is serum-free. In some embodiments, the serum-free medium comprises a basal medium supplemented with one or more additional components for the maintenance, expansion, and/or activation of a cell (e.g., a T cell), such as provided by an additional supplement (e.g. OpTmizer™ T-Cell Expansion Supplement (ThermoFisher)). In some embodiments, the serum-free medium further comprises a serum replacement supplement, for example, an immune cell serum replacement, e.g., ThermoFisher, #A2596101, the CTS™ Immune Cell Serum Replacement, or the immune cell serum replacement described in Smith et al. *Clin Transl Immunology*. 2015 January; 4(1): e31. In some embodiments, the serum-free medium further comprises a free form of an amino acid such as L-glutamine. In some embodiments, the serum-free medium further comprises a dipeptide form of L-glutamine (e.g., L-alanyl-L-glutamine), such as the dipeptide in Glutamax™ (ThermoFisher). In some embodiments, the serum-free medium further comprises one or more recombinant cytokines, such as recombinant human IL-2, recombinant human IL-7, and/or recombinant human IL-15.

In particular embodiments, the cells, e.g., the cells of the stimulated cell population (e.g., output composition) contain at least 80%, at least 85%, at least 90%, or at least 95% cells that are CD4+ T cells or CD8+ T cells. In some embodiments, the transduction, including post-transduction incubation, is performed for between 24 and 48 hours, between 36 and 12 hours, between 18 and 30 hours, or for about 24 hours. In some embodiments, the transduction, including post-transduction incubation, is performed for or for about 72 hours±6 hours. In some embodiments, the transduction is performed for or for about 0.5, 1, 1.5, 2, 2.5, 3, 3.5, 4, 4.5, or 5 hours. In some embodiments, the transduction is performed for or for about 0.5, 1, 1.5, or 2 hours. In some embodiments, the transduction is performed for or for about 0.5 to 1.5 hours. In some embodiments, the transduction is performed for or for about 1 hour.

In certain embodiments, the transduction step is initiated within two days, within 36 hours, within 30 hours, within 24 hours, within 12 hours, within 6 hours, within 5 hours, within 4 hours, or within 2 hours of the start or initiation of the incubation, e.g., the incubation under stimulating conditions. In certain embodiments, the transduction step is initiated within 4 to 5 hours of the start or initiation of the incubation, e.g., the incubation under stimulating conditions. In certain embodiments, the transduction step is initiated at about 20 hours of the start or initiation of the incubation, e.g., the incubation under stimulating conditions. In certain embodiments, the transduction step is initiated at or at about 4 to 5 hours of the start or initiation of the incubation, e.g., the incubation under stimulating conditions.

In some embodiments, the system is included with and/or placed into association with other instrumentation, including instrumentation to operate, automate, control and/or monitor aspects of the transduction step and one or more various other processing steps performed in the system, e.g. one or more processing steps that can be carried out with or in connection with the centrifugal chamber system as described herein or in International Publication Number WO2016/073602. This instrumentation in some embodiments is contained within a cabinet. In some embodiments, the instrumentation includes a cabinet, which includes a housing containing control circuitry, a centrifuge, a cover, motors, pumps, sensors, displays, and a user interface. An exemplary device is described in U.S. Pat. Nos. 6,123,655, 6,733,433 and US 2008/0171951.

In some embodiments, the system comprises a series of containers, e.g., bags, tubing, stopcocks, clamps, connectors, and a centrifuge chamber. In some embodiments, the containers, such as bags, include one or more containers, such as bags, containing the cells to be transduced and the viral vector particles, in the same container or separate containers, such as the same bag or separate bags. In some embodiments, the system further includes one or more containers, such as bags, containing medium, such as diluent and/or wash solution, which is pulled into the chamber and/or other components to dilute, resuspend, and/or wash components and/or populations during the methods. The containers can be connected at one or more positions in the system, such as at a position corresponding to an input line, diluent line, wash line, waste line and/or output line.

In some embodiments, the chamber is associated with a centrifuge, which is capable of effecting rotation of the chamber, such as around its axis of rotation. Rotation may occur before, during, and/or after the incubation in connection with transduction of the cells and/or in one or more of the other processing steps. Thus, in some embodiments, one or more of the various processing steps is carried out under rotation, e.g., at a particular force. The chamber is typically capable of vertical or generally vertical rotation, such that the chamber sits vertically during centrifugation and the side wall and axis are vertical or generally vertical, with the end wall(s) horizontal or generally horizontal.

In some embodiments, the population containing cells and population containing viral vector particles, and optionally air, can be combined or mixed prior to providing the populations to the cavity. In some embodiments, the population containing cells and population containing viral vector particles, and optionally air, are provided separately and combined and mixed in the cavity. In some embodiments, a population containing cells, a population containing viral vector particles, and optionally air, can be provided to the internal cavity in any order. In any of such some embodiments, a population containing cells and viral vector particles is the input population once combined or mixed together, whether such is combined or mixed inside or outside the centrifugal chamber and/or whether cells and viral vector particles are provided to the centrifugal chamber together or separately, such as simultaneously or sequentially.

In some embodiments, intake of the volume of gas, such as air, occurs prior to the incubating the cells and viral vector particles, such as rotation, in the transduction method. In some embodiments, intake of the volume of gas, such as air, occurs during the incubation of the cells and viral vector particles, such as rotation, in the transduction method.

In some embodiments, the liquid volume of the cells or viral vector particles that make up the transduction population, and optionally the volume of air, can be a predetermined volume. The volume can be a volume that is programmed into and/or controlled by circuitry associated with the system.

In some embodiments, intake of the transduction population, and optionally gas, such as air, is controlled manually, semi-automatically and/or automatically until a desired or predetermined volume has been taken into the internal cavity of the chamber. In some embodiments, a sensor associated with the system can detect liquid and/or gas flowing to and from the centrifuge chamber, such as via its color, flow rate and/or density, and can communicate with associated circuitry to stop or continue the intake as necessary until intake of such desired or predetermined volume has been achieved. In some aspects, a sensor that is programmed or able only to detect liquid in the system, but not gas (e.g. air), can be made able to permit passage of gas, such as air, into the system without stopping intake. In some such embodiments, a non-clear piece of tubing can be placed in the line near the sensor while intake of gas, such as air, is desired. In some embodiments, intake of gas, such as air, can be controlled manually.

In aspects of the provided methods, the internal cavity of the centrifuge chamber is subjected to high speed rotation. In some embodiments, rotation is effected prior to, simultaneously, subsequently or intermittently with intake of the liquid input population, and optionally air. In some embodiments, rotation is effected subsequent to intake of the liquid input population, and optionally air. In some embodiments, rotation is by centrifugation of the centrifugal chamber at a relative centrifugal force at the inner surface of side wall of the internal cavity and/or at a surface layer of the cells of at or about or at least at or about 200 g, 300 g, 400 g, 500 g, 600 g, 700 g, 800 g, 1000 g, 1100 g, 1500 g, 1600 g, 1800 g, 2000 g, 2200 g, 2500 g, 3000 g, 3200 g, 3500 g or 4000 g. In some embodiments, rotation is by centrifugation at a force that is greater than or about 1100 g, such as by greater than or about 1200 g, greater than or about 1400 g, greater than or about 1600 g, greater than or about 1800 g, greater than or about 2000 g, greater than or about 2400 g, greater than or about 2800 g, greater than or about 3000 g or greater than or about 3200 g. In particular embodiments, the rotation by centrifugation is at a force between 600 g and 800 g. In particular embodiments, the rotation by centrifugation is at a force of or of about 693 g. In some embodiments, rotation is by centrifugation at a force that is or is about 1600 g.

In some embodiments, the gas, such as air, in the cavity of the chamber is expelled from the chamber. In some embodiments, the gas, such as air, is expelled to a container that is operably linked as part of the closed system with the centrifugal chamber. In some embodiments, the container is a free or empty container. In some embodiments, the air, such as gas, in the cavity of the chamber is expelled through a filter that is operably connected to the internal cavity of the chamber via a sterile tubing line. In some embodiments, the air is expelled using manual, semi-automatic or automatic processes. In some embodiments, air is expelled from the chamber prior to, simultaneously, intermittently or subsequently with expressing the output population containing incubated cells and viral vector particles, such as cells in which transduction has been initiated or cells have been transduced with a viral vector, from the cavity of the chamber.

In some embodiments, the transduction and/or other incubation is performed as or as part of a continuous or semi-continuous process. In some embodiments, a continuous process involves the continuous intake of the cells and viral vector particles, e.g., the transduction composition (either as a single pre-existing composition or by continuously pulling into the same vessel, e.g., cavity, and thereby mixing, its parts), and/or the continuous expression or expulsion of liquid, and optionally expelling of gas (e.g. air), from the vessel, during at least a portion of the incubation, e.g., while centrifuging. In some embodiments, the continuous intake and continuous expression are carried out at least in part simultaneously. In some embodiments, the continuous intake occurs during part of the incubation, e.g., during part of the centrifugation, and the continuous expression occurs during a separate part of the incubation. The two may alternate. Thus, the continuous intake and expression, while carrying out the incubation, can allow for a greater overall volume of sample to be processed, e.g., transduced.

In some embodiments, the incubation is part of a continuous process, the method including, during at least a portion of the incubation, effecting continuous intake of said transduction composition into the cavity during rotation of the chamber and during a portion of the incubation, effecting continuous expression of liquid and, optionally expelling of gas (e.g. air), from the cavity through the at least one opening during rotation of the chamber.

In some embodiments, the semi-continuous incubation is carried out by alternating between effecting intake of the composition into the cavity, incubation, expression of liquid from the cavity and, optionally expelling of gas (e.g. air) from the cavity, such as to an output container, and then intake of a subsequent (e.g., second, third, etc.) composition containing more cells and other reagents for processing, e.g., viral vector particles, and repeating the process. For example, in some embodiments, the incubation is part of a semi-continuous process, the method including, prior to the incubation, effecting intake of the transduction composition into the cavity through said at least one opening, and subsequent to the incubation, effecting expression of fluid from the cavity; effecting intake of another transduction composition comprising cells and the viral vector particles into said internal cavity; and incubating the another transduction composition in said internal cavity under conditions whereby said cells in said another transduction composition are transduced or subjected to transduction with said vector. The process may be continued in an iterative fashion for a number of additional rounds. In this respect, the semi-continuous or continuous methods may permit production of even greater volume and/or number of cells.

In some embodiments, a portion of the transduction incubation is performed in the centrifugal chamber, which is performed under conditions that include rotation or centrifugation.

In particular embodiments, transduction of the cells with the viral vector is or includes spinoculation, e.g., centrifugation of a mixture containing the cells and the viral particles. In some embodiments, the composition containing cells and viral particles can be rotated, generally at relatively low force or speed, such as speed lower than that used to pellet the cells, such as from or from about 600 rpm to 1700 rpm (e.g. at or about or at least 600 rpm, 1000 rpm, or 1500 rpm or 1700 rpm). In some embodiments, the rotation is carried at a force, e.g., a relative centrifugal force, of from or from about 100 g to 4000 g (e.g. at or about or at least at or about 100 g, 200 g, 300 g, 400 g, 500 g, 600 g, 700 g, 800 g, 900 g, 1000 g, 1500 g, 2000 g, 2500 g, 3000 g or 3500 g), as measured for example at an internal or external wall of the chamber or cavity.

In some embodiments, the cells are spinoculated with the viral vector at a force, e.g., a relative centrifugal force, of between or between about 100 g and 4000 g, 200 g and 1,000 g, 500 g and 1200 g, 1000 g and 2000 g, 600 g and 800 g, 1200 g and 1800 g, or 1500 g and 1800 g. In certain embodiments, the cells are spinoculated with the viral vector particle for, for at least, or for about 100 g, 200 g, 300 g, 400 g, 500 g, 600 g, 700 g, 800 g, 900 g, 1000 g, 1200 g, 1500 g, 1600 g, 2000 g, 2500 g, 3000 g, 3200 g, or 3500 g. In some embodiments, the cells are transduced or subjected to transduction with the viral vector at a force of or of about 692 g. In particular embodiments, the cells are transduced or subjected to transduction with the viral vector at a force of or of about 1600 g. In some embodiments, the force is the force at the internal surface of the side wall of the internal cavity and/or at a surface layer of the cells.

In certain embodiments, the cells are spinoculated, e.g., the cell composition containing cells and viral vector is rotated, for greater than or about 5 minutes, such as greater than or about 10 minutes, greater than or about 15 minutes, greater than or about 20 minutes, greater than or about 30 minutes, greater than or about 45 minutes, greater than or about 60 minutes, greater than or about 90 minutes or greater than or about 120 minutes; or between or between about 5 minutes and 120 minutes, 30 minutes and 90 minutes, 15 minutes and 60 minutes, 15 minutes and 45 minutes, 30 minutes and 60 minutes or 45 minutes and 60 minutes, each inclusive. In some embodiments, the cells are spinoculated with the viral vector for or for about 30 minutes. In certain embodiments, the cells are spinoculated with the viral vector for or for about 60 minutes.

In some embodiments, the method of transduction includes a spinoculation, e.g., a rotation or centrifugation of the transduction composition, and optionally air, in the centrifugal chamber for greater than or about 5 minutes, such as greater than or about 10 minutes, greater than or about 15 minutes, greater than or about 20 minutes, greater than or about 30 minutes, greater than or about 45 minutes, greater than or about 60 minutes, greater than or about 90 minutes or greater than or about 120 minutes. In some embodiments, the transduction composition, and optionally air, is rotated or centrifuged in the centrifugal chamber for greater than 5 minutes, but for no more than 60 minutes, no more than 45 minutes, no more than 30 minutes or no more than 15 minutes. In particular embodiments, the transduction includes rotation or centrifugation for or for about 60 minutes.

In some embodiments, the method of transduction includes rotation or centrifugation of the transduction composition, and optionally air, in the centrifugal chamber for between or between about 10 minutes and 60 minutes, 15 minutes and 60 minutes, 15 minutes and 45 minutes, 30 minutes and 60 minutes or 45 minutes and 60 minutes, each inclusive, and at a force at the internal surface of the side wall of the internal cavity and/or at a surface layer of the cells of, of about, or at 1000 g, 1100 g, 1200 g, 1400 g, 1500 g, 1600 g, 1800 g, 2000 g, 2200 g, 2400 g, 2800 g, 3200 g or 3600 g. In particular embodiments, the method of transduction includes rotation or centrifugation of the transduction composition, e.g., the cells and the viral vector particles, at or at about 1600 g for or for about 60 minutes.

In some embodiments, the method of transduction does not include rotation or centrifugation.

2. Viral Vector Particles

In some embodiments, recombinant nucleic acids are transferred into cells using recombinant infectious virus particles, such as, e.g., vectors derived from simian virus 40 (SV40), adenoviruses, adeno-associated virus (AAV). In some embodiments, recombinant nucleic acids are transferred into T cells using recombinant lentiviral vectors or retroviral vectors, such as gamma-retroviral vectors (see, e.g., Koste et al. (2014) Gene Therapy 2014 Apr. 3. doi: 10.1038/gt.2014.25; Carlens et al. (2000) Exp Hematol 28(10): 1137-46; Alonso-Camino et al. (2013) Mol Ther Nucl Acids 2, e93; Park et al., Trends Biotechnol. 2011 Nov. 29(11): 550-557.

In some embodiments, the retroviral vector has a long terminal repeat sequence (LTR), e.g., a retroviral vector derived from the Moloney murine leukemia virus (MoMLV), myeloproliferative sarcoma virus (MPSV), murine embryonic stem cell virus (MESV), murine stem cell virus (MSCV), spleen focus forming virus (SFFV), or adeno-associated virus (AAV). Most retroviral vectors are derived from murine retroviruses. In some embodiments, the retroviruses include those derived from any avian or mammalian cell source. The retroviruses typically are amphotropic, meaning that they are capable of infecting host cells of several species, including humans. In one embodiment, the gene to be expressed replaces the retroviral gag, pol and/or env sequences. A number of illustrative retroviral systems have been described (e.g., U.S. Pat. Nos. 5,219,740; 6,207, 453; 5,219,740; Miller and Rosman (1989) BioTechniques 7:980-990; Miller, A. D. (1990) Human Gene Therapy 1:5-14; Scarpa et al. (1991) Virology 180:849-852; Burns et al. (1993) Proc. Natl. Acad. Sci. USA 90:8033-8037; and Boris-Lawrie and Temin (1993) Cur. Opin. Genet. Develop. 3:102-109.

The viral vector genome is typically constructed in a plasmid form that can be transfected into a packaging or producer cell line. In any of such examples, the nucleic acid encoding a recombinant protein, such as a recombinant receptor, is inserted or located in a region of the viral vector, such as generally in a non-essential region of the viral genome. In some embodiments, the nucleic acid is inserted into the viral genome in the place of certain viral sequences to produce a virus that is replication defective.

Any of a variety of known methods can be used to produce retroviral particles whose genome contains an RNA copy of the viral vector genome. In some embodiments, at least two components are involved in making a virus-based gene delivery system: first, packaging plasmids, encompassing the structural proteins as well as the enzymes necessary to generate a viral vector particle, and second, the viral vector itself, i.e., the genetic material to be transferred. Biosafety safeguards can be introduced in the design of one or both of these components.

In some embodiments, the packaging plasmid can contain all retroviral, such as HIV-1, proteins other than envelope proteins (Naldini et al., 1998). In other embodiments, viral vectors can lack additional viral genes, such as those that are associated with virulence, e.g. vpr, vif, vpu and nef, and/or Tat, a primary transactivator of HIV. In some embodiments, lentiviral vectors, such as HIV-based lentiviral vectors, comprise only three genes of the parental virus: gag, pol and rev, which reduces or eliminates the possibility of reconstitution of a wild-type virus through recombination.

In some embodiments, the viral vector genome is introduced into a packaging cell line that contains all the components necessary to package viral genomic RNA, transcribed from the viral vector genome, into viral particles. Alternatively, the viral vector genome may comprise one or more genes encoding viral components in addition to the one or more sequences, e.g., recombinant nucleic acids, of interest. In some aspects, in order to prevent replication of the genome in the target cell, however, endogenous viral genes required for replication are removed and provided separately in the packaging cell line.

In some embodiments, a packaging cell line is transfected with one or more plasmid vectors containing the components necessary to generate the particles. In some embodiments, a packaging cell line is transfected with a plasmid containing the viral vector genome, including the LTRs, the cis-acting packaging sequence and the sequence of interest, i.e. a nucleic acid encoding an antigen receptor, such as a CAR; and one or more helper plasmids encoding the virus enzymatic and/or structural components, such as Gag, pol and/or rev. In some embodiments, multiple vectors are utilized to separate the various genetic components that generate the retroviral vector particles. In some such embodiments, providing separate vectors to the packaging cell reduces the chance of recombination events that might otherwise generate replication competent viruses. In some embodiments, a single plasmid vector having all of the retroviral components can be used.

In some embodiments, the retroviral vector particle, such as lentiviral vector particle, is pseudotyped to increase the transduction efficiency of host cells. For example, a retroviral vector particle, such as a lentiviral vector particle, in some embodiments is pseudotyped with a VSV-G glycoprotein, which provides a broad cell host range extending the cell types that can be transduced. In some embodiments, a packaging cell line is transfected with a plasmid or polynucleotide encoding a non-native envelope glycoprotein, such as to include xenotropic, polytropic or amphotropic envelopes, such as Sindbis virus envelope, GALV or VSV-G.

In some embodiments, the packaging cell line provides the components, including viral regulatory and structural proteins, that are required in trans for the packaging of the viral genomic RNA into lentiviral vector particles. In some embodiments, the packaging cell line may be any cell line that is capable of expressing lentiviral proteins and producing functional lentiviral vector particles. In some aspects, suitable packaging cell lines include 293 (ATCC CCL X), 293T, HeLA (ATCC CCL 2), D17 (ATCC CCL 183), MDCK (ATCC CCL 34), BHK (ATCC CCL-10) and Cf2Th (ATCC CRL 1430) cells.

In some embodiments, the packaging cell line stably expresses the viral protein(s). For example, in some aspects, a packaging cell line containing the gag, pol, rev and/or other structural genes but without the LTR and packaging components can be constructed. In some embodiments, a packaging cell line can be transiently transfected with nucleic acid molecules encoding one or more viral proteins along with the viral vector genome containing a nucleic acid molecule encoding a heterologous protein, and/or a nucleic acid encoding an envelope glycoprotein.

In some embodiments, the viral vectors and the packaging and/or helper plasmids are introduced via transfection or infection into the packaging cell line. The packaging cell line produces viral vector particles that contain the viral vector genome. Methods for transfection or infection are well known. Non-limiting examples include calcium phosphate, DEAE-dextran and lipofection methods, electroporation and microinjection.

When a recombinant plasmid and the retroviral LTR and packaging sequences are introduced into a special cell line (e.g., by calcium phosphate precipitation for example), the packaging sequences may permit the RNA transcript of the recombinant plasmid to be packaged into viral particles, which then may be secreted into the culture media. The media containing the recombinant retroviruses in some embodiments is then collected, optionally concentrated, and used for gene transfer. For example, in some aspects, after cotransfection of the packaging plasmids and the transfer vector to the packaging cell line, the viral vector particles are recovered from the culture media and titered by standard methods used by those of skill in the art.

In some embodiments, a retroviral vector, such as a lentiviral vector, can be produced in a packaging cell line, such as an exemplary HEK 293T cell line, by introduction of plasmids to allow generation of lentiviral particles. In some embodiments, a packaging cell is transfected and/or contains a polynucleotide encoding gag and pol, and a polynucleotide encoding a recombinant receptor, such as an antigen receptor, for example, a CAR. In some embodiments, the packaging cell line is optionally and/or additionally transfected with and/or contains a polynucleotide encoding a rev protein. In some embodiments, the packaging cell line is optionally and/or additionally transfected with and/or contains a polynucleotide encoding a non-native envelope glycoprotein, such as VSV-G. In some such embodiments, approximately two days after transfection of cells, e.g. HEK 293T cells, the cell supernatant contains recombinant lentiviral vectors, which can be recovered and titered.

Recovered and/or produced retroviral vector particles can be used to transduce target cells using the methods as described. Once in the target cells, the viral RNA is reverse-transcribed, imported into the nucleus and stably integrated into the host genome. One or two days after the integration of the viral RNA, the expression of the recombinant protein, e.g. antigen receptor, such as CAR, can be detected.

3. Incubating the Cells

In particular embodiments, genetic engineering, such as by transforming (e.g. transducing) the cells (e.g. output composition) with a viral vector, further includes one or more steps of incubating the cells after the introducing or contacting of the cells with the viral vector. In some embodiments, cells, e.g., cells of the transformed cell population, are incubated subsequent to processes for genetically engineering, transforming, transducing, or transfecting the cells to introduce the viral vector into the cells. In particular embodiments, the incubation results in a population of incubated cells (also referred to herein as an incubated cell population).

In some embodiments, the cells are incubated after the introducing of the heterologous or recombinant polynucleotide, e.g., viral vector particles is carried out without further processing of the cells. In particular embodiments, prior to the incubating, the cells are washed, such as to remove or substantially remove exogenous or remaining polynucleotides encoding the heterologous or recombinant polynucleotide, e.g. viral vector particles, such as those remaining in the media after the genetic engineering process following the spinoculation.

In some such embodiments, the further incubation is effected under conditions to result in integration of the viral vector into a host genome of one or more of the cells. It is within the level of a skilled artisan to assess or determine if the incubation has resulted in integration of viral vector particles into a host genome, and hence to empirically determine the conditions for a further incubation. In some embodiments, integration of a viral vector into a host genome can be assessed by measuring the level of expression of a recombinant protein, such as a heterologous protein, encoded by a nucleic acid contained in the genome of the viral vector particle following incubation. A number of well-known methods for assessing expression level of recombinant molecules may be used, such as detection by affinity-based methods, e.g., immunoaffinity-based methods, e.g., in the context of cell surface proteins, such as by flow cytometry. In some examples, the expression is measured by detection of a transduction marker and/or reporter construct. In some embodiments, nucleic acid encoding a truncated surface protein is included within the vector and used as a marker of expression and/or enhancement thereof.

In certain embodiments, the incubation is performed under static conditions, such as conditions that do not involve centrifugation, shaking, rotating, rocking, or perfusion, e.g., continuous or semi-continuous perfusion of the media. In some embodiments, either prior to or shortly after, e.g., within 5, 15, or 30 minutes, the initiation of the incubation, the cells are transferred (e.g., transferred under sterile conditions) to a container such as a bag or vial, and placed in an incubator.

In some embodiments, at least a portion of the incubation is carried out in the internal cavity of a centrifugal chamber, such as described in International Publication Number WO2016/073602.

In some embodiments, the cells that have been introduced with a polynucleotide encoding the heterologous or recombinant polypeptide, e.g., the viral vectors, are transferred into a container for the incubation. In some embodiments, the container is a vial. In particular embodiments, the container is a bag. In some embodiments, the cells, and optionally the heterologous or recombinant polypeptide, are transferred into the container under closed or sterile conditions. In some embodiments, the container, e.g., the vial or bag, is then placed into an incubator for all or a portion of the incubation. In particular embodiments, incubator is set at, at about, or at least 16° C., 24° C., or 35° C. In some embodiments, the incubator is set at 37° C., at about at 37° C., or at 37° C.±2° C., ±1° C., ±0.5° C., or ±0.1° C.

In some aspects, the conditions for the incubation can include one or more of particular media, temperature, oxygen content, carbon dioxide content, time, agents, e.g., nutrients, amino acids, antibiotics, ions, and/or stimulatory factors, such as cytokines, chemokines, antigens, binding partners, fusion proteins, recombinant soluble receptors, and any other agents designed to activate the cells.

In some embodiments, the incubation is performed in serum free media. In some embodiments, the serum free media is a defined and/or well-defined cell culture media. In certain embodiments, the serum free media is a controlled culture media that has been processed, e.g., filtered to remove inhibitors and/or growth factors. In some embodiments, the serum free media contains proteins. In certain embodiments, the serum-free media may contain serum albumin, hydrolysates, growth factors, hormones, carrier proteins, and/or attachment factors.

In particular embodiments, the cells are incubated in the presence of one or more cytokines. In certain embodiments, the one or more cytokines are recombinant cytokines. In particular embodiments, the one or more cytokines are human recombinant cytokines. In certain embodiments, the one or more cytokines bind to and/or are capable of binding to receptors that are expressed by and/or are endogenous to T cells. In particular embodiments, the one or more cytokines is or includes a member of the 4-alpha-helix bundle family of cytokines. In some embodiments, members of the 4-alpha-helix bundle family of cytokines include, but are not limited to, interleukin-2 (IL-2), interleukin-4 (IL-4), interleukin-7 (IL-7), interleukin-9 (IL-9), interleukin 12 (IL-12), interleukin 15 (IL-15), granulocyte colony-stimulating factor (G-CSF), and granulocyte-macrophage colony-stimulating factor (GM-CSF). In some embodiments, the one or more cytokines is or includes IL-15. In particular embodiments, the one or more cytokines is or includes IL-7. In particular embodiments, the one or more cytokines is or includes recombinant IL-2.

In particular embodiments, the cells are incubated in the presence of IL-2, IL-7, and/or IL-15. In certain embodiments, the IL-2, IL-7, and/or IL-15 are recombinant. In certain embodiments, the IL-2, IL-7, and/or IL-15 are human. In particular embodiments, the one or more cytokines are or include human recombinant IL-2, IL-7, and/or IL-15. In certain embodiments, the cells are incubated in the presence of recombinant IL-2, IL-7, and IL-15.

In some embodiments, the cells, e.g., the transformed cells, are incubated with a cytokine, e.g., a recombinant human cytokine, at a concentration of between 1 IU/mL and 1,000 IU/mL, between 10 IU/mL and 50 IU/mL, between 50 IU/mL and 100 IU/mL, between 100 IU/mL and 200 IU/mL, between 100 IU/mL and 500 IU/mL, between 250 IU/mL and 500 IU/mL, or between 500 IU/mL and 1,000 IU/mL.

In some embodiments, the cells, e.g., the transformed cells, are incubated with IL-2, e.g., human recombinant IL-2, at a concentration between 1 IU/mL and 500 IU/mL, between 10 IU/mL and 250 IU/mL, between 50 IU/mL and 200 IU/mL, between 50 IU/mL and 150 IU/mL, between 75 IU/mL and 125 IU/mL, between 100 IU/mL and 200 IU/mL, or between 10 IU/mL and 100 IU/mL. In particular embodiments, cells, e.g., transformed cells, are incubated with recombinant IL-2 at a concentration at or at about 50 IU/mL, 60 IU/mL, 70 IU/mL, 80 IU/mL, 90 IU/mL, 100 IU/mL, 110 IU/mL, 120 IU/mL, 130 IU/mL, 140 IU/mL, 150 IU/mL, 160 IU/mL, 170 IU/mL, 180 IU/mL, 190 IU/mL, or 100 IU/mL. In some embodiments, the cells, e.g., the transformed cells, are incubated in the presence of or of about 100 IU/mL of recombinant IL-2, e.g., human recombinant IL-2.

In some embodiments, the cells, e.g., the transformed cells, are incubated with recombinant IL-7, e.g., human recombinant IL-7, at a concentration between 100 IU/mL and 2,000 IU/mL, between 500 IU/mL and 1,000 IU/mL, between 100 IU/mL and 500 IU/mL, between 500 IU/mL and 750 IU/mL, between 750 IU/mL and 1,000 IU/mL, or between 550 IU/mL and 650 IU/mL. In particular embodiments, the cells, e.g., the transformed cells, are incubated with IL-7 at a concentration at or at about 50 IU/mL, 100 IU/mL, 150 IU/mL, 200 IU/mL, 250 IU/mL, 300 IU/mL, 350 IU/mL, 400 IU/mL, 450 IU/mL, 500 IU/mL, 550 IU/mL, 600 IU/mL, 650 IU/mL, 700 IU/mL, 750 IU/mL, 800 IU/mL, 750 IU/mL, 750 IU/mL, 750 IU/mL, or 1,000 IU/mL. In particular embodiments, the cells, e.g., the transformed cells, are incubated in the presence of or of about 600 IU/mL of IL-7.

In some embodiments, the cells, e.g., the transformed cells, are incubated with recombinant IL-15, e.g., human recombinant IL-15, at a concentration between 1 IU/mL and 500 IU/mL, between 10 IU/mL and 250 IU/mL, between 50 IU/mL and 200 IU/mL, between 50 IU/mL and 150 IU/mL, between 75 IU/mL and 125 IU/mL, between 100 IU/mL and 200 IU/mL, or between 10 IU/mL and 100 IU/mL. In particular embodiments, cells, e.g., transformed cells, are incubated with recombinant IL-15 at a concentration at or at about 50 IU/mL, 60 IU/mL, 70 IU/mL, 80 IU/mL, 90 IU/mL, 100 IU/mL, 110 IU/mL, 120 IU/mL, 130 IU/mL, 140 IU/mL, 150 IU/mL, 160 IU/mL, 170 IU/mL, 180 IU/mL, 190 IU/mL, or 200 IU/mL. In some embodiments, the cells, e.g., the transformed cells, are incubated in the presence of or of about 100 IU/mL of recombinant IL-15, e.g., human recombinant IL-2.

In particular embodiments, the cells, e.g., transformed cells, are incubated in the presence of IL-2, IL-7, and/or IL-15. In some embodiments, the IL-2, IL-7, and/or IL-15 are recombinant. In certain embodiments, the IL-2, IL-7, and/or IL-15 are human. In particular embodiments, the one or more cytokines are or include human recombinant IL-2, IL-7, and/or IL-15. In certain embodiments, the cells are incubated in the presence of recombinant IL-2, IL-7, and IL-15.

In some embodiments, all or a portion of the incubation, e.g., of the non-expanded process, is performed in a media comprising a basal medium (e.g., a CTS OpTmizer basal media (Thermofisher)), glutamine, and one or more recombinant cytokines, such as recombinant IL-2, IL-7, and/or IL-15. In some embodiments, the media can contain one or more additional components, such as set froth in Section III. B. In some embodiments, the one or more additional components may include a dipeptide form of L-glutamine (e.g., L-alanyl-L-glutamine). In some embodiments, the one or more additional components are provided by an additional supplement, e.g. OpTmizer® supplement (Thermofisher). In some embodiments, the media is a serum-free media and does not contain any serum component. In some aspects, the media can contain one or more serum-substituting proteins, such as one or more of albumin, insulin or transferrin (e.g. CTS™ Immune Cell Serum Replacement). Exemplary serum-free media or components thereof are described in Section III.

In some embodiments, the cells are incubated in the presence of the same or similar media as was present during the stimulation of the cells, such as carried out in connection with methods or processes of stimulation (e.g., on-column stimulation) described above. In some embodiments, the cells are incubated in media having the same cytokines as the media present during stimulation of the cells, such as carried out in connection with methods or processes of stimulation described above. In certain embodiments, the cells are incubated in media having the same cytokines at the same concentrations as the media present during stimulation of the cells, such as carried out in connection with methods or processes of stimulation described above.

In some embodiments, the cells are incubated in the absence of recombinant cytokines. In some embodiments, the cells are incubated in the absence of one or more cytokines as described herein. In some embodiments, the cells are incubated in the absence of all the cytokines described herein.

In some embodiments, all or a portion of the incubation is performed in basal media, such as a basal media without one or more recombinant cytokines or without any recombinant cytokine. In some embodiments, the medium does not comprise one or more recombinant cytokines, such as recombinant human IL-2, recombinant human IL-7, and/or recombinant human IL-15. In some aspects, the incubation is carried out without any recombinant cytokines. In certain embodiments, the basal media is supplemented with additional additives. In some embodiments, the basal media is not supplemented with any additional additives. Additives to cell culture media may include, but is not limited to nutrients, sugars, e.g., glucose, amino acids, vitamins, or additives such as ATP and NADH. Other additives also can be added but in general the specific additives and amounts are such that the incubation of the media with the cells facilitates maintenance of the cells but minimizes, limits and/or does not induce the metabolic activity of the cells during the incubation.

In particular embodiments, the media is a basal media that does not contain one more more recombinant cytokines and that does not contain a serum component, i.e. is a serum-free media, but may contain one or more additional components such as described in Section III. B. In particular embodiments, use of such a serum-free media in all or a portion of the incubation, e.g., of the non-expanded process, e.g., according to Section I-E-3, provides for a lean media that provides for maintenance of the cells but does not include certain factors that may activate or render the cells metabolically active thereby fostering the cells in a state that is or is likely to be a resting or a quiescent state. In some aspects, incubation (e.g., according to Section I-E-3) in the presence of such a serum-free media allows the cells to recover after the stimulation and genetic engineering (e.g. transduction). In some aspects, incubation (e.g., according to Section I-E-3) in the presence of such a serum-free media results in an output composition (e.g., therapeutic cell composition) containing cells that are less susceptible to damage or loss of viability, e.g., during or following the manufacturing process and when the harvested/formulated cells are cryopreserved and then thawed immediately prior to use. In some embodiments, cells in the output composition (e.g., therapeutic cell composition) when thawed have lower levels of caspase or other marker of apoptosis than cells that have been incubated in a similar media but containing one or more recombinant cytokines, serum, or other factors that may make the cells more metabolically active at cryopreservation of the output composition (e.g., therapeutic cell composition).

In some embodiments, the basal medium contains a mixture of inorganic salts, sugars, amino acids, and, optionally, vitamins, organic acids and/or buffers or other well known cell culture nutrients. In addition to nutrients, the medium also helps maintain pH and osmolality. In some aspects, the reagents of the basal media support cell growth, proliferation and/or expansion. A wide variety of commercially available basal media are well known to those skilled in the art, and include Dulbeccos' Modified Eagles Medium (DMEM), Roswell Park Memorial Institute Medium (RPMI), Iscove modified Dulbeccos' medium and Hams medium. In some embodiments, the basal medium is Iscove's Modified Dulbecco's Medium, RPMI-1640, or α-MEM.

In some embodiments, the basal media is a balanced salt solution (e.g., PBS, DPBS, HBSS, EBSS). In some embodiments, the basal media is selected from Dulbecco's Modified Eagle's Medium (DMEM), Minimal Essential Medium (MEM), Basal Medium Eagle (BME), F-10, F-12, RPMI 1640, Glasgow's Minimal Essential Medium (GMEM), alpha Minimal Essential Medium (alpha MEM), Iscove's Modified Dulbecco's Medium, and M199. In some embodiments, the basal media is a complex medium (e.g., RPMI-1640, IMDM). In some embodiments, the basal medium is OpTmizer™ CTS™ T-Cell Expansion Basal Medium (ThermoFisher).

In some embodiments, the basal medium is free of a protein. In some embodiments, the basal medium is free of a human protein (e.g., a human serum protein). In some embodiments, the basal medium is serum-free. In some embodiments, the basal medium is free of serum derived from human. In some embodiments, the basal medium is free of a recombinant protein. In some embodiments, the basal medium is free of a human protein and a recombinant protein. In some embodiments, the basal medium is free of one or more or all cytokines as described herein.

In some embodiments, all or a portion of the incubation, e.g., for the non-expanded process, is performed in a basal medium without any additional additives or recombinant cytokines. In some embodiments, the basal media is a CTS OpTmizer basal media (Thermofisher) without any additional additives or recombinant cytokines. In some embodiments, all or a portion of the incubation, e.g., for the non-expanded process, is performed in a media comprising a basal medium and glutamine, e.g., a CTS OpTmizer basal media (Thermofisher) with glutamine.

In some embodiments, all or a portion of the incubation, e.g., of the non-expanded process, is performed in a media comprising a basal medium (e.g., a CTS OpTmizer basal media (Thermofisher)) without one or more recombinant cytokines, such as recombinant human IL-2, recombinant human IL-7, and/or recombinant human IL-15. In some embodiments, the medium is supplemented with one or more additional non-serum component, such as set forth in Section III.B. In some embodiments, the one or more supplement is serum-free. In some embodiments, the serum-free medium further comprises a free form of an amino acid such as L-glutamine. In some embodiments, the serum-free medium does not comprise a serum replacement supplement. In some embodiments, the serum-free medium does not comprise a dipeptide form of L-glutamine (e.g., L-alanyl-L-glutamine). In some embodiments, the serum-free medium does not comprise any recombinant cytokine. In some embodiments, the serum-free medium comprises a basal medium supplemented with a T cell supplement and a free form of L-glutamine, and does not contain any immune cell serum replacement, any dipeptide form of L-glutamine, or any recombinant cytokine. In some embodiments, the serum-free medium comprises a basal medium (e.g. OpTmizer™ T-Cell Expansion Basal Medium supplemented), L-glutamine and one or more additional components such as provided by a supplement (e.g. OpTmizer™ T-Cell Expansion Supplement).

In particular embodiments, the cells are incubated in the serum free medium at a concentration of or of about $0.25 \times 10^6$ cells/mL, $0.5 \times 10^6$ cells/mL, $0.75 \times 10^6$ cells/mL, $1.0 \times 10^6$ cells/mL, $1.25 \times 10^6$ cells/mL, $1.5 \times 10^6$ cells/mL, $1.75 \times 10^6$ cells/mL, or $2.0 \times 10^6$ cells/mL. In particular embodiments, the cells are incubated in the serum free medium at a concentration between or between about $0.25 \times 10^6$ cells/mL to $1.0 \times 10^6$ cell/mL. In particular embodiments, the cells are incubated in the serum free medium at a concentration between or between about $0.25 \times 10^6$ cells/mL to $0.75 \times 10^6$ cell/mL. In particular embodiments, the cells are incubated in the serum free medium at a concentration between or between about $0.5 \times 10^6$ cells/mL to $0.75 \times 10^6$ cell/mL. In particular embodiments, the cells are incubated in the serum free medium at a concentration between or between about $0.25 \times 10^6$ cells/mL to $0.5 \times 10^6$ cell/mL. In particular embodiments, the cells are incubated in the serum free medium at a concentration of or of about $0.75 \times 10^6$ cells/mL. In particular embodiments, the cells are incubated in the serum free medium at a concentration of or of about $0.5 \times 10^6$ cells/mL. In some embodiments, the incubating is for or for about between 18 hours and 30 hours. In particular embodiments, the incubating is for or for about 24 hours or for about one day.

In particular embodiments, the cells are incubated in the absence of cytokines. In particular embodiments, the cells are incubated in the absence of any recombinant cytokine. In particular embodiments, the cells are incubated in the absence of one or more recombinant cytokine, such as recombinant IL-2, IL-7, and/or IL-15.

In some embodiments, all or a portion of the incubation, e.g., for the non-expanded process, is performed in a media comprising a basal media, glutamine, and one or more recombinant cytokines, e.g., a CTS OpTmizer basal media (Thermofisher) with glutamine and recombinant IL-2, IL-7, and/or IL-15. In some embodiments, all or a portion of the incubation, e.g., for the non-expanded process, is performed in a media comprising a basal media, glutamine, one or more recombinant cytokines, and a T cell supplement, e.g., a CTS OpTmizer basal media (Thermofisher) with glutamine, recombinant IL-2, IL-7, and/or IL-15, and an OpTmizer® supplement (Thermofisher). In some embodiments, all or a portion of the incubation, e.g., for the non-expanded process, is performed in a media comprising a basal media, glutamine, one or more recombinant cytokines, a T cell supplement, and one or more serum-substituting proteins, e.g., a CTS OpTmizer basal media (Thermofisher) with glutamine, recombinant IL-2, IL-7, and/or IL-15, an OpTmizer® supplement (Thermofisher), and serum-substituting proteins such as one or more of albumin, insulin or transferrin.

In some embodiments, the basal medium further comprises glutamine, such as L-glutamine. In some aspects, the glutamine is a free form of glutamine, such as L-glutamine. In some embodiments, the concentration of the glutamine, such as L-glutamine, in the basal medium is about or less than about 0.5 mM-1 mM, 0.5 mM-1.5 mM, 0.5 mM-2 mM, 0.5 mM-2.5 mM, 0.5 mM-3 mM, 0.5 mM-3.5 mM, 0.5 mM-4 mM, 0.5 mM-4.5 mM, 0.5 mM-5 mM, 1 mM-1.5 mM, 1 mM-2 mM, 1 mM-2.5 mM, 1 mM-3 mM, 1 mM-3.5 mM, 1 mM-4 mM, 1 mM-4.5 mM, 1 mM-5 mM, 1.5 mM-2 mM, 1.5 mM-2.5 mM, 1.5 mM-3 mM, 1.5 mM-3.5 mM, 1.5 mM-4 mM, 1.5 mM-4.5 mM, 1.5 mM-5 mM, 2 mM-2.5 mM, 2 mM-3 mM, 2 mM-3.5 mM, 2 mM-4 mM, 2 mM-4.5 mM, 2 mM-5 mM, 2.5 mM-3 mM, 2.5 mM-3.5 mM, 2.5 mM-4 mM, 2.5 mM-4.5 mM, 2.5 mM-5 mM, 3 mM-3.5 mM, 3 mM-4 mM, 3 mM-4.5 mM, 3 mM-5 mM, 3.5 mM-4 mM, 3.5 mM-4.5 mM, 3.5 mM-5 mM, 4 mM-4.5 mM, 4 mM-5 mM, or 4.5 mM-5 mM, each inclusive. In some embodiments, the concentration of glutamin, such as L-glutamine, in the basal medium is at least about 0.5 mM, 1 mM, 1.5 mM, 2 mM, 2.5 mM, 3 mM, 3.5 mM, 4 mM, 4.5 mM, or 5 mM. In some embodiments, the concentration of glutamine, such as L-glutamine, in the basal medium is at most about 2 mM, 2.5 mM, 3 mM, 3.5 mM, 4 mM, 4.5 mM, 5 mM. In some embodiments, the concentration of glutamine, such as L-glutamine, in the basal medium is about 2 mM.

In some embodiments, the basal medium further may comprise a protein or a peptide. In some embodiments, the at least one protein is not of non-mammalian origin. In some embodiments, the at least one protein is human or derived from human. In some embodiments, the at least one protein is recombinant. In some embodiments, the at least one protein includes albumin, transferrin, insulin, fibronectin, aprotinin or fetuin. In some embodiments, the protein comprises one or more of albumin, insulin or transferrin, optionally one or more of a human or recombinant albumin, insulin or transferrin.

In some embodiments, the protein is an albumin or albumin substitute. In some embodiments, the albumin is a human derived albumin. In some embodiments, the albumin is a recombinant albumin. In some embodiments, the albumin is a natural human serum albumin. In some embodiments, the albumin is a recombinant human serum albumin. In some embodiments, the albumin is a recombinant albumin from a non-human source. Albumin substitutes may be any protein or polypeptide source. Examples of such protein or polypeptide samples include but are not limited to bovine pituitary extract, plant hydrolysate (e.g., rice hydrolysate), fetal calf albumin (fetuin), egg albumin, human serum albumin (HSA), or another animal-derived albumins, chick extract, bovine embryo extract, AlbuMAX® I, and AlbuMAX® II. In some embodiments, the protein or peptide comprises a transferrin. In some embodiments, the protein or peptide comprises a fibronectin. In some embodiments, the protein or peptide comprises aprotinin. In some embodiments, the protein comprises fetuin.

In some embodiments, the one or more additional protein is part of a serum replacement supplement that is added to the basal medium. Examples of serum replacement supplements include, for example, Immune Cell Serum Replacement (ThermoFisher, #A2598101) or those described in Smith et al. *Clin Transl Immunology.* 2015 January; 4(1): e31.

In certain embodiments, the cells are incubated after the introducing of the polynucleotide encoding the heterologous or recombinant protein, e.g., viral vector, for, for about, or for at least 18 hours, 24 hours, 30 hours, 36 hours, 40 hours, 48 hours, 54 hours, 60 hours, 72 hours, 84 hours, 96 hours, or more than 96 hours. In certain embodiments, the cells are incubated after the introducing of the polynucleotide encoding the heterologous or recombinant protein, e.g., viral vector, for, for about, or for at least one day, 2 days, 3 days, 4 days, or more than 4 days. In some embodiments, the incubating is performed for an amount of time between 30 minutes and 2 hours, between 1 hour and 8 hours, between 6 hours and 12 hours, between 12 hours and 18 hours, between 16 hours and 24 hours, between 18 hours and 30 hours, between 24 hours and 48 hours, between 24 hours and 72 hours, between 42 hours and 54 hours, between 60 hours and 120 hours between 96 hours and 120 hours, between 90 hours and between 1 days and 7 days, between 3 days and 8 days, between 1 day and 3 days, between 4 days and 6 days, or between 4 days and 5 days prior to the genetic engineering. In some embodiments, the incubating is for or for about between 18 hours and 30 hours. In particular embodiments, the incubating is for or for about 24 hours or for or for about one day.

In certain embodiments, the total duration of the incubation is, is about, or is at least 12 hours, 18 hours, 24 hours, 30 hours, 36 hours, 42 hours, 48 hours, 54 hours, 60 hours, 72 hours, 84 hours, 96 hours, 108 hours, or 120 hours. In certain embodiments, the total duration of the incubation is, is about, or is at least one day, 2 days, 3 days, 4 days, or 5 days. In particular embodiments, the incubation is completed at, at about, or within 120 hours, 108 hours, 96 hours, 84 hours, 72 hours, 60 hours, 54 hours, 48 hours, 42 hours, 36 hours, 30 hours, 24 hours, 18 hours, or 12 hours. In particular embodiments, the incubation is completed at, at about, or within one day, 2 days, 3 days, 4 days, or 5 days. In some embodiments, the total duration of the incubation is between or between about 12 hour and 120 hours, 18 hour and 96 hours, 24 hours and 72 hours, or 24 hours and 48 hours, inclusive. In some embodiments, the total duration of the incubation is between or about between 1 hour and 48 hours, 4 hours and 36 hours, 8 hours and 30 hours or 12 hours and 24 hours, inclusive. In particular embodiments, the incubation is performed for or for about 24 hours, 48 hours, or 72 hours, or for or for about 1 day, 2 days, or 3 days, respectively. In particular embodiments, the incubation is performed for 24 hours±6 hours, 48 hours±6 hours, or 72 hours±6 hours. In particular embodiments, the incubation is performed for or for about 72 hours or for or for about 3 days. In some embodiments, the incubation is performed for a duration sufficient to allow integration of the polynucleotide encoding the heterologous or recombinant protein into the genome of the cells.

In particular embodiments, the incubation is initiated at, at about, or is at least 12 hours, 18 hours, 24 hours, 30 hours, 36 hours, 42 hours, 48 hours after the initiation of the stimulation. In particular embodiments, the incubation is initiated at, at about, or is at least 0.5 days, one day, 1.5 days, or 2 days after the initiation of the stimulation. In particular embodiments, the incubation is initiated at, at about, or within 120 hours, 108 hours, 96 hours, 84 hours, 72 hours, 60 hours, 54 hours, 48 hours, 42 hours, 36 hours, 30 hours, 24 hours, 18 hours, or 12 hours of the initiation of the stimulation. In particular embodiments, the incubation is initiated at, at about, or within 11 hours, 10 hours, 9 hours, 8 hours, 7 hours, 6 hours, 5 hours, or 4 hours of the initiation of the stimulation. In particular embodiments, the incubation is initiated at, at about, or within 5 days, 4 days, 3 days, 2 days, one day, or 0.5 days of the initiation of the stimulation.

In some embodiments, the incubation is completed between or between about 24 hour and 120 hours, 36 hour and 108 hours, 48 hour and 96 hours, or 48 hours and 72 hours, inclusive, after the initiation of the stimulation. In some embodiments, the incubation is completed at, about, or within 120 hours, 108 hours, 96 hours, 72 hours, 48 hours, or 36 hours from the initiation of the stimulation. In some embodiments, the incubation is completed at, about, or within 5 days, 4.5 days, 4 days, 3 days, 2 days, or 1.5 days from the initiation of the stimulation. In particular embodiments, the incubation is completed after hours 24 hours±6 hours, 48 hours±6 hours, or 72 hours±6 hours after the initiation of the stimulation. In some embodiments, the incubation is completed after or after about 72 hours or after or after about 3 days.

In some of any of the embodiments above, the engineered cells are not incubated under cultivating conditions to expand the cell population (e.g., viable T cell count). In some any of the above embodiments, the cells are not incubated under cultivating conditions that increase the amount of viable cells during the incubation or cultivation. For example, in some aspects, the cells are not incubation under conditions (e.g., cultivating conditions) that increase the amount of total viable cells at the end of the incubation as compared to the number of total viable cells at the beginning of the incubation. In some embodiments, the cells are incubated under conditions that may result in expansion, but the incubating conditions are not carried out for purposes of expanding the cell population. In some embodiments, cells that have been incubated under conditions that do not promote or facilitate expansion and proliferation may be referred to as non-expanded or minimally expanded (see Section I-G).

In some embodiments, the transduced or engineered cells are incubated under cultivating conditions that promote proliferation and/or expansion subsequent to a step of genetically engineering, e.g., introducing a recombinant polypeptide to the cells by transduction or transfection. In particular embodiments, the cells are cultivated after the cells have been transduced or transfected with a recombinant polynucleotide, e.g., a polynucleotide encoding a recombinant receptor. In some embodiments, the cultivation produces one or more cultivated compositions of engineered T cells. In some embodiments, such cultivating conditions may be designed to induce proliferation, expansion, activation, and/or survival of cells in the population. In particular embodiments, the cultivating conditions can include one or more of particular media, temperature, oxygen content, carbon dioxide content, time, agents, e.g., nutrients, amino acids, antibiotics, ions, and/or stimulatory factors, such as cytokines, chemokines, antigens, binding partners, fusion proteins, recombinant soluble receptors, and any other agents designed to promote growth, division, and/or expansion of the cells. In some embodiments, cells that have been incubated under conditions that promote proliferation and/or expansion may be referred to as expanded cells (see Section I-G).

In particular embodiments, the cells are incubated under cultivating conditions (e.g., cultivated) at a concentration of or of about $0.25 \times 10^6$ cells/mL, $0.5 \times 10^6$ cells/mL, $0.75 \times 10^6$ cells/mL, $1.0 \times 10^6$ cells/mL, $1.25 \times 10^6$ cells/mL, $1.5 \times 10^6$ cells/mL, $1.75 \times 10^6$ cells/mL, or $2.0 \times 10^6$ cells/mL. In particular embodiments, the cells are incubated under cultivating conditions at a concentration between or between about $0.25 \times 10^6$ cells/mL to $1.0 \times 10^6$ cell/mL. In particular embodiments, the cells are incubated under cultivating conditions at a concentration between or between about $0.25 \times 10^6$ cells/mL to $0.75 \times 10^6$ cell/mL. In particular embodiments, the cells are incubated under cultivating conditions at a concentration between or between about $0.5 \times 10^6$ cells/mL to $0.75 \times 10^6$ cell/mL. In particular embodiments, the cells are incubated under cultivating conditions at a concentration between or between about $0.25 \times 10^6$ cells/mL to $0.5 \times 10^6$ cell/mL. In particular embodiments, the cells are incubated under cultivating conditions at a concentration of or of about $0.75 \times 10^6$ cells/mL. In particular embodiments, the cells are incubated under cultivating conditions at a concentration of or of about $0.5 \times 10^6$ cells/mL.

In some embodiments, the engineered cells are cultivated (e.g., cultured) in a container that can be filled, e.g. via the feed port, with cell media and/or cells for culturing added cells. The cells can be from any cell source for which culture of the cells is desired, for example, for expansion and/or proliferation of the cells.

In some aspects, the culture media is an adapted culture medium that supports that growth, expansion or proliferation of the cells, such as T cells. In some aspects, the medium can be a liquid containing a mixture of salts, amino acids, vitamins, sugars or any combination thereof. In some embodiments, the culture media further contains one or more stimulating conditions or agents, such as to stimulate the expansion or proliferation of cells during the incubation. In some embodiments, the stimulating condition is or includes one or more cytokines, such as selected from IL-2, IL-7 or IL-15. In some embodiments, the cytokine is a recombinant cytokine. In particular embodiments, the one or more cytokines are human recombinant cytokines. In certain embodiments, the one or more cytokines bind to and/or are capable of binding to receptors that are expressed by and/or are endogenous to T cells. In particular embodiments, the one or more cytokines is or includes a member of the 4-alpha-helix bundle family of cytokines. In some embodiments, members of the 4-alpha-helix bundle family of cytokines include, but are not limited to, interleukin-2 (IL-2), interleukin-4 (IL-4), interleukin-7 (IL-7), interleukin-9 (IL-9), interleukin 12 (IL-12), interleukin 15 (IL-15), granulocyte colony-stimulating factor (G-CSF), and granulocyte-macrophage colony-stimulating factor (GM-CSF). In some embodiments, the one or more cytokines is or includes IL-15. In particular embodiments, the one or more cytokines is or includes IL-7. In particular embodiments, the one or more cytokines is or includes recombinant IL-2.

In some embodiments, the concentration of the one or more cytokine in the culture media during the cultivating, independently, is from or from about 1 IU/mL to 1500 IU/mL, such as from or from about 1 IU/mL to 100 IU/mL, 2 IU/mL to 50 IU/mL, 5 IU/mL to 10 IU/mL, 10 IU/mL to 500 IU/mL, 50 IU/mL to 250 IU/mL or 100 IU/mL to 200 IU/mL, 50 IU/mL to 1500 IU/mL, 100 IU/mL to 1000 IU/mL or 200 IU/mL to 600 IU/mL. In some embodiments, the concentration of the one or more cytokine, independently, is at least or at least about 1 IU/mL, 5 IU/mL, 10 IU/mL, 50 IU/mL, 100 IU/mL, 200 IU/mL, 500 IU/mL, 1000 IU/mL or 1500 IU/mL.

In some embodiments, the composition of engineered cells is cultivated at a temperature of 25 to 38° C., such as 30 to 37° C., for example at or about 37° C.±2° C. In some embodiments, the cultivating condition is carried out for a time period until the culture, e.g. cultivation or expansion, results in a desired or threshold density, concentration, number or dose of cells. In some embodiments, the incubation is carried out for a time period until the culture, e.g. cultivation or expansion, results in a desired or threshold density, concentration, number or dose of viable cells. In some embodiments, the incubation is greater than or greater than about or is for about or 24 hours, 48 hours, 72 hours, 96 hours, 5 days, 6 days, 7 days, 8 days, 9 days or more.

In some embodiments, the cells are incubated or cultivated under conditions to maintain a target amount of carbon dioxide in the cell culture. In some aspects, this ensures optimal cultivation, expansion and proliferation of the cells during the growth. In some aspects, the amount of carbon dioxide ($CO_2$) is between 10% and 0% (v/v) of said gas, such as between 8% and 2% (v/v) of said gas, for example an amount of or about 5% (v/v) $CO_2$.

In particular embodiments, the cultivation is performed in a closed system. In certain embodiments, the cultivation is performed in a closed system under sterile conditions. In some embodiments the composition of engineered cells is removed from a closed system and placed in and/or connected to a bioreactor for the cultivation. Examples of suitable bioreactors for the cultivation include, but are not limited to, GE Xuri W25, GE Xuri W5, Sartorius BioSTAT RM 20|50, Finesse SmartRocker Bioreactor Systems, and Pall XRS Bioreactor Systems. In some embodiments, the bioreactor is used to perfuse and/or mix the cells during at least a portion of the cultivation step.

In some embodiments, cells cultivated while enclosed, connected, and/or under control of a bioreactor undergo expansion during the cultivation more rapidly than cells that are cultivated without a bioreactor, e.g., cells that are cultivated under static conditions such as without mixing, rocking, motion, and/or perfusion. In some embodiments, cells cultivated while enclosed, connected, and/or under control of a bioreactor reach or achieve a threshold expansion, cell count, and/or density within 14 days, 10 days, 9 days, 8 days, 7 days, 6 days, 5 days, 4 days, 3 days, 2 days, 60 hours, 48 hours, 36 hours, 24 hours, or 12 hours. In some embodiments, cells cultivated while enclosed, connected, and/or under control of a bioreactor reach or achieve a threshold expansion, cell count, and/or density at least 50%, at least 60%, at least 70%, at least 80%, at least 90%, at least 95%, at least 100%, at least 150%, at least 1-fold, at least 2-fold, at least 3-fold, at least 4-fold, at least 5-fold than cells cultivated in an exemplary and/or alternative process where cells are not cultivated while enclosed, connected, and/or under control of a bioreactor.

In some embodiments, the mixing is or includes rocking and/or motioning. In some embodiments, cells are incubated using containers, e.g., bags, which are used in connection with a bioreactor. In some cases, the bioreactor can be subject to motioning or rocking, which, in some aspects, can increase oxygen transfer. Motioning the bioreactor may include, but is not limited to rotating along a horizontal axis, rotating along a vertical axis, a rocking motion along a tilted or inclined horizontal axis of the bioreactor or any combination thereof. In some embodiments, at least a portion of the incubation is carried out with rocking. The rocking speed and rocking angle may be adjusted to achieve a desired agitation. In some embodiments the rock angle is or is about 20°, 19°, 18°, 17°, 16°, 15°, 14°, 13°, 12°, 11°, 10°, 9°, 8°, 7°, 6°, 5°, 4°, 3°, 2° or 1°. In certain embodiments, the rock angle is between 6-16°. In other embodiments, the rock angle is between 7-16°. In other embodiments, the rock angle is between 8-12°. In some embodiments, the rock rate is 1, 2, 3, 4, 5, 6, 7, 8, 9, 10, 11, 1 12, 13, 14 15, 16, 17, 18, 19, 20, 21, 22, 23, 24, 25, 26, 27, 28, 29, 30, 31, 32, 33, 34, 35, 36, 37, 38, 39, 40 rpm. In some embodiments, the rock rate is between 4 and 12 rpm, such as between 4 and 6 rpm, inclusive. At least a portion of the cell culture expansion is performed with a rocking motion, such as at an angle of between 5° and 10°, such as 6°, at a constant rocking speed, such as a speed of between 5 and 15 RPM, such as 6 RMP or 10 RPM.

In some embodiments, a composition comprising cells, such as engineered cells, e.g. engineered T cells, engineered CD3+ T cells, engineered CD4+ T cells or engineered CD8+ T cells, is cultivated in the presence of a surfactant. In particular embodiments, cultivating the cells of the composition reduces the amount of shear stress that may occur during the cultivation, e.g., due to mixing, rocking, motion, and/or perfusion. In particular embodiments, the composition of cells, such as engineered cells, e.g. engineered T cells, engineered CD3+ T cells, engineered CD4+ T cells or engineered CD8+ T cells, is cultivated with the surfactant and at least 50%, at least 60%, at least 70%, at least 75%, at least 80%, at least 85%, at least 90%, at least 95%, at least 99%, or at least 99.9% of the T cells survive, e.g., are viable and/or do not undergo necrosis, programed cell death, or apoptosis, during or at least 1 day, 2 days, 3 days, 4 days, 5 days, 6 days, 7 days, or more than 7 days after the cultivation is complete. In particular embodiments, the composition of cells, such as engineered T cells, e.g. engineered CD3+ T cells, engineered CD4+ T cells or engineered CD8+ T cells, is cultivated in the presence of a surfactant and less than 50%, less than 40%, less than 30%, less than 25%, less than 20%, less than 15%, less than 10%, less than 5%, less than 1%, less than 0.1% or less than 0.01% of the cells undergo cell death, e.g., programmed cell death, apoptosis, and/or necrosis, such as due to shearing or shearing-induced stress.

In particular embodiments, a composition of cells, such as engineered T cells, e.g. engineered CD4+ T cells or engineered CD8+ T cells, is cultivated in the presence of between 0.1 µl/ml and 10.0 µl/ml, between 0.2 µl/ml and 2.5 µl/ml, between 0.5 µl/ml and 5 µl/ml, between 1 µl/ml and 3 µl/ml, or between 2 µl/ml and 4 µl/ml of the surfactant. In some embodiments, the composition of cells, such as engineered T cells, e.g. engineered CD4+ T cells or engineered CD8+ T cells, is cultivated in the presence of, of about, or at least 0.1 µl/ml, 0.2 µl/ml, 0.4 µl/ml, 0.6 µl/ml, 0.8 µl/ml, 1 µl/ml, 1.5 µl/ml, 2.0 µl/ml, 2.5 µl/ml, 5.0 µl/ml, 10 µl/ml, 25 µl/ml, or 50 µl/ml of the surfactant. In certain embodiments, the composition of cells is cultivated in the presence of or of about 2 µl/ml of the surfactant.

In some embodiments, a surfactant is or includes an agent that reduces the surface tension of liquids and/or solids. For example, a surfactant includes a fatty alcohol (e.g., steryl alcohol), a polyoxyethylene glycol octylphenol ether (e.g., Triton X-100), or a polyoxyethylene glycol sorbitan alkyl ester (e.g., polysorbate 20, 40, 60). In certain embodiments the surfactant is selected from the group consisting of Polysorbate 80 (PS80), polysorbate 20 (PS20), poloxamer 188 (P188). In an exemplary embodiment, the concentration of the surfactant in chemically defined feed media is about 0.0025% to about 0.25% (v/v) of PS80; about 0.0025% to about 0.25% (v/v) of PS20; or about 0.1% to about 5.0% (w/v) of P188.

In some embodiments, the surfactant is or includes an anionic surfactant, a cationic surfactant, a zwitterionic surfactant, or a nonionic surfactant added thereto. Suitable anionic surfactants include but are not limited to alkyl sulfonates, alkyl phosphates, alkyl phosphonates, potassium laurate, triethanolamine stearate, sodium lauryl sulfate, sodium dodecylsulfate, alkyl polyoxyethylene sulfates, sodium alginate, dioctyl sodium sulfosuccinate, phosphatidyl glycerol, phosphatidyl inosine, phosphatidylinositol, diphosphatidylglycerol, phosphatidylserine, phosphatidic acid and their salts, sodium carboxymethylcellulose, cholic acid and other bile acids (e.g., cholic acid, deoxycholic acid, glycocholic acid, taurocholic acid, glycodeoxycholic acid) and salts thereof (e.g., sodium deoxycholate).

In some embodiments, suitable nonionic surfactants include: glyceryl esters, polyoxyethylene fatty alcohol ethers, polyoxyethylene sorbitan fatty acid esters (polysorbates), polyoxyethylene fatty acid esters, sorbitan esters, glycerol monostearate, polyethylene glycols, polypropylene glycols, cetyl alcohol, cetostearyl alcohol, stearyl alcohol, aryl alkyl polyether alcohols, polyoxyethylene-polyoxypropylene copolymers (poloxamers), poloxamines, methylcellulose, hydroxymethyl cellulose, hydroxypropyl cellulose, hydroxypropylmethyl cellulose, noncrystalline cellulose, polysaccharides including starch and starch derivatives such as hydroxyethylstarch (HES), polyvinyl alcohol, and polyvinylpyrrolidone. In certain embodiments, the nonionic surfactant is a polyoxyethylene and polyoxypropylene copolymer and preferably a block copolymer of propylene glycol and ethylene glycol. Such polymers are sold under the tradename POLOXAMER, also sometimes referred to as PLURONIC® F68 or Kolliphor® P188. Among polyoxyethylene fatty acid esters is included those having short alkyl chains. One example of such a surfactant is SOLUTOL® HS 15, polyethylene-660-hydroxystearate.

In some embodiments, suitable cationic surfactants may include, but are not limited to, natural phospholipids, synthetic phospholipids, quaternary ammonium compounds, benzalkonium chloride, cetyltrimethyl ammonium bromide, chitosans, lauryl dimethyl benzyl ammonium chloride, acyl carnitine hydrochlorides, dimethyl dioctadecyl ammonium bromide (DDAB), dioleyoltrimethyl ammonium propane (DOTAP), dimyristoyl trimethyl ammonium propane (DMTAP), dimethyl amino ethane carbamoyl cholesterol (DC-Chol), 1,2-diacylglycero-3-(O-alkyl) phosphocholine, O-alkylphosphatidylcholine, alkyl pyridinium halides, or long-chain alkyl amines such as, for example, n-octylamine and oleylamine.

Zwitterionic surfactants are electrically neutral but possess local positive and negative charges within the same molecule. Suitable zwitterionic surfactants include but are not limited to zwitterionic phospholipids. Suitable phospholipids include phosphatidylcholine, phosphatidylethanolamine, diacyl-glycero-phosphoethanolamine (such as dimyristoyl-glycero-phosphoethanolamine (DMPE), dipalmitoyl-glycero-phosphoethanolamine (DPPE), distearoyl-glycero-phosphoethanolamine (DSPE), and dioleolyl-glycero-phosphoethanolamine (DOPE)). Mixtures of phospholipids that include anionic and zwitterionic phospholipids may be employed in this invention. Such mixtures include but are not limited to lysophospholipids, egg or soybean phospholipid or any combination thereof. The phospholipid, whether anionic, zwitterionic or a mixture of phospholipids, may be salted or desalted, hydrogenated or partially hydrogenated or natural semi-synthetic or synthetic.

In certain embodiments, the surfactant is poloxamer, e.g., poloxamer 188. In some embodiments, a composition of cells is cultivated in the presence of between 0.1 µl/ml and 10.0 µl/ml, between 0.2 µl/ml and 2.5 µl/ml, between 0.5 µl/ml and 5 µl/ml, between 1 µl/ml and 3 µl/ml, or between 2 µl/ml and 4 µl/ml of poloxamer. In some embodiments, the composition of cells is cultivated in the presence of, of about, or at least 0.1 µl/ml, 0.2 µl/ml, 0.4 µl/ml, 0.6 µl/ml, 0.8 µl/ml, 1 µl/ml, 1.5 µl/ml, 2.0 µl/ml, 2.5 µl/ml, 5.0 µl/ml, 10 µl/ml, 25 µl/ml, or 50 µl/ml of the surfactant. In certain embodiments, the composition of cells is cultivated in the presence of or of about 2 µl/ml of poloxamer.

In some aspects, engineered T cells populations (e.g., CD4, CD8) may be expanded separately or expanded together until they each reach a threshold amount or cell density. In particular embodiments, the cultivation ends, such as by harvesting cells, when cells achieve a threshold amount, concentration, and/or expansion. In particular embodiments, the cultivation ends when the cell achieve or achieve about or at least a 1.5-fold expansion, a 2-fold expansion, a 2.5-fold expansion, a 3-fold expansion, a 3.5-fold expansion, a 4-fold expansion, a 4.5-fold expansion, a 5-fold expansion, a 6-fold expansion, a 7-fold expansion, a 8-fold expansion, a 9-fold expansion, a 10-fold expansion, or greater than a 10-fold expansion, e.g., with respect and/or in relation to the amount of density of the cells at the start or initiation of the cultivation. In some embodiments, the threshold expansion is a 4-fold expansion, e.g., with respect and/or in relation to the amount of density of the cells at the start or initiation of the cultivation. In some embodiments, the cultivation ends, such as by harvesting cells, when the cells achieve a threshold total amount of cells, e.g., threshold cell count. In some embodiments, the cultivation ends when the cells achieve a threshold total nucleated cell (TNC) count. In some embodiments, the cultivation ends when the cells achieve a threshold viable amount of cells, e.g., threshold viable cell count. In some embodiments, the threshold cell count is or is about or is at least of $50\times10^6$ cells, $100\times10^6$ cells, $200\times10^6$ cells, $300\times10^6$ cells, $400\times10^6$ cells, $600\times10^6$ cells, $800\times10^6$ cells, $1000\times10^6$ cells, $1200\times10^6$ cells, $1400\times10^6$ cells, $1600\times10^6$ cells, $1800\times10^6$ cells, $2000\times10^6$ cells, $2500\times10^6$ cells, $3000\times10^6$ cells, $4000\times10^6$ cells, $5000\times10^6$ cells, $10,000\times10^6$ cells, $12,000\times10^6$ cells, $15,000\times10^6$ cells or $20,000\times10^6$ cells, or any of the foregoing threshold of viable cells.

In particular embodiments, the cultivation ends when the cells achieve a threshold cell count. In some embodiments, the cultivation ends at, at about, or within 6 hours, 12 hours, 24 hours, 36 hours, 1 day, 2 days, 3 days, 4 days, 5 days, 6 days, or 7 or more days, after the threshold cell count is achieved. In particular embodiments, the cultivation is ended at or about 1 day after the threshold cell count is achieved. In certain embodiments, the threshold density is, is about, or is at least $0.1\times10^6$ cells/ml, $0.5\times10^6$ cells/ml, $1\times10^6$ cells/ml, $1.2\times10^6$ cells/ml, $1.5\times10^6$ cells/ml, $1.6\times10^6$ cells/ml, $1.8\times10^6$ cells/ml, $2.0\times10^6$ cells/ml, $2.5\times10^6$ cells/ml, $3.0\times10^6$ cells/ml, $3.5\times10^6$ cells/ml, $4.0\times10^6$ cells/ml, $4.5\times10^6$ cells/ml, $5.0\times10^6$ cells/ml, $6\times10^6$ cells/ml, $8\times10^6$ cells/ml, or $10\times10^6$ cells/ml, or any of the foregoing threshold of viable cells. In particular embodiments, the cultivation ends when the cells achieve a threshold density. In some embodiments, the cultivation ends at, at about, or within 6 hours, 12 hours, 24 hours, 36 hours, 1 day, 2 days, 3 days, 4 days, 5 days, 6 days, or 7 or more days, after the threshold density is achieved. In particular embodiments, the cultivation is ended at or about 1 day after the threshold density is achieved.

In some embodiments, at least a portion of the cultivation is carried out under static conditions. In some embodiments, at least a portion of the cultivation is carried out with perfusion, such as to perfuse out spent media and perfuse in fresh media during the culture. In some embodiments, the method includes a step of perfusing fresh culture medium into the cell culture, such as through a feed port. In some embodiments, the culture media added during perfusion contains the one or more stimulating agents, e.g. one or more recombinant cytokine, such as IL-2, IL-7 and/or IL-15. In some embodiments, the culture media added during perfusion is the same culture media used during a static incubation.

In some embodiments, subsequent to the incubation, the container, e.g., bag, is re-connected to a system for carrying out the one or more other processing steps of for manufacturing, generating or producing the cell therapy, such as is re-connected to the system containing the centrifugal chamber. In some aspects, cultured cells are transferred from the bag to the internal cavity of the chamber for formulation of the cultured cells.

a. Monitoring Cells During Incubation

In some embodiments, the cells are monitored during the incubation step, e.g., under expanded (e.g., cultivation) or minimally expanded/non-expanded (e.g., incubation). Monitoring may be performed, for example, to ascertain (e.g., measure, quantify) cell morphology, cell phenotype, cell viability, cell death, and/or cell concentration (e.g., viable cell concentration). In some embodiments, the monitoring is performed manually, such as by a human operator. In some embodiments, the monitoring is performed by an automated system. The automated system may require minimal or no manual input to monitor the cultivated cells. In some embodiments, the monitoring is performed both manually and by an automated system.

In certain embodiments, the cells are monitored by an automated system requiring no manual input. In some embodiments, the automated system is compatible with a bioreactor, for example a bioreactor as described herein, or an incubator, for example as described herein, such that cells undergoing incubation, e.g., undering expanded or minimally expanded conditions, can be removed from the bioreactor or incubator, monitored, and subsequently returned to the bioreactor or incubator. In some embodiments, the monitoring and incubation occur in a closed loop configuration. In some aspects, in a closed loop configuration, the automated system and bioreactor or incubator remain sterile. In embodiments, the automated system is sterile. In some embodiments, the automated system is an in-line system.

In some embodiments, the automated system includes the use of optical techniques (e.g., microscopy) for detecting cell morphology, cell phenotype, cell viability, cell death, and/or cell concentration (e.g., viable cell concentration). Any optical technique suitable for determining, for example, cell features, viability, and concentration are contemplated herein. Non-limiting examples of useful optical techniques include bright field microscopy, fluorescence microscopy, differential interference contrast (DIC) microscopy, phase contrast microscopy, digital holography microscopy (DHM), differential digital holography microscopy (DDHM), or a combination thereof. Differential digital holography microscopy, DDHM, and differential DHM may be used herein interchangeably. In certain embodiments, the automated system includes a differential digital holography microscope. In certain embodiments, the automated system includes a differential digital holography microscope including illumination means (e.g., laser, led). Descriptions of DDHM methodology and use may be found, for example, in U.S. Pat. No. 7,362,449; EP 1,631,788; U.S. Pat. Nos. 9,904,248; and 9,684,281, which are incorporated herein by reference in their entirety.

DDHM permits label-free, non-destructive imaging of cells, resulting in high-contrast holographic images. The images may undergo object segmentation and further analysis to obtain a plurality of morphological features that quantitatively describe the imaged objects (e.g., cultivated cells, cellular debris). As such, various features (e.g., cell morphology, phenotype, cell viability, cell concentration) may be directly assessed or calculated from DDHM using, for example, the steps of image acquisition, image processing, image segmentation, and feature extraction. In some embodiments, the automated system includes a digital recording device to record holographic images. In some embodiments, the automated system includes a computer including algorithms for analyzing holographic images. In some embodiments, the automated system includes a monitor and/or computer for displaying the results of the holographic image analysis. In some embodiments, the analysis is automated (i.e., capable of being performed in the absence of user input). An example of a suitable automated system for monitoring cells during the cultivating step includes, but is not limited to, Ovizio iLine F (Ovizio Imaging Systems NV/SA, Brussels, Belgium).

In certain embodiments, the monitoring is performed continuously throughout the duration of the incubation. In some embodiments, the monitoring is performed in real-time. In some embodiments, the monitoring is performed at discrete time points. In some embodiments, the monitoring is performed at least every 15 minutes for the duration of the incubation step. In some embodiments, the monitoring is performed at least every 30 minutes for the duration of the incubation step. In some embodiments, the monitoring is performed at least every 45 minutes for the duration of the incubation step. In some embodiments, the monitoring is performed at least every hour for the duration of the incubation step. In some embodiments, the monitoring is performed at least every 2 hours for the duration of the incubation step. In some embodiments, the monitoring is performed at least every 4 hours for the duration of the incubation step. In some embodiments, the monitoring is performed at least every 6 hours for the duration of the incubation step. In some embodiments, the monitoring is performed at least every 8 hours for the duration of the incubation step. In some embodiments, the monitoring is performed at least every 10 hours for the duration of the incubation step. In some embodiments, the monitoring is performed at least every 12 hours for the duration of the incubation step. In some embodiments, the monitoring is performed at least every 14 hours for the duration of the incubation step. In some embodiments, the monitoring is performed at least every 16 hours for the duration of the incubation step. In some embodiments, the monitoring is performed at least every 18 hours for the duration of the incubation step. In some embodiments, the monitoring is performed at least every 20 hours for the duration of the incubation step. In some embodiments, the monitoring is performed at least every 22 hours for the duration of the incubation step. In some embodiments, the monitoring is performed at least once a day for the duration of the incubation step. In some embodiments, the monitoring is performed at least once every second day for the duration of the incubation step. In some embodiments, the monitoring is performed at least once during the incubation step.

In some embodiments, features of the cells that can be determined by the monitoring, including using optical techniques such as DHM or DDHM, include cell viability, cell concentration, cell number and/or cell density. In some embodiments, cell viability is characterized or determined. In some embodiments, cell concentration, density and/or number is characterized or determined. In some embodiments, viable cell concentration, viable cell number and/or viable cell density is characterized or determined.

In some embodiments, for example when the cells undergo incubation under cultivating conditions for expansion, the cells are monitored by the automated system until a threshold of expansion is reached, such as 1, 2, 3, 4, or more population doublings. In some embodiments, once a threshold of expansion is reached, the cells are harvested, such as by automatic or manual methods, for example, by a human operator. The threshold of expansion may depend on the total concentration, density and/or number of cultured cells determined by the automated system. Alternatively, the threshold of expansion may depend on the viable cell concentration, density and/or number.

In some embodiments, the harvested cells are formulated as described, such as in the presence of a pharmaceutically acceptable carrier. In some embodiments, the harvested cells are formulated in the presence of a cryoprotectant.

F. Small Molecules in Process

In some embodiments, provided herein are methods comprising manufacturing or producing engineered cells (e.g., CAR-T cells) in the presence of a modulating agent, thereby improving the persistence, lack of exhaustion, and/or efficacy of the engineered cells manufactured or produced by the methods. In some aspects, the provided methods produce compositions of cells that include primary T cells engineered to express a recombinant receptor, such as for use in cell therapy, that (i) contain fewer exhausted cells and/or fewer cells that display markers or phenotypes associated with exhaustion; (ii) contain an increased percentage of memory-like T cells, such as long-lived memory T cells; (iii) are less differentiated; (iv) exhibit improved or enhanced survival, expansion, persistence, and/or anti-tumor activity; (v) exhibit improved therapeutic efficacy; and/or (vi) exhibit improved clinical durability of response, as compared to compositions of engineered cells that are produced by alternative methods, such as alternative methods that are not carried out in the presence of the modulating agent. In some embodiments, the comparison to an alternative process is made to the same process that differs only in that the alternative process is not carried out in the presence of the modulating agent.

In some embodiments, the modulating agent is in contact with the cells or cell populations (e.g., the modulating agent is in a cell or interacts with one or more cell surface molecule) prior to collecting, harvesting, or formulating the cells. In some embodiments, the modulating agent is present prior to, during, or after the cells are subjected to stimulation, e.g., T cell activation. In some embodiments, the modulating agent is in contact with the cells or cell populations (e.g., the modulating agent is in a cell or interacts with one or more cell surface molecule) prior to or during the stimulation, e.g., a stimulation described herein such as in Section I-C. In some embodiments, the modulating agent is present prior to, during, or after the cells are subjected to engineering, e.g., transduction. In some embodiments, the modulating agent is in contact with the cells or cell populations (e.g., the modulating agent is in a cell or interacts with one or more cell surface molecule) prior to or during the engineering, e.g., an engineering described herein such as in Section I-E. In some embodiments, the modulating agent is in contact with the cells or cell populations (e.g., the modulating agent is in a cell or interacts with one or more cell surface molecule) during or after the incubation, e.g., an incubation described herein such as in Section I-E-3. In some embodiments, the modulating agent is in contact with the cells or cell populations (e.g., the modulating agent is in a cell or interacts with one or more cell surface molecule) during the stimulation (e.g., a stimulation described herein such as in Section I-C), during the engineering (an engineering described herein such as in Section I-E), and/or during the incubation (e.g., an incubation described herein such as in Section I-E-3). In certain embodiments, the cells or cell population undergoes a process, procedure, step, or technique in the presence of the modulating agent after the incubation but prior to steps for collecting, harvesting, or formulating the cells. In particular embodiments, the cells or cell population undergoes a process, procedure, step, or technique in the presence of the modulating agent after the incubation.

In some embodiments, cells to be engineered (e.g. transduced) are contacted (e.g., incubated) with the modulating agent, e.g. in a culture media, prior to the engineering. In some embodiments, the cells are engineered in the presence of the modulating agent. In some embodiments, one or more engineered cells are contacted (e.g., incubated) with the modulating agent, e.g. in a culture media such as a basal medium without one or more recombinant cytokines or without any recombinant cytokine. Also provided in some embodiments are compositions during the manufacture or production of engineered cells, e.g., for cell-based therapies, that comprise (i) the modulating agent and (ii) cells to be engineered and/or cells that have been subjected to engineering (including engineered cells), such as primary immune cells (e.g., T cells).

In some embodiments, the modulating agent is selected from the group consisting of a PI3K inhibitor, an Akt pathway, an mTOR inhibitor, a Ras/ERK inhibitor, an NF-κB inhibitor, a BET inhibitor, a CDK inhibitor, a CRAC channel inhibitor, a Cox inhibitor, a dopamine antagonist, an ERK5 inhibitor, a glucocorticoid, an IGF-1R inhibitor, an IKK inhibitor, a JAK inhibitor, Lck inhibitor, a PDK1 inhibitor, a Raf inhibitor, and a Syk inhibitor. In some embodiments, the Src inhibitors include, but are not limited to dasatinib, saracatinib, bosutinib, KX01, and rebastinib (DCC-2036). In some embodiments, the Src inhibitor comprises rebastinib (DCC-2036). Certain agents useful as the modulating agent of the present disclosure are disclosed in WO2019018603, WO2018106595, and PCT/US2018/058812, all of which are incorporated herein by reference in the entirety.

In some embodiments, the modulating agent is or comprises a compound, a small molecule, e.g., small organic molecule, a polynucleotide, an oligonucleotide, an siRNA, or a polypeptide, or a fragment, isoform, variant, analog, or derivative thereof that inhibits, reduces, prevents, and/or is capable of inhibiting, reducing, or preventing, one or more activities of the target such as mTOR. In particular embodiments, the agent is a small molecule with a molecular weight of less than 10 kD, less than 9 kD, less than 8 kD, less than 7 kD, less than 6 kD, less than 5 kD, less than 4 kD, less than 3 kD, less than 2 kD, less than 1 kD, less than 0.5 kD, or less than 0.1 kD.

In some embodiments, the modulating agent is or comprises an agent that inhibits mTOR activity. In some embodiments, cells to be engineered (e.g. transduced) are contacted (e.g., incubated) with an mTOR inhibitor prior to the engineering. In some embodiments, the cells are engineered in the presence of an mTOR inhibitor. In some embodiments, one or more engineered cells are contacted (e.g., incubated) with an mTOR inhibitor, e.g. in a culture media such as a basal medium without one or more recombinant cytokines or without any recombinant cytokine. Also provided in some embodiments are compositions during the manufacture or production of engineered cells that comprise (i) an mTOR inhibitor and (ii) cells to be engineered and/or cells that have been subjected to engineering (including engineered cells).

In some embodiments, an agent that inhibits mTOR activity inhibits, reduces, and/or decreases, and/or is capable of inhibiting, reducing, and/or decreasing at least one activity of mTOR. In particular embodiments, an agent that inhibits mTOR activity inhibits, reduces, and/or decreases, and/or is capable of inhibiting, reducing, and/or decreasing an mTOR kinase activity. In some embodiments, an agent that inhibits mTOR activity inhibits, reduces, and/or decreases, and/or is capable of inhibiting, reducing, and/or decreasing an mTORC1 activity, e.g., an mTORC1 kinase activity, and/or an mTORC2 activity. In some embodiments, the agent that inhibits mTOR activity prevents the formation of and/or destabilizes the mTORC1 complex. In particular embodiments, the agent that inhibits activity prevents the formation of and/or destabilizes the mTORC2 complex.

In particular embodiments, the agent that inhibits mTOR activity inhibits the activity of at least one additional kinase. In certain embodiments, the at least one additional kinase is PI3K. In particular embodiments, the agent that inhibits mTOR activity: (i) does not inhibit PI3K activity; (ii) does not detectably inhibit PI3K activity at the $IC_{50}$ for mTOR activity; and/or (iii) does not detectably inhibit PI3K at all concentrations that detectably inhibit mTOR activity. In some embodiments, the agent that inhibits mTOR activity inhibits, e.g., selectively inhibits, mTORC1 and mTORC2 kinase activity relative to PI3K activity. In certain embodiments, the agent that inhibits mTOR activity inhibits mTORC1 and mTORC2 kinase activity. In particular embodiments, the agent that inhibits mTOR activity selectively inhibits mTORC1 activity, such as the mTORC1 kinase activity.

In certain embodiments, the agent that inhibits mTOR activity: (i) does not inhibit mTORC2 activity; (ii) does not detectably inhibit mTORC2 activity at the $IC_{50}$ for mTORC1 activity; and/or (iii) does not detectably inhibit mTORC2 at all concentrations that detectably inhibit mTORC1 activity.

In some embodiments, the agents that inhibit mTOR activity include, but are not limited to, CC214-1 (Celgene), CC214-2 (Celgene), CC0470324, GDC0980, SAR245409, VS5584, PI-103, SF1126, BGT226, XL765, PF-04691502, Dactolisib (codenamed NVP-BEZ235 and BEZ-235), a pyrazolopyrimidine, Torin 1, Torkinib (PP242), PP30, Ku-0063794, WAY-600 (Wyeth), WAY-687 (Wyeth), WAY-354 (Wyeth), DS3078a, rapamycin (sirolimus), temsirolimus (CC1779), everolimus (RAD001), deforolimus (AP23573), AZD8055 (AstraZeneca), and OSI-027 (OSI). In some embodiments, the agent that inhibits mTOR activity has or includes a formula that is provided in Formula (I), Formula (II), or Formula (III). In some embodiments, the agent is Compound 155, Compound 246, or Compound 63.

In particular embodiments, the agent comprises a formula set forth in Formula (I),

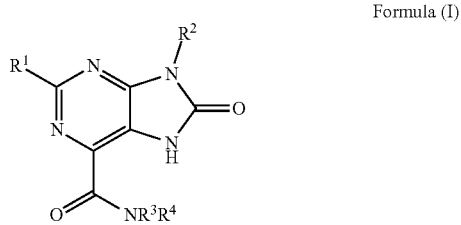

Formula (I)

wherein $R^1$ is substituted or unsubstituted $C_{1-8}$ alkyl, substituted or unsubstituted aryl, substituted or unsubstituted heteroaryl, substituted or unsubstituted cycloalkyl, or substituted or unsubstituted heterocycloalkyl, $R^2$ is substituted or unsubstituted $C_{1-8}$ alkyl, substituted or unsubstituted aryl, substituted or unsubstituted heteroaryl, substituted or unsubstituted cycloalkyl, or substituted or unsubstituted heterocycloalkyl, and $R^3$ and $R^4$ are independently H or $C_{1-8}$alkyl. In some embodiments, the agent that inhibits mTOR activity is or comprises a compound of Formula (I), or a pharmaceutically acceptable salt or solvate thereof. In some embodiments, the agent that inhibits mTOR activity is or comprises a compound of Formula (I), or a pharmaceutically acceptable salt thereof. In some embodiments, the agent that inhibits mTOR activity is or comprises 2-(3-hydroxyphenyl)-9-(2-isopropylphenyl)-8-oxo-8,9-dihydro-7H-purine-6-carboxamide, or a pharmaceutically acceptable salt or solvate thereof. In some embodiments, the agent that inhibits mTOR activity is or comprises

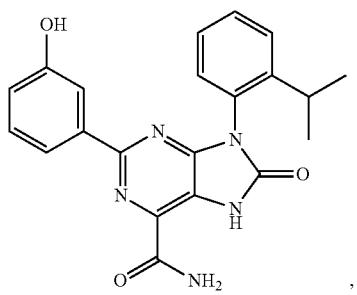 [SMILES: CC(C)c1ccccc1-n1c(=O)[nH]c2c(C(N)=O)nc(-c3cccc(O)c3)nc21]

or a pharmaceutically acceptable salt thereof.

In some embodiments, the agent comprises a formula set forth in Formula (II),

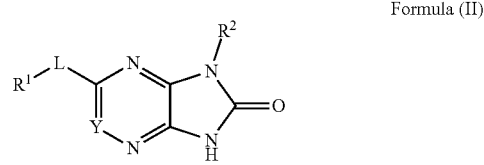

Formula (II)

wherein L is a direct bond, NH or O, Y is N or $CR^3$, wherein $R^1$ is H, substituted or unsubstituted $C_{1-8}$ alkyl, substituted or unsubstituted $C_{2-8}$ alkenyl, substituted or unsubstituted aryl, substituted or unsubstituted heteroaryl, substituted or unsubstituted cycloalkyl or substituted or unsubstituted heterocycloalkyl, $R^2$ is H, substituted or unsubstituted $C_{1-8}$alkyl, substituted or unsubstituted aryl, substituted or unsubstituted heteroaryl, substituted or unsubstituted cycloalkyl, or substituted or unsubstituted heterocycloalkyl, $R^3$ is H, substituted or unsubstituted $C_{1-8}$alkyl, substituted or unsubstituted aryl, substituted or unsubstituted heteroaryl, substituted or unsubstituted cycloalkyl, substituted or unsubstituted heterocycloalkyl, —$NHR^4$ or —$N(R^4)_2$, and $R^4$ is at each occurrence independently substituted or unsubstituted $C_{1-8}$ alkyl, substituted or unsubstituted aryl, substituted or unsubstituted heteroaryl, substituted or unsubstituted cycloalkyl, or substituted or unsubstituted heterocycloalkyl. In some embodiments, the agent that inhibits mTOR activity is or comprises a compound of Formula (II), or a pharmaceutically acceptable salt or solvate thereof. In some embodiments, the agent that inhibits mTOR activity is or comprises 6-(4-(2H-1,2,4-triazol-3-yl)phenyl)-1-(2-(tetrahydro-2H-pyran-4-yl)ethyl)-1H-imidazo [4,5-b] pyrazine-2(3H)-one, or a pharmaceutically acceptable salt or solvate thereof. In some embodiments, the agent that inhibits mTOR activity is or comprises

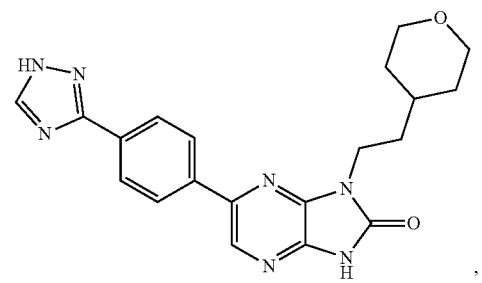 [SMILES: O=c1[nH]c2ncc(-c3ccc(-c4nc[nH]n4)cc3)nc2n1CCC1CCOCC1]

or a pharmaceutically acceptable salt thereof.

In particular embodiments, the agent comprises a formula set forth in Formula (III),

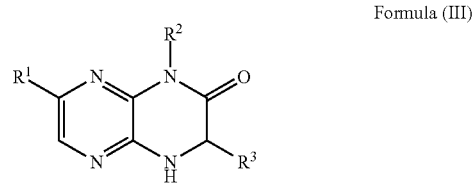

Formula (III)

wherein R¹ is substituted or unsubstituted $C_{1-8}$ alkyl, substituted or unsubstituted aryl, substituted or unsubstituted cycloalkyl, substituted or unsubstituted heterocyclyl, or substituted or unsubstituted heterocyclylalkyl, R² is H, substituted or unsubstituted $C_{1-8}$ alkyl, substituted or unsubstituted cycloalkyl, substituted or unsubstituted heterocyclyl, substituted or unsubstituted heterocyclylalkyl, substituted or unsubstituted aralkyl, or substituted or unsubstituted cycloalkylalkyl, and R³ is H, or a substituted or unsubstituted $C_{1-8}$ alkyl. In certain embodiments, R¹ is substituted or unsubstituted aryl or substituted or unsubstituted heteroaryl. In some embodiments, R¹ is pyridyl that is substituted. In some embodiments, the agent that inhibits mTOR activity is or comprises a compound of Formula (III), or a pharmaceutically acceptable salt or solvate thereof. In some embodiments, the agent that inhibits mTOR activity is or comprises a compound of Formula (III), or a pharmaceutically acceptable salt thereof. In some embodiments, the agent that inhibits mTOR activity is or comprises 7-(6-(2-hydroxypropan-2-yl)pyridin-3-yl)-1-((1r,4r)-4-methoxycyclohexyl)-3,4-dihydropyrazino[2,3-b]pyrazin-2(1H)-one, or a pharmaceutically acceptable salt or solvate thereof. In some embodiments, the agent that inhibits mTOR activity is or comprises

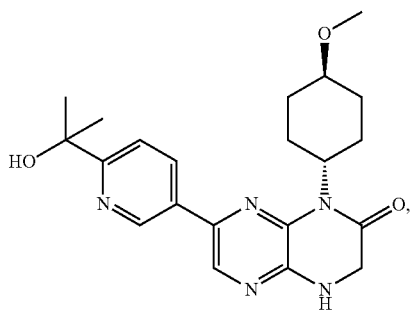 [SMILES: CO[C@H]1CC[C@H](N2C(=O)CNc3ncc(-c4ccc(C(C)(C)O)nc4)nc32)CC1]

or a pharmaceutically acceptable salt thereof.

As understood by those skilled in the art, the scope of the present invention also includes analogues or derivatives of all other agents functionally categorized under their respective class based on their targets, which analogues or derivatives include, but are not limited to, salt, ester, ether, solvate, hydrate, stereoisomer or prodrug.

G. Harvesting and Collecting Cells

In some embodiments, the cells are harvested or collected. In particular embodiments, the cells are collected or harvested after the completion of the incubation as described in Section I-E-3. In certain embodiments, the collected or harvested cells are the cells of an output population. In some embodiments, the output population includes cells that are viable, CD3+, CD4+, CD8+, and/or positive for a recombinant receptor, e.g., CAR+. In particular embodiments, the harvested CD4+ T cells and formulated CD8+ T cells are the output CD4+ and CD8+ T cells. In particular embodiments, a formulated cell population, e.g., a formulated population of enriched CD4+ and CD8+ cells, is an output cell population, e.g., an output population of enriched CD4+ and CD8+ cells.

In some embodiments, the cells or cell population that is harvested, collected, or formulated have not undergone any expansion, e.g., any conditions where the cells were incubated or cultivated under conditions that increase the amount of viable cells during the incubation or cultivation. For example, in some aspects, the cells that are harvested have not undergone any incubation or cultivation where the amount of total viable cells is increased at the end of the incubation or cultivation as compared to the number of total viable cells at the beginning of the incubation or cultivation. In some embodiments, the cells that are harvested have not undergone any incubation or cultivation step explicitly for the purpose of increasing (e.g., expanding) the total number of viable cells at the end of the incubation or cultivation process compared to the beginning of said incubation or cultivation process. In some embodiments, the cells are incubated or cultivated under conditions that may result in expansion, but the incubating or cultivating conditions are not carried out for purposes of expanding the cell population. In some embodiments, the cells that are harvested may have undergone expansion despite having been manufactured in a process that does not include an expansion step. In some embodiments, a manufacturing process that does not include an expansion step is referred to as a non-expanded or minimally expanded process. A "non-expanded" process may also be referred to as a "minimally expanded" process. In some embodiments, a non-expanded or minimally expanded process may result in cells having undergone expansion despite the process not including a step for expansion. In some embodiments, the cells that are harvested may have undergone an incubation or cultivating step that includes a media composition designed to reduce, suppress, minimize, or eliminate expansion of a cell population as a whole. In some embodiments, the collected, harvested, or formulated cells have not previously undergone an incubation or cultivation that was performed in a bioreactor, or under conditions where the cells were rocked, rotated, shaken, or perfused for all or a portion of the incubation or cultivation.

In some embodiments, the cells or cell population that is harvested, collected, or formulated has undergone an expansion, e.g., a condition where the cells were incubated or cultivated under conditions that increase the amount of viable cells during the incubation or cultivation. For example, in some aspects, the cells that are harvested have undergone an incubation or cultivation where the amount of total viable cells is increased at the end of the incubation or cultivation as compared to the number of total viable cells at the beginning of the incubation or cultivation. In some embodiments, the cells that are harvested have undergone an incubation or cultivation step explicitly for the purpose of increasing (e.g., expanding) the total number of viable cells at the end of the incubation or cultivation process compared to the beginning of said incubation or cultivation process. In some embodiments, the cells that are harvested have undergone an incubation or cultivating step that includes a media composition designed to facilitate or promote expansion of a cell population as a whole. In some embodiments, the collected, harvested, or formulated cells have previously undergone an incubation or cultivation that was performed in a bioreactor, or under conditions where the cells were rocked, rotated, shaken, or perfused for all or a portion of the incubation or cultivation.

In some embodiments, a cell selection, isolation, separation, enrichment, and/or purification step is performed before the cells or cell population is harvested, collected, or formulated. In some embodiments, the cell selection, isolation, separation, enrichment, and/or purification step is carried out using chromatography as disclosed herein. In some embodiments, a T cell selection step by chromatography is performed after T cell transduction, but prior to harvesting, prior to collecting, and/or prior to formulating the cells. In some embodiments, a T cell selection step by chromatography is performed immediately prior to harvesting the cells.

In certain embodiments, the amount of time from the initiation of the stimulation (e.g., on-column stimulation) to collecting, harvesting, or formulating the cells is, is about, or is less than 24 hours, 36 hours, 42 hours, 48 hours, 54 hours, 60 hours, 72 hours, 84 hours, 96 hours, 108 hours, or 120 hours. In some embodiments, the amount of time from the initiation of the stimulation to collecting, harvesting, or formulating the cells for generating engineered cells, from the initiation of the stimulation to collecting, harvesting, or formulating the cells is between or between about 12 hours and 24 hours, 36 hours and 120 hours, 48 hours and 96 hours, or 48 hours and 72 hours, inclusive. In particular embodiments, the amount of time from the initiation of incubation to harvesting, collecting, or formulating the cells is, is about, or is less than 48 hours, 72 hours, or 96 hours. In particular embodiments, the amount of time from the initiation of incubation to harvesting, collecting, or formulating the cells is 48 hours±6 hours, 72 hours±6 hours, or 96 hours±6 hours. In particular embodiments, the amount of time from the initiation of incubation to harvesting, collecting, or formulating the cells is or is about 96 hours or four days.

In particular embodiments, the cells are harvested, collected, or formulated in a serum-free medium, such as one described herein in Section III or in PCT/US2018/064627, which is incorporated herein by reference. In some embodiments, the cells are harvested, collected, or formulated into the same serum-free medium as used during the incubation, e.g., as described herein in Section I-E-3.

In particular embodiments, the cells are harvested, collected or formulated in a basal media that does not contain one more recombinant cytokines and that does not contain a serum component, i.e. is a serum-free media, but may contain one or more additional components such as described in Section III. B. In particular embodiments, use of such a serum-free media provides for a lean media that provides for maintenance of cells but does not include certain factors that may activate or render the cells metabolically active thereby fostering the cells in a state that is or is likely to be a resting or a quiescent state. In some aspects, incubation in the presence of such a serum-free media allows the cells to recover after the stimulation (e.g., according to Section I-C) and genetic engineering (e.g. transduction). In some aspects, harvesting, collecting or formulating cells in the presence of such a serum-free media results in a formulation of the output composition (e.g., therapeutic cell composition) containing cells that are less susceptible to damage or loss of viability, e.g., when the harvested/formulated cells are cryopreserved and then thawed immediately prior to use. In some embodiments, cells in the output composition (e.g., therapeutic cell composition) when thawed have lower levels of caspase or other marker of apoptosis than cells that have been incubated in a similar media but containing one or more recombinant cytokines, serum, or other factors that may make the cells more metabolically active at cryopreservation of the output composition (e.g., therapeutic cell composition).

In certain embodiments, one or more populations of enriched T cells are formulated. In particular embodiments, one or more populations of enriched T cells are formulated after the one or more populations have been engineered and/or cultivated. In particular embodiments, the one or more populations are input populations or output compositions (e.g., selected and stimulated cells). In some embodiments, the one or more input populations or output compositions have been previously cryoprotected and stored, and are thawed prior to the incubation (e.g., incubation as described in Section I-E-3).

In certain embodiments, the cells are harvested prior to, prior to about, or prior to at least one, two, three, four, five, six, eight, ten, twenty, or more cell doublings of the cell population, e.g., doublings that occur during the incubating.

In particular embodiments, the cells are harvested or collected at a time before the total number of cells, e.g., total number of incubated cells or cells undergoing the incubation (e.g., incubation as described in Section I-E-3), is greater than or than about one, two, three, four, five, six, eight, ten, twenty, or more than twenty times the number of cells of the input population, e.g., the total number of cells that were contacted with the stimulatory reagent. In some embodiments, the cells are harvested or collected at a time before the total number of incubated cells is greater than or than about one, two, three, four, five, six, eight, ten, twenty, or more than twenty times the total number of cells that were transformed, transduced, or spinoculated, e.g., the total number of cells that were contacted with a viral vector. In certain embodiments, the cells are T cells, viable T cells, CD3+ T cells, CD4+ T cells, CD8+ T cells, CAR expressing T cells, or a combination of any of the foregoing. In particular embodiments, the cells are harvested or collected at a time before the total number of cells is greater than the total number of cells of the input population. In various embodiments, the cells are harvested or collected at a time before the total number of viable CD3+ T cells is greater than the total number of viable CD3+ cells of the input population. In particular embodiments, the cells are harvested or collected at a time before the total number of cells is greater than the total number of cells of the transformed, transduced, or spinoculated cells. In various embodiments, the cells are harvested or collected at a time before the total number of viable CD3+ T cells is greater than the total number of viable CD3+ of the transformed, transduced, or spinoculated cells.

In certain embodiments, the formulated cells are output cells. In some embodiments, a formulated population of enriched T cells is an output population of enriched T cells. In particular embodiments, the formulated CD4+ T cells and formulated CD8+ T cells are the output CD4+ and CD8+ T cells. In particular embodiments, a formulated cell population, e.g., a formulated population of enriched CD4+ and CD8+ cells, is an output cell population, e.g., an output population of enriched CD4+ and CD8+ cells.

In some embodiments, cells can be formulated into a container, such as a bag or vial.

In some embodiments, the cells are formulated in a pharmaceutically acceptable buffer, which may, in some aspects, include a pharmaceutically acceptable carrier or excipient. In some embodiments, the processing includes exchange of a medium into a medium or formulation buffer that is pharmaceutically acceptable or desired for administration to a subject. In some embodiments, the processing steps can involve washing the transduced and/or expanded cells to replace the cells in a pharmaceutically acceptable buffer that can include one or more optional pharmaceutically acceptable carriers or excipients. Exemplary of such pharmaceutical forms, including pharmaceutically acceptable carriers or excipients, can be any described below in conjunction with forms acceptable for administering the cells and compositions to a subject. The pharmaceutical composition in some embodiments contains the cells in amounts effective to treat or prevent the disease or condition, such as a therapeutically effective or prophylactically effective amount.

A "pharmaceutically acceptable carrier" refers to an ingredient in a pharmaceutical formulation, other than an active ingredient, which is nontoxic to a subject. A pharmaceutically acceptable carrier includes, but is not limited to, a buffer, excipient, stabilizer, or preservative.

In some aspects, the choice of carrier is determined in part by the particular cell and/or by the method of administration. Accordingly, there are a variety of suitable formulations. For example, the pharmaceutical composition can contain preservatives. Suitable preservatives may include, for example, methylparaben, propylparaben, sodium benzoate, and benzalkonium chloride. In some aspects, a mixture of two or more preservatives is used. The preservative or mixtures thereof are typically present in an amount of about 0.0001% to about 2% by weight of the total composition. Carriers are described, e.g., by Remington's Pharmaceutical Sciences 16th edition, Osol, A. Ed. (1980). Pharmaceutically acceptable carriers are generally nontoxic to recipients at the dosages and concentrations employed, and include, but are not limited to: buffers such as phosphate, citrate, and other organic acids; antioxidants including ascorbic acid and methionine; preservatives (such as octadecyldimethylbenzyl ammonium chloride; hexamethonium chloride; benzalkonium chloride; benzethonium chloride; phenol, butyl or benzyl alcohol; alkyl parabens such as methyl or propyl paraben; catechol; resorcinol; cyclohexanol; 3-pentanol; and m-cresol); low molecular weight (less than about 10 residues) polypeptides; proteins, such as serum albumin, gelatin, or immunoglobulins; hydrophilic polymers such as polyvinylpyrrolidone; amino acids such as glycine, glutamine, asparagine, histidine, arginine, or lysine; monosaccharides, disaccharides, and other carbohydrates including glucose, mannose, or dextrins; chelating agents such as EDTA; sugars such as sucrose, mannitol, trehalose or sorbitol; salt-forming counter-ions such as sodium; metal complexes (e.g. Zn-protein complexes); and/or non-ionic surfactants such as polyethylene glycol (PEG).

Buffering agents in some aspects are included in the compositions. Suitable buffering agents include, for example, citric acid, sodium citrate, phosphoric acid, potassium phosphate, and various other acids and salts. In some aspects, a mixture of two or more buffering agents is used. The buffering agent or mixtures thereof are typically present in an amount of about 0.001% to about 4% by weight of the total composition. Methods for preparing administrable pharmaceutical compositions are known. Exemplary methods are described in more detail in, for example, Remington: The Science and Practice of Pharmacy, Lippincott Williams & Wilkins; 21st ed. (May 1, 2005).

The formulations can include aqueous solutions. The formulation or composition may also contain more than one active ingredient useful for the particular indication, disease, or condition being treated with the cells, preferably those with activities complementary to the cells, where the respective activities do not adversely affect one another. Such active ingredients are suitably present in combination in amounts that are effective for the purpose intended. Thus, in some embodiments, the pharmaceutical composition further includes other pharmaceutically active agents or drugs, such as chemotherapeutic agents, e.g., asparaginase, busulfan, carboplatin, cisplatin, daunorubicin, doxorubicin, fluorouracil, gemcitabine, hydroxyurea, methotrexate, paclitaxel, rituximab, vinblastine, and/or vincristine.

Compositions in some embodiments are provided as sterile liquid preparations, e.g., isotonic aqueous solutions, suspensions, emulsions, dispersions, or viscous compositions, which may in some aspects be buffered to a selected pH. Liquid compositions can comprise carriers, which can be a solvent or dispersing medium containing, for example, water, saline, phosphate buffered saline, polyol (for example, glycerol, propylene glycol, liquid polyethylene glycol) and suitable mixtures thereof. Sterile injectable solutions can be prepared by incorporating the cells in a solvent, such as in admixture with a suitable carrier, diluent, or excipient such as sterile water, physiological saline, glucose, dextrose, or the like. The compositions can contain auxiliary substances such as wetting, dispersing, or emulsifying agents (e.g., methylcellulose), pH buffering agents, gelling or viscosity enhancing additives, preservatives, flavoring agents, and/or colors, depending upon the route of administration and the preparation desired. Standard texts may in some aspects be consulted to prepare suitable preparations.

Various additives which enhance the stability and sterility of the compositions, including antimicrobial preservatives, antioxidants, chelating agents, and buffers, can be added. Prevention of the action of microorganisms can be ensured by various antibacterial and antifungal agents, for example, parabens, chlorobutanol, phenol, and sorbic acid. Prolonged absorption of the injectable pharmaceutical form can be brought about by the use of agents delaying absorption, for example, aluminum monostearate and gelatin.

In some embodiments, the formulation buffer contains a cryopreservative. In some embodiments, the cell are formulated with a cyropreservative solution that contains 1.0% to 30% DMSO solution, such as a 5% to 20% DMSO solution or a 5% to 10% DMSO solution. In some embodiments, the cryopreservation solution is or contains, for example, PBS containing 20% DMSO and 8% human serum albumin (HSA), or other suitable cell freezing media. In some embodiments, the cryopreservative solution is or contains, for example, at least or about 7.5% DMSO. In some embodiments, the processing steps can involve washing the transduced and/or expanded cells to replace the cells in a cryopreservative solution. In some embodiments, the cells are frozen, e.g., cryoprotected or cryopreserved, in media and/or solution with a final concentration of or of about 12.5%, 12.0%, 11.5%, 11.0%, 10.5%, 10.0%, 9.5%, 9.0%, 8.5%, 8.0%, 7.5%, 7.0%, 6.5%, 6.0%, 5.5%, or 5.0% DMSO, or between 1% and 15%, between 6% and 12%, between 5% and 10%, or between 6% and 8% DMSO. In particular embodiments, the cells are frozen, e.g., cryoprotected or cryopreserved, in media and/or solution with a final concentration of or of about 5.0%, 4.5%, 4.0%, 3.5%, 3.0%, 2.5%, 2.0%, 1.5%, 1.25%, 1.0%, 0.75%, 0.5%, or 0.25% HSA, or between 0.1% and −5%, between 0.25% and 4%, between 0.5% and 2%, or between 1% and 2% HSA.

In particular embodiments, the composition of enriched T cells, e.g., T cells that have been stimulated, engineered, and/or cultivated, are formulated, cryoprotected, and then stored for an amount of time. In certain embodiments, the formulated, cryoprotected cells are stored until the cells are released for infusion. In particular embodiments, the formulated cryoprotected cells are stored for between 1 day and 6 months, between 1 month and 3 months, between 1 day and 14 days, between 1 day and 7 days, between 3 days and 6 days, between 6 months and 12 months, or longer than 12 months. In some embodiments, the cells are cryoprotected and stored for, for about, or for less than 1 days, 2 days, 3 days, 4 days, 5 days, 6 days, or 7 days. In certain embodiments, the cells are thawed and administered to a subject after the storage. In certain embodiments, the cells are stored for or for about 5 days. In some embodiments, the formulated cells are not cryopreserved.

In some embodiments, the formulation is carried out using one or more processing step including washing, diluting or concentrating the cells, such as the cultured or expanded cells. In some embodiments, the processing can include dilution or concentration of the cells to a desired concentration or number, such as unit dose form compositions including the number of cells for administration in a given dose or fraction thereof. In some embodiments, the processing steps can include a volume-reduction to thereby increase the concentration of cells as desired. In some embodiments, the processing steps can include a volume-addition to thereby decrease the concentration of cells as desired. In some embodiments, the processing includes adding a volume of a formulation buffer to transduced and/or expanded cells. In some embodiments, the volume of formulation buffer is from or from about 10 mL to 1000 mL, such as at least or about at least or about or 50 mL, 100 mL, 200 mL, 300 mL, 400 mL, 500 mL, 600 mL, 700 mL, 800 mL, 900 mL or 1000 mL.

In some embodiments, such processing steps for formulating a cell composition are carried out in a closed system. Exemplary of such processing steps can be performed using a centrifugal chamber in conjunction with one or more systems or kits associated with a cell processing system, such as a centrifugal chamber produced and sold by Biosafe SA, including those for use with the Sepax® or Sepax 2® cell processing systems. An exemplary system and process is described in International Publication Number WO2016/073602. In some embodiments, the method includes effecting expression from the internal cavity of the centrifugal chamber a formulated composition, which is the resulting composition of cells formulated in a formulation buffer, such as pharmaceutically acceptable buffer, in any of the above embodiments as described. In some embodiments, the expression of the formulated composition is to a container, such as a bag that is operably linked as part of a closed system with the centrifugal chamber. In some embodiments, the container, such as bag, is connected to a system at an output line or output position.

In some embodiments, the closed system, such as associated with a centrifugal chamber or cell processing system, includes a multi-port output kit containing a multi-way tubing manifold associated at each end of a tubing line with a port to which one or a plurality of containers can be connected for expression of the formulated composition. In some aspects, a desired number or plurality of output containers, e.g., bags, can be sterilely connected to one or more, generally two or more, such as at least 3, 4, 5, 6, 7, 8 or more of the ports of the multi-port output. For example, in some embodiments, one or more containers, e.g., bags can be attached to the ports, or to fewer than all of the ports. Thus, in some embodiments, the system can effect expression of the output composition into a plurality of output bags.

In some aspects, cells can be expressed to the one or more of the plurality of output bags in an amount for dosage administration, such as for a single unit dosage administration or multiple dosage administration. For example, in some embodiments, the output bags may each contain the number of cells for administration in a given dose or fraction thereof. Thus, each bag, in some aspects, may contain a single unit dose for administration or may contain a fraction of a desired dose such that more than one of the plurality of output bags, such as two of the output bags, or 3 of the output bags, together constitute a dose for administration.

Thus, the containers, e.g., output bags, generally contain the cells to be administered, e.g., one or more unit doses thereof. The unit dose may be an amount or number of the cells to be administered to the subject or twice the number (or more) of the cells to be administered. It may be the lowest dose or lowest possible dose of the cells that would be administered to the subject.

In some embodiments, each of the containers, e.g., bags, individually comprises a unit dose of the cells. Thus in some embodiments, each of the containers comprises the same or approximately or substantially the same number of cells. In some embodiments, each unit dose contains at least or about at least $1 \times 10^6$, $2 \times 10^6$, $5 \times 10^6$, $1 \times 10^7$, $5 \times 10^7$, or $1 \times 10^8$ engineered cells, total cells, T cells, or PBMCs. In some embodiments, the volume of the formulated cell composition in each bag is 10 mL to 100 mL, such as at least or about at least 20 mL, 30 mL, 40 mL, 50 mL, 60 mL, 70 mL, 80 mL, 90 mL or 100 mL.

In some embodiments, such cells produced by the method, or a composition comprising such cells, are administered to a subject for treating a disease or condition.

H. Removal of Stimulatory Reagents

In some embodiments, the stimulatory reagent (e.g., oligomeric stimulatory reagent) is removed or separated from the collected cells or cell populations after collecting, harvesting, or formulating the cells. In some embodiments, the stimulatory reagents are removed or separated from the cells or cell populations after collection from the chromatography column, e.g., after the step of elution and cell collection as described in Section I-D. In some embodiments, the stimulatory reagents are removed or separated from the cells or cell populations after or during the incubation, e.g., an incubation described herein such as in Section I-E-3. In certain embodiments, the cells or cell population undergoes a process, procedure, step, or technique to remove the stimulatory reagent (e.g., oligomeric stimulatory reagent) after the incubation but prior to steps for collecting, harvesting, or formulating the cells. In particular embodiments, the cells or cell population undergoes a process, procedure, step, or technique to remove the stimulatory reagent (e.g., oligomeric stimulatory reagent) after the incubation. In some aspects, when stimulatory reagent (e.g., oligomeric stimulatory reagent) is separated or removed from the cells during the incubation, the cells are returned to the same incubation conditions as prior to the separation or removal for the remaining duration of the incubation.

In certain embodiments, the stimulatory reagent (e.g., oligomeric stimulatory reagent) is removed and/or separated from the cells. Without wishing to be bound by theory, particular embodiments contemplate that the binding and/or association between a stimulatory reagent (e.g., oligomeric stimulatory reagent) and cells may, in some circumstances, be reduced over time during the incubation. In certain embodiments, one or more agents may be added to reduce the binding and/or association between the stimulatory reagent and the cells. In particular embodiments, a change in cell culture conditions, e.g., the addition of an agent (e.g., a substance such as a competition agent or free binding agent), may reduce the binding and/or association between the stimulatory reagent and the cells. Thus, in some embodiments, the stimulatory reagent (e.g., oligomeric stimulatory reagent) may be removed from an incubation, cell culture system, and/or a solution separately from the cells, e.g., without removing the cells from the incubation, cell culture system, and/or a solution as well.

In certain embodiments, the stimulatory reagent (e.g., oligomeric stimulatory reagent) is separated and/or removed from the cells after an amount of time. In particular embodiments, the amount of time is an amount of time from the initiation of the stimulation. In particular embodiments the start of the incubation is considered at or at about the time the cells are contacted with the stimulatory reagent and/or a media or solution containing the stimulatory reagent. In particular embodiments, the stimulatory reagent is removed or separated from the cells within or within about 120 hours, 108 hours, 96 hours, 84 hours, 72 hours, 60 hours, 48 hours, 36 hours, 24 hours, 12 hours, 6, hours, 5 hours, 4 hours, 3 hours, or 2 hours, inclusive, of the initiation of the stimulation. In particular embodiments, the stimulatory reagent (e.g., oligomeric stimulatory reagent) is removed or separated from the cells at or at about 48 hours after the stimulation is initiated. In certain embodiments, the stimulatory reagent is removed or separated from the cells at or at about 72 hours after the stimulation is initiated. In some embodiments, the stimulatory reagent is removed or separated from the cells at or at about 96 hours after the stimulation is initiated.

1. Removal of Oligomeric Stimulatory Reagents

In some embodiments, the population of stimulated cells (i.e., cells having undergone selection with column chromatography and on-column stimulation as described herein) which was produced or generated in accord with any of the methods provided herein, underwent addition of a substance, such as a competition agent or free binding agent, such as to lessen and/or terminate, the signaling of the stimulatory agent or agents. In some embodiments, the addition of the competition agent or free binding agent occurred following an elution step as described herein (see Section I-D). In some embodiments, the addition of the competition agent or free binding agent occurred following a genetic engineering step as described herein. In some embodiments, the addition of the competition agent or free binding agent occurred following a harvesting step as described herein. Thus, in some embodiments, the population of the stimulated cells contains the presence of a substance, such as a competition agent, e.g. biotin or a biotin analog, e.g. D-Biotin. In some embodiments, the substance, such as a competition agent, e.g. biotin or a biotin analog, e.g. D-Biotin, is present in an amount that is at least 1.5-fold greater, at least 2-fold, at least 3-fold, at least 4-fold, at least 5-fold, at least 10-fold, at least 100-fold, at least 1000-fold or more greater than the amount of the substance in a reference population or preparation of cultured cells (e.g., T cells) in which the substance was not added exogenously during one of the aforementioned steps. In some embodiments, the amount of the substance, such as a competition agent, e.g. biotin or a biotin analog, e.g. D-Biotin, in the population of stimulated cells is from or from about 10 μM to 100 μM, 100 μM to 1 mM, 100 μM to 500 μM or 10 μM to 100 μM. In some embodiments, 10 μM or about 10 μM of biotin or a biotin analog, e.g., D-biotin, is added to the cells or the cell population to separate or remove the oligomeric stimulatory reagent from the cells or cell population. In some embodiments, 1 mM or about 1 mM of biotin or a biotin analog, e.g., D-biotin, is added to the cells or the cell population to separate or remove the oligomeric stimulatory reagent from the cells or cell population. In some embodiments, 1 mM or about 1 mM of D-biotin, is added to the cells or the cell population to separate or remove the oligomeric stimulatory reagent from the cells or cell population.

In certain embodiments, the one or more stimulatory agents (e.g., agents that stimulate or activate a TCR and/or a costimulatory molecule) associate with, such as are reversibly bound to, the oligomeric reagent, such as via the plurality of the particular binding sites (e.g., binding sites Z) present on the oligomeric reagent. In some cases, this results in the stimulatory agents being closely arranged to each other such that an avidity effect can take place if a target cell having (at least two copies of) a cell surface molecule that is bound by or recognized by the stimulatory agent is brought into contact with the agent. In some aspects, the stimulatory agent has a low affinity towards the molecule of the cell at binding site B, such that the receptor binding reagent dissociates from the cell in the presence of the competition reagent. Thus, in some embodiments, the stimulatory agents are removed from the cells in the presence of the competition reagent.

In some embodiments, the oligomeric stimulatory reagent is a streptavidin mutein oligomer with reversibly attached anti-CD3 and anti-CD28 Fabs. In some embodiments, the Fabs are attached contain streptavidin binding domains, e.g., that allow for the reversible attachment to the streptavidin mutein oligomer. In some cases, anti-CD3 and anti-CD28 Fabs are closely arranged to each other such that an avidity effect can take place if a T cell expressing CD3 and/or CD28 is brought into contact with the oligomeric stimulatory reagent with the reversibly attached Fabs. In some aspects, the Fabs have a low affinity towards CD3 and CD28, such that the Fabs dissociate from the cell in the presence of the competition reagent, e.g., biotin or a biotin variant or analogue. Thus, in some embodiments, the Fabs are removed or dissociated from the cells in the presence of the competition reagent, e.g., D-biotin.

In some embodiments, the oligomeric stimulatory reagent, e.g., the oligomeric stimulatory streptavidin mutein reagent, is removed or separated from the cells or cell populations prior to harvesting or formulating the cells. In some embodiments, oligomeric stimulatory reagent, e.g., the oligomeric stimulatory streptavidin mutein reagent, is removed or separated from the cells or cell populations by contact or exposure to a competition reagent, e.g., biotin or a biotin analog such as D-biotin, after or during the incubation, e.g., an incubation described herein such as in Section I-F or Section I-E-3. In certain embodiments, the cells or cell population are contacted or exposed to a competition reagent, e.g., biotin or a biotin analog such as D-biotin, to remove the oligomeric stimulatory reagent, e.g., the stimulatory oligomeric streptavidin mutein reagent, after the incubation but prior to steps for genetically engineering, harvesting, or formulating the cells. In particular embodiments, the cells or cell population are contacted or exposed to a competition reagent, e.g., biotin or a biotin analog such as D-biotin, to remove the oligomeric stimulatory reagent, e.g., the oligomeric stimulatory streptavidin mutein reagent, after the incubation. In some aspects, when the oligomeric stimulatory reagent, e.g., the oligomeric stimulatory streptavidin mutein reagent, is separated or removed from the cells during the incubation (see Section I-E-3), e.g., by contact or exposure to a competition reagent, e.g., biotin or a biotin analog such as D-biotin, the cells are returned to the same incubation conditions as prior to the separation or removal for the remaining duration of the incubation.

In some embodiments, the cells are contacted with, with about, or with at least 0.01 μM, 0.05 μM, 0.1 μM, 0.5 μM, 1 μM, 2 μM, 3 μM, 4 μM, 5 μM, 10 μM, 100 μM, 500 μM, 0.01 μM, 1 mM, or 10 mM of the competition reagent to remove or separate the oligomeric stimulatory reagent from the cells. In various embodiments, the cells are contacted with, with about, or with at least 0.01 µM, 0.05 µM, 0.1 µM, 0.5 µM, 1 µM, 2 µM, 3 µM, 4 µM, 5 µM, 10 µM, 100 µM, 500 µM, 0.01 µM, 1 mM, or 10 mM of biotin or a biotin analog such as D-biotin, to remove or separate the stimulatory streptavidin mutein oligomers with reversibly attached anti-CD3 and anti-CD28 Fabs from the cells. In various embodiments, the cells are contacted with between or between about 100 µM and 10 mM, e.g., 1 mM, of biotin or a biotin analog such as D-biotin, to remove or separate the stimulatory oligomeric reagent, such as streptavidin mutein oligomers with reversibly attached anti-CD3 and anti-CD28 Fabs from the cells. In various embodiments, the cells are contacted with between or between about 100 µM and 10 mM, e.g., 1 mM, of biotin or a biotin analog such as D-biotin for or for about 2 hours, 6 hours, 12 hours, 18 hours, 24 hours, 30 hours, 36 hours, 42 hours, or 48 hours post contact or exposure to D-biotin.

In particular embodiments, the oligomeric stimulatory reagent, e.g., the oligomeric stimulatory streptavidin mutein reagent, is removed or separated from the cells within or within about 120 hours, 108 hours, 96 hours, 84 hours, 72 hours, 60 hours, 48 hours, 36 hours, 24 hours, or 12 hours, inclusive, of the initiation of the stimulation. In particular embodiments, the oligomeric stimulatory reagent, e.g., the oligomeric stimulatory streptavidin mutein reagent, is removed or separated from the cells at or at about 48 hours after the stimulation is initiated. In certain embodiments, the oligomeric stimulatory reagent, e.g., the oligomeric stimulatory streptavidin mutein reagent, is removed or separated from the cells at or at about 72 hours after the stimulation is initiated. In some embodiments, the oligomeric stimulatory reagent, e.g., the oligomeric stimulatory streptavidin mutein reagent is removed or separated from the cells at or at about 96 hours after the stimulation is initiated.

In certain embodiments, the cells or cell population are contacted or exposed to a competition reagent, e.g., biotin or a biotin analog such as D-biotin, to remove stimulatory oligomeric reagent, e.g., the stimulatory oligomeric streptavidin mutein reagent, at or at about 48 hours or at or at about 2 days after the stimulation is initiated, e.g., during or after the incubation described herein such as in Section I-E-3. In some aspects, when stimulatory oligomeric reagent, e.g., the stimulatory oligomeric streptavidin mutein reagent, is separated or removed from the cells during the incubation, e.g., by contact or exposure to a competition reagent, e.g., biotin or a biotin analog such as D-biotin, the cells are returned to the same incubation conditions as prior to the separation or removal for the remaining duration of the incubation. In other aspects, when stimulatory oligomeric reagent, e.g., the stimulatory oligomeric streptavidin mutein reagent, is separated or removed from the cells after the incubation, e.g., by contact or exposure to a competition reagent, e.g., biotin or a biotin analog such as D-biotin, the cells are further incubated for or for about 2 hours, 6 hours, 12 hours, 18 hours, 24 hours, 30 hours, 36 hours, 42 hours, or 48 hours post contact or exposure to the competition reagent. In some embodiments, the transduced cells with D-Biotin treatment are further incubated for or for about 24±6 hours post D-Biotin addition. In some embodiments, the transduced cells with D-Biotin treatment are further incubated for or for about 48 hours post D-Biotin addition.

I. Sequential Selection, Parallel Selection, and Polishing

The methods provided herein allow for multiple selection steps, for example by column chromatography, to isolate and/or enrich a target cell population (e.g., T cells, CD3+, CD4+, CD8+ T cells). In some embodiments, one or more selection steps are carried out at one or more time points or following certain steps of the process for creating an output composition of engineered cells (e.g., a therapeutic cell composition), for example a process as described by Sections IA-H above. In some embodiments, selection steps that occur following initial cell selection, for example as described in Sections I-B and I-C, are referred to as polishing steps. Polishing steps may be performed for a variety of purposes, including, but not limited to, further purification of the cell composition, selection of specific cell subtypes (e.g., CD28+, CD62L+, CCR7+, CD27+, CD127+, CD4+, CD8+, CD45RA+, and/or CD45RO+ T cells), removal of dead cells (e.g., selection of viable cells), selection of successfully engineered cells (e.g., cells expressing a transgene (e.g., chimeric antigen receptor (CAR), T cell receptor (TCR), etc.), or for adjusting the ratio, total number, or concentration of specific cell types (e.g., CD4+ to CD8+ cells, CAR+ or TCR+ cells to CAR- or TCR-cells, or total number or concentration of CD4+, CD8+, CAR+, TCR+, and/or viable cells). In some embodiments, a selection step (e.g., polishing step) is useful for increasing product control and/or decreasing between patient variance.

In some embodiments, a selection step (e.g., an initial selection step and/or a polishing step) includes multiple selection steps for, for example, further purifying the cell composition, selection of specific cell subtypes, selection of viable cells, selection of engineered cells, and/or adjusting the ratio, total number, or concentration of cells. In some embodiments, a selection step (e.g., polishing step) is performed prior to incubation, for example incubation as described in Sections I-E-3 and/or I-F. In some embodiments, a selection step (e.g., polishing step) is performed prior to harvesting and collection, for example harvesting and collection as described in I-H.

In some aspects, such methods (e.g., selection steps (e.g., initial selection and/or polishing steps)) are achieved by a single process stream, such as in a closed system, by employing sequential selections in which a plurality of different cell populations from a sample (e.g., output composition of stimulated and/or engineered cells), as provided herein, are enriched and/or isolated. In some aspects, carrying out the separation or isolation in the same vessel or set of vessels, e.g., tubing set, is achieved by carrying out sequential positive and negative selection steps, the subsequent step subjecting the negative and/or positive fraction from the previous step to further selection, where the entire process is carried out in the same tube or tubing set. In one embodiment, a sample (e.g., output composition of stimulated and/or engineered cells) containing target cells is subjected to a sequential selection in which a first selection is effected to enrich for one of the CD4+ or CD8+ populations, and the non-selected cells from the first selection are used as the source of cells for a second selection to enrich for the other of the CD4+ or CD8+ populations. In some embodiments, a further selection or selections can be effected to enrich for sub-populations of one or both of the CD4+ or CD8+ population, for example, central memory T ($T_{CM}$) cells or naïve T cells. In some embodiments, specific subpopulations of T cells (e.g., CD3+, CD4+, CD8+ cells), such as cells positive or expressing high levels of one or more surface markers, e.g., CD28+, CD62L+, CCR7+, CD27+, CD127+, CD4+, CD8+, CD45RA+, and/or CD45RO+ T cells, are selected by positive or negative selection techniques during a selection step (e.g., an initial selection step and/or a polishing step). In some embodiments, a cell population (e.g., output composition of stimulated and/or engineered cells) containing target cells is subjected to a sequential selection in which the polishing step selects for viable cells. In some embodiments, the polishing step allows for controlling or adjusting the ratio or total number of cells in the cell composition.

In one embodiment, a sample (e.g., output composition of stimulated and/or engineered cells) containing target cells is subjected to a sequential selection in which a first selection is effected to enrich for a CD3+ population. In some embodiments, a further selection or selections can be effected to enrich for sub-populations of the CD3+ population, for example, CD4+ cells. In some embodiments, a further selection or selections can be effected to enrich for sub-populations of the CD3+ population, for example, CD8+ cells. In some embodiments, the further selection or selections can be effected to enrich for viable cells. In some embodiments, the further selection or selections can be effected to enrich subpopulations of CD3+ cells, for example CD3+CD4+ and/or CD3+CD8+ cells that are viable. In some embodiments, selecting viable cells includes or consists of removing dead cells from the cell population (e.g., output composition of stimulated and/or engineered cells or subpopulations thereof).

In some embodiments, the methods (e.g., selection steps (e.g., an initial selection step and/or a polishing steps)) disclosed in this Section do not need to be carried out using sequential selection techniques. In some embodiments, the methods (e.g., selection steps (e.g., initial selection and/or polishing steps)) disclosed in this Section can be carried out using sequential selection techniques in combination with parallel selection techniques. In some embodiments, the selection step (e.g., initial selection and/or polishing step) does not employ sequential selection or may employ sequential selection that does not occur in a closed system or in a set of vessels using the same tubing. In some embodiments, the selection step (e.g., initial selection and/or polishing step) is accomplished in a single step, for example using a single chromatography column. In some embodiments, the selection step (e.g., initial selection and/or polishing step) is accomplished using a parallel selection technique. For example, the selection step (e.g., initial selection and/or polishing step) is achieved by carrying out positive and/or negative selection steps simultaneously, for example in a closed system where the entire process is carried out in the same tube or tubing set. In some embodiments, a sample (e.g., output composition of stimulated and/or engineered cells) containing target cells is subjected to a parallel selection in which the sample (e.g., output composition of stimulated and/or engineered cells) is load onto two or more chromatography columns, where each column effects selection of a cell population. In some embodiments, the two or more chromatography columns effect selection of CD3+, CD4+, or CD8+ populations individually. In some embodiments, the two or more chromatorgraphy columns effect selection of the same cell population. For example, the two or more chromatography columns may effect selection of CD3+ cells. In some embodiments, the two or more chromatography columns, including affinity chromatography or gel permeation chromatography, independently effect selection of the same cell population. In some embodiments, the two or more chromatography columns, including affinity chromatography or gel permeation chromatography, independently effect selection of different cell populations. In some embodiments, a further selection or selections can be effected to enrich for subpopulations of one or all cell populations selected via parallel selection. For example, selected cells may be further selected for central memory T ($T_{CM}$) cells or naïve T cells. In some embodiments, a sample (e.g., output composition of stimulated and/or engineered cells) containing target cells (e.g., CD3+ cells) is subjected to a parallel selection in which parallel selection is effected to enrich for a CD4+ population and a CD8+ population. In some embodiments, a further selection or selections can be effected to enrich for sub-populations of the CD4+ and CD8+ populations, for example, central memory T ($T_{CM}$) cells or naïve T cells. It is contemplated that in some aspects, specific subpopulations of T cells (e.g., CD3+, CD4+, CD8+ T cells), such as cells positive or expressing high levels of one or more surface markers, e.g., CD28+, CD62L+, CCR7+, CD27+, CD127+, CD4+, CD8+, CD45RA+, and/or CD45RO+ T cells, are selected by positive or negative selection techniques. In some embodiments, a sample (e.g., output composition of stimulated and/or engineered cells) containing target cells (e.g., CD3+ cells) is subjected to a parallel selection in which parallel selection is effected to enrich for central memory T ($T_{CM}$) cells or naïve T cells. In some embodiments, a further selection or selections can be effected to enrich for subpopulations of the central memory T ($T_{CM}$) cells or naïve T cells, for example, CD4+, CD3+, or CD8+ cells. In some embodiments, the further selections carried out after the parallel selection are accomplished via sequential selection techniques.

In some embodiments, a selection step (e.g., initial selection and/or polishing step) can be carried out using beads labeled with selection agents as described herein, and the positive and negative fractions from the first selection step can be retained, followed by further positive selection of the positive fraction to enrich for a second selection marker, such as by using beads labeled with a second selection agent or by subjecting the positive fraction to column chromatography as described above. In some embodiments, one or more polishing steps are carried out using column chromatography as described herein, for example chromatography as described in Section I-B and/or chromatography including agent and reagent systems as described in Section I-B and Section II. In some embodiments, selection steps (e.g., initial selection and/or polishing steps) are accomplished using one or more methods including bead separation and column chromatography. In some embodiments, the selection steps (e.g., initial selection and/or polishing steps) are accomplished using column chromatography.

In some aspects, isolating the plurality of populations in a single or in the same isolation or separation vessel or set of vessels, such as a single column or set of columns, and/or same tube, or tubing set or using the same separation matrix or media or reagents, such as the same magnetic matrix, affinity-labeled solid support, or antibodies or other binding partners, include features that streamline the isolation, for example, resulting in reduced cost, time, complexity, need for handling of samples, use of resources, reagents, or equipment. In some aspects, such features are advantageous in that they minimize cost, efficiency, time, and/or complexity associated with the methods, and/or avoid potential harm to the cell product, such as harm caused by infection, contamination, and/or changes in temperature. The methods provided herein allow for multiple selection steps to enrich target populations both prior to or following cell selection combined with on-column stimulation.

The methods provided herein further allow for the selection and enrichment of successfully stimulated and engineered cells. For example, in some embodiments, the sequential selection, parallel selection, or single selection procedures described above may be used to identify stimulated cells expressing recombinant receptors (e.g., CARs, TCRs). In some embodiments, successfully engineered cells can be selected for by using a selection agent that can specifically bind to a surrogate maker (e.g., see Section IV-A-1). In some embodiments, cells expressing the recombinant receptor (e.g., CAR) can be further enriched (e.g., polished) for subpopulation cells, e.g., CD4+ CAR+ T cells, CD8+ CAR+ T cells, CD28+, CD62L+, CCR7+, CD27+, CD127+, CD45RA+, CD45RO+ T cells, and/or viable cells. In some embodiments, the selection step (e.g., initial selection and/or polishing step) allows control or adjustment of the ratio, concentration, or total number of cells expressing a recombinant receptor (e.g., CAR, TCR) and/or subpopulations thereof. In some embodiments, enriched (e.g., polished) populations can be formulated for use (e.g., administration) for cell therapy.

J. Exemplary Features of the Process and/or Output Populations

In particular embodiments, the provided methods are used in connection with a process that produces or generates an output population of engineered T cells (e.g., therapeutic cell population) from one or more input populations, such as input populations obtained, selected, or enriched from a single biological sample. In certain embodiments, the output population contains cells that express a recombinant receptor, e.g., a TCR or a CAR. In particular embodiments, the cells of the output populations are suitable for administration to a subject as a therapy, e.g., an autologous cell therapy.

In particular embodiments, the provided methods are used in connection with an entire process for generating or producing output cells and/or output populations of engineered T cells, such as a process including some or all of the steps of: selecting and stimulating the cells using column chromatography in a single step; collecting spontaneously detached cells without the use of a competition reagent; engineering, transforming, transducing, or transfecting the stimulated cells to express or contain a heterologous or recombinant polynucleotide, e.g., a polynucleotide encoding a recombinant receptor such as a CAR; incubating the cells, removing or separating a stimulatory reagent (e.g., oligomeric stimulatory reagent) from the cells, and harvesting and collecting the cells, in some aspects thereby generating an output population of engineered T cells.

In some embodiments, the provided methods are used in connection with an entire process for generating or producing output cells and/or output compositions of enriched T cells, such as a process including some or all of the steps of: collecting or obtaining a biological sample; isolating, selecting, or enriching input cells from the biological sample; cryofreezing and storing the and then thawing the input cells; selecting and stimulating the cells using column chromatography in a single step; collecting spontaneously detached cells without the use of a competition reagent; genetically engineering the stimulated cells to express or contain a recombinant polynucleotide, e.g., a polynucleotide encoding a recombinant receptor such as a CAR; formulating the cultivated cells in an output composition; and cryofreezing and storing the formulated output cells until the cells are released for infusion and or administration to a subject. In some embodiments, the provided methods do not include a step to expand or increase the number of cells during the process, such as by cultivating the cells in a bioreactor under conditions where the cells expand, such as to a threshold amount that is at least 3, 4, 5, or more times the amount, level, or concentration of the cells as compared to the input population. In some embodiments, the provided methods include a step to expand or increase the number of cells during the process, such as by incubation or cultivating the cells in a bioreactor under conditions where the cells expand, such as to a threshold amount that is at least 2, 3, 4, 5, or more times the amount, level, or concentration of the cells as compared to the input population. In some embodiments, genetically engineering the cells is or includes steps for transducing the cells with a viral vector, such as by spinoculating the cells in the presence of viral particles and then incubating the cells under static conditions in the presence of the viral particles.

In certain embodiments, the total duration of the provided process for generating engineered cells, from the initiation of the stimulation to collecting, harvesting, or formulating the cells is, is about, or is less than 36 hours, 42 hours, 48 hours, 54 hours, 60 hours, 72 hours, 84 hours, 96 hours, 108 hours, or 120 hours. In some embodiments, the total duration of the provided process for generating engineered cells, from the initiation of the stimulation to collecting, harvesting, or formulating the cells is between or between about 36 hours and 120 hours, 48 hours and 96 hours, or 48 hours and 72 hours, inclusive. In particular embodiments, the amount of time to complete the provided process as measured from the initiation of incubation to harvesting, collecting, or formulating the cells is, is about, or is less than 48 hours, 72 hours, or 96 hours. In particular embodiments, the amount of time to complete the provided process as measured from the initiation of incubation to harvesting, collecting, or formulating the cells is 48 hours±6 hours, 72 hours±6 hours, or 96 hours±6 hours.

In some embodiments, the incubation is completed between or between about 24 hour and 120 hours, 36 hour and 108 hours, 48 hours and 96 hours, or 48 hours and 72 hours, inclusive, after the initiation of the stimulation. In some embodiments, the incubation is completed at, about, or within 120 hours, 108 hours, 96 hours, 72 hours, 48 hours, or 36 hours from the initiation of the stimulation. In particular embodiments, the incubation are completed after 24 hours±6 hours, 48 hours±6 hours, or 72 hours±6 hours.

In some embodiments, the entire process is performed with a single population of enriched T cells, e.g., CD3+, CD4+, and CD8+ T cells. In certain embodiments, the process is performed with two or more input populations of enriched T cells that are combined prior to and/or during the process to generate or produce a single output population of enriched T cells. In some embodiments, the enriched T cells are or include engineered T cells, e.g., T cells transduced to express a recombinant receptor.

In some embodiments, an output population, e.g., a population of engineered T cells, is generated by (i) incubating a sample of or containing T cells under stimulating conditions on a chromatography column (e.g., on-column stimulation) for less than 24 hours, (ii) introducing a heterologous or recombinant polynucleotide encoding a recombinant receptor into T cells of the stimulated population, (iii) incubating the cells, and then (iv) collecting or harvesting the incubated cells.

In certain embodiments, an output population, e.g., a population of engineered T cells, is generated by (i) selecting and stimulating the T cells using column chromatography (e.g. on-column stimulation) in a single step and collecting spontaneously detached cells without the use of a competition reagent in less than 24 hours, (ii) transducing the stimulated T cells with a viral vector encoding a recombinant receptor, such as by spinoculating the stimulated T cells in the presence of the viral vector, (iii) incubating the transduced T cells under static conditions for between or between 18 hours and 96 hours, inclusive, and (iv) harvesting T cells of the transformed population within between or between about 36 and 108 hours after the incubation under stimulatory conditions is initiated.

In certain embodiments, an output population, e.g., a population of engineered T cells, is generated by (i) selecting and stimulating the T cells using column chromatography (e.g. on-column stimulation) in a single step and collecting spontaneously detached cells without the use of a competition reagent in less than or less than about 6 hours, (ii) transducing the stimulated T cells with a viral vector encoding a recombinant receptor for or for about 1 hour (iii) incubating the transduced T cells for or for about 72 hours, and (iv) harvesting T cells of the transformed population within or within about 90±10 hours after the incubation under stimulatory conditions is initiated.

In some embodiments, the process associated with the provided methods is compared to an alternative process. For example, in some embodiments, the provided methods herein are compared an alternative process that contains a step for expanding the cells. In some embodiments, the alternative process is a process that includes separate steps for cell selection and stimulation. In particular embodiments, the alternative process may differ in one or more specific aspects, but otherwise contains similar or the same features, aspects, steps, stages, reagents, and/or conditions of the process associated with the provided methods. In some embodiments, the alternative process is similar as the process associated with the provided methods, e.g., lacks or does not include expansion, but differs in a manner that includes, but is not limited to, one or more of; including separate steps for selection and stimulation, different reagents and/or media formulations; presence of serum during the incubation, transduction, transfection, and/or cultivation; different cellular makeup of the input population, e.g., ratio of CD4+ to CD8+ T cells; different stimulating conditions and/or a different stimulatory reagent; different ratio of stimulatory reagent to cells; different vector and/or method of transduction; different timing or order for incubating, transducing, and/or transfecting the cells; absence or difference of one or more recombinant cytokines present during the incubation or transduction (e.g., different cytokines or different concentrations), or different timing for harvesting or collecting the cells.

In some embodiments, the duration or amount of time required to complete the provided process, as measured from the isolation, enrichment, and/or selection input cells (e.g., CD4+ or CD8+ T cells) from a biological sample to the time at which a the output cells are collected, formulated, and/or cryoprotected is, is about, or is less than 48 hours, 72 hours, 96 hours, 120 hours, 4 days, 5 days, 7 days, or 10 days. In some embodiments, the duration or amount of time required to complete the provided process, as measured from the isolation, enrichment, and/or selection input cells (e.g., CD4+ or CD8+ T cells) from a biological sample to the time at which a the output cells are collected, formulated, and/or cryoprotected is, is about 4 to 5 days. In some embodiments, the duration or amount of time required to complete the provided process, as measured from the isolation, enrichment, and/or selection input cells (e.g., CD4+ or CD8+ T cells) from a biological sample to the time at which a the output cells are collected, formulated, and/or cryoprotected is or is about 5 days. In some embodiments, the duration or amount of time required to complete the provided process, as measured from the isolation, enrichment, and/or selection input cells (e.g., CD4+ or CD8+ T cells) from a biological sample to the time at which a the output cells are collected, formulated, and/or cryoprotected is, is less than 5 days. In some embodiments, the duration or amount of time required to complete the provided process, as measured from the isolation, enrichment, and/or selection input cells (e.g., CD4+ or CD8+ T cells) from a biological sample to the time at which a the output cells are collected, formulated, and/or cryoprotected is or is about 4 days. In some embodiments, isolated, selected, or enriched cells are not cryoprotected prior to the stimulation, and the duration or amount of time required to complete the provided process, as measured from the isolation, enrichment, and/or selection input cells (to the time at which a the output cells are collected, formulated, and/or cryoprotected is, is about, or is less than 48 hours, 72 hours, 96 hours, or 120 hours.

In certain embodiments, the provided processes are performed on a population of cells, e.g., CD4+ and CD8+ T cells or CD3+ T cells, that were isolated, enriched, or selected from a biological sample. In some aspects, the provided methods can produce or generate a composition of engineered T cells from when a biological sample is collected from a subject within a shortened amount of time as compared to other methods or processes. In some embodiments, the provided methods can produce or generate engineered T cells, including any or all times where biological samples, or enriched, isolated, or selected cells are cryopreserved and stored prior to steps for transduction, within or within about 10 days, 9 days, 8 days, 7 days, 6 days, 5 days, or within or within about 120 hours, 96 hours, 72 hours, or 48 hours, from when a biological sample is collected from a subject to when the engineered T cells are collected, harvested, or formulated (e.g., for cryopreservation or administration). In some embodiments, the provided methods can produce or generate engineered T cells, including any or all times where biological samples, or enriched, isolated, or selected cells are cryopreserved and stored prior to steps for transduction, within or within about 5 days or within about 4 days, from when a biological sample is collected from a subject to when the engineered T cells are collected, harvested, or formulated (e.g., for cryopreservation or administration).

In certain embodiments, the provided methods are used in connection with a process for generating or producing output cells and/or output populations of enriched T cells. In particular embodiments, the output cells and/or output populations of enriched T cells are or include cells that were collected, obtained, isolated, selected, and/or enriched from the biological sample, such as a blood sample or leukapheresis sample; incubated under stimulating conditions; engineered, e.g., transduced, to express or contain a recombinant polynucleotide, e.g., a polynucleotide encoding a recombinant receptor such as a CAR; cultivated to a threshold amount, density, or expansion; and/or formulated. In some embodiments, the cells of the output population have been previously cryoprotected and thawed, e.g., during, prior to, and/or after one or more steps of the process. In some embodiments, the output population (e.g., therapeutic cell composition) contains T cells, e.g., CD4+ T cells and CD8+ T cells, that express a recombinant receptor, e.g., a CAR.

In some embodiments, at least 30%, at least 40%, at least 45%, at least 50%, at least 55%, at least 60%, at least 65%, at least 70%, at least 75%, at least 80%, at least 85%, or at least 90%, at least 95%, of the cells of the output population (e.g., therapeutic cell composition) express the recombinant receptor. In certain embodiments, at least 50% of the cells of the output composition express the recombinant receptor. In certain embodiments, at least 30%, at least 40%, at least 45%, at least 50%, at least 55%, at least 60%, at least 65%, at least 70%, at least 75%, at least 80%, at least 85%, at least 90%, or at least 95%, of the CD3+ T cells of the output composition (e.g., therapeutic cell composition) express the recombinant receptor. In some embodiments, at least 50% of the CD3+ T cells of the output composition express the recombinant receptor. In particular embodiments, at least at least 30%, at least 40%, at least 45%, at least 50%, at least 55%, at least 60%, at least 65%, at least 70%, at least 75%, at least 80%, at least 85%, at least 90%, at least 95%, at least 97%, at least 99%, or more than 99% of the CD4+ T cells of the output composition (e.g., therapeutic cell composition) express the recombinant receptor. In particular embodiments, at least 50% of the CD4+ T cells of the output composition (e.g., therapeutic cell composition) express the recombinant receptor. In some embodiments, at least at least 30%, at least 40%, at least 45%, at least 50%, at least 55%, at least 60%, at least 65%, at least 70%, at least 75%, at least 80%, at least 85%, at least 90%, at least 95%, at least 97%, at least 99%, or more than 99% of the CD8+ T cells of the output composition (e.g., therapeutic cell composition) express the recombinant receptor. In certain embodiments, at least 50% of the CD8+ T cells of the output composition (e.g., therapeutic cell composition) express the recombinant receptor.

In particular embodiments, the cells of the output composition (e.g., therapeutic cell composition) have improved cytolytic activity towards cells expressing an antigen bound by and/or recognized by the recombinant receptor (e.g., target cells) as compared output cells produced by an alternative process, e.g., a process that includes one or more steps of expanding the cells. In some embodiments, when the cells of the output composition (e.g., therapeutic cell composition) are exposed to the cells that express the antigen, e.g., the target cells, the cells of the output composition kill, kill about, or kill at least 25%, 30%, 35%, 40%, 45%, 50%, 55%, 60%, 70%, 75%, 80%, 85%, 90%, 95%, or 100% of cells that express the antigen. In certain embodiments, the cells of the output composition (e.g., therapeutic cell composition) kill at least 25%, 50%, 75%, 100%, 150%, or 1-fold, 2-fold, 3-fold, 4-fold, or 5-fold greater amount of cells that express the antigen, e.g., target cells, than output cells produced by the alternative process under similar or the same conditions.

In particular embodiments, the cells of the output population (e.g., therapeutic cell composition) have improved anti-tumor activity in vivo as compared output cells produced by an alternative process, e.g., a process that includes one or more steps of expanding the cells. In some embodiments, when the cells of the output composition (e.g., therapeutic cell composition) are administered to a subject, e.g., a subject having a tumor or cancer, the cells of the output population kill, kill about, or kill at least 25%, 30%, 35%, 40%, 45%, 50%, 55%, 60%, 70%, 75%, 80%, 85%, 90%, 95%, or 100% of the tumor cells, e.g., cancer or tumor cells expressing the antigen, in the subject. In certain embodiments, the cells of the output composition (e.g., therapeutic cell composition) kill at least 25%, 50%, 75%, 100%, 150%, or 1-fold, 2-fold, 3-fold, 4-fold, or 5-fold greater amount of tumor cells in vivo than output cells produced by the alternative process under similar or the same conditions.

In particular embodiments, a majority of the cells of the output population (e.g., therapeutic cell composition) are naïve-like, central memory, and/or effector memory cells. In particular embodiments, a majority of the cells of the output population (e.g., therapeutic cell composition) are naïve-like or central memory cells. In some embodiments, a majority of the cells of the output population (e.g., therapeutic cell composition) are positive for one or more of CCR7 or CD27 expression. In certain embodiments, the cells of the output population (e.g., therapeutic cell composition) have a greater portion of naïve-like or central memory cells that output populations generated from alternative processes, such as processes that involve expansion.

In certain embodiments, the cells of the output population (e.g., therapeutic cell composition) have a low portion and/or frequency of cells that are exhausted and/or senescent. In particular embodiments, the cells of the output population have a low portion and/or frequency of cells that are exhausted and/or senescent. In some embodiments, less than 40%, less than 35%, less than 30%, less than 25%, less than 20%, less than 15%, less than 10%, less than 5%, or less than 1% of the cells of the output population (e.g., therapeutic cell composition) are exhausted and/or senescent. In certain embodiments, less than 25% of the cells of the output population (e.g., therapeutic cell composition) are exhausted and/or senescent. In certain embodiments, less than less than 10% of the cells of the output population are exhausted and/or senescent. In particular embodiments, the cells have a low portion.

In some embodiments, the cells of the output population (e.g., therapeutic cell composition) have a low portion and/or frequency of cells that are negative for CD27 and CCR7 expression, e.g., surface expression. In particular embodiments, the cells of the output population (e.g., therapeutic cell composition) have a low portion and/or frequency of CD27-CCR7-cells. In some embodiments, less than 40%, less than 35%, less than 30%, less than 25%, less than 20%, less than 15%, less than 10%, less than 5%, or less than 1% of the cells of the output population (e.g., therapeutic cell composition) are CD27-CCR7-cells. In certain embodiments, less than 25% of the cells of the output population are CD27-CCR7-cells. In certain embodiments, less than less than 10% of the cells of the output population are CD27-CCR7-cells. In embodiments, less than 5% of the cells of the output population are CD27-CCR7-cells.

In some embodiments, the cells of the output population (e.g., therapeutic cell composition) have a high portion and/or frequency of cells that are positive for one or both of CD27 and CCR7 expression, e.g., surface expression. In some embodiments, the cells of the output population (e.g., therapeutic cell composition) have a high portion and/or frequency of cells that are positive for one or both of CD27 and CCR7. In some embodiments, at least 50%, at least 60%, at least 70%, at least 75%, at least 80%, at least 85%, at least 90%, at least 95%, or greater than 95% of the cells of the output population are positive for one or both of CD27 and CCR7. In various embodiments, at least 50%, at least 60%, at least 70%, at least 75%, at least 80%, at least 85%, at least 90%, at least 95% or greater than 95% of the CD4+CAR+ cells of the output population (e.g., therapeutic cell composition) are positive for one or both of CD27 and CCR7. In some embodiments, at least 50%, at least 60%, at least 70%, at least 75%, at least 80%, at least 85%, at least 90%, at least 95% or greater than 95% of the CD8+CAR+ cells of the output population (e.g., therapeutic cell composition) are positive for one or both of CD27 and CCR7.

In certain embodiments, the cells of the output population (e.g., therapeutic cell composition) have a high portion and/or frequency of cells that are positive for CD27 and CCR7 expression, e.g., surface expression. In some embodiments, the cells of the output population (e.g., therapeutic cell composition) have a high portion and/or frequency of CD27+CCR7+ cells. In some embodiments, at least 50%, at least 60%, at least 70%, at least 75%, at least 80%, at least 85%, at least 90%, at least 95%, or greater than 95% of the cells of the output population (e.g., therapeutic cell composition) are CD27+ CCR7+ cells. In various embodiments, at least 50%, at least 60%, at least 70%, at least 75%, at least 80%, at least 85%, at least 90%, at least 95% or greater than 95% of the CD4+CAR+ cells of the output population (e.g., therapeutic cell composition) are CD27+ CCR7+ cells. In some embodiments, at least 50%, at least 60%, at least 70%, at least 75%, at least 80%, at least 85%, at least 90%, at least 95% or greater than 95% of the CD8+CAR+ cells of the output population (e.g., therapeutic cell composition) are CD27+ CCR7+ cells.

In certain embodiments, the cells of the output population (e.g., therapeutic cell composition) have a low portion and/or frequency of cells that are negative for CCR7 and positive for CD45RA expression, e.g., surface expression. In some embodiments, the cells of the output population (e.g., therapeutic cell composition) have a low portion and/or frequency of CCR7-CD45RA+ cells. In particular embodiments, less than 40%, less than 35%, less than 30%, less than 25%, less than 20%, less than 15%, less than 10%, less than 5%, or less than 1% of the cells of the output population (e.g., therapeutic cell composition) are CCR7-CD45RA+ cells. In some embodiments, less than 25% of the cells of the output population (e.g., therapeutic cell composition) are CCR7-CD45RA+ cells. In particular embodiments, less than less than 10% of the cells of the output population (e.g., therapeutic cell composition) are CCR7-CD45RA+ cells. In certain embodiments, less than 5% of the cells of the output population (e.g., therapeutic cell composition) are CCR7-CD45RA+ cells.

In any of the embodiments above, a selection step (e.g., polishing step; see Section I-I) can be used to achieve the portion, frequency, concentration, and/or percentage of cells of a particular phenotype or function in the output population (e.g., therapeutic cell composition). In any of the embodiments above, a selection step (e.g., polishing step; see Section I-I) can be used to select for the desired population.

In particular embodiments, the cells are harvested prior to, prior to about, or prior to at least one, two, three, four, five, six, eight, ten, twenty, or more cell doublings of the cell population, e.g., doublings that occur during the incubating. In certain embodiments, the cells are harvested prior to any doubling of the population, e.g., doubling that occurs during the incubation. In some aspects, reducing the doubling that may occur during an engineering process will, in some embodiments, increase the portion of engineered T cells that are naïve-line. In some embodiments, increasing the doubling during an engineering process increases T cell differentiation that may occur during the engineering process.

In some aspects, it is contemplated that, for a process for generating or producing engineered cell compositions (e.g., therapeutic cell composition), reducing the expansion or cell doublings that occur during the process, e.g., during the incubation, increase the amount or portion of naïve-like T cells of the resulting engineered cell composition. In particular aspects, increasing the expansion or cell doublings that occur during the process increases the amount or portion of differentiated T cells of the resulting engineered cell composition. In some aspects, it is contemplated that process, such as the processes provided herein, that increase or enlarge the portion of naïve-like cells in the resulting engineered cell composition may increase the potency, efficacy, and persistence, e.g., in vivo after administration, of the engineered cell composition.

II. AGENT AND REAGENT SYSTEMS

In particular aspects, the methods employ reversible systems in which at least one agent (e.g., a selection agent or stimulatory agent) capable of binding to a molecule on the surface of a cell (cell surface molecule), is reversibly associated with a reagent (e.g., selection reagent or stimulatory reagent). In some cases, the reagent contains a plurality of binding sites capable of reversibly binding to the agent (e.g., a selection agent or stimulatory agent). In some cases, the reagent (e.g., selection reagent or stimulatory reagent) is a multimerization reagent. In some embodiments, the at least one agent (e.g., a selection agent or stimulatory agent) contains at least one binding site B that can specifically bind an epitope or region of the molecule and also contains a binding partner C that specifically binds to at least one binding site Z of the reagent (e.g., selection reagent or stimulatory reagent). In some cases, the binding interaction between the binding partner C and the at least one binding site Z is a non-covalent interaction. In some embodiments, the binding interaction, such as non-covalent interaction, between the binding partner C and the at least one binding site Z is reversible.

In some embodiments, the reversible association can be mediated in the presence of a substance, such as a competition agent or free binding agent, that is or contains a binding site that also is able to bind to the at least one binding site Z. Generally, the substance (e.g. competition agent or free binding agent) can act as a competitor due to a higher binding affinity for the binding site Z present in the reagent and/or due to being present at higher concentrations than the binding partner C, thereby detaching and/or dissociating the binding partner C from the reagent. In some embodiments, the affinity of the substance (e.g. competition agent or free binding agent) for the at least one binding site Z is greater than the affinity of the binding partner C of the agent (e.g., a selection agent or stimulatory agent) for the at least one binding site Z. Thus, in some cases, the bond between the binding site Z of the reagent and the binding partner C of the agent (e.g., a selection agent or stimulatory agent) can be disrupted by addition of the substance (e.g. competition agent or free binding partner), thereby rendering the association of the agent (e.g., a selection agent or stimulatory agent) and reagent (e.g., selection reagent or stimulatory reagent) reversible.

Reagents that can be used in such reversible systems are described and known in the art, see e.g., U.S. Pat. Nos. 5,168,049; 5,506,121; 6,103,493; 7,776,562; 7,981,632; 8,298,782; 8,735,540; 9,023,604; and International published PCT Appl. Nos. WO2013/124474 and WO2014/076277. Non-limiting examples of reagents and binding partners capable of forming a reversible interaction, as well as substances (e.g. competition agents or free binding agents) capable of reversing such binding, are described below.

A. Reagent

The reagents contemplated herein include selection and stimulatory reagents. In some embodiments, the selection and stimulatory reagents are identical. In some embodiments, the selection and stimulatory reagents are different. However, both the selection and stimulatory reagents may be formulated from the same materials. In some embodiments, the reagent (e.g., selection reagent or stimulatory reagent) contains one or a plurality of binding sites Z that are capable of reversibly binding to a binding partner C comprised by the agent (e.g., a selection agent or stimulatory agent). In some embodiments, the reagent contains a plurality of binding sites Z, which each are able to specifically bind to the binding partner C that is included in the agent (e.g., a selection agent or stimulatory agent), such that the reagent is capable of reversibly binding to a plurality of agents (e.g., a selection agent or stimulatory agent), e.g., is a multimerization reagent (e.g., selection reagent or stimulatory reagent). In some embodiments, the reagent is an oligomer or polymer of individual molecules (e.g. monomers) or complexes that make up an individual molecule (e.g. tetramer), each containing at least one binding site Z. In some embodiments, the reagent contains at least two binding sites Z, at least three binding sites Z, at least four binding sites Z, such as at least 5, 6, 7, 8, 9, 10, 11, 12, 13, 14, 15, 16, 17, 18, 19, 20, 24, 28, 32, 36, 40, 44, 48, 52, 56, 60, 64, 68, 72 or more binding sites Z. The binding sites can all be the same or the plurality of binding sites can contain one or more different binding sites (e.g., Z1, Z2, Z3, etc.).

In some embodiments, two or more agents (e.g., selection agents or stimulatory agents) associate with, such as are reversibly bound to, the reagent (e.g., selection reagent or stimulatory reagent), such as via the one or plurality of binding sites Z present on the reagent (e.g., selection reagent or stimulatory reagent). In some cases, this results in the agents (e.g., selection agents or stimulatory agents) being closely arranged to each other such that an avidity effect can take place if a target cell having (at least two copies of) a cell surface molecule is brought into contact with the agent (e.g., a selection agent or stimulatory agent) that has one or more binding sites B able to bind the particular molecule.

In some embodiments, two or more different agents (e.g., selection agents or stimulatory agents) that are the same, i.e. containing the same binding site B, can be reversibly bound to the reagent. In some embodiments, it is possible to use at least two different (kinds of) agents (e.g., selection agents or stimulatory agents), and in some cases, three or four different (kinds of) agents, e.g. two or more different selection agents and/or stimulatory agents. For example, in some embodiments, the reagent (e.g., selection reagent or stimulatory reagent) can be reversibly bound to a first agent (e.g., a selection agent or stimulatory agent) containing a binding site B1, B2, B3 or B4, etc. and a second agent (e.g., selection agent or stimulatory agent) containing another binding site, e.g. another of a binding site B1, B2, B3 or B4. In some cases, the binding site of the first agent and the second agent can be the same. For example, in some aspects, each of the at least two agents (e.g., selection agent or stimulatory agent) can bind to the same molecule. In some cases, the binding site of the first agent and the second agent can be different. In some aspects, each of the at least two agents (e.g., selection agent or stimulatory agent) can bind to a different molecule, such as a first molecule, second molecule and so on. In some cases, the different molecules, such as cell surface molecules, can be present on the same target cell. In other cases, the different molecules, such as cell surface molecules, can be present on different target cells that are present in the same population of cells. In some cases, a third, fourth and so on agent (e.g., selection agent or stimulatory agent) can be associated with the same reagent (e.g., selection reagent or stimulatory reagent), each containing a further different binding site.

In some embodiments, the two or more different agents (e.g., selection agent or stimulatory agent) contain the same binding partner C. In some embodiments, the two or more different agents (e.g., selection agent or stimulatory agent) contain different binding partners. In some aspects, a first agent (e.g., selection agent or stimulatory agent) can have a binding partner C1 that can specifically bind to a binding site Z1 present on the reagent (e.g., selection reagent or stimulatory reagent) and a second agent (e.g., selection agent or stimulatory agent) can have a binding partner C2 that can specifically bind to the binding site Z1 or to a binding site Z2 present on the reagent (e.g., selection reagent or stimulatory reagent). Thus, in some instances, the plurality of binding sites Z comprised by the reagent includes binding sites Z1 and Z2, which are capable of reversibly binding to binding partners C1 and C2, respectively, comprised by the agent (e.g., selection agent or stimulatory agent). In some embodiments, C1 and C2 are the same, and/or Z1 and Z2 are the same. In other aspects, one or more of the plurality of binding sites Z can be different. In other instances, one or more of the plurality of binding partners C may be different. It is within a level of a skilled artisan to choose any combination of different binding partners C that are compatible with a reagent containing the binding sites Z, as long as each of the binding partners C are able to interact, such as specifically bind, with one of the binding sites Z.

In some embodiments, the reagent (e.g., selection reagent or stimulatory reagent) is a streptavidin, a streptavidin mutein or analog, avidin, an avidin mutein or analog (such as neutravidin) or a mixture thereof, in which such reagent contains one or more binding sites Z for reversible association with a binding partner C. In some embodiments, the binding partner C can be a biotin, a biotin derivative or analog, or a streptavidin-binding peptide or other molecule that is able to specifically bind to streptavidin, a streptavidin mutein or analog, avidin or an avidin mutein or analog. In some embodiments, the reagent is or contains streptavidin, avidin, an analog or mutein of streptavidin, or an analog or mutein or avidin that reversibly binds biotin, a biotin analog or a biologically active fragment thereof. In some embodiments, the reagent (e.g., selection reagent or stimulatory reagent) is or contains an analog or mutein of streptavidin or an analog or mutein of avidin that reversibly binds a streptavidin-binding peptide. In some embodiments, the substance (e.g. competition agent or free binding agent) can be a biotin, a biotin derivative or analog or a streptavidin-binding peptide capable of competing for binding with the binding partner C for the one or more binding sites Z. In some embodiments, the binding partner C and the substance (e.g. competition agent or free binding agent) are different, and the substance (e.g. competition agent or free binding agent) exhibits a higher binding affinity for the one or more binding sites Z compared to the affinity of the binding partner.

In some embodiments, the streptavidin can be wild-type streptavidin, streptavidin muteins or analogs, such as streptavidin-like polypeptides. Likewise, avidin, in some aspects, includes wild-type avidin or muteins or analogs of avidin such as neutravidin, a deglycosylated avidin with modified arginines that typically exhibits a more neutral pi and is available as an alternative to native avidin. Generally, deglycosylated, neutral forms of avidin include those commercially available forms such as "Extravidin", available through Sigma Aldrich, or "NeutrAvidin" available from Thermo Scientific or Invitrogen, for example.

In some embodiments, the reagent (e.g., selection reagent or stimulatory reagent) is a streptavidin or a streptavidin mutein or analog. In some embodiments, wild-type streptavidin (wt-streptavidin) has the amino acid sequence disclosed by Argarana et al, Nucleic Acids Res. 14 (1986) 1871-1882 (SEQ ID NO: 1). In general, streptavidin naturally occurs as a tetramer of four identical subunits, i.e. it is a homo-tetramer, where each subunit contains a single binding site for biotin, a biotin derivative or analog or a biotin mimic. An exemplary sequence of a streptavidin subunit is the sequence of amino acids set forth in SEQ ID NO: 1, but such a sequence also can include a sequence present in homologs thereof from other *Streptomyces* species. In particular, each subunit of streptavidin may exhibit a strong binding affinity for biotin with an equilibrium dissociation constant ($K_D$) on the order of about $10^{-14}$ M. In some cases, streptavidin can exist as a monovalent tetramer in which only one of the four binding sites is functional (Howarth et al. (2006) *Nat. Methods*, 3:267-73; Zhang et al. (2015) *Biochem. Biophys. Res. Commun.*, 463:1059-63)), a divalent tetramer in which two of the four binding sites are functional (Fairhead et al. (2013) *J. Mol. Biol.*, 426:199-214), or can be present in monomeric or dimeric form (Wu et al. (2005) *J. Biol. Chem.*, 280:23225-31; Lim et al. (2010) *Biochemistry*, 50:8682-91).

In some embodiments, streptavidin may be in any form, such as wild-type or unmodified streptavidin, such as a streptavidin from a *Streptomyces* species or a functionally active fragment thereof that includes at least one functional subunit containing a binding site for biotin, a biotin derivative or analog or a biotin mimic, such as generally contains at least one functional subunit of a wild-type streptavidin from *Streptomyces avidinii* set forth in SEQ ID NO: 1 or a functionally active fragment thereof. For example, in some embodiments, streptavidin can include a fragment of wild-type streptavidin, which is shortened at the N- and/or C-terminus. Such minimal streptavidins include any that begin N-terminally in the region of amino acid positions 10 to 16 of SEQ ID NO: 1 and terminate C-terminally in the region of amino acid positions 133 to 142 of SEQ ID NO: 1. In some embodiments, a functionally active fragment of streptavidin contains the sequence of amino acids set forth in SEQ ID NO: 2. In some embodiments, a functionally active fragment of streptavidin contains the sequence of amino acids set forth in SEQ ID NO: 103. In some embodiments, streptavidin, such as set forth in SEQ ID NO: 2, can further contain an N-terminal methionine at a position corresponding to Ala13 with numbering set forth in SEQ ID NO: 1. In some embodiments, a functionally active fragment of streptavidin, such as set forth in SEQ ID NO:103, does not an N-terminal methionine at a position corresponding to Ala13 with numbering set forth in SEQ ID NO: 1. Reference to the position of residues in streptavidin or streptavidin muteins is with reference to numbering of residues in SEQ ID NO: 1.

In some aspects, streptavidin muteins include polypeptides that are distinguished from the sequence of an unmodified or wild-type streptavidin by one or more amino acid substitutions, deletions, or additions, but that include at least one functional subunit containing a binding site for biotin, a biotin derivative or analog or a streptavidin-binding peptide. In some aspects, streptavidin-like polypeptides and streptavidin muteins can be polypeptides which essentially are immunologically equivalent to wild-type streptavidin and are in particular capable of binding biotin, biotin derivatives or biotin analogues with the same or different affinity as wt-streptavidin. In some cases, streptavidin-like polypeptides or streptavidin muteins may contain amino acids which are not part of wild-type streptavidin or they may include only a part of wild-type streptavidin. In some embodiments, streptavidin-like polypeptides are polypeptides which are not identical to wild-type streptavidin, since the host does not have the enzymes which are required in order to transform the host-produced polypeptide into the structure of wild-type streptavidin. In some embodiments, streptavidin also may be present as streptavidin tetramers and streptavidin dimers, in particular streptavidin homotetramers, streptavidin homodimers, streptavidin heterotetramers and streptavidin heterodimers. Generally, each subunit normally has a binding site for biotin or biotin analogues or for streptavidin-binding peptides. Examples of streptavidins or streptavidin muteins are mentioned, for example, in WO 86/02077, DE 19641876 A1, U.S. Pat. No. 6,022,951, WO 98/40396 or WO 96/24606.

In some embodiments, a streptavidin mutein can contain amino acids that are not part of an unmodified or wild-type streptavidin or can include only a part of a wild-type or unmodified streptavidin. In some embodiments, a streptavidin mutein contains at least one subunit that can have one more amino acid substitutions (replacements) compared to a subunit of an unmodified or wild-type streptavidin, such as compared to the wild-type streptavidin subunit set forth in SEQ ID NO: 1 or a functionally active fragment thereof, e.g. set forth in SEQ ID NO: 2 or SEQ ID NO:103. In some embodiments, at least one subunit of a streptavidin mutein can have at least 1, 2, 3, 4, 5, 6, 7, 8, 9, 10, 11, 12, 13, 14, 15, 16, 17, 18, 19 or 20 amino acid differences compared to a wild-type or unmodified streptavidin and/or contains at least one subunit that comprising an amino acid sequence that exhibits at least 85%, 86%, 87%, 88%, 89%, 90%, 91%, 92%, 93%, 94%, 95%, 96%, 97%, 98%, 99% or more sequence identity to the sequence of amino acids set forth in SEQ ID NO: 1, 2, or 103 where such streptavidin mutein exhibits functional activity to bind biotin, a biotin derivative or analog or biotin mimic. In some embodiments, the amino acid replacements (substitutions) are conservative or non-conservative mutations. Examples of streptavidin muteins are known in the art, see e.g., U.S. Pat. Nos. 5,168,049; 5,506,121; 6,022,951; 6,156,493; 6,165,750; 6,103,493; or 6,368,813; or International published PCT App. No. WO2014/076277.

In some embodiments, streptavidin or a streptavidin mutein includes proteins containing one or more than one functional subunit containing one or more binding sites Z for biotin, a biotin derivative or analog or a streptavidin-binding peptide, such as two or more, three or more, four or more, and, in some cases, 5, 6, 7, 8, 9, 10, 11, 12 or more functional subunits. In some embodiments, streptavidin or streptavidin mutein can include a monomer; a dimer, including a heterodimer or a homodimer; a tetramer, including a homotetramer, a heterotetramer, a monovalent tetramer or a divalent tetramer; or can include higher ordered multimers or oligomers thereof.

In some embodiments, the binding affinity of streptavidin or a streptavidin mutein for a peptide ligand binding partner is less than $1\times10^{-4}$ M, $5\times10^{-4}$ M, $1\times10^{-5}$ M, $5\times10^{-5}$ M, $1\times10^{-6}$ M, $5\times10^{-6}$ M or $1\times10^{-7}$ M, but generally greater than $1\times10^{-13}$ M, $1\times10^{-12}$ M or $1\times10^{-11}$ M. For example, peptide sequences (Strep-tags), such as disclosed in U.S. Pat. No. 5,506,121, can act as biotin mimics and demonstrate a binding affinity for streptavidin, e.g., with a $K_D$ of approximately between $10^{-4}$ M and $10^{-5}$ M. In some cases, the binding affinity can be further improved by making a mutation within the streptavidin molecule, see e.g. U.S. Pat. No. 6,103,493 or International published PCT App. No.

WO2014/076277. In some embodiments, binding affinity can be determined by methods known in the art, such as any described below.

In some embodiments, the reagent (e.g., selection reagent or stimulatory reagent), such as a streptavidin or streptavidin mutein, exhibits binding affinity for a peptide ligand binding partner, which peptide ligand binding partner can be the binding partner C present in the agent (e.g., selection agent or stimulatory agent). In some embodiments, the peptide sequence contains a sequence with the general formula set forth in SEQ ID NO: 9, such as contains the sequence set forth in SEQ ID NO: 10. In some embodiments, the peptide sequence has the general formula set forth in SEQ ID NO: 11, such as set forth in SEQ ID NO: 12. In one example, the peptide sequence is Trp-Arg-His-Pro-Gln-Phe-Gly-Gly (also called Strep-Tag®, set forth in SEQ ID NO: 7). In one example, the peptide sequence is Trp-Ser-His-Pro-Gln-Phe-Glu-Lys (also called Strep-Tag® II, set forth in SEQ ID NO: 8). In some embodiments, the peptide ligand contains a sequential arrangement of at least two streptavidin-binding modules, wherein the distance between the two modules is at least 0 and not greater than 50 amino acids, wherein one binding module has 3 to 8 amino acids and contains at least the sequence His-Pro-Xaa (SEQ ID NO: 9), where Xaa is glutamine, asparagine, or methionine, and wherein the other binding module has the same or different streptavidin peptide ligand, such as set forth in SEQ ID NO: 11 (see e.g. International Published PCT Appl. No. WO02/077018; U.S. Pat. No. 7,981,632). In some embodiments, the peptide ligand contains a sequence having the formula set forth in any of SEQ ID NO: 13 or 14. In some embodiments, the peptide ligand has the sequence of amino acids set forth in any of SEQ ID NOS: 15-19.

In some embodiments, the reagent (e.g., selection reagent or stimulatory reagent) is or contains a streptavidin mutein. In some embodiments, the streptavidin muteins contain one or more mutations (e.g. amino acid replacements) compared to wild-type streptavidin set forth in SEQ ID NO: 1 or a biologically active portion thereof (e.g., SEQ ID NO:2 or SEQ ID NO:103). For example, biologically active portions of streptavidin can include streptavidin variants that are shortened at the N- and/or the C-terminus, which in some cases is called a minimal streptavidin. In some embodiments, an N-terminally shortened minimal streptavidin, to which any of the mutations can be made, begins N-terminally in the region of the amino acid positions 10 to 16 and terminates C-terminally in the region of the amino acid positions 133 to 142 compared to the sequence set forth in SEQ ID NO: 1. In some embodiments, an N-terminally shortened streptavidin, to which any of the mutations can be made, contains the amino acid sequence set forth in SEQ ID NO: 2. In some embodiments, the minimal streptavidin contains an amino acid sequence from position Ala13 to Ser139 and optionally has an N-terminal methionine residue instead of Ala13. For purposes herein, the numbering of amino acid positions refers throughout to the numbering of wt-streptavidin set forth in SEQ ID NO: 1 (e.g. Argarana et al., Nucleic Acids Res. 14 (1986), 1871-1882, cf. also FIG. 3).

In some embodiments, the streptavidin mutein is a mutant as described in U.S. Pat. No. 6,103,493. In some embodiments, the streptavidin mutein contains at least one mutation within the region of amino acid positions 44 to 53, based on the amino acid sequence of wild-type streptavidin, such as set forth in SEQ ID NO: 1. In some embodiments, the streptavidin mutein contains a mutation at one or more residues 44, 45, 46, and/or 47. In some embodiments, the streptavidin mutein contains a replacement of Glu at position 44 of wild-type streptavidin with a hydrophobic aliphatic amino acid, e.g. Val, Ala, Ile or Leu, any amino acid at position 45, an aliphatic amino acid, such as a hydrophobic aliphatic amino acid at position 46 and/or a replacement of Val at position 47 with a basic amino acid, e.g. Arg or Lys, such as generally Arg. In some embodiments, Ala is at position 46 and/or Arg is at position 47 and/or Val or Ile is at position 44. In some embodiments, the streptavidin mutant contains residues $Val^{44}$-$Thr^{45}$-$Ala^{46}$-$Arg^{47}$, such as set forth in exemplary streptavidin muteins containing the sequence of amino acids set forth in SEQ ID NO: 3, SEQ ID NO: 4 (also known as streptavidin mutant 1, SAM1), or SEQ ID NO:104. In some embodiments, the streptavidin mutein contains residues $Ile^{44}$-$Gly^{45}$-$Ala^{46}$-$Arg^{47}$, such as set forth in exemplary streptavidin muteins containing the sequence of amino acids set forth in SEQ ID NO: 5, SEQ ID NO: 6, (also known as SAM2) or SEQ ID NO:105. In some cases, such streptavidin mutein are described, for example, in U.S. Pat. No. 6,103,493, and are commercially available under the trademark Strep-Tactin®.

In some embodiment, the streptavidin mutein is a mutant as described in International Published PCT Appl. Nos. WO 2014/076277. In some embodiments, the streptavidin mutein contains at least two cysteine residues in the region of amino acid positions 44 to 53 with reference to amino acid positions set forth in SEQ ID NO: 1. In some embodiments, the cysteine residues are present at positions 45 and 52 to create a disulfide bridge connecting these amino acids. In such an embodiment, amino acid 44 is typically glycine or alanine and amino acid 46 is typically alanine or glycine and amino acid 47 is typically arginine. In some embodiments, the streptavidin mutein contains at least one mutation or amino acid difference in the region of amino acids residues 115 to 121 with reference to amino acid positions set forth in SEQ ID NO: 1. In some embodiments, the streptavidin mutein contains at least one mutation at amino acid position 117, 120 and 121 and/or a deletion of amino acids 118 and 119 and substitution of at least amino acid position 121.

In some embodiments, the streptavidin mutein contains a mutation at a position corresponding to position 117, which mutation can be to a large hydrophobic residue like Trp, Tyr or Phe or a charged residue like Glu, Asp or Arg or a hydrophilic residue like Asn or Gin, or, in some cases, the hydrophobic residues Leu, Met or Ala, or the polar residues Thr, Ser or His. In some embodiments, the mutation at position 117 is combined with a mutation at a position corresponding to position 120, which mutation can be to a small residue like Ser or Ala or Gly, and a mutation at a position corresponding to position 121, which mutation can be to a hydrophobic residue, such as a bulky hydrophobic residue like Trp, Tyr or Phe. In some embodiments, the mutation at position 117 is combined with a mutation at a position corresponding to position 120 of wildtype streptavidin set forth in SEQ ID NO:1 or a biologically active fragment thereof, which mutation can be a hydrophobic residue such as Leu, Ile, Met, or Val or, generally, Tyr or Phe, and a mutation at a position corresponding to position 121 compared to positions of wildtype streptavidin set forth in SEQ ID NO:1 or a biologically active fragment thereof, which mutation can be to a small residue like Gly, Ala, or Ser, or with Gln, or with a hydrophobic residue like Leu, Val, Ile, Trp, Tyr, Phe, or Met. In some embodiments, such muteins also can contain residues Val44-Thr45-Ala46-Arg47 or residues Ile44-Gly45-Ala46-Arg47. In some embodiments, the streptavidin mutein contains the residues Val44, Thr45, Ala46, Arg47, Glu117, Gly120 and Tyr121. In some embodiments, the mutein streptavidin contains the sequence of amino acids set forth in SEQ ID NO:27 or SEQ ID NO:28, or a sequence of amino acids that exhibits at least 85%, 86%, 87%, 88%, 89%, 90%, 91%, 92%, 93%, 94%, 95%, 96%, 97%, 98%, 99% or more sequence identity to the sequence of amino acids set forth in SEQ ID NO: 27 or SEQ ID NO: 28, contains the residues Val44, Thr45, Ala46, Arg47, Glu117, Gly120 and Tyr121 and exhibits functional activity to bind to biotin, a biotin analog or a streptavidin-binding peptide.

In some embodiments, a streptavidin mutein can contain any of the above mutations in any combination, and the resulting streptavidin mutein may exhibit a binding affinity that is less than $2.7 \times 10^{-4}$ M for the peptide ligand (Trp-Arg-His-Pro-Gln-Phe-Gly-Gly; also called Strep-Tag®, set forth in SEQ ID NO: 7) and/or less than $1.4 \times 10^{-4}$ M for the peptide ligand (Trp-Ser-His-Pro-Gln-Phe-Glu-Lys; also called Strep-Tag® II, set forth in SEQ ID NO: 8) and/or is less than $1 \times 10^{-4}$ M, $5 \times 10^{-4}$ M, $1 \times 10^{-5}$ M, $5 \times 10^{-5}$ M, $1 \times 10^{-6}$ M, $5 \times 10^{-6}$ M or $1 \times 10^{-7}$ M, but generally greater than $1 \times 10^{-13}$ M, $1 \times 10^{-12}$ M or $1 \times 10^{-11}$ M for any of the peptide ligands set forth in any of SEQ ID NOS:7-19.

In some embodiments, the streptavidin mutein exhibits the sequence of amino acids set forth in any of SEQ ID NOs: 3-6, 27, 28, 104, or 105, or a sequence of amino acids that exhibits at least 90%, 91%, 92%, 93%, 94%, 95%, 96%, 97%, 98%, 99% or more sequence identity to the sequence of amino acids set forth in any of SEQ ID NO: 3-6, 27, 28, 104, or 105 and exhibits a binding affinity that is less than $2.7 \times 10^{-4}$ M for the peptide ligand (Trp Arg His Pro Gln Phe Gly Gly; also called Strep-Tag®, set forth in SEQ ID NO: 7) and/or less than $1.4 \times 10^{-4}$ M for the peptide ligand (Trp Ser His Pro Gln Phe Glu Lys; also called Strep-Tag® II, set forth in SEQ ID NO: 8) and/or is less than $1 \times 10^{-4}$ M, $5 \times 10^{-4}$ M, $1 \times 10^{-5}$ M, $5 \times 10^{-5}$ M, $1 \times 10^{-6}$ M, $5 \times 10^{-6}$ M or $1 \times 10^{-7}$ M, but generally greater than $1 \times 10^{-13}$ M, $1 \times 10^{-12}$ M or $1 \times 10^{-11}$ M for any of the peptide ligands set forth in any of SEQ ID NOS:7-19.

In some embodiments, the streptavidin mutein also exhibits binding to other streptavidin ligands, such as but not limited to, biotin, iminobiotin, lipoic acid, desthiobiotin, diaminobiotin, HABA (hydroxyazobenzene-benzoic acid) and/or dimethyl-HABA. In some embodiments, the streptavidin mutein exhibits a binding affinity for another streptavidin ligand, such as biotin or desthiobiotin, that is greater than the binding affinity of the streptavidin mutein for a biotin mimic peptide ligand, such as set forth in any of SEQ ID NOS: 7-19. Thus, in some embodiments, biotin or a biotin analog or derivative (e.g. desthiobiotin) can be employed as a competition agent in the provided methods. For example, as an example, the interaction of a mutein streptavidin designated Strep-Tactin® (e.g. containing the sequence set forth in SEQ ID NO: 4) with the peptide ligand designated Strep-Tag® II (e.g. set forth in SEQ ID NO: 8) is characterized by a binding affinity with a $K_D$ of approximately $10^{-6}$ M compared to approximately $10^{-13}$ M for the biotin-streptavidin interaction. In some cases, biotin, which can bind with high affinity to the Strep-Tactin® with a $K_D$ of between or between about $10^{-10}$ and $10^{-13}$ M, can compete with Strep-Tag® II for the binding site.

In some cases, the reagent (e.g., selection reagent or stimulatory reagent) contains at least two chelating groups K that may be capable of binding to a transition metal ion. In some embodiments, the reagent (e.g., selection reagent or stimulatory reagent) may be capable of binding to an oligohistidine affinity tag, a glutathione-S-transferase, calmodulin or an analog thereof, calmodulin binding peptide (CBP), a FLAG-peptide, an HA-tag, maltose binding protein (MBP), an HSV epitope, a myc epitope, and/or a biotinylated carrier protein.

In some embodiments, the reagent (e.g., selection reagent or stimulatory reagent) is an oligomer or polymer. In some embodiments, the oligomer or polymer can be generated by linking directly or indirectly individual molecules of the protein as it exists naturally, either by linking directly or indirectly individual molecules of a monomer or a complex of subunits that make up an individual molecule (e.g. linking directly or indirectly dimers, trimers, tetramers, etc. of a protein as it exists naturally). For example, a tetrameric homodimer or heterodimer of streptavidin or avidin may be referred to as an individual molecule or smallest building block of a respective oligomer or polymer. In some embodiments, the oligomer or polymer can contain linkage of at least 2 individual molecules of the protein (e.g. is a 2-mer), or can be at least a 3-mer, 4-mer, 5-mer, 6-mer, 7-mer, 8-mer, 9-mer, 10-mer, 11-mer, 12-mer, 13-mer, 14-mer, 15-mer, 16-mer, 17-mer, 18-mer, 19-mer, 20-mer, 25-mer, 30-mer, 35-mer, 40-mer, 45-mer or 50-mer of individual molecules of the protein (e.g., monomers, tetramers).

Oligomers can be generated using any methods known in the art, such as any described in published U.S. Patent Application No. US2004/0082012. In some embodiments, the oligomer or polymer contains two or more individual molecules that may be crosslinked, such as by a polysaccharide or a bifunctional linker.

In some embodiments, the oligomer or polymer is obtained by crosslinking individual molecules or a complex of subunits that make up an individual molecule in the presence of a polysaccharide. In some embodiments, oligomers or polymers can be prepared by the introduction of carboxyl residues into a polysaccharide, e.g. dextran. In some aspects, individual molecules of the reagent (e.g., monomers, tetramers) can be coupled via primary amino groups of internal lysine residues and/or the free N-terminus to the carboxyl groups in the dextran backbone using conventional carbodiimide chemistry. In some embodiments, the coupling reaction is performed at a molar ratio of about 60 moles of individual molecules of the reagent (e.g., monomers, tetramers) per mole of dextran.

In some embodiments, the reagent (e.g., selection reagent or stimulatory reagent) is an oligomer or a polymer of one or more streptavidin or avidin or of any analog or mutein of streptavidin (e.g. Strep-Tactin® or Strep-Tactin® XT) or an analog or mutein of avidin (e.g. neutravidin). In some embodiments, the binding site Z is a natural biotin binding site of avidin or streptavidin for which there can be up to four binding sites in an individual molecule (e.g. a tetramer contains four binding sites Z), whereby a homo-tetramer can contain up to 4 binding sites that are the same, i.e. Z1, whereas a hetero-tetramer can contain up to 4 binding sites that may be different, e.g. containing Z1 and Z2. In some embodiments, the oligomer is generated or produced from a plurality of individual molecules (e.g. a plurality of homo-tetramers) of the same streptavidin, streptavidin mutein, avidin or avidin mutein, in which case each binding site Z, e.g. Z1, of the oligomer is the same. For example, in some cases, an oligomer can contain a plurality of binding sites Z1, such as at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 40, 45, 50 or more binding sites Z1. In some embodiments, the oligomer is generated or produced from a plurality of individual molecules that can be hetero-tetramers of a streptavidin, streptavidin mutein, avidin or avidin mutein and/or from a plurality of two or more different individual molecules (e.g. different homo-tetramers) of streptavidin, streptavidin mutein, avidin or avidin mutein that differ in their binding sites Z, e.g. Z1 and Z2, in which case a plurality of different binding sites Z, e.g. Z1 and Z2, may be present in the oligomer. For example, in some cases, an oligomer can contain a plurality of binding sites Z1 and a plurality of binding sites Z, which, in combination, can include at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 40, 45, 50 or more combined binding sites Z1 and Z2.

In some cases, the respective oligomer or polymer may be crosslinked by a polysaccharide. In one embodiment, oligomers or polymers of streptavidin or of avidin or of analogs of streptavidin or of avidin (e.g., neutravidin) can be prepared by the introduction of carboxyl residues into a polysaccharide, e. g. dextran, essentially as described in Noguchi, A, et al, Bioconjugate Chemistry (1992) 3, 132-137 in a first step. In some such aspects, streptavidin or avidin or analogs thereof then may be linked via primary amino groups of internal lysine residue and/or the free N-terminus to the carboxyl groups in the dextran backbone using conventional carbodiimide chemistry in a second step. In some cases, cross-linked oligomers or polymers of streptavidin or avidin or of any analog of streptavidin or avidin may also be obtained by crosslinking via bifunctional molecules, serving as a linker, such as glutardialdehyde or by other methods described in the art.

In some embodiments, the oligomer or polymer is obtained by crosslinking individual molecules or a complex of subunits that make up an individual molecule using a bifunctional linker or other chemical linker, such as glutardialdehyde or by other methods known in the art. In some aspects, cross-linked oligomers or polymers of streptavidin or avidin or of any mutein or analog of streptavidin or avidin may be obtained by crosslinking individual streptavidin or avidin molecules via bifunctional molecules, serving as a linker, such as glutardialdehyde or by other methods described in the art. It is, for example, possible to generate oligomers of streptavidin muteins by introducing thiol groups into the streptavidin mutein (this can, for example, be done by reacting the streptavidin mutein with 2-iminothiolan (Trauts reagent) and by activating, for example in a separate reaction, amino groups available in the streptavidin mutein. In some embodiments, this activation of amino groups can be achieved by reaction of the streptavidin mutein with a commercially available heterobifunctional crosslinker such as sulfosuccinimidyl 4-(N-maleimidomethyl)cyclohexane-1-carboxylate (sulfo SMCC) or Succinimidyl-6-[(β-maleimidopropionamido)hexanoate (SMPH). In some such embodiments, the two reaction products so obtained are mixed together, typically leading to the reaction of the thiol groups contained in the one batch of modified streptavidin mutein with the activated (such as by maleimide functions) amino acids of the other batch of modified streptavidin mutein. In some cases, by this reaction, multimers/oligomers of the streptavidin mutein are formed. These oligomers can have any suitable number of individual molecules, such as at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 40, 45, 50 or more, and the oligomerization degree can be varied according to the reaction condition.

In some embodiments, the oligomeric or polymeric reagent (e.g., selection reagent or stimulatory reagent) can be isolated via size exclusion chromatography and any desired fraction can be used as the reagent. For example, in some embodiments, after reacting the modified streptavidin mutein, in the presence of 2-iminothiolan and a heterobifunctional crosslinker such as sulfo SMCC, the oligomeric or polymeric reagent can be isolated via size exclusion chromatography and any desired fraction can be used as the reagent. In some embodiments, the oligomers do not have (and do not need to have) a single molecular weight but they may observe a statistical weight distribution such as Gaussian distribution. In some cases, any oligomer with more than three streptavidin or mutein tetramers, e.g., homotetramers or heterotetramers, can be used as a soluble reagent, such as generally 3 to 50 tetramers, e.g., homotetramers or heterotetramers, 10 to 40 tetramers, e.g., homotetramers or heterotetramers, or 25 to 35 tetramers, e.g., homotetramers or heterotetramers. The oligomers might have, for example, from 3 to 25 streptavidin mutein tetramers, e.g., homotetramers or heterotetramers. In some aspects, with a molecular weight of about 50 kDa for streptavidin muteins, the soluble oligomers can have a molecular weight from about 150 kDa to about 2000 kDa, about 150 kDa to about 1500 kDa, about 150 kDa to about 1250 kDa, about 150 kDa to 1000 kDa, about 150 kDa to about 500 kDa or about 150 kDa to about 300 kDa, about 300 kDa to about 2000 kDa, about 300 kDa to about 1500 kDa, about 300 kDa to about 1250 kDa, about 300 kDa to 1000 kDa, about 300 kDa to about 500 kDa, about 500 kDa to about 2000 kDa, about 500 kDa to about 1500 kDa, about 500 kDa to about 1250 kDa, about 500 kDa to 1000 kDa, about 1000 kDa to about 2000 kDa, about 1000 kDa to about 1500 kDa, about 1000 kDa to about 1250 kDa, about 1250 kDa to about 2000 kDa or about 1500 kDa to about 2000 kDa. Generally, because each streptavidin molecule/mutein has four biotin binding sites, such a reagent can provide 12 to 160 binding sites Z, such as 12 to 100 binding sites Z.

B. Agents

The agents contemplated herein include selection and stimulatory agents. In some embodiments, the selection and stimulatory agents are identical. In some embodiments, the selection and stimulatory agents are different. However, both the selection and stimulatory reagents may be formulated from the same materials. In some embodiments, the agent (e.g., selection agent or stimulatory agent) has one or more binding sites, B, for binding to the molecule on the surface of the cell, e.g. cell surface molecule. Thus, in some instances, the agent (e.g., selection agent or stimulatory agent) contains a binding site B or a plurality of binding sites B, wherein the specific binding between the agent (e.g., selection agent or stimulatory agent) and the molecule on the surface of the target cells contains interaction between B and the molecule. In some embodiments, the agent contains only a single binding site, i.e. is monovalent. In some embodiments, the agent (e.g., selection agent or stimulatory agent) has at least two, such as a plurality of binding sites B including three, four or five binding sites B capable of binding to the cell surface molecule. In some such aspects, the at least two or plurality of binding sites B may be identical. In some embodiments, one or more of the at least two or plurality of binding sites B may be different (e.g. B1 and B2).

In some embodiments, one or more different agents (e.g. one or more different e.g., selection agent or stimulatory agent or other agent that binds to a molecule on a cell) are reversibly bound to the reagent (e.g., selection agent or stimulatory reagent). In some embodiments, at least 2, 3, 4 or more different agents (e.g., selection agents or stimulatory agents) are reversibly bound to the same reagent. In some embodiments, at least two different agents (e.g., selection agent or stimulatory agents) are reversibly bound to the same reagent, whereby each agent comprises a binding site B or a plurality of binding sites B for specific binding between the agent and the molecule. In some embodiments, the at least two or more agents (e.g., selection agent or stimulatory agents) contain the same binding site B, e.g. for binding the same or substantially the same molecule. In some embodiments, the at least two or more agents (e.g., selection agents or stimulatory agents) contain different binding sites B, e.g. for the binding to different molecules. In some embodiments, a first agent (e.g., a first selection agent or first stimulatory agent) contains a binding site B1, B2, B3, B4, etc. and a second agent (e.g., second selection agent or second stimulatory agent) contains another of a binding site B1, B2, B3, B4, etc. In some embodiments, a first agent (e.g. a first selection agent) contains a binding site B1 and a second agent (e.g. second selection agent) contains a binding site B3. In some embodiments, a first agent (e.g. a first stimulatory agent) contains a binding site B2 and a second agent (e.g. a second stimulatory agent) contains a binding site B4. In any of such embodiments, the first agent and second agent can contain a binding partner, C1 or C2. In some embodiments, C1 and C2 can be the same. In some embodiments, C1 and C2 are different. In some embodiments, the first agent and second agent contain the same binding partner, C1.

In some cases, the dissociation constant ($K_D$) of the binding between the agent (e.g., via the binding site B) and the binding site Z of the reagent may have a value in the range from about $10^{-2}$ M to about $10^{-13}$ M or from about $10^{-3}$ M to about $10^{-12}$ M or from about $10^{-4}$ M to about $10^{-11}$ M, or from about $10^{-5}$ M to about $10^{-10}$ M. In some embodiments, the dissociation constant ($K_D$) for the binding between the binding agent and the molecule is of low affinity, for example, in the range of a $K_D$ of about $10^{-3}$ to about $10^{-7}$ M. In some embodiments, the dissociation constant ($K_D$) for the binding between the binding agent and the molecule is of high affinity, for example, in the range of a $K_D$ of about $10^{-7}$ to about $1 \times 10^{-10}$ M.

In some embodiments, the dissociation of the binding of the agent via the binding site B and the molecule occurs sufficiently fast, for example, to allow the target cell to be only transiently stained or associated with the agent after disruption of the reversible bond between the reagent and the agent. In some cases, when expressed in terms of the $k_{off}$ rate (also called dissociation rate constant for the binding between the agent (via the binding site B) and the molecule, the $k_{off}$ rate is about $0.5 \times 10^{-4}$ sec$^{-1}$ or greater, about $1 \times 10^{-4}$ sec$^{-1}$ or greater, about $2 \times 10^{-4}$ sec$^{-1}$ or greater, about $3 \times 10^{-4}$ sec$^{-1}$ or greater, about $4 \times 10^{-4}$ sec$^{-1}$ of greater, about $5 \times 10^{-4}$ sec$^{-1}$ or greater, about $1 \times 10^{-3}$ sec$^{-1}$ or greater, about $1.5 \times 10^{-3}$ sec$^{-1}$ or greater, about $2 \times 10^{-3}$ sec$^{-1}$ or greater, about $3 \times 10^{-3}$ sec$^{-1}$ or greater, about $4 \times 10^{-3}$ sec$^{-1}$, about $5 \times 10^{-3}$ sec$^{-1}$ or greater, about $1 \times 10^{-2}$ sec or greater, or about $5 \times 10^{-1}$ sec$^{-1}$ or greater. It is within the level of a skilled artisan to empirically determine the $k_{off}$ rate range suitable for a particular agent and cell molecule interaction (see e.g. U.S. published application No. US2014/0295458). For example, an agent with a rather high $k_{off}$ rate of, for example, greater than $4.0 \times 10^{-4}$ sec$^{-1}$ may be used so that, after the disruption of the binding complexes, most of the agent can be removed or dissociated within one hour. In other cases, an agent with a lower $k_{off}$ rate of, for example, $1.0 \times 10^{-4}$ sec$^{-1}$, may be used, so that after the disruption of the binding complexes, most of the agent may be removed or dissociated from the cell within about 3 and a half hours.

In some embodiments, the $K_D$ of this bond as well as the $K_D$, $k_{off}$ and $k_{on}$ rate of the bond formed between the binding site B of the agent (e.g., e.g., selection agent or stimulatory agent) and the cell surface molecule can be determined by any suitable means, for example, by fluorescence titration, equilibrium dialysis or surface plasmon resonance.

In some aspects, the cell surface molecule is a molecule against which an agent (e.g., selection agent or stimulatory agent) may be directed. In some embodiments, the cell surface molecule is a peptide or a protein, such as a receptor, e.g., a membrane receptor protein. In some embodiments, the receptor is a lipid, a polysaccharide or a nucleic acid. In some embodiments, a cell surface molecule that is a protein may be a peripheral membrane protein or an integral membrane protein. The cell surface molecule may in some embodiments have one or more domains that span the membrane. As a few illustrative examples, a membrane protein with a transmembrane domain may be a G-protein coupled receptor, such as an odorant receptors, a rhodopsin receptor, a rhodopsin pheromone receptor, a peptide hormone receptor, a taste receptor, a GABA receptor, an opiate receptor, a serotonin receptor, a Ca2+ receptor, melanopsin, a neurotransmitter receptor, such as a ligand gated, a voltage gated or a mechanically gated receptor, including the acetylcholine, the nicotinic, the adrenergic, the norepinephrine, the catecholamines, the L-DOPA-, a dopamine and serotonin (biogenic amine, endorphin/enkephalin) neuropeptide receptor, a receptor kinase such as serine/threonine kinase, a tyrosine kinase, a porin/channel such as a chloride channel, a potassium channel, a sodium channel, an OMP protein, an ABC transporter (ATP-Binding Cassette-Transporter) such as amino acid transporter, the Na-glucose transporter, the Na/iodide transporter, an ion transporter such as Light Harvesting Complex, cytochrome c oxidase, ATPase Na/K, H/K, Ca, a cell adhesion receptor such as metalloprotease, an integrin or a catherin.

In some embodiments, the cell surface molecule may be an antigen defining a desired cell population or subpopulation, for instance a population or subpopulation of blood cells, e.g., lymphocytes (e.g., T cells, T-helper cells, for example, CD4+ T-helper cells, B cells or natural killer cells), monocytes, or stem cells, e.g. CD34-positive peripheral stem cells or Nanog or Oct-4 expressing stem cells. Examples of T-cells include cells such as CMV-specific CD8+ T-lymphocytes, cytotoxic T-cells, memory T-cells and regulatory T-cells (Treg). An illustrative example of Treg is CD4 CD25 CD45RA Treg cells and an illustrative example of memory T-cells is CD62L CD8+ specific central memory T-cells. The cell surface molecule may also be a marker for a tumor cell.

As described above, in some embodiments, the agent (e.g., selection agent or stimulatory agent) has, in addition to the binding site B that is able to bind the cell surface molecule, a binding partner C. In some aspects, this binding partner C is able to bind to a binding site Z of the reagent (e.g., selection reagent or stimulatory reagent (e.g., oligomeric stimulatory reagent)) wherein the reagent has one or more binding sites for the binding partner C. In some embodiments, the non-covalent bond that may be formed between the binding partner C that is included in the agent (e.g., selection agent or stimulatory agent) and the binding site(s) Z of the reagent (e.g., selection reagent or stimulatory reagent (e.g., oligomeric stimulatory reagent)) may be of any desired strength and affinity, and may be disruptable or reversible under conditions under which the method is performed. The agent (e.g., receptor-binding agent or selection agent) may include at least one, including two, three or more, additional binding partners C and the reagent (e.g., selection reagent or stimulatory reagent (e.g., oligomeric stimulatory reagent)) may include at least two, such as three, four, five, six, seven, eight or more binding sites Z for the binding partner C that is included in the agent (e.g., selection agent or stimulatory agent). As described in U.S. Pat. Nos. 7,776,562, 8,298,782 or International Patent application WO 2002/054065, any combination of a binding partner C and a reagent with one or more corresponding binding sites Z can be chosen, for example, such that the binding partner C and the binding site Z are able to reversibly bind in a complex, such as to cause an avidity effect.

The binding partner C included in the agent (e.g., selection agent or stimulatory agent) may for instance be hydrocarbon-based (including polymeric) and include nitrogen-, phosphorus-, sulphur-, carbon-, halogen- or pseudohalogen groups. In some aspects, it may be an alcohol, an organic acid, an inorganic acid, an amine, a phosphine, a thiol, a disulfide, an alkane, an amino acid, a peptide, an oligopeptide, a polypeptide, a protein, a nucleic acid, a lipid, a saccharide, an oligosaccharide, or a polysaccharide. As further examples, it may also be a cation, an anion, a polycation, a polyanion, a polycation, an electrolyte, a polyelectrolyte, a carbon nanotube or carbon nanofoam. Generally, such a binding partner C has a higher affinity to the binding site of the reagent than to other matter. Examples of a respective binding partner C include, but are not limited to, a crown ether, an immunoglobulin, a fragment thereof and a proteinaceous binding molecule with antibody-like functions.

In some embodiments, the binding partner C that is included in the agent (e.g., selection agent or stimulatory agent) includes biotin and the reagent includes a streptavidin analog or an avidin analog that reversibly binds to biotin. In some embodiments, the binding partner C that is included in the agent (e.g., selection agent or stimulatory agent) includes a biotin analog that reversibly binds to streptavidin or avidin, and the reagent includes streptavidin, avidin, a streptavidin analog or an avidin analog that reversibly binds to the respective biotin analog. In some embodiments, the binding partner C that is included in the agent (e.g., selection agent or stimulatory agent) includes a streptavidin or avidin binding peptide and the reagent includes streptavidin, avidin, a streptavidin analog or an avidin analog that reversibly binds to the respective streptavidin or avidin binding peptide.

In some embodiments, the reagent (e.g., selection reagent or stimulatory reagent) is a streptavidin, such as a streptavidin mutein including any described above (e.g. set forth in SEQ ID NOS: 3-6, 104, 105), and the binding partner C that is included in the agent (e.g., selection agent or stimulatory agent) may include a streptavidin-binding peptide. In some embodiments, the streptavidin-binding peptide may include a sequence with the general formula set forth in SEQ ID NO: 9, such as contains the sequence set forth in SEQ ID NO: 10. In some embodiments, the peptide sequence has the general formula set forth in SEQ ID NO: 11, such as set forth in SEQ ID NO: 12. In one example, the peptide sequence is Trp-Arg-His-Pro-Gln-Phe-Gly-Gly (also called Strep-Tag®, set forth in SEQ ID NO: 7). In one example, the peptide sequence is Trp-Ser-His-Pro-Gln-Phe-Glu-Lys (also called Strep-Tag® II, set forth in SEQ ID NO: 8). In some embodiments, the peptide ligand contains a sequential arrangement of at least two streptavidin-binding modules, wherein the distance between the two modules is at least 0 and not greater than 50 amino acids, wherein one binding module has 3 to 8 amino acids and contains at least the sequence His-Pro-Xaa (SEQ ID NO: 9), where Xaa is glutamine, asparagine, or methionine, and wherein the other binding module has the same or different streptavidin peptide ligand, such as set forth in SEQ ID NO: 11 (see e.g. International Published PCT Appl. No. WO02/077018; U.S. Pat. No. 7,981,632). In some embodiments, the peptide ligand contains a sequence having the formula set forth in any of SEQ ID NO: 13 or 14. In some embodiments, the peptide ligand has the sequence of amino acids set forth in any of SEQ ID NOS: 15-19. In most cases, all these streptavidin binding peptides bind to the same binding site, namely the biotin binding site of streptavidin. If one or more of such streptavidin binding peptides is used as binding partners C, e.g. C1 and C2, the multimerization reagent is typically a streptavidin mutein.

In some embodiments, the streptavidin-binding peptide may be further modified. In some embodiments, the streptavidin-binding peptide may include the peptide sequence is Trp-Ser-His-Pro-Gln-Phe-Glu-Lys (also called Strep-Tag® II, set forth in SEQ ID NO: 8) conjugated with a nickel charged trisNTA (also called His-STREPPER or His/Strep-Tag®II Adapter).

In some embodiments, the binding partner C of the agent (e.g., receptor-binding agent or selection agent) includes a moiety known to the skilled artisan as an affinity tag. In such an embodiment, the reagent may include a corresponding binding partner, for example, an antibody or an antibody fragment, known to bind to the affinity tag. As a few illustrative examples of known affinity tags, the binding partner C that is included in the agent (e.g., selection agent or stimulatory agent) may include dinitrophenol or digoxigenin, oligohistidine, polyhistidine, an immunoglobulin domain, maltose-binding protein, glutathione-S-transferase (GST), chitin binding protein (CBP) or thioredoxin, calmodulin binding peptide (CBP), FLAG'-peptide, the HA-tag (sequence: Tyr-Pro-Tyr-Asp-Val-Pro-Asp-Tyr-Ala) (SEQ ID NO: 20), the VSV-G-tag (sequence: Tyr-Thr-Asp-Ile-Glu-Met-Asn-Arg-Leu-Gly-Lys) (SEQ ID NO: 21), the HSV-tag (sequence: Gln-Pro-Glu-Leu-Ala-Pro-Glu-Asp-Pro-Glu-Asp) (SEQ ID NO: 22), the T7 epitope (Ala-Ser-Met-Thr-Gly-Gly-Gln-Gln-Met-Gly) (SEQ ID NO: 23), maltose binding protein (MBP), the HSV epitope of the sequence Gln-Pro-Glu-Leu-Ala-Pro-Glu-Asp-Pro-Glu-Asp (SEQ ID NO: 24) of herpes simplex virus glycoprotein D, the "myc" epitope of the transcription factor c-myc of the sequence Glu-Gln-Lys-Leu-Ile-Ser-Glu-Glu-Asp-Leu (SEQ ID NO: 25), the V5-tag (sequence: Gly-Lys-Pro-Ile-Pro-Asn-Pro-Leu-Leu-Gly-Leu-Asp-Ser-Thr) (SEQ ID NO: 26), or glutathione-S-transferase (GST). In such embodiments, the complex formed between the one or more binding sites Z of the reagent which may be an antibody or antibody fragment, and the antigen can be disrupted competitively by adding the free antigen, i.e. the free peptide (epitope tag) or the free protein (such as MBP or CBP). In some embodiments, the affinity tag might also be an oligonucleotide tag. In some cases, such an oligonucleotide tag may, for instance, be used to hybridize to an oligonucleotide with a complementary sequence, linked to or included in the reagent.

Further examples of a suitable binding partner C include, but are not limited to, a lectin, protein A, protein G, a metal, a metal ion, nitrilo triacetic acid derivatives (NT A), RGD-motifs, a dextrane, polyethyleneimine (PEI), a redox polymer, a glycoproteins, an aptamers, a dye, amylose, maltose, cellulose, chitin, glutathione, calmodulin, gelatine, polymyxin, heparin, NAD, NADP, lysine, arginine, benzamidine, poly U, or oligo-dT. Lectins such as Concavalin A are known to bind to polysaccharides and glycosylated proteins. An illustrative example of a dye is a triazine dye such as Cibacron blue F3G-A (CB) or Red HE-3B, which specifically bind NADH-dependent enzymes. Typically, Green A binds to Co A proteins, human serum albumin, and dehydrogenases. In some cases, the dyes 7-aminoactinomycin D and 4',6-diamidino-2-phenylindole bind to DNA. Generally, cations of metals such as Ni, Cd, Zn, Co, or Cu, are typically used to bind affinity tags such as an oligohistidine containing sequence, including the hexahistidine or the His-Asn-His-Arg-His-Lys-His-Gly-Gly-Gly-Cys tag (MAT tag) (SEQ ID NO: 35), and N-methacryloyl-(L)-cysteine methyl ester.

In some embodiments, the binding between the binding partner C that is included in the agent (e.g., selection agent or stimulatory agent) and the one or more binding sites Z of the reagent occurs in the presence of a divalent, a trivalent or a tetravalent cation. In this regard, in some embodiments, the reagent includes a divalent, a trivalent or a tetravalent cation, typically held, e.g. complexed, by means of a suitable chelator. In some embodiments, the binding partner C that is included in the agent (e.g., selection agent or stimulatory agent) may include a moiety that includes, e.g. complexes, a divalent, a trivalent or a tetravalent cation. Examples of a respective metal chelator, include, but are not limited to, ethylenediamine, ethylenediaminetetraacetic acid (EDTA), ethylene glycol tetraacetic acid (EGTA), diethylenetri-aminepentaacetic acid (DTPA), N,N-bis(carboxymethyl)glycine (also called nitrilotriacetic acid, NTA), 1,2-bis(o-aminophenoxy)ethane-N,N,N',N'-tetraacetic acid (BAPTA), 2,3-dimer-capto-1-propanol (dimercaprol), porphine and heme. As an example, EDTA forms a complex with most monovalent, divalent, trivalent and tetravalent metal ions, such as e.g. silver ($Ag^+$), calcium ($Ca^{2+}$), manganese ($Mn^{2+}$), copper ($Cu^{2+}$), iron ($Fe^{2+}$), cobalt ($Co^+$) and zirconium ($Zr^{4+}$), while BAPTA is specific for $Ca^{2+}$. As an illustrative example, a standard method used in the art is the formation of a complex between an oligohistidine tag and copper ($Cu^{2+}$), nickel ($Ni^{2+}$), cobalt ($Co^{2+}$), or zinc ($Zn^{2+}$) ions, which are presented by means of the chelator nitrilotriacetic acid (NTA).

In some embodiments, the binding partner C that is included in the agent (e.g., selection agent or stimulatory agent) includes a calmodulin binding peptide and the reagent includes multimeric calmodulin as described in U.S. Pat. No. 5,985,658, for example. In some embodiments, the binding partner C that is included in the agent (e.g., selection agent or stimulatory agent) includes a FLAG peptide and the reagent includes an antibody that binds to the FLAG peptide, e.g. the FLAG peptide, which binds to the monoclonal antibody 4E11 as described in U.S. Pat. No. 4,851,341. In one embodiment, the binding partner C that is included in the agent (e.g., selection agent or stimulatory agent) includes an oligohistidine tag and the reagent includes an antibody or a transition metal ion binding the oligohistidine tag. In some cases, the disruption of all these binding complexes may be accomplished by metal ion chelation, e.g. calcium chelation, for instance by adding EDTA or EGTA. In some embodiments, calmodulin, antibodies such as 4E11 or chelated metal ions or free chelators may be multimerized by conventional methods, e.g. by biotinylation and complexation with streptavidin or avidin or oligomers thereof or by the introduction of carboxyl residues into a polysaccharide, e.g. dextran, essentially as described in Noguchi, A, et al. Bioconjugate Chemistry (1992) 3, 132-137 in a first step and linking calmodulin or antibodies or chelated metal ions or free chelators via primary amino groups to the carboxyl groups in the polysaccharide, e.g. dextran, backbone using conventional carbodiimide chemistry in a second step. In some such embodiments, the binding between the binding partner C that is included in the agent (e.g., selection agent or stimulatory agent) and the one or more binding sites Z of the reagent can be disrupted by metal ion chelation. The metal chelation may, for example, be accomplished by addition of EGTA or EDTA.

In some embodiments, the agent (e.g., selection agent or stimulatory agent), which specifically bind to the cell surface molecule, may for instance be comprised by an antibody, a fragment thereof, or a proteinaceous binding molecule with antibody-like functions. In some embodiments, the binding site B of the agent is an antibody combining site, such as is or contains one or more complementarity determining regions (CDRs) of an antibody. Examples of (recombinant) antibody fragments include, but are not limited to, Fab fragments, Fv fragments, single-chain Fv fragments (scFv), a divalent antibody fragment such as an (Fab)2'-fragment, diabodies, triabodies (Iliades, P., et al, FEB S Lett (1997) 409, 437-441), decabodies (Stone, E., et al, Journal of Immunological Methods (2007) 318, 88-94) and other domain antibodies (Holt, L. J., et al, Trends Biotechnol. (2003), 21, 11, 484-490). In some embodiments, the agent (e.g., receptor-binding agent or selection agent) may comprise a bivalent proteinaceous artificial binding molecule such as a dimeric lipocalin mutein that is also known as "duocalin".

In some embodiments, the agent (e.g., selection agent or stimulatory agent) may have a single binding site B, i.e., it may be monovalent. Examples of monovalent agents (e.g., selection agent or stimulatory agent) include, but are not limited to, a monovalent antibody fragment, a proteinaceous binding molecule with antibody-like binding properties or an MHC molecule. Examples of monovalent antibody fragments include, but are not limited to a Fab fragment, an Fv fragment, and a single-chain Fv fragment (scFv), including a divalent single-chain Fv fragment.

In some embodiments, the agent (e.g., selection agent or stimulatory agent) is an antibody or an antigen-binding fragment thereof, such as a Fab fragments, Fv fragments, single-chain Fv fragments (scFv), a divalent antibody fragment such as an F(ab')2-fragment. In some embodiments, the agent (e.g., selection agent or stimulatory agent) is or is derived from a parental antibody that is known to bind to a cell molecule of interest. Various antibody molecules or fragments thereof against cell surface molecules are well known in the art and any of a variety of such can be used as agents in the methods herein. In some embodiments, the agent (e.g., selection agent or stimulatory agent) is an antibody or fragment thereof that contains one or more amino acid replacements in the variable heavy chain of a parental or reference antibody, for example, to generate an antibody with an altered affinity or that exhibits a sufficiently fast off-rate as described above. For example, exemplary of such mutations are known the context of mutants of the anti-CD4 antibody 13B8.2 (see e.g., U.S. Pat. No. 7,482,000, U.S. Patent Appl. Pub. No. US2014/0295458 or International Patent Application App. No. WO2013/124474), and any of such mutations can be generated in another parental or reference antibody.

In some aspects, the agent (e.g., selection agent or stimulatory agent) that can be monovalent, for example comprise a monovalent antibody fragment or a monovalent artificial binding molecule (proteinaceous or other) such as a mutein based on a polypeptide of the lipocalin family (also known as "Anticalin®"), or a bivalent molecule such as an antibody or a fragment in which both binding sites are retained such as an F(ab')2 fragment.

An example of a proteinaceous binding molecule with antibody-like functions includes a mutein based on a polypeptide of the lipocalin family (see for example, WO 03/029462, Beste et al, Proc. Natl. Acad. Sci. U.S.A. (1999) 96, 1898-1903). Generally, lipocalins, such as the bilin binding protein, the human neutrophil gelatinase-associated lipocalin, human Apo lipoprotein D or human tear lipocalin possess natural ligand-binding sites that can be modified so that they bind a given target. Further examples of a proteinaceous binding molecule with antibody-like binding properties that can be used as agent (e.g., selection agent or stimulatory agent) that specifically binds to the cell surface molecule include, but are not limited to, the so-called glubodies (see e.g. international patent application WO 96/23879), proteins based on the ankyrin scaffold (Mosavi, L. K., et al, Protein Science (2004) 13, 6, 1435-1448) or crystalline scaffold (e.g. international patent application WO 01/04144) the proteins described in Skerra, J. Mol. Recognit. (2000) 13, 167-187, AdNectins, tetranectins and avimers. Generally, avimers, including multivalent avimer proteins evolved by exon shuffling of a family of human receptor domains, contain so called A-domains that occur as strings of multiple domains in several cell surface receptors (Silverman, J., et al, Nature Biotechnology (2005) 23, 1556-1561). Adnectins, generally derived from a domain of human fibronectin, typically contain three loops that can be engineered for immunoglobulin-like binding to targets (Gill, D. S. & Damle, N. K., Current Opinion in Biotechnology (2006) 17, 653-658). Tetranectins, generally derived from the respective human homotrimeric protein, likewise typically contain loop regions in a C-type lectin domain that can be engineered for desired binding. Peptoids, which can, in some cases, act as protein ligands, typically are oligo(N-alkyl) glycines that differ from peptides in that the side chain is connected to the amide nitrogen rather than the carbon atom. Peptoids are typically resistant to proteases and other modifying enzymes and can have a much higher cell permeability than peptides (see e.g. Kwon, Y.-U., and Kodadek, T., J. Am. Chem. Soc. (2007) 129, 1508-1509).

Further examples of suitable proteinaceous binding molecules include, but are not limited to, an EGF-like domain, a Kringle-domain, a fibronectin type I domain, a fibronectin type II domain, a fibronectin type III domain, a PAN domain, a Gla domain, a SRCR domain, a Kunitz/Bovine pancreatic trypsin Inhibitor domain, tendamistat, a Kazal-type serine protease inhibitor domain, a Trefoil (P-type) domain, a von Willebrand factor type C domain, an Anaphylatoxin-like domain, a CUB domain, a thyroglobulin type I repeat, LDL-receptor class A domain, a Sushi domain, a Link domain, a Thrombospondin type I domain, an immunoglobulin domain or a an immunoglobulin-like domain (for example, domain antibodies or camel heavy chain antibodies), a C-type lectin domain, a MAM domain, a von Willebrand factor type A domain, a Somatomedin B domain, a WAP-type four disulfide core domain, a F5/8 type C domain, a Hemopexin domain, an SH2 domain, an SH3 domain, a Laminin-type EGF-like domain, a C2 domain, "Kappabodies" (Ill et al. Protein Eng (1997) 10, 949-57, a so called "minibody" (Martin et al, EMBO J (1994) 13, 5303-5309), a diabody (Holliger et al, PNAS USA (1993)90, 6444-6448), a so called "Janusis" (Traunecker et al, EMBO J (1991) 10, 3655-3659, or Traunecker et al, Int J Cancer (1992) Suppl 7, 51-52), a nanobody, a microbody, an affilin, an affibody, a knottin, ubiquitin, a zinc-finger protein, an autofluorescent protein or a leucine-rich repeat protein. In some embodiments, a nucleic acid molecule with antibody-like functions can be an aptamer. Generally, an aptamer folds into a defined three-dimensional motif and shows high affinity for a given target structure.

III. SERUM-FREE MEDIUA FORMULATIONS AND RELATED COMPONENTS

One or more steps of the provided methods can be carried out in the presence of a serum-free media containing a free form of glutamine (i.e., L-glutamine) in a basal medium. One or more further supplements can be added, including one or more supplements containing at least one protein, such as a serum-substituting protein, or one or more other components supporting maintenance, growth and/or expansion of cells. In some embodiments, the serum-free media contains a synthetic amino acid (e.g., a dipeptide form of L-glutamine, e.g., L-alanyl-L-glutamine), In some embodiments, the concentration of the synthetic amino acid (e.g., a dipeptide form of L-glutamine, e.g., L-alanyl-L-glutamine) is at or about 0.5 mM to at or about 5 mM (such as 2 mM). In some embodiments, the concentration of L-glutamine is at or about 0.5 mM to at or about 5 mM (such as 2 mM). In some embodiments, the at least one protein is a human protein or a recombinant protein, such as a serum-substituting protein, e.g. albumin. In some embodiments, the serum free media further comprises one or more recombinant cytokine (such as IL-2, IL-7, or IL-15). In some embodiments, the serum free media does not further comprise one or more recombinant cytokine (such as IL-2, IL-7, or IL-15). In some embodiments, the serum-free media does not comprise phenol red.

In some embodiments, the provided serum-free media is produced or prepared from a liquid basal medium and one or more supplements.

In some embodiments, the serum-free media can contain a synthetic amino acid that is capable of being converted into L-glutamine in a cell culture, such as a synthetic amino acid that is a dipeptide form of L-glutamine, e.g., L-alanyl-L-glutamine. In some cases, the synthetic amino acid is provided in a basal medium in which is contained a free of L-glutamine and a protein. In some embodiments, the concentration of the synthetic amino acid (e.g., a dipeptide form of L-glutamine, e.g., L-alanyl-L-glutamine) is at or about 0.5 mM to at or about 5 mM (such as 2 mM). In some embodiments, the at least one protein is a human-derived protein, a recombinant protein, or both. In some embodiments, the basal medium does not comprise phenol red.

In some embodiments, among supplements for preparing a serum-free media is a supplement comprising at least one protein and a free form of glutamine, e.g. L-glutamine, wherein the supplement is frozen or has been frozen after L-glutamine becomes a component thereof. In some embodiments, the concentration of L-glutamine in the supplement is less than 200 mM, such as less than 150 mM, 100 mM or less, such as 20 mM to 120 mM, or 40 mM to 100 mM, such as or about 80 mM. In some embodiments, the concentration of L-glutamine after the supplement has been combined with basal medium is about 0.5 mM to about 5 mM (such as 2 mM). In some embodiments, the at least one protein is not of a non-mammalian origin. In some embodiments, the at least one protein is a human protein or a human-derived protein or is recombinant. In some embodiments, the at least one protein includes albumin, e.g. human or recombinant human albumin.

A. Basal Medium

In some embodiments, the basal medium comprises a carbon source such as glucose, water, one or more salts, and a source of amino acids and nitrogen.

In some embodiments, the basal medium comprises an amino acid. In some embodiments, the amino acid comprises aspartic acid, glutamic acid, asparagine, serine, glutamine, histidine, glycine, threonine, arginine, alanine, tyrosine, cysteine, valine, methionine, norvaline, tryptophan, phenylalanine, isoleucine, leucine, lysine, hydroxyproline, sarcosine, and/or proline.

In some embodiments, the basal medium comprises at least one synthetic amino acid. In some embodiments, the synthetic amino acid is capable of being converted into a free form of glutamine (i.e., L-glutamine) in a cell culture comprising a cell. In some embodiments, the cell comprises a human cell. In some embodiments, the cell comprises an immune cell. In some embodiments, the cell is a genetically engineered cell. In some embodiments, the cell is a T cell. In some embodiments, the cell is a genetically engineered T cell. In some embodiments, the cell is genetically engineered to express a recombinant receptor (e.g., a chimeric antigen receptor). In some embodiments, the cell is a chimeric antigen receptor (CAR) expressing T cells.

In some embodiments, the synthetic amino acid is a stabilized form of glutamine (i.e., L-glutamine). In some embodiments, the synthetic amino acid is more stable than glutamine (i.e., L-glutamine) in an aqueous solution (e.g., a basal medium). In some embodiments, the synthetic amino acid does not produce a significant amount of glutamine in the basal medium. In some embodiments, the synthetic amino acid does not produce a significant amount of pyrrolidone carboxylic acid or ammonia in the basal medium. In some embodiments, the synthetic amino acid does not produce a significant amount of glutamine (i.e., L-glutamine) for at least about 1, 3, 5, 7, 9, 11 13, or 14 days in the basal medium. In some embodiments, the synthetic amino acid does not produce a significant amount of glutamine (i.e., L-glutamine) for at least about 1, 2, 3, 4, 5, 6, 7, or 8 weeks in the basal medium. In some embodiments, the synthetic amino acid does not produce a significant amount of glutamine (i.e., L-glutamine) for at least about 1, 2, 3, 4, 5, 6, 7, 8, 9, 10, 11, or 12 months in the basal medium. In some embodiments, the synthetic amino acid does not produce a significant amount of glutamine (i.e., L-glutamine) for at least 1, 2, 3, 4, or 5 years in the basal medium. In some embodiments, the synthetic amino acid does not produce a significant amount of pyrrolidone carboxylic acid or ammonia for at least about 1, 3, 5, 7, 9, 11 13, or 14 days in the basal medium. In some embodiments, the synthetic amino acid does not produce a significant amount of pyrrolidone carboxylic acid or ammonia for at least about 1, 2, 3, 4, 5, 6, 7, or 8 weeks in the basal medium. In some embodiments, the synthetic amino acid does not produce a significant amount of pyrrolidone carboxylic acid or ammonia for at least about 1, 2, 3, 4, 5, 6, 7, 8, 9, 10, 11, or 12 months in the basal medium. In some embodiments, the synthetic amino acid does not produce a significant amount of pyrrolidone carboxylic acid or ammonia for at least 1, 2, 3, 4, or 5 years in the basal medium.

In some embodiments, the synthetic amino acid is soluble in an aqueous solution (e.g., a basal medium). In some embodiments, the solubility of the synthetic amino acid in the aqueous solution is higher than a free form of glutamine (i.e., L-glutamine).

In some embodiments, the synthetic amino acid is capable of being transported into a cell, wherein it can be converted into a free form of glutamine (i.e., L-glutamine). In some embodiments, the cell comprises an immune cell. In some embodiments, the cell is a genetically engineered cell. In some embodiments, the cell is a T cell. In some embodiments, the cell is a genetically engineered T cell. In some embodiments, the cell is genetically engineered to express a recombinant receptor (e.g., a chimeric antigen receptor). In some embodiments, the cell is a chimeric antigen receptor (CAR) expressing T cells.

In some embodiments, the synthetic amino acid is a dipeptide. In some embodiments, the synthetic amino acid is a tripeptide. In some embodiments, the synthetic amino acid is a dipeptide form of L-glutamine (e.g., L-alanyl-L-glutamine), such as the dipeptide in Giutamax™ that does not spontaneously degrade in the basal medium.

In some embodiments, the concentration of the dipeptide form of L-glutamine (e.g., L-alanyl-L-glutamine) in the basal medium is about 0.5 mM-5 mM. In some embodiments, the concentration of the dipeptide form of L-glutamine (e.g., L-alanyl-L-glutamine) in the basal medium is at or about 2 mM. In some embodiments, the concentration of the dipeptide form of L-glutamine (e.g., L-alanyl-L-glutamine) is at or about 0.5 mM-1 mM, 0.5 mM-1.5 mM, 0.5 mM-2 mM, 0.5 mM-2.5 mM, 0.5 mM-3 mM, 0.5 mM-3.5 mM, 0.5 mM-4 mM, 0.5 mM-4.5 mM, 0.5 mM-5 mM, 1 mM-1.5 mM, 1 mM-2 mM, 1 mM-2.5 mM, 1 mM-3 mM, 1 mM-3.5 mM, 1 mM-4 mM, 1 mM-4.5 mM, 1 mM-5 mM, 1.5 mM-2 mM, 1.5 mM-2.5 mM, 1.5 mM-3 mM, 1.5 mM-3.5 mM, 1.5 mM-4 mM, 1.5 mM-4.5 mM, 1.5 mM-5 mM, 2 mM-2.5 mM, 2 mM-3 mM, 2 mM-3.5 mM, 2 mM-4 mM, 2 mM-4.5 mM, 2 mM-5 mM, 2.5 mM-3 mM, 2.5 mM-3.5 mM, 2.5 mM-4 mM, 2.5 mM-4.5 mM, 2.5 mM-5 mM, 3 mM-3.5 mM, 3 mM-4 mM, 3 mM-4.5 mM, 3 mM-5 mM, 3.5 mM-4 mM, 3.5 mM-4.5 mM, 3.5 mM-5 mM, 4 mM-4.5 mM, 4 mM-5 mM, or 4.5 mM-5 mM, each inclusive. In some embodiments, the concentration of the dipeptide form of L-glutamine (e.g., L-alanyl-L-glutamine) in the basal medium is at or about 5 mM-7.5 mM, 5 mM-10 mM, 5 mM-12.5 mM, 5 mM-15 mM, 5 mM-17.5 mM, 5 mM-20 mM, 7.5 mM-10 mM, 7.5 mM-12.5 mM, 7.5 mM-15 mM, 7.5 mM-17.5 mM, 7.5 mM-20 mM, 10 mM-12.5 mM, 10 mM-15 mM, 10 mM-17.5 mM, 10 mM-20 mM, 12.5 mM-15 mM, 12.5 mM-17.5 mM, 12.5 mM-20 mM, 15 mM-17.5 mM, 15 mM-20 mM, or 17.5 mM-20 mM, each inclusive. In some embodiments, the concentration of dipeptide form of L-glutamine (e.g., L-alanyl-L-glutamine) in the basal medium is at least about at or 0.5 mM, 1 mM, 1.5 mM, 2 mM, 2.5 mM, 3 mM, 3.5 mM, 4 mM, 4.5 mM, or 5 mM. In some embodiments, the concentration of the dipeptide form of L-glutamine (e.g., L-alanyl-L-glutamine) in the basal medium is or is about 2 mM. In some embodiments, the concentration of the dipeptide form of L-glutamine (e.g., L-alanyl-L-glutamine) in the basal medium is at most at or about 2 mM, 2.5 mM, 3 mM, 3.5 mM, 4 mM, 4.5 mM, 5 mM, 5.5 mM, 6 mM, 6.5 mM, 7 mM, 7.5 mM, 8 mM, 8.5 mM, 9 mM, 9.5 mM, 10 mM, 12.5 mM, 15 mM, 17.5 mM, or 20 mM.

In some embodiments, the basal medium does not comprise L-glutamine or does not comprise a significant amount of L-glutamine.

In some embodiments, the basal medium comprises L-glutamine. In some embodiments, the concentration of the L-glutamine in the basal medium is at or about or less than at or about 0.1 mM, 0.2 mM, 0.3 mM, 0.4 mM, or 0.5 mM. In some embodiments, the concentration of the L-glutamine in the basal medium is at or about or less than at or about 1 mM, 2 mM, 3 mM, 4 mM, or 5 mM. In some embodiments, the concentration of the L-glutamine in the basal medium is at or about 2 mM.

In some embodiments, the one or more amino acids, including at least one synthetic amino acid that is capable of being converted into a free form of glutamine (i.e., L-glutamine), e.g. dipeptide form of L-glutamine, such as L-alanyl-L-glutamine, is provided in a basal medium. In some embodiments, the basal media is an artificial or synthetic medium. In some embodiments, the basal media is or comprises a balanced salt solution (e.g., PBS, DPBS, HBSS, EBSS). In some embodiments, the basal media is selected from Dulbecco's Modified Eagle's Medium (DMEM), Minimal Essential Medium (MEM), Basal Medium Eagle (BME), F-10, F-12, RPMI 1640, Glasgow's Minimal Essential Medium (GMEM), alpha Minimal Essential Medium (alpha MEM), Iscove's Modified Dulbecco's Medium, and M199. In some embodiments, the basal media is a complex medium (e.g., RPMI-1640, IMDM). In some embodiments, the basal medium is OpTmizer™ CTS™ T-Cell Expansion Basal Medium (ThermoFisher).

In some embodiments, the basal media comprises a nutrient mixture of inorganic salts, sugars, amino acids, optionally also containing vitamins, organic acids, antioxidants, and/or buffers.

In some embodiments, the basal medium comprises $CO_3^{2-}$ and $HCO_3^-$. In some embodiments, the $CO_3^{2-}/HCO_3^-$ content of the basal medium is balanced with gaseous $CO_2$ (e.g., 5-10%), thereby maintaining an optimal pH in the medium. In some embodiments, the basal medium comprises a zwitterion, e.g. HEPES. In some embodiments, the basal medium comprises phenol red. In some embodiments, the basal medium does not comprise phenol red.

In some embodiments, the basal medium comprises an inorganic salt. In some embodiments, the inorganic salt promotes the osmotic balance. In some embodiments, the inorganic salt regulates membrane potential by providing sodium, potassium, and calcium ions.

In some embodiments, the basal medium comprises one or more carbohydrates. In some embodiments, the carbohydrate comprises glucose. In some embodiments, the carbohydrate comprises galactose. In some embodiments, the carbohydrate comprises maltose. In some embodiments, the carbohydrate comprises fructose.

In some embodiments, the basal medium comprises fatty acid. In some embodiments, the basal medium comprises lipid. In some embodiments, the basal medium comprises vitamin (e.g., Vitamin A, Vitamin B7, Vitamin B9, Vitamin B12, Vitamin C, Vitamin E). In some embodiments, the basal medium comprises a trace element. In some embodiments, the trace element comprises copper. In some embodiments, the trace element comprises zinc. In some embodiments, the trace element comprises selenium. In some embodiments, the trace element comprises tricarboxylic acid intermediate.

In some embodiments, the basal medium contains a mixture of inorganic salts, sugars, amino acids, and, optionally, vitamins, organic acids and/or buffers or other well known cell culture nutrients. In addition to nutrients, the medium also helps maintain pH and osmolality. In some aspects, the reagents of the basal media support cell growth, proliferation and/or expansion. A wide variety of basal media are available and include Dulbeccos' Modified Eagles Medium (DMEM), Roswell Park Memorial Institute Medium (RPMI), Iscove modified Dulbeccos' medium and Hams medium. In some embodiments, the basal medium is Iscove's Modified Dulbecco's Medium, RPMI-1640, or α-MEM.

In some embodiments, the basal medium is free of a protein. In some embodiments, the basal medium is free of a human protein (e.g., a human serum protein). In some embodiments, the basal medium is serum-free. In some embodiments, the basal medium is free of serum derived from human. In some embodiments, the basal medium is free of a recombinant protein. In some embodiments, the basal medium is free of a human protein and a recombinant protein.

In some embodiments, the basal medium comprises a protein or a peptide. In some embodiments, the protein is an albumin or albumin substitute. In some embodiments, the albumin is a human derived albumin. In some embodiments, the albumin is a recombinant albumin. In some embodiments, the albumin is a natural human serum albumin. In some embodiments, the albumin is a recombinant human serum albumin. In some embodiments, the albumin is a recombinant albumin from a non-human source. Albumin substitutes may be any protein or polypeptide source. Examples of such protein or polypeptide samples include but are not limited to bovine pituitary extract, plant hydrolysate (e.g., rice hydrolysate), fetal calf albumin (fetuin), egg albumin, human serum albumin (HSA), or another animal-derived albumins, chick extract, bovine embryo extract, AlbuMAX® I, and AlbuMAX® II. In some embodiments, the protein or peptide comprises a transferrin. In some embodiments, the protein or peptide comprises a fibronectin. In some embodiments, the protein or peptide comprises aprotinin. In some embodiments, the protein comprises fetuin.

In some embodiments, the basal medium (e.g. OpTmizer™ CTS™ T-Cell Expansion Basal Medium) is a liquid formulation. In some embodiments, the basal medium has not been frozen or is instructed not to be frozen (e.g., according to its protocol) prior to an intended use. In some embodiments, the basal medium is stored at or about 2° C. to 8° C. In some embodiments, the basal medium is stored at room temperature. In some embodiments, the basal medium is stable for at least at or about 1, 2, 3, 4, 5, or 6 weeks when stored at 2° C. to 8° C. In some embodiments, the basal medium is stable for at least at or about 1, 2, 3, 4, 5, or 6 months when stored at 2° C. to 8° C.

B. Additional Components and Supplement

In some embodiments, the serum-free media includes the basal medium and one or more additional components, which can be provided by one or more supplements. In some embodiments, the one or more supplement includes at least a first supplement, comprising a free form of glutamine (i.e., L-glutamine). In some embodiments, such a supplement is frozen prior to use and/or incorporation into a basal medium. In some embodiments, the supplement such as these described herein is intended to be used as a media supplement (e.g., a media supplement for a basal medium). In some embodiments, the first supplement and/or further supplement provides for the maintenance of a cell. In some embodiments, the cell is a primary cell. In some embodiments, the cell is an immune cell. In some embodiments, the cell is a T cell. In some embodiments, the cell is a CD3 T cell, CD4 T cell or CD8 T cell. In some embodiments, the cell is a cell from human. In some embodiments, the cell is an immune cell from human. In some embodiments, the cell is a T cell from human. In some embodiments, the cell is a primary immune cell from human. In some embodiments, the cell is a genetically engineered cell. In some embodiments, the cell is a genetically engineered cell derived from human. In some embodiments, the cell is a genetically engineered T cell (e.g., a chimeric antigen receptor (CAR) expressing T cell) from human.

In some embodiments, the first supplement is stored or is recommended to be stored at or about −20° C. to at or about 0° C. before its intended use. In some embodiments, the supplement is stored or is recommended to be stored at less than about 0° C. In some embodiments, the supplement is frozen immediately or quickly after the free form of glutamine (i.e., L-glutamine) becomes a component thereof until the time when the supplement is used for its intended use. In some embodiments, the supplement is frozen for the majority of the time after the free form of glutamine (i.e., L-glutamine) becomes a component thereof until the time when the supplement is used for its intended use. In some embodiments, the supplement is not kept as a liquid for more than 1, 2, 3, 4, 5, 6, or 7 days after the free form of glutamine (i.e., L-glutamine) becomes a component thereof until the time when the supplement is used for its intended use. In some embodiments, the supplement is not kept as a liquid for more than or more than about 4, 8, 12, 16, 20, or 24 hours after the free form of glutamine (i.e., L-glutamine) becomes a component thereof until the time when the supplement is used for its intended use. In some embodiments, the supplement is frozen for the majority of the time both before and after the free form of glutamine (i.e., L-glutamine) becomes a component thereof until the time when the supplement is used for its intended use. In some embodiments, the supplement is at or below room temperature (e.g., the temperature of the supplement is under or under about 20° C., 15° C., 10° C., 5° C., or 0° C.) when the free form of glutamine (i.e., L-glutamine) becomes a component of the supplement. In one aspect, the presence of the L-glutamine in the frozen supplement ensured its stability prior to addition to the basal media to minimize variable glutamine concentration and/or increasing ammonia concentration in the serum-free media formulation that can occur due to instability of L-glutamine.

In some embodiments, the free form L-glutamine in the supplement does not precipitate when the supplement is thawed. In some embodiments, the free form L-glutamine in the supplement does not precipitate when the supplement is a liquid. In some embodiments, the free form L-glutamine in the supplement does not precipitate when the supplement is thawed under room temperature. In some embodiments, the concentration of free form L-glutamine in the supplement is at or about or less than or less than about 400 mM, 300 mM, 200 mM, 180 mM, 160 mM, 140 mM, 120 mM, 100 mM or 80 mM. In some embodiments, the concentration of L-glutamine in the supplement is about 200 mM.

In some embodiments, the concentration of the free form of glutamine (i.e., L-glutamine) in the supplement is such that after the supplement is combined with a basal medium (such as these described herein), the concentration of the free form of glutamine (i.e., L-glutamine) in the media is at or about 0.5 mM-5 mM. In some embodiments, the concentration of the free form of glutamine (i.e., L-glutamine) in the basal medium is at or about 2 mM. In some embodiments, the concentration of the free form of glutamine (i.e., L-glutamine) is at or about 0.5 mM-1 mM, 0.5 mM-1.5 mM, 0.5 mM-2 mM, 0.5 mM-2.5 mM, 0.5 mM-3 mM, 0.5 mM-3.5 mM, 0.5 mM-4 mM, 0.5 mM-4.5 mM, 0.5 mM-5 mM, 1 mM-1.5 mM, 1 mM-2 mM, 1 mM-2.5 mM, 1 mM-3 mM, 1 mM-3.5 mM, 1 mM-4 mM, 1 mM-4.5 mM, 1 mM-5 mM, 1.5 mM-2 mM, 1.5 mM-2.5 mM, 1.5 mM-3 mM, 1.5 mM-3.5 mM, 1.5 mM-4 mM, 1.5 mM-4.5 mM, 1.5 mM-5 mM, 2 mM-2.5 mM, 2 mM-3 mM, 2 mM-3.5 mM, 2 mM-4 mM, 2 mM-4.5 mM, 2 mM-5 mM, 2.5 mM-3 mM, 2.5 mM-3.5 mM, 2.5 mM-4 mM, 2.5 mM-4.5 mM, 2.5 mM-5 mM, 3 mM-3.5 mM, 3 mM-4 mM, 3 mM-4.5 mM, 3 mM-5 mM, 3.5 mM-4 mM, 3.5 mM-4.5 mM, 3.5 mM-5 mM, 4 mM-4.5 mM, 4 mM-5 mM, or 4.5 mM-5 mM, each inclusive. In some embodiments, the concentration of the free form of glutamine (i.e., L-glutamine) in the basal medium is at or about 5 mM-7.5 mM, 5 mM-10 mM, 5 mM-12.5 mM, 5 mM-15 mM, 5 mM-17.5 mM, 5 mM-20 mM, 7.5 mM-10 mM, 7.5 mM-12.5 mM, 7.5 mM-15 mM, 7.5 mM-17.5 mM, 7.5 mM-20 mM, 10 mM-12.5 mM, 10 mM-15 mM, 10 mM-17.5 mM, 10 mM-20 mM, 12.5 mM-15 mM, 12.5 mM-17.5 mM, 12.5 mM-20 mM, 15 mM-17.5 mM, 15 mM-20 mM, or 17.5 mM-20 mM, each inclusive. In some embodiments, the concentration of the free form of glutamine (i.e., L-glutamine) in the basal medium is at least at or about 0.5 mM, 1 mM, 1.5 mM, 2 mM, 2.5 mM, 3 mM, 3.5 mM, 4 mM, 4.5 mM, or 5 mM. In some embodiments, the concentration of the free form of glutamine (i.e., L-glutamine) in the basal medium is at most at or about 2 mM.

In some embodiments, the first supplement contains one or more additional components. In some embodiments, a further supplement, such as a second supplement, is provided to provide one or more additional components. In some embodiments, the supplements, the first supplement and optionally one or more further supplements, e.g. second supplement, are combined with the basal media to provide the one or more additional components to the basal media.

In some embodiments, the one or more additional components include at least one protein. In some embodiments, the at least one protein is not of non-mammalian origin. In some embodiments, the at least one protein is human or derived from human. In some embodiments, the at least one protein is recombinant. In some embodiments, the at least one protein includes albumin, transferrin, insulin, fibronectin, aprotinin or fetuin. In some embodiments, the protein comprises one or more of albumin, insulin or transferrin, optionally one or more of a human or recombinant albumin, insulin or transferrin.

In some embodiments, the protein is an albumin or albumin substitute. In some embodiments, the albumin is a human derived albumin. In some embodiments, the albumin is a recombinant albumin. In some embodiments, the albumin is a natural human serum albumin. In some embodiments, the albumin is a recombinant human serum albumin. In some embodiments, the albumin is a recombinant albumin from a non-human source. Albumin substitutes may be any protein or polypeptide source. Examples of such protein or polypeptide samples include but are not limited to bovine pituitary extract, plant hydrolysate (e.g., rice hydrolysate), fetal calf albumin (fetuin), egg albumin, human serum albumin (HSA), or another animal-derived albumins, chick extract, bovine embryo extract, AlbuMAX® I, and AlbuMAX® II.

In some embodiments, the one or more additional components include an albumin. In some embodiments, the albumin is human albumin or derived from human albumin. In some embodiments, the albumin is derived from human serum or human plasma. In some embodiments, the albumin is a recombinant albumin. In some embodiments, the recombinant albumin is derived from human. In some embodiments, the recombinant albumin is not derived from human. In some embodiments, the supplement comprises a natural albumin. In some embodiments, the natural albumin is derived from human. In some embodiments, the natural albumin is not derived from human. In some embodiments, the concentration of the albumin in the supplement is such that after the supplement is combined with a basal medium (such as these described herein), at or about the concentration of the albumin in the media is at or about 0 mg/mL to at or about 2 mg/mL, at or about 0 mg/mL to at or about 4 mg/mL, at or about 0 mg/mL to at or about 6 mg/mL, at or about 0 mg/mL to at or about 8 mg/mL, at or about 0 mg/mL to at or about 10 mg/mL, at or about 0 mg/mL to at or about 12 mg/mL, at or about 2 mg/mL to at or about 4 mg/mL, at or about 2 mg/mL to at or about 6 mg/mL, at or about 2 mg/mL to at or about 8 mg/mL, at or about 2 mg/mL to at or about 10 mg/mL, at or about 2 mg/mL to at or about 12 mg/mL, at or about 4 mg/mL to at or about 6 mg/mL, at or about 4 mg/mL to at or about 8 mg/mL, at or about 4 mg/mL to at or about 10 mg/mL, at or about 4 mg/mL to at or about 12 mg/mL, at or about 6 mg/mL to at or about 8 mg/mL, at or about 6 mg/mL to at or about 10 mg/mL, at or about 6 mg/mL to at or about 12 mg/mL, at or about 8 mg/mL to at or about 10 mg/mL, at or about 8 mg/mL to at or about 12 mg/mL, at or about 10 mg/mL to at or about 12 mg/mL, or at or about 10 mg/mL to at or about 15 mg/mL each inclusive. In some embodiments, the albumin in the media is at or about 5 mg/mL.

In some embodiments, the one or more additional components include a transferrin or transferrin substitute. In some embodiments, a transferrin substitute is a compound which may replace transferrin in the supplement to give substantially similar results as transferrin. Examples of transferrin substitutes include but are not limited to any iron chelate compound. Iron chelate compounds which may be used include but are not limited to iron chelates of ethylenediaminetetraacetic acid (EDTA), ethylene glycol-bis(β-aminoethyl ether)-N,N,N',N'-tetraacetic acid (EGTA), deferoxamine mesylate, dimercaptopropanol, diethylenetriamine-pentaacetic acid (DPT A), and trans-1, 2-diaminocyclohexane-N,N,N',N'-tetraacetic acid (CDTA), as well as a ferric citrate chelate and a ferrous sulfate chelate. In some embodiments, the transferrin is iron saturated transferrin. In some embodiments, the transferrin is iron saturated human transferrin.

In some embodiments, the transferrin or transferrin substitute is human transferrin or is derived from human transferrin. In some embodiments, the transferrin or transferrin substitute is derived from human serum or plasma. In some embodiments, the transferrin or transferrin substitute is recombinant transferrin. In some embodiments, the concentration of the transferrin is such that after the supplement is combined with a basal medium (such as these described herein), the concentration of the transferrin in the media is at or about 10 mg/L to at or about 50 mg/L, at or about 10 mg/L to at or about 100 mg/L, at or about 10 mg/L to at or about 150 mg/L, at or about 10 mg/L to at or about 200 mg/L, at or about 10 mg/L to at or about 250 mg/L, at or about 10 mg/L to at or about 300 mg/L, at or about 10 mg/L to at or about 350 mg/L, at or about 10 mg/L to at or about 400 mg/L, at or about 10 mg/L to at or about 450 mg/L, at or about 10 mg/L to at or about 500 mg/L, at or about 10 mg/L to at or about 550 mg/L, at or about 10 mg/L to at or about 600 mg/L, at or about 10 mg/L to at or about 650 mg/L, at or about 10 mg/L to at or about 750 mg/L. In some embodiments, the concentration of the transferrin is such that after the supplement is combined with a basal medium (such as these described herein), the concentration of the transferrin in the media is at or about 100 mg/L. In some embodiments, the concentration of the transferrin is such that after the supplement is combined with a basal medium (such as these described herein), the concentration of the transferrin in the media is at or about 50 mg/L to at or about 150 mg/L.

In some embodiments, the one or more additional components include insulin or insulin substitute. In some embodiments, an insulin substitute is a zinc containing compound which may be used in place of insulin to give substantially similar results as insulin. Examples of insulin substitutes include but are not limited to zinc chloride, zinc nitrate, zinc bromide, and zinc sulfate. A number of insulins are known to those of ordinary skill in the art. See Gilman, A. G. et al, Eds., The Pharmacological Basis of Therapeutics, Pergamon Press, New York, 1990, pp. 1463-1495. In some embodiments, insulin, rather than an insulin substitute, is used in the supplement and the medium. In some embodiments, the insulin is zinc insulin. In some embodiments, the insulin is human zinc insulin.

In some embodiments, the insulin is a human insulin or derived from human insulin. In some embodiments, the insulin is a recombinant insulin. In some embodiment, the insulin is a recombinant human insulin. In some embodiment, the concentration of the insulin (or insulin substitute) is such that after the supplement is combined with a basal medium (such as these described herein), at or about the concentration of the insulin (or insulin substitute) in the media is about 1 mg/L to at or about 2.5 mg/L, at or about 1 mg/L to at or about 5 mg/L, at or about 1 mg/L to at or about 7.5 mg/L, at or about 1 mg/L to at or about 10 mg/L, at or about 1 mg/L to at or about 12.5 mg/L, at or about 1 mg/L to at or about 15 mg/L, at or about 1 mg/L to at or about 17.5 mg/L, at or about 1 mg/L to at or about 20 mg/L, at or about 1 mg/L to at or about 22.5 mg/L, at or about 1 mg/L to at or about 25 mg/L, at or about 1 mg/L to at or about 27.5 mg/L, at or about 1 mg/L to at or about 30 mg/L. In some embodiments, the concentration of insulin or insulin substitute in the media is at or about 10 mg/L. In some embodiments, the concentration of insulin or insulin substitute in the media is at or about 7.5 mg/L to at or about 12.5 mg/L.

In some embodiments, the one or more additional components include a growth factor. In some embodiments, the growth factor comprises epidermal growth factor (EGF). In some embodiments, the growth factor comprises fibroblast growth factor (FGF). In some embodiments, the growth factor comprises insulin-like growth factor (IGF). In some embodiments, the growth factor comprises nerve growth factor (NGF). In some embodiments, the growth factor comprises platelet-derived growth factor (PDGF). In some embodiments, the growth factor comprises transforming growth factor (TGF).

In some embodiments, the one or more additional components include a hormone (e.g., growth hormone, insulin, hydrocortisone, triiodothyronine, estrogen, androgen, progesterone, prolactin, follicle-stimulating hormone, gastrin-releasing peptide). In some embodiment, the one or more additional components include alpha-globulin or beta-globulin. In some embodiment, the one or more additional components include a peptide or peptide fraction (e.g., protein hydrolysate derived from animal, microorganism or plant).

In some embodiments, the one or more additional components include a lipid. In some embodiments, the lipid comprises cholesterol. In some embodiments, the lipid comprises steroid. In some embodiments, the lipid comprises fatty acid (e.g., palmitate, stearate, oleate, linoleate). In some embodiments, the lipid comprises ethanolamine. In some embodiments, the lipid comprises choline. In some embodiments, the lipid comprises inositol.

In some embodiments, the one or more additional components comprises a transition metal. In some embodiments, the transition metal comprises iron. In some embodiments, the transition metal comprises zinc. In some embodiments, the transition metal comprises copper. In some embodiments, the transition metal comprises chromium. In some embodiments, the transition metal comprises iodine. In some embodiments, the transition metal comprises cobalt. In some embodiments, the transition metal comprises selenium. In some embodiments, the transition metal comprises magnesium. In some embodiments, the transition metal comprises molybdenum.

In some embodiments, the one or more additional components include a vitamin. In some embodiments, the vitamin comprises a fat-soluble vitamin (e.g., Vitamin A, Vitamin D, Vitamin E, Vitamin K). In some embodiments, the vitamin comprises a water-soluble vitamin (e.g., B1, B2, B6, B12, C, folate).

In some embodiments, the one or more additional components include a polyamine. In some embodiments, the polyamine comprises putrescine. In some embodiments the polyamine comprises spermidine. In some embodiments, the polyamine comprises spermine.

In some embodiments, the one or more additional components include a reductant. In some embodiments, the reductant comprises a 2-mercaptoethanol. In some embodiments, the reductant includes an alpha-thioglycerol. In some embodiments, the reductant comprises reduced glutathione.

In some embodiments, the one or more additional components include a protective additive. In some embodiments, the protective additive comprises carboxymethyl cellulose. In some embodiments, the protective additive comprises polyvinyl pyrrolidone. In some embodiments, the protective additive comprises pluronic F-68. In some embodiments, the protective additive comprises Tween 80.

In some embodiments, the one or more additional components include an adhesion factor. In some embodiments the adhesion factor comprises fibronectin. In some embodiments, the adhesion factor comprises laminin.

In some embodiments, the one or more additional components is one or more of one or more antioxidants, one or more albumins or albumin substitutes, one or more lipid agents, one or more insulins or insulin substitutes, one or more transferrins or transferrin substitutes, one or more trace elements, and one or more glucocorticoids. In some embodiments, the antioxidants include N-acetyl-L-cysteine, 2-mercaptoethanol, or D,L-tocopherol acetate, or derivatives or mixtures thereof. In some embodiments, the albumin is human serum albumin. In some embodiments, the lipid agents include Human Ex-Cite® or ethanolamine or derivatives and mixtures thereof. In some embodiments, the insulin is human zinc insulin. In some embodiments, transferrin is human iron-saturated transferrin. In some embodiments, the trace element is Se4+. In some embodiments, glucocorticoid is hydrocortisone. In some embodiments, the supplement is concentrated.

In some embodiments, the one or more additional components comprises one or more antioxidants, and one or more ingredients selected from the group consisting of one or more albumins or albumin substitutes, one or more lipid agents, one or more insulins or insulin substitutes, one or more transferrins or transferrin substitutes, one or more trace elements, and one or more glucocorticoids.

In some embodiments, the one or more additional components comprises one or more of N-acetyl-L cysteine, human serum albumin, Human Ex-Cyte®, ethanolamine, human zinc insulin, human iron saturated transferrin, Se4+, hydrocortisone, D,L-tocopherol acetate, and/or 2-mercaptoethanol.

In some embodiments, the one or more additional components include N-acetyl-L-cysteine (NAC). In some embodiments, the concentration of NAC is such that after the supplement is combined with a basal medium (such as these described herein), the concentration of NAC of in the basal medium is at or about 10 mg/L to at or about 50 mg/L, at or about 10 mg/L to at or about 100 mg/L, at or about 10 mg/L to at or about 150 mg/L, at or about 10 mg/L to at or about 200 mg/L, at or about 10 mg/L to at or about 250 mg/L, at or about 10 mg/L to at or about 300 mg/L, at or about 10 mg/L to at or about 350 mg/L, at or about 10 mg/L to at or about 400 mg/L, at or about 10 mg/L to at or about 450 mg/L, at or about 10 mg/L to at or about 500 mg/L, at or about 10 mg/L to at or about 550 mg/L, at or about 10 mg/L to at or about 600 mg/L, at or about 10 mg/L to at or about 650 mg/L, at or about 10 mg/L to at or about 700 mg/L.

In some embodiments, the concentration of NAC in the basal medium is at or about 0 mM to at or about 1 mM, at or about 0 mM to at or about 2 mM, at or about 0 mM to at or about 3 mM, at or about 0 mM to at or about 4 mM, at or about 0 mM to at or about 5 mM, at or about 0 mM to at or about 6 mM, at or about 0 mM to at or about 7 mM, at or about 0 mM to at or about 8 mM, at or about 0 mM to at or about 9 mM, at or about 0 mM to at or about 10 mM, at or about 0 mM to at or about 12 mM, at or about 0 mM to at or about 14 mM, at or about 0 mM to at or about 16 mM, at or about 0 mM to at or about 18 mM, at or about 0 mM to at or about 20 mM.

In some embodiments, the one or more additional components include ethanolamine. In some embodiments, the concentration of ethanolamine is such that after the supplement is combined with a basal medium (such as these described herein), the concentration of ethanolamine in the basal medium is at or about 0 mg/L to at or about 2 mg/L, at or about 0 mg/L to at or about 4 mg/L, at or about 0 mg/L to at or about 6 mg/L, at or about 0 mg/L to at or about 8 mg/L, at or about 0 mg/L to at or about 10 mg/L, at or about 0 mg/L to at or about 12 mg/L, at or about 0 mg/L to at or about 14 mg/L, at or about 0 mg/L to at or about 16 mg/L, at or about 0 mg/L to at or about 18 mg/L, at or about 0 mg/L to at or about 20 mg/L, at or about 0 mg/L to at or about 22 mg/L, at or about 0 mg/L to at or about 24 mg/L, at or about 0 mg/L to at or about 26 mg/L, at or about 0 mg/L to at or about 28 mg/L, at or about 0 mg/L to at or about 30 mg/L.

In some embodiments, the one or more additional components can be provided by adding one or more supplements, such as a first supplement and one or more further or additional supplement to the basal medium.

In some embodiments, the first supplement is prepared by adding or mixing L-glutamine with existing supplements containing one or more desired components. In some embodiments, L-glutamine is added or mixed with a serum replacement supplement, for example, an immune cell serum replacement, e.g., ThermoFisher, #A2598101 or the CTS™ Immune Cell Serum Replacement. In some embodiments, the L-glutamine is added to or mixed with a supplement that includes an immune cell serum replacement described in Smith et al. *Clin Transl Immunology.* 2015 January; 4(1): e31.

In some embodiments, the serum-free medium formulation comprises at or about 90% to 98.75% (v/v) of the basal medium and at or about 1.25% to 10% (v/v) of the first supplement. In some embodiments, the serum-free medium formulation comprises at or about 90% to 97.5% (v/v) of the basal medium and at or about 1.25% to 5% (v/v) of the first supplement. In some embodiments, the serum-free medium formulation comprises at or about 95% (v/v) of the basal medium and at or about 2.5%±0.2% (v/v) of the first supplement, such as at or about 2.5% (v/v). In some embodiments, a liter of the basal medium is supplemented with at or about 25 milliliter of the first supplement.

In some embodiments, a further supplement, e.g. second supplement, is combined with the basal media to provide the one or more additional components. In some embodiments, the second supplement comprises one or more additional components, such as any described above, including one or more antioxidants, one or more albumins or albumin substitutes, one or more lipid agents, one or more insulins or insulin substitutes, one or more transferrins or transferrin substitutes, one or more trace elements, and one or more glucocorticoids. Exemplary components of a second supplement are described above. In some embodiments, the second supplement comprises an albumin, N-acetylcysteine (NAC) and ethanolamine. In some embodiments, the second supplement comprises an albumin, N-acetylcysteine (NAC) and ethanolamine, wherein the concentration of albumin, NAC and/or ethanolamine is such that after the second supplement is combined with a basal medium (such as these described herein), the concentration of albumin, NAC and/or ethanolamine is substantially the same as described herein. In some embodiments, the albumin is a human derived albumin. In some embodiments, the albumin is a human derived albumin from human plasma or serum. In some embodiments, the second supplement is a liquid and does not include, or does not include a significant amount of a free form of glutamine (i.e., L-glutamine). In some embodiments, the second supplement comprises OpTmizer® supplement (Thermofisher, part of A1048503).

In some embodiments, the second supplement is liquid. In some embodiments, the second supplement is not frozen, or not recommended to be frozen for the storage. In some embodiments, the serum-free medium formulation comprises about 1.25% to 5% (v/v) of the second supplement, such as or about 2.5%±0.2%, such as or about 2.5% or 2.6%. In some embodiments, a liter of the basal medium is supplemented with about 26 milliliter of the second supplement. In some embodiments, the serum-free medium formulation comprises at or about 90% to 97.5% (v/v) of the basal medium and at or about 1.25% to 5% (v/v) of the second supplement. In some embodiments, the serum-free medium formulation comprises at or about 95% (v/v) of the basal medium and at or about 2.5%±0.2% (v/v) of the second supplement, such as at or about 2.5% (v/v) or 2.6% (v/v). In some embodiments, a liter of the basal medium is supplemented with at or about 25 milliliter or 26 milliliters of the second supplement.

In some embodiments, both the first supplement (e.g. serum replacement supplement, e.g. CTS™ Immune Cell Serum Replacement) and a further supplement (e.g. OpTmizer® Cell Supplement) are added to the basal medium. In some embodiments, the serum-free medium formulation comprises about 90% to 97.5% (v/v) of the basal medium, about 1.25% to 5% (v/v) of the first supplement, and about 1.25% to 5% (v/v) of the second supplement. In some embodiments, the serum-free medium formulation comprises about 95% (v/v) of the basal medium, about 2.5%±0.2% (v/v) of the first supplement, and about 2.5%±0.2% (v/v) of the second supplement.

In some embodiments, the one or more supplement is concentrated at or about 2 to at or about 100 fold. In some embodiments, the supplement is at or about a 40× formulation. In some embodiments, a liter of the basal medium is supplemented with at or about 20 to 30 milliliters, such as 25±2 milliliter, of at least one supplement, including the first supplement and, in some cases, one or more further supplement.

C. Serum-Free Media

In some embodiments, the serum-free media comprises a basal medium and a synthetic amino acid (e.g., a dipeptide form of L-glutamine, e.g., L-alanyl-L-glutamine) a free form of glutamine (i.e., L-glutamine). In some embodiments, the serum-free media comprises a basal medium and a synthetic amino acid (e.g., a dipeptide form of L-glutamine, e.g., L-alanyl-L-glutamine) a free form of glutamine (i.e., L-glutamine). In some embodiments, the serum-free media further comprises at least one protein or additional component such as to support maintenance of T cell during the proved process for generating engineered T cells.

In some embodiments, the serum-free media is a form that contains a synthetic amino acid (e.g., a dipeptide form of L-glutamine, e.g., L-alanyl-L-glutamine) that is capable of being converted into a free form of glutamine (i.e., L-glutamine) in a cell culture comprising a cell, wherein the media is serum-free. In some embodiments, the synthetic amino acid is soluble in an aqueous solution (e.g., a serum-free media). In some embodiments, the solubility of the synthetic amino acid in the aqueous solution is higher than a free form of glutamine (i.e., L-glutamine). In some embodiments, the concentration of the dipeptide form of L-glutamine (e.g., L-alanyl-L-glutamine) in the serum-free media is at or about 0.5 mM-5 mM. In some embodiments, the concentration of the dipeptide form of L-glutamine (e.g., L-alanyl-L-glutamine) in the serum-free media is at or about 2 mM. In some embodiments, the concentration of the dipeptide form of L-glutamine (e.g., L-alanyl-L-glutamine) is at or about 0.5 mM-1 mM, 0.5 mM-1.5 mM, 0.5 mM-2 mM, 0.5 mM-2.5 mM, 0.5 mM-3 mM, 0.5 mM-3.5 mM, 0.5 mM-4 mM, 0.5 mM-4.5 mM, or 0.5 mM-5 mM, each inclusive. In some embodiments, the concentration of dipeptide form of L-glutamine (e.g., L-alanyl-L-glutamine) in the serum-free media is at least at or about 0.5 mM, 1 mM, 1.5 mM, 2 mM, 2.5 mM, 3 mM, 3.5 mM, 4 mM, 4.5 mM, or 5 mM. In some embodiments, the concentration of the dipeptide form of L-glutamine, such as L-alanyl-L-glutamine, in the serum-free media is at or about 2 mM, and the concentration of the free form of L-glutamine in the serum-free media is at or about 2 mM.

In some embodiments, the concentration of the free form of glutamine (i.e., L-glutamine) in the serum-free media is about 0.5 mM-5 mM. In some embodiments, the concentration of the free form of glutamine (i.e., L-glutamine) in the serum-free media is at or about 2 mM. In some embodiments, the concentration of the free form of glutamine (i.e., L-glutamine) in the serum-free media is at or about 0.5 mM-1 mM, 0.5 mM-1.5 mM, 0.5 mM-2 mM, 0.5 mM-2.5 mM, 0.5 mM-3 mM, 0.5 mM-3.5 mM, 0.5 mM-4 mM, 0.5 mM-4.5 mM, or 0.5 mM-5 mM, each inclusive. In some embodiments, the concentration of the free form of glutamine (i.e., L-glutamine) in the media is at least at or about 0.5 mM, 1 mM, 1.5 mM, 2 mM, 2.5 mM, 3 mM, 3.5 mM, 4 mM, 4.5 mM, or 5 mM.

In some embodiments, the serum-free media comprises at least one protein. In some embodiments, the at least one protein is not of non-mammalian origin. In some embodiments, the at least one protein is human or derived from human. In some embodiments, the at least one protein is recombinant. In some embodiments, the one or more additional components include at least one protein. In some embodiments, the at least one protein is not of non-mammalian origin. In some embodiments, the at least one protein is human or derived from human. In some embodiments, the at least one protein is recombinant. In some embodiments, the at least one protein includes albumin, transferrin, insulin, fibronectin, aprotinin or fetuin. In some embodiments, the protein comprises one or more of albumin, insulin or transferrin, optionally one or more of a human or recombinant albumin, insulin or transferrin.

In some embodiments, the serum-free media comprises an albumin. In some embodiments, the albumin is derived from human. In some embodiments, the albumin is derived from human serum or human plasma. In some embodiments, the albumin is a recombinant albumin. In some embodiments, the recombinant albumin is derived from human. In some embodiment, the recombinant albumin is not derived from human. In some embodiments, the supplement comprises a natural albumin. In some embodiments, the natural albumin is derived from human. In some embodiments, the natural albumin is not derived from human. In some embodiments, the concentration of the albumin in the serum-free media is at or about 0 mg/mL to at or about 2 mg/mL, at or about 0 mg/mL to at or about 4 mg/mL, at or about 0 mg/mL to at or about 6 mg/mL, at or about 0 mg/mL to at or about 8 mg/mL, at or about 0 mg/mL to at or about 10 mg/mL, at or about 0 mg/mL to at or about 12 mg/mL, at or about 2 mg/mL to at or about 4 mg/mL, at or about 2 mg/mL to at or about 6 mg/mL, at or about 2 mg/mL to at or about 8 mg/mL, at or about 2 mg/mL to at or about 10 mg/mL, at or about 2 mg/mL to at or about 12 mg/mL, at or about 4 mg/mL to at or about 6 mg/mL, at or about 4 mg/mL to at or about 8 mg/mL, at or about 4 mg/mL to at or about 10 mg/mL, at or about 4 mg/mL to at or about 12 mg/mL, at or about 6 mg/mL to at or about 8 mg/mL, at or about 6 mg/mL to at or about 10 mg/mL, at or about 6 mg/mL to at or about 12 mg/mL, at or about 8 mg/mL to at or about 10 mg/mL, at or about 8 mg/mL to at or about 12 mg/mL, at or about 10 mg/mL to at or about 12 mg/mL, or at or about 10 mg/mL to at or about 15 mg/mL each inclusive. In some embodiments, the albumin in the media is at or about 5 mg/mL.

In some embodiments, the serum-free media comprises a transferrin or transferrin substitute (such as these described herein). In some embodiments, the transferrin or transferrin substitute is derived from human. In some embodiments, the transferrin or transferrin substitute is derived from human serum or plasma. In some embodiments, the concentration of the transferrin in the serum-free media is at or about 10 mg/L to at or about 50 mg/L, at or about 10 mg/L to at or about 100 mg/L, at or about 10 mg/L to at or about 150 mg/L, at or about 10 mg/L to at or about 200 mg/L, at or about 10 mg/L to at or about 250 mg/L, at or about 10 mg/L to at or about 300 mg/L, at or about 10 mg/L to at or about 350 mg/L, at or about 10 mg/L to at or about 400 mg/L, at or about 10 mg/L to at or about 450 mg/L, at or about 10 mg/L to at or about 500 mg/L, at or about 10 mg/L to at or about 550 mg/L, at or about 10 mg/L to at or about 600 mg/L, at or about 10 mg/L to at or about 650 mg/L, or at or about 10 mg/L to at or about 750 mg/L. In some embodiments, the concentration of the transferrin in the serum-free media is at or about 100 mg/L. In some embodiments, the concentration of the transferrin in the serum-free media is at or about 50 mg/L to 150 mg/L.

In some embodiments, the supplement comprises insulin or insulin substitute (such as these described herein). In some embodiments, the insulin is derived from human. In some embodiments, the insulin is a recombinant insulin. In some embodiment, the insulin is a recombinant human insulin. In some embodiment, the concentration of the insulin (or insulin substitute) in the serum-free media is at or about 1 mg/L to at or about 2.5 mg/L, at or about 1 mg/L to at or about 5 mg/L, at or about 1 mg/L to at or about 7.5 mg/L, at or about 1 mg/L to at or about 10 mg/L, at or about 1 mg/L to at or about 12.5 mg/L, at or about 1 mg/L to at or about 15 mg/L, at or about 1 mg/L to at or about 17.5 mg/L, at or about 1 mg/L to at or about 20 mg/L, at or about 1 mg/L to at or about 22.5 mg/L, at or about 1 mg/L to at or about 25 mg/L, at or about 1 mg/L to at or about 27.5 mg/L, or at or about 1 mg/L to at or about 30 mg/L. In some embodiments, the concentration of insulin or insulin substitute in the serum-free media is at or about 10 mg/L. In some embodiments, the concentration of insulin or insulin substitute in the serum-free media is at or about 7.5 mg/L to at or about 12.5 mg/L.

In some embodiments, the serum-free media does not comprise phenol red. In some embodiments, the serum-free media comprises phenol red.

In some embodiments, the serum-free media comprises a nutrient mixture of inorganic salts, sugars, amino acids, optionally also containing vitamins, organic acids, antioxidants, lipids, growth factors, N-acetylcysteine, ethanolamine and/or buffers. Examples include those described herein, such as in the section above, including inorganic salts, sugars, amino acids, vitamins, organic acids, antioxidants, lipids, growth factors, N-acetylcysteine, ethanolamine and/or buffers.

In some embodiments, the serum free media comprises one or more ingredients selected from one or more of one or more antioxidants, one or more albumins or albumin substitutes, one or more lipid agents, one or more insulins or insulin substitutes, one or more transferrins or transferrin substitutes, one or more trace elements, one or more glucocorticoids, one or more inorganic salts, one or more energy sources, one or more buffering agents, one or more pyruvate salts, one or more pH indicators, one or more amino acids, and one or more vitamins. In some embodiments, the antioxidants are selecting from the group consisting of N-acetyl-L-cysteine, 2-mercaptoethanol, and D,L-tocopherol acetate, or derivatives or mixtures thereof. In some embodiments, the albumin is human serum albumin. In some embodiments, the lipid agents are Human Ex-Cyte® and ethanolamine. In some embodiments, the insulin is human zinc insulin. In some embodiments, the transferrin is human iron-saturated transferrin. In some embodiments, the glucocorticoid is hydrocortisone. In some embodiments, inorganic salt ingredient comprises one or more inorganic salts selected from the group consisting of one or more calcium salts, one or more potassium salts, one or more magnesium salts, one or more sodium salts, one or more carbonate salts, and one or more phosphate salts. In some embodiments, the energy source is D-glucose. In some embodiments, the buffering agent is HEPES. In some embodiments, the pyruvate salt is sodium pyruvate. In some embodiments, the pH indicator is phenol red. In some embodiments, amino acid ingredient comprises one or more amino acids selected from the group consisting of glycine, L-alanine, L-asparagine, L-cysteine, L-aspartic acid, L-glutamic acid, L-phenylalanine, L-histidine, L-isoleucine, L-lysine, L-leucine, L-glutamine, L-arginine HCL, L-methionine, L-proline, L-hydroxyproline, L-serine, L-threonine, L-tryptophan, L-tyrosine, and L-valine, and salts and derivatives thereof. In some embodiments, the vitamin ingredient comprises one or more vitamins selected from the group consisting of biotin, D-calcium pantothenate, choline chloride, folic acid, i-inositol, niacinamide, pyridoxal HCl, riboflavin, thiamine HCl, and vitamin B12 and derivatives thereof. In some embodiments, ingredients comprise N-acetyl-L-cysteine, 2-mercaptoethanol, human serum albumin, D,L-tocopherol acetate, Human Ex-Cyte®, ethanolamine, human zinc insulin, iron-saturated transferrin, Se4+, hydrocortisone, Ca2+, K+, Mg2+, Na+, CO32-, PO43-, D-glucose, HEPES, sodium pyruvate, phenol red, glycine, L-alanine, L-asparagine, L-cysteine, L-aspartic acid, L-glutamic acid, L-phenylalanine, L-histidine, L-isoleucine, L-lysine, L-leucine, L-glutamine, L-arginine HCL, L-methionine, L-proline, L-hydroxyproline, L-serine, L-threonine, L-tryptophan, L-tyrosine, and L-valine, biotin, D-calcium pantothenate, choline chloride, folic acid, i-inositol, niacinamide, pyridoxal HCl, riboflavin, thiamine HCl, and vitamin B12.

In some embodiments, there is provided a serum-free media comprising a basal medium and at least one supplement. Various examples of basal medium and supplements are described herein, such as in the section above.

In some embodiments, the serum-free medium formulation comprises at or about 90% to at or about 97.5% (v/v) of the basal medium, at or about 2.5% to at or about 10% (v/v) of a supplement, e.g. a first supplement and/or a second supplement. In some embodiments, the serum-free medium formulation comprises at or about 90% to at or about 97.5% (v/v) of the basal medium, at or about 1.25% to at or about 5% (v/v) of a first supplement, and at or about 1.25% to at or about 5% (v/v) of a second supplement.

In some embodiments, the serum-free medium comprises a basal medium, such as the OpTmizer™ T-Cell Expansion Basal Medium (ThermoFisher), supplemented with one or more supplement. In some embodiments, the one or more supplement is serum-free. In some embodiments, the serum-free medium comprises a basal medium supplemented with a supplement for the maintenance of a cell (e.g., a T cell), such as the OpTmizer™ T-Cell Expansion Supplement (ThermoFisher). In some embodiments, the serum-free medium further comprises a free form of an amino acid such as L-glutamine. In some embodiments, the serum free media does not contain a recombinant cytokine, such as one or more of recombinant human IL-2, recombinant human IL-7, and/or recombinant human IL-15. In particular embodiments, the serum-free media can be used in any one or more steps of the process described herein, such as one or more steps described in Section I. In some embodiments, such as serum-free medium is used during the incubation and/or harvesting, collecting or formulation of cells.

In some embodiments, the serum-free medium comprises a basal medium supplemented with a T cell supplement and a free form of L-glutamine. In some embodiments, the serum-free medium comprises the OpTmizer™ T-Cell Expansion Basal Medium supplemented with the OpTmizer™ T-Cell Expansion Supplement and L-glutamine. In some embodiments, the serum-free medium comprises the OpTmizer™ T-Cell Expansion Basal Medium supplemented with about 2.6% OpTmizer™ T-Cell Expansion Supplement, and about 1.0% L-glutamine (about 2 mM in final concentration). In some embodiments, such a serum-free media does not contain a recombinant cytokine, such as one or more of recombinant human IL-2, recombinant human IL-7, and/or recombinant human IL-15. In particular embodiments, the serum-free media can be used in any one or more steps of the process described herein, such as one or more steps described in Section I. In some embodiments, such as serum-free medium is used during the incubation and/or harvesting, collecting or formulation of cells.

In some embodiments, the serum-free medium comprises a basal medium supplemented with a supplement for the maintenance of a cell (e.g., a T cell), such as the OpTmizer™ T-Cell Expansion Supplement (ThermoFisher). and further comprises a serum replacement supplement, for example, an immune cell serum replacement, e.g., ThermoFisher, #A2596101, the CTS™ Immune Cell Serum Replacement, or the immune cell serum replacement described in Smith et al. Clin Transl Immunology. 2015 January; 4(1): e31. In some embodiments, the serum-free medium further comprises a free form of an amino acid such as L-glutamine. In some embodiments, the serum-free medium further comprises a dipeptide form of L-glutamine (e.g., L-alanyl-L-glutamine), such as the dipeptide in Glutamax™ (ThermoFisher). In some embodiments, the serum-free media comprises one or more cytokine. In certain embodiments, the one or more cytokines are recombinant cytokines. In certain embodiments, the one or more cytokines bind to and/or are capable of binding to receptors that are expressed by and/or are endogenous to T cells. In particular embodiments, the one or more cytokines is or includes a member of the 4-alpha-helix bundle family of cytokines. In some embodiments, members of the 4-alpha-helix bundle family of cytokines include, but are not limited to, interleukin-2 (IL-2), interleukin-4 (IL-4), interleukin-7 (IL-7), interleukin-9 (IL-9), interleukin 12 (IL-12), interleukin 15 (IL-15), granulocyte colony-stimulating factor (G-CSF), and granulocyte-macrophage colony-stimulating factor (GM-CSF). In some embodiments, the serum-free medium further comprises one or more of recombinant human IL-2, recombinant human IL-7, and/or recombinant human IL-15. In particular embodiments, the serum-free media can be used in any one or more steps of the process described herein, such as one or more steps described in Section I. In particular embodiments, the serum-free media can be used in any one or more steps involving sample preparation, selection, stimulation and/or engineering.

In some embodiments, the serum-free medium comprises a basal medium supplemented with a T cell supplement, an immune cell serum replacement, a free form of L-glutamine, a dipeptide form of L-glutamine, a recombinant IL-2, a recombinant IL-7, and/or a recombinant IL-15. In some embodiments, the serum-free medium comprises the OpTmizer™ T-Cell Expansion Basal Medium supplemented with the OpTmizer™ T-Cell Expansion Supplement, the CTS™ Immune Cell Serum Replacement, L-glutamine, L-alanyl-L-glutamine, a recombinant human IL-2, a recombinant human IL-7, and a recombinant human IL-15. In some embodiments, the serum-free medium comprises the OpTmizer™ T-Cell Expansion Basal Medium supplemented with about 2.6% OpTmizer™ T-Cell Expansion Supplement, about 2.5% CTS™ Immune Cell Serum Replacement, about 1.0% L-glutamine (about 2 mM in final concentration), about 1.0% L-alanyl-L-glutamine (about 2 mM in final concentration), about 100 IU/mL recombinant human IL-2, about 600 IU/mL recombinant human IL-7, and about 100 IU/mL recombinant human IL-15. In particular embodiments, the serum-free media can be used in any one or more steps of the process described herein, such as one or more steps described in Section I. In particular embodiments, the serum-free media can be used in any one or more steps involving sample preparation, selection, stimulation and/or engineering.

In some embodiments, the serum-free media is a concentrated media formulation. In some embodiments, the serum-free media is not a concentrated media formulation. In some embodiments, the serum-free media is from at or about 2× to at or about 100× concentrated. In some embodiments, the serum-free media is at or about 10× formulation. In some embodiments, the serum-free media can be stored at or about 2° C. to 8° C.

IV. RECOMBINANT PROTEINS

In some embodiments, the cells that are treated, processed, engineered, and/or produced by the methods provided herein contain or express, or are engineered to contain or express, a recombinant protein, such as a recombinant receptor, e.g., a chimeric antigen receptor (CAR), or a T cell receptor (TCR). In certain embodiments, the methods provided herein produce and/or a capable of producing cells, or populations or compositions containing and/or enriched for cells, that are engineered to express or contain a recombinant protein. In various embodiments, provided are engineered, transformed, transduced, or transfected cells, such as immune cells, such as T cells, that express one or more recombinant proteins(s). In particular embodiments, at least one of the one or more recombinant proteins is a recombinant receptor, e.g., antigen receptors and receptors containing one or more component thereof.

A. Recombinant Receptors

In some embodiments, provided are engineered cells, such as immune cells, such as T cells, that express one or more recombinant receptor(s). Among the receptors are antigen receptors and receptors containing one or more component thereof. The recombinant receptors may include chimeric receptors, such as those containing ligand-binding domains or binding fragments thereof and intracellular signaling domains or regions, functional non-TCR antigen receptors, chimeric antigen receptors (CARs), T cell receptors (TCRs), such as recombinant or transgenic TCRs, chimeric autoantibody receptor (CAAR) and components of any of the foregoing. The recombinant receptor, such as a CAR, generally includes the extracellular antigen (or ligand) binding domain linked to one or more intracellular signaling components, in some aspects via linkers and/or transmembrane domain(s). In some embodiments, the engineered cells express two or more receptors that contain different components, domains or regions. In some aspects, two or more receptors allows spatial or temporal regulation or control of specificity, activity, antigen (or ligand) binding, function and/or expression of the recombinant receptors.

1. Chimeric Antigen Receptors (CARs)

In some embodiments of the provided methods, chimeric receptors, such as a chimeric antigen receptors, contain one or more domains that combine a ligand-binding domain (e.g. antibody or antibody fragment) that provides specificity for a desired antigen (e.g., tumor antigen) with intracellular signaling domains. In some embodiments, the intracellular signaling domain is an activating intracellular domain portion, such as a T cell activating domain, providing a primary activation signal. In some embodiments, the intracellular signaling domain contains or additionally contains a costimulatory signaling domain to facilitate effector functions. In some embodiments, chimeric receptors when genetically engineered into immune cells can modulate T cell activity, and, in some cases, can modulate T cell differentiation or homeostasis, thereby resulting in genetically engineered cells with improved longevity, survival and/or persistence in vivo, such as for use in adoptive cell therapy methods.

Exemplary antigen receptors, including CARs, and methods for engineering and introducing such receptors into cells, include those described, for example, in international patent application publication numbers WO200014257, WO2013126726, WO2012/129514, WO2014031687, WO2013/166321, WO2013/071154, WO2013/123061 U.S. patent application publication numbers US2002131960, US2013287748, US20130149337, U.S. Pat. Nos. 6,451,995, 7,446,190, 8,252,592, 8,339,645, 8,398,282, 7,446,179, 6,410,319, 7,070,995, 7,265,209, 7,354,762, 7,446,191, 8,324,353, and 8,479,118, and European patent application number EP2537416, and/or those described by Sadelain et al., Cancer Discov. 2013 April; 3(4): 388-398; Davila et al. (2013) PLoS ONE 8(4): e61338; Turtle et al., Curr. Opin. Immunol., 2012 October; 24(5): 633-39; Wu et al., Cancer, 2012 Mar. 18(2): 160-75. In some aspects, the antigen receptors include a CAR as described in U.S. Pat. No. 7,446,190, and those described in International Patent Application Publication No.: WO/2014055668 A1. Examples of the CARs include CARs as disclosed in any of the aforementioned publications, such as WO2014031687, U.S. Pat. Nos. 8,339,645, 7,446,179, US 2013/0149337, U.S. Pat. Nos. 7,446,190, 8,389,282, Kochenderfer et al., 2013, Nature Reviews Clinical Oncology, 10, 267-276 (2013); Wang et al. (2012) J. Immunother. 35(9): 689-701; and Brentjens et al., Sci Transl Med. 2013 5(177). See also WO2014031687, U.S. Pat. Nos. 8,339,645, 7,446,179, US 2013/0149337, U.S. Pat. Nos. 7,446,190, and 8,389,282.

The chimeric receptors, such as CARs, generally include an extracellular antigen binding domain, such as a portion of an antibody molecule, generally a variable heavy (VH) chain region and/or variable light (VL) chain region of the antibody, e.g., an scFv antibody fragment.

In some embodiments, the antigen targeted by the receptor is a polypeptide. In some embodiments, it is a carbohydrate or other molecule. In some embodiments, the antigen is selectively expressed or overexpressed on cells of the disease or condition, e.g., the tumor or pathogenic cells, as compared to normal or non-targeted cells or tissues. In other embodiments, the antigen is expressed on normal cells and/or is expressed on the engineered cells.

In some embodiments, the antigen is or includes αvβ6 integrin (avb6 integrin), B cell maturation antigen (BCMA), B7-H3, B7-H6, carbonic anhydrase 9 (CA9, also known as CAIX or G250), a cancer-testis antigen, cancer/testis antigen 1B (CTAG, also known as NY-ESO-1 and LAGE-2), carcinoembryonic antigen (CEA), a cyclin, cyclin A2, C-C Motif Chemokine Ligand 1 (CCL-1), CD19, CD20, CD22, CD23, CD24, CD30, CD33, CD38, CD44, CD44v6, CD44v7/8, CD123, CD133, CD138, CD171, chondroitin sulfate proteoglycan 4 (CSPG4), epidermal growth factor protein (EGFR), type III epidermal growth factor receptor mutation (EGFR vIII), epithelial glycoprotein 2 (EPG-2), epithelial glycoprotein 40 (EPG-40), ephrinB2, ephrin receptor A2 (EPHa2), estrogen receptor, Fc receptor like 5 (FCRL5; also known as Fc receptor homolog 5 or FCRH5), fetal acetylcholine receptor (fetal AchR), a folate binding protein (FBP), folate receptor alpha, ganglioside GD2, O-acetylated GD2 (OGD2), ganglioside GD3, glycoprotein 100 (gp100), glypican-3 (GPC3), G Protein Coupled Receptor 5D (GPRC5D), Her2/neu (receptor tyrosine kinase erb- B2), Her3 (erb-B3), Her4 (erb-B4), erbB dimers, Human high molecular weight-melanoma-associated antigen (HMW-MAA), hepatitis B surface antigen, Human leukocyte antigen A1 (HLA-A1), Human leukocyte antigen A2 (HLA-A2), IL-22 receptor alpha(IL-22Ra), IL-13 receptor alpha 2 (IL-13Ra2), kinase insert domain receptor (kdr), kappa light chain, L1 cell adhesion molecule (L1-CAM), CE7 epitope of L1-CAM, Leucine Rich Repeat Containing 8 Family Member A (LRRC8A), Lewis Y, Melanoma-associated antigen (MAGE)-A1, MAGE-A3, MAGE-A6, MAGE-A10, mesothelin (MSLN), c-Met, murine cytomegalovirus (CMV), mucin 1 (MUC1), MUC16, natural killer group 2 member D (NKG2D) ligands, melan A (MART-1), neural cell adhesion molecule (NCAM), oncofetal antigen, Preferentially expressed antigen of melanoma (PRAME), progesterone receptor, a prostate specific antigen, prostate stem cell antigen (PSCA), prostate specific membrane antigen (PSMA), Receptor Tyrosine Kinase Like Orphan Receptor 1 (ROR1), survivin, Trophoblast glycoprotein (TPBG also known as 5T4), tumor-associated glycoprotein 72 (TAG72), Tyrosinase related protein 1 (TRP1, also known as TYRP1 or gp75), Tyrosinase related protein 2 (TRP2, also known as dopachrome tautomerase, dopachrome delta-isomerase or DCT), vascular endothelial growth factor receptor (VEGFR), vascular endothelial growth factor receptor 2 (VEGFR2), Wilms Tumor 1 (WT-1), a pathogen-specific or pathogen-expressed antigen, or an antigen associated with a universal tag, and/or biotinylated molecules, and/or molecules expressed by HIV, HCV, HBV or other pathogens. Antigens targeted by the receptors in some embodiments include antigens associated with a B cell malignancy, such as any of a number of known B cell marker. In some embodiments, the antigen is or includes CD20, CD19, CD22, ROR1, CD45, CD21, CD5, CD33, Igkappa, Iglambda, CD79a, CD79b or CD30. In some embodiments, the antigen is or includes a pathogen-specific or pathogen-expressed antigen. In some embodiments, the antigen is a viral antigen (such as a viral antigen from HIV, HCV, HBV, etc.), bacterial antigens, and/or parasitic antigens.

In some embodiments, the antibody is an antigen-binding fragment, such as a scFv, that includes one or more linkers joining two antibody domains or regions, such as a heavy chain variable ($V_H$) region and a light chain variable ($V_L$) region. The linker typically is a peptide linker, e.g., a flexible and/or soluble peptide linker. Among the linkers are those rich in glycine and serine and/or in some cases threonine. In some embodiments, the linkers further include charged residues such as lysine and/or glutamate, which can improve solubility. In some embodiments, the linkers further include one or more proline. In some aspects, the linkers rich in glycine and serine (and/or threonine) include at least 80%, 85%, 90%, 91%, 92%, 93%, 94%, 95%, 96%, 97%, 98%, or 99% such amino acid(s). In some embodiments, they include at least at or about 50%, 55%, 60%, 70%, or 75%, glycine, serine, and/or threonine. In some embodiments, the linker is comprised substantially entirely of glycine, serine, and/or threonine. The linkers generally are between about 5 and about 50 amino acids in length, typically between at or about 10 and at or about 30, e.g., 10, 11, 12, 13, 14, 15, 16, 17, 18, 19, 20, 21, 22, 23, 24, 25, 26, 27, 28, 29, or 30, and in some examples between 10 and 25 amino acids in length. Exemplary linkers include linkers having various numbers of repeats of the sequence GGGGS (4GS; SEQ ID NO: 122) or GGGS (3GS; SEQ ID NO: 123), such as between 2, 3, 4, and 5 repeats of such a sequence. Exemplary linkers include those having or consisting of an sequence set forth in SEQ ID NO: 79 (GGGGSGGGGSGGGGS), SEQ ID NO: 62 (GSTSGSGKPGSGEGSTKG) or SEQ ID NO: 124 (SRGGGGSGGGGSGGGGSLEMA).

Antigens targeted by the receptors in some embodiments include antigens associated with a B cell malignancy, such as any of a number of known B cell marker. In some embodiments, the antigen targeted by the receptor is CD20, CD19, CD22, ROR1, CD45, CD21, CD5, CD33, Igkappa, Iglambda, CD79a, CD79b or CD30.

In some embodiments, the antigen or antigen binding domain is CD19. In some embodiments, the scFv contains a VH and a VL derived from an antibody or an antibody fragment specific to CD19. In some embodiments, the antibody or antibody fragment that binds CD19 is a mouse derived antibody such as FMC63 and SJ25C1. In some embodiments, the antibody or antibody fragment is a human antibody, e.g., as described in U.S. Patent Publication No. US 2016/0152723.

The term "antibody" herein is used in the broadest sense and includes polyclonal and monoclonal antibodies, including intact antibodies and functional (antigen-binding) antibody fragments, including fragment antigen binding (Fab) fragments, F(ab')2 fragments, Fab' fragments, Fv fragments, recombinant IgG (rIgG) fragments, heavy chain variable ($V_H$) regions capable of specifically binding the antigen, single chain antibody fragments, including single chain variable fragments (scFv), and single domain antibodies (e.g., sdAb, sdFv, nanobody) fragments. The term encompasses genetically engineered and/or otherwise modified forms of immunoglobulins, such as intrabodies, peptibodies, chimeric antibodies, fully human antibodies, humanized antibodies, and heteroconjugate antibodies, multispecific, e.g., bispecific or trispecific, antibodies, diabodies, triabodies, and tetrabodies, tandem di-scFv, tandem tri-scFv. Unless otherwise stated, the term "antibody" should be understood to encompass functional antibody fragments thereof also referred to herein as "antigen-binding fragments." The term also encompasses intact or full-length antibodies, including antibodies of any class or sub-class, including IgG and sub-classes thereof, IgM, IgE, IgA, and IgD.

The terms "complementarity determining region," and "CDR," synonymous with "hypervariable region" or "HVR," are known in the art to refer to non-contiguous sequences of amino acids within antibody variable regions, which confer antigen specificity and/or binding affinity. In general, there are three CDRs in each heavy chain variable region (CDR-H1, CDR-H2, CDR-H3) and three CDRs in each light chain variable region (CDR-L1, CDR-L2, CDR-L3). "Framework regions" and "FR" are known in the art to refer to the non-CDR portions of the variable regions of the heavy and light chains. In general, there are four FRs in each full-length heavy chain variable region (FR-H1, FR-H2, FR-H3, and FR-H4), and four FRs in each full-length light chain variable region (FR-L1, FR-L2, FR-L3, and FR-L4).

The precise amino acid sequence boundaries of a given CDR or FR can be readily determined using any of a number of well-known schemes, including those described by Kabat et al. (1991), "Sequences of Proteins of Immunological Interest," 5th Ed. Public Health Service, National Institutes of Health, Bethesda, MD ("Kabat" numbering scheme); Al-Lazikani et al., (1997) JMB 273, 927-948 ("Chothia" numbering scheme); MacCallum et al., J. Mol. Biol. 262: 732-745 (1996), "Antibody-antigen interactions: Contact analysis and binding site topography," J. Mol. Biol. 262, 732-745." ("Contact" numbering scheme); Lefranc M P et al., "IMGT unique numbering for immunoglobulin and T cell receptor variable domains and Ig superfamily V-like domains," Dev Comp Immunol, 2003 January; 27(1):55-77 ("IMGT" numbering scheme); Honegger A and Plückthun A, "Yet another numbering scheme for immunoglobulin variable domains: an automatic modeling and analysis tool," J Mol Biol, 2001 Jun. 8; 309(3):657-70, ("Aho" numbering scheme); and Martin et al., "Modeling antibody hypervariable loops: a combined algorithm," PNAS, 1989, 86(23): 9268-9272, ("AbM" numbering scheme).

The boundaries of a given CDR or FR may vary depending on the scheme used for identification. For example, the Kabat scheme is based on structural alignments, while the Chothia scheme is based on structural information. Numbering for both the Kabat and Chothia schemes is based upon the most common antibody region sequence lengths, with insertions accommodated by insertion letters, for example, "30a," and deletions appearing in some antibodies. The two schemes place certain insertions and deletions ("indels") at different positions, resulting in differential numbering. The Contact scheme is based on analysis of complex crystal structures and is similar in many respects to the Chothia numbering scheme. The AbM scheme is a compromise between Kabat and Chothia definitions based on that used by Oxford Molecular's AbM antibody modeling software.

Table 1, below, lists exemplary position boundaries of CDR-L1, CDR-L2, CDR-L3 and CDR-H1, CDR-H2, CDR-H3 as identified by Kabat, Chothia, AbM, and Contact schemes, respectively. For CDR-H1, residue numbering is listed using both the Kabat and Chothia numbering schemes. FRs are located between CDRs, for example, with FR-L1 located before CDR-L1, FR-L2 located between CDR-L1 and CDR-L2, FR-L3 located between CDR-L2 and CDR-L3 and so forth. It is noted that because the shown Kabat numbering scheme places insertions at H35A and H35B, the end of the Chothia CDR-H1 loop when numbered using the shown Kabat numbering convention varies between H32 and H34, depending on the length of the loop.

Thus, unless otherwise specified, a "CDR" or "complementary determining region," or individual specified CDRs (e.g., CDR-H1, CDR-H2, CDR-H3), of a given antibody or region thereof, such as a variable region thereof, should be understood to encompass a (or the specific) complementary determining region as defined by any of the aforementioned schemes, or other known schemes. For example, where it is stated that a particular CDR (e.g., a CDR-H3) contains the amino acid sequence of a corresponding CDR in a given $V_H$ or $V_L$ region amino acid sequence, it is understood that such a CDR has a sequence of the corresponding CDR (e.g., CDR-H3) within the variable region, as defined by any of the aforementioned schemes, or other known schemes. In some embodiments, specific CDR sequences are specified. Exemplary CDR sequences of provided antibodies are described using various numbering schemes, although it is understood that a provided antibody can include CDRs as described according to any of the other aforementioned numbering schemes or other numbering schemes known to a skilled artisan.

Likewise, unless otherwise specified, a FR or individual specified FR(s) (e.g., FR-H1, FR-H2, FR-H3, FR-H4), of a given antibody or region thereof, such as a variable region thereof, should be understood to encompass a (or the specific) framework region as defined by any of the known schemes. In some instances, the scheme for identification of a particular CDR, FR, or FRs or CDRs is specified, such as the CDR as defined by the Kabat, Chothia, AbM or Contact method, or other known schemes. In other cases, the particular amino acid sequence of a CDR or FR is given.

The term "variable region" or "variable domain" refers to the domain of an antibody heavy or light chain that is involved in binding the antibody to antigen. The variable regions of the heavy chain and light chain ($V_H$ and $V_L$, respectively) of a native antibody generally have similar structures, with each domain comprising four conserved framework regions (FRs) and three CDRs. (See, e.g., Kindt et al. Kuby Immunology, 6th ed., W.H. Freeman and Co., page 91 (2007). A single $V_H$ or $V_L$ domain may be sufficient to confer antigen-binding specificity. Furthermore, antibodies that bind a particular antigen may be isolated using a $V_H$ or $V_L$ domain from an antibody that binds the antigen to screen a library of complementary $V_L$ or $V_H$ domains, respectively. See, e.g., Portolano et al., J. Immunol. 150: 880-887 (1993); Clarkson et al., Nature 352:624-628 (1991).

Among the antibodies included in the provided CARs are antibody fragments. An "antibody fragment" or "antigen-binding fragment" refers to a molecule other than an intact antibody that comprises a portion of an intact antibody that binds the antigen to which the intact antibody binds. Examples of antibody fragments include but are not limited to Fv, Fab, Fab', Fab'-SH, F(ab')2; diabodies; linear antibodies; heavy chain variable ($V_H$) regions, single-chain antibody molecules such as scFvs and single-domain antibodies comprising only the $V_H$ region; and multispecific antibodies formed from antibody fragments. In some embodiments, the antigen-binding domain in the provided CARs is or comprises an antibody fragment comprising a variable heavy chain ($V_H$) and a variable light chain ($V_L$) region. In particular embodiments, the antibodies are single-chain antibody fragments comprising a heavy chain variable ($V_H$) region and/or a light chain variable ($V_L$) region, such as scFvs.

TABLE 1

Boundaries of CDRs according to various numbering schemes.

| CDR | Kabat | Chothia | AbM | Contact |
| --- | --- | --- | --- | --- |
| CDR-L1 | L24--L34 | L24--L34 | L24--L34 | L30--L36 |
| CDR-L2 | L50--L56 | L50--L56 | L50--L56 | L46--L55 |
| CDR-L3 | L89--L97 | L89--L97 | L89--L97 | L89--L96 |
| CDR-H1 (Kabat Numbering[1]) | H31--H35B | H26--H32 . . . 34 | H26--H35B | H30--H35B |
| CDR-H1 (Chothia Numbering[2]) | H31--H35 | H26--H32 | H26--H35 | H30--H35 |
| CDR-H2 | H50--H65 | H52--H56 | H50--H58 | H47--H58 |
| CDR-H3 | H95--H102 | H95--H102 | H95--H102 | H93--H101 |

[1]Kabat et al. (1991), "Sequences of Proteins of Immunological Interest," 5th Ed. Public Health Service, National Institutes of Health, Bethesda, MD
[2]Al-Lazikani et al., (1997) JMB 273, 927-948

In some embodiments, the scFv is derived from FMC63. FMC63 generally refers to a mouse monoclonal IgG1 antibody raised against Nalm-1 and -16 cells expressing CD19 of human origin (Ling, N. R., et al. (1987). Leucocyte typing III. 302). In some embodiments, the FMC63 antibody comprises CDRH1 and H2 set forth in SEQ ID NOS: 51 and 52, respectively, and CDRH3 set forth in SEQ ID NO: 53 or 54 and CDRL1 set forth in SEQ ID NO: 55 and CDR L2 set forth in SEQ ID NO: 55 or 57 and CDR L3 set forth in SEQ ID NO: 58 or 59. In some embodiments, the FMC63 antibody comprises the heavy chain variable region ($V_H$) comprising the amino acid sequence of SEQ ID NO: 60 and the light chain variable region ($V_L$) comprising the amino acid sequence of SEQ ID NO: 61.

In some embodiments, the scFv comprises a variable light chain containing the CDRL1 sequence of SEQ ID NO: 55, a CDRL2 sequence of SEQ ID NO: 56, and a CDRL3 sequence of SEQ ID NO: 58 and/or a variable heavy chain containing a CDRH1 sequence of SEQ ID NO: 51, a CDRH2 sequence of SEQ ID NO: 52, and a CDRH3 sequence of SEQ ID NO: 53. In some embodiments, the scFv comprises a variable heavy chain region set forth in SEQ ID NO:60 and a variable light chain region set forth in SEQ ID NO:61. In some embodiments, the variable heavy and variable light chains are connected by a linker. In some embodiments, the linker is set forth in SEQ ID NO: 62. In some embodiments, the scFv comprises, in order, a $V_H$, a linker, and a $V_L$. In some embodiments, the scFv comprises, in order, a $V_L$, a linker, and a $V_H$. In some embodiments, the scFv is encoded by a sequence of nucleotides set forth in SEQ ID NO: 63 or a sequence that exhibits at least 85%, 86%, 87%, 88%, 89%, 90%, 91%, 92%, 93%, 94%, 95%, 96%, 97%, 98%, or 99% sequence identity to SEQ ID NO: 63. In some embodiments, the scFv comprises the sequence of amino acids set forth in SEQ ID NO: 64 or a sequence that exhibits at least 85%, 86%, 87%, 88%, 89%, 90%, 91%, 92%, 93%, 94%, 95%, 96%, 97%, 98%, or 99% sequence identity to SEQ ID NO:64.

In some embodiments the scFv is derived from SJ25C1. SJ25C1 is a mouse monoclonal IgG1 antibody raised against Nalm-1 and -16 cells expressing CD19 of human origin (Ling, N. R., et al. (1987). Leucocyte typing III. 302). In some embodiments, the SJ25C1 antibody comprises CDRH1, H2 and H3 set forth in SEQ ID NOS: 65-67, respectively, and CDRL1, L2 and L3 sequences set forth in SEQ ID NOS:68-70, respectively. In some embodiments, the SJ25C1 antibody comprises the heavy chain variable region ($V_H$) comprising the amino acid sequence of SEQ ID NO: 71 and the light chain variable region ($V_L$) comprising the amino acid sequence of SEQ ID NO: 72.

In some embodiments, the scFv comprises a variable light chain containing the CDRL1 sequence of SEQ ID NO:73, a CDRL2 sequence of SEQ ID NO: 74, and a CDRL3 sequence of SEQ ID NO:75 and/or a variable heavy chain containing a CDRH1 sequence of SEQ ID NO:76, a CDRH2 sequence of SEQ ID NO:77, and a CDRH3 sequence of SEQ ID NO:78. In some embodiments, the scFv comprises a variable heavy chain region set forth in SEQ ID NO: 71 and a variable light chain region set forth in SEQ ID NO:72. In some embodiments, the variable heavy and variable light chain are connected by a linker. In some embodiments, the linker is set forth in SEQ ID NO:79. In some embodiments, the scFv comprises, in order, a $V_H$, a linker, and a $V_L$. In some embodiments, the scFv comprises, in order, a $V_L$, a linker, and a $V_H$. In some embodiments, the scFv comprises the sequence of amino acids set forth in SEQ ID NO:80 or a sequence that exhibits at least 85%, 86%, 87%, 88%, 89%, 90%, 91%, 92%, 93%, 94%, 95%, 96%, 97%, 98%, or 99% sequence identity to SEQ ID NO:80.

In some embodiments, the antibody or an antigen-binding fragment (e.g. scFv or $V_H$ domain) specifically recognizes an antigen, such as BCMA. In some embodiments, the antibody or antigen-binding fragment is derived from, or is a variant of, antibodies or antigen-binding fragment that specifically binds to BCMA.

In some embodiments, the CAR is an anti-BCMA CAR that is specific for BCMA, e.g. human BCMA. Chimeric antigen receptors containing anti-BCMA antibodies, including mouse anti-human BCMA antibodies and human anti-human antibodies, and cells expressing such chimeric receptors have been previously described. See Carpenter et al., Clin Cancer Res., 2013, 19(8):2048-2060, WO 2016/090320, WO2016090327, WO2010104949A2 and WO2017173256. In some embodiments, the antigen or antigen binding domain is BCMA. In some embodiments, the scFv contains a $V_H$ and a $V_L$ derived from an antibody or an antibody fragment specific to BCMA. In some embodiments, the antibody or antibody fragment that binds BCMA is or contains a $V_H$ and a $V_L$ from an antibody or antibody fragment set forth in International Patent Applications, Publication Number WO 2016/090327 and WO 2016/090320.

In some embodiments, the anti-BCMA CAR contains an antigen-binding domain, such as an scFv, containing a variable heavy ($V_H$) and/or a variable light ($V_L$) region derived from an antibody described in WO 2016/090320 or WO2016090327. In some embodiments, the antigen-binding domain, such as an scFv, contains a $V_H$ set forth in SEQ ID NO: 116 and a $V_L$ set forth in SEQ ID NO: 117. In some embodiments, the antigen-binding domain, such as an scFv, contains a $V_H$ set forth in SEQ ID NO: 118 and a $V_L$ set forth in SEQ ID NO: 119. In some embodiments, the antigen-binding domain, such as an scFv, contains a $V_H$ set forth in SEQ ID NO: 120 and a $V_L$ set forth in SEQ ID NO: 121. In some embodiments, the antigen-binding domain, such as an scFv, contains a $V_H$ set forth in SEQ ID NO: 113 and a $V_L$ set forth in SEQ ID NO: 114. In some embodiment the antigen-binding domain, such as an scFv, contains a $V_H$ set forth in SEQ ID NO: 125 and a $V_L$ set forth in SEQ ID NO: 126. In some embodiments, the antigen-binding domain, such as an scFv, contains a $V_H$ set forth in SEQ ID NO: 127 and a $V_L$ set forth in SEQ ID NO: 128. In some embodiments, the antigen-binding domain, such as an scFv, contains a $V_H$ set forth in SEQ ID NO: 129 and a $V_L$ set forth in SEQ ID NO: 130. In some embodiments, the $V_H$ or $V_L$ has a sequence of amino acids that exhibits at least 85%, 86%, 87%, 88%, 89%, 90%, 91%, 92%, 93%, 94%, 95%, 96%, 97%, 98%, 99% or more sequence identity to any of the foregoing $V_H$ or $V_L$ sequences, and retains binding to BCMA. In some embodiments, the $V_H$ region is amino-terminal to the $V_L$ region. In some embodiments, the $V_H$ region is carboxy-terminal to the $V_L$ region.

In some embodiments, the antigen or antigen binding domain is GPRC5D. In some embodiments, the scFv contains a VH and a VL derived from an antibody or an antibody fragment specific to GPRC5D. In some embodiments, the antibody or antibody fragment that binds GPRC5D is or contains a VH and a VL from an antibody or antibody fragment set forth in International Patent Applications, Publication Number WO 2016/090329 and WO 2016/090312.

In some aspects, the CAR contains a ligand-(e.g., antigen-) binding domain that binds or recognizes, e.g., specifically binds, a universal tag or a universal epitope. In some aspects, the binding domain can bind a molecule, a tag, a polypeptide and/or an epitope that can be linked to a different binding molecule (e.g., antibody or antigen-binding fragment) that recognizes an antigen associated with a disease or disorder. Exemplary tag or epitope includes a dye (e.g., fluorescein isothiocyanate) or a biotin. In some aspects, a binding molecule (e.g., antibody or antigen-binding fragment) linked to a tag, that recognizes the antigen associated with a disease or disorder, e.g., tumor antigen, with an engineered cell expressing a CAR specific for the tag, to effect cytotoxicity or other effector function of the engineered cell. In some aspects, the specificity of the CAR to the antigen associated with a disease or disorder is provided by the tagged binding molecule (e.g., antibody), and different tagged binding molecule can be used to target different antigens. Exemplary CARs specific for a universal tag or a universal epitope include those described, e.g., in U.S. Pat. No. 9,233,125, WO 2016/030414, Urbanska et al., (2012) Cancer Res 72: 1844-1852, and Tamada et al., (2012). Clin Cancer Res 18:6436-6445.

In some embodiments, the antigen is or includes a pathogen-specific or pathogen-expressed antigen. In some embodiments, the antigen is a viral antigen (such as a viral antigen from HIV, HCV, HBV, etc.), bacterial antigens, and/or parasitic antigens. In some embodiments, the CAR contains a TCR-like antibody, such as an antibody or an antigen-binding fragment (e.g. scFv) that specifically recognizes an intracellular antigen, such as a tumor-associated antigen, presented on the cell surface as a major histocompatibility complex (MHC)-peptide complex. In some embodiments, an antibody or antigen-binding portion thereof that recognizes an MHC-peptide complex can be expressed on cells as part of a recombinant receptor, such as an antigen receptor. Among the antigen receptors are functional non-T cell receptor (TCR) antigen receptors, such as chimeric antigen receptors (CARs). In some embodiments, a CAR containing an antibody or antigen-binding fragment that exhibits TCR-like specificity directed against peptide-MHC complexes also may be referred to as a TCR-like CAR. In some embodiments, the CAR is a TCR-like CAR and the antigen is a processed peptide antigen, such as a peptide antigen of an intracellular protein, which, like a TCR, is recognized on the cell surface in the context of an MHC molecule. In some embodiments, the extracellular antigen-binding domain specific for an MHC-peptide complex of a TCR-like CAR is linked to one or more intracellular signaling components, in some aspects via linkers and/or transmembrane domain(s). In some embodiments, such molecules can typically mimic or approximate a signal through a natural antigen receptor, such as a TCR, and, optionally, a signal through such a receptor in combination with a costimulatory receptor.

Reference to "Major histocompatibility complex" (MHC) refers to a protein, generally a glycoprotein, that contains a polymorphic peptide binding site or binding groove that can, in some cases, complex with peptide antigens of polypeptides, including peptide antigens processed by the cell machinery. In some cases, MHC molecules can be displayed or expressed on the cell surface, including as a complex with peptide, i.e. MHC-peptide complex, for presentation of an antigen in a conformation recognizable by an antigen receptor on T cells, such as a TCRs or TCR-like antibody. Generally, MHC class I molecules are heterodimers having a membrane spanning α chain, in some cases with three α domains, and a non-covalently associated β2 microglobulin. Generally, MHC class II molecules are composed of two transmembrane glycoproteins, α and β, both of which typically span the membrane. An MHC molecule can include an effective portion of an MHC that contains an antigen binding site or sites for binding a peptide and the sequences necessary for recognition by the appropriate antigen receptor. In some embodiments, MHC class I molecules deliver peptides originating in the cytosol to the cell surface, where a MHC-peptide complex is recognized by T cells, such as generally $CD8^+$ T cells, but in some cases $CD4^+$ T cells. In some embodiments, MHC class II molecules deliver peptides originating in the vesicular system to the cell surface, where they are typically recognized by $CD4^+$ T cells. Generally, MHC molecules are encoded by a group of linked loci, which are collectively termed H-2 in the mouse and human leukocyte antigen (HLA) in humans. Hence, typically human MHC can also be referred to as human leukocyte antigen (HLA).

The term "MHC-peptide complex" or "peptide-MHC complex" or variations thereof, refers to a complex or association of a peptide antigen and an MHC molecule, such as, generally, by non-covalent interactions of the peptide in the binding groove or cleft of the MHC molecule. In some embodiments, the MHC-peptide complex is present or displayed on the surface of cells. In some embodiments, the MHC-peptide complex can be specifically recognized by an antigen receptor, such as a TCR, TCR-like CAR or antigen-binding portions thereof.

In some embodiments, a peptide, such as a peptide antigen or epitope, of a polypeptide can associate with an MHC molecule, such as for recognition by an antigen receptor. Generally, the peptide is derived from or based on a fragment of a longer biological molecule, such as a polypeptide or protein. In some embodiments, the peptide typically is about 8 to about 24 amino acids in length. In some embodiments, a peptide has a length of from or from about 9 to 22 amino acids for recognition in the MHC Class II complex. In some embodiments, a peptide has a length of from or from about 8 to 13 amino acids for recognition in the MHC Class I complex. In some embodiments, upon recognition of the peptide in the context of an MHC molecule, such as MHC-peptide complex, the antigen receptor, such as TCR or TCR-like CAR, produces or triggers an activation signal to the T cell that induces a T cell response, such as T cell proliferation, cytokine production, a cytotoxic T cell response or other response.

In some embodiments, a TCR-like antibody or antigen-binding portion, are known or can be produced by known methods (see e.g. US Published Application Nos. US 2002/0150914; US 2003/0223994; US 2004/0191260; US 2006/0034850; US 2007/00992530; US20090226474; US20090304679; and International App. Pub. No. WO 03/068201).

In some embodiments, an antibody or antigen-binding portion thereof that specifically binds to a MHC-peptide complex, can be produced by immunizing a host with an effective amount of an immunogen containing a specific MHC-peptide complex. In some cases, the peptide of the MHC-peptide complex is an epitope of antigen capable of binding to the MHC, such as a tumor antigen, for example a universal tumor antigen, myeloma antigen or other antigen as described below. In some embodiments, an effective amount of the immunogen is then administered to a host for eliciting an immune response, wherein the immunogen retains a three-dimensional form thereof for a period of time sufficient to elicit an immune response against the three-dimensional presentation of the peptide in the binding groove of the MHC molecule. Serum collected from the host is then assayed to determine if desired antibodies that recognize a three-dimensional presentation of the peptide in the binding groove of the MHC molecule is being produced.

In some embodiments, the produced antibodies can be assessed to confirm that the antibody can differentiate the MHC-peptide complex from the MHC molecule alone, the peptide of interest alone, and a complex of MHC and irrelevant peptide. The desired antibodies can then be isolated.

In some embodiments, an antibody or antigen-binding portion thereof that specifically binds to an MHC-peptide complex can be produced by employing antibody library display methods, such as phage antibody libraries. In some embodiments, phage display libraries of mutant Fab, scFv or other antibody forms can be generated, for example, in which members of the library are mutated at one or more residues of a CDR or CDRs. See e.g. US Pat. App. Pub. No. US20020150914, US20140294841; and Cohen CJ. et al. (2003) *J Mol. Recogn.* 16:324-332.

In some embodiments, the antigen is CD20. In some embodiments, the scFv contains a VH and a VL derived from an antibody or an antibody fragment specific to CD20. In some embodiments, the antibody or antibody fragment that binds CD20 is an antibody that is or is derived from Rituximab, such as is Rituximab scFv.

In some embodiments, the antigen is CD22. In some embodiments, the scFv contains a VH and a VL derived from an antibody or an antibody fragment specific to CD22. In some embodiments, the antibody or antibody fragment that binds CD22 is an antibody that is or is derived from m971, such as is m971 scFv.

In some embodiments, the chimeric antigen receptor includes an extracellular portion containing an antibody or antibody fragment. In some aspects, the chimeric antigen receptor includes an extracellular portion containing the antibody or fragment and an intracellular signaling domain. In some embodiments, the antibody or fragment includes an scFv.

In some embodiments, the antibody portion of the recombinant receptor, e.g., CAR, further includes at least a portion of an immunoglobulin constant region, such as a hinge region, e.g., an IgG4 hinge region, and/or a CH1/CL and/or Fc region. In some embodiments, the constant region or portion is of a human IgG, such as IgG4 or IgG1. In some aspects, the portion of the constant region serves as a spacer region between the antigen-recognition component, e.g., scFv, and transmembrane domain. The spacer can be of a length that provides for increased responsiveness of the cell following antigen binding, as compared to in the absence of the spacer. Exemplary spacers include, but are not limited to, those described in Hudecek et al. (2013) *Clin. Cancer Res.*, 19:3153, international patent application publication number WO2014031687, U.S. Pat. No. 8,822,647 or published app. No. US2014/0271635.

In some embodiments, the constant region or portion is of a human IgG, such as IgG4 or IgG1. In some embodiments, the spacer has the sequence ESKYGPPCPPCP (set forth in SEQ ID NO: 81), and is encoded by the sequence set forth in SEQ ID NO: 82. In some embodiments, the spacer has the sequence set forth in SEQ ID NO: 83. In some embodiments, the spacer has the sequence set forth in SEQ ID NO: 84. In some embodiments, the constant region or portion is of IgD. In some embodiments, the spacer has the sequence set forth in SEQ ID NO: 85. In some embodiments, the spacer has a sequence of amino acids that exhibits at least 85%, 86%, 87%, 88%, 89%, 90%, 91%, 92%, 93%, 94%, 95%, 96%, 97%, 98%, 99% or more sequence identity to any of SEQ ID NOS: 81, 83, 84 or 85. In some embodiments, the spacer has the sequence set forth in SEQ ID NOS: 86-94. In some embodiments, the spacer has a sequence of amino acids that exhibits at least 85%, 86%, 87%, 88%, 89%, 90%, 91%, 92%, 93%, 94%, 95%, 96%, 97%, 98%, 99% or more sequence identity to any of SEQ ID NOS: 86-94.

In some embodiments, the antigen receptor comprises an intracellular domain linked directly or indirectly to the extracellular domain. In some embodiments, the chimeric antigen receptor includes a transmembrane domain linking the extracellular domain and the intracellular signaling domain. In some embodiments, the intracellular signaling domain comprises an ITAM. For example, in some aspects, the antigen recognition domain (e.g. extracellular domain) generally is linked to one or more intracellular signaling components, such as signaling components that mimic activation through an antigen receptor complex, such as a TCR complex, in the case of a CAR, and/or signal via another cell surface receptor. In some embodiments, the chimeric receptor comprises a transmembrane domain linked or fused between the extracellular domain (e.g. scFv) and intracellular signaling domain. Thus, in some embodiments, the antigen-binding component (e.g., antibody) is linked to one or more transmembrane and intracellular signaling domains.

In one embodiment, a transmembrane domain that naturally is associated with one of the domains in the receptor, e.g., CAR, is used. In some instances, the transmembrane domain is selected or modified by amino acid substitution to avoid binding of such domains to the transmembrane domains of the same or different surface membrane proteins to minimize interactions with other members of the receptor complex.

The transmembrane domain in some embodiments is derived either from a natural or from a synthetic source. Where the source is natural, the domain in some aspects is derived from any membrane-bound or transmembrane protein. Transmembrane regions include those derived from (i.e. comprise at least the transmembrane region(s) of) the alpha, beta or zeta chain of the T-cell receptor, CD28, CD3 epsilon, CD45, CD4, CD5, CD8, CD9, CD16, CD22, CD33, CD37, CD64, CD80, CD86, CD134, CD137, CD154. Alternatively the transmembrane domain in some embodiments is synthetic. In some aspects, the synthetic transmembrane domain comprises predominantly hydrophobic residues such as leucine and valine. In some aspects, a triplet of phenylalanine, tryptophan and valine will be found at each end of a synthetic transmembrane domain. In some embodiments, the linkage is by linkers, spacers, and/or transmembrane domain(s). In some aspects, the transmembrane domain contains a transmembrane portion of CD28.

In some embodiments, the extracellular domain and transmembrane domain can be linked directly or indirectly. In some embodiments, the extracellular domain and transmembrane are linked by a spacer, such as any described herein. In some embodiments, the receptor contains extracellular portion of the molecule from which the transmembrane domain is derived, such as a CD28 extracellular portion.

Among the intracellular signaling domains are those that mimic or approximate a signal through a natural antigen receptor, a signal through such a receptor in combination with a costimulatory receptor, and/or a signal through a costimulatory receptor alone. In some embodiments, a short oligo- or polypeptide linker, for example, a linker of between 2 and 10 amino acids in length, such as one containing glycines and serines, e.g., glycine-serine doublet, is present and forms a linkage between the transmembrane domain and the cytoplasmic signaling domain of the CAR.

T cell activation is in some aspects described as being mediated by two classes of cytoplasmic signaling sequences: those that initiate antigen-dependent primary activation through the TCR (primary cytoplasmic signaling sequences), and those that act in an antigen-independent manner to provide a secondary or co-stimulatory signal (secondary cytoplasmic signaling sequences). In some aspects, the CAR includes one or both of such signaling components.

The receptor, e.g., the CAR, generally includes at least one intracellular signaling component or components. In some aspects, the CAR includes a primary cytoplasmic signaling sequence that regulates primary activation of the TCR complex. Primary cytoplasmic signaling sequences that act in a stimulatory manner may contain signaling motifs which are known as immunoreceptor tyrosine-based activation motifs or ITAMs. Examples of ITAM containing primary cytoplasmic signaling sequences include those derived from CD3 zeta chain, FcR gamma, CD3 gamma, CD3 delta and CD3 epsilon. In some embodiments, cytoplasmic signaling molecule(s) in the CAR contain(s) a cytoplasmic signaling domain, portion thereof, or sequence derived from CD3 zeta.

In some embodiments, the receptor includes an intracellular component of a TCR complex, such as a TCR CD3 chain that mediates T-cell activation and cytotoxicity, e.g., CD3 zeta chain. Thus, in some aspects, the antigen-binding portion is linked to one or more cell signaling modules. In some embodiments, cell signaling modules include CD3 transmembrane domain, CD3 intracellular signaling domains, and/or other CD3 transmembrane domains. In some embodiments, the receptor, e.g., CAR, further includes a portion of one or more additional molecules such as Fc receptor γ, CD8, CD4, CD25, or CD16. For example, in some aspects, the CAR or other chimeric receptor includes a chimeric molecule between CD3-zeta (CD3-ζ) or Fc receptor γ and CD8, CD4, CD25 or CD16.

In some embodiments, upon ligation of the CAR or other chimeric receptor, the cytoplasmic domain or intracellular signaling domain of the receptor activates at least one of the normal effector functions or responses of the immune cell, e.g., T cell engineered to express the CAR. For example, in some contexts, the CAR induces a function of a T cell such as cytolytic activity or T-helper activity, such as secretion of cytokines or other factors. In some embodiments, a truncated portion of an intracellular signaling domain of an antigen receptor component or costimulatory molecule is used in place of an intact immunostimulatory chain, for example, if it transduces the effector function signal. In some embodiments, the intracellular signaling domain or domains include the cytoplasmic sequences of the T cell receptor (TCR), and in some aspects also those of co-receptors that in the natural context act in concert with such receptors to initiate signal transduction following antigen receptor engagement.

In the context of a natural TCR, full activation generally requires not only signaling through the TCR, but also a costimulatory signal. Thus, in some embodiments, to promote full activation, a component for generating secondary or co-stimulatory signal is also included in the CAR. In other embodiments, the CAR does not include a component for generating a costimulatory signal. In some aspects, an additional CAR is expressed in the same cell and provides the component for generating the secondary or costimulatory signal.

In some embodiments, the chimeric antigen receptor contains an intracellular domain of a T cell costimulatory molecule. In some embodiments, the CAR includes a signaling domain and/or transmembrane portion of a costimulatory receptor, such as CD28, 4-1BB, OX40, DAP10, and ICOS. In some aspects, the same CAR includes both the activating and costimulatory components. In some embodiments, the chimeric antigen receptor contains an intracellular domain derived from a T cell costimulatory molecule or a functional variant thereof, such as between the transmembrane domain and intracellular signaling domain. In some aspects, the T cell costimulatory molecule is CD28 or 41BB.

In some embodiments, the activating domain is included within one CAR, whereas the costimulatory component is provided by another CAR recognizing another antigen. In some embodiments, the CARs include activating or stimulatory CARs, costimulatory CARs, both expressed on the same cell (see WO2014/055668). In some aspects, the cells include one or more stimulatory or activating CAR and/or a costimulatory CAR. In some embodiments, the cells further include inhibitory CARs (iCARs, see Fedorov et al., Sci. Transl. Medicine, 5(215) (December, 2013), such as a CAR recognizing an antigen other than the one associated with and/or specific for the disease or condition whereby an activating signal delivered through the disease-targeting CAR is diminished or inhibited by binding of the inhibitory CAR to its ligand, e.g., to reduce off-target effects.

In some embodiments, the two receptors induce, respectively, an activating and an inhibitory signal to the cell, such that ligation of one of the receptor to its antigen activates the cell or induces a response, but ligation of the second inhibitory receptor to its antigen induces a signal that suppresses or dampens that response. Examples are combinations of activating CARs and inhibitory CARs (iCARs). Such a strategy may be used, for example, to reduce the likelihood of off-target effects in the context in which the activating CAR binds an antigen expressed in a disease or condition but which is also expressed on normal cells, and the inhibitory receptor binds to a separate antigen which is expressed on the normal cells but not cells of the disease or condition.

In some aspects, the chimeric receptor is or includes an inhibitory CAR (e.g. iCAR) and includes intracellular components that dampen or suppress an immune response, such as an ITAM- and/or co stimulatory-promoted response in the cell. Exemplary of such intracellular signaling components are those found on immune checkpoint molecules, including PD-1, CTLA4, LAG3, BTLA, OX2R, TIM-3, TIGIT, LAIR-1, PGE2 receptors, EP2/4 Adenosine receptors including A2AR. In some aspects, the engineered cell includes an inhibitory CAR including a signaling domain of or derived from such an inhibitory molecule, such that it serves to dampen the response of the cell, for example, that induced by an activating and/or costimulatory CAR.

In certain embodiments, the intracellular signaling domain comprises a CD28 transmembrane and signaling domain linked to a CD3 (e.g., CD3-zeta) intracellular domain. In some embodiments, the intracellular signaling domain comprises a chimeric CD28 and CD137 (4-1BB, TNFRSF9) co-stimulatory domains, linked to a CD3 zeta intracellular domain.

In some embodiments, the CAR encompasses one or more, e.g., two or more, costimulatory domains and an activation domain, e.g., primary activation domain, in the cytoplasmic portion. Exemplary CARs include intracellular components of CD3-zeta, CD28, and 4-1BB.

In some embodiments, the antigen receptor further includes a marker and/or cells expressing the CAR or other antigen receptor further includes a surrogate marker, such as a cell surface marker, which may be used to confirm transduction or engineering of the cell to express the receptor. In some aspects, the marker includes all or part (e.g., truncated form) of CD34, a NGFR, or epidermal growth factor receptor, such as truncated version of such a cell surface receptor (e.g., tEGFR). In some embodiments, the nucleic acid encoding the marker is operably linked to a polynucleotide encoding for a linker sequence, such as a cleavable linker sequence, e.g., T2A. For example, a marker, and optionally a linker sequence, can be any as disclosed in published patent application No. WO2014031687. For example, the marker can be a truncated EGFR (tEGFR) that is, optionally, linked to a linker sequence, such as a T2A cleavable linker sequence.

An exemplary polypeptide for a truncated EGFR (e.g. tEGFR) comprises the sequence of amino acids set forth in SEQ ID NO: 43 or 16 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 43 or 44. An exemplary T2A linker sequence comprises the sequence of amino acids set forth in SEQ ID NO: 47 or 48 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 47 or 48.

In some embodiments, the marker is a molecule, e.g., cell surface protein, not naturally found on T cells or not naturally found on the surface of T cells, or a portion thereof. In some embodiments, the molecule is a non-self molecule, e.g., non-self protein, i.e., one that is not recognized as "self" by the immune system of the host into which the cells will be adoptively transferred.

In some embodiments, the marker serves no therapeutic function and/or produces no effect other than to be used as a marker for genetic engineering, e.g., for selecting cells successfully engineered. In other embodiments, the marker may be a therapeutic molecule or molecule otherwise exerting some desired effect, such as a ligand for a cell to be encountered in vivo, such as a costimulatory or immune checkpoint molecule to enhance and/or dampen responses of the cells upon adoptive transfer and encounter with ligand.

In some cases, CARs are referred to as first, second, and/or third generation CARs. In some aspects, a first generation CAR is one that solely provides a CD3-chain induced signal upon antigen binding; in some aspects, a second-generation CARs is one that provides such a signal and costimulatory signal, such as one including an intracellular signaling domain from a costimulatory receptor such as CD28 or CD137; in some aspects, a third generation CAR is one that includes multiple costimulatory domains of different costimulatory receptors.

For example, in some embodiments, the CAR contains an antibody, e.g., an antibody fragment, such as an scFv, specific to an antigen including any as described, a transmembrane domain that is or contains a transmembrane portion of CD28 or a functional variant thereof, and an intracellular signaling domain containing a signaling portion of CD28 or functional variant thereof and a signaling portion of CD3 zeta or functional variant thereof. In some embodiments, the CAR contains an antibody, e.g., antibody fragment, such as an scFv, specific to an antigen including any as described, a transmembrane domain that is or contains a transmembrane portion of CD28 or a functional variant thereof, and an intracellular signaling domain containing a signaling portion of a 4-1BB or functional variant thereof and a signaling portion of CD3 zeta or functional variant thereof. In some such embodiments, the receptor further includes a spacer containing a portion of an Ig molecule, such as a human Ig molecule, such as an Ig hinge, e.g. an IgG4 hinge, such as a hinge-only spacer.

In some embodiments, the transmembrane domain of the recombinant receptor, e.g., the CAR, is or includes a transmembrane domain of human CD28 (e.g. Accession No. P01747.1) or variant thereof, such as a transmembrane domain that comprises the sequence of amino acids set forth in SEQ ID NO: 95 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 95; in some embodiments, the transmembrane-domain containing portion of the recombinant receptor comprises the sequence of amino acids set forth in SEQ ID NO: 96 or a sequence of amino acids having at least at or about 85%, 86%, 87%, 88%, 89%, 90%, 91%, 92%, 93%, 94%, 95%, 96%, 97%, 98%, 99% or more sequence identity thereto.

In some embodiments, the intracellular signaling component(s) of the recombinant receptor, e.g. the CAR, contains an intracellular costimulatory signaling domain of human CD28 or a functional variant or portion thereof, such as a domain with an LL to GG substitution at positions 186-187 of a native CD28 protein. For example, the intracellular signaling domain can comprise the sequence of amino acids set forth in SEQ ID NO: 97 or 98 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 97 or 98. In some embodiments, the intracellular domain comprises an intracellular costimulatory signaling domain of 4-1BB (e.g. (Accession No. Q07011.1) or functional variant or portion thereof, such as the sequence of amino acids set forth in SEQ ID NO: 99 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 99.

In some embodiments, the intracellular signaling domain of the recombinant receptor, e.g. the CAR, comprises a human CD3 zeta stimulatory signaling domain or functional variant thereof, such as an 112 AA cytoplasmic domain of isoform 3 of human CD3ζ (Accession No.: P20963.2) or a CD3 zeta signaling domain as described in U.S. Pat. No. 7,446,190 or 8,911,993. For example, in some embodiments, the intracellular signaling domain comprises the sequence of amino acids as set forth in SEQ ID NO: 100, 101 or 102 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 100, 101 or 102.

In some aspects, the spacer contains only a hinge region of an IgG, such as only a hinge of IgG4 or IgG1, such as the hinge only spacer set forth in SEQ ID NO: 81. In other embodiments, the spacer is or contains an Ig hinge, e.g., an IgG4-derived hinge, optionally linked to a CH2 and/or CH3 domains. In some embodiments, the spacer is an Ig hinge, e.g., an IgG4 hinge, linked to CH2 and CH3 domains, such as set forth in SEQ ID NO: 84. In some embodiments, the spacer is an Ig hinge, e.g., an IgG4 hinge, linked to a CH3 domain only, such as set forth in SEQ ID NO: 83. In some embodiments, the spacer is or comprises a glycine-serine rich sequence or other flexible linker such as known flexible linkers.

For example, in some embodiments, the CAR includes an antibody such as an antibody fragment, including scFvs, a spacer, such as a spacer containing a portion of an immunoglobulin molecule, such as a hinge region and/or one or more constant regions of a heavy chain molecule, such as an Ig-hinge containing spacer, a transmembrane domain containing all or a portion of a CD28-derived transmembrane domain, a CD28-derived intracellular signaling domain, and a CD3 zeta signaling domain. In some embodiments, the CAR includes an antibody or fragment, such as scFv, a spacer such as any of the Ig-hinge containing spacers, a CD28-derived transmembrane domain, a 4-1BB-derived intracellular signaling domain, and a CD3 zeta-derived signaling domain.

Exemplary surrogate markers can include truncated forms of cell surface polypeptides, such as truncated forms that are non-functional and to not transduce or are not capable of transducing a signal or a signal ordinarily transduced by the full-length form of the cell surface polypeptide, and/or do not or are not capable of internalizing. Exemplary truncated cell surface polypeptides including truncated forms of growth factors or other receptors such as a truncated human epidermal growth factor receptor 2 (tHER2), a truncated epidermal growth factor receptor (tEGFR, exemplary tEGFR sequence set forth in 43 or 44) or a prostate-specific membrane antigen (PSMA) or modified form thereof tEGFR may contain an epitope recognized by the antibody cetuximab (Erbitux®) or other therapeutic anti-EGFR antibody or binding molecule, which can be used to identify or select cells that have been engineered to express the tEGFR construct and an encoded exogenous protein, and/or to eliminate or separate cells expressing the encoded exogenous protein. See U.S. Pat. No. 8,802,374 and Liu et al., Nature Biotech. 2016 April; 34(4): 430-434). In some aspects, the marker, e.g. surrogate marker, includes all or part (e.g., truncated form) of CD34, a NGFR, a CD19 or a truncated CD19, e.g., a truncated non-human CD19, or epidermal growth factor receptor (e.g., tEGFR). In some embodiments, the marker is or comprises a fluorescent protein, such as green fluorescent protein (GFP), enhanced green fluorescent protein (EGFP), such as super-fold GFP (sfGFP), red fluorescent protein (RFP), such as tdTomato, mCherry, mStrawberry, AsRed2, DsRed or DsRed2, cyan fluorescent protein (CFP), blue green fluorescent protein (BFP), enhanced blue fluorescent protein (EBFP), and yellow fluorescent protein (YFP), and variants thereof, including species variants, monomeric variants, and codon-optimized and/or enhanced variants of the fluorescent proteins. In some embodiments, the marker is or comprises an enzyme, such as a luciferase, the lacZ gene from *E. coli*, alkaline phosphatase, secreted embryonic alkaline phosphatase (SEAP), chloramphenicol acetyl transferase (CAT). Exemplary light-emitting reporter genes include luciferase (luc), β-galactosidase, chloramphenicol acetyltransferase (CAT), β-glucuronidase (GUS) or variants thereof.

In some embodiments, the marker is a resistance marker or selection marker. In some embodiments, the resistance marker or selection marker is or comprises a polypeptide that confers resistance to exogenous agents or drugs. In some embodiments, the resistance marker or selection marker is an antibiotic resistance gene. In some embodiments, the resistance marker or selection marker is an antibiotic resistance gene confers antibiotic resistance to a mammalian cell. In some embodiments, the resistance marker or selection marker is or comprises a Puromycin resistance gene, a Hygromycin resistance gene, a Blasticidin resistance gene, a Neomycin resistance gene, a Geneticin resistance gene or a Zeocin resistance gene or a modified form thereof.

In some embodiments, the nucleic acid encoding the marker is operably linked to a polynucleotide encoding for a linker sequence, such as a cleavable linker sequence, e.g., a T2A. For example, a marker, and optionally a linker sequence, can be any as disclosed in PCT Pub. No. WO2014031687.

In some embodiments, nucleic acid molecules encoding such CAR constructs further includes a sequence encoding a T2A ribosomal skip element and/or a tEGFR sequence, e.g., downstream of the sequence encoding the CAR. In some embodiments, the sequence encodes a T2A ribosomal skip element set forth in SEQ ID NO: 47 or 48, or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 47 or 48.

In some embodiments, T cells expressing an antigen receptor (e.g. CAR) can also be generated to express a truncated EGFR (EGFRt) as a non-immunogenic selection epitope (e.g. by introduction of a construct encoding the CAR and EGFRt separated by a T2A ribosome switch to express two proteins from the same construct), which then can be used as a marker to detect such cells (see e.g. U.S. Pat. No. 8,802,374). In some embodiments, the sequence encodes an tEGFR sequence set forth in SEQ ID NO: 43 or 44, or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 43 or 44. In some cases, the peptide, such as T2A, can cause the ribosome to skip (ribosome skipping) synthesis of a peptide bond at the C-terminus of a 2A element, leading to separation between the end of the 2A sequence and the next peptide downstream (see, for example, de Felipe. *Genetic Vaccines and Ther.* 2:13 (2004) and deFelipe et al. *Traffic* 5:616-626 (2004)). Many 2A elements are known. Examples of 2A sequences that can be used in the methods and nucleic acids disclosed herein, without limitation, 2A sequences from the foot-and-mouth disease virus (F2A, e.g., SEQ ID NO: 45), equine rhinitis A virus (E2A, e.g., SEQ ID NO: 46), Thosea asigna virus (T2A, e.g., SEQ ID NO: 47 or 48), and porcine teschovirus-1 (P2A, e.g., SEQ ID NO: 49 or 50) as described in U.S. Patent Publication No. 20070116690.

The recombinant receptors, such as CARs, expressed by the cells administered to the subject generally recognize or specifically bind to a molecule that is expressed in, associated with, and/or specific for the disease or condition or cells thereof being treated. Upon specific binding to the molecule, e.g., antigen, the receptor generally delivers an immunostimulatory signal, such as an ITAM-transduced signal, into the cell, thereby promoting an immune response targeted to the disease or condition. For example, in some embodiments, the cells express a CAR that specifically binds to an antigen expressed by a cell or tissue of the disease or condition or associated with the disease or condition.

2. Chimeric Auto-Antibody Receptor (CAAR)

In some embodiments, the recombinant receptor is a chimeric autoantibody receptor (CAAR). In some embodiments, the CAAR binds, e.g., specifically binds, or recognizes, an autoantibody. In some embodiments, a cell expressing the CAAR, such as a T cell engineered to express a CAAR, can be used to bind to and kill autoantibody-expressing cells, but not normal antibody expressing cells. In some embodiments, CAAR-expressing cells can be used to treat an autoimmune disease associated with expression of self-antigens, such as autoimmune diseases. In some embodiments, CAAR-expressing cells can target B cells that ultimately produce the autoantibodies and display the autoantibodies on their cell surfaces, mark these B cells as disease-specific targets for therapeutic intervention. In some embodiments, CAAR-expressing cells can be used to efficiently targeting and killing the pathogenic B cells in autoimmune diseases by targeting the disease-causing B cells using an antigen-specific chimeric autoantibody receptor. In some embodiments, the recombinant receptor is a CAAR, such as any described in U.S. Patent Application Pub. No. US 2017/0051035.

In some embodiments, the CAAR comprises an autoantibody binding domain, a transmembrane domain, and one or more intracellular signaling region or domain (also interchangeably called a cytoplasmic signaling domain or region). In some embodiments, the intracellular signaling region comprises an intracellular signaling domain. In some embodiments, the intracellular signaling domain is or comprises a primary signaling domain, a signaling domain that is capable of stimulating and/or inducing a primary activation signal in a T cell, a signaling domain of a T cell receptor (TCR) component (e.g. an intracellular signaling domain or region of a CD3-zeta (CD3ζ) chain or a functional variant or signaling portion thereof), and/or a signaling domain comprising an immunoreceptor tyrosine-based activation motif (ITAM).

In some embodiments, the autoantibody binding domain comprises an autoantigen or a fragment thereof. The choice of autoantigen can depend upon the type of autoantibody being targeted. For example, the autoantigen may be chosen because it recognizes an autoantibody on a target cell, such as a B cell, associated with a particular disease state, e.g. an autoimmune disease, such as an autoantibody-mediated autoimmune disease. In some embodiments, the autoimmune disease includes pemphigus vulgaris (PV). Exemplary autoantigens include desmoglein 1 (Dsg1) and Dsg3.

3. T Cell Receptors (TCRs)

In some embodiments, engineered cells, such as T cells, are provided that express a T cell receptor (TCR) or antigen-binding portion thereof that recognizes an peptide epitope or T cell epitope of a target polypeptide, such as an antigen of a tumor, viral or autoimmune protein.

In some embodiments, a "T cell receptor" or "TCR" is a molecule that contains a variable α and β chains (also known as TCRα and TCRβ, respectively) or a variable γ and δ chains (also known as TCRα and TCRβ, respectively), or antigen-binding portions thereof, and which is capable of specifically binding to a peptide bound to an MHC molecule. In some embodiments, the TCR is in the αβ form. Typically, TCRs that exist in αβ and γδ forms are generally structurally similar, but T cells expressing them may have distinct anatomical locations or functions. A TCR can be found on the surface of a cell or in soluble form. Generally, a TCR is found on the surface of T cells (or T lymphocytes) where it is generally responsible for recognizing antigens bound to major histocompatibility complex (MHC) molecules.

Unless otherwise stated, the term "TCR" should be understood to encompass full TCRs as well as antigen-binding portions or antigen-binding fragments thereof. In some embodiments, the TCR is an intact or full-length TCR, including TCRs in the αβ form or γδ form. In some embodiments, the TCR is an antigen-binding portion that is less than a full-length TCR but that binds to a specific peptide bound in an MHC molecule, such as binds to an MHC-peptide complex. In some cases, an antigen-binding portion or fragment of a TCR can contain only a portion of the structural domains of a full-length or intact TCR, but yet is able to bind the peptide epitope, such as MHC-peptide complex, to which the full TCR binds. In some cases, an antigen-binding portion contains the variable domains of a TCR, such as variable α chain and variable β chain of a TCR, sufficient to form a binding site for binding to a specific MHC-peptide complex. Generally, the variable chains of a TCR contain complementarity determining regions involved in recognition of the peptide, MHC and/or MHC-peptide complex.

In some embodiments, the variable domains of the TCR contain hypervariable loops, or complementarity determining regions (CDRs), which generally are the primary contributors to antigen recognition and binding capabilities and specificity. In some embodiments, a CDR of a TCR or combination thereof forms all or substantially all of the antigen-binding site of a given TCR molecule. The various CDRs within a variable region of a TCR chain generally are separated by framework regions (FRs), which generally display less variability among TCR molecules as compared to the CDRs (see, e.g., Jores et al., Proc. Nat'l Acad. Sci. U.S.A. 87:9138, 1990; Chothia et al., EMBO J. 7:3745, 1988; see also Lefranc et al., Dev. Comp. Immunol. 27:55, 2003). In some embodiments, CDR3 is the main CDR responsible for antigen binding or specificity, or is the most important among the three CDRs on a given TCR variable region for antigen recognition, and/or for interaction with the processed peptide portion of the peptide-MHC complex. In some contexts, the CDR1 of the alpha chain can interact with the N-terminal part of certain antigenic peptides. In some contexts, CDR1 of the beta chain can interact with the C-terminal part of the peptide. In some contexts, CDR2 contributes most strongly to or is the primary CDR responsible for the interaction with or recognition of the MHC portion of the MHC-peptide complex. In some embodiments, the variable region of the β-chain can contain a further hypervariable region (CDR4 or HVR4), which generally is involved in superantigen binding and not antigen recognition (Kotb (1995) Clinical Microbiology Reviews, 8:411-426).

In some embodiments, a TCR also can contain a constant domain, a transmembrane domain and/or a short cytoplasmic tail (see, e.g., Janeway et al., Immunobiology: The Immune System in Health and Disease, 3rd Ed., Current Biology Publications, p. 4:33, 1997). In some aspects, each chain of the TCR can possess one N-terminal immunoglobulin variable domain, one immunoglobulin constant domain, a transmembrane region, and a short cytoplasmic tail at the C-terminal end. In some embodiments, a TCR is associated with invariant proteins of the CD3 complex involved in mediating signal transduction.

In some embodiments, a TCR chain contains one or more constant domain. For example, the extracellular portion of a given TCR chain (e.g., α-chain or □-chain) can contain two immunoglobulin-like domains, such as a variable domain (e.g., Vα or V□; typically amino acids 1 to 116 based on Kabat numbering Kabat et al., "Sequences of Proteins of Immunological Interest, US Dept. Health and Human Services, Public Health Service National Institutes of Health, 1991, 5th ed.) and a constant domain (e.g., α-chain constant domain or Cα, typically positions 117 to 259 of the chain based on Kabat numbering or □ chain constant domain or C□, typically positions 117 to 295 of the chain based on Kabat) adjacent to the cell membrane. For example, in some cases, the extracellular portion of the TCR formed by the two chains contains two membrane-proximal constant domains, and two membrane-distal variable domains, which variable domains each contain CDRs. The constant domain of the TCR may contain short connecting sequences in which a cysteine residue forms a disulfide bond, thereby linking the two chains of the TCR. In some embodiments, a TCR may have an additional cysteine residue in each of the α and β chains, such that the TCR contains two disulfide bonds in the constant domains.

In some embodiments, the TCR chains contain a transmembrane domain. In some embodiments, the transmembrane domain is positively charged. In some cases, the TCR chain contains a cytoplasmic tail. In some cases, the structure allows the TCR to associate with other molecules like CD3 and subunits thereof. For example, a TCR containing constant domains with a transmembrane region may anchor the protein in the cell membrane and associate with invariant subunits of the CD3 signaling apparatus or complex. The intracellular tails of CD3 signaling subunits (e.g. CD3γ, CD3δ, CD3ε and CD3ζ chains) contain one or more immunoreceptor tyrosine-based activation motif or ITAM that are involved in the signaling capacity of the TCR complex.

In some embodiments, the TCR may be a heterodimer of two chains α and β (or optionally γ and δ) or it may be a single chain TCR construct. In some embodiments, the TCR is a heterodimer containing two separate chains (α and β chains or γ and δ chains) that are linked, such as by a disulfide bond or disulfide bonds.

In some embodiments, the TCR can be generated from a known TCR sequence(s), such as sequences of Vα,β chains, for which a substantially full-length coding sequence is readily available. Methods for obtaining full-length TCR sequences, including V chain sequences, from cell sources are well known. In some embodiments, nucleic acids encoding the TCR can be obtained from a variety of sources, such as by polymerase chain reaction (PCR) amplification of TCR-encoding nucleic acids within or isolated from a given cell or cells, or synthesis of publicly available TCR DNA sequences.

In some embodiments, the TCR is obtained from a biological source, such as from cells such as from a T cell (e.g. cytotoxic T cell), T-cell hybridomas or other publicly available source. In some embodiments, the T-cells can be obtained from in vivo isolated cells. In some embodiments, the TCR is a thymically selected TCR. In some embodiments, the TCR is a neoepitope-restricted TCR. In some embodiments, the T-cells can be a cultured T-cell hybridoma or clone. In some embodiments, the TCR or antigen-binding portion thereof or antigen-binding fragment thereof can be synthetically generated from knowledge of the sequence of the TCR.

In some embodiments, the TCR is generated from a TCR identified or selected from screening a library of candidate TCRs against a target polypeptide antigen, or target T cell epitope thereof. TCR libraries can be generated by amplification of the repertoire of Vα and Vβ from T cells isolated from a subject, including cells present in PBMCs, spleen or other lymphoid organ. In some cases, T cells can be amplified from tumor-infiltrating lymphocytes (TILs). In some embodiments, TCR libraries can be generated from CD4+ or CD8+ T cells. In some embodiments, the TCRs can be amplified from a T cell source of a normal of healthy subject, i.e. normal TCR libraries. In some embodiments, the TCRs can be amplified from a T cell source of a diseased subject, i.e. diseased TCR libraries. In some embodiments, degenerate primers are used to amplify the gene repertoire of Vα and Vβ, such as by RT-PCR in samples, such as T cells, obtained from humans. In some embodiments, scTv libraries can be assembled from naïve Vα and Vβ libraries in which the amplified products are cloned or assembled to be separated by a linker. Depending on the source of the subject and cells, the libraries can be HLA allele-specific. Alternatively, in some embodiments, TCR libraries can be generated by mutagenesis or diversification of a parent or scaffold TCR molecule. In some aspects, the TCRs are subjected to directed evolution, such as by mutagenesis, e.g., of the α or β chain. In some aspects, particular residues within CDRs of the TCR are altered. In some embodiments, selected TCRs can be modified by affinity maturation. In some embodiments, antigen-specific T cells may be selected, such as by screening to assess CTL activity against the peptide. In some aspects, TCRs, e.g. present on the antigen-specific T cells, may be selected, such as by binding activity, e.g., particular affinity or avidity for the antigen.

In some embodiments, the TCR or antigen-binding portion thereof is one that has been modified or engineered. In some embodiments, directed evolution methods are used to generate TCRs with altered properties, such as with higher affinity for a specific MHC-peptide complex. In some embodiments, directed evolution is achieved by display methods including, but not limited to, yeast display (Holler et al. (2003) Nat Immunol, 4, 55-62; Holler et al. (2000) Proc Natl Acad Sci USA, 97, 5387-92), phage display (Li et al. (2005) Nat Biotechnol, 23, 349-54), or T cell display (Chervin et al. (2008) J Immunol Methods, 339, 175-84). In some embodiments, display approaches involve engineering, or modifying, a known, parent or reference TCR. For example, in some cases, a wild-type TCR can be used as a template for producing mutagenized TCRs in which in one or more residues of the CDRs are mutated, and mutants with an desired altered property, such as higher affinity for a desired target antigen, are selected.

In some embodiments, peptides of a target polypeptide for use in producing or generating a TCR of interest are known or can be readily identified. In some embodiments, peptides suitable for use in generating TCRs or antigen-binding portions can be determined based on the presence of an HLA-restricted motif in a target polypeptide of interest, such as a target polypeptide described below. In some embodiments, peptides are identified using available computer prediction models. In some embodiments, for predicting MHC class I binding sites, such models include, but are not limited to, ProPred1 (Singh and Raghava (2001) Bioinformatics 17(12):1236-1237, and SYFPEITHI (see Schuler et al. (2007) Immunoinformatics Methods in Molecular Biology, 409(1): 75-93 2007). In some embodiments, the MHC-restricted epitope is HLA-A0201, which is expressed in approximately 39-46% of all Caucasians and therefore, represents a suitable choice of MHC antigen for use preparing a TCR or other MHC-peptide binding molecule.

HLA-A0201-binding motifs and the cleavage sites for proteasomes and immune-proteasomes using computer prediction models are known. For predicting MHC class I binding sites, such models include, but are not limited to, ProPred1 (described in more detail in Singh and Raghava, ProPred: prediction of HLA-DR binding sites. BIOINFORMATICS 17(12):1236-1237 2001), and SYFPEITHI (see Schuler et al. SYFPEITHI, Database for Searching and T-Cell Epitope Prediction. in Immunoinformatics Methods in Molecular Biology, vol 409(1): 75-93 2007).

In some embodiments, the TCR or antigen binding portion thereof may be a recombinantly produced natural protein or mutated form thereof in which one or more property, such as binding characteristic, has been altered. In some embodiments, a TCR may be derived from one of various animal species, such as human, mouse, rat, or other mammal. A TCR may be cell-bound or in soluble form. In some embodiments, for purposes of the provided methods, the TCR is in cell-bound form expressed on the surface of a cell.

In some embodiments, the TCR is a full-length TCR. In some embodiments, the TCR is an antigen-binding portion. In some embodiments, the TCR is a dimeric TCR (dTCR). In some embodiments, the TCR is a single-chain TCR (sc-TCR). In some embodiments, a dTCR or scTCR have the structures as described in WO 03/020763, WO 04/033685, WO2011/044186.

In some embodiments, the TCR contains a sequence corresponding to the transmembrane sequence. In some embodiments, the TCR does contain a sequence corresponding to cytoplasmic sequences. In some embodiments, the TCR is capable of forming a TCR complex with CD3. In some embodiments, any of the TCRs, including a dTCR or scTCR, can be linked to signaling domains that yield an active TCR on the surface of a T cell. In some embodiments, the TCR is expressed on the surface of cells.

In some embodiments a dTCR contains a first polypeptide wherein a sequence corresponding to a TCR α chain variable region sequence is fused to the N terminus of a sequence corresponding to a TCR α chain constant region extracellular sequence, and a second polypeptide wherein a sequence corresponding to a TCR β chain variable region sequence is fused to the N terminus a sequence corresponding to a TCR β chain constant region extracellular sequence, the first and second polypeptides being linked by a disulfide bond. In some embodiments, the bond can correspond to the native inter-chain disulfide bond present in native dimeric αβ TCRs. In some embodiments, the interchain disulfide bonds are not present in a native TCR. For example, in some embodiments, one or more cysteines can be incorporated into the constant region extracellular sequences of dTCR polypeptide pair. In some cases, both a native and a non-native disulfide bond may be desirable. In some embodiments, the TCR contains a transmembrane sequence to anchor to the membrane.

In some embodiments, a dTCR contains a TCR α chain containing a variable α domain, a constant α domain and a first dimerization motif attached to the C-terminus of the constant α domain, and a TCR β chain comprising a variable β domain, a constant β domain and a first dimerization motif attached to the C-terminus of the constant β domain, wherein the first and second dimerization motifs easily interact to form a covalent bond between an amino acid in the first dimerization motif and an amino acid in the second dimerization motif linking the TCR α chain and TCR β chain together.

In some embodiments, the TCR is a scTCR. Typically, a scTCR can be generated using methods known, See e.g., Soo Hoo, W. F. et al. PNAS (USA) 89, 4759 (1992); Wülfing, C. and Plückthun, A., J. Mol. Biol. 242, 655 (1994); Kurucz, I. et al. PNAS (USA) 90 3830 (1993); International published PCT Nos. WO 96/13593, WO 96/18105, WO99/60120, WO99/18129, WO 03/020763, WO2011/044186; and Schlueter, C. J. et al. J. Mol. Biol. 256, 859 (1996). In some embodiments, a scTCR contains an introduced non-native disulfide interchain bond to facilitate the association of the TCR chains (see e.g. International published PCT No. WO 03/020763). In some embodiments, a scTCR is a non-disulfide linked truncated TCR in which heterologous leucine zippers fused to the C-termini thereof facilitate chain association (see e.g. International published PCT No. WO99/60120). In some embodiments, a scTCR contain a TCRα variable domain covalently linked to a TCRβ variable domain via a peptide linker (see e.g., International published PCT No. WO99/18129).

In some embodiments, a scTCR contains a first segment constituted by an amino acid sequence corresponding to a TCR α chain variable region, a second segment constituted by an amino acid sequence corresponding to a TCR β chain variable region sequence fused to the N terminus of an amino acid sequence corresponding to a TCR β chain constant domain extracellular sequence, and a linker sequence linking the C terminus of the first segment to the N terminus of the second segment.

In some embodiments, a scTCR contains a first segment constituted by an α chain variable region sequence fused to the N terminus of an α chain extracellular constant domain sequence, and a second segment constituted by a β chain variable region sequence fused to the N terminus of a sequence β chain extracellular constant and transmembrane sequence, and, optionally, a linker sequence linking the C terminus of the first segment to the N terminus of the second segment.

In some embodiments, a scTCR contains a first segment constituted by a TCR β chain variable region sequence fused to the N terminus of a β chain extracellular constant domain sequence, and a second segment constituted by an α chain variable region sequence fused to the N terminus of a sequence α chain extracellular constant and transmembrane sequence, and, optionally, a linker sequence linking the C terminus of the first segment to the N terminus of the second segment.

In some embodiments, the linker of a scTCRs that links the first and second TCR segments can be any linker capable of forming a single polypeptide strand, while retaining TCR binding specificity. In some embodiments, the linker sequence may, for example, have the formula—P-AA-P— wherein P is proline and AA represents an amino acid sequence wherein the amino acids are glycine and serine. In some embodiments, the first and second segments are paired so that the variable region sequences thereof are orientated for such binding. Hence, in some cases, the linker has a sufficient length to span the distance between the C terminus of the first segment and the N terminus of the second segment, or vice versa, but is not too long to block or reduces bonding of the scTCR to the target ligand. In some embodiments, the linker can contain from 10 to 45 amino acids or from about 10 to about 45 amino acids, such as 10 to 30 amino acids or 26 to 41 amino acids residues, for example 29, 30, 31 or 32 amino acids. In some embodiments, the linker has the formula—PGGG-(SGGGG)5-P— wherein P is proline, G is glycine and S is serine (SEQ ID NO:38). In some embodiments, the linker has the sequence GSADDAKKDAAKKDGKS (SEQ ID NO:39). In some embodiments, the scTCR contains a covalent disulfide bond linking a residue of the immunoglobulin region of the constant domain of the α chain to a residue of the immunoglobulin region of the constant domain of the β chain. In some embodiments, the interchain disulfide bond in a native TCR is not present. For example, in some embodiments, one or more cysteines can be incorporated into the constant region extracellular sequences of the first and second segments of the scTCR polypeptide. In some cases, both a native and a non-native disulfide bond may be desirable.

In some embodiments of a dTCR or scTCR containing introduced interchain disulfide bonds, the native disulfide bonds are not present. In some embodiments, the one or more of the native cysteines forming a native interchain disulfide bonds are substituted to another residue, such as to a serine or alanine. In some embodiments, an introduced disulfide bond can be formed by mutating non-cysteine residues on the first and second segments to cysteine. Exemplary non-native disulfide bonds of a TCR are described in published International PCT No. WO2006/000830.

In some embodiments, the TCR or antigen-binding fragment thereof exhibits an affinity with an equilibrium binding constant for a target antigen of between or between about 10-5 and 10-12 M and all individual values and ranges therein. In some embodiments, the target antigen is an MHC-peptide complex or ligand.

In some embodiments, nucleic acid or nucleic acids encoding a TCR, such as α and β chains, can be amplified by PCR, cloning or other suitable means and cloned into a suitable expression vector or vectors. The expression vector can be any suitable recombinant expression vector, and can be used to transform or transfect any suitable host. Suitable vectors include those designed for propagation and expansion or for expression or both, such as plasmids and viruses.

In some embodiments, the vector can a vector of the pUC series (Fermentas Life Sciences), the pBluescript series (Stratagene, LaJolla, Calif.), the pET series (Novagen, Madison, Wis.), the pGEX series (Pharmacia Biotech, Uppsala, Sweden), or the pEX series (Clontech, Palo Alto, Calif.). In some cases, bacteriophage vectors, such as λG10, λGT11, λZapII (Stratagene), λEMBL4, and λNM1149, also can be used. In some embodiments, plant expression vectors can be used and include pBI01, pBI101.2, pBI101.3, pBI121 and pBIN19 (Clontech). In some embodiments, animal expression vectors include pEUK-C1, pMAM and pMAM-neo (Clontech). In some embodiments, a viral vector is used, such as a retroviral vector.

In some embodiments, the recombinant expression vectors can be prepared using standard recombinant DNA techniques. In some embodiments, vectors can contain regulatory sequences, such as transcription and translation initiation and termination codons, which are specific to the type of host (e.g., bacterium, fungus, plant, or animal) into which the vector is to be introduced, as appropriate and taking into consideration whether the vector is DNA- or RNA-based. In some embodiments, the vector can contain a nonnative promoter operably linked to the nucleotide sequence encoding the TCR or antigen-binding portion (or other MHC-peptide binding molecule). In some embodiments, the promoter can be a non-viral promoter or a viral promoter, such as a cytomegalovirus (CMV) promoter, an SV40 promoter, an RSV promoter, and a promoter found in the long-terminal repeat of the murine stem cell virus. Other known promoters also are contemplated.

In some embodiments, to generate a vector encoding a TCR, the α and β chains are PCR amplified from total cDNA isolated from a T cell clone expressing the TCR of interest and cloned into an expression vector. In some embodiments, the α and β chains are cloned into the same vector. In some embodiments, the α and β chains are cloned into different vectors. In some embodiments, the generated α and β chains are incorporated into a retroviral, e.g. lentiviral, vector.

B. Nucleic Acids, Vectors and Methods for Genetic Engineering

In some embodiments, the cells, e.g., T cells, are genetically engineered to express a recombinant receptor. In some embodiments, the engineering is carried out by introducing one or more polynucleotide(s) that encode the recombinant receptor or portions or components thereof. Also provided are polynucleotides encoding a recombinant receptor, and vectors or constructs containing such nucleic acids and/or polynucleotides.

In some embodiments, the polynucleotide encoding the recombinant receptor contains at least one promoter that is operatively linked to control expression of the recombinant receptor. In some examples, the polynucleotide contains two, three, or more promoters operatively linked to control expression of the recombinant receptor. In some embodiments, polynucleotide can contain regulatory sequences, such as transcription and translation initiation and termination codons, which are specific to the type of host (e.g., bacterium, fungus, plant, or animal) into which the polynucleotide is to be introduced, as appropriate and taking into consideration whether the polynucleotide is DNA- or RNA-based. In some embodiments, the polynucleotide can contain regulatory/control elements, such as a promoter, an enhancer, an intron, a polyadenylation signal, a Kozak consensus sequence, internal ribosome entry sites (IRES), a 2A sequence, and splice acceptor or donor. In some embodiments, the polynucleotide can contain a nonnative promoter operably linked to the nucleotide sequence encoding the recombinant receptor and/or one or more additional polypeptide(s). In some embodiments, the promoter is selected from among an RNA pol I, pol II or pol III promoter. In some embodiments, the promoter is recognized by RNA polymerase II (e.g., a CMV, SV40 early region or adenovirus major late promoter). In another embodiment, the promoter is recognized by RNA polymerase III (e.g., a U6 or H1 promoter). In some embodiments, the promoter can be a non-viral promoter or a viral promoter, such as a cytomegalovirus (CMV) promoter, an SV40 promoter, an RSV promoter, and a promoter found in the long-terminal repeat of the murine stem cell virus. Other known promoters also are contemplated.

In some embodiments, the promoter is or comprises a constitutive promoter. Exemplary constitutive promoters include, e.g., simian virus 40 early promoter (SV40), cytomegalovirus immediate-early promoter (CMV), human Ubiquitin C promoter (UBC), human elongation factor 1α promoter (EF1α), mouse phosphoglycerate kinase 1 promoter (PGK), and chicken β-Actin promoter coupled with CMV early enhancer (CAGG). In some embodiments, the constitutive promoter is a synthetic or modified promoter. In some embodiments, the promoter is or comprises an MND promoter, a synthetic promoter that contains the U3 region of a modified MoMuLV LTR with myeloproliferative sarcoma virus enhancer (see Challita et al. (1995) J. Virol. 69(2):748-755). In some embodiments, the promoter is a tissue-specific promoter. In another embodiment, the promoter is a viral promoter. In another embodiment, the promoter is a non-viral promoter. In some embodiments, exemplary promoters can include, but are not limited to, human elongation factor 1 alpha (EF1α) promoter or a modified form thereof or the MND promoter.

In another embodiment, the promoter is a regulated promoter (e.g., inducible promoter). In some embodiments, the promoter is an inducible promoter or a repressible promoter. In some embodiments, the promoter comprises a Lac operator sequence, a tetracycline operator sequence, a galactose operator sequence or a doxycycline operator sequence, or is an analog thereof or is capable of being bound by or recognized by a Lac repressor or a tetracycline repressor, or an analog thereof. In some embodiments, the polynucleotide does not include a regulatory element, e.g. promoter.

In some cases, the nucleic acid sequence encoding the recombinant receptor contains a signal sequence that encodes a signal peptide. In some aspects, the signal sequence may encode a signal peptide derived from a native polypeptide. In other aspects, the signal sequence may encode a heterologous or non-native signal peptide, such as the exemplary signal peptide of the GMCSFR alpha chain set forth in SEQ ID NO:40 and encoded by the nucleotide sequence set forth in SEQ ID NO:41. In some cases, the nucleic acid sequence encoding the recombinant receptor, e.g., chimeric antigen receptor (CAR) contains a signal sequence that encodes a signal peptide. Non-limiting exemplary signal peptides include, for example, the GMCSFR alpha chain signal peptide set forth in SEQ ID NO: 40 and encoded by the nucleotide sequence set forth in SEQ ID NO:40, or the CD8 alpha signal peptide set forth in SEQ ID NO:42.

In some embodiments, the polynucleotide contains a nucleic acid sequence encoding one or more additional polypeptides, e.g., one or more marker(s) and/or one or more effector molecules. In some embodiments, the one or more marker(s) includes a transduction marker, a surrogate marker and/or a resistance marker or selection marker. Among additional nucleic acid sequences introduced, e.g., encoding for one or more additional polypeptide(s), include nucleic acid sequences that can improve the efficacy of therapy, such as by promoting viability and/or function of transferred cells; nucleic acid sequences to provide a genetic marker for selection and/or evaluation of the cells, such as to assess in vivo survival or localization; nucleic acid sequences to improve safety, for example, by making the cell susceptible to negative selection in vivo as described by Lupton S. D. et al., *Mol. and Cell Biol.,* 11:6 (1991); and Riddell et al., *Human Gene Therapy* 3:319-338 (1992); see also WO 1992008796 and WO 1994028143 describing the use of bifunctional selectable fusion genes derived from fusing a dominant positive selectable marker with a negative selectable marker, and U.S. Pat. No. 6,040,177.

In some embodiments, the marker is a transduction marker or a surrogate marker. A transduction marker or a surrogate marker can be used to detect cells that have been introduced with the polynucleotide, e.g., a polynucleotide encoding a recombinant receptor. In some embodiments, the transduction marker can indicate or confirm modification of a cell. In some embodiments, the surrogate marker is a protein that is made to be co-expressed on the cell surface with the recombinant receptor, e.g. CAR. In particular embodiments, such a surrogate marker is a surface protein that has been modified to have little or no activity. In certain embodiments, the surrogate marker is encoded on the same polynucleotide that encodes the recombinant receptor. In some embodiments, the nucleic acid sequence encoding the recombinant receptor is operably linked to a nucleic acid sequence encoding a marker, optionally separated by an internal ribosome entry site (IRES), or a nucleic acid encoding a self-cleaving peptide or a peptide that causes ribosome skipping, such as a 2A sequence. Extrinsic marker genes may in some cases be utilized in connection with engineered cell to permit detection or selection of cells and, in some cases, also to promote cell elimination and/or cell suicide.

Exemplary surrogate markers can include truncated forms of cell surface polypeptides, such as truncated forms that are non-functional and to not transduce or are not capable of transducing a signal or a signal ordinarily transduced by the full-length form of the cell surface polypeptide, and/or do not or are not capable of internalizing. Exemplary truncated cell surface polypeptides including truncated forms of growth factors or other receptors such as a truncated human epidermal growth factor receptor 2 (tHER2), a truncated epidermal growth factor receptor (tEGFR, exemplary tEGFR sequence set forth in SEQ ID NO: 43 or 44) or a prostate-specific membrane antigen (PSMA) or modified form thereof, such as a truncated PSMA (tPSMA). In some aspects, tEGFR may contain an epitope recognized by the antibody cetuximab (Erbitux®) or other therapeutic anti-EGFR antibody or binding molecule, which can be used to identify or select cells that have been engineered with the tEGFR construct and an encoded exogenous protein, and/or to eliminate or separate cells expressing the encoded exogenous protein. See U.S. Pat. No. 8,802,374 and Liu et al., Nature Biotech. 2016 April; 34(4): 430-434). In some aspects, the marker, e.g. surrogate marker, includes all or part (e.g., truncated form) of CD34, a NGFR, a CD19 or a truncated CD19, e.g., a truncated non-human CD19. An exemplary polypeptide for a truncated EGFR (e.g. tEGFR) comprises the sequence of amino acids set forth in SEQ ID NO: 43 or 44 or a sequence of amino acids that exhibits at least 85%, 86%, 87%, 88%, 89%, 90%, 91%, 92%, 93%, 94%, 95%, 96%, 97%, 98%, 99% or more sequence identity to SEQ ID NO: 43 or 44.

In some embodiments, the marker is or comprises a detectable protein, such as a fluorescent protein, such as green fluorescent protein (GFP), enhanced green fluorescent protein (EGFP), such as super-fold GFP (sfGFP), red fluorescent protein (RFP), such as tdTomato, mCherry, mStrawberry, AsRed2, DsRed or DsRed2, cyan fluorescent protein (CFP), blue green fluorescent protein (BFP), enhanced blue fluorescent protein (EBFP), and yellow fluorescent protein (YFP), and variants thereof, including species variants, monomeric variants, codon-optimized, stabilized and/or enhanced variants of the fluorescent proteins. In some embodiments, the marker is or comprises an enzyme, such as a luciferase, the lacZ gene from *E. coli*, alkaline phosphatase, secreted embryonic alkaline phosphatase (SEAP), chloramphenicol acetyl transferase (CAT). Exemplary light-emitting reporter genes include luciferase (luc), β-galactosidase, chloramphenicol acetyltransferase (CAT), β-glucuronidase (GUS) or variants thereof. In some aspects, expression of the enzyme can be detected by addition of a substrate that can be detected upon the expression and functional activity of the enzyme.

In some embodiments, the marker is a resistance maker or selection marker. In some embodiments, the resistance maker or selection marker is or comprises a polypeptide that confers resistance to exogenous agents or drugs. In some embodiments, the resistance marker or selection marker is an antibiotic resistance gene. In some embodiments, the resistance marker or selection marker is an antibiotic resistance gene confers antibiotic resistance to a mammalian cell. In some embodiments, the resistance marker or selection marker is or comprises a Puromycin resistance gene, a Hygromycin resistance gene, a Blasticidin resistance gene, a Neomycin resistance gene, a Geneticin resistance gene or a Zeocin resistance gene or a modified form thereof.

Any of the recombinant receptors and/or the additional polypeptide(s) described herein can be encoded by one or more polynucleotides containing one or more nucleic acid sequences encoding recombinant receptors, in any combinations, orientation or arrangements. For example, one, two, three or more polynucleotides can encode one, two, three or more different polypeptides, e.g., recombinant receptors or portions or components thereof, and/or one or more additional polypeptide(s), e.g., a marker and/or an effector molecule. In some embodiments, one polynucleotide contains a nucleic acid sequence encoding a recombinant receptor, e.g., CAR, or portion or components thereof, and a nucleic acid sequence encoding one or more additional polypeptide(s). In some embodiments, one vector or construct contains a nucleic acid sequence encoding a recombinant receptor, e.g., CAR, or portion or components thereof, and a separate vector or construct contains a nucleic acid sequence encoding one or more additional polypeptide(s). In some embodiments, the nucleic acid sequence encoding the recombinant receptor and the nucleic acid sequence encoding the one or more additional polypeptide(s) are operably linked to two different promoters. In some embodiments, the nucleic acid encoding the recombinant receptor is present upstream of the nucleic acid encoding the one or more additional polypeptide(s). In some embodiments, the nucleic acid encoding the recombinant receptor is present downstream of the nucleic acid encoding one or more additional polypeptide(s).

In certain cases, one polynucleotide contains nucleic acid sequences encode two or more different polypeptide chains, e.g., a recombinant receptor and one or more additional polypeptide(s), e.g., a marker and/or an effector molecule. In some embodiments, the nucleic acid sequences encoding two or more different polypeptide chains, e.g., a recombinant receptor and one or more additional polypeptide(s), are present in two separate polynucleotides. For example, two separate polynucleotides are provided, and each can be individually transferred or introduced into the cell for expression in the cell. In some embodiments, the nucleic acid sequences encoding the marker and the nucleic acid sequences encoding the recombinant receptor are present or inserted at different locations within the genome of the cell. In some embodiments, the nucleic acid sequences encoding the marker and the nucleic acid sequences encoding the recombinant receptor are operably linked to two different promoters.

In some embodiments, such as those where the polynucleotide contains a first and second nucleic acid sequence, the coding sequences encoding each of the different polypeptide chains can be operatively linked to a promoter, which can be the same or different. In some embodiments, the nucleic acid molecule can contain a promoter that drives the expression of two or more different polypeptide chains. In some embodiments, such nucleic acid molecules can be multicistronic (bicistronic or tricistronic, see e.g., U.S. Pat. No. 6,060,273). In some embodiments, the nucleic acid sequences encoding the recombinant receptor and the nucleic acid sequences encoding the one or more additional polypeptide(s) are operably linked to the same promoter and are optionally separated by an internal ribosome entry site (IRES), or a nucleic acid encoding a self-cleaving peptide or a peptide that causes ribosome skipping, such as a 2A element. For example, an exemplary marker, and optionally a ribosome skipping sequence sequence, can be any as disclosed in PCT Pub. No. WO2014031687.

In some embodiments, transcription units can be engineered as a bicistronic unit containing an IRES, which allows coexpression of gene products (e.g. encoding the recombinant receptor and the additional polypeptide) by a message from a single promoter. Alternatively, in some cases, a single promoter may direct expression of an RNA that contains, in a single open reading frame (ORF), two or three genes (e.g. encoding the marker and encoding the recombinant receptor) separated from one another by sequences encoding a self-cleavage peptide (e.g., 2A sequences) or a protease recognition site (e.g., furin). The ORF thus encodes a single polypeptide, which, either during (in the case of 2A) or after translation, is processed into the individual proteins. In some cases, the peptide, such as a T2A, can cause the ribosome to skip (ribosome skipping) synthesis of a peptide bond at the C-terminus of a 2A element, leading to separation between the end of the 2A sequence and the next peptide downstream (see, e.g., de Felipe, Genetic Vaccines and Ther. 2:13 (2004) and de Felipe et al. Traffic 5:616-626 (2004)). Various 2A elements are known. Examples of 2A sequences that can be used in the methods and system disclosed herein, without limitation, 2A sequences from the foot-and-mouth disease virus (F2A, e.g., SEQ ID NO: 45), equine rhinitis A virus (E2A, e.g., SEQ ID NO: 46), Thosea asigna virus (T2A, e.g., SEQ ID NO: 47 or 48), and porcine teschovirus-1 (P2A, e.g., SEQ ID NO: 49 or 50) as described in U.S. Patent Pub. No. 20070116690.

In some embodiments, the polynucleotide encoding the recombinant receptor and/or additional polypeptide is contained in a vector or can be cloned into one or more vector(s). In some embodiments, the one or more vector(s) can be used to transform or transfect a host cell, e.g., a cell for engineering. Exemplary vectors include vectors designed for introduction, propagation and expansion or for expression or both, such as plasmids and viral vectors. In some aspects, the vector is an expression vector, e.g., a recombinant expression vector. In some embodiments, the recombinant expression vectors can be prepared using standard recombinant DNA techniques.

In some embodiments, the vector can be a vector of the pUC series (Fermentas Life Sciences), the pBluescript series (Stratagene, LaJolla, Calif.), the pET series (Novagen, Madison, Wis.), the pGEX series (Pharmacia Biotech, Uppsala, Sweden), or the pEX series (Clontech, Palo Alto, Calif.). In some cases, bacteriophage vectors, such as λG10, λGT11, λZapII (Stratagene), λEMBL4, and λNM1149, also can be used. In some embodiments, plant expression vectors can be used and include pBI01, pBI101.2, pBI101.3, pBI121 and pBIN19 (Clontech). In some embodiments, animal expression vectors include pEUK-Cl, pMAM and pMAM-neo (Clontech).

In some embodiments, the vector is a viral vector, such as a retroviral vector. In some embodiments, the polynucleotide encoding the recombinant receptor and/or additional polypeptide(s) are introduced into the cell via retroviral or lentiviral vectors, or via transposons (see, e.g., Baum et al. (2006) Molecular Therapy: The Journal of the American Society of Gene Therapy. 13:1050-1063; Frecha et al. (2010) Molecular Therapy 18:1748-1757; and Hackett et al. (2010) Molecular Therapy 18:674-683).

In some embodiments, one or more polynucleotide(s) are introduced into cells using recombinant infectious virus particles, such as, e.g., vectors derived from simian virus 40 (SV40), adenoviruses, adeno-associated virus (AAV). In some embodiments, one or more polynucleotide(s) are introduced into T cells using recombinant lentiviral vectors or retroviral vectors, such as gamma-retroviral vectors (see, e.g., Koste et al. (2014) Gene Therapy 2014 Apr. 3. doi: 10.1038/gt.2014.25; Carlens et al. (2000) Exp Hematol 28(10): 1137-46; Alonso-Camino et al. (2013) Mol Ther Nucl Acids 2, e93; Park et al., Trends Biotechnol. 2011 Nov. 29(11): 550-557.

In some embodiments, the vector is a retroviral vector. In some aspects, a retroviral vector has a long terminal repeat sequence (LTR), e.g., a retroviral vector derived from the Moloney murine leukemia virus (MoMLV), myeloproliferative sarcoma virus (MPSV), murine embryonic stem cell virus (MESV), murine stem cell virus (MSCV), spleen focus forming virus (SFFV), or adeno-associated virus (AAV). Most retroviral vectors are derived from murine retroviruses. In some embodiments, the retroviruses include those derived from any avian or mammalian cell source. The retroviruses typically are amphotropic, meaning that they are capable of infecting host cells of several species, including humans. In one embodiment, the gene to be expressed replaces the retroviral gag, pol and/or env sequences. A number of illustrative retroviral systems have been described (e.g., U.S. Pat. Nos. 5,219,740; 6,207,453; 5,219, 740; Miller and Rosman (1989) BioTechniques 7:980-990; Miller, A. D. (1990) Human Gene Therapy 1:5-14; Scarpa et al. (1991) Virology 180:849-852; Burns et al. (1993) Proc. Natl. Acad. Sci. USA 90:8033-8037; and Boris-Lawrie and Temin (1993) Cur. Opin. Genet. Develop. 3:102-109.

Methods of lentiviral transduction are known. Exemplary methods are described in, e.g., Wang et al. (2012) J. Immunother. 35(9): 689-701; Cooper et al. (2003) Blood. 101: 1637-1644; Verhoeyen et al. (2009) Methods Mol Biol. 506: 97-114; and Cavalieri et al. (2003) Blood. 102(2): 497-505. In some embodiments, the polynucleotide encoding the recombinant receptor and/or one or more additional polypeptide(s), is introduced into a composition containing cultured cells, such as by retroviral transduction, transfection, or transformation.

In some embodiments, one or more polynucleotide(s) are introduced into a T cell using electroporation (see, e.g., Chicaybam et al, (2013) PLoS ONE 8(3): e60298 and Van Tedeloo et al. (2000) Gene Therapy 7(16): 1431-1437). In some embodiments, recombinant nucleic acids are transferred into T cells via transposition (see, e.g., Manuri et al. (2010) Hum Gene Ther 21(4): 427-437; Sharma et al. (2013) Molec Ther Nucl Acids 2, e74; and Huang et al. (2009) Methods Mol Biol 506: 115-126). Other methods of introducing and expressing genetic material, e.g., polynucleotides and/or vectors, into immune cells include calcium phosphate transfection (e.g., as described in Current Protocols in Molecular Biology, John Wiley & Sons, New York. N.Y.), protoplast fusion, cationic liposome-mediated transfection; tungsten particle-facilitated microparticle bombardment (Johnston, Nature, 346: 776-777 (1990)); and strontium phosphate DNA co-precipitation (Brash et al., Mol. Cell Biol., 7: 2031-2034 (1987) and other approaches described in, e.g., International Pat. App. Pub. No. WO 2014055668, and U.S. Pat. No. 7,446,190.

In some embodiments, the one or more polynucleotide(s) or vector(s) encoding a recombinant receptor and/or additional polypeptide(s) may be introduced into cells, e.g., T cells, either during or after expansion. This introduction of the polynucleotide(s) or vector(s) can be carried out with any suitable retroviral vector, for example. Resulting genetically engineered cells can then be liberated from the initial stimulus (e.g., anti-CD3/anti-CD28 stimulus) and subsequently be stimulated in the presence of a second type of stimulus (e.g., via a de novo introduced recombinant receptor). This second type of stimulus may include an antigenic stimulus in form of a peptide/MHC molecule, the cognate (cross-linking) ligand of the genetically introduced receptor (e.g. natural antigen and/or ligand of a CAR) or any ligand (such as an antibody) that directly binds within the framework of the new receptor (e.g. by recognizing constant regions within the receptor). See, for example, Cheadle et al, "Chimeric antigen receptors for T-cell based therapy" Methods Mol Biol. 2012; 907:645-66 or Barrett et al., Chimeric Antigen Receptor Therapy for Cancer Annual Review of Medicine Vol. 65: 333-347 (2014).

In some cases, a vector may be used that does not require that the cells, e.g., T cells, are activated. In some such instances, the cells may be selected and/or transduced prior to activation. Thus, the cells may be engineered prior to, or subsequent to culturing of the cells, and in some cases at the same time as or during at least a portion of the culturing.

V. COMPOSITIONS, FORMULATIONS AND METHODS OF ADMINISTRATION

Also provided are compositions containing the stimulated and selected cells, optionally genetically engineered (e.g., engineered antigen receptor), such as CAR or TCR, and compositions containing the cells, including pharmaceutical compositions and formulations. Also provided are methods of using and uses of the compositions, such as in the treatment of diseases, conditions, and disorders in which the antigen is expressed, or in detection, diagnostic, and prognostic methods.

A. Compositions/Formulations

The term "pharmaceutical formulation" refers to a preparation which is in such form as to permit the biological activity of an active ingredient contained therein to be effective, and which contains no additional components which are unacceptably toxic to a subject to which the formulation would be administered.

A "pharmaceutically acceptable carrier" refers to an ingredient in a pharmaceutical formulation, other than an active ingredient, which is nontoxic to a subject. A pharmaceutically acceptable carrier includes, but is not limited to, a buffer, excipient, stabilizer, or preservative.

In some aspects, the choice of carrier is determined in part by the particular cell and/or by the method of administration. Accordingly, there are a variety of suitable formulations. For example, the pharmaceutical composition can contain preservatives. Suitable preservatives may include, for example, methylparaben, propylparaben, sodium benzoate, and benzalkonium chloride. In some aspects, a mixture of two or more preservatives is used. The preservative or mixtures thereof are typically present in an amount of about 0.0001% to about 2% by weight of the total composition. Carriers are described, e.g., by Remington's Pharmaceutical Sciences 16th edition, Osol, A. Ed. (1980). Pharmaceutically acceptable carriers are generally nontoxic to recipients at the dosages and concentrations employed, and include, but are not limited to: buffers such as phosphate, citrate, and other organic acids; antioxidants including ascorbic acid and methionine; preservatives (such as octadecyldimethylbenzyl ammonium chloride; hexamethonium chloride; benzalkonium chloride; benzethonium chloride; phenol, butyl or benzyl alcohol; alkyl parabens such as methyl or propyl paraben; catechol; resorcinol; cyclohexanol; 3-pentanol; and m-cresol); low molecular weight (less than about 10 residues) polypeptides; proteins, such as serum albumin, gelatin, or immunoglobulins; hydrophilic polymers such as polyvinylpyrrolidone; amino acids such as glycine, glutamine, asparagine, histidine, arginine, or lysine; monosaccharides, disaccharides, and other carbohydrates including glucose, mannose, or dextrins; chelating agents such as EDTA; sugars such as sucrose, mannitol, trehalose or sorbitol; salt-forming counter-ions such as sodium; metal complexes (e.g. Zn-protein complexes); and/or non-ionic surfactants such as polyethylene glycol (PEG).

Buffering agents in some aspects are included in the compositions. Suitable buffering agents include, for example, citric acid, sodium citrate, phosphoric acid, potassium phosphate, and various other acids and salts. In some aspects, a mixture of two or more buffering agents is used. The buffering agent or mixtures thereof are typically present in an amount of about 0.001% to about 4% by weight of the total composition. Methods for preparing administrable pharmaceutical compositions are known. Exemplary methods are described in more detail in, for example, Remington: The Science and Practice of Pharmacy, Lippincott Williams & Wilkins; 21st ed. (May 1, 2005).

The formulation or composition may also contain more than one active ingredient useful for the particular indication, disease, or condition being treated with the cells, preferably those with activities complementary to the cell, where the respective activities do not adversely affect one another. Such active ingredients are suitably present in combination in amounts that are effective for the purpose intended. Thus, in some embodiments, the pharmaceutical composition further includes other pharmaceutically active agents or drugs, such as chemotherapeutic agents, e.g., asparaginase, busulfan, carboplatin, cisplatin, daunorubicin, doxorubicin, fluorouracil, gemcitabine, hydroxyurea, methotrexate, paclitaxel, rituximab, vinblastine, vincristine, etc. In some embodiments, the cells or antibodies are administered in the form of a salt, e.g., a pharmaceutically acceptable salt. Suitable pharmaceutically acceptable acid addition salts include those derived from mineral acids, such as hydrochloric, hydrobromic, phosphoric, metaphosphoric, nitric, and sulphuric acids, and organic acids, such as tartaric, acetic, citric, malic, lactic, fumaric, benzoic, glycolic, gluconic, succinic, and arylsulphonic acids, for example, p-toluenesulphonic acid.

Active ingredients may be entrapped in microcapsules, in colloidal drug delivery systems (for example, liposomes, albumin microspheres, microemulsions, nano-particles and nanocapsules) or in macroemulsions. In certain embodiments, the pharmaceutical composition is formulated as an inclusion complex, such as cyclodextrin inclusion complex, or as a liposome. Liposomes can serve to target the host cells (e.g., T-cells or NK cells) to a particular tissue. Many methods are available for preparing liposomes, such as those described in, for example, Szoka et al., Ann. Rev. Biophys. Bioeng., 9: 467 (1980), and U.S. Pat. Nos. 4,235,871, 4,501,728, 4,837,028, and 5,019,369.

The pharmaceutical composition in some aspects can employ time-released, delayed release, and sustained release delivery systems such that the delivery of the composition occurs prior to, and with sufficient time to cause, sensitization of the site to be treated. Many types of release delivery systems are available and known. Such systems can avoid repeated administrations of the composition, thereby increasing convenience to the subject and the physician.

The pharmaceutical composition in some embodiments contains cells in amounts effective to treat or prevent the disease or condition, such as a therapeutically effective or prophylactically effective amount. Therapeutic or prophylactic efficacy in some embodiments is monitored by periodic assessment of treated subjects. For repeated administrations over several days or longer, depending on the condition, the treatment is repeated until a desired suppression of disease symptoms occurs. However, other dosage regimens may be useful and can be determined. The desired dosage can be delivered by a single bolus administration of the composition, by multiple bolus administrations of the composition, or by continuous infusion administration of the composition.

The cells may be administered using standard administration techniques, formulations, and/or devices. Provided are formulations and devices, such as syringes and vials, for storage and administration of the compositions. Administration of the cells can be autologous or heterologous. For example, immunoresponsive cells or progenitors can be obtained from one subject, and administered to the same subject or a different, compatible subject. Peripheral blood derived immunoresponsive cells or their progeny (e.g., in vivo, ex vivo or in vitro derived) can be administered via localized injection, including catheter administration, systemic injection, localized injection, intravenous injection, or parenteral administration. When administering a therapeutic composition (e.g., a pharmaceutical composition containing a genetically modified immunoresponsive cell), it will generally be formulated in a unit dosage injectable form (solution, suspension, emulsion).

Formulations include those for oral, intravenous, intraperitoneal, subcutaneous, pulmonary, transdermal, intramuscular, intranasal, buccal, sublingual, or suppository administration. In some embodiments, the cell populations are administered parenterally. The term "parenteral," as used herein, includes intravenous, intramuscular, subcutaneous, rectal, vaginal, and intraperitoneal administration. In some embodiments, the cell populations are administered to a subject using peripheral systemic delivery by intravenous, intraperitoneal, or subcutaneous injection.

Compositions in some embodiments are provided as sterile liquid preparations, e.g., isotonic aqueous solutions, suspensions, emulsions, dispersions, or viscous compositions, which may in some aspects be buffered to a selected pH. Liquid preparations are normally easier to prepare than gels, other viscous compositions, and solid compositions. Additionally, liquid compositions are somewhat more convenient to administer, especially by injection. Viscous compositions, on the other hand, can be formulated within the appropriate viscosity range to provide longer contact periods with specific tissues. Liquid or viscous compositions can comprise carriers, which can be a solvent or dispersing medium containing, for example, water, saline, phosphate buffered saline, polyoi (for example, glycerol, propylene glycol, liquid polyethylene glycol) and suitable mixtures thereof.

Sterile injectable solutions can be prepared by incorporating the cells in a solvent, such as in admixture with a suitable carrier, diluent, or excipient such as sterile water, physiological saline, glucose, dextrose, or the like. The compositions can also be lyophilized. The compositions can contain auxiliary substances such as wetting, dispersing, or emulsifying agents (e.g., methylcellulose), pH buffering agents, gelling or viscosity enhancing additives, preservatives, flavoring agents, colors, and the like, depending upon the route of administration and the preparation desired. Standard texts may in some aspects be consulted to prepare suitable preparations.

Various additives which enhance the stability and sterility of the compositions, including antimicrobial preservatives, antioxidants, chelating agents, and buffers, can be added. Prevention of the action of microorganisms can be ensured by various antibacterial and antifungal agents, for example, parabens, chlorobutanol, phenol, sorbic acid, and the like. Prolonged absorption of the injectable pharmaceutical form can be brought about by the use of agents delaying absorption, for example, aluminum monostearate and gelatin.

Sustained-release preparations may be prepared. Suitable examples of sustained-release preparations include semipermeable matrices of solid hydrophobic polymers containing the antibody, which matrices are in the form of shaped articles, e.g. films, or microcapsules.

The formulations to be used for in vivo administration are generally sterile. Sterility may be readily accomplished, e.g., by filtration through sterile filtration membranes.

B. Methods of Administration

Provided are methods of administering the cells, populations, and compositions, and uses of such cells, populations, and compositions to treat or prevent diseases, conditions, and disorders, including cancers. Also provided are methods of using and uses of the cells, populations, and compositions, and uses of such cells, populations, and compositions to treat or prevent diseases, conditions, and disorders, including cancers. In particular embodiments, the cells, populations and compositions are those as produced and engineered in accord with any of the provided methods. In some embodiments, the cells, populations, and compositions are administered to a subject or patient having the particular disease or condition to be treated, e.g., via adoptive cell therapy, such as adoptive T cell therapy. In some embodiments, cells and compositions prepared by the provided methods, such as engineered compositions and end-of-production compositions following incubation and/or other processing steps, are administered to a subject, such as a subject having or at risk for the disease or condition. In some aspects, the methods thereby treat, e.g., ameliorate one or more symptom of, the disease or condition, such as by lessening tumor burden in a cancer expressing an antigen recognized by an engineered T cell.

Such methods and uses include therapeutic methods and uses, for example, involving administration of cells and compositions prepared by the provided methods, such as engineered compositions and end-of-production compositions following incubation and/or other processing steps, to a subject having a disease, condition or disorder, such as a cancer, to effect treatment of the disease or disorder. Uses include uses of the compositions in such methods and treatments, and uses of such compositions in the preparation of a medicament in order to carry out such therapeutic methods. In some embodiments, the methods and uses thereby treat the disease or condition or disorder, such as a tumor or cancer, in the subject.

Methods for administration of cells for adoptive cell therapy are known and may be used in connection with the provided methods and compositions. For example, adoptive T cell therapy methods are described, e.g., in US Patent Application Publication No. 2003/0170238 to Gruenberg et al; U.S. Pat. No. 4,690,915 to Rosenberg; Rosenberg (2011) Nat Rev Clin Oncol. 8(10):577-85). See, e.g., Themeli et al. (2013) *Nat Biotechnol.* 31(10): 928-933; Tsukahara et al. (2013) *Biochem Biophys Res Commun* 438(1): 84-9; Davila et al. (2013) *PLoS ONE* 8(4): e61338.

As used herein, a "subject" is a mammal, such as a human or other animal, and typically is human. In some embodiments, the subject, e.g., patient, to whom the cells, cell populations, or compositions are administered is a mammal, typically a primate, such as a human. In some embodiments, the primate is a monkey or an ape. The subject can be male or female and can be any suitable age, including infant, juvenile, adolescent, adult, and geriatric subjects. In some embodiments, the subject is a non-primate mammal, such as a rodent.

As used herein, "treatment" (and grammatical variations thereof such as "treat" or "treating") refers to complete or partial amelioration or reduction of a disease or condition or disorder, or a symptom, adverse effect or outcome, or phenotype associated therewith. Desirable effects of treatment include, but are not limited to, preventing occurrence or recurrence of disease, alleviation of symptoms, diminishment of any direct or indirect pathological consequences of the disease, preventing metastasis, decreasing the rate of disease progression, amelioration or palliation of the disease state, and remission or improved prognosis. The terms do not imply complete curing of a disease or complete elimination of any symptom or effect(s) on all symptoms or outcomes.

As used herein, "delaying development of a disease" means to defer, hinder, slow, retard, stabilize, suppress and/or postpone development of the disease (such as cancer). This delay can be of varying lengths of time, depending on the history of the disease and/or individual being treated. As is evident to one skilled in the art, a sufficient or significant delay can, in effect, encompass prevention, in that the individual does not develop the disease. For example, a late stage cancer, such as development of metastasis, may be delayed.

"Preventing," as used herein, includes providing prophylaxis with respect to the occurrence or recurrence of a disease in a subject that may be predisposed to the disease but has not yet been diagnosed with the disease. In some embodiments, the provided cells and compositions are used to delay development of a disease or to slow the progression of a disease.

As used herein, to "suppress" a function or activity is to reduce the function or activity when compared to otherwise same conditions except for a condition or parameter of interest, or alternatively, as compared to another condition. For example, cells that suppress tumor growth reduce the rate of growth of the tumor compared to the rate of growth of the tumor in the absence of the cells.

An "effective amount" of an agent, e.g., a pharmaceutical formulation, cells, or composition, in the context of administration, refers to an amount effective, at dosages/amounts and for periods of time necessary, to achieve a desired result, such as a therapeutic or prophylactic result.

A "therapeutically effective amount" of an agent, e.g., a pharmaceutical formulation or cells, refers to an amount effective, at dosages and for periods of time necessary, to achieve a desired therapeutic result, such as for treatment of a disease, condition, or disorder, and/or pharmacokinetic or pharmacodynamic effect of the treatment. The therapeutically effective amount may vary according to factors such as the disease state, age, sex, and weight of the subject, and the populations of cells administered. In some embodiments, the provided methods involve administering the cells and/or compositions at effective amounts, e.g., therapeutically effective amounts.

A "prophylactically effective amount" refers to an amount effective, at dosages and for periods of time necessary, to achieve the desired prophylactic result. Typically but not necessarily, since a prophylactic dose is used in subjects prior to or at an earlier stage of disease, the prophylactically effective amount will be less than the therapeutically effective amount.

The disease or condition that is treated can be any in which expression of an antigen is associated with and/or involved in the etiology of a disease condition or disorder, e.g. causes, exacerbates or otherwise is involved in such disease, condition, or disorder. Exemplary diseases and conditions can include diseases or conditions associated with malignancy or transformation of cells (e.g. cancer), autoimmune or inflammatory disease, or an infectious disease, e.g. caused by a bacterial, viral or other pathogen. Exemplary antigens, which include antigens associated with various diseases and conditions that can be treated, are described above. In particular embodiments, the chimeric antigen receptor or transgenic TCR specifically binds to an antigen associated with the disease or condition.

Thus, the provided methods and uses include methods and uses for adoptive cell therapy. In some embodiments, the methods include administration of the cells or a composition containing the cells to a subject, tissue, or cell, such as one having, at risk for, or suspected of having the disease, condition or disorder. In some embodiments, the cells, populations, and compositions are administered to a subject having the particular disease or condition to be treated, e.g., via adoptive cell therapy, such as adoptive T cell therapy. In some embodiments, the cells or compositions are administered to the subject, such as a subject having or at risk for the disease or condition, ameliorate one or more symptom of the disease or condition.

In some embodiments, the cell therapy, e.g., adoptive T cell therapy, is carried out by autologous transfer, in which the cells are isolated and/or otherwise prepared from the subject who is to receive the cell therapy, or from a sample derived from such a subject. Thus, in some aspects, the cells are derived from a subject, e.g., patient, in need of a treatment and the cells, following isolation and processing are administered to the same subject.

In some embodiments, the cell therapy, e.g., adoptive T cell therapy, is carried out by allogeneic transfer, in which the cells are isolated and/or otherwise prepared from a subject other than a subject who is to receive or who ultimately receives the cell therapy, e.g., a first subject. In such embodiments, the cells then are administered to a different subject, e.g., a second subject, of the same species. In some embodiments, the first and second subjects are genetically identical. In some embodiments, the first and second subjects are genetically similar. In some embodiments, the second subject expresses the same HLA class or supertype as the first subject. The cells can be administered by any suitable means. Dosing and administration may depend in part on whether the administration is brief or chronic. Various dosing schedules include but are not limited to single or multiple administrations over various timepoints, bolus administration, and pulse infusion.

In certain embodiments, the cells, or individual populations of sub-types of cells, are administered to the subject at a range of about one million to about 100 billion cells and/or that amount of cells per kilogram of body weight, such as, e.g., 1 million to about 50 billion cells (e.g., about 5 million cells, about 25 million cells, about 500 million cells, about 1 billion cells, about 5 billion cells, about 20 billion cells, about 30 billion cells, about 40 billion cells, or a range defined by any two of the foregoing values), such as about 10 million to about 100 billion cells (e.g., about 20 million cells, about 30 million cells, about 40 million cells, about 60 million cells, about 70 million cells, about 80 million cells, about 90 million cells, about 10 billion cells, about 25 billion cells, about 50 billion cells, about 75 billion cells, about 90 billion cells, or a range defined by any two of the foregoing values), and in some cases about 100 million cells to about 50 billion cells (e.g., about 120 million cells, about 250 million cells, about 350 million cells, about 450 million cells, about 650 million cells, about 800 million cells, about 900 million cells, about 3 billion cells, about 30 billion cells, about 45 billion cells) or any value in between these ranges and/or per kilogram of body weight. Again, dosages may vary depending on attributes particular to the disease or disorder and/or patient and/or other treatments. In some embodiments, the cells are administered as part of a combination treatment, such as simultaneously with or sequentially with, in any order, another therapeutic intervention, such as an antibody or engineered cell or receptor or agent, such as a cytotoxic or therapeutic agent. The cells in some embodiments are co-administered with one or more additional therapeutic agents or in connection with another therapeutic intervention, either simultaneously or sequentially in any order. In some contexts, the cells are co-administered with another therapy sufficiently close in time such that the cell populations enhance the effect of one or more additional therapeutic agents, or vice versa. In some embodiments, the cells are administered prior to the one or more additional therapeutic agents. In some embodiments, the cells are administered after the one or more therapeutic agents. In some embodiments, the one or more additional agents include a cytokine, such as IL-2, for example, to enhance persistence. In some embodiments, the methods comprise administration of a chemotherapeutic agent.

Following administration of the cells, the biological activity of the engineered cell populations in some embodiments is measured, e.g., by any of a number of known methods. Parameters to assess include specific binding of an engineered or natural T cell or other immune cell to antigen, in vivo, e.g., by imaging, or ex vivo, e.g., by ELISA or flow cytometry. In certain embodiments, the ability of the engineered cells to destroy target cells can be measured using any suitable method known in the art, such as cytotoxicity assays described in, for example, Kochenderfer et al., J. Immunotherapy, 32(7): 689-702 (2009), and Herman et al. J. Immunological Methods, 285(1): 25-40 (2004). In certain embodiments, the biological activity of the cells is measured by assaying expression and/or secretion of one or more cytokines, such as CD 107a, IFNγ, IL-2, and TNF. In some aspects the biological activity is measured by assessing clinical outcome, such as reduction in tumor burden or load.

In certain embodiments, the engineered cells are further modified in any number of ways, such that their therapeutic or prophylactic efficacy is increased. For example, the engineered CAR or TCR expressed by the population can be conjugated either directly or indirectly through a linker to a targeting moiety. The practice of conjugating compounds, e.g., the CAR or TCR, to targeting moieties is known in the art. See, for instance, Wadwa et al., J. Drug Targeting 3: 1 1 1 (1995), and U.S. Pat. No. 5,087,616.

VI. APPARATUS AND ARTICLES OF MANUFACTURES

In some embodiments, also provided is an apparatus or article of manufacture. Provided herein is an apparatus including a stationary phase that is an affinity chromatography matrix, for carrying out any of the provided methods. In some embodiments, the stationary phase is comprised in a chromatography column. The arrangement may further comprise a second stationary phase which is fluidly connected to the first stationary phase. The secondary stationary phase may be a gel filtration matrix and/or affinity chromatography matrix, wherein the gel filtration and/or affinity chromatography matrix comprises a selection reagent, thereby being suitable of immobilizing the multimerization reagent on the stationary phase. This type of arrangement may facilitate sequential selection of target cells (e.g., T cells, CD4, CD3, CD8 T cells) wherein one of the columns is also suitable for on-column stimulation as described herein.

In some embodiments, the apparatus contains an arrangement including a stationary phase that is an affinity chromatography matrix for chromatography (e.g., column chromatography). In some embodiments, the stationary phase has a selection reagent, such as described herein, immobilized thereon. In some embodiments, the arrangement includes two such stationary phases for affinity chromatography (e.g., column chromatography) in parallel for selection and on-column stimulation as described herein. In some embodiments, the arrangement includes two such stationary phases for affinity chromatography (e.g., column chromatography) for sequential selection and on-column stimulation as described herein. In some embodiments, the arrangement includes more than two columns which can be arranged to carry out parallel and sequential selection, on-column stimulation, or polishing. For example, two columns in parallel may be arranged such that the output of the columns is fed to a column for sequential selection.

In some embodiments, the apparatus contains an arrangement of stationary phases (e.g., as described above) and a device (e.g., centrifugal chamber) for washing and transducing selected and stimulated cells collected from the stationary phases.

The invention is further directed in some embodiments to an apparatus for purification (e.g. selection and on-column stimulation) and culture, such as stimulation or expansion, of a composition of cells, the apparatus comprising at least one arrangement of a bioreactor and a first stationary phase or a second stationary phase for chromatography as defined above. In some embodiments, provided is an arrangement of a stationary phase for chromatography and a bioreactor. The bioreactor is suitable for the expansion of cells, and the stationary phase is suitable for cell separation and on-column stimulation. For example, selected and stimulated cells from the stationary phase may be washed, transduced, and placed in a bioreactor for expansion. In embodiments, the stationary phase is a gel filtration matrix and/or affinity chromatography matrix, wherein the gel filtration and/or affinity chromatography matrix comprises a selection reagent, wherein the selection reagent comprises a binding site Z1 specifically binding to a binding partner C1 comprised in a selection agent and/or the selection reagent comprises a binding site Z2 specifically binding to a binding partner C2 comprised in a second selection agent. The stationary phase is thereby suitable for immobilizing thereon the first selection agent and/or the second selection agent, the first binding partner C1 and/or the second binding partner C2. In addition the bioreactor and the stationary phase are fluidly connected. In some embodiments, the stationary phase may be connected to the bioreactor via a device for washing and transducing steps. This arrangement can be used in a serial expansion and can be integrated into known cell expansion systems such as the Quantum® cell expansion system) or the Xuri Cell Expansion System W25. In some embodiments, the bioreactor is connect to a device, for example, but not limited to, an Ovizio iLine F (Ovizio Imaging Systems NV/SA, Brussels, Belgium, to monitor cell health and phenotype (see Section I-E-3α).

In some embodiments, the arrangement further includes stationary phases for polishing (see, e.g., Section I-I). In some embodiments, the stationary phases are affinity chromatography matrix for chromatography (e.g., column chromatography). In some embodiments, the o stationary phases for polishing have a selection reagent, such as described herein, immobilized thereon, to facilitate cell selection. In some embodiments, the arrangement further includes a device (e.g., centrifugal chamber) for washing, formulating, and filling of the therapeutic composition into suitable containers, for example as described herein.

In some embodiments, the components of the arrangement are connect by tubing. In some embodiments, the components of the arrangement are connect by welding. In some embodiments, the connections (e.g., tubing and/or welding) between the components of the arrangement are sterile.

In some embodiments, the arrangement is embodied in an apparatus. The apparatus may further comprise a plurality of arrangements of a bioreactor and a stationary phase being fluidly connected in series.

The apparatus may comprise a sample inlet being fluidly connected to the stationary phase for chromatography (e.g., selection and on-column stimulation). The apparatus may also comprise a sample outlet for purified (e.g., selected) and stimulated target cells, the sample outlet being fluidly connected to the stationary phase of the last of the at least one arrangement of a bioreactor and the stationary phase for chromatography. In some embodiments, the apparatus further comprises an outlet by which engineered T cells (e.g., therapeutic cell composition) can be filled into suitable containers. Finally, the apparatus may be designed as a functionally closed system.

VII. DEFINITIONS

Unless defined otherwise, all terms of art, notations and other technical and scientific terms or terminology used herein are intended to have the same meaning as is commonly understood by one of ordinary skill in the art to which the claimed subject matter pertains. In some cases, terms with commonly understood meanings are defined herein for clarity and/or for ready reference, and the inclusion of such definitions herein should not necessarily be construed to represent a substantial difference over what is generally understood in the art.

As used herein, the singular forms "a," "an," and "the" include plural referents unless the context clearly dictates otherwise. For example, "a" or "an" means "at least one" or "one or more." It is understood that aspects and variations described herein include "consisting" and/or "consisting essentially of" aspects and variations.

Throughout this disclosure, various aspects of the claimed subject matter are presented in a range format. It should be understood that the description in range format is merely for convenience and brevity and should not be construed as an inflexible limitation on the scope of the claimed subject matter. Accordingly, the description of a range should be considered to have specifically disclosed all the possible sub-ranges as well as individual numerical values within that range. For example, where a range of values is provided, it is understood that each intervening value, between the upper and lower limit of that range and any other stated or intervening value in that stated range is encompassed within the claimed subject matter. The upper and lower limits of these smaller ranges may independently be included in the smaller ranges, and are also encompassed within the claimed subject matter, subject to any specifically excluded limit in the stated range. Where the stated range includes one or both of the limits, ranges excluding either or both of those included limits are also included in the claimed subject matter. This applies regardless of the breadth of the range.

The term "about" as used herein refers to the usual error range for the respective value readily known. Reference to "about" a value or parameter herein includes (and describes) embodiments that are directed to that value or parameter per se. For example, description referring to "about X" includes description of "X".

As used herein, recitation that nucleotides or amino acid positions "correspond to" nucleotides or amino acid positions in a disclosed sequence, such as set forth in the Sequence listing, refers to nucleotides or amino acid positions identified upon alignment with the disclosed sequence to maximize identity using a standard alignment algorithm, such as the GAP algorithm. By aligning the sequences, corresponding residues can be identified, for example, using conserved and identical amino acid residues as guides. In general, to identify corresponding positions, the sequences of amino acids are aligned so that the highest order match is obtained (see, e.g.: Computational Molecular Biology, Lesk, A. M., ed., Oxford University Press, New York, 1988; Biocomputing: Informatics and Genome Projects, Smith, D. W., ed., Academic Press, New York, 1993; Computer Analysis of Sequence Data, Part I, Griffin, A. M., and Griffin, H. G., eds., Humana Press, New.Jersey, 1994; Sequence Analysis in Molecular Biology, von Heinje, G., Academic Press, 1987; and Sequence Analysis Primer, Gribskov, M. and Devereux, J., eds., M Stockton Press, New York, 1991; Carrillo et al. (1988) SIAM J Applied Math 48: 1073).

The term "vector," as used herein, refers to a nucleic acid molecule capable of propagating another nucleic acid to which it is linked. The term includes the vector as a self-replicating nucleic acid structure as well as the vector incorporated into the genome of a host cell into which it has been introduced. Certain vectors are capable of directing the expression of nucleic acids to which they are operatively linked. Such vectors are referred to herein as "expression vectors." Among the vectors are viral vectors, such as retroviral, e.g., gammaretroviral and lentiviral vectors.

The terms "host cell," "host cell line," and "host cell culture" are used interchangeably and refer to cells into which exogenous nucleic acid has been introduced, including the progeny of such cells. Host cells include "transformants" and "transformed cells," which include the primary transformed cell and progeny derived therefrom without regard to the number of passages. Progeny may not be completely identical in nucleic acid content to a parent cell, but may contain mutations. Mutant progeny that have the same function or biological activity as screened or selected for in the originally transformed cell are included herein.

As used herein, a statement that a cell or population of cells is "positive" for a particular marker refers to the detectable presence on or in the cell of a particular marker, typically a surface marker. When referring to a surface marker, the term refers to the presence of surface expression as detected by flow cytometry, for example, by staining with an antibody that specifically binds to the marker and detecting said antibody, wherein the staining is detectable by flow cytometry at a level substantially above the staining detected carrying out the same procedure with an isotype-matched control under otherwise identical conditions and/or at a level substantially similar to that for cell known to be positive for the marker, and/or at a level substantially higher than that for a cell known to be negative for the marker.

As used herein, a statement that a cell or population of cells is "negative" for a particular marker refers to the absence of substantial detectable presence on or in the cell of a particular marker, typically a surface marker. When referring to a surface marker, the term refers to the absence of surface expression as detected by flow cytometry, for example, by staining with an antibody that specifically binds to the marker and detecting said antibody, wherein the staining is not detected by flow cytometry at a level substantially above the staining detected carrying out the same procedure with an isotype-matched control under otherwise identical conditions, and/or at a level substantially lower than that for cell known to be positive for the marker, and/or at a level substantially similar as compared to that for a cell known to be negative for the marker.

As used herein, "percent (%) amino acid sequence identity" and "percent identity" when used with respect to an amino acid sequence (reference polypeptide sequence) is defined as the percentage of amino acid residues in a candidate sequence (e.g., the subject antibody or fragment) that are identical with the amino acid residues in the reference polypeptide sequence, after aligning the sequences and introducing gaps, if necessary, to achieve the maximum percent sequence identity, and not considering any conservative substitutions as part of the sequence identity. Alignment for purposes of determining percent amino acid sequence identity can be achieved in various known ways, for instance, using publicly available computer software such as BLAST, BLAST-2, ALIGN or Megalign (DNASTAR) software. Appropriate parameters for aligning sequences can be determined, including any algorithms needed to achieve maximal alignment over the full length of the sequences being compared.

An amino acid substitution may include replacement of one amino acid in a polypeptide with another amino acid. The substitution may be a conservative amino acid substitution or a non-conservative amino acid substitution. Amino acid substitutions may be introduced into a binding molecule, e.g., antibody, of interest and the products screened for a desired activity, e.g., retained/improved antigen binding, decreased immunogenicity, or improved ADCC or CDC.

Amino acids generally can be grouped according to the following common side-chain properties:
(1) hydrophobic: Norleucine, Met, Ala, Val, Leu, Ile;
(2) neutral hydrophilic: Cys, Ser, Thr, Asn, Gln;
(3) acidic: Asp, Glu;
(4) basic: His, Lys, Arg;
(5) residues that influence chain orientation: Gly, Pro;
(6) aromatic: Trp, Tyr, Phe.

In some embodiments, conservative substitutions can involve the exchange of a member of one of these classes for another member of the same class. In some embodiments, non-conservative amino acid substitutions can involve exchanging a member of one of these classes for another class.

As used herein, a composition refers to any mixture of two or more products, substances, or compounds, including cells. It may be a solution, a suspension, liquid, powder, a paste, aqueous, non-aqueous or any combination thereof.

As used herein, a "subject" is a mammal, such as a human or other animal, and typically is human.

VIII. EXEMPLARY EMBODIMENTS

Among the provided embodiments are:
1. A method of on-column stimulation of T cells, the method comprising:
   (a) incubating a plurality of T cells immobilized on a stationary phase with one or more stimulatory agent to deliver a stimulatory signal in one or more T cells of the plurality of T cells, said stationary phase comprising a selection agent that specifically binds to a selection marker on the surface of the one or more T cells, wherein specific binding of the selection agent to the selection marker expressed by the one or more T cells effects the immobilization of the one or more T cells on the stationary phase; and
   (b) within 24 hours of the initiation of the incubation, collecting the one or more T cells from the stationary phase by gravity flow without the addition of a competition agent or free binding agent to elute the plurality of T cells from the stationary phase, thereby generating a composition comprising stimulated T cells.
2. The method of embodiment 1, wherein the stationary phase comprises at least one of the one or more stimulatory agent capable of delivering a stimulatory signal in the one or more T cells.

3. The method of embodiment 2, wherein the at least one stimulatory agent is a first stimulatory agent, and the stationary phase further comprises one or more of a second stimulatory agent capable of enhancing, dampening, or modifying the stimulatory signal of the first stimulatory agent.
4. The method of embodiment 2, wherein the stimulatory agent is a first stimulatory agent, and wherein prior to the incubating, adding to the stationary phase a stimulatory reagent comprising one or more of a second stimulatory agent capable of enhancing, dampening, or modifying the stimulatory signal of the first stimulatory agent.
5. The method of embodiment 1, wherein prior to the incubating, adding a stimulatory reagent to the stationary phase, said stimulatory reagent comprising at least one of the one or more stimulatory agent.
6. The method of embodiment 5, wherein the at least one stimulatory agent is a first stimulatory agent and the one or more stimulatory agent further comprises one or more of a second stimulatory agent capable of enhancing, dampening, or modifying the stimulatory signal of the first stimulatory agent.
7. The method of any of embodiments 1-6, wherein the at least one of the one or more stimulatory agent, optionally the first stimulatory agent, is capable of delivering a stimulatory signal, wherein the stimulatory signal is through a TCR/CD3 complex in a T cell, a CD3-containing complex in a T cell, and/or an ITAM-containing molecule in a T cell.
8. The method of any of embodiments 3, 4, 6, and 7, wherein the second stimulatory agent is capable of specifically binding to a costimulatory molecule on the one or more T cells.
9. A method of on-column stimulation of T cells, the method comprising:
(a) adding a sample comprising a plurality of T cells to a stationary phase, said stationary phase comprising a selection agent that binds to a selection marker on the surface of one or more of the plurality of T cells, thereby immobilizing the one or more of the plurality of T cells on the stationary phase;
(b) adding, to the stationary phase, a stimulatory reagent comprising one or more stimulatory agent capable of delivering a stimulatory signal in one or more of said plurality of T cells, thereby initiating incubation of the stimulatory reagent with the one or more T cells; and
(c) within 24 hours of the initiating incubation, collecting one or more of said plurality of T cells from the stationary phase by gravity flow without the addition of a competition agent or free binding agent to elute the plurality of T cells from the stationary phase, thereby generating a composition comprising stimulated T cells.
10. A method of on-column stimulation of T cells, comprising:
(1) combining (a) a sample comprising a plurality of T cells and (b) a stationary phase comprising a selection agent capable of specifically binding to a selection marker expressed on the surface of one or more of the plurality of T cells, wherein specific binding of the selection agent to a selection marker effects the immobilization of said plurality of T cells on the stationary phase;
(2) adding, to the stationary phase, a stimulatory reagent comprising one or more stimulatory agent capable of delivering a stimulatory signal in T cells, thereby initiating incubation of the stimulatory reagent with the one or more T cells; and
(3) within 24 hours of the initiating incubation, collecting one or more of said plurality of T cells from the stationary phase by gravity flow without the addition of a competition agent or free binding agent to elute the plurality of T cells from the stationary phase, thereby generating a composition comprising stimulated T cells.
11. A method of on-column stimulation of T cells, the method comprising adding an oligomeric stimulatory reagent to a stationary phase comprising a plurality of immobilized T cells, thereby initiating incubation of the stimulatory reagent with one or more T cells of the plurality of immobilized T cells, wherein:
the stationary phase comprises a selection agent that specifically binds to a selection marker on the surface of one or more T cells, wherein specific binding of the selection agent to the selection marker expressed by the one or more T cells effects the immobilization of said one or more T cells on the stationary phase; and
the oligomeric stimulatory reagent comprises (i) a plurality of streptavidin or streptavidin mutein molecules and (ii) one or more stimulatory agent capable of delivering a stimulatory signal in one or more T cells, wherein the size of the oligomeric stimulatory reagent comprises i) a radius of greater than 50 nm, ii) a molecular weight of at least $5 \times 10^6$ g/mol; and/or (iii) at least 100 streptavidin or streptavidin mutein tetramers per oligomeric stimulatory reagent.
12. The method of embodiment 11, further comprising, within 24 hours of the initiating incubation, collecting one or more of the plurality of T cells from the stationary phase by gravity flow without the addition of a competition agent or free binding agent to elute the plurality of T cells from the stationary phase, thereby generating a composition comprising stimulated T cells.
13. The method of any of embodiments 1-10 or 12, wherein the collecting the one or more of the plurality of T cells from the stationary phase occurs within about 23, 22, 21, 20, 19, 18, 17, 16, 15, 14, 13, 12, 11, 10, 9, 8, 7, 6, 5, 4, 3, or 2 hours of initiating the incubation.
14. The method of any of embodiments 1-10, 12, or 13, wherein the collecting one or more of the plurality of T cells from the stationary phase occurs within about 2 to 24, 3 to 24, 4 to 24, 5, to 24, 6 to 24, 7 to 24, 8 to 24, 9 to 24, 10 to 24, 11 to 24, 12 to 24, 13 to 24, 14 to 24, 15 to 24, 16 to 24, 17 to 24, 18 to 24, 19 to 24, 20 to 24, 21 to 24, 22 to 24, 23 to 24, 2 to 23, 2 to 22, 2 to 21, 2 to 20, 2 to 19, 2 to 18, 2 to 17, 2 to 16, 2 to 15, 2 to 14, 2 to 13, 2 to 12, 2 to 11, 2 to 10, 2 to 9, 2 to 8, 2 to 7, 2 to 6, 2 to 5, 2 to 4, or 2 to 3 hours of initiating the incubation.
15. The method of any of embodiments 1-10 or 12-14, wherein the collecting one or more of the plurality of T cells from the stationary phase occurs within about 12, 10, 8, 6, 4, or 2 hours of initiating the incubation.
16. The method of any of embodiments 1-10 or 12-15, wherein the collecting one or more of the plurality of T cells from the stationary phase occurs within 5 hours of initiating the incubation.
17. The method of any of embodiments 1-10 or 12-16, wherein the collecting one or more of the plurality of T cells from the stationary phase occurs within 4 hours of initiating the incubation.

18. The method of any of embodiments 9, 10, and 13-17, wherein the initiating incubation with the stimulatory reagent is carried out within or within about 10 minutes, within or within about 20 minutes, within or within about 30 minutes, within or within about 45 minutes, within or within about 60 minutes, within or within about 90 minutes or within or within about 120 minutes after adding or combining the sample comprising the plurality of T cells to or with the stationary phase.

19. The method of any of embodiments 9-18, wherein at least one of the one or more stimulatory agent is capable of delivering a stimulatory signal, wherein the stimulatory signal is through a TCR/CD3 complex in a T cell, a CD3-containing complex in a T cell, and/or an ITAM-containing molecule in a T cell.

20. The method of embodiment 19, wherein the at least one stimulatory agent is a first stimulatory agent and the stimulatory reagent further comprises one or more of a second stimulatory agent capable of enhancing, dampening, or modifying the stimulatory signal of the first stimulatory agent.

21. The method of any of embodiments 3, 4, 6, 7, and 20, wherein the second stimulatory agent is capable of specifically binding to a costimulatory molecule on the one or more T cells.

22. The method of embodiment 21, wherein the costimulatory molecule is selected from among CD28, CD90 (Thy-1), CD95 (Apo-/Fas), CD137 (4-1BB), CD154 (CD40L), ICOS, LAT, CD27, OX40 or HVEM.

23. The method of embodiment 21 or embodiment 22, wherein the second stimulatory agent is capable of specifically binding to CD28.

24. The method of any of embodiments 3, 4, 6, 7, and 20-23, wherein the first stimulatory agent specifically binds CD3 and the second stimulatory agent specifically binds CD28.

25. The method of any of embodiments 1-24, wherein:
the stimulatory agent is or comprises an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or
the stimulatory agent comprises an antibody fragment;
the stimulatory agent is or comprises a Fab fragment;
the stimulatory agent is selected from the group of divalent antibody fragments consisting of (Fab)$_2$'-fragments and divalent single-chain Fv (scFv) fragments;
the stimulatory agent is a monovalent antibody fragment selected from the group consisting of Fab fragments, Fv fragments, and scFvs; and/or
the stimulatory agent is a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

26. The method of any of embodiments 3, 4, 6, 7 or 20-24, wherein:
the first and second stimulatory agents, independently, are or comprise an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or
the first and second stimulatory agents, independently, comprise an antibody fragment;
the first and second stimulatory agents, independently, are or comprise a Fab fragment;
the first and second stimulatory agents, independently, are selected from the group of divalent antibody fragments consisting of (Fab)2'-fragments and divalent single-chain Fv (scFv) fragments;
the first and second stimulatory agents, independently, are a monovalent antibody fragment selected from the group consisting of Fab fragments, Fv fragments, and scFvs; and/or
the first and second stimulatory agents, independently, are a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

27. The method of any of embodiments 3, 4, 6, 7, 20-24, and 26, wherein the first stimulatory reagent is an anti-CD3 Fab and the second stimulatory agent is an anti-CD28 Fab.

28. A method of on-column stimulation of T cells, the method comprising adding an oligomeric stimulatory reagent capable of delivering a stimulatory signal in T cells to a stationary phase comprising a plurality of immobilized T cells, thereby initiating incubation of the stimulatory reagent with one or more T cells, wherein:
the stationary phase comprises a selection agent capable of specifically binding to a selection marker on the surface of one or more T cells or subset thereof, wherein specific binding of the selection agent to a selection marker expressed by the one or more T cells or a subset thereof effects the immobilization of said at least a plurality of T cells on the stationary phase, and wherein the selection agent is a Fab fragment capable of specifically binding to a selection marker selected from the group consisting of CD3, CD4, and CD8;
the oligomeric stimulatory reagent comprises (i) a plurality of streptavidin mutein molecules, (ii) a first stimulatory agent capable of delivering a stimulatory signal in one or more T cells, wherein the first stimulatory agent is a Fab fragment capable of specifically binding to CD3, and (iii) a second stimulatory agent capable of enhancing, dampening, or modifying the stimulatory signal, wherein the second stimulatory agent is a Fab fragment capable of specifically binding to CD28, and wherein the size of the oligomeric stimulatory reagent comprises i) a radius of greater than 50 nm, ii) a molecular weight of at least $5 \times 10^6$ g/mol; and/or (iii) at least 100 streptavidin or streptavidin mutein tetramers per oligomeric stimulatory reagent; and
within 24 hours of initiating incubation, collecting one or more of the plurality of T cells from the stationary phase by gravity flow without the addition of a competition agent or free binding agent to elute the plurality of T cells from the stationary phase, thereby generating a composition comprising stimulated T cells.

29. The method of embodiment 25, wherein:
the stimulatory agent further comprises biotin, a biotin analog that reversibly binds to a streptavidin or avidin, a streptavidin-binding peptide selected from the group consisting of Tip-Ser-His-Pro-Gln-Phe-Glu-Lys (SEQ ID NO: 8), Ser-Ala-Trp-Ser-His-Pro-Gln-Phe-Glu-Lys- (GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGG-SAWSHPQFEK (SEQ ID NO: 16), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Tip-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag.

30. The method of 26, wherein:
the first stimulatory agent and the second stimulatory agent, independently, further comprise biotin, a biotin analog that reversibly binds to a streptavidin or avidin, a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGG-SAWSHPQFEK (SEQ ID NO: 16), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag.

31. The method of any of embodiments 1-30, wherein the selection agent is or comprises an agent selected from the group consisting of antibody fragments, monovalent antibody fragments, proteinaceous binding molecules with immunoglobulin-like functions, molecules containing Ig domains, cytokines, chemokines, aptamers, MHC molecules, MHC-peptide complexes; receptor ligands; and binding fragments thereof; and/or
the selection agent comprises an antibody fragment;
the selection agent is or comprises a Fab fragment;
the selection agent is selected from the group of divalent antibody fragments consisting of (Fab)$_2$'-fragments and divalent single-chain Fv (scFv) fragments;
the selection agent is a monovalent antibody fragment selected from the group consisting of Fab fragments, Fv fragments, and scFvs; and/or
the selection agent is a proteinaceous binding molecule with antibody-like binding properties, selected from the group consisting of aptamers, muteins based on a polypeptide of the lipocalin family, glubodies, proteins based on the ankyrin scaffold, proteins based on the crystalline scaffold, adnectins, and avimers.

32. The method of embodiment 31, wherein:
the selection agent further comprises biotin, a biotin analog that reversibly binds to a streptavidin or avidin, a streptavidin-binding peptide selected from the group consisting of Tip-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGG-SAWSHPQFEK (SEQ ID NO:16), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19), a calmodulin binding peptide that reversibly binds to calmodulin, a FLAG peptide that reversibly binds to an antibody binding the FLAG peptide, and an oligohistidine tag that reversibly binds to an antibody binding the oligohistidine tag.

33. The method of any of embodiments 1-32, wherein:
the selection marker is a T cell coreceptor;
the selection marker is or comprises a member of a T cell antigen receptor complex; the selection marker is or comprises a CD3 chain;
the selection marker is or comprises a CD3 zeta chain;
the selection marker is or comprises a CD8;
the selection marker is or comprises a CD4;
the selection marker is or comprises CD45RA;
the selection marker is or comprises CD27;
the selection marker is or comprises CD28; and/or
the selection marker is or comprises CCR7.

34. The method of any of embodiments 1-33, wherein the specific binding between the selection agent and the selection marker does not induce a signal, or does not induce a stimulatory or activating or proliferative signal, to the T cells.

35. The method of any of embodiments 1-34, wherein the selection agent is an anti-CD3 Fab, an anti-CD8 Fab or an anti-CD4 Fab.

36. The method of any of embodiments 2 and 5-35, wherein said stimulatory reagent is soluble.

37. The method of any of embodiments 2 and 5-36, wherein:
the stimulatory reagent is not, and is not bound to or associated with, a solid support, stationary phase, a bead, a microparticle, a magnetic particle, and/or a matrix; and/or
the reagent is flexible, does not contain a metal or magnetic core, is comprised entirely or primarily of organic multimer, is not spherical, is not substantially spherical or uniform in shape and/or is not rigid.

38. The method of any of embodiments 2 and 5-10, and 12-37, wherein the stimulatory reagent is or comprises streptavidin, avidin, a mutein of streptavidin that reversibly binds biotin, a biotin analog or a biologically active fragment thereof; a mutein of avidin or streptavidin that reversibly binds a streptavidin-binding peptide; a reagent that comprises at least two chelating groups K, wherein the at least two chelating groups are capable of binding to a transition metal ion; an agent capable of binding to an oligohistidine affinity tag; an agent capable of binding to a glutathione-S-transferase; calmodulin or an analog thereof; an agent capable of binding to calmodulin binding peptide (CBP); an agent capable of binding to a FLAG-peptide; an agent capable of binding to an HA-tag; an agent capable of binding to maltose binding protein (MBP); an agent capable of binding to an HSV epitope; an agent capable of binding to a myc epitope; or an agent capable of binding to a biotinylated carrier protein.

39. The method of any of embodiments 2, 5-10, and 12-38, wherein:
the stimulatory reagent is or comprises a streptavidin mutein or an avidin mutein that reversibly binds to biotin or a biologically active fragment;

the stimulatory reagent is or comprises a streptavidin mutein or an avidin mutein that reversibly binds to a biotin analog or a biologically active fragment; and/or the stimulatory reagent is or comprises a streptavidin mutein or an avidin mutein that reversibly binds to a streptavidin-binding peptide.

40. The method of any of embodiments 2, 5-10, and 12-39, wherein the stimulatory reagent is an oligomeric stimulatory reagent comprising a plurality of streptavidin or streptavidin mutein molecules, wherein the size of the oligomeric particle reagent comprises i) a radius of greater than 50 nm, ii) a molecular weight of at least $5 \times 10^6$ g/mol; and/or (iii) at least 100 streptavidin or streptavidin mutein tetramers per oligomeric particle reagent.

41. The method of embodiment 11 or embodiment 40, wherein the oligomeric stimulatory reagent is soluble.

42. The method of any of embodiments 11, 40, or 41, wherein:

the oligomeric stimulatory reagent is not, and is not bound to or associated with, a solid support, stationary phase, a bead, a microparticle, a magnetic particle, and/or a matrix; and/or the reagent is flexible, does not contain a metal or magnetic core, is comprised entirely or primarily of organic multimer, and/or is not rigid.

43. The method of any of embodiments 11 or 40-42, wherein the streptavidin or streptavidin mutein molecules reversibly bind to or are capable of reversibly binding to biotin, a biotin analog or a streptavidin-binding peptide.

44. The method of any of embodiments 38-43, wherein:

the streptavidin mutein comprising the amino acid sequence $Val^{44}$-$Thr^{45}$-$Ala^{46}$-$Arg^{47}$ or $Ile^{44}$-$Gly^{45}$-$Ala^{46}$-$Arg^{47}$ at sequence positions corresponding to positions 44 to 47 with reference to positions in streptavidin in the sequence of amino acids set forth in SEQ ID NO:1; or the streptavidin mutein comprises the amino acid sequence $Val^{44}$-$Thr^{45}$-$Ala^{46}$-$Arg^{47}$ at sequence positions corresponding to positions 44 to 47 with reference to positions in streptavidin in the sequence of amino acids set forth in SEQ ID NO: 1.

45. The method of any of embodiments 38, 39, 43, or 44, wherein the streptavidin-binding peptide is selected from the group consisting of Trp-Ser-His-Pro-Gln-Phe-Glu-Lys (SEQ ID NO: 8), Trp-Ser-His-Pro-Gln-Phe-Glu-Lys-(GlyGlyGlySer)$_3$-Trp-Ser-His-Pro-Gln-Phe-Glu-Lys ((SEQ ID NO: 17), SAWSHPQFEKGGGSGGGSGGSAWSHPQFEK (SEQ ID NO:16), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19).

46. The method of any one of embodiments 11 or 40-45, wherein the oligomeric particle reagent comprises:

a radius of greater than 60 nm, greater than 70 nm, greater than 80 nm, or greater than 90 nm.

47. The method of any of embodiments 11 or 40-46, wherein the oligomeric particle reagent comprises:

a radius of between 50 nm and 150 nm, between 75 nm and 125 nm, between 80 nm and 115 nm, or between 90 nm and 110 nm, inclusive; or a radius of 90 nm±15 nm, or 95 nm±20-25 nm.

48. The method of any of embodiments 11 or 40-47, wherein the radius is a hydrodynamic radius.

49. The method of any of embodiments 11 or 40-48, wherein the oligomeric particle reagent comprises a molecular weight of:

at least $5 \times 10^7$ g/mol, or at least $1 \times 10^8$ g/mol; and/or between $5 \times 10^7$ g/mol and $5 \times 10^8$ g/mol, between $1 \times 10^8$ g/mol and $5 \times 10^8$ g/mol, or between $1 \times 10^8$ g/mol and $2 \times 10^8$ g/mol.

50. The method of any of embodiments 11 or 40-49, wherein the oligomeric particle reagent comprises at least 500 streptavidin or streptavidin mutein tetramers, at least 1,000 streptavidin or streptavidin mutein tetramers, at least 1,500 streptavidin or streptavidin mutein tetramers, or at least 2,000 streptavidin or streptavidin mutein tetramers; and/or;

between 1,000 and 20,000 streptavidin or streptavidin mutein tetramers, between 1,000 and 10,000 streptavidin or streptavidin mutein tetramers, or between 2,000 and 5,000 streptavidin or streptavidin mutein tetramers.

51. The method of any of embodiments 1-50, wherein the selection agent is directly or indirectly bound to the stationary phase.

52. The method of any of embodiments 1-51, wherein the selection agent is bound indirectly to the stationary phase through a selection reagent to which the selection agent reversibly binds.

53. The method of embodiment 51 or embodiment 52, wherein the selection reagent is or comprises streptavidin, avidin, a mutein of streptavidin that reversibly binds biotin, a biotin analog or a biologically active fragment thereof; a mutein of avidin or streptavidin that reversibly binds a streptavidin-binding peptide; a reagent that comprises at least two chelating groups K, wherein the at least two chelating groups are capable of binding to a transition metal ion; an agent capable of binding to an oligohistidine affinity tag; an agent capable of binding to a glutathione-S-transferase; calmodulin or an analog thereof; an agent capable of binding to calmodulin binding peptide (CBP); an agent capable of binding to a FLAG-peptide; an agent capable of binding to an HA-tag; an agent capable of binding to maltose binding protein (MBP); an agent capable of binding to an HSV epitope; an agent capable of binding to a myc epitope; or an agent capable of binding to a biotinylated carrier protein.

54. The method of any of embodiments 51-53, wherein:

the selection reagent is or comprises a streptavidin mutein or an avidin mutein that reversibly binds to biotin or a biologically active fragment;

the stimulatory reagent is or comprises a streptavidin mutein or an avidin mutein that reversibly binds to a biotin analog or a biologically active fragment; and/or the stimulatory reagent is or comprises a streptavidin mutein or an avidin mutein that reversibly binds to a streptavidin-binding peptide.

55. The method of embodiment 53 or embodiment 54, wherein the streptavidin or streptavidin mutein molecules reversibly bind to or are capable of reversibly binding to biotin, a biotin analog or a streptavidin-binding peptide.

56. The method of any of embodiments 53-55, wherein:

the streptavidin mutein comprising the amino acid sequence $Val^{44}$-$Thr^{45}$-$Ala^{46}$-$Arg^{47}$ or $Ile^{44}$-$Gly^{45}$-$Ala^{46}$-$Arg^{47}$ at sequence positions corresponding to positions 44 to 47 with reference to positions in streptavidin in the sequence of amino acids set forth in SEQ ID NO:1; or the streptavidin mutein comprises the amino acid sequence $Val^{44}$-$Thr^{45}$-$Ala^{46}$-$Arg^{47}$ at sequence positions corresponding to positions 44 to 47 with reference to positions in streptavidin in the sequence of amino acids set forth in SEQ ID NO: 1.

57. The method of any of embodiments 53-54, wherein the streptavidin-binding peptide is selected from the group consisting of Trp-Ser-His-Pro-Gln-Phe-Glu-Lys (SEQ ID NO: 8), SAWSHPQFEKGGGSGGGSGG-SAWSHPQFEK (SEQ ID NO:16), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), Trp-Ser-His-Pro-Gln-Phe-Glu-Lys-(GlyGlyGlySer)$_2$-Trp-Ser-His-Pro-Gln-Phe-Glu-Lys (SEQ ID NO: 18) and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19).

58. The method of any of embodiments 1-10 or 12-57, wherein said collecting comprises washing the stationary phase with media, the media not comprising a competition agent or free binding agent to elute the T cells from the stationary phase.

59. The method of any of embodiments 1-10 or 12-58, comprising, after said collecting, further incubating the composition comprising the stimulated T cells.

60. The method of embodiment 59, wherein:
the further incubation is carried out at or about 37° C.±2° C.; and/or the further incubation is carried out in the presence of a further agent that is capable of delivering a signal to T cells.

61. The method of embodiment 60, wherein the further agent is comprised in the media used for washing the stationary phase.

62. The method of embodiment 60 or 61, wherein the further agent is capable of enhancing or inducing proliferation of T cells, CD4+ T cells and/or CD8+ T cells.

63. The method of any of embodiments 60-62, wherein the further agent is a cytokine selected from among IL-2, IL-15 and IL-7.

64. The method of any of embodiments 59-63, wherein the further incubation is carried out for a time that is 72 hours, no more than 48 hours, no more than 24 hours, or no more than 12 hours.

65. The method of any of embodiments 1-64, further comprising introducing a recombinant nucleic acid molecule into the stimulated T cells of the composition, wherein the nucleic acid molecule encodes a recombinant protein, thereby producing a composition comprising transduced T cells.

66. The method of embodiment 65, wherein the recombinant protein is an antigen receptor.

67. The method of embodiment 65, wherein the recombinant protein is a chimeric antigen receptor.

68. The method of embodiment 67, wherein the chimeric antigen receptor (CAR) comprises an extracellular antigen-recognition domain that specifically binds to a target antigen and an intracellular signaling domain comprising an ITAM.

69. The method of embodiment 68, wherein the intracellular signaling domain comprises an intracellular domain of a CD3-zeta (CD3ç) chain.

70. The method of embodiment 68 or embodiment 69, further comprising a transmembrane domain linking the extracellular domain and the intracellular signaling domain.

71. The method of embodiment 70, wherein the transmembrane domain comprises a transmembrane portion of CD28.

72. The method of any of embodiments 68-71, wherein the intracellular signaling domain further comprises an intracellular signaling domain of a T cell costimulatory molecule.

73. The method of embodiment 72, wherein the T cell costimulatory molecule is selected from the group consisting of CD28 and 41BB.

74. The method of any of embodiments 65-73, wherein the nucleic acid further comprises a promoter operably linked to the nucleic acid encoding the recombinant antigen receptor.

75. The method of any of embodiments 65-74, wherein the introduction of the recombinant nucleic acid is achieved by transduction with a viral particle.

76. The method of embodiment 75, wherein the viral particle is a retroviral vector particle.

77. The method of embodiment 75, wherein the viral particle is a lentiviral vector particle. 78. The method of any of embodiments 65-77, further comprising cultivating the composition comprising transduced cells under conditions for viral integration, thereby producing a composition comprising cultivated T cells.

79. The method of any of embodiments 75-78, further comprising cultivating the composition comprising transduced cells under conditions to expand the T cells.

80. The method of embodiment 79, wherein the cultivating is carried out for a time that is no more than 14 days, no more than 12 days, no more than 10 days, no more than 8 days or no more than 6 days.

81. The method of any of embodiments 59-64, further comprising adding a competition agent or free binding agent to the composition comprising the stimulated T cells, thereby disrupting the reversible bond(s).

82. The method of any of embodiments 65-77, further comprising adding a competition agent or free binding agent to the composition comprising the transduced T cells, thereby disrupting the reversible bond(s).

83. The method of any of embodiments 78-80, further comprising adding a competition agent or free binding agent to the composition comprising the cultivated T cells, thereby disrupting the reversible bond(s).

84. The method of any of embodiments 81-83, wherein the competition agent or free binding agent is not detrimental to the T cells and/or wherein the addition of said substance does not reduce the percentage of surviving T cells to less than 90%, 80%, 70%, 60%, or 50%, as compared to incubation of the T cells, under comparable or the same conditions, without the competition agent or free binding agent.

85. The method of any of embodiments 81-84, wherein said disruption terminates or lessens the stimulatory signal in the T cells.

86. The method of any of embodiments 81-85, wherein:
the competition reagent and free binding agent independently comprise a molecule from the group consisting of: streptavidin-binding molecules; biotin; D-biotin; biotin analogs; biotin analogs that specifically bind to streptavidin or a streptavidin analog having an amino acid sequence $Val^{44}$-$Thr^{45}$-$Ala^{46}$-$Arg^{47}$ or $Ile^{44}$-$Gly^{45}$-$Ala^{46}$-$Arg^{47}$ at sequence positions corresponding to positions 44 to 47 of a wild type streptavidin; and peptides comprising or consisting of a sequence set forth in any of SEQ ID NO: 1, 4, 5, and 7; or the competition reagent and free binding agent independently comprise a metal chelator, which is optionally EDTA or EGTA.
87. The method of any of embodiments 1-77, wherein the T cells comprise antigen-specific T cells or a population thereof, a T helper cell or population thereof, a cytotoxic T cell or population thereof, a memory T cell or population thereof, or a regulatory T cell or population thereof.
88. The method of any of embodiments 1-87, wherein the T cells comprise CD3+ T cells or comprise CD4+ and/or CD8+ T cells.
89. The method of any of embodiments 1-88, wherein the stationary phase is or comprises a chromatography matrix.
90. An article of manufacture for on-column stimulation of T cells, the article of manufacture comprising:
(a) a first stimulatory agent and a second stimulatory agent capable of specifically binding to a first molecule and a second molecule, respectively, on the surface of a T cell, thereby stimulating the T cell; and
(b) a stationary phase comprising a selection agent capable of specifically binding to a selection marker on a T cell, thereby immobilizing the T cell onto the stationary phase.
91. The article of manufacture of embodiment 90, wherein the stationary phase further comprises the first stimulatory agent and the second stimulatory agent.
92. The article of manufacture of embodiment 90 or embodiment 91, wherein the first stimulatory agent, the second stimulatory agent, and the selection agent are bound indirectly to the stationary phase through a selection reagent.
93. The article of manufacture of embodiment 90, further comprising a stimulatory reagent, wherein the first and second stimulatory agents are or are capable of being reversibly bound.
94. The method of embodiment 90, wherein the selection agent is bound indirectly to the stationary phase through a selection reagent.
95. The article of manufacture of any of embodiments 90-94, wherein the stationary phase is or comprises a chromatography matrix, and wherein the article of manufacture further comprises a container in which all or part of the chromatography matrix is contained.
96. An apparatus comprising the article of manufacture of any of embodiments 90-95.
97. The apparatus of embodiment 96, further comprising a fluid inlet, being fluidly connected to one or more component of the apparatus, and/or a fluid outlet, being fluidly connected to one or more component of the apparatus.
98. The apparatus of any of embodiments 96 or 97 that is in a closed or sterile system.
99. The apparatus of any of embodiments 96-98, or the article of any of embodiments 90-95, for use in the method of any of embodiments 1-89, wherein the method is optionally carried out in an automated fashion.

IX. EXAMPLES

The following examples are included for illustrative purposes only and are not intended to limit the scope of the invention.

Example 1: Methods for Preparing an Anti-CD3/Anti-CD28 Fab Conjugated Oligomeric Reagent Comprising a Streptavidin Mutein An oligomeric reagent was prepared by polymerizing an exemplary streptavidin mutein designated STREP-TACTIN® M2 (a streptavidin homo-tetramer containing the mutein sequence of amino acids set forth in SEQ ID NO:6, see e.g. U.S. Pat. No. 6,103,493 and Voss and Skerra (1997) Protein Eng., 1:975-982, and Argarana et al. (1986) Nucleic Acids Research, 1871-1882). To prepare streptavidin muteins for oligomerization, streptavidin muteins containing one or more reactive thiol groups were incubated with maleimide activated streptavidin muteins. To prepare the thiolated streptavidin mutein, about 100 mg of streptavidin mutein was thiolated by incubation with 2-iminothiolane hydrochloride at a molar ratio of 1:100 at a pH of about 8.5 at 24° C. for 1 hour in 100 mM Borate buffer in a total volume of 2.6 mL. For the activation reaction, about 400 mg of streptavidin mutein was incubated with Succinimidyl-6 [(β-maleimidopropionamido) hexanoate (SMPH) at a molar ratio of 1:2 at a pH of about 7.2 at 24° C. for 1 hour in a total volume of about 10.4 mL in a sodium phosphate buffer. The thiolation and activation reactions were coordinated to start at about the same time, and the duration of the reactions was controlled After the reactions, the 2-Iminothiolane hydrochloride and SMPH were removed from the samples by individually carrying out gel filtration of the samples with PD-10 desalting columns (GE Healthcare). For each 2.5 mL volume of sample, a 1 mL PD-10 column was equilibrated and loaded with either thiolated mutein streptavidin or maleimide mutein streptavidin and elution was carried out by adding 3.5 mL of coupling buffer (100 mM NaH2P)4, 150 mM NaCl, 5 mM EDTA, pH 7.2). Gel filtration of the maleimide mutein streptavidin was carried out on 4 columns to account for the >10 mL volume and eluates were pooled. The timing of the activation and thiolation reactions and the timing between the end of the activation and thiolation reactions and the start of the oligomerization reactions were carefully controlled. Generally, no more than ten minutes was allowed to pass from the start of gel filtrations, i.e. the end of the activation and thiolation reactions, to when oligomerization reaction was initiated.

For oligomerization, the maleimide streptavidin mutein and thiolated streptavidin mutein samples were then combined into an overall volume of about 17.5 mL and incubated for 1 hour at a pH of 7.2 at 24° C. under stirring conditions at about 600 rpm. Because four times more streptavidin mutein was incubated with SMPH than with 2-iminothiolane hydrochloride, the molar ratio of thiolated streptavidin mutein and maleimide streptavidin mutein was 1:4 during the oligomerization reaction. After the reaction, remaining SH groups of the oligomerized streptavidin mutein reagent were saturated by incubation with N-Ethylmaleimide (NEM) for 15 min at 24° C. with stirring (about 600 rpm) followed by incubation for a further 16-20 hours at 4° C.

After incubation with NEM, the sample containing oligomerized streptavidin mutein was centrifuged and the supernatant was filtered through a 0.45 µm membrane (Millex-HP 0.45 µm from Merck Millopore). The filtered solution was then loaded into a column (Sephacryl S-300 HR HiPrep 26/60, GE Healthcare) for size exclusion chromatography (SEC) with an AKTA Explorer chromatography system (GE Healthcare). Fractions with a milli absorbance unit (mAU) greater than or equal to 1500 mAU were pooled.

The pooled sample containing oligomeric streptavidin mutein was treated with 100 mM hydroxylamine at a pH of 6.35 for 15 minutes at room temperature. To remove the hydroxylamine after treatment, sample was loaded onto a PD10 column (2.5 mL per column) and eluted with 3.5 mL of buffer containing 100 mM NaH2PO4, 140 mM NaCl, 1 mM EDTA, pH 7.2. The PD10 elutes were pooled and sterile filtered with a 0.45 µm filter followed by a 0.22 µm filter and then samples were frozen and stored at −80° C. Prior to freezing, the final concentration of the oligomeric streptavidin mutein reagent was measured and the size of the oligomeric streptavidin mutein reagent was determined by dynamic light scattering (DLS).

To evaluate the consistency of the oligomerization process, 10 oligomeric streptavidin mutein reagents were prepared using the methods described above from five different lots of streptavidin mutein (SAM). The average size, percent yield (determined by measuring absorbance at 280 nm without baseline correction), and activity (biotin binding) of the oligomers were assessed and the results are shown in Table E1. The results indicated that the resulting oligomeric streptavidin mutein reagents were consistent in these parameters with an average radius of 97 nm±10 nm and biotin binding of 40 nmol/mg±3 nmol/mg.

TABLE E1

Comparison of oligomerized STREP-TACTIN from different batches.

|  | SAM lot | Radius (nm) | Yield(%) | Biotin Binding (nmol/mg) |
| --- | --- | --- | --- | --- |
| Batch 1 | 1 | 92 | 74 | 41 |
| Batch 2 | 2 | 100 | 68 | 40 |
| Batch 3 | 2 | 106 | 82 | 37 |
| Batch 4 | 2 | 94 | 73 | 39 |
| Batch 5 | 3 | 87 | 79 | 41 |
| Batch 6 | 3 | 90 | 81 | 39 |
| Batch 7 | 4 | 97 | 84 | 43 |
| Batch 8 | 4 | 97 | 76 | 43 |
| Batch 9 | 5 | 102 | 85 | 42 |
| Batch 10 | 5 | 87 | 63 | 42 |

The average molecular weight (MW) of three oligomeric streptavidin mutein reagents generated as described above was measured by asymmetrical flow field-flow fractionation (AF4) performed with an HPLC system (AGILENT 1100 and Wyatt ECLIPSE DUALTEC) with UV detection (Agilent UV detector coupled with MALLS DAWN HELEOS (Wyatt)). The measurements by AF4 allowed for the calculation of the average number of streptavidin mutein tetramers in each oligomeric reagent assuming the average molecular weight of a streptavidin mutein tetramer of 52,500 g/mol (52.5 kDa) (Table E2).

TABLE E2

Size and Molecular Weight of oligomeric streptavidin mutein reagents

| Radius (nm) | MW (g/mol) | Number of Tetramers |
| --- | --- | --- |
| 102 | $1.65 \times 10^8$ | 3150 |
| 82 | $1.08 \times 10^8$ | 2050 |
| 92 | $1.26 \times 10^8$ | 2280 |

Stimulatory agents (anti-CD3 and anti-CD28 Fab fragments) were multimerized by reversible binding to oligomeric streptavidin mutein reagent generated as described above. Anti-CD3 and anti-CD28 Fab fragments were reversibly bound to the streptavidin mutein oligomer via a streptavidin peptide-binding partner fused to each Fab fragment. The anti-CD3 Fab fragment was derived from the CD3 binding monoclonal antibody produced by the hybridoma cell line OKT3 (ATCC® CRL-8001™; see also U.S. Pat. No. 4,361,549), and contained the heavy chain variable domain and light chain variable domain of the anti-CD3 antibody OKT3 described in Arakawa et al J. Biochem. 120, 657-662 (1996). These sequences are set forth in SEQ ID NOS: 31 and 32, respectively. The anti-CD28 Fab fragment was derived from antibody CD28.3 (deposited as a synthetic single chain Fv construct under GenBank Accession No. AF451974.1; see also Vanhove et al., BLOOD, 15 Jul. 2003, Vol. 102, No. 2, pages 564-570) and contained the heavy and light chain variable domains of the anti-CD28 antibody CD28.3 set forth in SEQ ID NOS: 33 and 34, respectively. The Fab fragments were individually fused at the carboxy-terminus of their heavy chain to a streptavidin peptide-binding sequence containing a sequential arrangement of two streptavidin binding modules having the sequence of amino acids SAWSHPQFEKGGGSGGGSGG-SAWSHPQFEK (SEQ ID NO: 16). The peptide-tagged Fab fragments were recombinantly produced (see International Patent App. Pub. Nos. WO 2013/011011 and WO 2013/124474).

To effect reversible binding, peptide-tagged anti-CD3 and anti-CD28 Fab fragments were mixed with the oligomeric streptavidin mutein reagent at approximately room temperature, thereby reversibly binding them to the reagent via interaction between twin-strep-tags on the Fab fragments, which were binding partners capable of reversibly binding to binding sites on the reagent. In some cases, the peptide-tagged Fab fragments were pre-mixed prior to immobilization onto the oligomeric streptavidin mutein reagent, which, in some instances, can result in a more uniform distribution of the different Fab molecules. Binding of the peptide-tagged anti-CD3 and anti-CD28 to the oligomeric streptavidin mutein reagent can be disrupted, or reversed, by addition of D-biotin. D-biotin competes with the strep-tag on the agents for binding to the binding partner on the streptavidin mutein, thereby disrupting binding.

Example 2: Activity Assessment of Oliomerized Anti-CD3 and Anti-CD28 Fab Fragments Reversibly Bound to Streptavidin Mutein Oligomers Anti-CD3 and anti-CD28 Fab fragments, reversibly bound to various oligomeric streptavidin reagents from each of the batches described in Table E1 by the process described in Example 1, were assessed for the ability to stimulate T cells. These oligomeric streptavidin reagents had an average radius of about 95 nm. Metabolic activity of cells as an indicator of cell proliferation was assessed by colorimetric monitoring of cleavage of the stable tetrazolium salt WST-1 to a soluble formazan dye complex.

T cells, from three different donors, were incubated with the anti-CD3/anti-CD28 multimerized Fab fragments reversibly bound on an oligomeric streptavidin reagent. Cells were also incubated with control oligomeric reagents that had either an average radius of 101 (internal reference) or 36 nm, which also were reversibly bound to anti-CD3/anti-CD28 Fab fragments.

After the incubation, WST-1 reagent was applied to the cells and the levels of metabolic activity were assessed by measuring the absorbance at 450 nm as a readout. The results were normalized to the number of cells in the culture being assayed and depicted as the ratio of WST-1 per cell number.

Figure 2B:
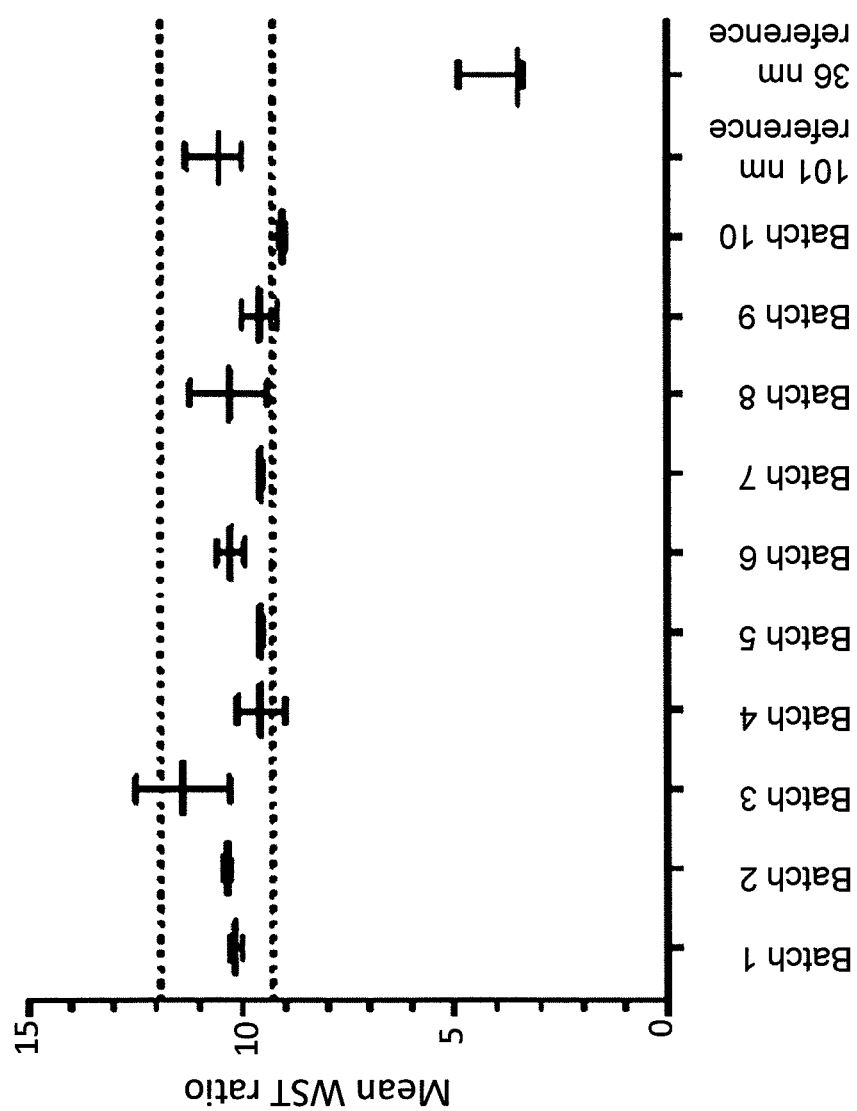
FIGS. 2A and 2B show results of a WST metabolic assay of T cells from three different donors incubated with anti-CD3/anti-CD28 multimerized on different batches of oligomeric reagents.
Figure 2A:
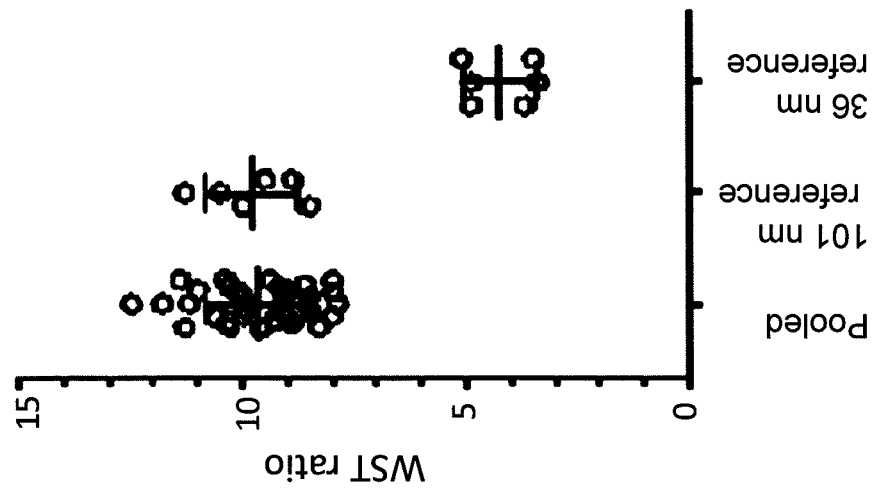

As shown in FIG. 2B, mean WST-1 activity of T cells stimulated with each of the tested reagents were comparable. Moreover, the degree of stimulation was similar for all tested reagents and was comparable to a similarly sized internal reference reagent (varying generally within ±2 standard deviations). FIG. 2A shows the WST-1 activity depicted as a separate data point for each reagent. FIG. 2A and FIG. 2B indicate that stimulation of T cells, as observed by WST-1 activity, was lower using anti-CD3/anti-CD28 Fabs multimerized on a smaller 36 nm oligomeric streptavidin mutein reagent backbone.

Example 3: Selection and Stimulation of T Cells Via Column Chromatography

A study was carried out to enrich T cells by column-based affinity chromatography with on-column stimulation in the presence of an anti-CD3/anti-CD28 oligomeric stimulatory agent.

In this study, a Sephadex G50 (Sigma) was used as stationary phase and was covalently coupled with STREP-TACTIN® M2 (SEQ ID NO: 6) using a cyanogen bromide (CNBr) activated resin. A 50% suspension of Sephadex G50 contained approximately 70 µg of covalently coupled 7 Strep-Tactin®/mL of the bead suspension. Following immobilization of STREP-TACTIN® onto the stationary phase, two mL of the suspension of Sephadex G50 with Strep-Tactin® was incubated with 10 µg of a selection agent specific to a T cell surface selection marker for 20 min at 4° C. in order to allow binding of the Fab fragment to the immobilized Strep-Tactin® reagent. The suspension was then filled in a plastic minicolumn with a 90 micrometer frit at the bottom. The column was equilibrated with PBS (phosphate buffered saline) containing 0.5% bovine serum albumin (PBSA buffer) to give a bed volume of 1 mL.

In these studies, experiments were carried out using as the selection agent either an anti-CD3 binding Fab fragment, an anti-CD4 binding Fab fragment, or an anti-CD8 binding Fab fragment as the selection agent. The CD3 binding Fab fragment was derived from the CD3 binding monoclonal antibody produced by the hybridoma cell line OKT3 (ATCC® CRL-8001™; see also U.S. Pat. No. 4,361,549), and contained the heavy chain variable domain (SEQ ID NO:31) and light chain variable domain (SEQ ID NO:32) of the anti-CD3 antibody OKT3 described in Arakawa et al J. Biochem. 120, 657-662 (1996). The CD4 binding Fab fragment was obtained from m13B8.2 (e.g. U.S. Pat. No. 7,482,000) and contained the heavy chain variable domain (SEQ ID NO:29) and light chain variable domain (SEQ ID NO:30) of the anti-CD4 antibody m13B8.2. The CD8 binding Fab fragment was obtained from OKT8 (e.g. ATCC CRL-8014) and contained the heavy chain variable domain (SEQ ID NO:9) and light chain variable domain (SEQ ID NO:10) of the anti-CD8 antibody OKT8. The heavy chain of each of the Fab fragment was carboxy-terminally fused with a Twin Strep-Tag® (SEQ ID NO:16) containing a sequential arrangement of two streptavidin binding modules.

An apheresis sample from a human donor was loaded onto the affinity column and two wash steps performed After more than 30 minutes passed from the time of loading the sample, 40 µg of multimerized anti-CD3 anti-CD28 Fab fragments reversibly bound to an oligomeric streptavidin mutein reagent (anti-CD3/anti-CD28 oligomeric reagent), generated as described in Example 1, was loaded onto the column in 3 mL of serum free basal media containing glutamine and recombinant IL-2, IL-15, and IL-7 and incubated at 37° C. After approximately 24 hours, cells were collected from the column in a single step by passing approximately 80 mL of serum free basal media containing glutamine and recombinant IL-2, IL-15, and IL-7, without the addition of a further competition substance to disrupt the binding, through the column. As a control, an apheresis sample was loaded onto the anti-CD3 affinity column but without incubation in the presence of the anti-CD3/anti-CD28 oligomeric stimulatory reagent. For the control condition, after 24 hours D-biotin was added to disrupt binding between the Twin Strep-Tag® of the anti-CD3 Fab and the STREP-TACTIN®, and released cells were collected by gravity flow.

Figure 3:
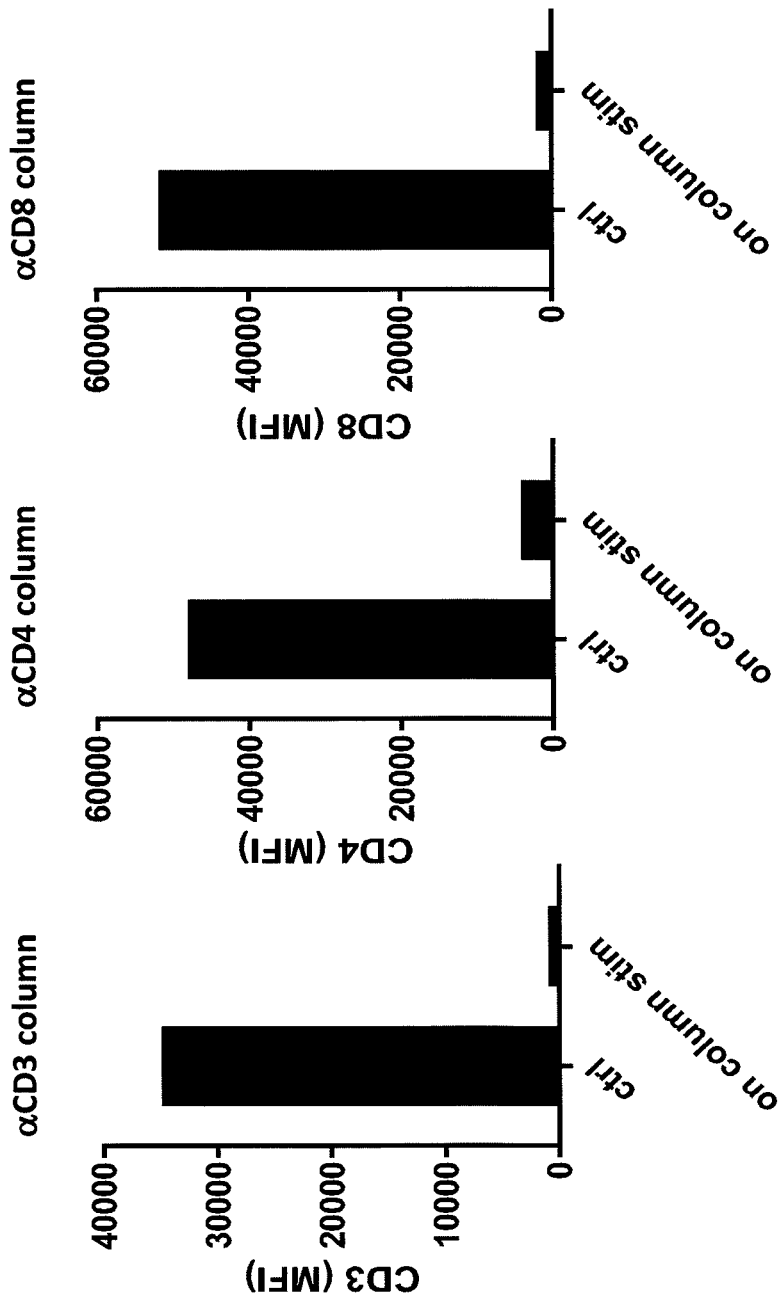
FIG. 3 shows the effects of 24 hour on-column stimulation with an anti-CD3/anti-CD28 oligomeric stimulatory reagent on CD3, CD4, and CD8 surface expression, when the respective molecule was used as a selection marker to immobilize the cell on the stationary phase of a chromatography column. Surface expression patterns are compared to control conditions not involving on-column stimulation with an anti-CD3/anti-CD28 oligomeric stimulatory reagent. Cells were isolated from an apheresis sample applied to the stationary phase.

Approximately 24 hours after the initiation of stimulation with the anti-CD3/anti-CD28 oligomeric reagent, collected cells were analyzed for surface expression of the selection marker. As shown in FIG. 3, downregulation of CD3, CD4, and CD8 was observed at 24 hours following on-column selection using the respective selection agent specific to the selection marker, and incubation with the stimulatory reagent. In contrast, for the control condition in which cells were not incubated with the oligomeric stimulatory reagent, receptor downregulation of the selection marker was not observed. These results are consistent with an observation that stimulation of the T cells with an anti-CD3/anti-CD8 stimulatory reagent resulted in downregulation of surface expression of the receptor, thereby permitting spontaneous detachment of the cells from the column without the need to add a competition reagent.

Figure 4:
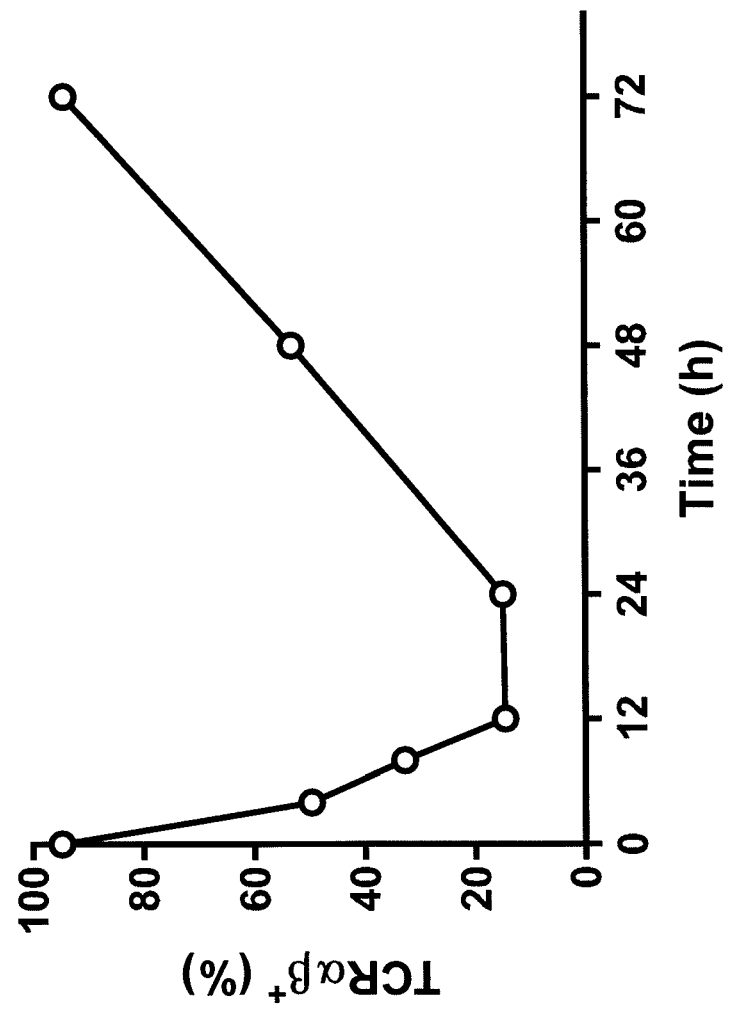
FIG. 4 shows exemplary kinetics of downregulation and re-expression of the TCR/CD3 complex upon on-column stimulation with an anti-CD3/anti-CD28 oligomeric stimulatory reagent when CD3 was used as a selection marker to immobilize the cell on the column. Cells were isolated from an apheresis sample applied to the stationary phase. An antibody against the alpha-beta TCR chains was used to assess the CD3/TCR complex.

A similar study was carried out in which T cells were selected on an anti-CD3 STREP-TACTIN® affinity column and subjected to on-column stimulation with an anti-CD3/anti-CD28 oligomeric stimulatory reagent as described above. Cells were collected by gravity flow at various times after addition of the oligomeric stimulatory reagent. Collected cells were immediately stained with an antibody against alpha-beta TCR chains and monitored by flow cytometry to detect surface expression of CD3. FIG. 4 illustrates exemplary kinetics of CD3/TCR complex downregulation and re-expression following the initiation of the stimulation in the presence of the anti-CD3/anti-CD28 oligomeric stimulatory reagent. As shown, a rapid downregulation of CD3/TCR complex surface expression was observed during the first 24 hours of stimulation, with a maximum reduction in CD3/TCR complex surface expression observed after only 12 hours. Incubation in the presence of the oligomeric stimulatory reagent for longer than 36 hours resulted in re-expression of surface CD3/TCR complex with maximal CD3/TCR complex surface re-expression achieved within about 72 hours after the initiation of the stimulation with the stimulatory reagent. These results support that substantial on-column stimulation-mediated spontaneous T cell detachment can occur within 4 to 6 hours, with maximal release occurring at or approximately at 12 hours, after initiation of the on-column incubation with the stimulatory reagent.

Figure 5A:
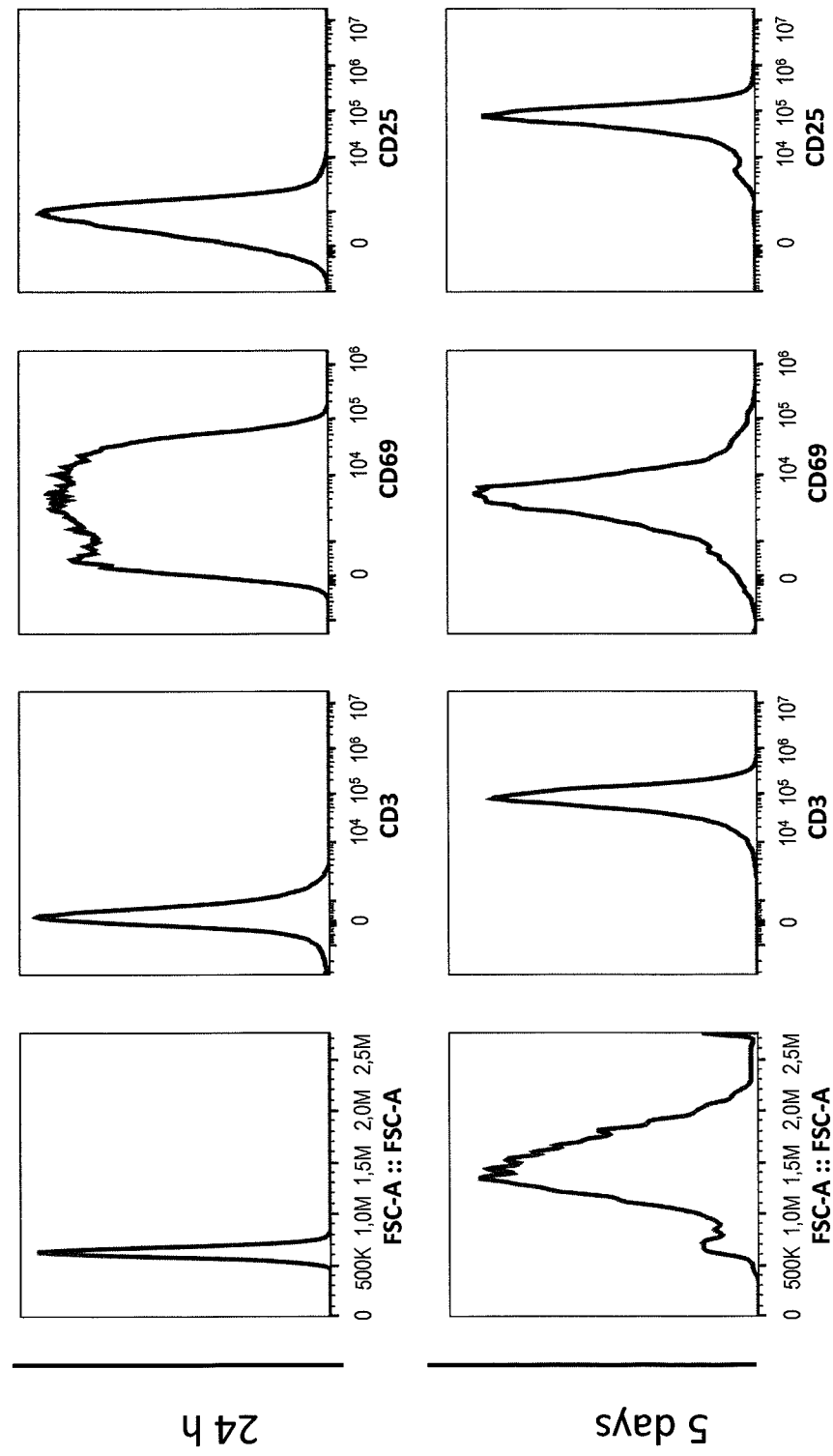
FIGS. 5A-5B show phenotypic and functional characteristics of cultured T cells that spontaneously detached during on-column stimulation with an anti-CD3/anti-CD28 oligomeric stimulatory reagent.
Figure 5B:
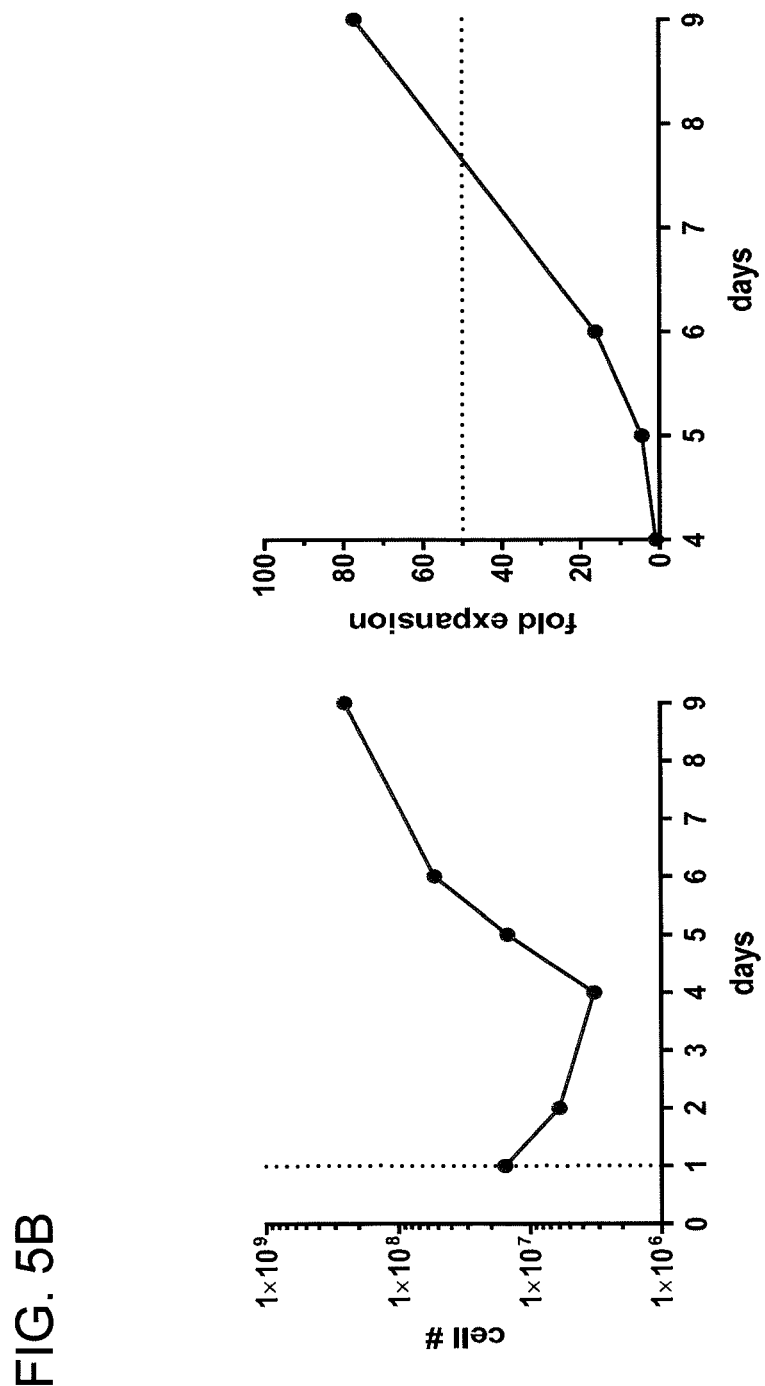

Cells that were spontaneously detached at about 24 hours after adding the anti-CD3/anti-CD28 oligomeric stimulatory reagent were cultured at 37° C. in serum free basal media containing glutamine and recombinant IL-2, IL-15, and IL-7 for up to 9 days. During the incubation, the oligomeric stimulatory reagent was not removed; however, it was diluted as the cells continued to expand during the incubation. The cells were monitored, at 24 hours and at 5 days during the subsequent incubation, for size and expression of CD3 and activation markers CD69 and CD25. As shown in FIG. 5A, further incubation for up to 5 days resulted in re-expression of CD3 following CD3 early downregulation observed at 24 hours. In addition, an increase in cell size and surface expression of activation markers CD25 and CD69 also was observed at 5 days compared to at the 24 hour time point. Assessment for cell number and fold-expansion following the subsequent incubation for up to 9 days showed that spontaneously detached cells demonstrated high proliferative capacity (FIG. 5B). These results are consistent with an observation that T cells that have undergone on-column selection and short-term stimulation are able to be further incubated to attain a desired stimulation, activation and/or expansion.

These results support the use of on-column selection and stimulation as a rapid means (e.g., less than 24 hours) of isolating and stimulating target cells prior to, or in connection with, downstream processes (e.g. transduction) for producing an engineered T cell composition.

Example 4: Assessment of T Cell Phenotype and Function in Engineered T Cells Produced in the Presence of a Small Molecule mTOR Kinase Inhibitor CD4+ and CD8+ T cells were isolated by immunoaffinity-based enrichment from leukapheresis samples from human donor subjects. At day 1, isolated CD4+ and CD8+ T cells were mixed 1:1 and stimulated with an anti-CD3/anti-CD28 oligomeric stimulatory reagent generated as described in Example 1 in serum-free media supplemented with recombinant IL-2 (100 IU/mL), recombinant IL-7 (600 IU/mL), and recombinant IL-15 (100 IU/mL) with or without 1 µM of 2-(3-hydroxyphenyl)-9-(2-isopropylphenyl)-8-oxo-8,9-dihydro-7H-purine-6-carboxamide (Compound 63). The T cells cultured with our without Compound 63 were incubated overnight (approximately 24 hr) at 37° C., and were then transduced in serum-free culture media with our without Compound 63 (1 mM) with a lentiviral vector encoding an anti-CD19 CAR. The CAR contained an scFv antigen-binding domain specific for CD19 (derived from FMC63), a CD28 transmembrane region, a 4-1BB costimulatory signaling region, and a CD3-zeta derived intracellular signaling domain. Following transduction, the cells were incubated in serum free media without recombinant cytokines (basal media) and with or without Compound 63 (1 mM) and allowed to incubate at about 37.0° C. in an incubator for up to 96 hours after initiation of the stimulation with the anti-CD3/anti-CD28 oligomeric stimulatory reagent (until day 5 of the process). At approximately 24 hours after beginning the incubation (day 3 of the process), 1 mM biotin was added. Following incubation CD4+ and CD8+ T cells from each donor were harvested, formulated, and cryofrozen.

Figure 6B:
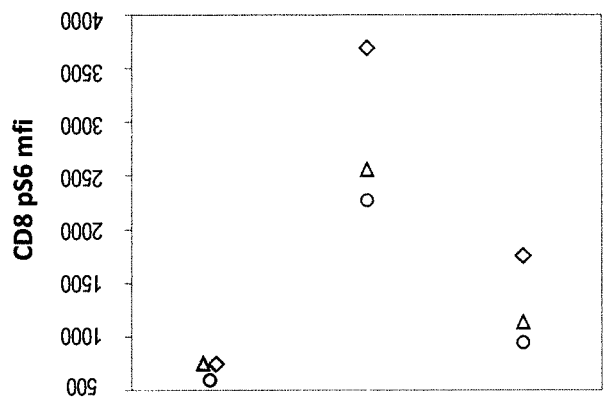
FIGS. 6A-6D show exemplary effects of incubating T cells with an anti-CD3/anti-CD28 oligomeric stimulatory reagent in the presence or absence of Compound 63 on mTor signaling and viability and growth kinetics.
Figure 6D:
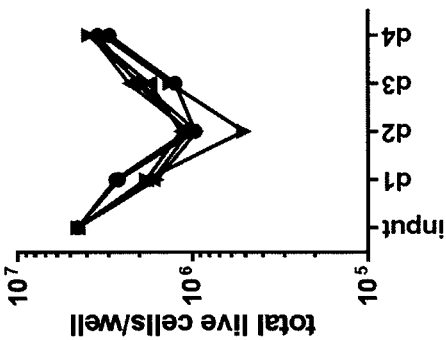
Figure 6A:
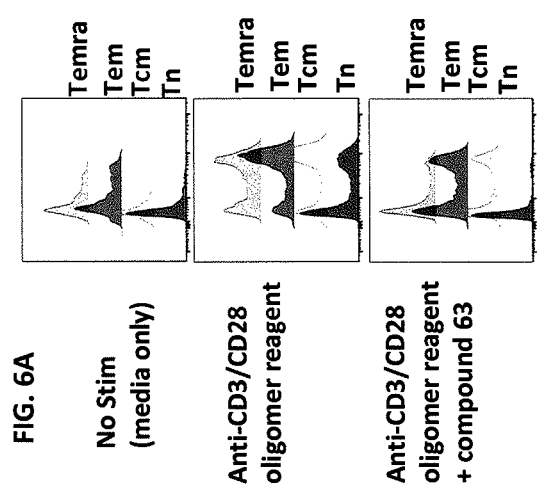
Figure 6C:
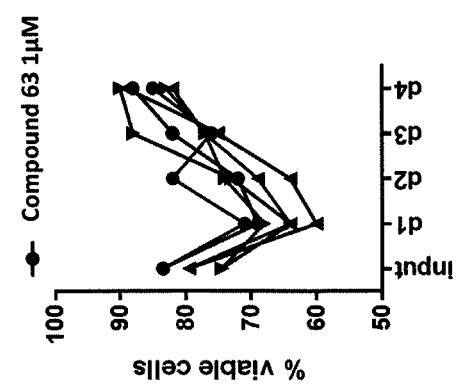

The cryofrozen engineered CD4+ and CD8+ T cells were thawed, and T cells were assessed for intracellular S6 phosphorylation, a ribosomal protein and marker of mTOR inhibition, and co-stained for surface expression of CD4 or CD8 and for CCR7 and CD45RA as markers of memory subsets. pS6 expression in live CD8+ T cells by memory subsets was shown by the expression of CCR7 and CD45RA as shown in FIG. 6A. As shown, incubation with Compound 63 decreased the mean fluorescence intensity of stimulated memory T cell subsets, Temra, Tem, and Tcm cells, indicating an inhibition of mTOR, while having no significant effect on the percentage or total number of viable cells over time. Mean fluorescence intensity (MFI) of PS6 in CD8+ T cells is shown in FIG. 6B. As shown in FIG. 6C and FIG. 6D, the presence of compound 63 did not impact the percent viable cells or the total live cells, respectively, in the generated composition.

Thawed cells generated by the process described were assessed for a marker of apoptosis (e.g., percentage of caspase positive CAR-T cells), phenotypic profile, and ability to produce intracellular cytokines following stimulation with PMA/Ionomycin and a Golgi Inhibitor. As shown in FIG. 7A, T cells from samples incubated with compound 63 exhibited less intracellular caspase expression than those not incubated with compound 63, indicating that the presence of compound 63 during the process for generating the engineered cells improved overall cell heath of the T cell composition. Thawed cells also were stained for surface expression of CD27 and CCR7 by flow cytometry. As shown in FIG. 7B (CD8+ T cells) and FIG. 7D (CD4+ T cells), incubation with compound 63 did not substantially alter the phenotypic subset profile of the cells as assessed by expression of CD27 and/or CCR7. The functional activity of CD4+ and CD8+ T cells produced in the presence of compound 63, as evidenced by the level of intracellular cytokines IL2, IFNg, or TNF, was substantially improved in both the engineered CD8+ T cells (FIG. 7C) and CD4+ T cells (FIG. 7E) that had been produced in the presence of Compound 63.

To further assess the functional activity of the cells, the generated T cell compositions were stimulated long-term over 12 days with beads conjugated with an anti-idiotype (ID) antibody against the anti-CD19 CAR, and expansion and survival of the cells were monitored (FIG. 7F, left panel) and total expansion metric calculated by area under the curve (FIG. 7F, right panel). As shown, stimulation of the cells in the absence of compound 63 resulted in a decreased expansion of the cells over time consistent with chronic stimulation of the CAR and loss of sustained function following the long-term stimulation. The results show that improved function of the T cells was observed following long-term CAR-specific stimulation in engineered cells that had been produced in the presence of compound 63.

Example 5: Assessment of Phenotypic and Functional Properties of T Cells Engineered Using a Combined Selection and On-Column Stimulation Process The process combining selection and stimulation steps in a chromatography column (on-column selection and stimulation) was performed substantially as described in Example 3, but at a larger scale. The on-column selection and stimulation process was compared to an alternative process that was substantially similar but in which the stimulation step was carried out separately from selection and in solution.

A. On-Column Selection and Stimulation

On day 0, an apheresis sample from a human donor was loaded onto an affinity column containing a Sephadex G50 (Sigma) stationary phase covalently coupled to StrepTactin® (SEQ ID NO: 6) using a cyanogen bromide (CNBr) activated resin. The 20 mL stationary phase was capable of accommodating up to 2 billion±0.5 billion cells. The selection agent, an anti-CD3 binding Fab fragment as described in Example 3, was immobilized on the stationary phase through a heavy chain carboxy-terminally fused streptavidin binding peptide (Twin Strep-Tag®; SEQ ID NO:16) capable of binding to StrepTactin.

After approximately 60 minutes from the time of loading the sample, multimerized anti-CD3 anti-CD28 Fab fragments reversibly bound to an oligomeric streptavidin mutein reagent (anti-CD3/anti-CD28 oligomeric reagent), generated as described in Example 1, were loaded onto the column at a fixed dose of 0.2-0.3× (1-2 µg/1 million cells) in serum free media containing recombinant IL-2 (e.g. 100 IU/mL), IL-15 (e.g. 100 IU/mL), and IL-7 (e.g. 600 IU/mL) and incubated at 37° C. in the column for approximately 4.5 hours. During the incubation, the stimulation with the anti-CD3/anti-CD28 oligomeric reagent resulted in detachment or release of immobilized cells from the selection agent on the column. Released cells were eluted from the column by gravity flow with the same serum free media. The media did not include biotin or any competition substance to disrupt the binding between the StrepTactin® on the stationary phase and the streptavidin binding peptide fused to the anti-CD3 antibody used to immobilize the cells on the stationary phase of the column.

The released and collected cells were then transduced to express a chimeric antigen receptor (CAR) by incubation for 1 hour in the same serum free media with a lentiviral vector encoding an exemplary anti-CD19 CAR. The exemplary CAR contained an anti-CD19 scFv derived from a murine antibody FMC63, an immunoglobulin spacer, a transmembrane domain derived from CD28, a costimulatory region derived from 4-1BB, and a CD3-zeta intracellular signaling domain. For transduction, the culture volume was adjusted to $1 \times 10^6$ cells/mL.

The transduced cells were washed and then further incubated at 37° C. About 48 hours after initiation of the on-column stimulation with the anti-CD3/anti-CD28 oligomeric reagent, 1.0 mM D-biotin was added and mixed with the cells to dissociate the anti-CD3 and anti-CD28 Fabs from the soluble oligomeric streptavidin mutein reagent.

After addition of the biotin, the cells were further incubated at 37° C. for an additional about 24 hours. The cells were then divided into two subsets. In a first subset, the cells were directly formulated with a cryoprotectant. In a second subset, the volume of the cells was adjusted to $0.5 \times 10^6$ cells/mL in serum free media containing twice the concentration of IL-2, IL-7 and IL-15 as used during the incubation and transduction steps. The cells of this second subset were further incubated for expansion by cultivation for another 5 days at 37° C. in static culture with media exchange, and then were formulated with a cryprotectant.

B. Alternative Process: Separate Selection and Stimulation (in Solution)

The alternative process proceeded generally as described above, but the steps for selection and stimulation were not combined in the column. An apheresis sample from the same human donor was loaded onto an affinity column containing an anti-CD3 selection reagent as described above for selection of CD3+ T cells. To elute the selected cells, 1.0 mM D-biotin was added to the column and the eluted cells were collected. D-biotin acted as a competition substance to disrupt the binding between the streptavidin binding peptide fused to the anti-CD3 Fab and the StrepTactin® on the stationary phase to release the cells from the column and the anti-CD3 Fab.

At day 0 of the alternative process, the selected cells were washed, diluted to $1 \times 10^6$/mL, and stimulated by incubation with anti-CD3/anti-CD28 Fab conjugated oligomeric streptavidin mutein reagents, generated as described in Example 1, at a fixed dose (0.3×, approximately 2 µg/1 million cells). The stimulation was carried out for between about 18-30 hours (24±6 hours) in serum-free media containing recombinant IL-2 (e.g. 100 IU/mL), recombinant IL-7 (e.g. 600 IU/mL), and recombinant IL-15 (e.g. 100 IU/mL).

After stimulation, the cells were transduced by spinoculation for 30 minutes in the same serum free media with a lentiviral vector encoding the same exemplary anti-CD19 CAR as described above.

After spinoculation, the cells were washed and then further incubated at 37° C. About 48±6 hours after initiation of the stimulation with the anti-CD3/anti-CD28 oligomeric reagent, 1.0 mM D-biotin was added and mixed with the cells to dissociate the anti-CD3 and anti-CD28 Fabs from the oligomeric streptavidin reagent.

After addition of the biotin, the cells were further incubated at 37° C. for an additional about 24 hours. The cells were then divided into two subsets similar to above. In a first subset, the cells were directly formulated with a cryoprotectant. In a second subset, the cells were further incubated for expansion by cultivation for a further 5 days at 37° C. in static culture with media exchange, and then were formulated with a cryprotectant.

C. Assessment of Cell Recovery and Phenotype

Figure 8A:
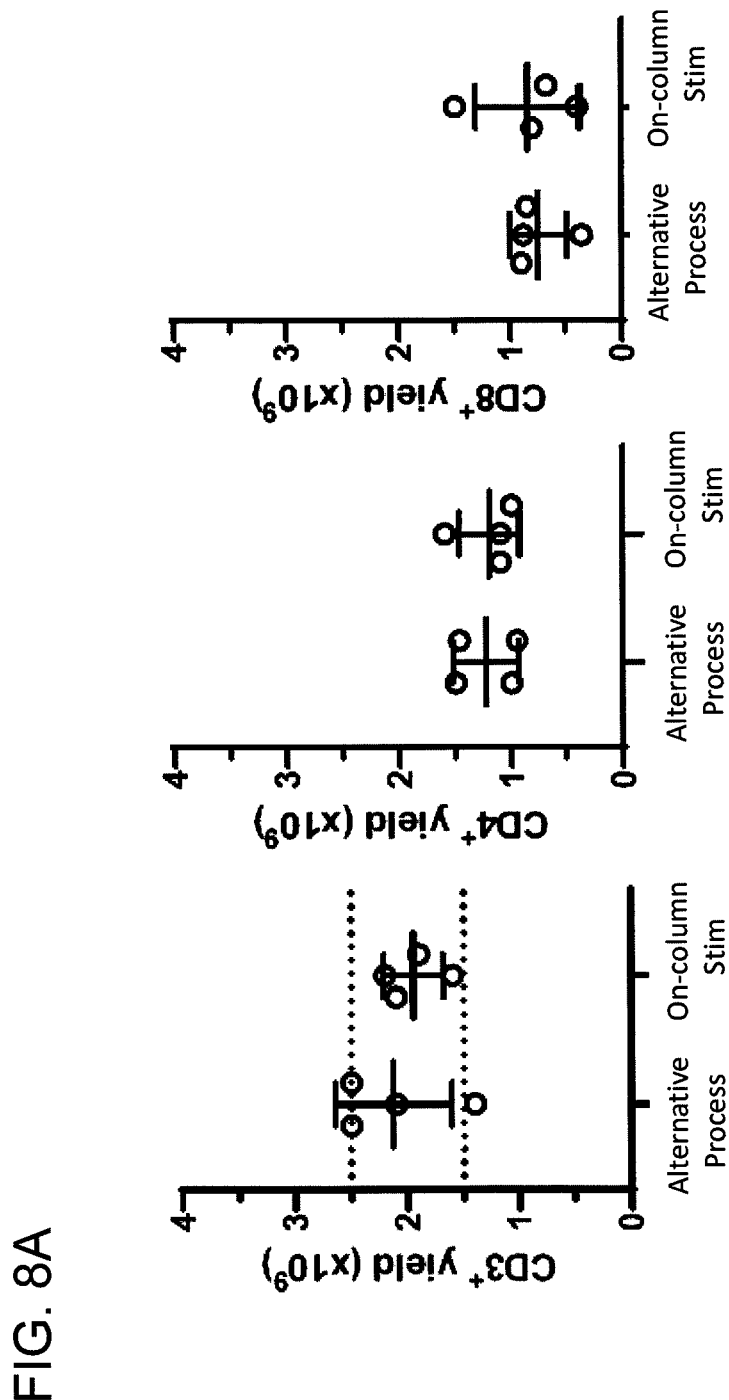
FIG. 8A shows CD3+, CD4+ and CD8+ T cell yields following cell selection either using the on-column stimulation process or alternative process described in Example 5.
Figure 8B:
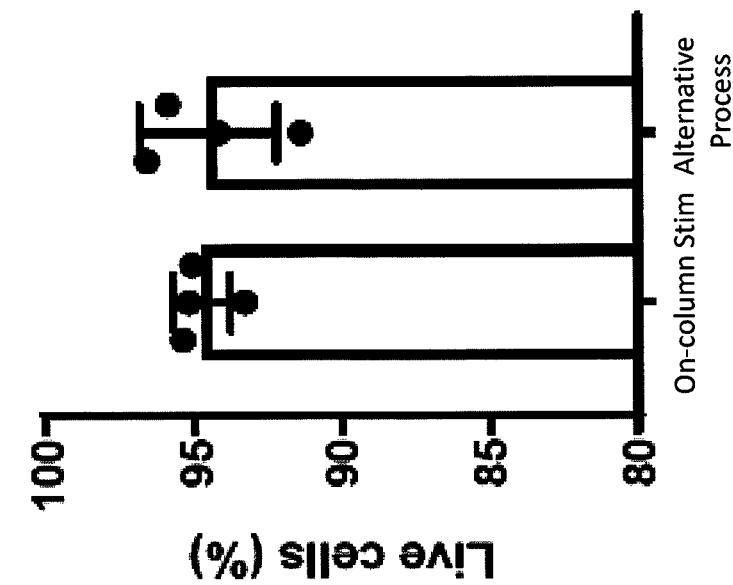
FIGS. 8B-8C show the total number of cells (FIG. 8B) and percentage of live cells (FIG. 8C) recovered following the use of on-column stimulation or alternative processes described in Example 5.
Figure 8C:
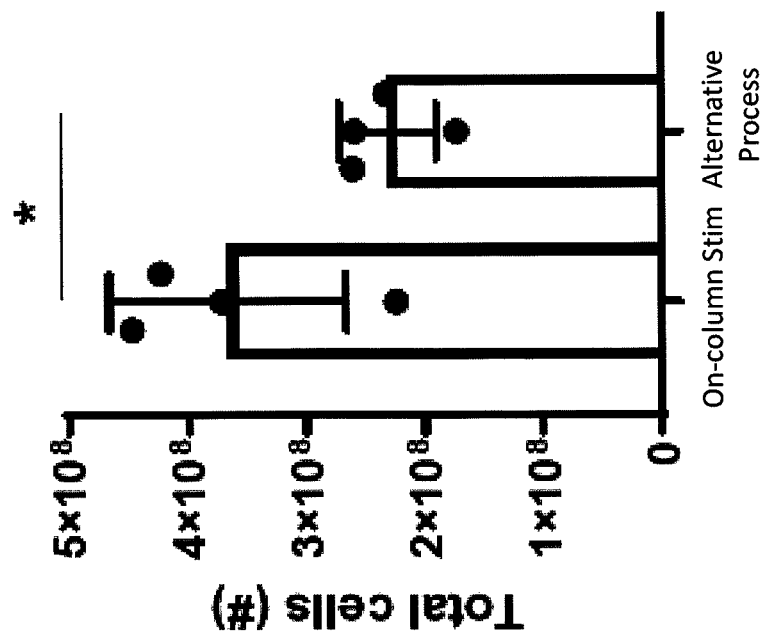

Yield of CD3+, CD4+ and CD8+ T cells that had been released from the column following on-column selection and stimulation were compared against the cells that had been released from the column in the alternative process in which only the selection was carried out on the column with the addition of biotin to release the cells. As shown in FIG. 8A, the CD3+ T cell yield, as well as the CD4+ and CD8+ T cell yield, was similar in both processes. Total cell count and percentage of live cells after stimulation among cells that had been released from the column following on-column selection and stimulation were compared against cells after separate stimulation of selected cells in the alternative process FIGS. 8B and 8C show the total cell counts and percentage of live cells, respectively, after stimulation for both processes. In this experiment, cell recovery was greater for the process using on-column stimulation.

Figure 9A:
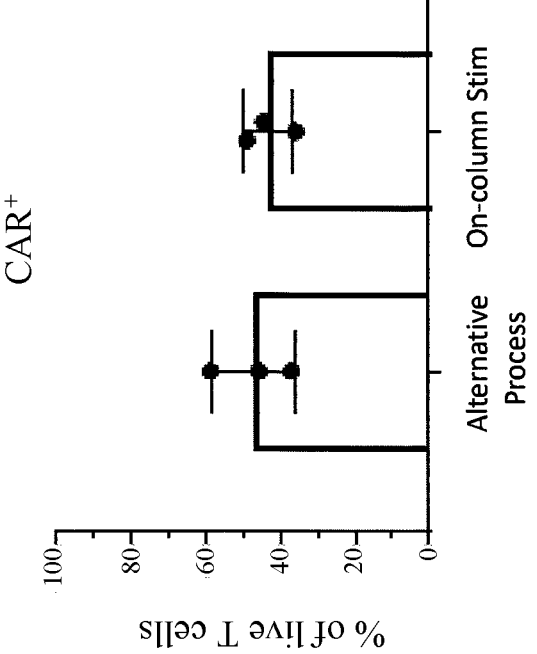
FIGS. 9A-9D show the percentage of live cells (e.g., purity.
Figure 9B:
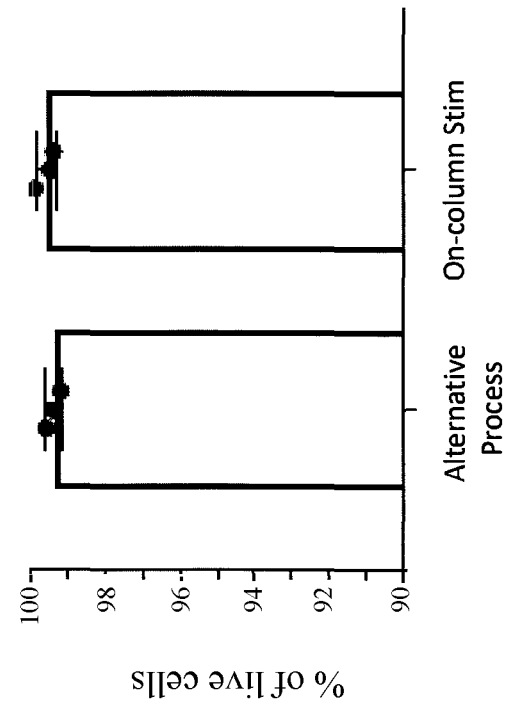
Figure 9C:
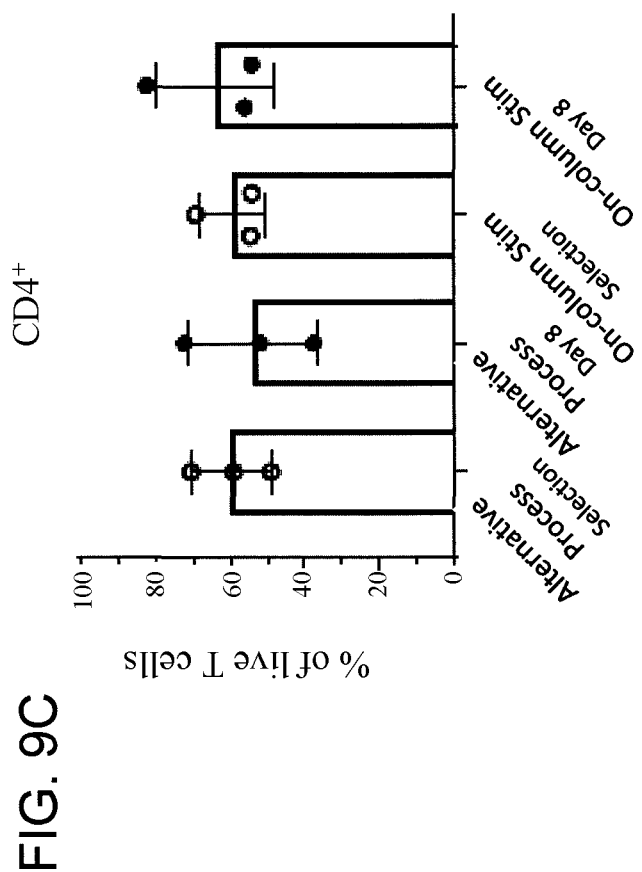

For processes that included an additional 5 day cultivation, the quality and phenotype of cell populations engineered by each process were assessed on day 5 in culture (day 8 from the start of the process). FIGS. 9A and 9B show the percentage of live T cells recovered and the percentage of live cells expressing the exemplary CAR (CAR+), respectively, for each process. Samples from the compositions generated from both processes after the further cultivation for 5 days (day 8 from start of process) were assessed by flow cytometry for surface expression of markers that included CD4, CD8, CD27 and CCR7. FIG. 9C provides a comparison of the percentage of CD4+ T cells obtained from the selection step (alternative process) or combined selection and stimulation step (on-column stimulation) against the percentage of live CD4+ T cells present in cell compositions on the last day of culture after the further cultivation (day 5).

Figure 9D:
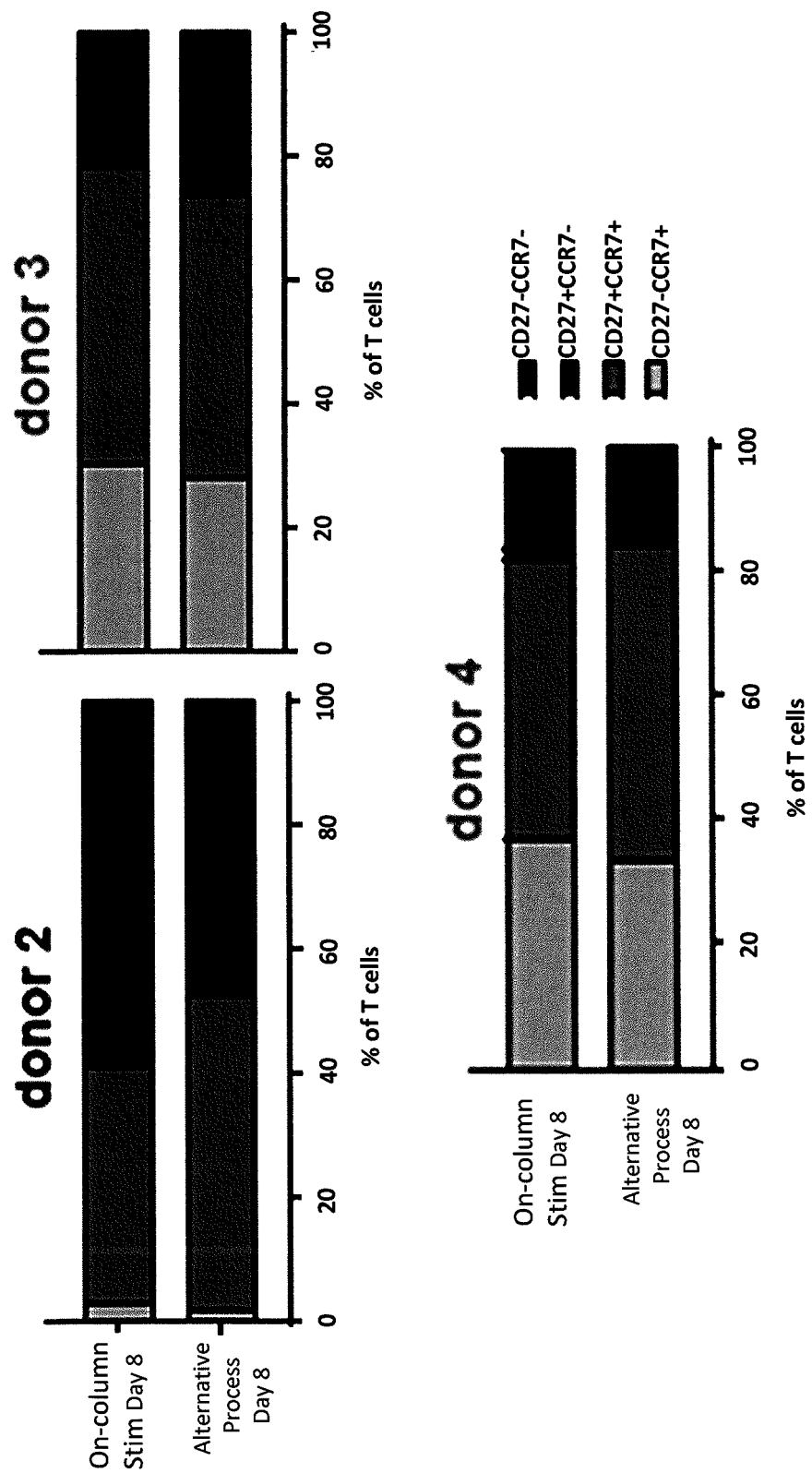

FIG. 9D shows the percentage of CD27-CCR7-, CD27+CCR7-, CD27+CCR7+ and CD27-CCR7+ T cells in the compositions generated by the on-column stimulation process was similar to the percentages present in a cell composition produced by the alternative process.

D. Assessing Function of Engineered T Cells Manufactured Using On-Column Stimulation The functional capabilities of engineered T cells manufactured using a process including on-column stimulation were assessed both in vitro and in vivo. The results were compared against engineered T cells manufactured using the alternative process.

1. In Vitro Functional Analysis

Figure 10:
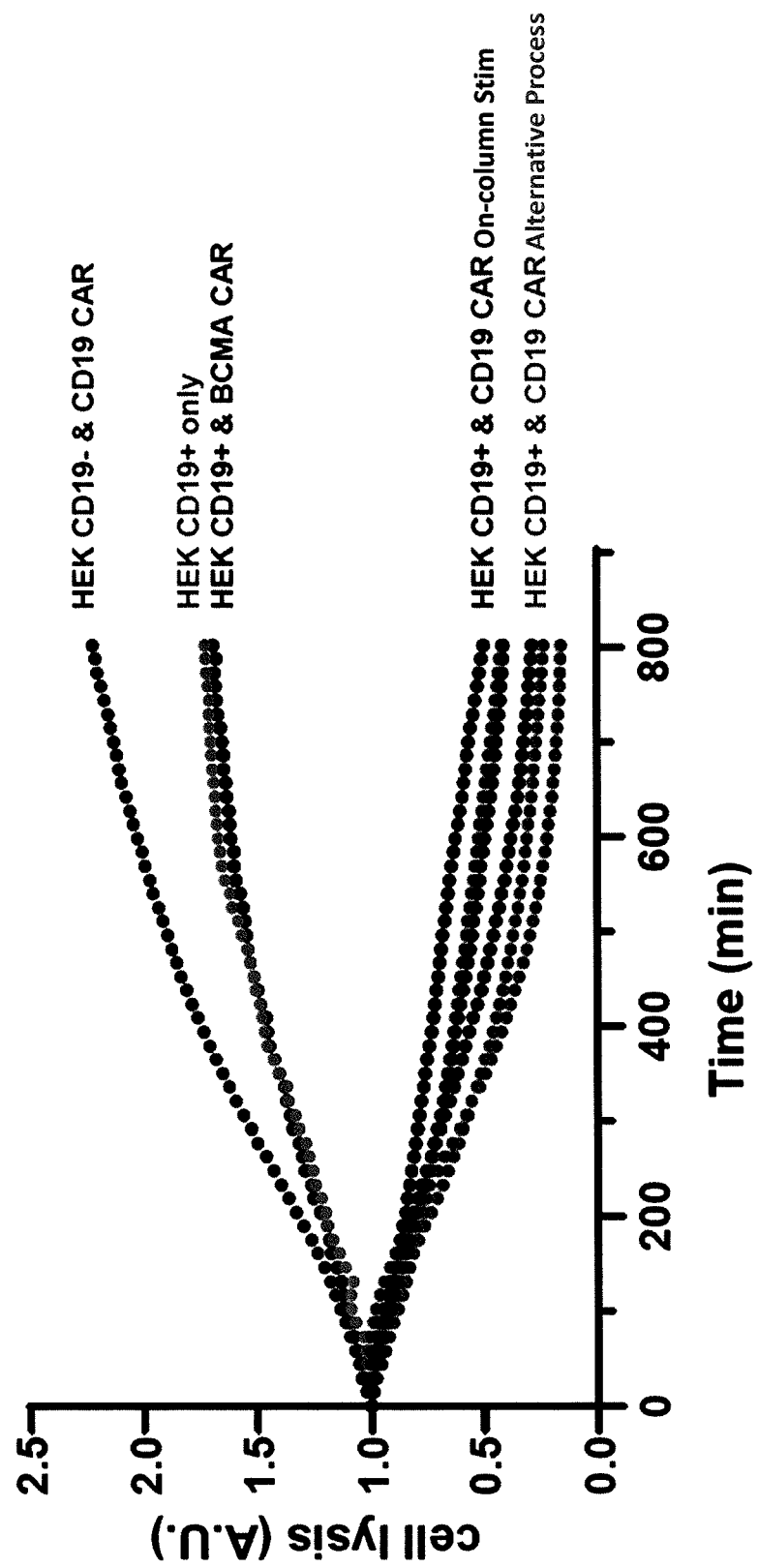
FIG. 10 shows CD19+ HEK cell lysis over time during culture with anti-CD19 CAR T cells engineered using on-column stimulation or alternative processes, as described in Example 5, and under control conditions.

Cytolytic activity was assessed by co-culturing the engineered anti-CD19 CAR T cells with HEK cells expressing CD19 (HEK CD19) at an effector to target ratio of 5:1. Cell lysis was determined by impedance measurements taken at multiple time points during culture. Control conditions included incubation of T cells expressing an alternative CAR directed against a different target (BCMA) (HEK CD19+ BCMA CAR), target cells only (HEK CD19+ only), or non-target cells incubated with anti-CD19 CART cells (HEK CD19– & CD19 CAR). As shown in FIG. 10, cytolytic activity was specific to target cells, and CAR T cells manufactured by the on-column stimulation process exhibited potent cytolytic activity that was similar to cells engineered by the alternative process. These data demonstrate that the engineered T cells manufactured using on-column stimulation have comparable potency to engineered T cells manufactured using the alternative process.

Figure 11A:
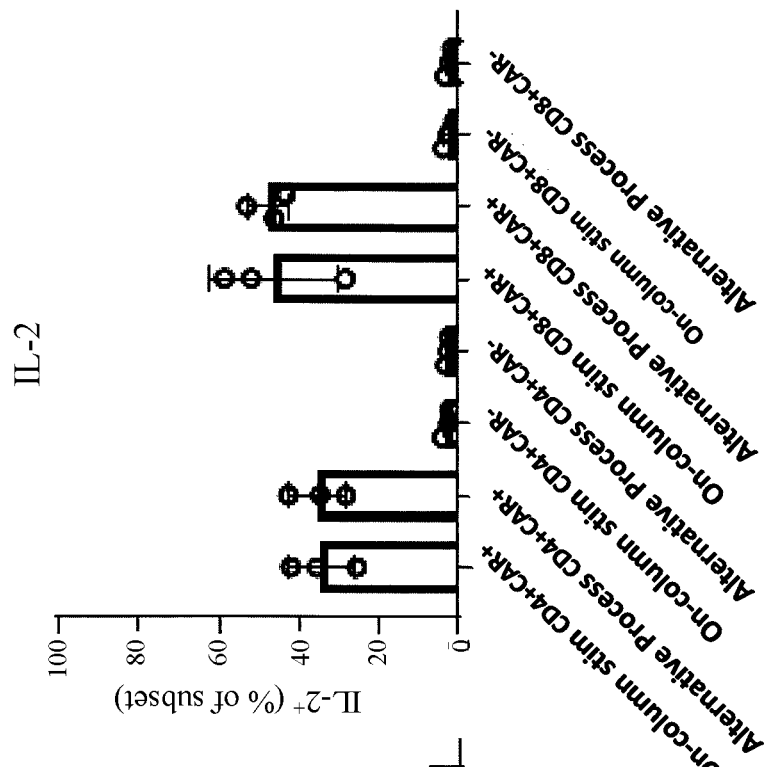
FIGS. 11A-11C show antigen-specific CAR T cell IFNg (FIG. 11A), IL-2 (FIG. 11B), and TNF-α (FIG. 11C) production for CD4 and CD8 T cells engineered using the on-column stimulation or the alternative processes described in Example 5.
Figure 11B:
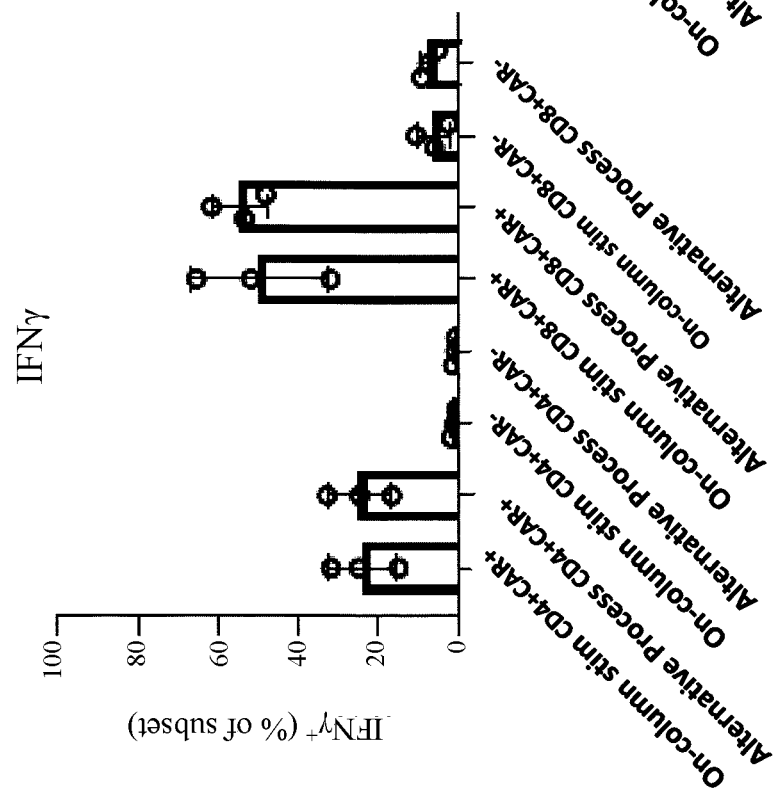
Figure 11C:
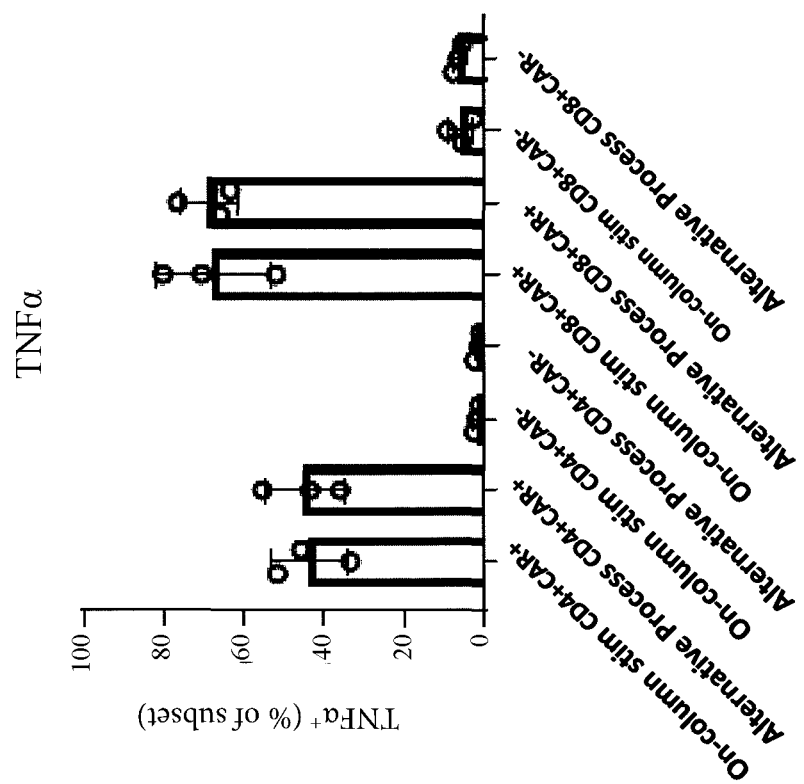

The cytokine activity of the engineered T cells was assessed by monitoring cytokine accumulation following antigen-specific stimulation with a target cell line (CD19+ HEK cells) in the presence of Golgi inhibitor. Cytokine production was assessed by flow cytometry following intracellular cytokine staining for IFNg, IL-2, and TNF-alpha in cells that were also co-stained for surface CD4, CD8 or the anti-CD19 CAR. FIGS. 11A-11C show the percentages of CD4+ and CD8+ T cell subsets derived from each manufacturing process that expressed IFNg, IL-2, and TNF-alpha, respectively. T cells manufactured according to the two methods, but lacking CAR expression were used as controls. These data demonstrate that CAR T cell antigen-specific cytokine production is comparable in cells produced between the manufacturing processes.

2. In vivo Functional Analysis

The anti-tumor activity of T cell compositions containing anti-CD19 CAR T cells generated from the on-column stimulation and alternative engineering processes were compared in vivo.

Figure 12B:
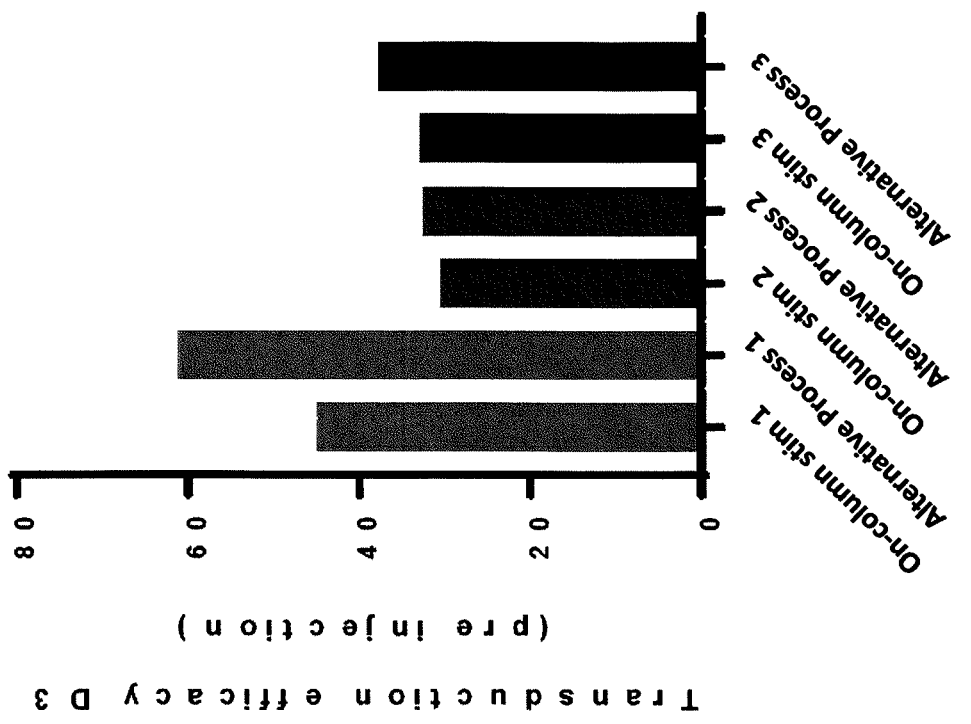
FIGS. 12A-12C show the CD4:CD8 ratio (FIG. 12A), transduction efficiency of engineered T cells (CD4 and CD8 cells combined.
Figure 12A:
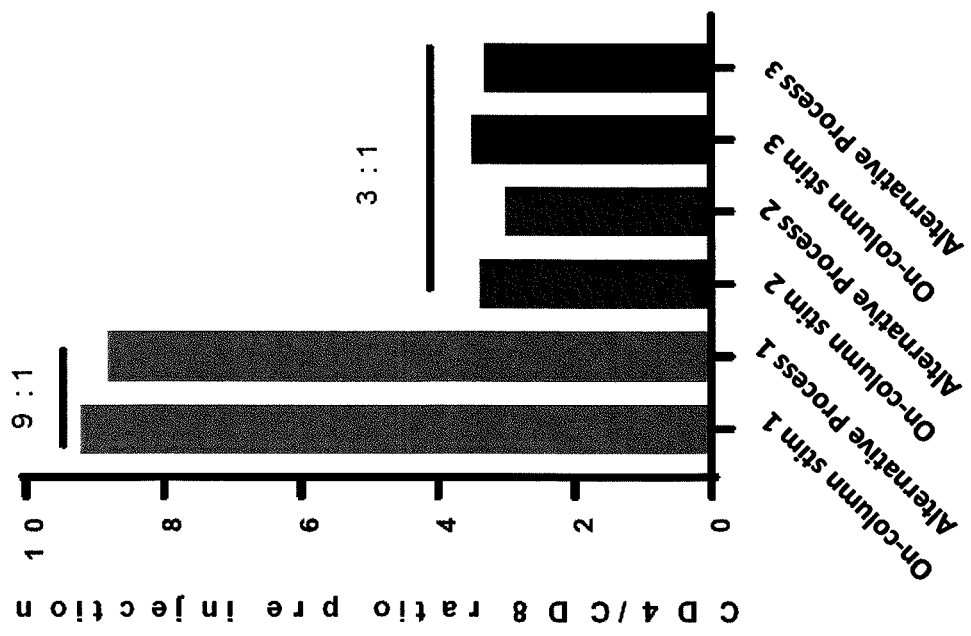
Figure 12C:
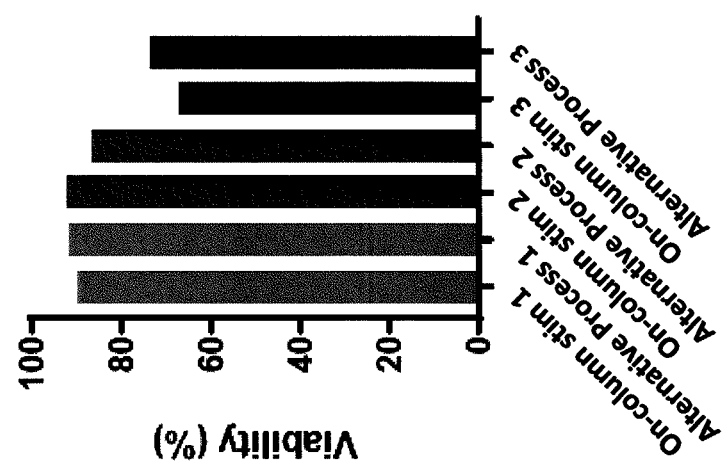

Immunocompromised NSG mice were injected (i.v.) with $5 \times 10^5$ B cell lymphoma cell line (Raji) at day 0. On day 7, mice were injected with $0.75 \times 10^6$ CAR+ T cells from CAR+ engineered compositions produced by either the on-column stimulation or alternative process. Three manufacturing runs were completed for each process from three different donors and each produced engineered CAR+ T therapeutic cell composition was tested. FIGS. 12A-12C show CD4:CD8 ratio, transduction efficiency, and percentage of viable cells, respectively, of each engineered therapeutic composition prior to injection. As shown, cells from both processes produced comparable engineered cells for each donor, although some donor variability was observed.

Figure 13:
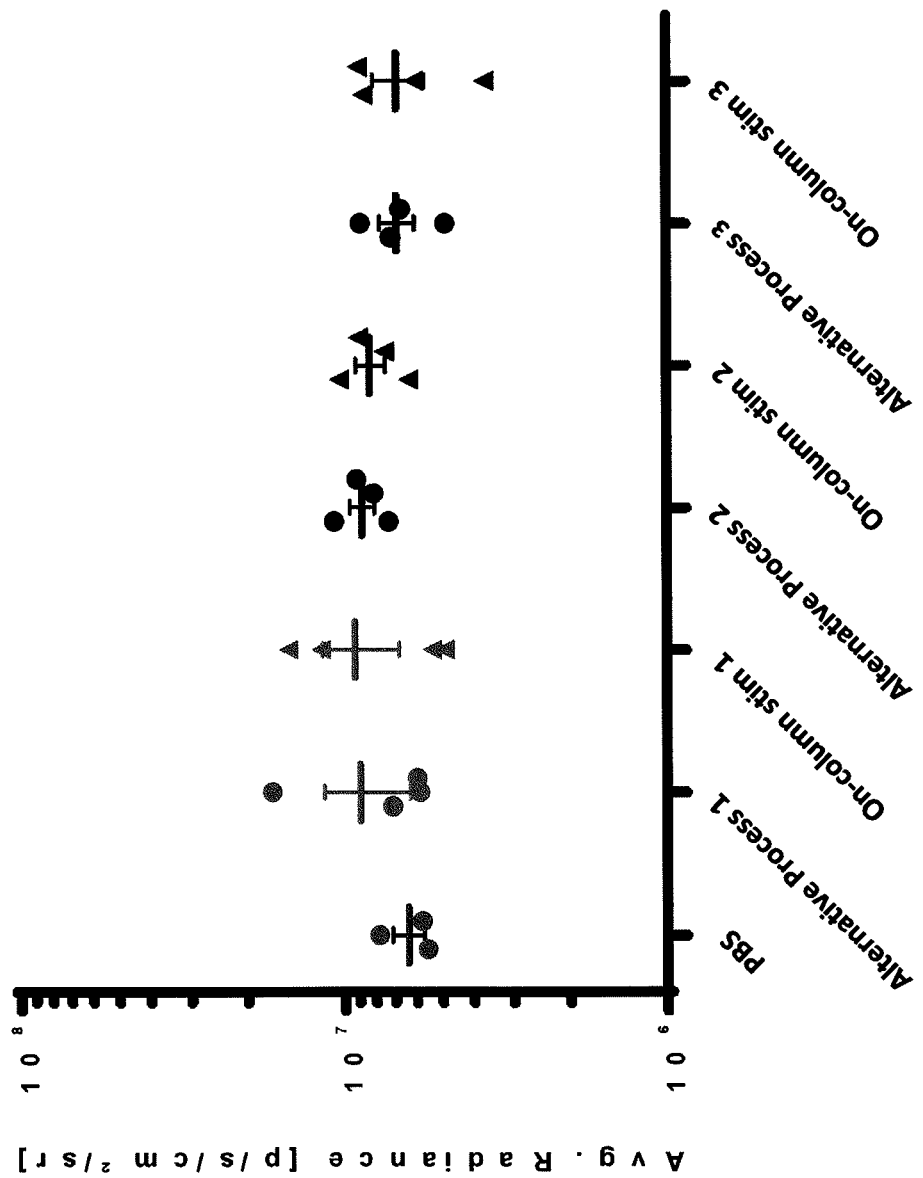
FIG. 13 shows tumor size by average radiance across treatment groups 6 days after mice were injected (i.v.) with B cell lymphoma cell line (Raji).
Figure 14:
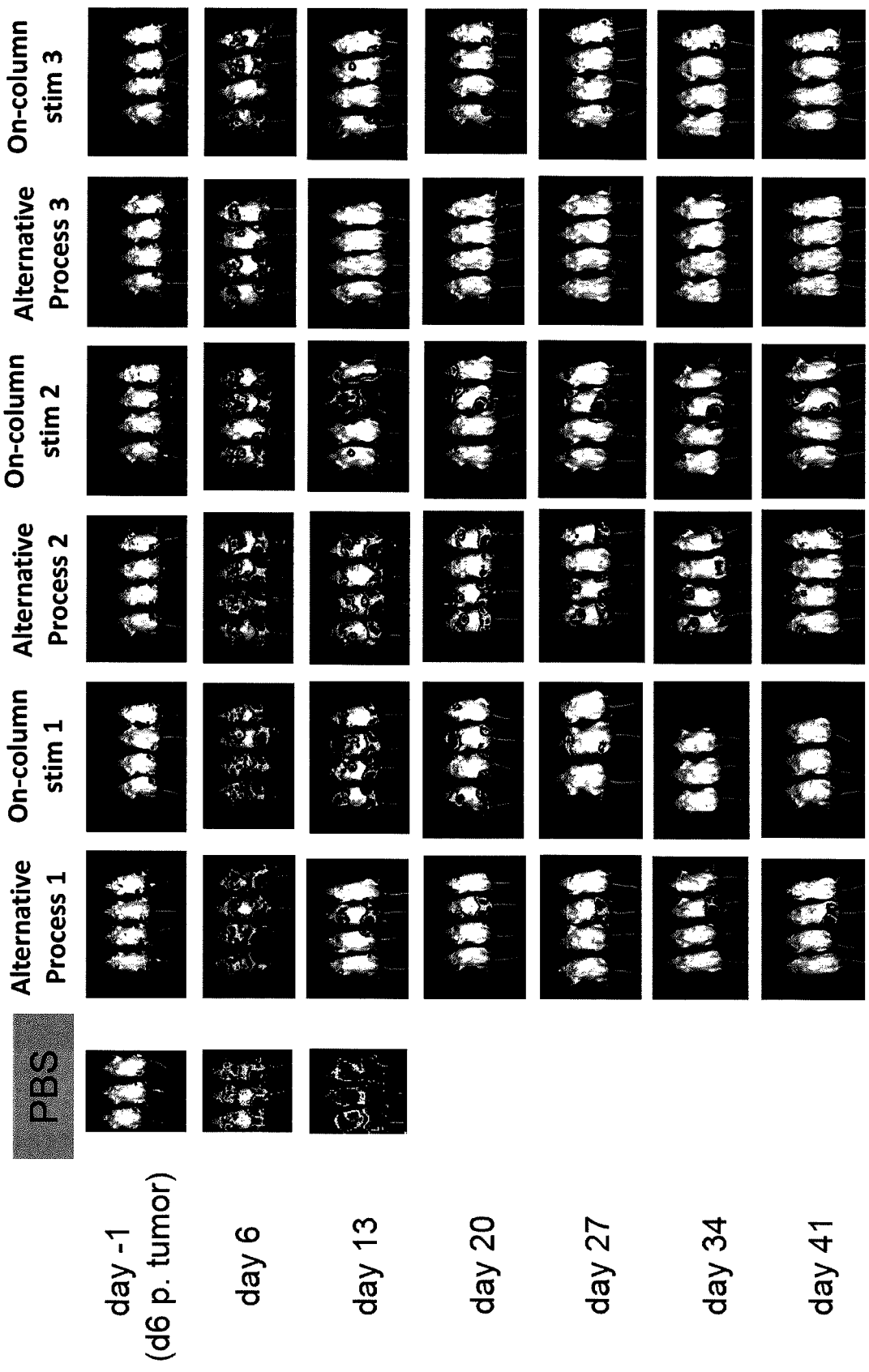
FIG. 14 shows tumor burden in B cell lymphoma cell line (Raji) injected mice over time for each treatment group. CAR T cell treatment effects are shown for on-column stimulation or the alternative processes described in Example 5, and each of the three manufacturing runs (see FIGS. 12A-12C).

Tumor burden was measured in vivo by in-life luminescence imaging at different time points up to 41 days following administration of CAR-T cells. Six days following tumor injection, animals in all treatment groups showed similar tumor burden (FIG. 13). As shown in FIG. 14, tumor burden was substantially reduced over time across all treatment groups. These results demonstrate comparable anti-tumor efficacy between the CAR+ engineered therapeutic T cells produced by the manufacturing processes.

E. Conclusion

Together, these data indicate that on-column selection and stimulation can be used in a process for producing engineered T cells (e.g. CAR+ T cells), including in a process in which selected T cells are collected from the column within 4.5 hours after initiation of stimulation with anti-CD3/anti-CD28 oligomeric reagent for use in subsequent steps of the process including transduction. The results demonstrate that the on-column selection and stimulation process results in an engineered (e.g. CAR+ cells) cell composition that exhibits phenotypic and functional features that are comparable to the alternative process, yet can be carried out more efficiently and in a shorter time due to the ability to combine the selection and stimulation in a single step.

The present invention is not intended to be limited in scope to the particular disclosed embodiments, which are provided, for example, to illustrate various aspects of the invention. Various modifications to the compositions and methods described will become apparent from the description and teachings herein. Such variations may be practiced without departing from the true scope and spirit of the disclosure and are intended to fall within the scope of the present disclosure.

SEQUENCES

| No. | Sequence | Description |
|-----|----------|-------------|
| 1 | DPSKDSKAQVSAAEAGITGTWYNQLGSTFIVTAGADGALT GTYESAVGNAESRYVLTGRYDSAPATDGSGTALGWTVAW KNNYRNAHSATTWSGQYVGGAEARINTQWLLTSGTTEAN AWKSTLVGHDTFTKVKPSAASIDAAKKAGVNNGNPLDAV QQ | Streptavidin Species: *Streptomyces avidinii* UniProt No. P22629 |
| 2 | MetGluAlaGlyIleThrGlyThrTrpTyrAsnGlnLeuGlySerThrPheIle ValThrAlaGlyAlaAspGlyAlaLeuThrGlyThrTyrGluSerAlaValGly AsnAlaGluSerArgTyrValLeuThrGlyArgTyrAspSerAlaProAlaThr AspGlySerGlyThrAlaLeuGlyTrpThrValAlaTrpLysAsnAsnTyrArg AsnAlaHisSerAlaThrThrTrpSerGlyGlnTyrValGlyGlyAlaGluAla ArgIleAsnThrGlnTrpLeuLeuThrSerGlyThrThrGluAlaAsnAlaTrp LysSerThrLeuValGlyHisAspThrPheThrLysValLysProSerAlaAla Ser | Minimal streptavidin Species: *Streptomyces avidinii* |

-continued

SEQUENCES

| No. | Sequence | Description |
|---|---|---|
| 3 | DPSKDSKAQVSAAEAGITGTWYNQLGSTFIVTAGADGALT<br>GTYVTARGNAESRYVLTGRYDSAPATDGSGTALGWTVAW<br>KNNYRNAHSATTWSGQYVGGAEARINTQWLLTSGTTEAN<br>AWKSTLVGHDTFTKVKPSAASIDAAKKAGVNNGNPLDAV<br>QQ | Mutein Streptavidin Val44-Thr45-Ala46-Arg47 Species: *Streptomyces avidinii* |
| 4 | MetGluAlaGlyIleThrGlyThrTrpTyrAsnGlnLeuGlySerThrPheIle<br>ValThrAlaGlyAlaAspGlyAlaLeuThrGlyThrTyrValThrAlaArgGly<br>AsnAlaGluSerArgTyrValLeuThrGlyArgTyrAspSerAlaProAlaThr<br>AspGlySerGlyThrAlaLeuGlyTrpThrValAlaTrpLysAsnAsnTyrArg<br>AsnAlaHisSerAlaThrThrTrpSerGlyGlnTyrValGlyGlyAlaGluAla<br>ArgIleAsnThrGlnTrpLeuLeuThrSerGlyThrThrGluAlaAsnAlaTrp<br>LysSerThrLeuValGlyHisAspThrPheThrLysValLysProSerAlaAla<br>Ser | Mutein Streptavidin Val44-Thr45-Ala46-Arg47 Species: *Streptomyces avidinii* |
| 5 | DPSKDSKAQVSAAEAGITGTWYNQLGSTFIVTAGADGALT<br>GTYIGARGNAESRYVLTGRYDSAPATDGSGTALGWTVAW<br>KNNYRNAHSATTWSGQYVGGAEARINTQWLLTSGTTEAN<br>AWKSTLVGHDTFTKVKPSAASIDAAKKAGVNNGNPLDAV<br>QQ | Mutein Streptavidin Ile44-Gly45-Ala-46-Arg47 Species: *Streptomyces avidinii* |
| 6 | MetGluAlaGlyIleThrGlyThrTrpTyrAsnGlnLeuGlySerThrPheIle<br>ValThrAlaGlyAlaAspGlyAlaLeuThrGlyThrTyrIleGlyAlaArgGly<br>AsnAlaGluSerArgTyrValLeuThrGlyArgTyrAspSerAlaProAlaThr<br>AspGlySerGlyThrAlaLeuGlyTrpThrValAlaTrpLysAsnAsnTyrArg<br>AsnAlaHisSerAlaThrThrTrpSerGlyGlnTyrValGlyGlyAlaAlaAla<br>ArgIleAsnThrGlnTrpLeuLeuThrSerGlyThrThrGluAlaAsnAlaTrp<br>LysSerThrLeuValGlyHisAspThrPheThrLysValLysProSerAlaAla<br>Ser | Mutein Streptavidin Ile44-Gly45-Ala-46-Arg47 Species: *Streptomyces avidinii* |
| 7 | Trp-Arg-His-Pro-Gln-Phe-Gly-Gly | Streptavidin binding peptide, Strep-tag® |
| 8 | WSHPQFEK | Strep-tag® II |
| 9 | His-Pro-Xaa | Streptavidin Binding peptide Xaa is selected from Gln, Asp, and Met |
| 10 | His-Pro-Gln-Phe | Streptavidin-binding peptide |
| 11 | Xaa$_1$-Xaa$_2$-His-Pro-Gln-Phe-Xaa$_3$-Xaa$_4$ | Streptavidin-binding peptide Xaa$_1$ is Trp, Lys or Arg; Xaa$_2$ is any amino acid; Xaa$_3$ is Gly or Glu Xaa$_4$ is Gly, Lys or Arg |
| 12 | -Trp-Xaa$_1$-His-Pro-Gln-Phe-Xaa$_2$-Xaa$_3$- | Streptavidin-binding peptide Xaa$_1$ is any amino acid; Xaa$_2$ is Gly or Glu Xaa$_3$ is Gly, Lys or Arg |
| 13 | Trp-Ser-His-Pro-Gln-Phe-Glu-Lys-(Xaa)n-Trp-Ser-His-Pro-Gln-Phe-Glu-Lys- | Sequential modules of streptavidin-binding peptide Xaa is any amino |

| No. | Sequence | Description |
|---|---|---|
| | | acid; n is either 8 or 12 |
| 14 | Trp-Ser-His-Pro-Gln-Phe-Glu-Lys-(GlyGlyGlySer)n-Trp-Ser-His-Pro-Gln-Phe-Glu-Lys | Sequential modules of streptavidin-binding peptide n is 2 or 3 |
| 15 | SAWSHPQFEKGGGSGGGSGGGSWSHPQFEK | Twin-Strep-tag |
| 16 | SAWSHPQFEKGGGSGGGSGGSAWSHPQFEK | Twin-Strep-tag |
| 17 | WSHPQFEKGGGSGGGSGGGSWSHPQFEK | Twin-Strep-tag |
| 18 | WSHPQFEKGGGSGGGSWSHPQFEK | Twin-Strep-tag |
| 19 | WSHPQFEKGGGSGGGSGGSAWSHPQFEK | Twin-Strep-tag |
| 20 | Tyr-Pro-Tyr-Asp-Val-Pro-Asp-Tyr-Ala | HA-tag |
| 21 | Tyr-Thr-Asp-Ile-Glu-Met-Asn-Arg-Leu-Gly-Lys | VSV-G-tag |
| 22 | Gln-Pro-Glu-Leu-Ala-Pro-Glu-Asp-Pro-Glu-Asp | HSV-tag |
| 23 | Ala-Ser-Met-Thr-Gly-Gly-Gln-Gln-Met-Gly | T7 epitope |
| 24 | Gln-Pro-Glu-Leu-Ala-Pro-Glu-Asp-Pro-Glu-Asp | HSV epitope |
| 25 | Glu-Gln-Lys-Leu-Ile-Ser-Glu-Glu-Asp-Leu | Myc epitope |
| 26 | Gly-Lys-Pro-Ile-Pro-Asn-Pro-Leu-Leu-Gly-Leu-Asp-Ser-Thr | V5-tag |
| 27 | EAGITGTWYNQLGSTFIVTAGADGALTGTYVTARGNAESR YVLTGRYDSAPATDGSGTALGWTVAWKNNYRNAHSATT WSGQYVGGAEARINTQWLLTSGTTEENAGYSTLVGHDTF TKVKPSAAS | Mutein Streptavidin Val44-Thr45-Ala46-Arg47 and Glu117, Gly120, Tyr121 (mutein m1-9) Species: *Streptomyces avidinii* |
| 28 | DPSKDSKAQVSAAEAGITGTWYNQLGSTFIVTAGADGALT GTYVTARGNAESRYVLTGRYDSAPATDGSGTALGWTVA WKNNYRNAHSATTWSGQYVGGAEARINTQWLLTSGTTEE NAGYSTLVGHDTFTKVKPSAAS | Mutein Streptavidin Val44-Thr45-Ala46-Arg47 and Glu117, Gly120, Tyy121 (mutein m1-9) Species: *Streptomyces avidinii* |
| 29 | AMQVQLKQSG PGLVQPSQSL SITCTVSGFS LTTFGVHWVR QSPGKGLEWL GVIWASGITD YNVPFMSRLS ITKDNSKSQV FFKLNSLQPD DTAIYYCAKN DPGTGFAYWG QGTLVTVSAG STKGPSVFPL APSSKSTSGG TAALGCLVKD YFPEPVTVSW NSGALTSGVH TFPAVLQSSG LYSLSSVVTV PSSSLGTQTY ICNVNHKPSN TKVDKKVEPK SCGSAWSHPQ FEKGGGSGGG SGGSAWSHPQ FEK | Variable Heavy chain of Fab fragment m13B8.2 |
| 30 | AMDIQMTQSP ASLSASVGET VTFTCRASEM IYSYLAWYQQ KQGKSPQLLV HDAKTLAEGV PSRFSGGGSG TQFSLKINTL QPEDFGTYYC QAHYGNPPTF GGGTKLEIKR GIAAPSVFIF PPSDEQLKSG TASVVCLLNN FYPREAKVQW KVDNALQSGN SQESVTEQDS KDSTYSLSST LTLSKADYEK HKVYACEVTH QGLSSPVTKS FNRGECGS | Variable Light chain of Fab Fragment m13B8.2 |
| 31 | Gln Val Gln Leu Gln Gln Ser Gly Ala Glu Leu Ala Arg Pro Gly Ala Ser Val Lys Met Ser Cys Lys Ala Ser Gly Tyr Thr Phe Thr Arg Tyr Thr Met His Trp Val Lys Gln Arg Pro Gly Gln Gly Leu | Variable Heavy chain of anti-CD3 antibody OKT3 |

SEQUENCES

| No. | Sequence | Description |
|---|---|---|
| | Glu Trp Ile Gly Tyr Ile Asn Pro Ser Arg Gly Tyr Thr Asn Tyr<br>Asn Gln Lys Phe Lys Asp Lys Ala Thr Leu Thr Thr Asp Lys Ser<br>Ser Ser Thr Ala Tyr Met Gln Leu Ser Ser Leu Thr Ser Glu Asp<br>Ser Ala Val Tyr Tyr Cys Ala Arg Tyr Tyr Asp Asp His Tyr Cys<br>Leu Asp Tyr Trp Gly Gln Gly Thr Thr Leu Thr Val Ser Ser | |
| 32 | Gln Ile Val Leu Thr Gln Ser Pro Ala Ile Met Ser Ala Ser Pro Gly<br>Glu Lys Val Thr Met Thr Cys Ser Ala Ser Ser Val Ser Tyr<br>Met Asn Trp Tyr Gln Gln Lys Ser Gly Thr Ser Pro Lys Arg Trp<br>Ile Tyr Asp Thr Ser Lys Leu Ala Ser Gly Val Pro Ala His Phe<br>Arg Gly Ser Gly Ser Gly Thr Ser Tyr Ser Leu Thr Ile Ser Gly Met<br>Glu Ala Glu Asp Ala Ala Thr Tyr Tyr Cys Gln Gln Trp Ser Ser<br>Asn Pro Phe Thr Phe Gly Ser Gly Thr Lys Leu Glu Ile Asn | Variable Light chain of anti-CD3 antibody OKT3 |
| 33 | Leu Gln Gln Ser Gly Ala Glu Leu Val Lys Pro Gly Ala Ser Val<br>Arg Leu Ser Cys Lys Ala Ser Gly Tyr Thr Phe Thr Glu Tyr Ile Ile<br>His Trp Ile Lys Leu Arg Ser Gly Gln Gly Leu Glu Trp Ile Gly Trp<br>Phe Tyr Pro Gly Ser Asn Asp Ile Gln Tyr Asn Ala Lys Phe Lys<br>Gly Lys Ala Thr Leu Thr Ala Asp Lys Ser Ser Ser Thr Val Tyr<br>Met Glu Leu Thr Gly Leu Thr Ser Glu Asp Ser Ala Val Tyr Phe<br>Cys Ala Arg Arg Asp Asp Phe Ser Gly Tyr Asp Ala Leu Pro Tyr<br>Trp Gly Gln Gly Thr Met Val Thr Val | Variable Heavy chain of anti-CD28 antibody CD28.3 |
| 34 | Asp Ile Gln Met Thr Gln Ser Pro Ala Ser Leu Ser Val Ser Val Gly<br>Glu Thr Val Thr Ile Thr Cys Arg Thr Asn Glu Asn Ile Tyr Ser<br>Asn Leu Ala Trp Tyr Gln Gln Lys Gln Gly Lys Ser Pro Gln Leu<br>Leu Ile Tyr Ala Ala Thr His Leu Val Glu Gly Val Pro Ser Arg<br>Phe Ser Gly Ser Gly Ser Gly Thr Gln Tyr Ser Leu Lys Ile Thr Ser<br>Leu Gln Ser Glu Asp Phe Gly Asn Tyr Tyr Cys Gln His Phe Trp<br>Gly Thr Pro Cys Thr Phe Gly Gly Gly Thr Lys Leu Glu Ile Lys<br>Arg | Variable Light chain of anti-CD28 antibody CD28.3 |
| 35 | His-Asn-His-Arg-His-Lys-His-Gly-Gly-Gly-Cys | MAT tag |
| 36 | Gln Val Gln Leu Val Gln Ser Gly Ala Glu Val Lys Lys Pro Gly<br>Ala1 Thr Val Lys Ile Ser Cys Lys Val Ser Gly Phe Asn Ile Lys<br>Asp Thr Tyr Ile His Trp Val Gln Gln Ala Pro Gly Lys Gly Leu<br>Glu Trp Met Gly Arg Ile Asp Pro Ala Asn Asp Asn Thr Leu Tyr<br>Ala Ser Lys Phe Gln Gly Arg Val Thr Ile Thr Ala Asp Thr Ser<br>Thr Asp Thr Ala Tyr65 Met Glu Leu Ser Ser Leu Arg Ser Glu<br>Asp Thr Ala Val Tyr Tyr Cys Ala Arg Gly Tyr Gly Tyr Tyr Val<br>Phe Asp His Trp Gly Gln Gly Thr Leu Val Thr Val Ser Ser | Variable Heavy chain of huOKT8 |
| 37 | Asp Val Gln Ile Thr Gln Ser Pro Ser Ser Leu Ser Ala Ser Val Gly<br>Asp Arg Val Thr Ile Thr Cys Arg Thr Ser Arg Ser Ile Ser Gln Tyr<br>Leu Ala Trp Tyr Gln Gln Lys Pro Gly Lys Val Pro Lys Leu Leu<br>Ile Tyr Ser Gly Ser Thr Leu Gln Ser Gly Val Pro Ser Arg Phe Ser<br>Gly Ser Gly Ser Gly Thr Asp Phe Thr Leu Thr Ile Ser Ser Leu<br>Gln Pro Glu Asp Val Ala Thr Tyr Tyr Cys Gln Gln His Asn Glu<br>Asn Pro Leu Thr Phe Gly Gly Gly Thr Lys Val Glu Ile Lys | Variable Light chain of huOKT8 |
| 38 | -PGGG-(SGGGG)$_5$-P- | Linker<br>P is proline, G is glycine and S is serine |
| 39 | GSADDAKKDAAKKDGKS | Linker |
| 40 | MLLLVTSLLLCELPHPAFLLIP | GMCSFR alpha chain (amino acid) |
| 41 | atgcttctcctggtgacaagccttctgctctgtgagttaccacacccagcattcctcctgatccca | GMCSFR alpha chain (nucleic acid) |
| 42 | MALPVTALLLPLALLLHA | CD8 alpha signal peptide |
| 43 | MLLLVTSLLLCELPHPAFLLIPRKVCNGIGIGEFKDSLSINAT<br>NIKHFKNCTSISGDLHILPVAFRGDSFTHTPPLDPQELDILKT<br>VKEITGFLLIQAWPENRTDLHAFENLEIIRGRTKQHGQFSLA<br>VVSLNITSLGLRSLKEISDGDVIISGNKNLCYANTINWKKLF<br>GTSGQKTKIISNRGENSCKATGQVCHALCSPEGCWGPEPR<br>DCVSCRNVSRGRECVDKCNLLEGEPREFVENSECIQCHPEC | truncated epidermal growth factor receptor (tEGFR) |

| No. | Sequence | Description |
|---|---|---|
|  | LPQAMNITCTGRGPDNCIQCAHYIDGPHCVKTCPAGVMGE<br>NNTLVWKYADAGHVCHLCHPNCTYGCTGPGLEGCPTNGP<br>KIPSIATGMVGALLLLLVVALGIGLFM |  |
| 44 | RKVCNGIGIGEFKDSLSINATNIKHFKNCTSISGDLHILPVAF<br>RGDSFTHTPPLDPQELDILKTVKEITGFLLIQAWPENRTDLH<br>AFENLEIIRGRTKQHGQFSLAVVSLNITSLGLRSLKEISDGD<br>VIISGNKNLCYANTINWKKLFGTSGQKTKIISNRGENSCKA<br>TGQVCHALCSPEGCWGPEPRDCVSCRNVSRGRECVDKCN<br>LLEGEPREFVENSECIQCHPECLPQAMNITCTGRGPDNCIQ<br>CAHYIDGPHCVKTCPAGVMGENNTLVWKYADAGHVCHL<br>CHPNCTYGCTGPGLEGCPTNGPKIPSIATGMVGALLLLLVV<br>ALGIGLFM | truncated epidermal growth factor receptor (tEGFR) |
| 45 | VKQTLNFDLLKLAGDVESNPGP | F2A |
| 46 | QCTNYALLKLAGDVESNPGP | E2A |
| 47 | LEGGGEGRGSLLTCGDVEENPGPR | T2A |
| 48 | EGRGSLLTCGDVEENPGP | T2A |
| 49 | GSGATNFSLLKQAGDVEENPGP | P2A |
| 50 | ATNFSLLKQAGDVEENPGP | P2A |
| 51 | DYGVS | CDR H1 |
| 52 | VIWGSETTYYNSALKS | CDR H2 |
| 53 | YAMDYWG | CDR H3 |
| 54 | HYYYGGSYAMDY | CDR H3 |
| 55 | RASQDISKYLN | CDR L1 |
| 56 | SRLHSGV | CDR L2 |
| 57 | HTSRLHS | CDR L2 |
| 58 | GNTLPYTFG | CDR L3 |
| 59 | QQGNTLPYT | CDR L3 |
| 60 | EVKLQESGPGLVAPSQSLSVTCTVSGVSLPDYGVSWIRQPP<br>RKGLEWLGVIWGSETTYYNSALKSRLTIIKDNSKSQVFLK<br>MNSLQTDDTAIYYCAKHYYYGGSYAMDYWGQGTSVTVS<br>S | VH |
| 61 | DIQMTQTTSSLSASLGDRVTISCRASQDISKYLNWYQQKPD<br>GTVKLLIYHTSRLHSGVPSRFSGSGSGTDYSLTISNLEQEDI<br>ATYFCQQGNTLPYTFGGGTKLEIT | VL |
| 62 | GSTSGSGKPGSGEGSTKG | Linker |
| 63 | gacatccagatgacccagaccacctccagcctgagcgccagcctgggcgaccgggtgacc<br>atcagctgccgggccagccaggacatcagcaagtacctgaactggtatcagcagaagccc<br>gacggcaccgtcaagctgctgatctaccacaccagccggctgcacagcggcgtgcccagc<br>cggtttagcggcagcggctccggcaccgactacagcctgaccatctccaacctggaacagg<br>aagatatcgccacctacttttgccagcagggcaacacactgccctacacctttggcggcgga<br>acaaagctggaaatcaccggcagcacctccggcagcggcaagcctggcagcggcgagg<br>gcagcaccaagggcgaggtgaagctgcaggaaagcggccctggcctggtggcccccagc<br>cagagcctgagcgtgacctgcaccgtgagcggcgtgagcctgcccgactacggcgtgagc<br>tggatccggcagccccccaggaagggcctggaatggctgggcgtgatctgggcgcagcga<br>gaccacctactacaacagcgccctgaagagccggctgaccatcaaggacaacagcaa<br>gagccaggtgttcctgaagatgaacagcctgcagaccgacgacaccgccatctactactgc<br>gccaagcactactactacggcggcagctacgccatggactactggggccagggcaccagc<br>gtgaccgtgagcagc | Sequence encoding scFv |
| 64 | DIQMTQTTSSLSASLGDRVTISCRASQDISKYLNWYQQKPD<br>GTVKLLIYHTSRLHSGVPSRFSGSGSGTDYSLTISNLEQEDI<br>ATYFCQQGNTLPYTFGGGTKLEITGSTSGSGKPGSGEGSTK<br>GEVKLQESGPGLVAPSQSLSVTCTVSGVSLPDYGVSWIRQP<br>PRKGLEWLGVIWGSETTYYNSALKSRLTIIKDNSKSQVFLK<br>MNSLQTDDTAIYYCAKHYYYGGSYAMDYWGQGTSVTVS | scFv |

| No. | Sequence | Description |
|---|---|---|
| | S | |
| 65 | SYWMN | CDR H1 |
| 66 | QIYPGDGDTNYNGKFKG | CDR H2 |
| 67 | KTISSVVDFYFDY | CDR H3 |
| 68 | QQYNRYPYT | CDR L3 |
| 69 | SYWMN | CDR H1 |
| 70 | QIYPGDGDTNYNGKFKG | CDR H2 |
| 71 | EVKLQQSGAELVRPGSSVKISCKASGYAFSSYWMNWVKQ RPGQGLEWIGQIYPGDGDTNYNGKFKGQATLTADKSSSTA YMQLSGLTSEDSAVYFCARKTISSVVDFYFDYWGQGTTVT VSS | VH |
| 72 | DIELTQSPKFMSTSVGDRVSVTCKASQNVGTNVAWYQQK PGQSPKPLIYSATYRNSGVPDRFTGSGSGTDFTLTITNVQSK DLADYFCQQYNRYPYTSGGGTKLEIKR | VL |
| 73 | KASQNVGTNVA | CDR L1 |
| 74 | SATYRNS | CDR L2 |
| 75 | QQYNRYPYT | CDR L3 |
| 76 | SYWMN | CDR H1 |
| 77 | QIYPGDGDTNYNGKFKG | CDR H2 |
| 78 | KTISSVVDFYFDY | CDR H3 |
| 79 | GGGGSGGGGSGGGGS | Linker |
| 80 | EVKLQQSGAELVRPGSSVKISCKASGYAFSSYWMNWVKQ RPGQGLEWIGQIYPGDGDTNYNGKFKGQATLTADKSSSTA YMQLSGLTSEDSAVYFCARKTISSVVDFYFDYWGQGTTVT VSSGGGGSGGGGSGGGGSDIELTQSPKFMSTSVGDRVSVT CKASQNVGTNVAWYQQKPGQSPKPLIYSATYRNSGVPDR FTGSGSGTDFTLTITNVQSKDLADYFCQQYNRYPYTSGGG TKLEIKR | scFv |
| 81 | ESKYGPPCPPCP | spacer (IgG4hinge) (aa) *Homo sapiens* |
| 82 | GAATCTAAGTACGGACCGCCCTGCCCCCCTTGCCCT | spacer (IgG4hinge) (nt) *homo sapiens* |
| 83 | ESKYGPPCPPCPGQPREPQVYTLPPSQEEMTKNQVSLTCLV KGFYPSDIAVEWESNGQPENNYKTTPPVLDSDGSFFLYSRL TVDKSRWQEGNVFSCSVMHEALHNHYTQKSLSLSLGK | Hinge-CH3 spacer *Homo sapiens* |
| 84 | ESKYGPPCPPCPAPEFLGGPSVFLFPPKPKDTLMISRTPEVT CVVVDVSQEDPEVQFNWYVDGVEVHNAKTKPREEQFNST YRVVSVLTVLHQDWLNGKEYKCKVSNKGLPSSIEKTISKA KGQPREPQVYTLPPSQEEMTKNQVSLTCLVKGFYPSDIAV EWESNGQPENNYKTTPPVLDSDGSFFLYSRLTVDKSRWQE GNVFSCSVMHEALHNHYTQKSLSLSLGK | Hinge-CH2-CH3 spacer *Homo sapiens* |
| 85 | RWPESPKAQASSVPTAQPQAEGSLAKATTAPATTRNTGRG GEEKKKEKEKEEQEERETKTPECPSHTQPLGVYLLTPAVQ DLWLRDKATFTCFVVGSDLKDAHLTWEVAGKVPTGVEE GLLERHSNGSQSQHSRLTLPRSLWNAGTSVTCTLNHPSLPP QRLMALREPAAQAPVKLSLNLLASSDPPEAASWLLCEVSG FSPPNILLMWLEDQREVNTSGFAPARPPPQPGSTTFWAWS VLRVPAPPSPQPATYTCVVSHEDSRTLLNASRSLEVSYVTD H | IgD-hinge-Fc *Homo sapiens* |
| 86 | Glu Val Val Val Lys Tyr Gly Pro Pro Cys Pro Pro Cys Pro | Exemplary IgG Hinge |

| No. | Sequence | Description |
|---|---|---|
| 87 | X1PPX2P<br>X1 is glycine, cysteine or arginine<br>X2 is cysteine or threonine | Exemplary IgG Hinge |
| 88 | Glu Pro Lys Ser Cys Asp Lys Thr His Thr Cys Pro Pro Cys Pro | Exemplary IgG Hinge |
| 89 | Glu Arg Lys Cys Cys Val Glu Cys Pro Pro Cys Pro | Exemplary IgG Hinge |
| 90 | ELKTPLGDTHTCPRCPEPKSCDTPPPCPRCPEPKSCDTPPPC<br>PRCPEPKSCDTPPPCPRCP | Exemplary IgG Hinge |
| 91 | Glu Ser Lys Tyr Gly Pro Pro Cys Pro Ser Cys Pro | Exemplary IgG Hinge |
| 92 | Glu Ser Lys Tyr Gly Pro Pro Cys Pro Pro Cys Pro | Exemplary IgG Hinge |
| 93 | Tyr Gly Pro Pro Cys Pro Cys Pro | Exemplary IgG Hinge |
| 94 | Lys Tyr Gly Pro Pro Cys Pro Pro Cys Pro | Exemplary IgG Hinge |
| 95 | FWVLVVVGGVLACYSLLVTVAFIIFWV | CD28 (amino acids 153-179 of Accession No. P10747) *Homo sapien* |
| 96 | IEVMYPPPYLDNEKSNGTIIHVKGKHLCPSPLFPGPSKPFW<br>VLVVVGGVLACYSLLVTVAFIIFWV | CD28 (amino acids 114-179 of Accession No. P10747) *Homo sapiens* |
| 97 | RSKRSRLLHSDYMNMTPRRPGPTRKHYQPYAPPRDFAAY<br>RS | CD28 (amino acids 180-220 of P10747) *Homo sapiens* |
| 98 | RSKRSRGGHSDYMNMTPRRPGPTRKHYQPYAPPRDFAAY<br>RS | CD28 (LL to GG) *Homo sapiens* |
| 99 | KRGRKKLLYIFKQPFMRPVQTTQEEDGCSCRFPEEEEGGCE<br>L | 4-1BB (amino acids 214-255 of Q07011.1) *Homo sapiens* |
| 100 | RVKFSRSADAPAYQQGQNQLYNELNLGRREEYDVLDKRR<br>GRDPEMGGKPRRKNPQEGLYNELQKDKMAEAYSEIGMK<br>GERRRGKGHDGLYQGLSTATKDTYDALHMQALPPR | CD3 zeta *Homo sapiens* |
| 101 | RVKFSRSAEPPAYQQGQNQLYNELNLGRREEYDVLDKRR<br>GRDPEMGGKPRRKNPQEGLYNELQKDKMAEAYSEIGMK<br>GERRRGKGHDGLYQGLSTATKDTYDALHMQALPPR | CD3 zeta *Homo sapiens* |
| 102 | RVKFSRSADAPAYKQGQNQLYNELNLGRREEYDVLDKRR<br>GRDPEMGGKPRRKNPQEGLYNELQKDKMAEAYSEIGMK<br>GERRRGKGHDGLYQGLSTATKDTYDALHMQALPPR | CD3 zeta *Homo sapiens* |
| 103 | GluAlaGlyIleThrGlyThrTrpTyrAsnGlnLeuGlySerThrPheIleVal<br>ThrAlaGlyAlaAspGlyAlaLeuThrGlyThrTyrGluSerAlaValGlyAsn<br>AlaGluSerArgTyrValLeuThrGlyArgTyrAspSerAlaProAlaThrAsp<br>GlySerGlyThrAlaLeuGlyTrpThrValAlaTrpLysAsnAsnTyrArgAsn<br>AlaHisSerAlaThrThrTrpSerGlyGlnTyrValGlyGlyAlaGluAlaArg<br>IleAsnThrGlnTrpLeuLeuThrSerGlyThrThrGluAlaAsnAlaTrpLys<br>SerThrLeuValGlyHisAspThrPheThrLysValLysProSerAlaAlaSer | Minimal streptavidin Species: *Streptomyces avidinii* |
| 104 | GluAlaGlyIleThrGlyThrTrpTyrAsnGlnLeuGlySerThrPheIleVal<br>ThrAlaGlyAlaAspGlyAlaLeuThrGlyThrTyrValThrAlaArgGlyAsn<br>AlaGluSerArgTyrValLeuThrGlyArgTyrAspSerAlaProAlaThrAsp<br>GlySerGlyThrAlaLeuGlyTrpThrValAlaTrpLysAsnAsnTyrArgAsn | Mutein Streptavidin Val44-Thr45-Ala46-Arg47 |

| No. | Sequence | Description |
|---|---|---|
| | AlaHisSerAlaThrThrTrpSerGlyGlnTyrValGlyGlyAlaGluAlaArg<br>IleAsnThrGlnTrpLeuLeuThrSerGlyThrThrGluAlaAsnAlaTrpLys<br>SerThrLeuValGlyHisAspThrPheThrLysValLysProSerAlaAlaSer | Species:<br>*Streptomyces*<br>*avidinii* |
| 105 | GluAlaGlyIleThrGlyThrTrpTyrAsnGlnLeuGlySerThrPheIleVal<br>ThrAlaGlyAlaAspGlyAlaLeuThrGlyThrTyrIleGlyAlaArgGlyAsn<br>AlaGluSerArgTyrValLeuThrGlyArgTyrAspSerAlaProAlaThrAsp<br>GlySerGlyThrAlaLeuGlyTrpThrValAlaTrpLysAsnAsnTyrArgAsn<br>AlaHisSerAlaThrThrTrpSerGlyGlnTyrValGlyGlyAlaGluAlaArg<br>IleAsnThrGlnTrpLeuLeuThrSerGlyThrThrGluAlaAsnAlaTrpLys<br>SerThrLeuValGlyHisAspThrPheThrLysValLysProSerAlaAlaSer | Mutein<br>Streptavidin<br>Ile44-Gly45-<br>Ala-46-Arg47<br>Species:<br>*Streptomyces*<br>*avidinii* |
| 106 | ASTKGPSVFPLAPCSRSTSESTAALGCLVKDYFPEPVTVSW<br>NSGALTSGVHTFPAVLQSSGLYSLSSVVTVPSSNFGTQYT<br>CNVDHKPSNTKVDKTVERKCCVECPPCPAPPVAGPSVFLF<br>PPKPKDTLMISRTPEVTCVVVDVSHEDPEVQFNWYVDGVE<br>VHNAKTKPREEQFNSTFRVVSVLTVVHQDWLNGKEYKCK<br>VSNKGLPAPIEKTISKTKGQPREPQVYTLPPSREEMTKNQV<br>SLTCLVKGFYPSDISVEWESNGQPENNYKTTPPMLDSDGSF<br>FLYSKLTVDKSRWQQGNVFSCSVMHEALHNHYTQKSLSL<br>SPGK | Human IgG2 Fc<br>(Uniprot P01859) |
| 107 | ASTKGPSVFPLAPCSRSTSESTAALGCLVKDYFPEPVTVSW<br>NSGALTSGVHTFPAVLQSSGLYSLSSVVTVPSSSLGTKTYT<br>CNVDHKPSNTKVDKRVESKYGPPCPSCPAPEFLGGPSVFLF<br>PPKPKDTLMISRTPEVTCVVVDVSQEDPEVQFNWYVDGVE<br>VHNAKTKPREEQFNSTYRVVSVLTVLHQDWLNGKEYKCK<br>VSNKGLPSSIEKTISKAKGQPREPQVYTLPPSQEEMTKNQV<br>SLTCLVKGFYPSDIAVEWESNGQPENNYKTTPPVLDSDGSF<br>FLYSRLTVDKSRWQEGNVFSCSVMHEALHNHYTQKSLSLS<br>LGK | Human IgG4 Fc<br>(Uniprot P01861) |
| 108 | GVQVETISPGDGRTFPKRGQTCVVHYTGMLEDGKKMDSS<br>RDRNKPFKFMLGKQEVIRGWEEGVAQMSVGQRAKLTISP<br>DYAYGATGHPGIIPPHATLVFDVELLKLE | FKBP |
| 109 | GVQVETISPGDGRTFPKRGQTCVVHYTGMLEDGKKVDSS<br>RDRNKPFKFMLGKQEVIRGWEEGVAQMSVGQRAKLTISP<br>DYAYGATGHPGIIPPHATLVFDVELLKLE | FKBP12v36 |
| 110 | MGSNKSKPKDASQRRR | Modified<br>acylation motif |
| 111 | Met-Gly-Cys-Xaa-Cys | dual acylation<br>motif |
| 112 | Cys-Ala-Ala-Xaa | acylation region |
| 113 | EVQLVQSGAEMKKPGASLKLSCKASGYTFIDYYVYWMRQ<br>APGQGLESMGWINPNSGGTNYAQKFQGRVTMTRDTSISTA<br>YMELSRLRSDDTAMYYCARSQRDGYMDYWGQGTLVTVS<br>S | Variable heavy<br>($V_H$) Anti-BCMA |
| 114 | QSALTQPASVSASPGQSIAISCTGTSSDVGWYQQHPGKAPK<br>LMIYEDSKRPSGVSNRFSGSKSGNTASLTISGLQAEDEADY<br>YCSSNTRSSTLVFGGGTKLTVLG | Variable light<br>($V_L$) Anti-BCMA |
| 115 | ESKYGPPCPPCPAPPVAGPSVFLFPPKPKDTLMISRTPEVTC<br>VVVDVSQEDPEVQFNWYVDGVEVHNAKTKPREEQFQSTY<br>RVVSVLTVLHQDWLNGKEYKCKVSNKGLPSSIEKTISKAK<br>GQPREPQVYTLPPSQEEMTKNQVSLTCLVKGFYPSDIAVE<br>WESNGQPENNYKTTPPVLDSDGSFFLYSRLTVDKSRWQEG<br>NVFSCSVMHEALHNHYTQKSLSLSLGK | Hinge-$C_H2$-$C_H3$<br>spacer<br>*Homo sapiens* |
| 116 | QIQLVQSGPELKKPGETVKISCKASGYTFTDYSINWVKRAP<br>GKGLKWMGWINTETREPAYAYDFRGRFAFSLETSASTAY<br>LQINNLKYEDTATYFCALDYSYAMDYWGQGTSVTVSS | Variable heavy<br>($V_H$) Anti-BCMA |
| 117 | DIVLTQSPPSLAMSLGKRATISCRASESVTILGSHLIHWYQQ<br>KPGQPPTLLIQLASNVQTGVPARFSGSGSRTDFTLTIDPVEE<br>DDVAVYYCLQSRTIPRTFGGGTKLEIK | Variable light<br>($V_L$) Anti-BCMA |
| 118 | QIQLVQSGPDLKKPGETVKLSCKASGYTFTNFGMNWVKQ<br>APGKGFKWMAWINTYTGESYFADDFKGRFAFSVETSATT<br>AYLQINNLKTEDTATYFCARGEIYYGYDGGFAYWGQGTL | Variable heavy<br>($V_H$) Anti-BCMA |

| No. | Sequence | Description |
|---|---|---|
| | VTVSA | |
| 119 | DVVMTQSHRFMSTSVGDRVSITCRASQDVNTAVSWYQQK PGQSPKLLIFSASYRYTGVPDRFTGSGSGADFTLTISSVQAE DLAVYYCQQHYSTPWTFGGGTKLDIK | Variable light ($V_L$) Anti-BCMA |
| 120 | EVQLVQSGAEVKKPGESLKISCKGSGYSFTSYWIGWVRQM PGKGLEWMGIIYPGDSDTRYSPSFQGHVTISADKSISTAYL QWSSLKASDTAMYYCARYSGSFDNWGQGTLVTVSS | Variable heavy ($V_H$) Anti-BCMA |
| 121 | SYELTQPPSASGTPGQRVTMSCSGTSSNIGSHSVNWYQQLP GTAPKLLIYTNNQRPSGVPDRFSGSKSGTSASLAISGLQSED EADYYCAAWDGSLNGLVFGGGTKLTVLG | Variable light ($V_L$) Anti-BCMA |
| 122 | GGGGS | Linker |
| 123 | GGGS | Linker |
| 124 | SRGGGGSGGGGSGGGGSLEMA | Linker |
| 125 | EVQLVQSGAEVKKPGSSVKVSCKASGGTFSSYAISWVRQA PGQGLEWMGRIIPILGIANYAQKFQGRVTMTEDTSTDTAY MELSSLRSEDTAVYYCARSGYSKSIVSYMDYWGQGTLVT VSS | Variable heavy ($V_H$) Anti-BCMA |
| 126 | LPVLTQPPSTSGTPGQRVTVSCSGSSSNIGSNVVFWYQQLP GTAPKLVIYRNNQRPSGVPDRFSVSKSGTSASLAISGLRSE DEADYYCAAWDDSLSGYVFGTGTKVTVLG | Variable light ($V_L$) Anti-B CMA |
| 127 | QVQLVQSGAEVKKPGSSVKVSCKASGGTFSSYAISWVRQA PGQGLEWMGRIIPILGTANYAQKFQGRVTITADESTSTAYM ELSSLRSEDTAVYYCARSGYGSYRWEDSWGQGTLVTVSS | Variable heavy ($V_H$) Anti-BCMA |
| 128 | QAVLTQPPSASGTPGQRVTISCSGSSSNIGSNYVFWYQQLP GTAPKLLIYSNNQRPSGVPDRFSGSKSGTSASLAISGLRSED EADYYCAAWDDSLSASYVFGTGTKVTVLG | Variable light ($V_L$) Anti-BCMA |
| 129 | QVQLVQSGAEVKKPGASVKVSCKASGYTFTDYYMHWVR QAPGQRLEWMGWINPNSGGTNYAQKFQDRITVTRDTSSN TGYMELTRLRSDDTAVYYCARSPYSGVLDKWGQGTLVTV SS | Variable heavy ($V_H$) Anti-BCMA |
| 130 | QSVLTQPPSVSGAPGQRVTISCTGSSSNIGAGFDVHWYQQL PGTAPKLLIYGNSNRPSGVPDRFSGSKSGTSASLAITGLQAE DEADYYCQSYDSSLSGYVFGTGTKVTVLG | Variable light ($_L$) Anti-BCMA |
| 131 | KYGPPCPPCP | Hinge |

What is claimed:

1. A method of on-column stimulation of T cells, the method comprising:
   (a) adding an oligomeric stimulatory reagent capable of delivering a stimulatory signal in T cells to a stationary phase comprising a plurality of T cells immobilized on the stationary phase, thereby initiating incubation of the stimulatory reagent with one or more T cells, wherein:
   the stationary phase is comprised in a chromatography column and comprises a selection agent that specifically binds to a selection marker on the surface of one or more T cells or a subset thereof, wherein specific binding of the selection agent to the selection marker expressed by the one or more T cells immobilizes the one or more T cells on the stationary phase; and
   the oligomeric stimulatory reagent comprises one or more stimulatory agents comprising (i) a first stimulatory agent that is an anti-CD3 antibody, and (ii) a second stimulatory agent that is an anti-CD28 antibody; and
   (b) within 24 hours of initiating incubation, collecting one or more of the plurality of T cells detached from the stationary phase by downregulation of the selection marker and by gravity flow without the addition of a competition agent or free binding agent to elute the plurality of T cells from the stationary phase, thereby generating a composition comprising stimulated T cells.

2. A method of on-column stimulation of T cells, the method comprising:
   (a) incubating a plurality of T cells immobilized on a stationary phase with one or more stimulatory agents to deliver a stimulatory signal in one or more T cells of the plurality of T cells, said stationary phase comprised in a chromatography column and comprising a selection agent that specifically binds to a selection marker on the surface of the one or more T cells, wherein specific binding of the selection agent to the selection marker expressed by the one or more T cells immobilizes the one or more T cells on the stationary phase; and
   (b) within 24 hours of the initiation of the incubation, collecting the one or more T cells detached from the stationary phase by downregulation of the selection marker and by gravity flow without the addition of a competition agent or free binding agent to elute the plurality of T cells from the stationary phase, thereby generating a composition comprising stimulated T cells.

3. The method of claim 2, wherein the stationary phase comprises or is immobilized with at least one of the one or more stimulatory agents capable of delivering a stimulatory signal in the one or more T cells.

4. The method of claim 2, wherein the method comprises prior to the incubating, adding a stimulatory reagent to the stationary phase, said stimulatory reagent comprising at least one of the one or more stimulatory agents.

5. A method of on-column stimulation of T cells, the method comprising:
   (a) adding a sample comprising a plurality of T cells to a stationary phase comprised in a chromatography column, said stationary phase comprising a selection agent that binds to a selection marker on the surface of one or more of the plurality of T cells, thereby immobilizing the one or more of the plurality of T cells on the stationary phase;
   (b) adding, to the stationary phase, a stimulatory reagent comprising one or more stimulatory agents capable of delivering a stimulatory signal in one or more of said plurality of T cells, thereby initiating incubation of the stimulatory reagent with the one or more of said plurality of T cells; and
   (c) within 24 hours of the initiating incubation, collecting one or more of said plurality of T cells detached from the stationary phase by downregulation of the selection marker and by gravity flow without the addition of a competition agent or free binding agent to elute the plurality of T cells from the stationary phase, thereby generating a composition comprising stimulated T cells.

6. A method of on-column stimulation of T cells, comprising:
   (a) combining (i) a sample comprising a plurality of T cells and (ii) a stationary phase comprised in a chromatography column and comprising a selection agent capable of specifically binding to a selection marker expressed on the surface of one or more of the plurality of T cells, wherein specific binding of the selection agent to a selection marker immobilizes said one or more of the plurality of T cells on the stationary phase;
   (b) adding, to the stationary phase, a stimulatory reagent comprising one or more stimulatory agents capable of delivering a stimulatory signal in T cells, thereby initiating incubation of the stimulatory reagent with the one or more of the plurality of T cells; and
   (c) within 24 hours of the initiating incubation, collecting one or more of said plurality of T cells detached from the stationary phase by downregulation of the selection marker and by gravity flow without the addition of a competition agent or free binding agent to elute the plurality of T cells from the stationary phase, thereby generating a composition comprising stimulated T cells.

7. A method of on-column stimulation of T cells, the method comprising adding an oligomeric stimulatory reagent to a stationary phase comprising a plurality of T cells immobilized on the stationary phase, thereby initiating incubation of the stimulatory reagent with one or more T cells of the plurality of T cells, wherein:
   the stationary phase is comprised in a chromatography column and comprises a selection agent that specifically binds to a selection marker on the surface of one or more T cells, wherein specific binding of the selection agent to the selection marker expressed by the one or more T cells immobilizes said one or more T cells on the stationary phase; and the oligomeric stimulatory reagent comprises (i) a plurality of streptavidin or streptavidin mutein molecules and (ii) one or more stimulatory agents capable of delivering a stimulatory signal in one or more T cells, wherein the size of the oligomeric stimulatory reagent comprises (i) a radius of greater than 50 nm, (ii) a molecular weight of at least $5 \times 10^6$ g/mol; and/or (iii) at least 100 streptavidin or streptavidin mutein tetramers; and within 24 hours of the initiating incubation, collecting one or more of the plurality of T cells detached from the stationary phase by downregulation of the selection marker and by gravity flow without the addition of a competition agent or free binding agent to elute the plurality of T cells from the stationary phase, thereby generating a composition containing stimulated T cells.

8. The method of claim 1, wherein the collecting one or more of the plurality of T cells from the stationary phase occurs within about 2 to 12 hours of initiating the incubation.

9. The method of claim 2, wherein the one or more stimulatory agents comprise (i) a first stimulatory agent that is capable of delivering the stimulatory signal and (ii) a second stimulatory agent that is capable of specifically binding to a costimulatory molecule on the one or more T cells.

10. The method of claim 9, wherein the first stimulatory agent specifically binds CD3 and the second stimulatory agent specifically binds CD28.

11. The method of claim 1, wherein the first and second stimulatory agents, independently, comprise a monovalent antibody fragment.

12. The method of claim 11, wherein the monovalent antibody fragment is selected from the group consisting of a Fab fragment, an Fv fragment, and a single-chain Fv fragment (scFv).

13. The method of claim 1, wherein the first stimulatory agent is an anti-CD3 Fab and the second stimulatory agent is an anti-CD28 Fab.

14. A method of on-column stimulation of T cells, the method comprising:
(a) adding an oligomeric stimulatory reagent capable of delivering a stimulatory signal in T cells to a stationary phase comprising a plurality of T cells immobilized on the stationary phase, thereby initiating incubation of the stimulatory reagent with one or more T cells, wherein:
the stationary phase is comprised in a chromatography column and comprises a selection agent capable of specifically binding to a selection marker on the surface of one or more T cells or a subset thereof, wherein specific binding of the selection agent to a selection marker expressed by the one or more T cells or a subset thereof immobilizes said plurality of T cells on the stationary phase, and wherein the selection agent is a Fab fragment capable of specifically binding to a selection marker selected from the group consisting of CD3, CD4, and CD8; and
the oligomeric stimulatory reagent comprises (i) a plurality of streptavidin mutein molecules, (ii) a first stimulatory agent capable of delivering a stimulatory signal in one or more T cells, wherein the first stimulatory agent is a Fab fragment capable of specifically binding to CD3, and (iii) a second stimulatory agent capable of enhancing, dampening, or modifying the stimulatory signal, wherein the second stimulatory agent is a Fab fragment capable of specifically binding to CD28, and wherein the size of the oligomeric stimulatory reagent comprises (i) a radius of greater than 50 nm, (ii) a molecular weight of at least $5 \times 10^6$ g/mol; and/or (iii) at least 100 streptavidin or streptavidin mutein tetramers; and (b) within 24 hours of initiating incubation, collecting one or more of the plurality of T cells detached from the stationary phase by downregulation of the selection marker and by gravity flow without the addition of a competition agent or free binding agent to elute the plurality of T cells from the stationary phase.

15. The method of claim 1, wherein the T cells are from a whole blood sample, a buffy coat sample, a peripheral blood mononuclear cells (PBMC) sample, an unfractionated T cell sample, a lymphocyte sample, a white blood cell sample, an apheresis product, or a leukapheresis product.

16. The method of claim 1, wherein each of the first and second stimulatory agent further comprises a streptavidin-binding peptide selected from the group consisting of Trp-Ser-His-Pro-Gln-Phe-Glu-Lys (SEQ ID NO: 8), Ser-Ala-Trp-Ser-His-Pro-Gln-Phe-Glu-Lys-(GlyGlyGlySer)$_3$-Trp-Ser-His-Pro-Gln-Phe-Glu-Lys (SEQ ID NO:15), Trp-Ser-His-Pro-Gln-Phe-Glu-Lys-(GlyGlyGlySer)$_3$-Trp-Ser-His-Pro-Gln-Phe-Glu-Lys (SEQ ID NO: 17), SAWSHPQFEKGGGSGGGSGGGSAWSHPQFEK (SEQ ID NO: 16), Trp-Ser-His-Pro-Gln-Phe-Glu-Lys-(GlyGlyGly-Ser)$_2$-Trp-Ser-His-Pro-Gln-Phe-Glu-Lys (SEQ ID NO: 18), and Trp-Ser-His-Pro-Gln-Phe-Glu-Lys-(GlyGlyGlySer)$_2$Gly-Gly-Ser-Ala-Trp-Ser-His-Pro-Gln-Phe-Glu-Lys (SEQ ID NO: 19).

17. The method of claim 1, wherein the selection agent comprises an agent selected from the group consisting of antibody fragments, proteinaceous binding molecules with immunoglobulin-like functions, molecules containing Ig domains, cytokines, chemokines, aptamers, MHC molecules, MHC-peptide complexes, receptor ligands, and binding fragments of any of the foregoing.

18. The method of claim 1, wherein:
the selection marker is a T cell coreceptor; or
the selection marker is a member of a T cell antigen receptor complex.

19. The method of claim 1, wherein the selection marker is selected from the group consisting of CD3, CD4, CD8, CD45RA, CD27, CD28, and CCR7.

20. The method of claim 1, wherein the selection agent comprises a monovalent antibody fragment.

21. The method of claim 1, wherein the selection agent comprises a Fab.

22. The method of claim 4, wherein the stimulatory reagent is an oligomeric stimulatory reagent comprising a plurality of streptavidin or streptavidin mutein molecules, wherein the oligomeric stimulatory reagent comprises.

23. The method of claim 1, wherein the oligomeric stimulatory reagent comprising a plurality of streptavidin or streptavidin mutein molecules, wherein the oligomeric stimulatory reagent comprises at least 100 streptavidin or streptavidin mutein tetramers.

24. The method of claim 23, wherein the oligomeric stimulatory reagent is soluble and is not bound to a solid support.

25. The method of claim 23, wherein the streptavidin or streptavidin mutein molecules reversibly bind to biotin, a biotin analog, or a streptavidin-binding peptide.

26. The method of claim 23, wherein:
the streptavidin mutein comprises the amino acid sequence Ile$^{44}$-Gly$^{45}$-Ala$^{46}$-Arg$^{47}$ at sequence positions corresponding to positions 44 to 47 with reference to positions in streptavidin in the sequence of amino acids set forth in SEQ ID NO: 1; or the streptavidin mutein comprises the amino acid sequence $Val^{44}$-$Thr^{45}$-$Ala^{46}$-$Arg^{47}$ at sequence positions corresponding to positions 44 to 47 with reference to positions in streptavidin in the sequence of amino acids set forth in SEQ ID NO: 1.

27. The method of claim 23, wherein the streptavidin mutein comprises the amino acid sequence set forth in any of SEQ ID NOS: 3-6 and 104-105.

28. The method of claim 23, wherein the oligomeric stimulatory reagent comprises between 1,000 and 10,000 streptavidin or streptavidin mutein tetramers.

29. The method of claim 23, wherein the oligomeric stimulatory reagent is added to the stationary phase at a concentration of between about 1 μg/1 million cells to about 2 μg/1 million cells.

30. The method of claim 1, wherein said competition agent or free binding agent facilitates detachment of the one or more T cells from the stationary phase.

31. The method of claim 1, wherein said competition agent or free binding agent comprises biotin, a biotin analog, or a streptavidin-binding peptide.

32. The method of claim 1, further comprising introducing a recombinant nucleic acid molecule into T cells of the composition comprising stimulated T cells, wherein the nucleic acid molecule encodes a recombinant protein, thereby producing a composition comprising engineered T cells.

33. The method of claim 32, wherein the recombinant protein is a chimeric antigen receptor.

34. The method of claim 32, wherein the introduction of the recombinant nucleic acid is achieved by transduction with a viral particle.

35. The method of claim 32, further comprising cultivating the composition comprising engineered cells under conditions for viral integration.

36. The method of claim 32, further comprising cultivating the composition comprising engineered cells under conditions to expand the T cells.

37. The method of claim 32, further comprising harvesting the engineered T cells, thereby producing an output population of engineered T cells.

38. The method of claim 37, further comprising formulating the harvested cells for cryopreservation or administration to a subject.

39. The method of claim 1, wherein the stationary phase has a binding capacity of between about 75 million and about 125 million T cells per mL of stationary phase.

\* \* \* \* \*